US006694270B2

(12) United States Patent
Hart

(10) Patent No.: US 6,694,270 B2
(45) Date of Patent: Feb. 17, 2004

(54) PHASOR TRANSDUCER APPARATUS AND SYSTEM FOR PROTECTION, CONTROL, AND MANAGEMENT OF ELECTRICITY DISTRIBUTION SYSTEMS

(75) Inventor: Ronald G. Hart, Victoria (CA)

(73) Assignee: Power Measurement Ltd. (CA)

( * ) Notice: Subject to any disclaimer, the term of this patent is extended or adjusted under 35 U.S.C. 154(b) by 0 days.

(21) Appl. No.: 10/068,431

(22) Filed: Feb. 6, 2002

(65) Prior Publication Data

US 2003/0101008 A1 May 29, 2003

Related U.S. Application Data

(63) Continuation of application No. 08/798,723, filed on Feb. 12, 1997, now abandoned, which is a continuation-in-part of application No. 08/369,849, filed on Dec. 30, 1994, now Pat. No. 5,650,936.

(51) Int. Cl.[7] .................................................. H02H 9/00
(52) U.S. Cl. ............................ 702/57; 702/58; 700/297
(58) Field of Search ......................... 702/57–62, 64–66, 702/75, 117–119, 122, 123, 125, 182–185, 189, FOR 103, FOR 104, FOR 106, FOR 111, FOR 170, FOR 171; 324/142, 509, 521, 522; 361/78–80, 85–88, 93.2; 307/125, 126, 131, 116, 38–40; 700/286, 291–298; 340/638, 639, 657–664, 310.01, 870.01, 870.02; 717/108

(56) References Cited

U.S. PATENT DOCUMENTS 4,415,968 A 11/1983 Maeda et al. ................. 700/73
4,709,339 A 11/1987 Fernandes ................... 700/293
4,794,327 A 12/1988 Fernandes ................... 324/126

(List continued on next page.)

OTHER PUBLICATIONS

Miller et al., "Multichannel Continuous Harmonic Analysis in Real–Time", Oct. 1992, IEEE Transactions on Power Delivery, vol. 7, issue 4, pp. 1813–1819.*

7700 ION Preliminary Installation and Operation Manual, Power Measurement Ltd., Revised Nov. 1, 1994.

"Phasors Revisited", Elmore, Presented to Western Protective Relay Conference, Oct. 23–25, 1990, Spokane, Washington, (no month).

(List continued on next page.)

*Primary Examiner*—Hal Wachsman
(74) *Attorney, Agent, or Firm*—Brinks Hofer Gilson & Lione

(57) ABSTRACT

A phasor monitoring system and apparatus for use with a distribution system for electricity wherein periodic three phase electricity is distributed in a plurality of circuits. The phasor monitoring apparatus comprises a phasor transducer that has an input that receives analog signals representative of parameters of electricity in a circuit of the distribution system, an analog to digital converter that receives the analog signals and outputs a digital data signal representative of the analog signals, a processor coupled to the analog to digital converter to receive the digital data signal output from the analog to digital converter, programming on the processor that computes phasor data representative of the electricity in the circuit based on the digital data received from the analog to digital converter and provides a digital output representative of the phasor data, and a network-compatible port coupled to the processor to transmit the phasor data onto a data network coupled thereto. The phasor monitoring system comprises a data network interconnecting a plurality of phasor transducers each associated with one of the circuits of an electricity distribution system. A phasor array processor is connected to the data network and receives phasor data from a plurality of the phasor transducers connected to the network. The phasor array processor computes combined phasor data for the plurality based upon the phasor data received from the plurality of phasor transducers.

23 Claims, 207 Drawing Sheets

U.S. PATENT DOCUMENTS

| | | | | | |
|---|---|---|---|---|---|
| 4,855,671 | A | | 8/1989 | Fernandes | 324/127 |
| 5,151,866 | A | | 9/1992 | Glaser et al. | 702/66 |
| 5,181,026 | A | | 1/1993 | Granville | 340/870.28 |
| 5,216,621 | A | | 6/1993 | Dickens | 702/58 |
| 5,233,538 | A | | 8/1993 | Wallis | 702/62 |
| 5,237,511 | A | | 8/1993 | Caird et al. | 702/58 |
| 5,247,454 | A | | 9/1993 | Farrington et al. | 702/62 |
| 5,414,812 | A | | 5/1995 | Filip et al. | 707/103 R |
| 5,426,780 | A | | 6/1995 | Gerull et al. | 707/3 |
| 5,428,549 | A | | 6/1995 | Chen | 702/59 |
| 5,455,760 | A | | 10/1995 | Bilas et al. | 700/22 |
| 5,481,700 | A | | 1/1996 | Thuraisingham | 707/9 |
| 5,498,956 | A | | 3/1996 | Kinney et al. | 324/142 |
| 5,572,438 | A | | 11/1996 | Ehlers et al. | 700/295 |
| 5,650,936 | A | | 7/1997 | Loucks et al. | 702/62 |
| 5,671,112 | A | | 9/1997 | Hu et al. | 361/86 |
| 5,736,847 | A | | 4/1998 | Van Doorn et al. | 324/142 |
| 5,768,148 | A | | 6/1998 | Murphy et al. | 700/286 |
| 5,790,977 | A | | 8/1998 | Ezekiel | 702/122 |
| 5,859,596 | A | | 1/1999 | McRae | 340/870.02 |
| 5,991,535 | A | * | 11/1999 | Fowlow et al. | 717/107 |
| 6,430,740 | B1 | * | 8/2002 | Hart et al. | 717/108 |
| 6,456,947 | B1 | * | 9/2002 | Adamiak et al. | 702/59 |

OTHER PUBLICATIONS

"Power System Applications for Phasor Measurement Units", burnett, et al., *IEEE Computer Applications in Power*, Jan., 1994.

Macrodyne Inc. Model 1690 Phasor Measurement Unit, Product Description, Jan. 24, 1995.

"Metering for Transmission Access", Longini Digital KWH Inc., Pittsburgh, PA, 1996, (no month).

"Adaptive Out–Of–Step Relaying Using Phasor Measurement Techniques", Centeno, et al., *IEEE Computer Applications In Power*, Oct. 1993.

* cited by examiner

Phasion ION Moudle Diagram

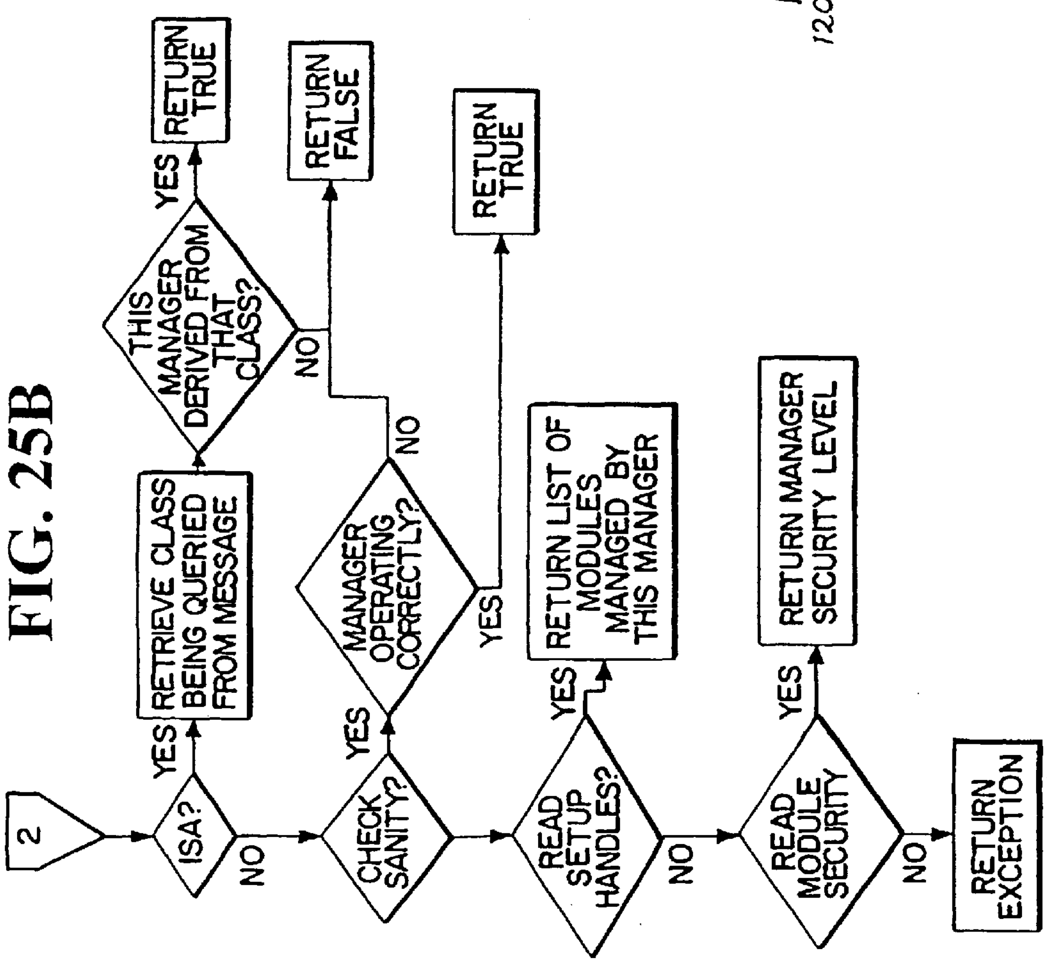
FIG. 25B
FIG. 26
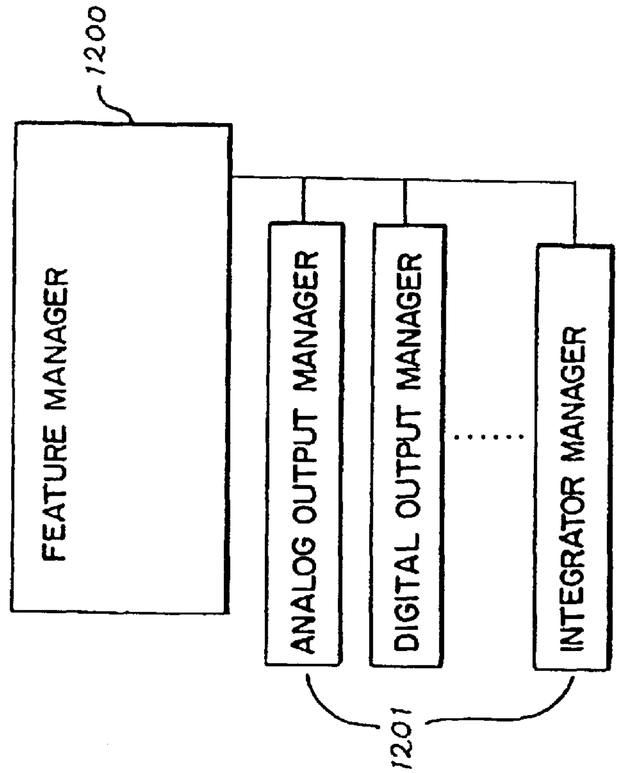

To Fig. 31h ic and/or specifications are the property, trade secrets, or patented ns of CD Power Measurement Ltd. and n strict confidence. No reproduction be made without prior written consent Measurement Ltd.

Figure 33I:
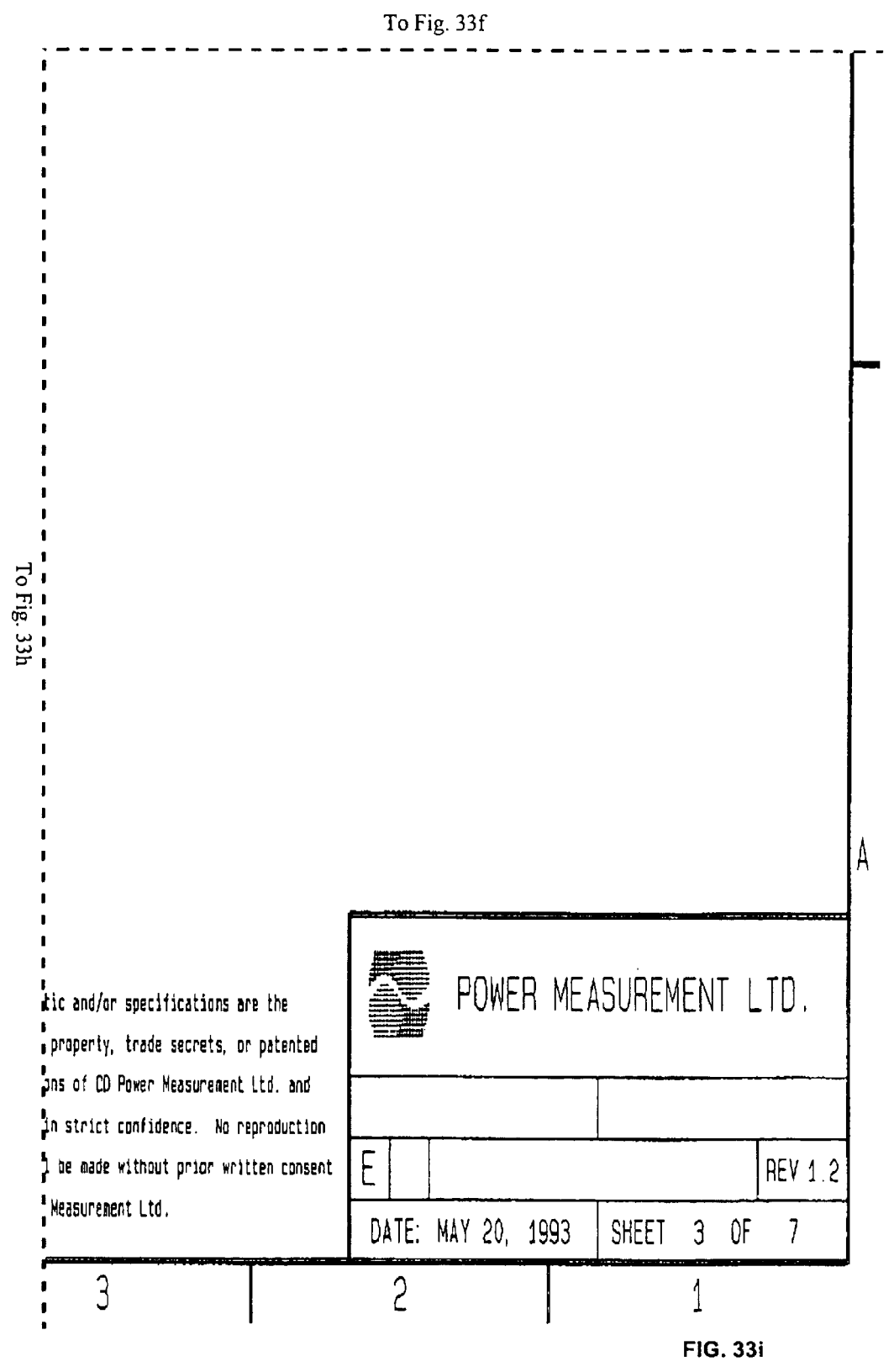

A tic and/or specifications are the
property, trade secrets, or patented
ons of CD Power Measurement Ltd. and
in strict confidence. No reproduction
be made without prior written consent
Measurement Ltd.

POWER MEASUREMENT LTD.

| | | |
|---|---|---|
| E | | REV 1.2 |
| DATE: MAY 20, 1993 | SHEET 3 OF 7 | |

To Fig. 35h ic and/or specifications are the property, trade secrets, or patented ns of CD Power Measurement Ltd. and n strict confidence. No reproduction be made without prior written consent Measurement Ltd.

A and/or specifications are the
operty, trade secrets, or patented
of CD Power Measurement Ltd. and
strict confidence. No reproduction
e made without prior written consent
asurement Ltd.

POWER MEASUREMENT LTD.

E

REV 1.2

DATE: OCT 20, 1993

Figure 40I:
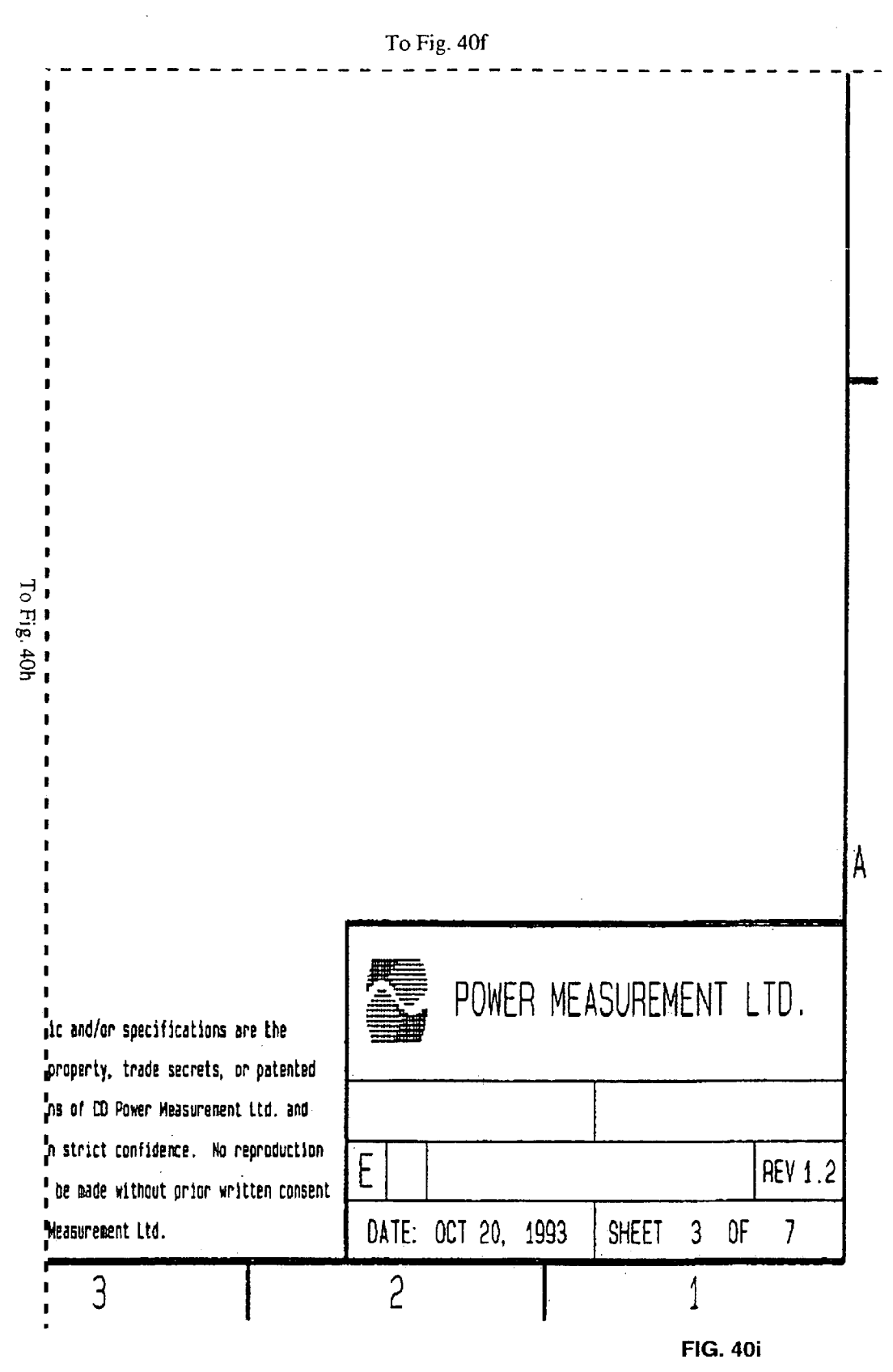

A ic and/or specifications are the
property, trade secrets, or patented
ns of CD Power Measurement Ltd. and
n strict confidence. No reproduction
be made without prior written consent
Measurement Ltd.

POWER MEASUREMENT LTD.

| | | |
|---|---|---|
| E | | REV 1.2 |
| DATE: OCT 20, 1993 | SHEET 3 OF 7 | |

Figure 41I:
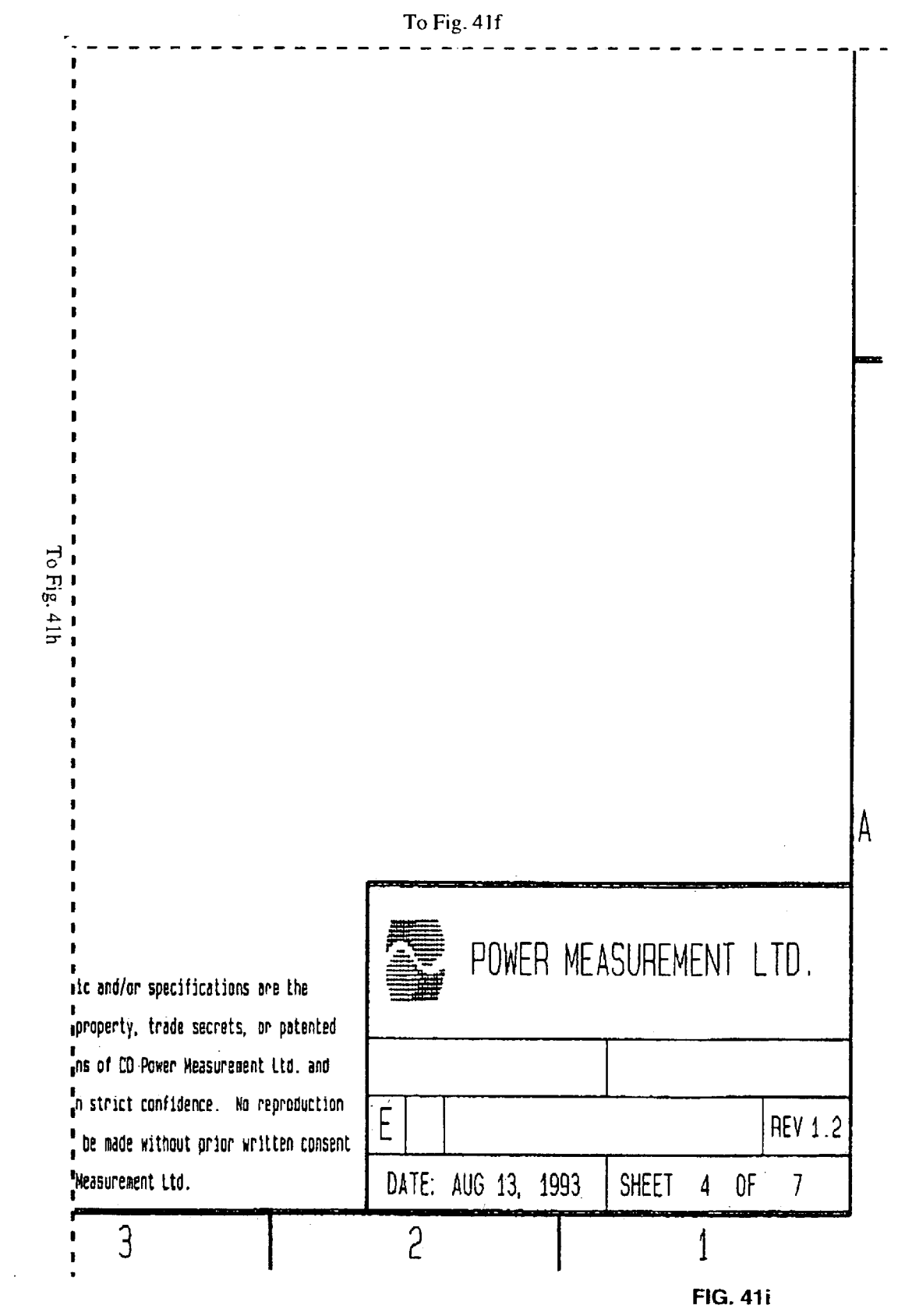

A ic and/or specifications are the
property, trade secrets, or patented
ns of CD Power Measurement Ltd. and
n strict confidence. No reproduction
be made without prior written consent
Measurement Ltd.

POWER MEASUREMENT LTD.

E

REV 1.2

DATE: AUG 13, 1993

PHASOR TRANSDUCER APPARATUS AND SYSTEM FOR PROTECTION, CONTROL, AND MANAGEMENT OF ELECTRICITY DISTRIBUTION SYSTEMS

RELATED APPLICATIONS

This application is a continuation under 37 C.F.R. §1.53 (b) of U.S. application Ser. No. 08/798,723, filed Feb. 12, 1997, abandoned, which is a continuation-in-part of U.S. application Ser. No. 08/369,849, filed Dec. 30, 1994, now U.S. Pat. No. 5,650,936, both of which are incorporated by reference herein. U.S. application Ser. No. 08/798,923 was filed on the same day as and incorporated by reference, U.S. patent application Ser. No. 08/798,724, now U.S. Pat. No. 5,995,911, entitled "DIGITAL SENSOR APPARATUS AND SYSTEM FOR PROTECTION, CONTROL, AND MANAGEMENT OF ELECTRICITY DISTRIBUTION SYSTEMS", filed on Feb. 12, 1997 herewith, the entire disclosure of which is incorporated by reference herein.

REFERENCE TO COMPUTER PROGRAM LISTINGS SUBMITTED ON COMPACT DISK

A compact disk appendix is included containing computer program code listings pursuant to 37 C.F.R. 1.52(e) and is hereby incorporated by reference. The compact disk contains program code files in ASCII format. The total number of compact disks is 1 and the files included on the compact disk are as follows:

| Creation Date | Creation Time | File Size (Bytes) | File Name |
|---|---|---|---|
| 01/28/2003 | 07:42 p | 993,526 | PROB0113.S19 |

BACKGROUND

The present invention relates to systems and components for the protection, control, and/or energy management of electricity distribution systems for electric utility industrial, manufacturing, commercial, and/or institutional use.

Monitoring of electric parameters, such as current, voltage, energy, power, etc., particularly the measuring and calculating of electric parameters, provides valuable information for power utilities and their customers. Monitoring of electric power is important to ensure that the electric power is effectively and efficiently generated, distributed and utilized. Knowledge about power parameters such as volts, amps, watts, phase relationship between waveforms, KWH, KVAR, KVARB, KVA, KVAH, power factor, frequency, etc., is of foremost concern for utilities and industrial power users. In addition monitoring of electricity can be used for control and protection purposes.

Typically, electricity from a utility is fed from a primary substation over a distribution cable to several local substations. At the substations, the supply is transformed by distribution transformers from a relatively high voltage on the distributor cable to a lower voltage at which it is supplied to the end consumer. From the substations, the power is provided to industrial users over a distributed power network that supplies power to various loads. Such loads may include, for example, various power machines.

In such arrangements, utilities need to measure power coming out of or into the generating station or going into a power station. It is important to minimize the phase relationship between the current and voltage waveforms of the power being transmitted to minimize losses. It is also important to minimize the amount of harmonics that are present in the voltage and current waveforms. Also, the ability to detect the presence and magnitude of faults in the power system is important. Thus, accurate measurement of these waveforms is important.

In industrial applications, it is important to continuously monitor the voltage, current, phase, harmonics, faults and three phase balance of the power into the machine. These parameters may vary with the machine load. With knowledge of these parameters, the industrial user can better adjust and manage the loads to control machines, determine alarm conditions and/or more efficiently use the power.

Many protection, control, and metering functions in a modern power distribution system require concurrent knowledge of the states of multiple circuits in the system in order to work efficiently and effectively. Examples include differential protection devices and breaker coordination schemes, Conventional devices and systems have addressed these requirements by various coordination and data sharing arrangements. Many of these approaches suffer from cost, performance, reliability, security, and scalability problems.

Accordingly, it is an objective of the present invention to provide a system that overcomes the disadvantages of the prior art by providing a monitoring system that can be used for protection control, and/or metering of electricity in a electric distribution system.

SUMMARY

To achieve the foregoing and other objectives, there is provided an improved phasor monitoring system and apparatus for use with a distribution system for electricity wherein periodic three phase electricity is distributed in a plurality of circuits. The phasor monitoring apparatus comprises a phasor transducer that has an input that receives analog signals representative of parameters of electricity in a circuit of the distribution system. The phasor transducer also includes an analog to digital converter that receives the analog signals and that outputs a digital data signal representative of the analog signals and a processor coupled to the analog to digital converter to receive the digital data signal output therefrom. Programming on the processor of the phasor transducer computes phasor data representative of the electricity in the circuit based on the digital data received from the analog to digital converter and provides a digital output representative of the phasor data. The phasor transducer also includes a network-compatible port coupled to the processor to transmit the phasor data onto a digital data network.

According to a further aspect, there is provided a phasor monitoring system for use with an electricity distribution system having a plurality of circuits. The phasor monitoring system comprises a data network interconnecting a plurality of phasor transducers. Each phasor transducer is associated with one of the circuits of the electricity distribution system. One or more phasor array processors are connected to the data network to receive phasor data from the plurality of phasor transducers connected to the network. The phasor array processor computes combined phasor data for the plurality of circuits in the electricity distribution system based upon the phasor data received from the plurality of phasor transducers.

According to a further aspect, associated with each of the circuits of the electricity distribution system is a protection device. The protection device is coupled to the data network.

Each of the protection devices is also connected to a circuit breaker associated with one of the circuits. The protection device operates its respective circuit breaker based upon data instructions received over the data network.

BRIEF DESCRIPTION OF THE DRAWINGS

FIGS. 25A and 25B show a flowchart of a preferred embodiment of the logic for the application of a manager.

FIG. 26 schematically illustrates a preferred embodiment of the feature manager.

DETAILED DESCRIPTION OF THE PRESENTLY PREFERRED EMBODIMENTS

1. General

Figure 1:
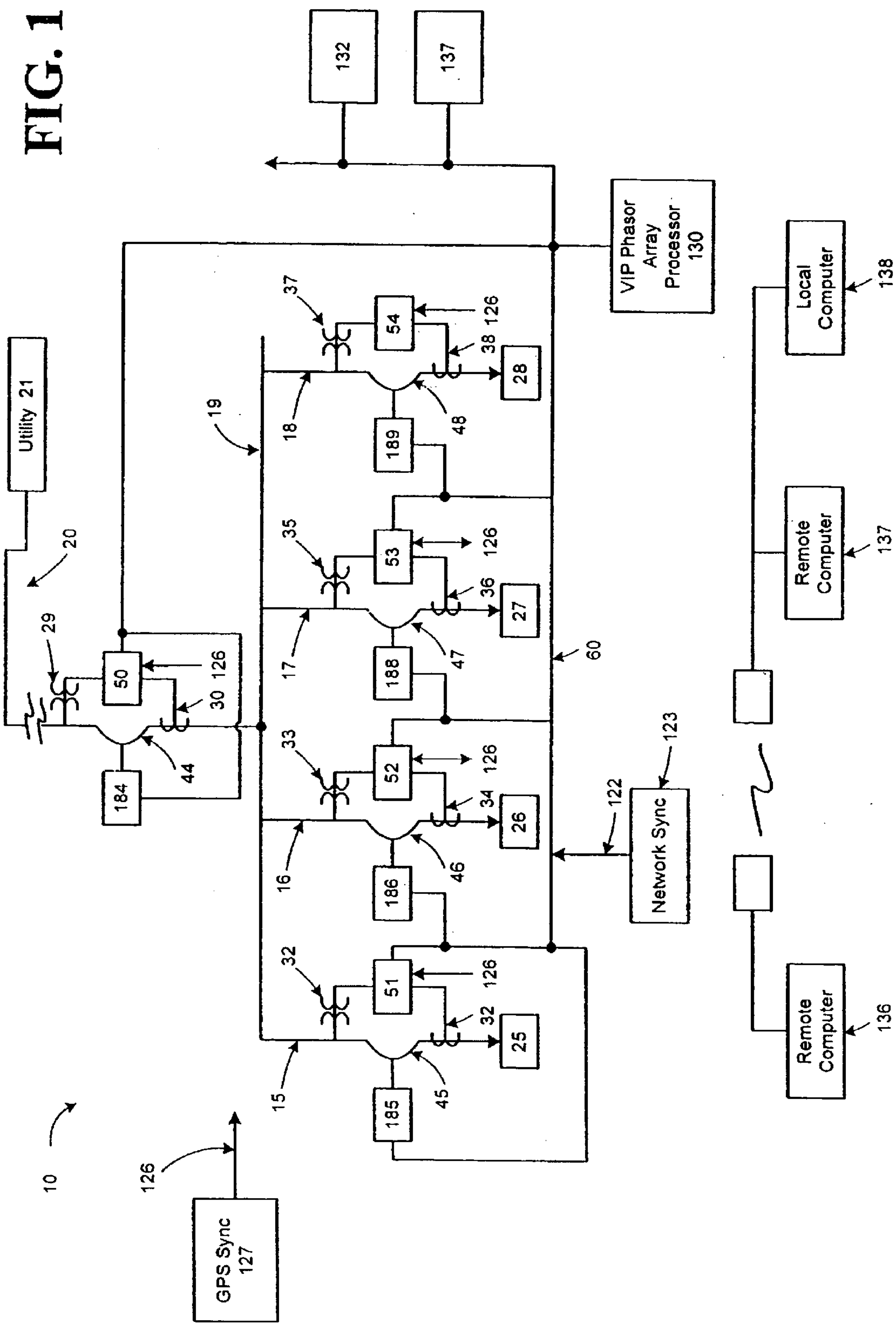
FIG. 1 is a diagram illustrating a distribution system for electricity incorporating embodiments of the present invention.

Referring to FIG. 1, there is illustrated a diagram of an electricity distribution system 10. The electricity distribution system 10 represents a typical distribution system that may be used in factories or utilities, or in industrial, commercial, manufacturing and/or institutional uses. For example, the system 10 may represent a part of a typical three-phase electric switchgear or an electricity distribution substation arrangement. Such an arrangement may be located in a manufacturing facility in which electrical energy is distributed to a plurality of loads, which may be various types of machines, motors, welding equipment, furnaces, mills, etc.

The distribution system 10 receives electric power over a power line 20 from an electric utility 21. In the electricity distribution system 10, three phase electric power is distributed over a plurality of three-phase electric circuits, such as electric circuits 14, 15, 16, 17, and 18. Although only five three-phase circuits are illustrated in FIG. 1, it is understood that the distribution system 10 may typically include many more such circuits.

As further illustrated in FIG. 1, one of the circuits, i.e. the circuit 14 is a main circuit. The main circuit 14 feeds electricity to a three-phase substation bus 19. Multiple feeder or branch circuits, such as the three-phase circuits 15, 16, 1 7, and 1 8, obtain the three-phase electric power from the substation bus 19. The feeder circuits 14, 15, 16, 17, and 18 distribute the electric power to a plurality of loads 25, 26, 27, and 28. (Note that instead of distributing electricity directly to a load, any of the feeder circuits, such as feeder circuits 15, 16, 17, and 18, may feed electricity to additional distribution feeder circuits which in turn may distribute electricity either directly to loads or to still additional feeder circuits. Also, note that the "load" for the main circuit 14 may be regarded as the combined loads of the feeder circuits 15–18.) The electricity distribution system 10 may also include numerous other components found in typical installations, such as switches and transformers.

Voltage sensors and current sensors are associated with each of the circuits. In one embodiment, a voltage sensor and a current sensor are associated with each of the phase conductors of each the circuits. For example voltage sensors 29 and current sensors 30 are associated with the three phase conductors of the main circuit 14; voltage sensors 31 and current sensors 32 are associated with the three phase conductors of the feeder circuit 15, and so on. Also associated with each of the electric circuits 14, 15, 16, 17, and 18, is a circuit breaker, such as circuit breakers 44, 45, 46, 47, and 48. Although each of the circuits in the system 10 of FIG. 1 has voltage and current sensors associated with it, in alternative embodiments, the electric distribution system 10 may include additional electric circuits that do have voltage and current sensors associated with them. In one embodiment, the voltage and current sensors 29 and 30 associated with each circuit sense the power waveform for that circuit and provide an analog output representative thereof. In addition, although the embodiment of FIG. 1 shows voltage sensors and current sensors associated with each of the circuits in the installation, in alternative embodiment, some or all of the circuits may have only current sensors and no voltage sensors and similarly, some or all of the circuits may have voltage sensors and no current sensors.

2. Phasor Transducer

Referring still to FIG. 1, associated with each of the circuits is a phasor transducer. For example, associated with the main circuit 14 is a phasor transducer 50, associated with the feeder circuit 15 is a phasor transducer 51, and so on. Each phasor transducer is connected to receive the outputs from the voltage and current sensors associated with its respective circuit. For example, the phasor transducer 50, which is associated with the main circuit 14 is connected to and receives the outputs from the voltage sensors 29 and the current sensors 30; the phasor transducer 51, which is associated with the branch circuit 15, is connected to and receives the outputs from the voltage sensors 31 and the current sensors 32; and so on. Each of the phasor transducers is connected to a digital data transmission network 60, as described in more detail below.

Figure 2:
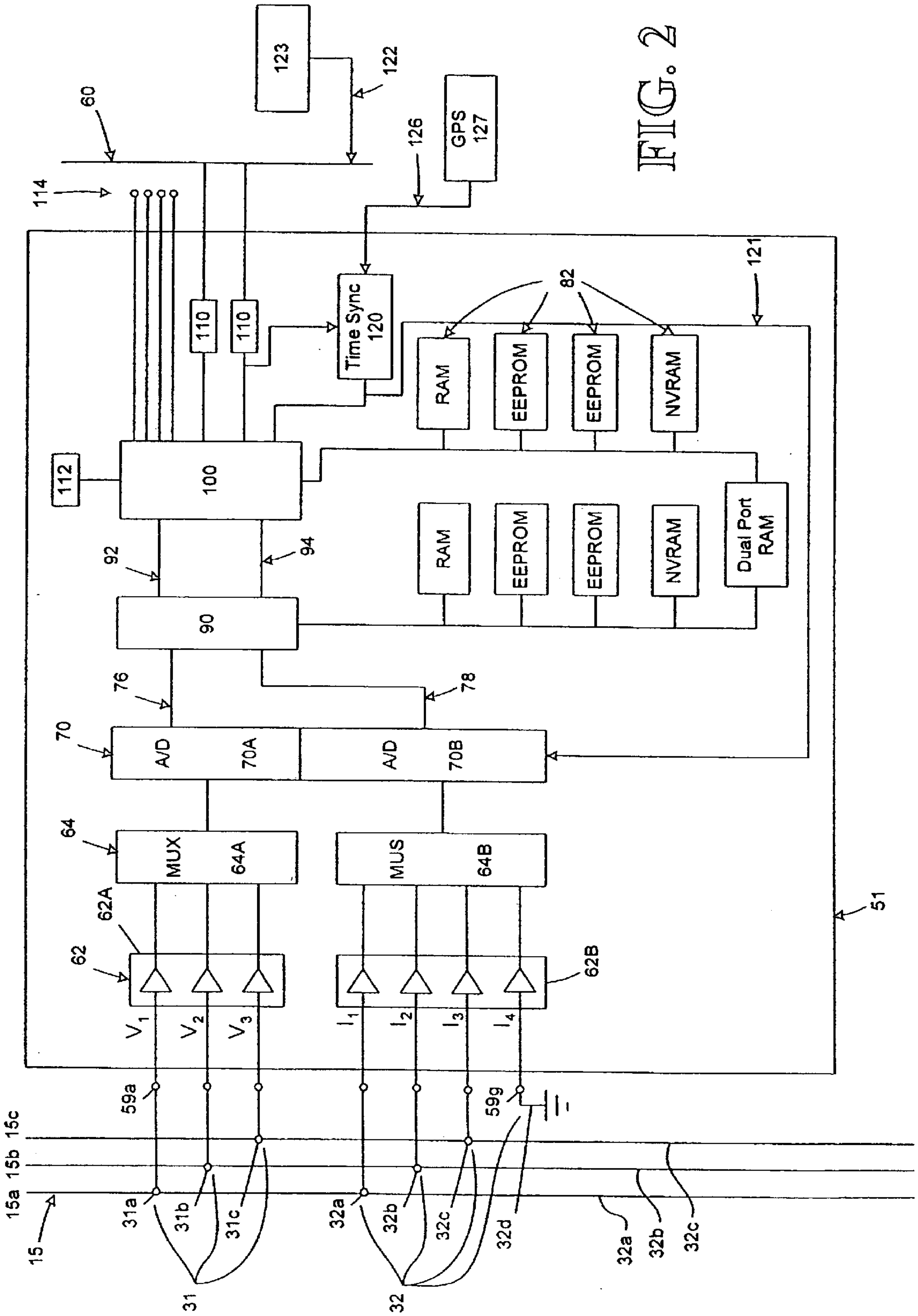
FIG. 2 is a schematic diagram of a phasor transducer device in FIG. 1.

Referring to FIG. 2, the branch circuit 15 is shown to comprise three phase conductors, 15A, 15B, and 15C. The voltage sensors 31 are shown to comprise individual voltage sensors 31A, 31B, and 31C, each associated with its own respective phase conductor. The current sensors 32 are shown to comprise the three current sensors. 32A, 32B, and 32C, each associated with its own respective phase conductor, 15A, 15B, and 15C. The current sensors 32 also include the current sensor 32D which is associated with the ground or neutral conductor in the circuit 15 and which measures the ground or neutral current in the circuit 15. In one embodiment, the voltage and current sensors may be implemented using conventional technology. For example, the voltage sensors may be conventional voltage transformers (e.g. PT's) and the current sensors may be conventional current transformers (e.g. CT's). (In low voltage systems the PT's may be omitted.)

FIG. 2 shows a block diagram of the phasor transducer 51. The other phasor transducers, 50, 52, 53, and 54, as well as any other phasor transducers that may be associated with other circuits in the system 10, may be similar or identical in construction to the phasor transducer 51. The phasor transducer 51 has a plurality of inputs 59A–59G to which the outputs of the voltage sensors 31 and current sensors 32 are coupled. The phasor transducer 51 includes a conditioner unit 62. The conditioner unit 62 receives the voltage and current sensor signals from the inputs 59A–59G. The conditioner unit 62 comprises two parts: a voltage conditioner stage 62A and a current conditioner stage 62B. Each of the voltage signals, V1, V2, and V3 received from the voltage sensors 31A, 31B, and 31C via the inputs 59A, 59B, and 59C are separately conditioned in the voltage conditioner stage 62A to provide low level analog signals. Each of the current signals, 11, 12, 13, and 14, received from the current sensors 32A, 32B, 32C, and 32D via the inputs 59D, 59E, 59F and 59G are separately conditioned in the current conditioner stage 62B to provide low level analog signals.

The low level analog signals from the conditioner unit 62 are sent to a multiplexer 64. The multiplexer 64 includes two parts or stages: a first stage 64A of the multiplexer 64 receives the low level analog signals representing the voltage signals from the voltage conditioning stage 62A and a second stage 64B of the multiplexer 64 receives the low level analog signals representing the current signals from the current condition stage 62B.

Each stage of the multiplexer 64 operates to select in turn which of the conditioned analog signals from the conditioner unit 62 is to be output from the multiplexer 64 to an analog to digital converter 70. The analog to digital converter 70 includes two portions: a first analog to digital converter portion 70A and a second analog to digital converter portion 70B. The first analog to digital converter portion 70A receives the output of the first stage 64A of the multiplexer 64, including the selected one of the voltage signals. The second analog to digital converter portion 70B receives the output of the second stage 64B of the multiplexer 64 including the selected one of the current signals, 11, 12, 13, and 14. The analog to digital converter 70 repeatedly samples the analog signals and converts the samples to digital value outputs 76 and 78 which represent the magnitudes of the analog voltage and current signals at the instant that they were sampled. The digital value outputs 76 and 78 generated by the analog to digital converter 70 are output to buffers 82. The digital value outputs 76 and 78 are retrieved from the buffers 82 by a digital signal processor 90 which computes phasor data 92 and 94 from the digitally-sampled data, as explained further below. The digital signal processor 90 outputs the phasor data 92 and 94 to a phasor transducer local microprocessor 100.

The phasor transducer local microprocessor 100 is coupled to one or more communication ports 10 that connect the phasor transducer 51 to the network 60. The communication port 110 may be a conventional network-compatible port such as a 10 base T ethernet port. The phasor transducer 51 may, optionally, include a local display 112 coupled to the local microprocessor 100. The local display 112 may be used to provide a local visual display of data, including volts, amps, watts, vars, power factor, frequency, etc., as well as provide energy consumption recording of kwh, kvarh, kvah import, export and totals for each circuit, or any combination of circuits. The phasor transducer 51 may also include auxiliary local I/O ports 114 also coupled to the local microprocessor 100.

The phasor transducer 51 also includes a local synchronization circuit 120. In a preferred embodiment, the local synchronization circuit 120 utilizes two processes to provide a highly accurate local synchronization timing clock signal 121 internal to the phasor transducer. First, the local synchronization circuit 120 receives a network synchronization signal 122 on an input port, such as data port 110, which is connected to the network 60. This network synchronization signal 122 (which may be in a conventional UNIX time format) is generated by a network timing reference 123 coupled to the data network 60. The network synchronization signal 122 synchronizes the synchronization circuit 120 to within approximately 10 to 200 milliseconds.

Referring to FIGS. 1 and 2, in a preferred embodiment, the synchronization circuit 120 also receives a GPS-signal 126. The GPS-signal 126 is obtained from a GPS receiver system 127. The GPS-signal 126 is provided to each of the phasor transducers 51–54 used in the electricity distribution system 10. The GPS receiver system 127 may be a conventional type of GPS receiver that obtains GPS information and provides the GPS signal 126 as an output. In one embodiment, a single GPS receiver may be used for the entire installation containing the electricity distribution system 10. Alternatively, more than one GPS-receiver 127 may be used in the installation containing the electricity distribution system 10 and some of the phasor transducers may be coupled to receive a GPS signal from one of the GPS receivers and others of the phasor transducer may receive a GPS signal from another of the GPS receivers. A single GPS receiver may be appropriate if the installation containing the electricity distribution system 10 does not cover too large a geographic area since propagation delays from the GPS receiver to the phasor transducers should be taken into account. The GPS output signal 126 may be distributed to each of the phasor transducers by a suitable communication means, such a twisted pair, coaxial cable, wireless, and so on. In a still further embodiment, each of the phasor transducers 51–54 may have its own GPS receiver located internally thereto.

The GPS-signal 126 is used to fine tune the local synchronization circuit timing clock signal 121 to within approximately 1 microsecond. Using both the network synchronization signal 122 and the GPS signal 126, the local synchronization circuit 120 outputs the local synchronization timing clock signal 121 to the local microprocessor 100 and to the analog-to-digital converters 70A and 70B.

The local microprocessor 100 receives the phasor data 92 and 94 from the digital signal processor 90 and applies a time stamp to the data using the local synchronization signal 121 from the synchronization circuit 120. The local microprocessor 100 outputs the phasor data as digital data and transmits the phasor data output in real time via the ports 110 onto the network 60. Optionally, the local microprocessor 100 may process some or all of the phasor data prior to transmitting them in real time over the network 60, as explained below.

3. The Data Network

As mentioned above in connection with FIG. 1, the phasor transducers 50, 51, 52, 53 and 54 are connected to the data transmission network 60. The data transmission network 60 provides real time data communication among the various components connected to the network. The data transmission network 60 may be implemented using conventional local area network (LAN) or wide area network (WAN) technology. The network 60 may use conventional communications protocols, such as point-to-point or multi-point data transmission. The network 60 should be able to sustain the data flow generated by the various devices. Data propagation times should be short, deterministic and reliable.

Also connected to the data transmission network 60 are at least one and preferably several phasor array processors, such as a first phasor array processor 130, a second phasor array processor 131, a third phasor array processor 132 and so on. These phasor array processors 130, 131, and 132 are connected as nodes on the network 60. It is understood that although only three phasor array processors are illustrated in FIG. 1, there may be many more phasor array processors connected to the network 60 in a typical embodiment. The structure and function of the phasor array processors are explained below.

The data transmission network 60 enables real time data communication between each of the phasor transducers 50, 51, 52, 53, and 54 and the phasor array processors 130, 131, and 132. In addition, in a preferred embodiment, the data transmission network 60 enables data communication between the phasor array processors 130, 131, and 132, and further, the data transmission network 60 enables communication among the phasor transducers, if desired, and between the phasor transducers and the second and third phasor array processors 131 and 132. Still further, the first phasor array processor 130 may be connected to local computers or remote computers, such as 136. 137, and 138, that are also connected to the network 60, either locally or remotely. There may also be connected to the network other equipment such as programmable logic controllers and digital control systems.

In one embodiment, a TCP/IP ethernet communications network is used. TCP/IP ethernet is used due to its high data throughput capabilities and its ability to be easily segmented to control data loading and propagation times. For example, if each phasor transducer computes and transmits voltages and current phasor arrays for all three phases of every cycle, and each phasor array has typically six elements for the odd harmonics, 1 to 11, the data throughput required per phasor traducer is approximately 300 kbaud including overheads. If a typical substation has sixteen circuits, then the total data throughput would be about 4800 kbaud. This is within the capabilities of LAN or WAN technology, such as 10 base T ethernet, asynchronous transfer mode (ATM), or FDDI.

In alternative embodiments, the network may include digital radio or fiber optic data transmission techniques to couple the data. These alternatives also provide the advantage of providing electrical isolation between the various transducers, phasor array processor, and other nodes.

4. The Phasor Array Processor

The phasor array processors, 130, 131, and 132, are microprocessor or computer-based devices that function as nodes to receive data over the network 60 from the phasor transducers or from other phasor array processors. For example, any one or more of the phasor array processors may include the appropriate hardware and software to receive and process data from the phasor transducers, such as the data output from the phasor transducer 51 on its output ports 110 in FIG. 2.

Each of the phasor array processors may be implemented using a general purpose computer platform, such as an IBM-compatible personal computer. Alternatively, the phasor array processors may be implemented using a custom-designed computing device. A custom-designed computing device may be used for higher performance for specific tasks. Custom-designed devices may include multiple processors or digital signal processors for very fast computational capabilities. A task-specific hardware platform, such as a 7700 ION, manufactured by Power Measurement Ltd., of Victoria, BC, may be used.

The phasor array processor is preferably equipped with suitable hardware, such as RS-232, RS-485, ethernet or other industry standard communications ports, so that it is network-compatible with the network 60. The phasor array processor 130 may also be equipped with multiple communication ports which would allow it to connect to multiple phasor transducer devices or multiple central computers, or to allow multiple phasor array processors to be connected to a remote computer.

5. Protection Devices on the Data Network

Also connected to the data transmission network 60 are one or more protection devices (also referred to as protection device nodes). In one embodiment a protection device is associated with each of the circuits. For example, a first protection device 184 is associated with the first circuit 14, a second protection device node 185 is associated with the second circuit 15, and so on. Alternatively, there may be more or fewer protection devices than circuits. The protection devices are microprocessor or computer-based devices or nodes that can receive data over the network 60 from the phasor transducers 50–54 or the phasor array processors 130–132, as well as from other devices on the network 60. In a preferred embodiment, the protection devices process data using object-oriented program modules, as explained in more detail below.

The protection devices may be implemented using a general purpose computer platform. For example, the protection device node may implemented on an IBM-compatible personal computer or on a task-specific hardware platform. Each protection device is preferably equipped with suitable hardware, such as RS-232, RS-485, ethernet or other industry standard communications ports, so that it is network-compatible with the network 60. Each of the protection devices has one or more outputs that are connected to the circuit breakers associated with the circuits. In the embodiment wherein there is one protection device for each circuit, each of the protection devices may have a single output coupled to its respective circuit breaker for its respective circuit. For example, the output of the first protection device 184 is connected to the circuit breaker 44 associated with the main circuit 14, the output of the protection device 185 is connected to the circuit breaker 45 associated with the branch circuit 15, and so on. In the alternative embodiment where there are fewer protection devices than circuits, at least one of the protection devices has more than one output and is coupled to more than one of the circuit breakers.

The protection devices may be coupled directly to the circuit breakers, or alternatively, each of the protection devices may have a data output that is coupled to the data network 60. In this latter embodiment, the circuit breakers 44–48 each have a port coupled to the network 60 to receive data addressed thereto from the one or more protection devices.

In one embodiment, a first protection device operates to provide outputs to some or all of the circuit breakers in the distribution system. Another protection device operates to back up the first protection device. According to this embodiment, the second protection device is configured similar to the first protection device so that its operation follows that of the first protection device. The second protection device takes over for the operation of the first protection device if the first protection device fails.

6. Operations and Program Objects

The phasor array processors have four principle functions: protection, control energy management, and systems diagnostics. An individual phasor array processor can provide any combination of these functions depending on the hardware, software, and/or software/firmware and the requirements of the user.

According to a present embodiment, the phasor transducers and phasor array processor(s) include appropriate software, such as programming and logic, to implement the desired functions, features, and operations. The software may be implemented in alternative ways including various programming languages, scripts, and architectures, and combinations of software and firmware, etc. In one preferred embodiment, the phasor transducers, phasor array processors, and other components on the network 60 interact internally and with each other using an object-oriented programming architecture. One preferred object-oriented programming approach is disclosed in the copending patent application Ser. No. 08/369,849, now U.S. Pat. No. 5,650,936, the entire disclosure of which, including the microfiche appendix, is incorporated by reference herein and the text of which is replicated below.

If a phasor array processor is implemented using an IBM-compatible personal computer, the personal computer may run the Virtual ION Processor software developed by Power Measurement Ltd. of Victoria, BC. This software allows standard ION modules to be implemented on an IBM-compatible personal computer. The ION communication architecture allows the inputs or outputs of any ION module on the phasor array processor to be linked to the inputs or outputs of any ION module on the phasor transducers via standard communications networks.

ION Architectural Description (Incorporated from U.S. Pat. No. 5,650,936)

An object oriented architecture is used within individual monitoring units. The monitoring devices include circuitry which receives an electrical signal and generates at least one digital signal representing the electrical signal. Objects within such individual monitoring units include modules which perform a function and registers which contain the inputs, outputs and setup information for the modules. Methods can be invoked on all objects to change or query the operation or configuration of the device. At least one of the modules receives the digital signal as an input and uses the signal to generate measured parameters. Additional modules take measured parameters as input and generate additional parameters therefrom. The module may be linked in an arbitrary manner to form arbitrary functional blocks.

The present embodiments relate generally to digital power monitoring. More specifically, the embodiments relate to a digital power monitoring system using an object oriented structure. The present embodiments also generally relate to an improved object oriented structure.

Monitoring of electrical power, particularly the measuring and calculating of electrical parameters, provides valuable information for power utilities and their customers. Monitoring of electrical power is important to ensure that the electrical power is effectively and efficiently generated, distributed and utilized. As described in more detail below, knowledge about power parameters such as volts, amps, watts, phase relationship between waveforms, KWH, KVAR, KVARH, KVA, KVAH, power factor, frequency, etc. is of foremost concern for utilities and industrial power users.

Typically, electricity from a utility is fed from a primary substation over a distribution cable to several local substations. At the substations, the supply is transformed by distribution transformers from a relatively high voltage on the distributor cable to the lower voltage at which it is supplied to the end consumer. From the substations, the power is provided to industrial users over a distributed power network which supplies power to various loads. Such loads may be, for example, various power machines.

In such arrangements, utilities need to measure power coming out of the generating station or going into a power station. It is also important to minimize the phase relationship between the current and voltage waveforms of the power being transmitted to minimize losses. Thus, accurate measurement of these waveforms is important.

In industrial applications, it is important to continuously monitor the voltage, current and phase of the power into the machine. These parameters may vary with the machine load. With knowledge of these parameters the industrial user can better adjust, and control the loads to control machines, determine alarm conditions and/or to more efficiently use the power.

Various different arrangements are presently available for monitoring, measuring, and controlling power parameters. Typically, an individual power measuring device which measures specific power system parameters is placed on a given branch or line proximate one of the loads. Such power monitoring devices measure electrical power parameters, such as those described above.

An example of such a system is disclosed in U.S. Pat. No. 5,151,866. In the system disclosed in this patent, a power analyzer system uses discrete analog transducers to convert AC voltage and current signals from a power system to DC output signals. The values from the voltage and the current transducers are then used to calculate the various other desired power parameters.

In addition to monitoring power parameters of a certain load, power monitoring devices have a variety of other applications. For example, power monitoring devices can be used in supervisory control and data acquisition systems (SCADA), process controllers (PLC), etc.

As discussed briefly above, in industrial applications, a plurality of the power monitoring units are placed on the branches of a power distribution system near the loads. The monitoring units are connected through a communication network to at least one central computer. An example of such system is disclosed in Siemens Power Engineering & Automation VII (1085) No. 3, Pg. 169, Microprocessor—Based Station Control System For New And Existing Switchgear, Muller et al.

In fact, many other applications also use a network of devices interconnected through some sort of communication media. Often, the network is composed of a large number of slave devices with a much smaller number of master devices. A master device is any device that can query another device or change the configuration of another device. A slave device is a device that performs a function, and produces results that can be accessed by another device. It is possible for a single device to act as a master and a slave. In the power monitoring system described above, the central computer is the master device and the individual power monitoring units are the slave devices.

The architecture of the slave devices is such that they contain a large number of registers. Some of these registers contain output values from the slave device which can be read by the master and some of these registers contain setup information for the slave device which the master can read or write. The master device must know which registers contain which information for every different slave device. For instance the master device would know that a certain device measures volts and it would know that volts are stored in a particular register. Therefore, in order for the master to retrieve a reading of volts from the slave device it must send a request (communications packet) to the slave device indicating that it requires a packet containing the number in the respective register.

With this approach, the master device(s) must have a large amount of knowledge about the configuration of the remote devices. This requires large amounts of storage space on the master device(s). Also, if the characteristics of a slave device are changed, or a new type of slave device is added, the master device(s) must be reprogrammed. If the slave devices go through a large number of changes, the master device(s) must retain information about the slave devices for all intermediate versions to retain backward compatibility. This further increases the memory and processing power requirement for the master device(s).

In the configuration where the slave device is field programmable, the master device(s) must have some means of determining the slave device's current configuration. In addition the master device(s) must be able to change the slave device's configuration. This invariably means that the master device(s) must know all the possible configurations of the remote device which again increases the memory and processing power required for the master device.

Further, if there are multiple masters changing the configuration of the same slave device, it is difficult for the masters to keep track of the current configuration of the device. Each master has its own local copy of the current configuration of the slave device. When another master changes the configuration of the device, the first master's local copy is not updated. Thus, the first master may think the device is executing a function it no longer is.

If the configuration of a slave device is not configurable or if the slave device has limited configurability, the slave device may be using its available resources (memory and processing power) to perform functions that the user has no interest in. Therefore, the slave device may perform many functions that are not required, but may be missing some functions that are required by a certain user.

Systems are available which use an object oriented approach to program a computer to connect the outputs of a number of remote devices to local functions on the computer and to the inputs of other devices. U.S. Pat. Nos. 4,901,221, 4,914,568 and 5,155,836 disclose such systems where a central digital computer is connected to a number of remote devices. In the systems disclosed in these patents, however, the object oriented structure resides on the central digital computer and all information must travel through the central computer. Therefore, the speed of the system is limited to the speed of the communications channels between the computer and the remote devices and the speed of the computer. Further, although the structure on the computer can be modified through the object oriented architecture the slave devices cannot be easily modified or updated.

Systems are also available which allow reprogramming of a slave device. For example, such a system is disclosed in U.S. Pat. No. 5,155,836. The controlling logic within these devices, however, does not allow the reconfiguration of the device while other functions within the device continue to operate. The user must compile and download firmware in order to implement a different control program. The downloading process interrupts the operation of the device.

Therefore, in view of the above it is a primary object of the present embodiments to provide a power monitor which can be readily configured to exactly match a user's unique requirements.

It is a further object of the present embodiments to provide a power monitoring system where it is not necessary to change the software on a master device when a slave device is upgraded.

It is a further object of the present embodiments to provide a power monitoring system where the storage space memory and/or processing power required for master device (s) is minimized.

It is still a further object of the present embodiments to provide a power monitoring system where master device(s) can accurately and easily track changes or modifications in the configuration of individual monitoring units devices.

To achieve these and other objectives, the present embodiments use an object oriented architecture within individual digital devices, such as monitoring devices. The monitoring devices include circuitry which receives an electrical signal and generates at least one digital signal representing the electrical signal. Objects within such individual monitoring units include modules which perform a function and preferably registers which contain the inputs, outputs and setup information for the modules. Methods can be invoked on all objects to change or query the operation or configuration of the device. At least one of the modules receives the digital signal as an input and uses the signal to generate measured parameters. Additional modules take measured parameters as input and generate additional parameters therefrom.

In one preferred embodiment, the monitoring device includes transducers which measure voltage and current from a power line.

In another preferred embodiment, a flow controller is used to control the operation of the modules. A feature manager provides a means for accessing the entire device.

Since, the objects reside inside the individual slave devices the communication between the different objects is limited only by the processing speed of the individual monitoring units and not by the speed of the communications media between the devices. With this arrangement the number of slave devices connected to a single master is virtually unlimited since no communication between the devices is required unless a specific request from the user is made.

The operations that the monitoring unit performs are configured by a master device executing methods which instruct the monitoring unit to connect modules to registers. The objects can be programmed and linked in totally arbitrary ways, enabling the user to build arbitrary functional blocks consisting of networks of objects.

Many modifications to the preferred embodiment will be apparent to those skilled in the art. It is the intention of this description to provide an example system using the disclosed embodiments.

The present embodiments comprise a novel system with an object oriented structure. The novel system and architecture are particularly useful for configuring a power monitoring unit to perform given functions and causing the unit to execute those functions.

Figure 8:
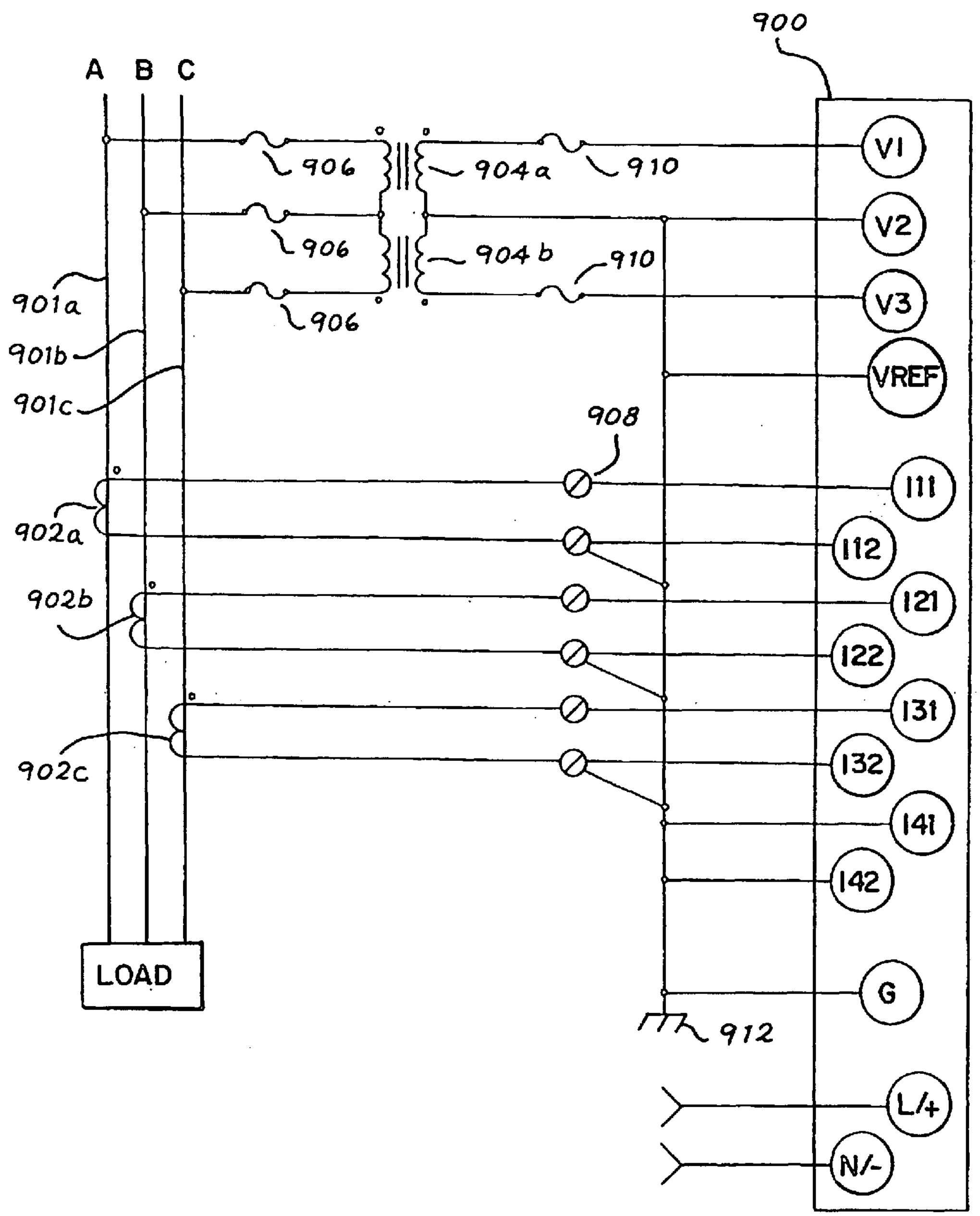
FIG. 8 schematically represents a preferred embodiment of a system using a power monitoring unit of the present invention.

FIG. 8 schematically illustrates how a power monitoring unit 900 using the present embodiments is connectable to a three wire power line. Three current transducers (CTs) 902A, 902B and 902C are connected to wires 901A, 901B and 901C of the power line, respectively. Potential transducers (PTs) 904A and 904B are connected between lines 901A, 901B and 901B, 901C, respectively. A plurality of fuses 906 are disposed between the lines 901A–901C and Pts 904A and 904B. Fuses 910 are connected between Pts 904A and 904B and unit 900.

The CTs 902A–902C are connected through a shorting switch or test block 908 to the power monitoring unit 900. The CTs 902A–902C provide the power monitoring unit 900 with current inputs 111–132. The PTs 904A and 904B provide the power monitoring unit 900 with voltage inputs V1–V3. Current inputs 141 and 142, chassis ground 912 and voltage input VREF are connected to ground potential. The unit 900 is connected to a power supply, such as a standard 120 V AC supply, through power leads L and N.

Figure 9:
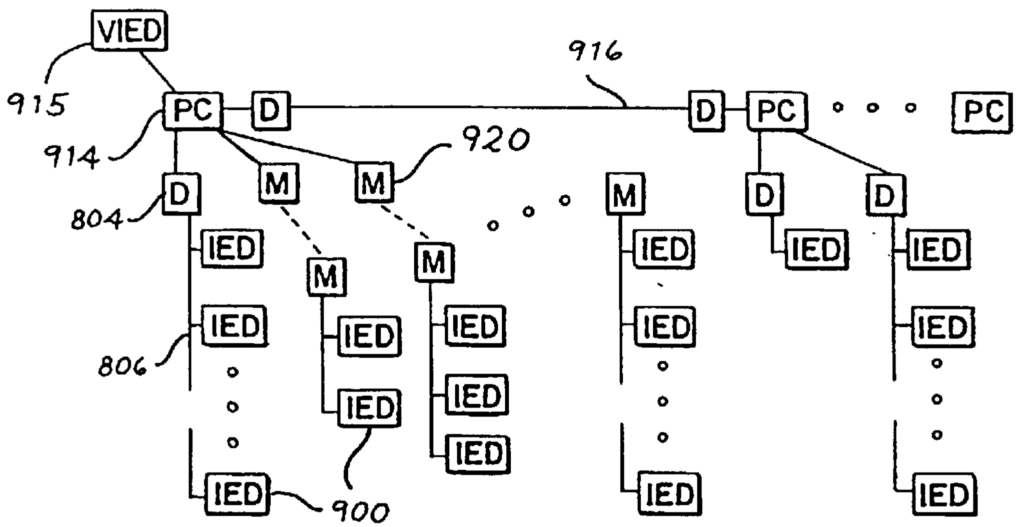
FIG. 9 schematically illustrates a preferred embodiment of a physical layout of a preferred embodiment of a system of the present invention.
Figure 11:
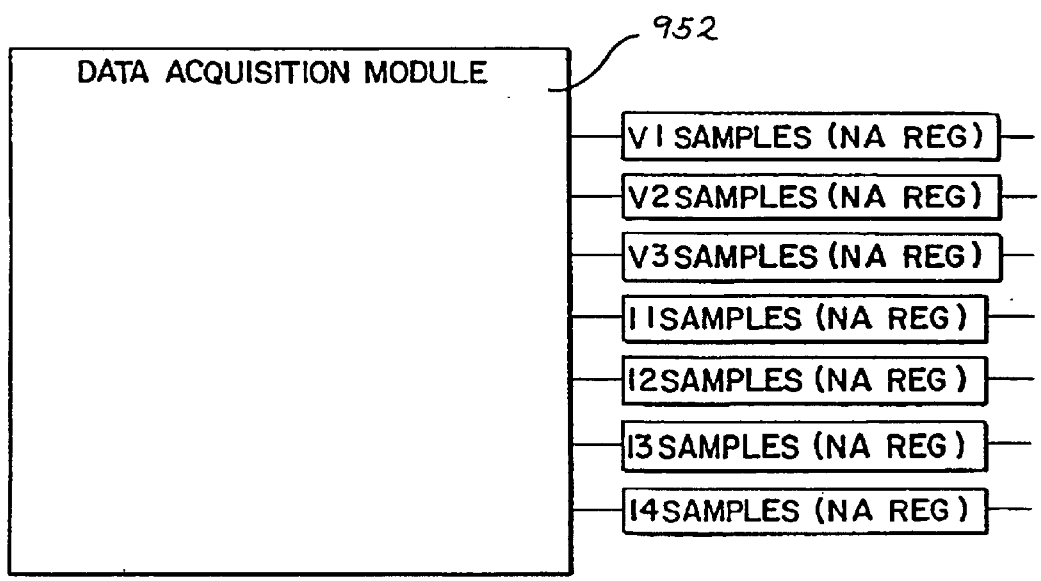
FIG. 11 schematically illustrates a preferred embodiment of the data acquisition module and its respective registers.

FIG. 9 shows a preferred embodiment of the physical layout of a plurality of monitoring units 900 in a system using the present embodiments. The system comprises one or more personal computers (PCs) 914 which are used as master devices. A plurality of monitoring units 900 configured as intelligent electronic devices (IEDs) are used as slave devices. Virtual intelligent electronic devices (VIEDs) 915 which reside in software on the personal computer 914 can also serve as slave devices. All devices in the system are interconnected through a communication network 916. The network may be directly connected to devices or may connect through other communications devices such as modems 912. Preferably, the IEDs, PCs and VIEDs all have an object oriented architecture as described in detail below.

To fully appreciate the present embodiments, an understanding of the principals of basic object oriented structures is necessary. Therefore, a brief description of the type of architecture is given here. (A more detailed discussion of the principles of object oriented structures is given in “SMALLTALK-80 The Language And Its Implementation,” Goldberg and Robson, 1983 (from which some of the following definitions are taken)). An object consists of some private memory and a set of operations. An object has state, behavior and identity. The nature of the object's operations depends on the type of component it represents. For example, objects representing numbers compute arithmetic functions, and objects representing data structures store and retrieve information. A key component of object oriented architecture is encapsulation. Encapsulation is the process of hiding all of the details of an object, as well as the implementation of its methods. In an object oriented system, in order for an object to carry out one of its operations, a request must be made which specifies which operation is desired. The request is called a “message”. Importantly, because of encapsulation in object oriented architecture, the message does not specify how that operation is to be carried out. The "receiver", the object to which the message was sent, determines how to carry out the requested operation. The set of messages to which an object can respond is called its "interface" with the rest of the system. The only way to interact with an object is through its interface. A crucial property of an object is that its private memory can be manipulated only by its own operations. Messages are the only way to invoke an object's operations. These properties ensure that the implementation of one object cannot depend on the internal details of other objects, only on the messages to which they respond.

Messages ensure the modularity of the system because they specify the type of operation desired, but not how the operation should be accomplished.

Other important components of object oriented architecture are "classes" and "instances". A class describes the implementation of a set of objects that all represent the same kind of component. The individual objects described by a class are called its instances. A class describes the form of its instances' private memories and it describes how they carry out their operations. Even an object that represents a unique component is implemented as a single instance of a class. The instances of a class are similar in both their public and private properties. An object's public properties are the messages that make up its interface. All instances of a class have the same message interface since they represent the same kind of component. An object's private properties are a set of instance variables that make up its private memory and a set of methods that describe how to carry out its operations. The instance variables and methods are not directly available to other objects. The instances of a class all use the same set of methods to describe their operation.

Each method in a class tells how to perform the operation requested by a particular type of message. When that type of message is sent to any instance of the class, the method is executed. A class includes a method for each type of operation its instances can perform. The method may specify some changes to the object's private memory and/or some other messages to be sent. A method also specifies a value that should be returned. An object's methods can access the object's own instance variables, but not those of any other objects.

Another important aspect of the objects within the device is that they are independent or autonomous. In other words, any change in the configuration of one object on a slave by a master device does not affect the operation of the other objects on the slave device (or any objects on the master device).

Figure 10:
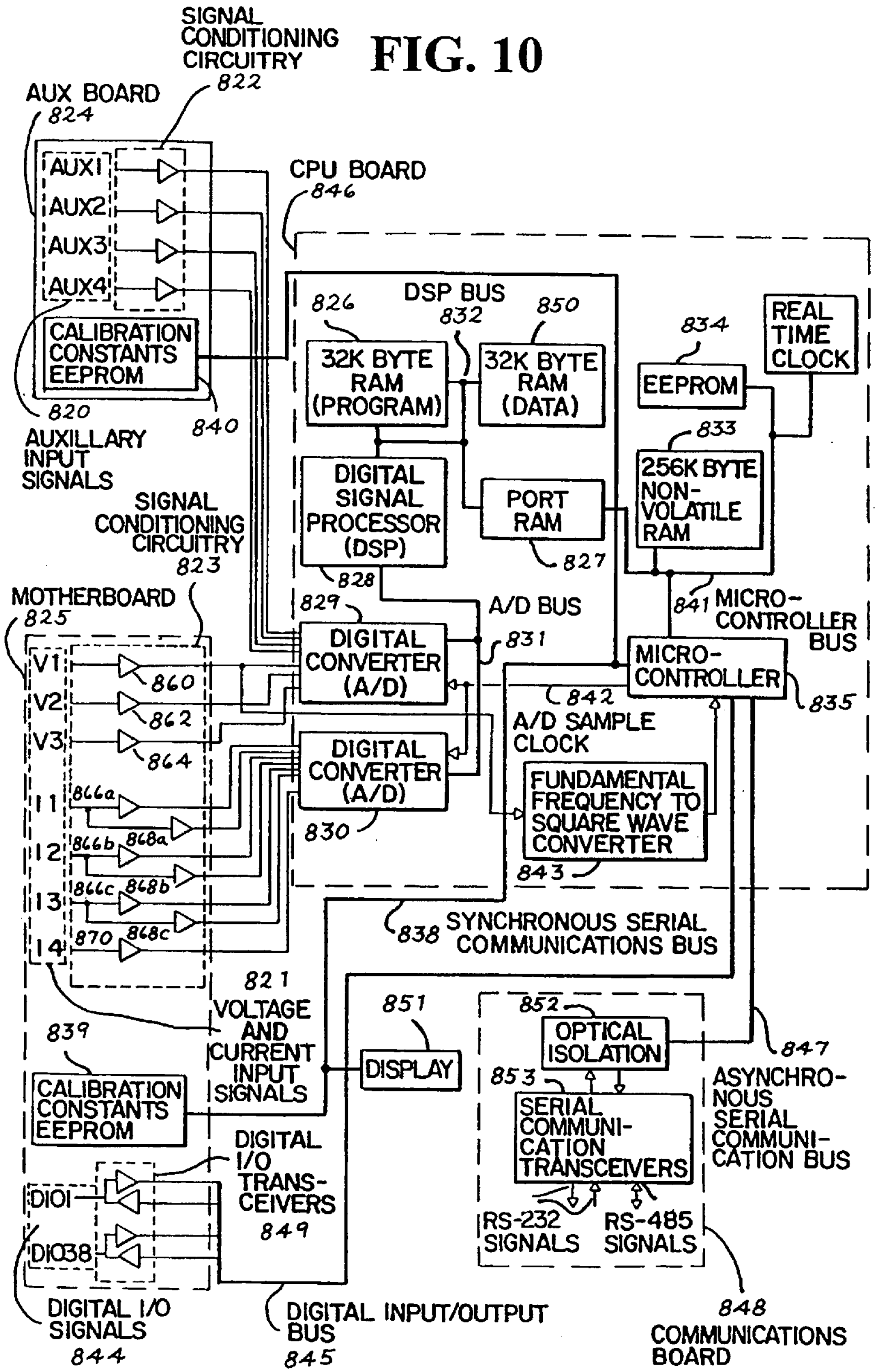
FIG. 10 schematically illustrates a preferred embodiment of the internal structure of a power monitoring unit of the present invention.

Referring now to FIG. 10, a preferred embodiment of the internal structure of an IED 900 is illustrated. As described in more detail below, the IED's 900 are run by an object oriented structure. The electrical signals (i.e. the voltage and current) from the power lines are used by a detector to generate digital signals which represent the electrical signals. In the illustrated embodiment, the detector is comprised of the CTs 902, PTs 904, conditioning circuitry and A/D converters, as described more fully below. Three-phase voltage and current input signals V1–V3 and 11–14 from electric power lines enter the motherboard 825 and are converted to voltage levels compatible with the analog to digital converters (A/Ds) 829 and 830 by signal conditioning circuitry 823. In an exemplary embodiment a suitable A/D convertor is a 13 bit, 7 input one available from National Semiconductor as model No. LM12458. A suitable voltage to the AID's 829 and 830 ranges from 0 to 5 Volts depending on what part of the AC signal the sample is taken at and the level of the AC signal.

In the illustrated embodiment, the signal conditioning circuitry comprises operational amplifiers (op amps) 860, 862 and 864 and associated circuitry which amplify V1, V2 and V3 respectively. The currents 11, 12, and 13 are amplified by two different scales to provide greater dynamic range. The amplification to the two different scales is implemented using the conditioning circuitry 823. Op amps 866A, 866B and 866C amplify input current signals 11, 12 and 13, respectively, to a first scale. For example, a current of 5 Amperes AC creates a voltage of 4 Volts AC to the A/D converter. Op amps 868A, 868B and 868C amplify input current signals 11, 12 and 13, respectively to a second scale. For example, a current of 100 Amperes AC creates a voltage of 4 Volts AC to the A/D converter. The voltage and current signals enter separate A/Ds 829 and 830 so that the voltage and current on a particular phase can be simultaneously sampled. Auxiliary Input Signals 820 on the AUX board 824 also pass through signal conditioning circuitry 822 and to A/b 829. Auxiliary inputs allow the user to sample additional signals in addition to the three-phase voltage and current. For example, the auxiliary inputs may be 0 to 10 Volts DC outputs from a temperature transducer.

A digital signal processor (DSP) 828 reads the samples from the A/D converters 829, 830 through the A/D Bus 831. The signals are preferably sampled at the rate of 128 samples per line frequency cycle. The DSP performs a Fast Fourier Transform (FFT) on the samples to determine the frequency components of the signal in a manner known in the art. It also calculates Root Mean Square (RMS) voltage and/or current for each input signal. This data is then transferred through dual port RAM 827 to the microcontroller 835. A suitable DSP is a 4K byte RAM available as a TMS320C25 available from Texas Instruments.

The microcontroller 835 performs many functions within the lED. The fundamental frequency to square wave converter 843 provides a square wave at the fundamental frequency of the incoming voltage signals. A suitable fundamental frequency to square wave converter is an LM311D available from National Semiconductor configured in a manner known in the art. A time processing unit (TPU) within the microcontroller 835 measures this frequency and multiplies it by a predetermined value, such as 128. The TPU creates an A/D sample clock 842 at this new frequency so that the A/Ds sample at 128 samples per cycle. A suitable microcontroller is a MC68332ACFC16 available from Motorola.

Different AUX boards 824 and motherboards 825 can be exchanged with different CPU Boards 846. This, however presents a calibration problem. In the system of the present embodiments, the calibration information for the circuitry 822, 823 of each AUX or motherboard is preferably stored on the individual board. A suitable EEPROM in a 93LC56 available from Microchip. This is implemented by storing the information in calibration constants EEPROM 839, 840 on each individual board. The microcontroller 835 then reads the information using the synchronous serial communications bus 838 before performing calculations on the values received through the dual port RAM 827 from the DSP 828. The synchronous serial communications bus 838 is also used to communicate with the display 851. Results of all calculations and control functions of the microcontroller 835 can be displayed on the display.

The IED 900 connects to the network 916 through the communications board 848. The microcontroller 835 sends and receives information over the serial communications bus 847.

A further description of a preferred embodiment of the present embodiments and its operation is given in U.S.

patent application Ser. No. 08/367,534, now U.S. Pat. No. 5,736,847, filed concurrently with this application and entitled "High Accuracy Power Monitor and Method" which is incorporated herein by reference.

FIGS. 11, 12, 13, 14, 15 and 16 show how the auxiliary input signals 820, the voltage and current input signals 821, and the digital I/O signals 844 may be represented in the object oriented structure of this embodiments. In an exemplary embodiment, in the IED 900 the logic or code is implemented in firmware and in the PC the code is implemented in software. It will, of course, be recognized by those skilled in the art that the logic for the IED 900 can also be implemented in software and that the logic in the PC can be implemented in firmware. In the present embodiment, the firmware is implemented using a 512K byte flash EEPROM 834 available from Intel as a 28F010 EEPROM. In an exemplary embodiment, the software is written in the C programming language. An exemplary embodiment of the logic for the object oriented architecture of the present embodiments in object code is given in CD-ROM Appendix which is incorporated herein by reference. The object code is presented in Srecord format which is defined in the M68332BUG Debug Monitor User's Manual (Motorola 1990) which is incorporated herein by reference. More detailed schematics for the presently preferred embodiment are given in FIGS. 31*a*–46*i*.

Figure 17:
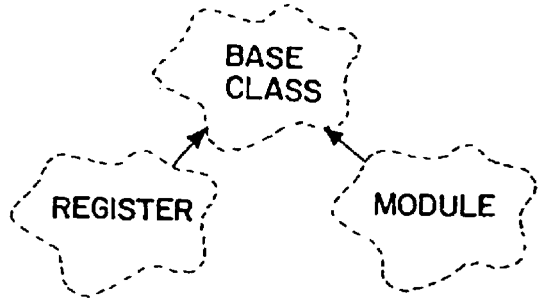
FIG. 17 schematically illustrates the inheritance of the registers and modules.
Figure 17A:
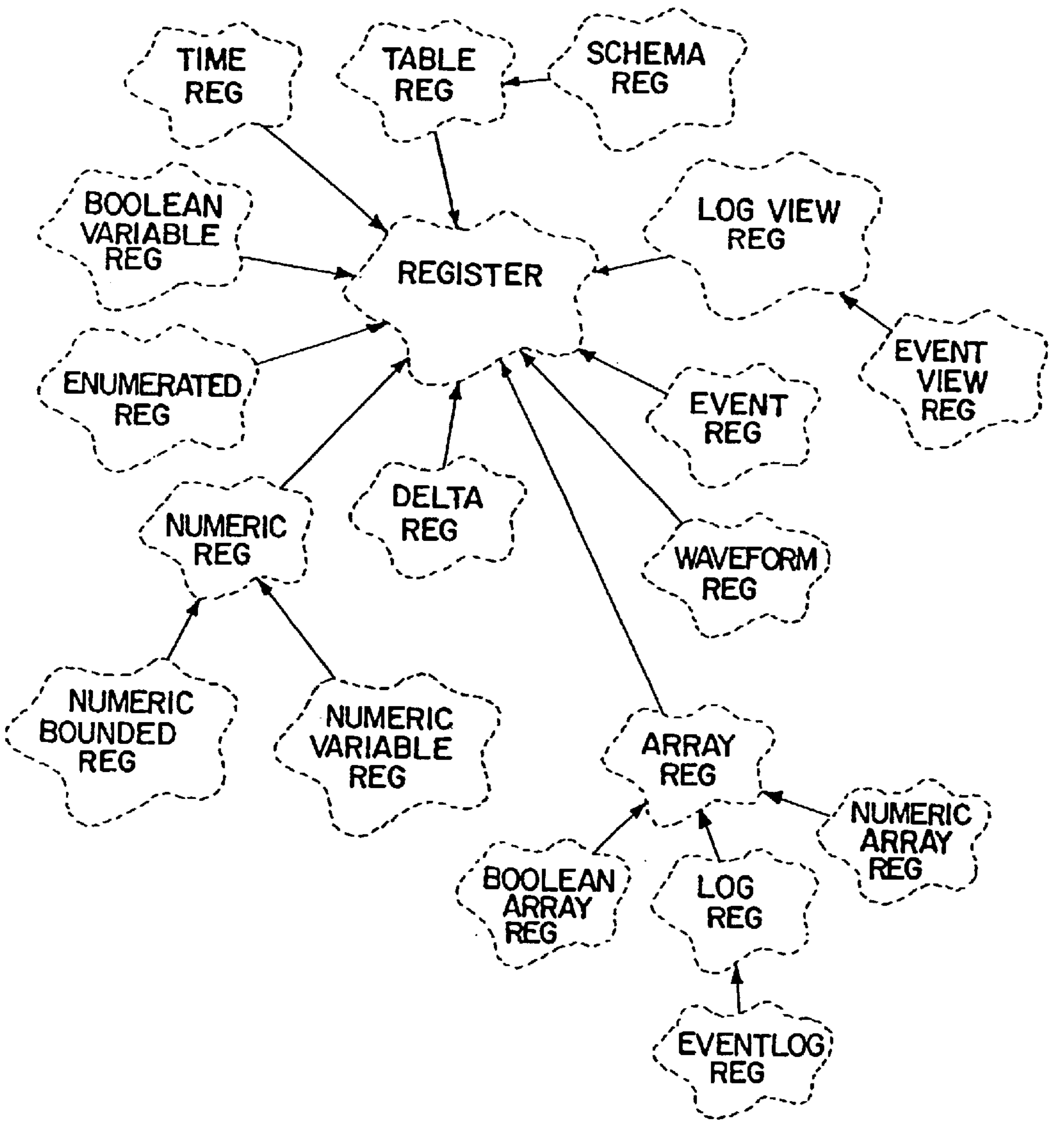
FIG. 17A schematically illustrates the inheritance of some of the registers.
Figure 17B:
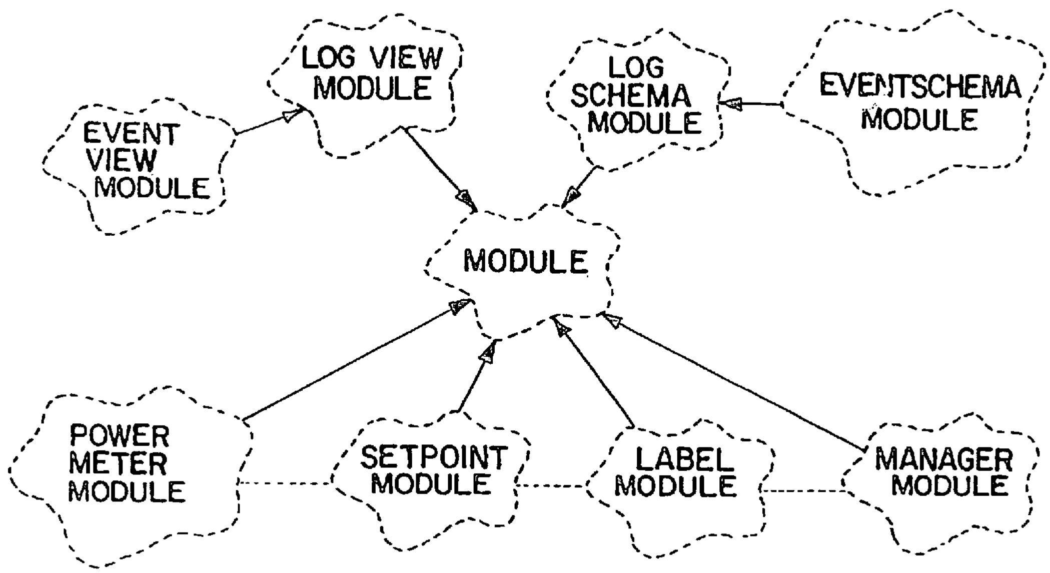
FIG. 17B schematically illustrates the inheritance of some of the modules.

In the system of the present embodiments, two fundamental classes exist for objects: 1) registers and 2) modules. Both the registers and modules are derived from a common base class (class=1). The registers are passive data storage objects containing a single value, an array or structure. Registers behave only as "servers" in the architecture. A "server" is defined as an entity which can respond to method invocations. A "client", on the other hand, is an entity which can invoke a method on a server. Modules behave both as client and server. The client portion of the module contains the active components that perform the various tasks within the device. The inheritance of the registers and modules is shown in FIG. 17. An inheritance diagram for some of the registers is shown in FIG. 17A. An inheritance diagram for some of the modules is shown in FIG. 17B. Data passing between objects is accomplished using method invocation using "types," where types define the semantics for passing data between objects. A method is invoked by a "client" sending a message to another object. This message contains a "method" and may contain a "value". Every method in an object has a security level. Any methods which are invoked with a level less than the security level for that method will fail. The system also has the following set of rules of operation which must be followed by objects:

1. All data passed to or from an object must have a Type.
2. Modules must be owned by a module, with the exception of the root module, which has no owner.
3. Registers must be owned by a module.
4. Behavior of servers will be consistent for multiple clients.
5. A server portion of a object cannot access the server portion of another object.
6. A client portion of an object cannot access the client portion of another object.
7. Any register or module cannot be destroyed if it is owned by any module.

Figure 17C:
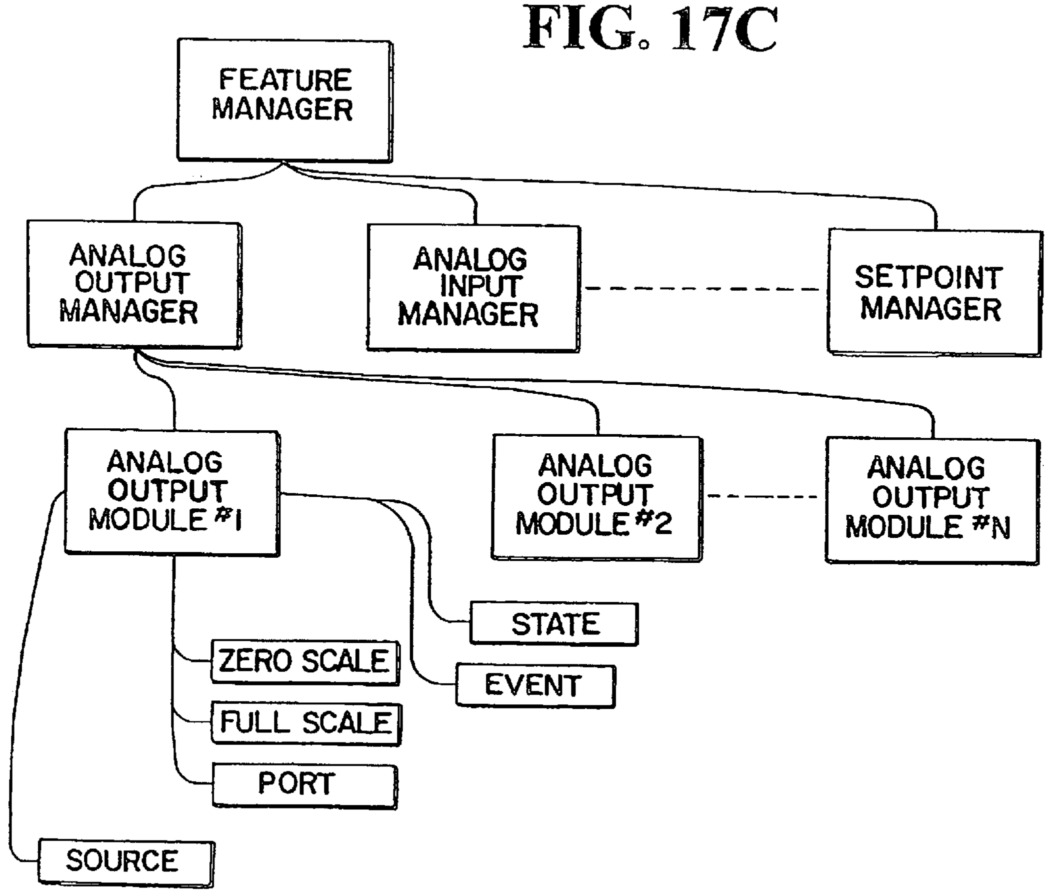
FIG. 17C illustrates a hierarchical structure.

The system also has a hierarchy. As used herein a hierarchy means that every manager, module and register can be accessed by starting at the top of the hierarchy. This concept can be seen pictorially by referring to FIG. 17C. In this figure modules or registers that appear as setup registers are connected to the bottom of the modules or managers with a line. Registers that appear as output registers are connected with lines to the right side of the modules and registers that appear as input registers are connected with lines to the left of the modules.

Certain semantics are needed for passing information to and from modules and registers. Here these semantics are defined by "Types". Table A provides the Types defined in the presently preferred embodiment.

TABLE A

The Types describe the semantics for passing information to and from modules and registers.

| Type Name | Type equivalence | Restrictions | Description |
|---|---|---|---|
| VoidType | fundamental Type | | Has no semantic value. |
| SignedType | fundamental Type | Maximum size = 32 bits. | Defines a signed value. |
| UnsignedType | fundamental Type | Maximum size = 32 bits | Defines an unsigned value. |
| CharType | fundamental Type | Maximum size = 32 bits. | Defines a character value. Supports wide characters as well as ASCII. |
| BooleanType | fundamental Type | Size = 1 bit. | Defines a Boolean value. Value may be TRUE or FALSE. |
| FixedPointType | fundamental Type | Maximum size = 64 bits. | Defines a fixed point value. |
| FloatType | fundamental Type | Size = 32, 64, or 80 bits. | Defines a floating point value. |
| ComplexType | fundamental Type | Maximum size = TBA. | Defines a complex value. |
| DeltaType | fundamental Type | Size = 0 bits. | The value represents a delta-function pulse. |
| RealType | define union RealType = | | Defines a real |

TABLE A-continued

The Types describe the semantics for passing information to and from modules and registers.

| Type Name | Type equivalence | Restrictions | Description |
|---|---|---|---|
| | SignedType.linevert split. UnsignedType.linevert split. CharType.linevert split. BooleanType.linevert split. FloatType.linevert split. FixedPointType. | | value. |
| NumericType | define union NumericType = RealType.linevert split. ComplexType. | | Defines a numeric value. |
| SignedArrayType | define array SignedArrayType = {SignedType value.sub.i `}. | | Defines an array of signed values. |
| UnsignedArrayType | define array UnsignedArrayType = {UnsignedType value.sub.i `}. | | Defines an array of unsigned values. |
| CharArrayType | define array CharArrayType = {CharType `char.sub.i `}. | | Defines an array of characters. |
| BooleanArrayType | define array BooleanArrayType = {BooleanType value.sub.i `}. | | Defines an array of Boolean values. |
| FixedPointArrayType | define array FixedPointArrayType = {FixedPointType `value.sub.i `}. | | Defines an array of fixed point values. |
| FloatArrayType | define array FloatArrayType = {FloatType `value.sub.i `}. | | Defines an array of floating point values. |
| ComplexArrayType | define array ComplexArrayType = {ComplexType value.sub.i `}. | | Defines an array of complex values. |
| NumericArrayType | define union NumericArrayType = SignedArrayType.linevert split. UnsignedArrayType.linevert split. CharArrayType.linevert split. BooleanArrayType.linevert split. FixedPointArrayType.linevert split. FloatPointArrayType.linevert split. ComplexArrayType. | | Defines an array of numeric values. |
| ArrayUnsignedArray Type | define structure ArrayUnsignedArrayType = {UnsignedArrayType us.sub.-- array.sub.i `}. | | Structure defines an array of UnsignedArrayTypes. |
| StringType | define StringType = CharArrayType. | must be null terminated. | Defines a character string (null-terminated). |
| StringArrayType | define structure StringArrayType = {CharArrayType `string.sub.i `}. | | Defines an array of strings. |
| SizeType | define SizeType = UnsignedType. | | An unsigned integral value which is used for defining a size parameter (e.g. size of array, #records). |
| CounterType | define CounterType = UnsignedType. | | An unsigned integral value which can be incremented (by 1 or more), decremented (by 1 or more), and cleared to 0. |
| IndexType | define IndexType = UnsignedType. | | An unsigned integral value which is used to index arrays. |
| TimeType | define TimeType = NumericType. | | Universal Time (GMT) in seconds. |
| ReasonType | define ReasonType = CharArrayType. | | The reason for an exception. |
| ExceptionType | define structure ExceptionType = UnsignedType `exception.sub.-- cause. Type `exception.sub.-- value` [ReasonType `reason`]. | | An exception returns a code and value. A reason string is opitonal. The valid codes are: 0 = underflow 1 = overflow 2 = not.sub.-- valid 3 = not.sub.-- supported |

TABLE A-continued

The Types describe the semantics for passing information to and from modules and registers.

| Type Name | Type equivalence | Restrictions | Description |
|---|---|---|---|
| | | | 4 = not.sub.-- available<br>5 = invalid.sub.-- method<br>6 = loss.sub.-- of.sub.-- precision.<br>7 = internal.sub.-- error |
| MethodType | define<br>MethodType = UnsignedType. | | The value represents (numerically) the particular method of an Object. |
| ClassType | define ClassType = UnsignedType. | | The value represents (numerically) a particular class (such as Numeric Register of PowerMeter Module). |
| NodeHandleType | define union NodeHandleType = StringType.linevert split. UnsignedType. | | An address to a remote IED site. |
| ExtendedHandleType | define structure ExtendedHandleType = [NodeHandleType \`node\`] UnsignedType \`handle\`. | | Defines a handle used to a reference an object on another IED. |
| HandleType | define union HandleType = UnsignedType.linevert split. ExtendedHandleType. | | The value represents the address of an object. |
| ExtendedHandle ArrayType | define structure array ExtendedHandleArrayType = {ExtendedHandle \`value.sub.i \`}. | | The value is an array of Extended Handles. |
| HandleArrayType | define union HandleArrayType = ExtendedHandleArrayType.linevert split. UnsignedArrayType. | | The value is an array of handle values. |
| PriorityType | define<br>PriorityType = UnsignedType. | Priorities range from 0 to 255 | The value represents an priority. Guidelines for priorities are as follows:<br>Urgent<br>192 to 255<br>High<br>128 to 191<br>Medium 64 to 127<br>Low 0<br>to 63 |
| RangeType | define structure RangeType = IndexType \`range.sub.-- start\` IndexType \`range.sub.-- end\`. | | defines a range of values that starts at index range.sub.-- start and ends at index range.sub.-- end. This is useful in log situations. |
| EventType | define structure EventType = PriorityType \`priority\` UnsignedType \`event.sub.-- state\` HandleType \`cause.sub.-- handle\` IONType \`cause.sub.-- value\` HandleType \`effect.sub.-- handle\` IONType \`effect.sub.-- value\`. | | Defines a structure for an event.<br>Values for event.sub.--state are:<br>0 = unary state event.<br>1 = Active transition for bi-state event.<br>2 = Inactive transition for bi-state event.<br>3 = Label change event. |
| LogHeaderType | define<br>LogHeaderType = HandleArrayType | | Structure defines the header for a general purpose log record. |
| LogRecordType | define structure LogRecordType = IndexType \`position\` TimeType \`timestamp\` {Type \`value.sub.i \`}. | | Structure defines the data values in a general purpose log record. |
| LogArrayType | define structure.sub.-- LogArrayType = {LogRecordType \`logrec.sub.i \`}. | | array Array of log records. |
| WaveformType | define structure WaveformType = NumericType \`sampling.sub.-- frequency\` NumericType \`offset\` NumericType \`scale\` | | Defines a structure for a waveform.<br>Note:<br>plotted value = (data point + offset) * scale. |

TABLE A-continued

The Types describe the semantics for passing information to and from modules and registers.

| Type Name | Type equivalence | Restrictions | Description |
| --- | --- | --- | --- |
| | TimeType `time.sub.-- of.sub.-- first.sub.-- point`. NumericArray `points`. | | |
| AlarmType | define structure AlarmType = HandleType `effect.sub.-- handle` CounterType `transitions`. PriorityType `priority`. | | Structure for alarms: When parameter Transitions is odd the alarm is active. |
| AlarmArrayType | define structure.sub.-- array AlarmArrayType = {AlarmType `alarm.sub.i `}. | | Array of alarms. |
| SecurityType | define SecurityType = UnsignedTypes. | security level. | Value represents a<br>The following security levels are defined:<br>1 = no access<br>16 = user (R/O)<br>32 = user (R/W)<br>48 = configure (can create/destroy modules)<br>64 = system administration (can change secruity levels).<br>80 = highest level (factory - i.e. cal constants) |
| MehtodSecurityType | define structure MethodSecurityType = MethodType `method` SecurityType `security`. | | Assigns a security level to a method. |
| MethodSecurityArray Type | define structure.sub.-- array MethodSecurityArrayType = {MethodSecurityType `methsec.sub.i `}. | | Array of method-security. |
| CompositeLogRecord | define structure CompositeLogRecord = UnsignedType `record.sub.-- type` HandleType `handle` LogHeaderType `header` [StringArrayType `labels`] LogArrayType `records`. | | This is the complete description of a log record.<br>Note:-the position field of the log record type is the record ID. RecordType is currently always zero. |
| CompositeLogArray | define structure.sub.-- array CompositeLogArray = {CompositeLogRecord `record.sub.i `}. | | An array of CompositeLogRecords |
| CompositeEventRecord | define structure CompositeEventRecord = UnsignedType `record.sub.-- type` HandleType `handle` LogHeaderType `header` [StringArrayType `labels`] LogArrayType `records` TimeType `achmowledge.sub.-- time` PriorityType `priority`. | | This is a complete description of a single event (either unary event or half of a binary event). The header consists of two handles cause.sub.-- handle and effect.sub.-- handle (in this order).<br>The records field always has two elements, cause.sub.-- value and effect.sub.-- value. RecordType is 0 for unary events, 1 for binary active events, 2 for binary inactive events, and 3 for label change events. |
| CompositeEventArray | define structure CompositeEventArray = {CompositeEventRecord `record.sub.i `}. | | An array of CompositeEventRecords |
| PredicateOperator Type | define PredicateOperatorType = UnsignedType `operator`. | Defines some SQL | predicate operators<br>0 = AND |

TABLE A-continued

The Types describe the semantics for passing information to and from modules and registers.

| Type Name | Type equivalence | Restrictions | Description |
|---|---|---|---|
| | | | 3 = OR<br>1 = IN<br>4 = XOR<br>2 = BETWEEN |
| PredicateOperand Type | define PredicateOperandType = Type `operand` | | A predicate for an SQL-type query is formed from a list of PredicateOperandType (see SearchCriteria type). |
| | SortOrderType `<br>UnsignedType `order`<br>StringType `key`. | define structure | SortOrderType order is:<br>0 = Ascending order<br>1 = Descending order.<br>key names a key field of a table. |
| SortOrderArray | define structure.sub.-- array SortOrderArray = {Sort OrderType `order.sub.i `}. | | |
| SearchCriteria | define structure SearchCriteria = {PredicateOperandType `operand.sub.i }` SortOrderArray `order`. | | Defines a query on a LogSchemeRegister The list of operands form a predicate in postfix (reverse Polish) notation. |
| Type | define union Type =<br>/* type all types here */ | | All Types. |

Note:
Arrays of fundamental Types are defined as "array" but arrays of nonfundamental Types ase defined as "struturearray". This distinction improves communication throughput in the system.

Table 1 lists a set of methods which are presently defined for the base class. All of these base class methods are inherited by the registers and modules.

TABLE 1

| # | Method | Return-type | Description |
|---|---|---|---|
| 1 | read.sub.-- class( ) | Class Type | Causes a manager, module or register to return a number indicating what type of manager, module or register it is. |
| 2 | read.sub.-- name ( ) | StringType | Causes a manager, module or register to return a string containing the name of the manager, module or register. |
| 3 | read.sub.-- label ( ) | StringType | Causes a manager, module or register to return a string containing the label for the manager, module or register.<br>A label differs from a name in that it can be programmed by executing a Write Label method on the manager, module or register. If no label is programmed the object name will be returned. |
| 128 | write.sub.-- label(StringType) | BooleanType | Write the programmable object label. If a null-string is written, the Label is destroyed. |
| 129 | read.sub.-- security.sub.-- level(MethodType) | SecurityType | Is executed to determine whether a method can be executed on a particular manager, module or register.<br>Not all methods are available on all devices. The master device can determine whether it will receive a valid result by first executing this method. Another method, Read All Security Levels returns a list which corresponds to the security levels of all the methods that can be executed on a manager or module. |
| 130 | read.sub.-- all.sub.-- security.sub.-- levels( ) | MethodSecurity ArrayType | Read the security levels for all methods of a given |

TABLE 1-continued

| # | Method | Return-type | Description |
|---|---|---|---|
| | | | object. Only methods valid for the object's class are included. |
| 131 | read.sub.-- parent.sub.-- handle | HandleType | Returns a handle of the parent of a manager, module or register. For instance, executing this method on an analog output module will return the handle of the analog output manager. Executing this method on the analog output manager will return a handle to the feature manager. Executing this method on an analog output's output register returns the analog output module. |
| 132 | read.sub.-- owners( ) | HandleArray Type | Returns a list of handles for all the modluels that own the object this method is executed on. This will include a list of modules if the method is invoked on a register or a manager if it is invoked on a module. |
| 133 | IsA(ClassType) | BooleanType | Returns a value indicating whether or not and object is derived from the class given as an argument. |
| 134 | check.sub.-- sanity( ) | BooleanType | Checks to see if the manager, module or Register is operating correctly. i.e., determines whether the software that implements the object is operating correctly. Returns True if object is sane. |

If a method invocation is unsuccessful, an ExceptionType will be returned rather than the normal Return-type.

In the current implementation a module performs a function using registers. Input registers provide the information a module is operating on. Setup registers permit modification of the operation of the module. Output registers contain the results of the module's operation. The output registers of one module can be used as input registers for another. The module keeps track of which registers are to be used for its input, output and setup. The links to the input registers can be modified, but those to the output and setup registers are fixed. A module is said to "own" all the registers it is linked to. Methods may also be executed on registers once the handle to a register is known. The handle of a register or module is a number which is unique for each register and module on a device. When a method is invoked, a handle is supplied which indicates which module or register the method is to be invoked upon.

In most instances, the methods that can be invoked on the different types of registers depend on what type of register is involved. Table 2 lists a set of methods which are presently defined for all registers (all register classes are inherited from the register class).

TABLE 2

Register Class (R) - class = 20

| # | Method | Return-type | Description |
|---|---|---|---|
| 20 | read.sub.-- time( ) | TimeType | Read the time of last update. |
| 21 | read.sub.-- value( ) | VoidType | Read the value of the object |
| 22 | write.sub.-- value(VoidType) | BooleanType | Write the value of the object |

TABLES 3–19 list methods which are supported for the indicated register classes. (In Tables 3–19, "*" indicates that the method is inherited from the parent class and "+" indicates that the method is re-defined from the parent class.)

TABLE 3

BooleanVariableRegister (BVR) - class = 21
This class defines a Boolean variable storage location.

| # | Method | Return-type | Description |
|---|---|---|---|
| 20 | read.sub.-- time( )* | TimeType | Read the time of last update |
| 21 | read.sub.-- value( )+ | BooleanType | Read the value of the register. |
| 22 | write. sub.-- value(BooleanType)+ | BooleanType | Write the value of the register |
| 30 | read.sub.-- ON.sub.-- label( ) | StringType | Read the ON label. |
| 500 | write.sub.-- ON.sub.-- label(StringType) | BooleanType | Write the ON label. |
| 31 | read.sub.-- OFF.sub.-- label( ) | StringType | Read the OFF label. |
| 501 | write.sub.-- OFF.sub.-- label(StringType) | BooleanType | Write the OFF label. |
| 32 | read.sub.-- current.sub.-- state.sub.-- label( ) | StringType | Returns the ON label if register value = True and OFF label if register value = False. |

TABLE 4

EnumeratedRegister (ENR) - class = 22
This class defines a register that can store one instance of an enumerated list.

| # | Method | Return-type | Description |
|---|---|---|---|
| 20 | read.sub.-- time( )* | TimeType | Read the time of last update |
| 21 | read.sub.-- value( )+ | StringType | Read the value of the register. |
| 22 | write.sub.-- value(StringType)+ | BooleanType | Write the value of the register. The string must be one of the strings provided by the read.sub.-- unumerations( ) method - otherwise the method will fail. |
| 520 | read.sub.-- enumerations( ) | StringArrayType | Read the enumeration list. This list contains ALL possible register values. |

TABLE 5

NumericRegister (NR) - class = 24
This is the parent class for Numeric Registers.

| # | Method | Return-type | Description |
|---|---|---|---|
| 20 | read.sub.-- time( )* | TimeType | Read the time of last update |
| 21 | read.sub.-- value( )+ | NumericType | Read the value of the register |
| 22 | write.sub.-- value(NumericType)+ | Boolean Type | Write the value of the register |

TABLE 8

DeltaRegister (DR) - class = 26
This defines a delta-function value.

| # | Method | Return-type | Description |
|---|---|---|---|
| 20 | read.sub.-- time( )* | TimeType | Read the time of last update |
| 21 | read.sub.-- value( )+ | VoidType | Read the delta value |
| 22 | write.sub.-- value(VoidType)* | Boolean Type | Output a delta-pulse |

TABLE 6

NumericBoundedRegister (NBR) - class = 23
This defines a numeric value bounded by two values.

| # | Method | Return-type | Description |
|---|---|---|---|
| 20 | read.sub.-- time( )* | TimeType | Read the time of last update |
| 21 | read.sub.-- value( )* | NumericType | Read the value of the register |
| 22 | write.sub.-- value(NumericType)* | BooleanType | Write the value of the register. If the value is outside the prescribed bounds, no value will be written and an excepeition will be returned. |
| 540 | read.sub.-- bounds( ) | NumeriArray Type | Read the bounds of the register. The numeric array will have two elements. |
| 541 | write.sub.-- bounds(NumericArrayType) | BooleanType | Write the bounds of the register. The first array element will be the low bound and the second will be the hight bound. |

TABLE 7

NumericVariableRegister (NVR) - class = 25
This defines a numeric storage location.

| # | Method | Return-type | Description |
|---|---|---|---|
| 20 | read.sub.-- time( )* | TimeType | Read the time of the last update |
| 21 | read.sub.-- value( )* | NumericType | Read the value of the register |
| 22 | write.sub.-- value(NumericType)* | BooleanType | Write the value of the register |

TABLE 9

| Arrayregister (AR) - class = 27<br>This is the parent class for all registers containing arrays. | | | |
|---|---|---|---|
| # | Method | Return-type | Description |
| 20 | read.sub.-- time( )* | TimeType | Read the time of last update |
| 21 | read.sub.-- value(RangeType)+ | VoidType | Read a range of values. |
| 22 | write.sub.-- value(IndexType, VoidType)+ | BooleanType | Write values at index |
| 35 | read.sub.-- depth( ) | SizeType | Read the depthe of the array |
| 36 | write.sub.-- depth(SizeType) | BooleanType | Write the depth of the array |
| 37 | read.sub.-- rollover( ) | UnsignedType | Read rollover value - value is the highest count that can be reached before rollover to 0. |

TABLE 10

| BooleanArrayRegister (BAR) - class = 28<br>This class defines a non-circular array of Boolean values. | | | |
|---|---|---|---|
| # | Method | Return-type | Description |
| 20 | read.sub.-- time( )* | TimeType | Read the time of last update |
| 21 | read.sub.-- value(RangeType)+ | BooleanArray Type | Read a range of values. |
| 22 | write.sub.-- value(IndexType, BooleanArrayType)+ | BooleanType | Write values at index |
| 35 | read.sub.-- depth( )* | SizeType | Read the depth of the array |
| 36 | write.sub.-- depth(SizeType)* | BooleanType | Write the depth of the array |
| 37 | read.sub.-- rollover( )* | UnsignedType | Read rollover value. |

TABLE 11

| NumericArrayRegister (NAR) - class = 29<br>This class defines a non-circular array of numeric values. | | | |
|---|---|---|---|
| # | Method | Return-type | Description |
| 20 | read.sub.-- time( )* | TimeType | Read the time of last update |
| 21 | read.sub.-- value(RangeType)+ | NumericArray Type | Read a range of values. |
| 22 | write.sub.-- value(IndexType, NumericArrayType)+ | BooleanType | Write values at index |
| 35 | read.sub.-- depth( )* | SizeType | Read the depth of the array |
| 36 | write.sub.-- depth(SizeType)* | BooleanType | Write the depth of the array |
| 37 | read.sub.-- rollover( )* | UnsignedType | Read rollover value. |

TABLE 12

| LogRegister (LR) - class = 30<br>This class defines a circular array of log-type structures. This class is intended for the implenemtation of any kind of historic log. | | | |
|---|---|---|---|
| # | Method | Return-type | Description |
| 20 | read.sub.-- time( )* | TimeType | Read the time of last update |
| 21 | read.sub.-- value(RangeType)+ | LogArrayType | Read a range of records. |
| 22 | write.sub.-- value(IndexType, LogArrayType)+ | BooleanType | Write the records at index |
| 35 | read.sub.-- depth( )+ | BooleanType | NotSupported |
| 36 | write.sub.-- depth( )+ | BooleanType | NotSupported |
| 37 | read.sub.-- rollover( )* | UnsignedType | Read rollover value. |
| 40 | read.sub.-- position( ) | IndexType | Read the present position. Note: Upon leaving the factory, the position = 0 (i.e. the first record will be written into position 0). The position always indicates where the next record will be written. |
| 41 | write.sub.-- position(IndexType) | BooleanType | Write the present position |

TABLE 13

EventLogRegister (ELR) - class = 31
This class defines a circular array of event structures and a non-circular array of alarms. It is derived from the LogRegister class. The following methods are supported.

| # | Method | Return-type | Description |
|---|---|---|---|
| 20 | read.sub.-- time( )* | TimeType | Read the time of the last update |
| 21 | read.sub.-- value(RangeType)* | LogArrayType | Read range of events |
| 22 | write.sub.-- value(IndexType, LogArrayType)* | BooleanType | Write range of events |
| 35 | read.sub.-- depth( )+ | BooleanType | NotSupported |
| 36 | write.sub.-- depth( )+ | BooleanType | NotSupported |
| 37 | read.sub.-- rollover( )* | UnsignedType | Read rollover value. |
| 40 | read.sub.-- position( )* | IndexType | Read the present position. |
| 41 | write.sub.-- position(IndexType)* | BooleanType | Write the present position |
| 45 | read.sub.-- alarms( ) | AlarmArrayType | Read entire alarm array. |
| 46 | write.sub.-- alarms(AlarmArrayType) | BooleanType | Write entire alarm array. |
| 560 | read.sub.-- alarm.sub.-- count.sub.-- rollover( ) | UnsignedType | Read rollover value of alarm counters in the AlarmArray - value is the highest count that can be reached before rollover to 0. |

TABLE 14

SchemaRegister (DSR) - class = 39
This is derived from TableRegister. A SchemaRegister loosely represents of a database schema, a collection of related database tables. In the current embodiment, the tables are not accessible via methods. These registers are used primarily as inputs to specialized modules that allow indirect access to the tables.

| # | Method | Return-type | Description |
|---|---|---|---|
| 20 | read.sub.-- time( )* | TimeType | Read the time of the last update. |
| 21 | read.sub.-- value( )+ | BooleanType | NotSupported. |
| 22 | write.sub.-- value( )+ | BooleanType | NotSupported. |

TABLE 15

Log View Register (LVR) - class = 40
The Log View Register class is derived from Register. In database terminology, a view is a database table that is derived from queries on other database tables. Here a “view” is extended to mean a specialized representation of table or group of tables. A log View Register is used to access data stored in the Table Registers associated with the creator module (see Log View Module). Data retrieved from the tables is reformatted and retuRened as Composite Log Records.

| # | Method | Return-type | Description |
|---|---|---|---|
| 20 | read.sub.-- time( )* | TimeType | Read the time of the last update. |
| 21 | read.sub.-- value(SearchCriteria)+. | CompositeLogArray | Returns all records that match SearchCriteria. |
| 22 | write.sub.-- value( )+ | BooleanType | Not supported. |
| 583 | read.sub.-- updates(SearchCriteria) | CompositeLogArray | The first time this method is invoked (for a particular program), all records that match the SearchCriteria are returned. Subsequently, only the newest matching records are returned. |

TABLE 16

| EventViewRegister (EVR) - class = 41<br>The EventViewRegister class is a LogViewRegister that specializes the in storage of CompositeEventRecords. It also allows these records to be marked as acknowledged and sends prioritized alarm messages to registered clients. | | | |
|---|---|---|---|
| # | Method | Return-type | Description |
| 20 | read.sub.-- time( )* | TimeType | Read the time of the last update. |
| 21 | read.sub.-- value(SearchCriteria)+ | CompositeEventArray | Returns all records that match SearchCriteria. |
| 22 | write.sub.-- value( )* | BooleanType | Not supported. |
| 583 | read.sub.-- updates(SearchCriteria)+ | CompositeEventArray | See LogViewRegister |
| 584 | acknowledge(UnsignedArrayType) | Boolean Type | Marks the specified event records as acknowledged. The argument is an array of recordIDs. |

TABLE 17

| WaveformRegister (WR) - class = 32<br>This class defines an array of points defining a waveform. | | | |
|---|---|---|---|
| # | Method | Return-type | Descripiton |
| 20 | read.sub.-- time( )* | TimeType | Read the time of last update |
| 21 | read.sub.-- value( )+ | WaveformType | Read the present value of the register |
| 22 | write.sub.-- value(WaveformType)+ | BooleanType | Write the present value of the register |

TABLE 18

| EventRegister (ER) - class = 33<br>This class defines a register which holds an evet. | | | |
|---|---|---|---|
| # | Method | Return-type | Description |
| 20 | read.sub.-- time( )* | TimeType | Read the time of last update |
| 21 | read.sub.-- value( )+ | EventType | Read the present value of the register |
| 22 | write.sub.-- value(EventType)+ | BooleanType | Write the present value of the register |

TABLE 19

| TimeRegister (TR) - class = 34<br>This class defines a register which holds unformatted time. | | | |
|---|---|---|---|
| # | Method | Return-type | Description |
| 20 | read.sub.-- time( )* | TimeType | Read the time of last update |
| 21 | read.sub.-- value( )+ | TimeType | Read the present value of the register |
| 22 | write.sub.-- value(TimeType)+ | Boolean Type | Write the present value of the register |

It is also contemplated that a TableRegisterClass will be defined. The TableRegisterClass represents a database table, rows of data organized into distinct columns. It is presently envisioned that the database tables will not be accessible using methods. These registers may be used permanently as inputs to specialized modules that allow indirect access to the tables.

Figure 27A:
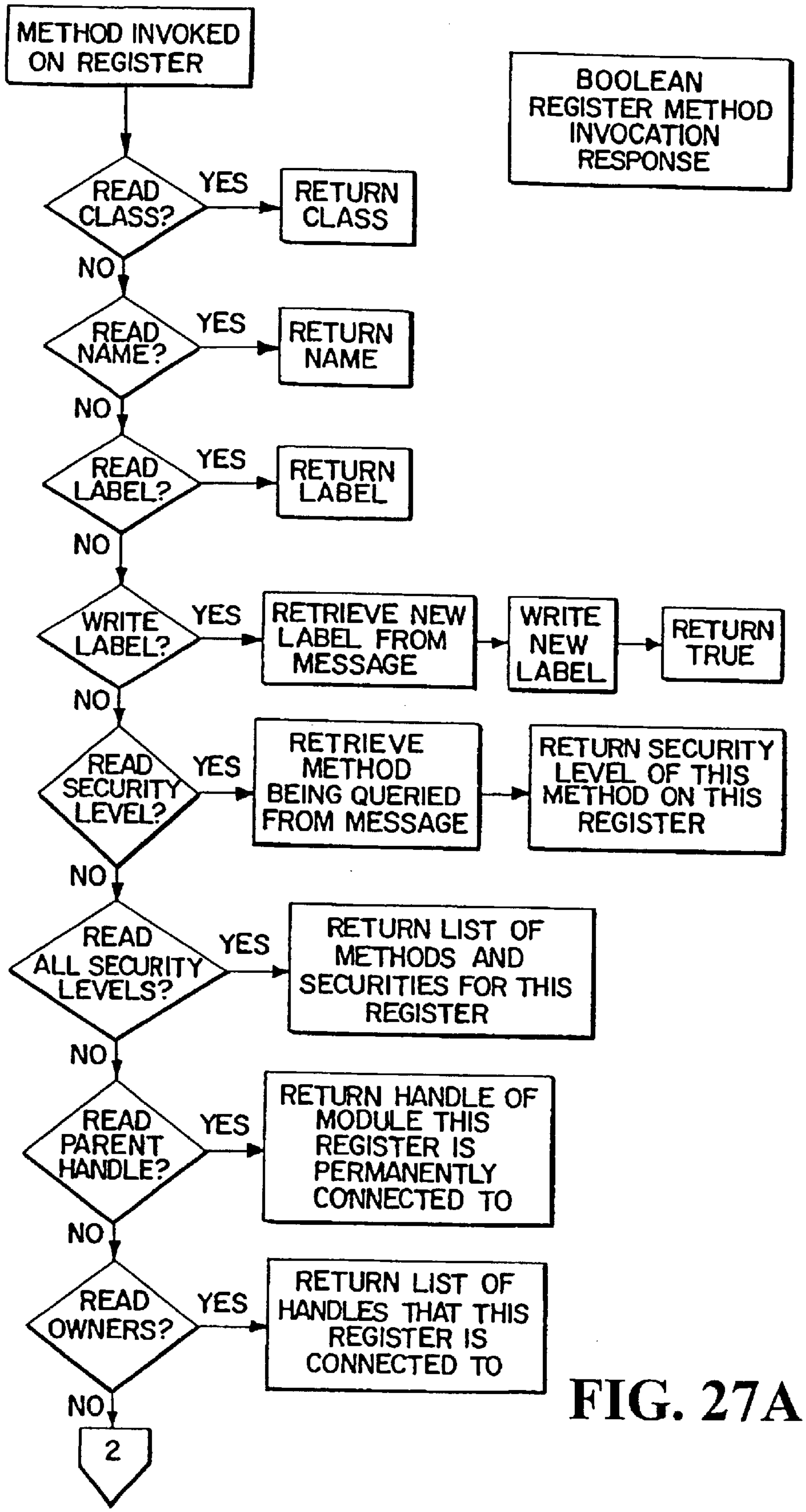
FIGS. 27A–27C show a flowchart of a preferred embodiment of the logic for the operation of a boolean register.
Figure 27B:
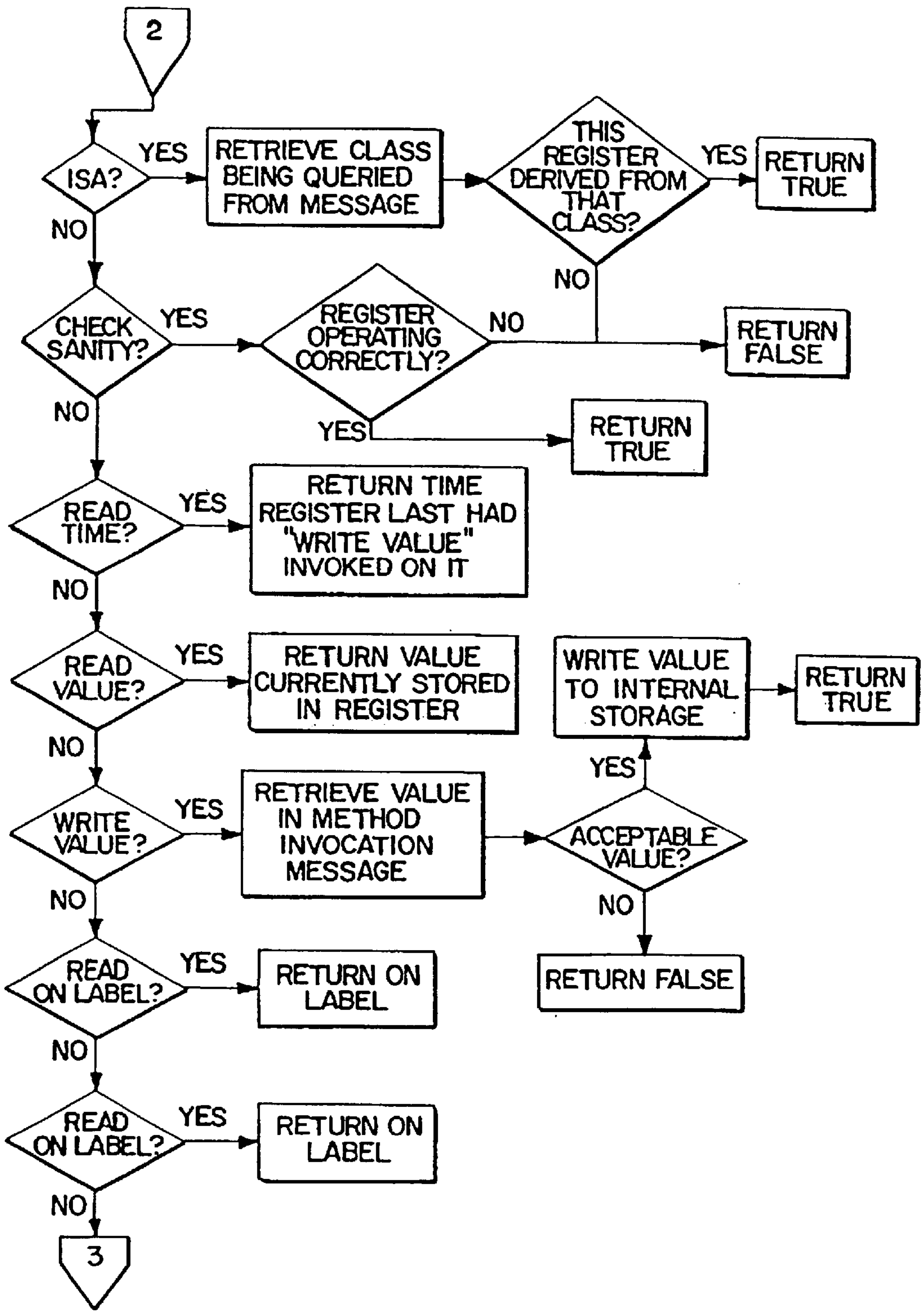
Figure 27C:
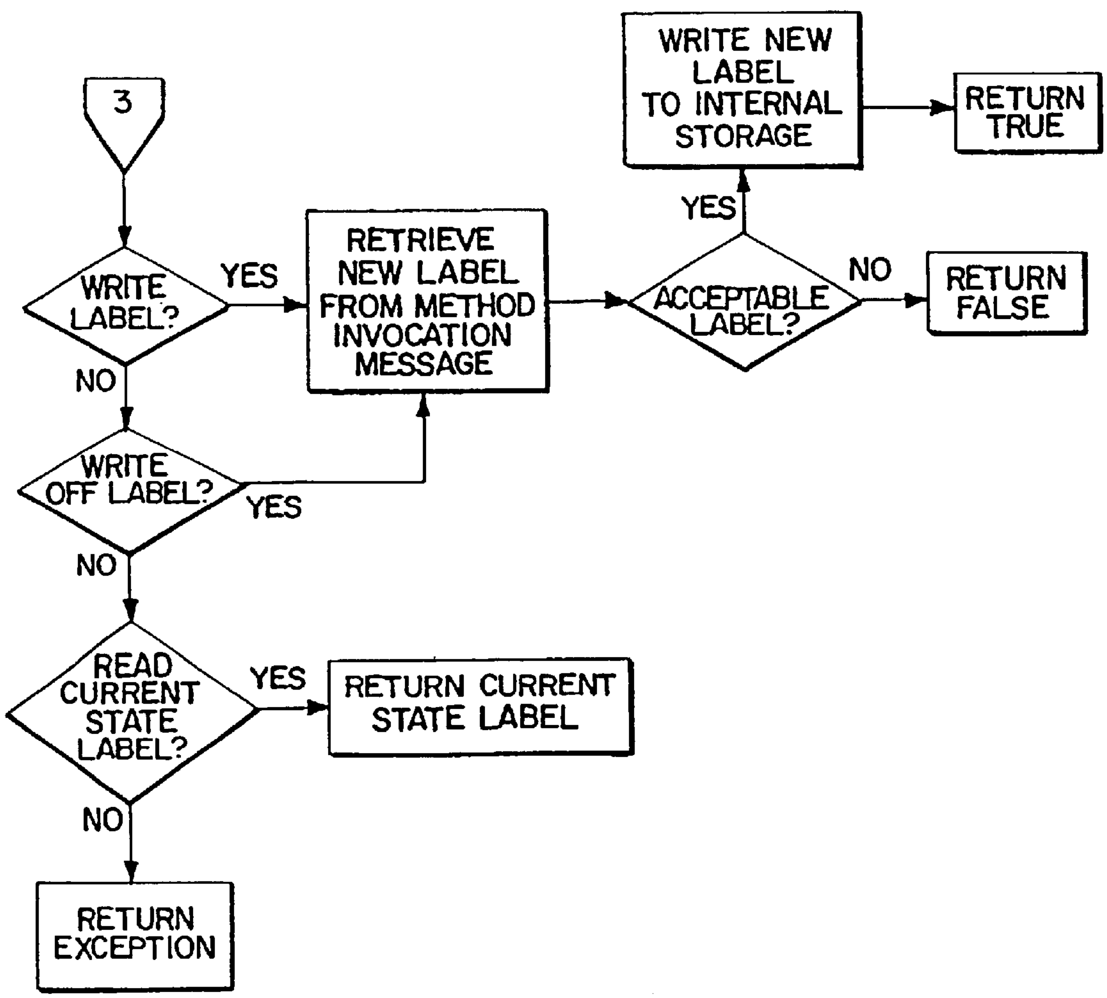
Figure 28A:
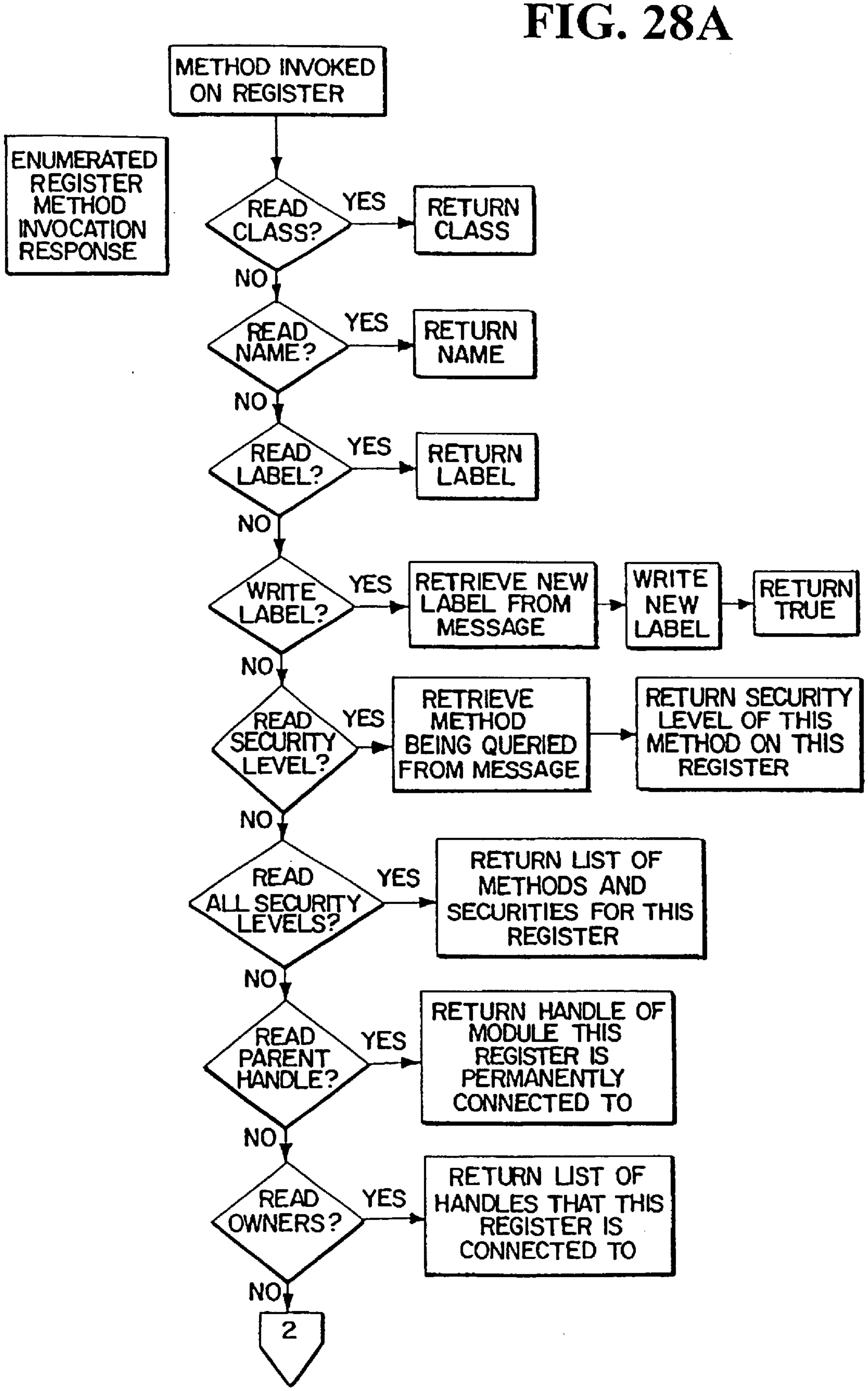
FIGS. 28A and 28B show a flowchart of a preferred embodiment of the logic for the operation of an enumerated register.
Figure 28B:
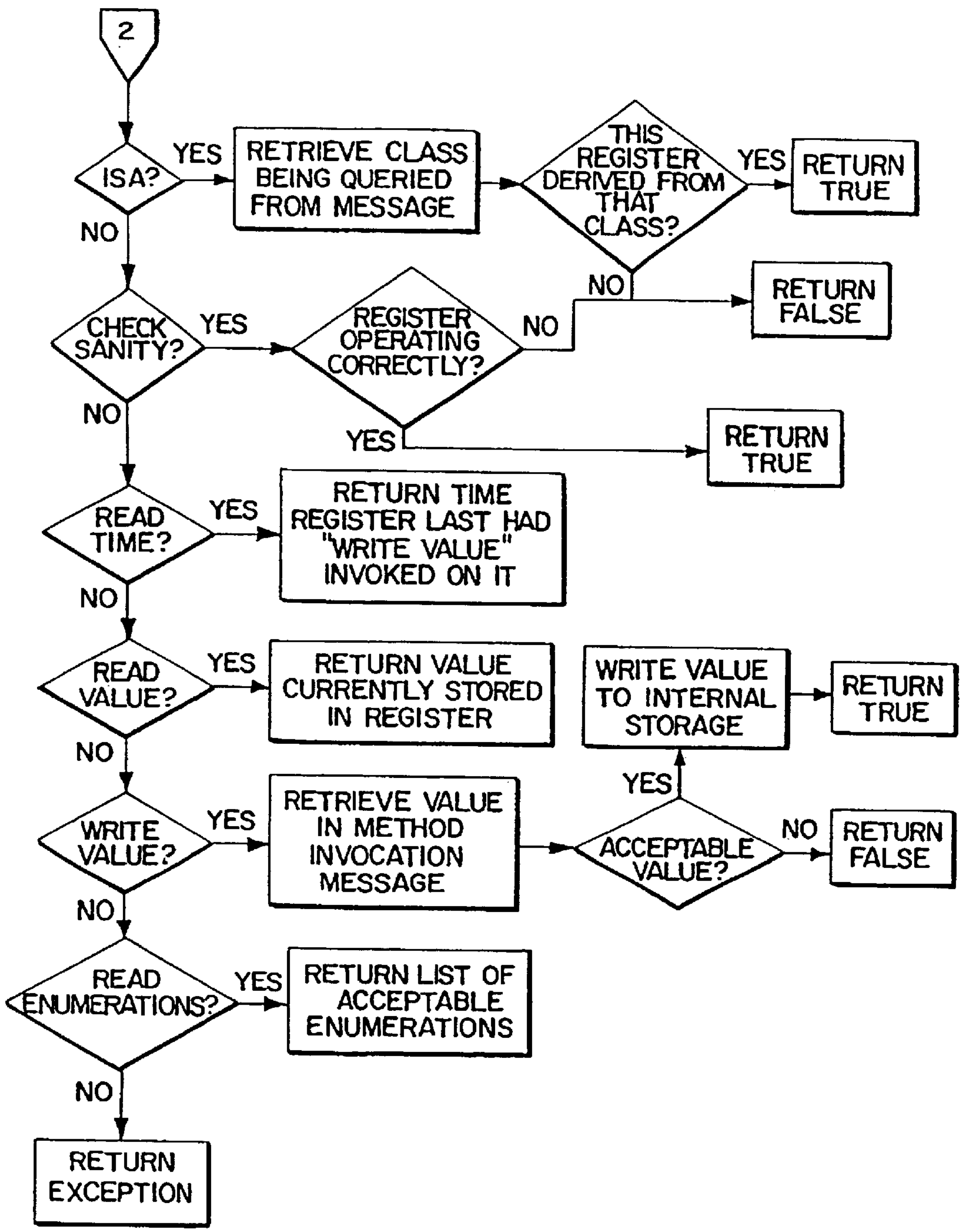
Figure 29A:
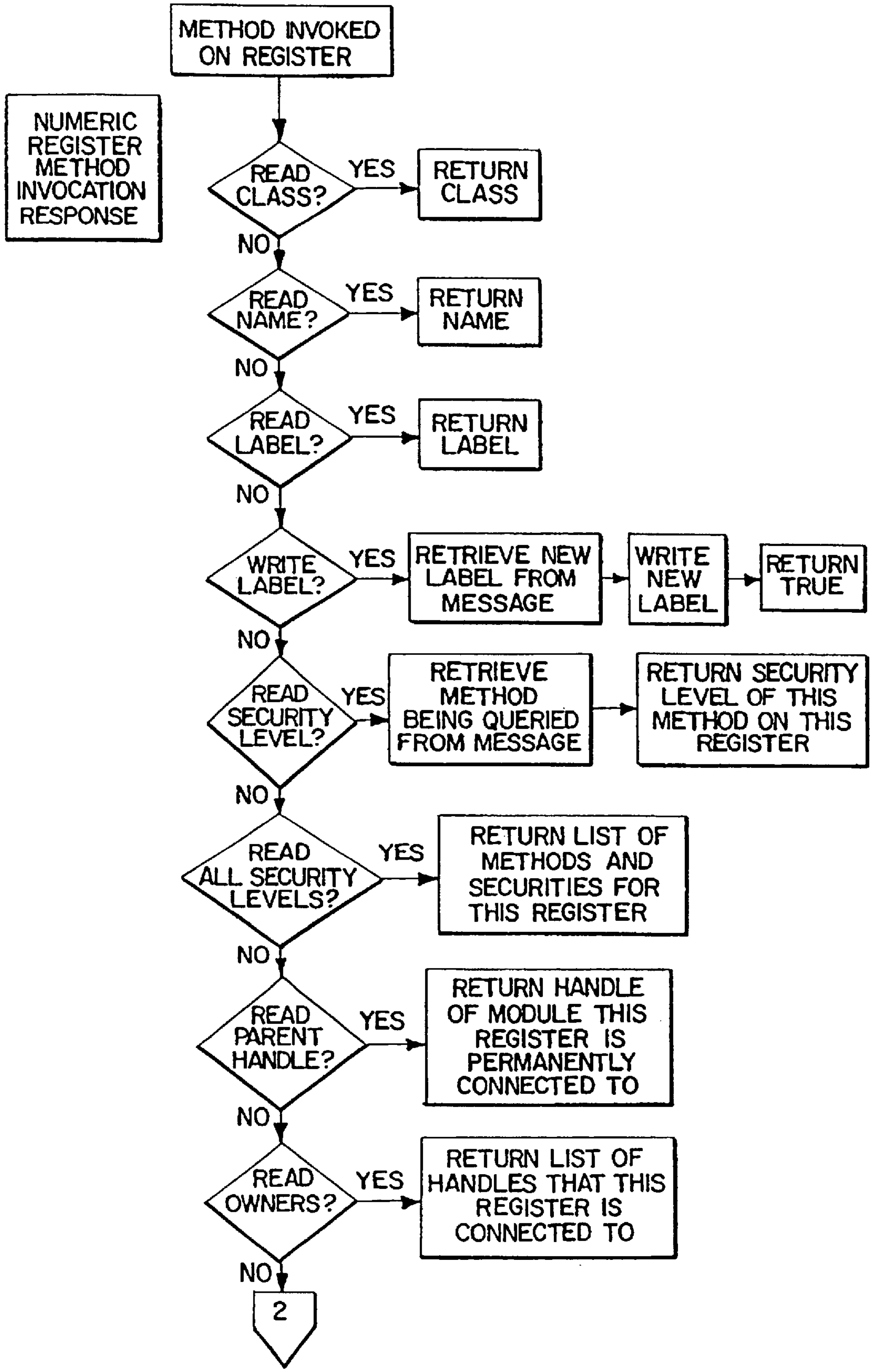
FIGS. 29A and 29B show a flowchart of a preferred embodiment of the logic for the operation of a numeric register.
Figure 29B:
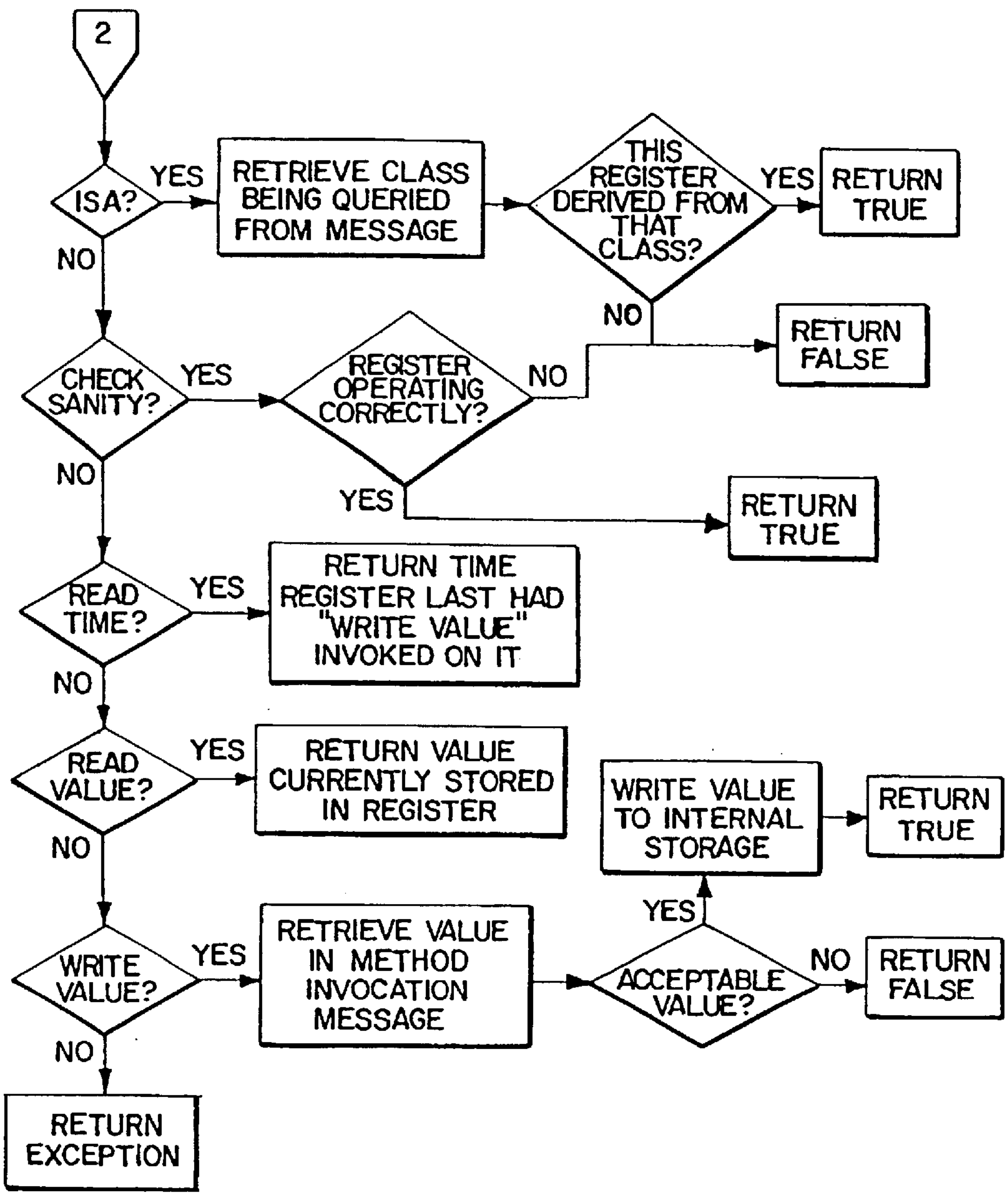
Figure 30A:
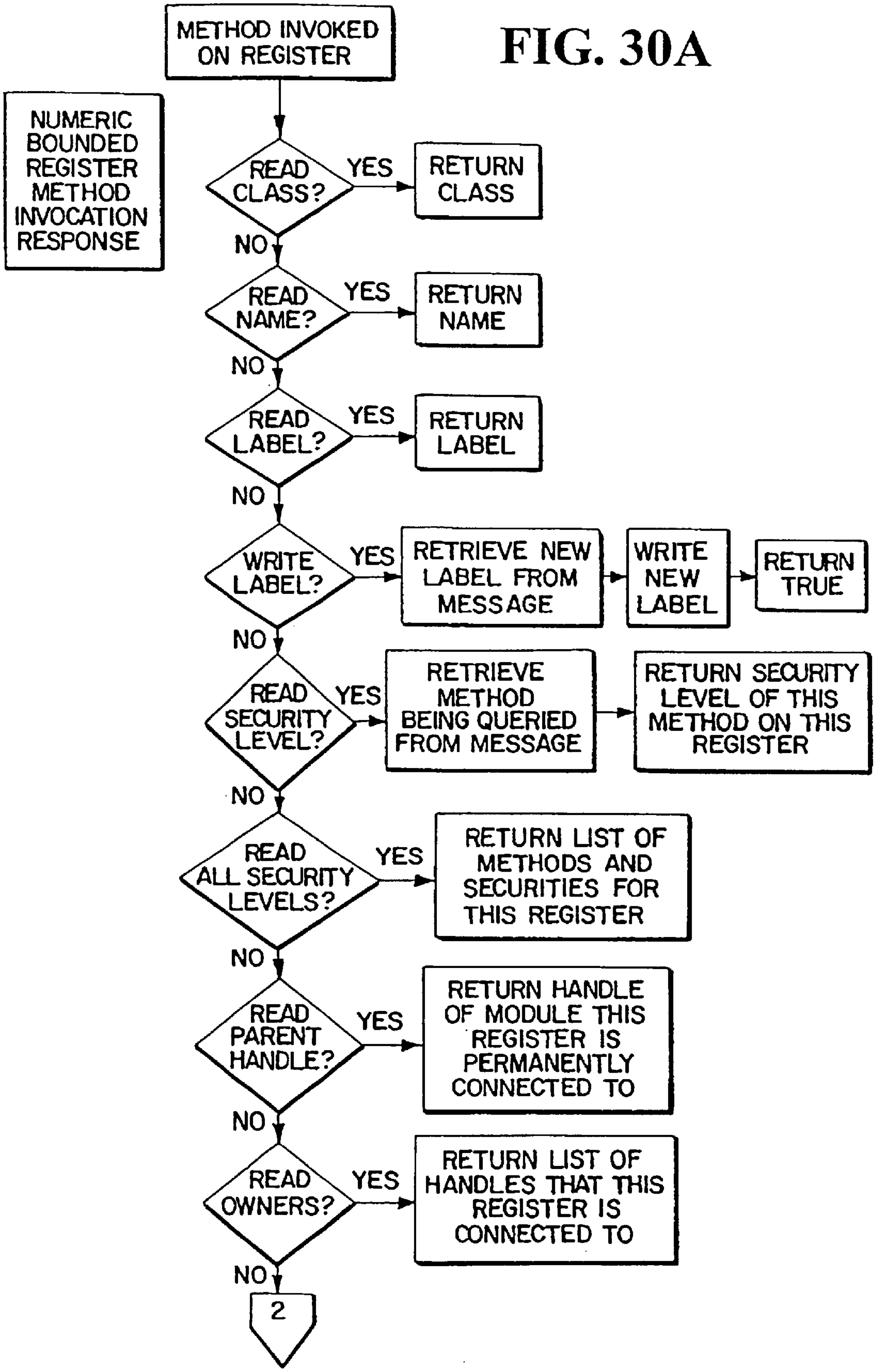
FIGS. 30A and 30B show a flowchart of a preferred embodiment of the logic for the operation of a numeric bounded register.
Figure 30B:
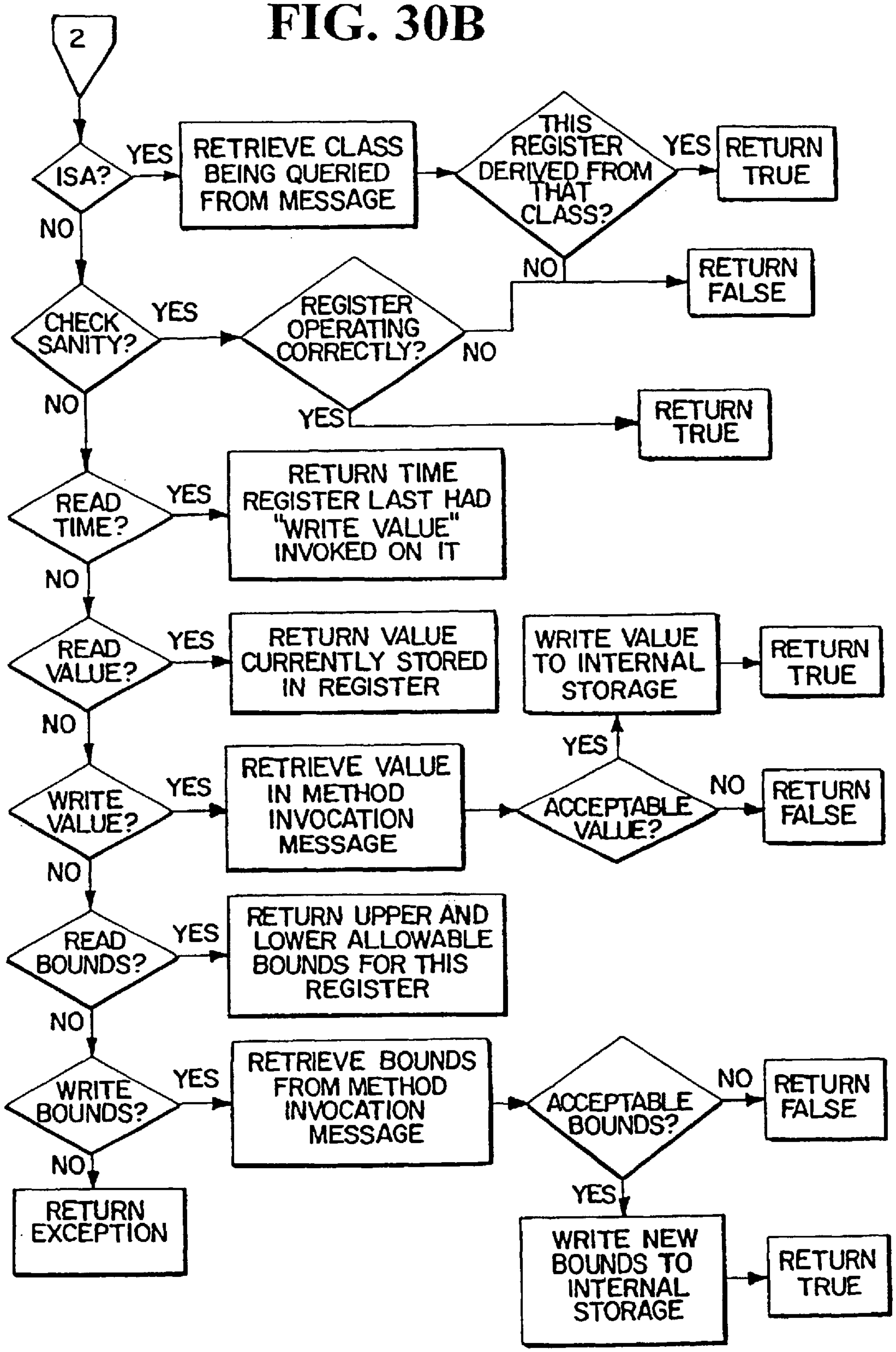
Figure 31A:
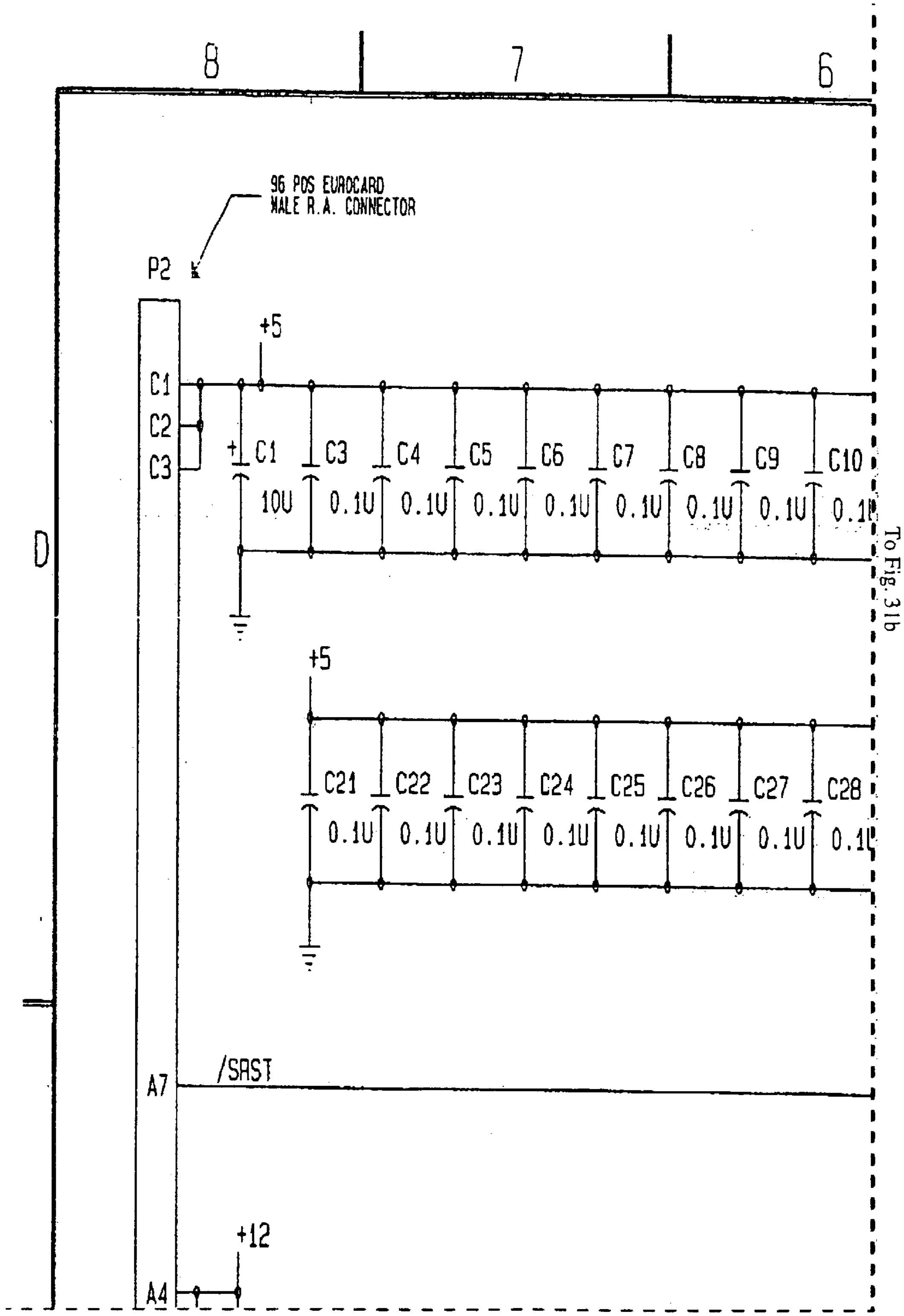
FIGS. 31*a*–46*i* depict schematic diagrams of the presently preferred embodiments.
Figure 31B:
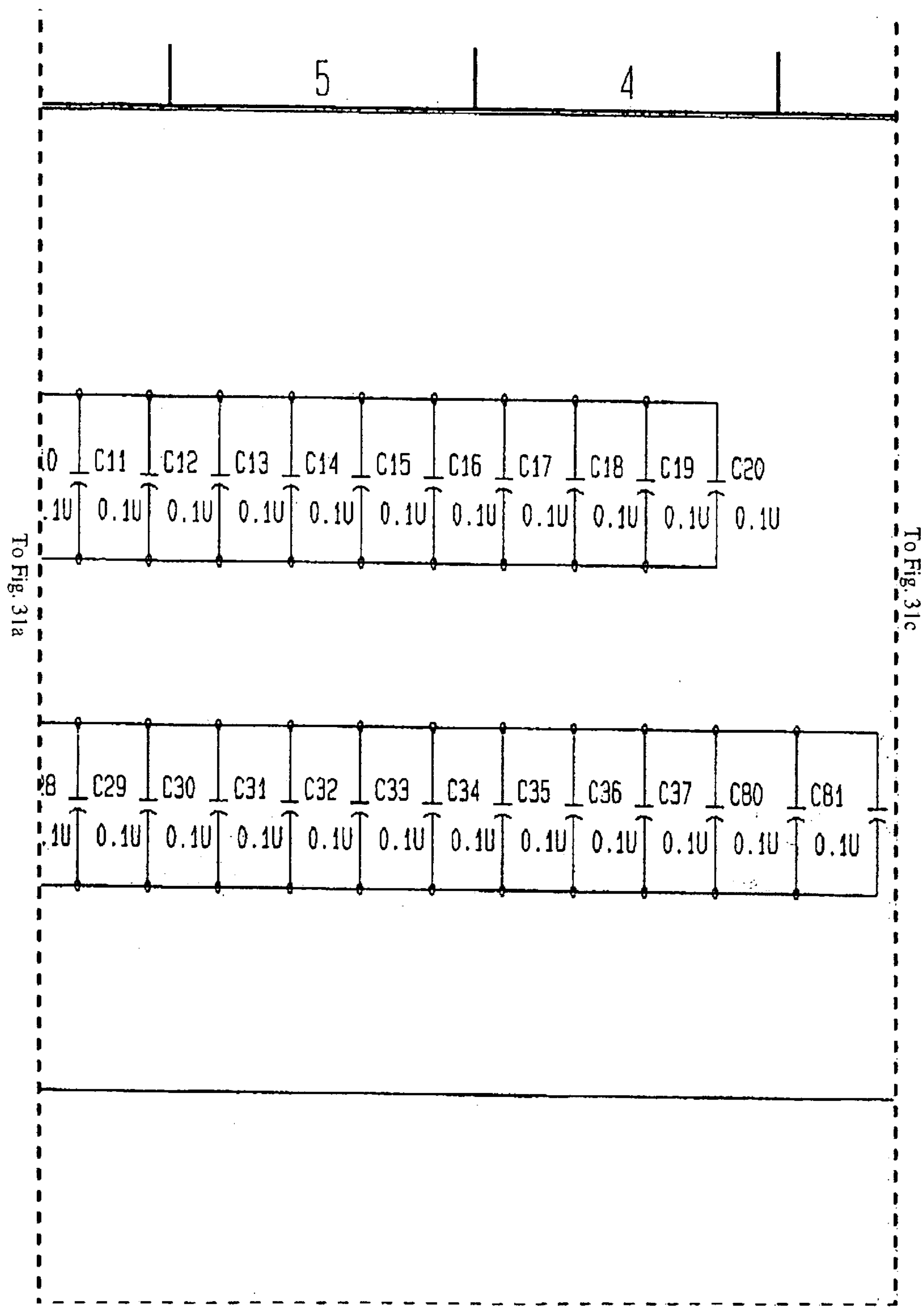
Figure 31C:
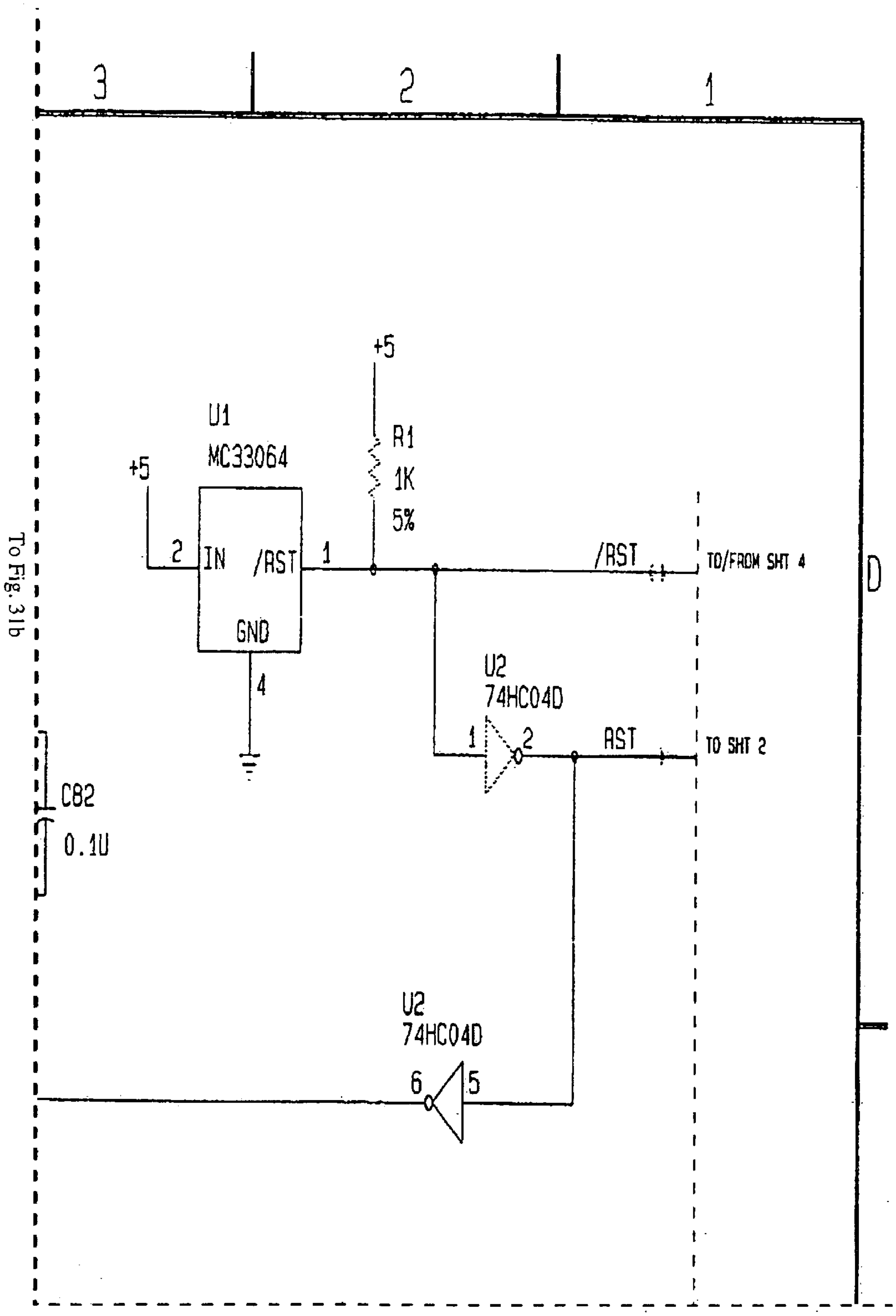
Figure 31D:
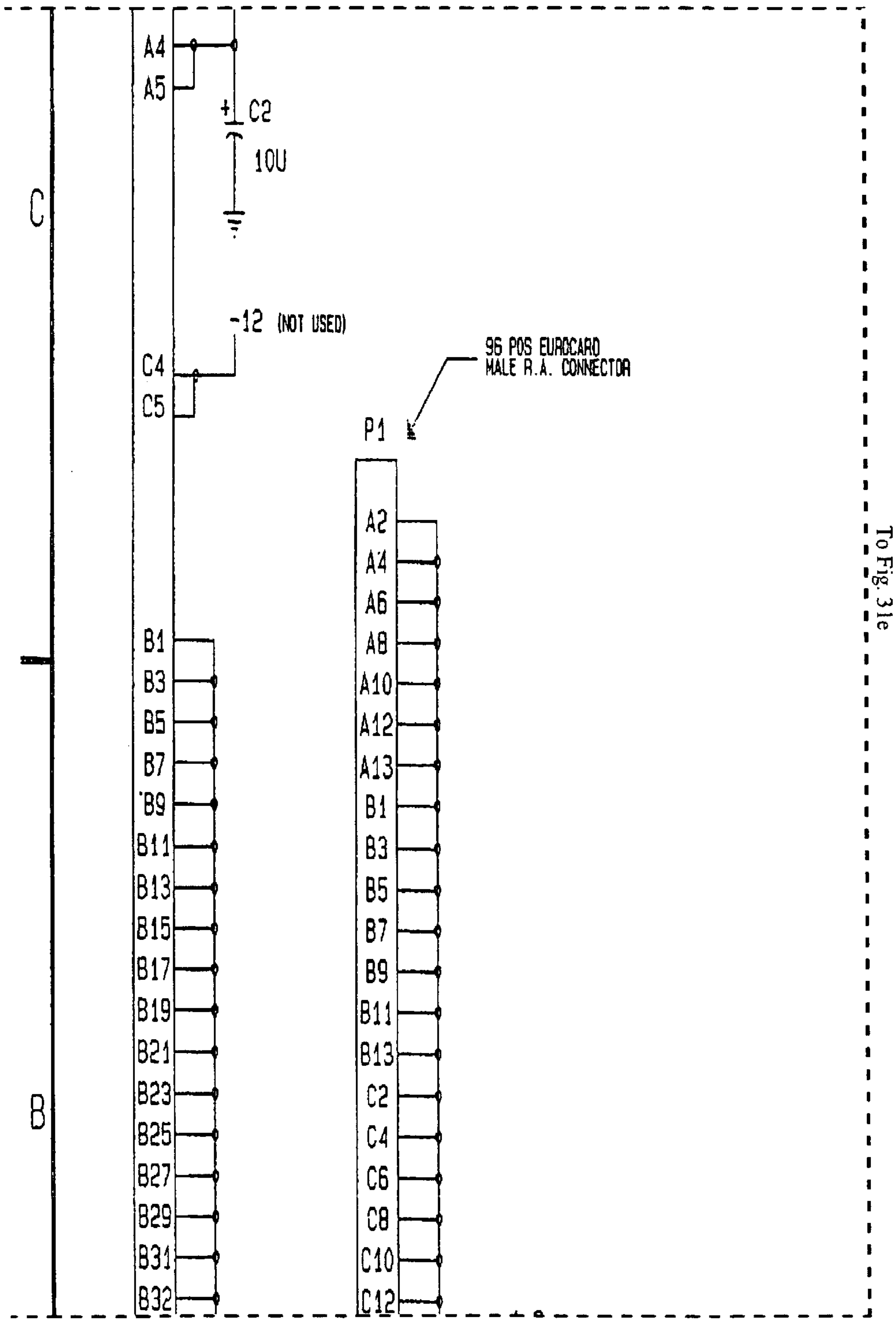
Figure 31E:
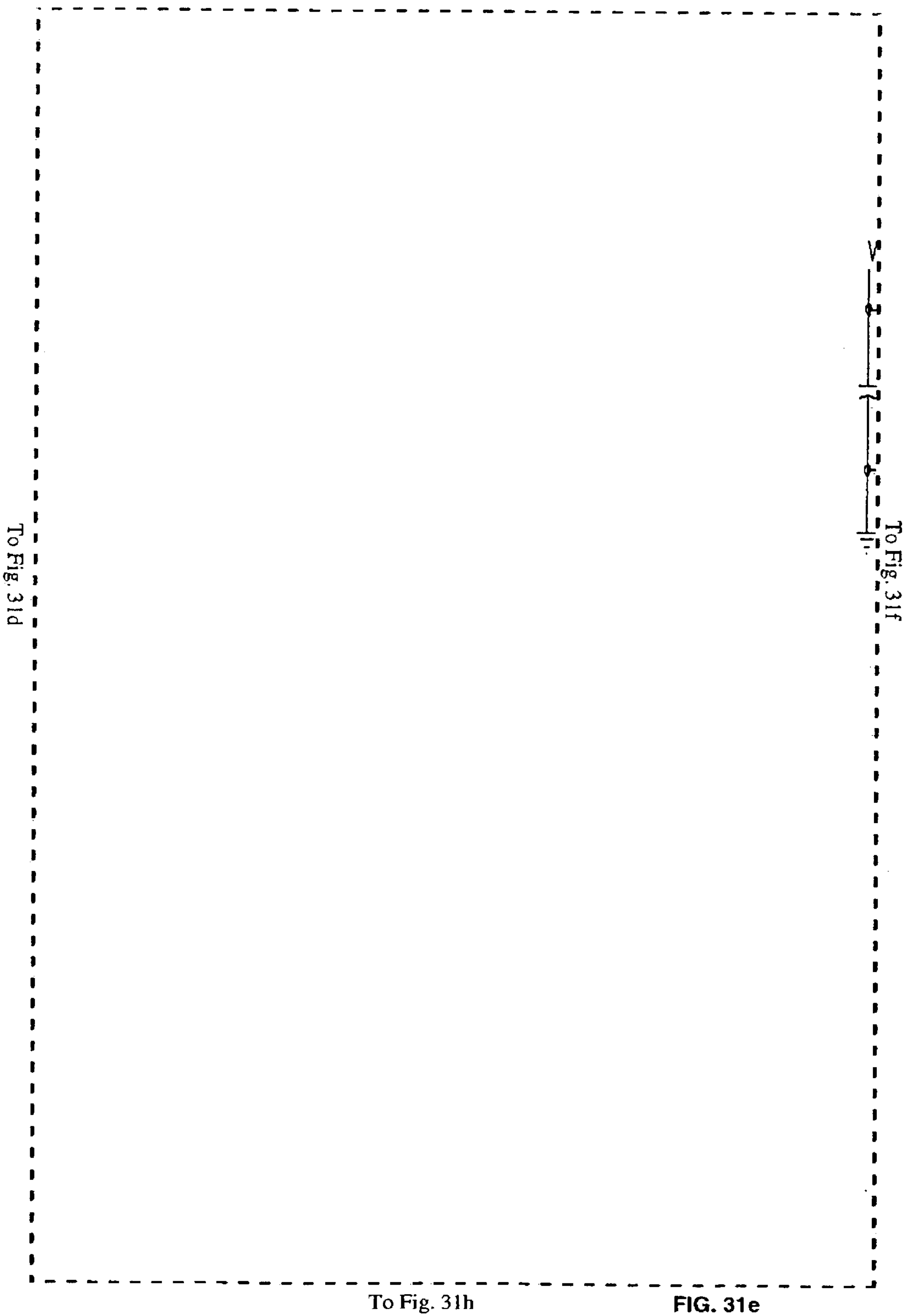
Figure 31F:
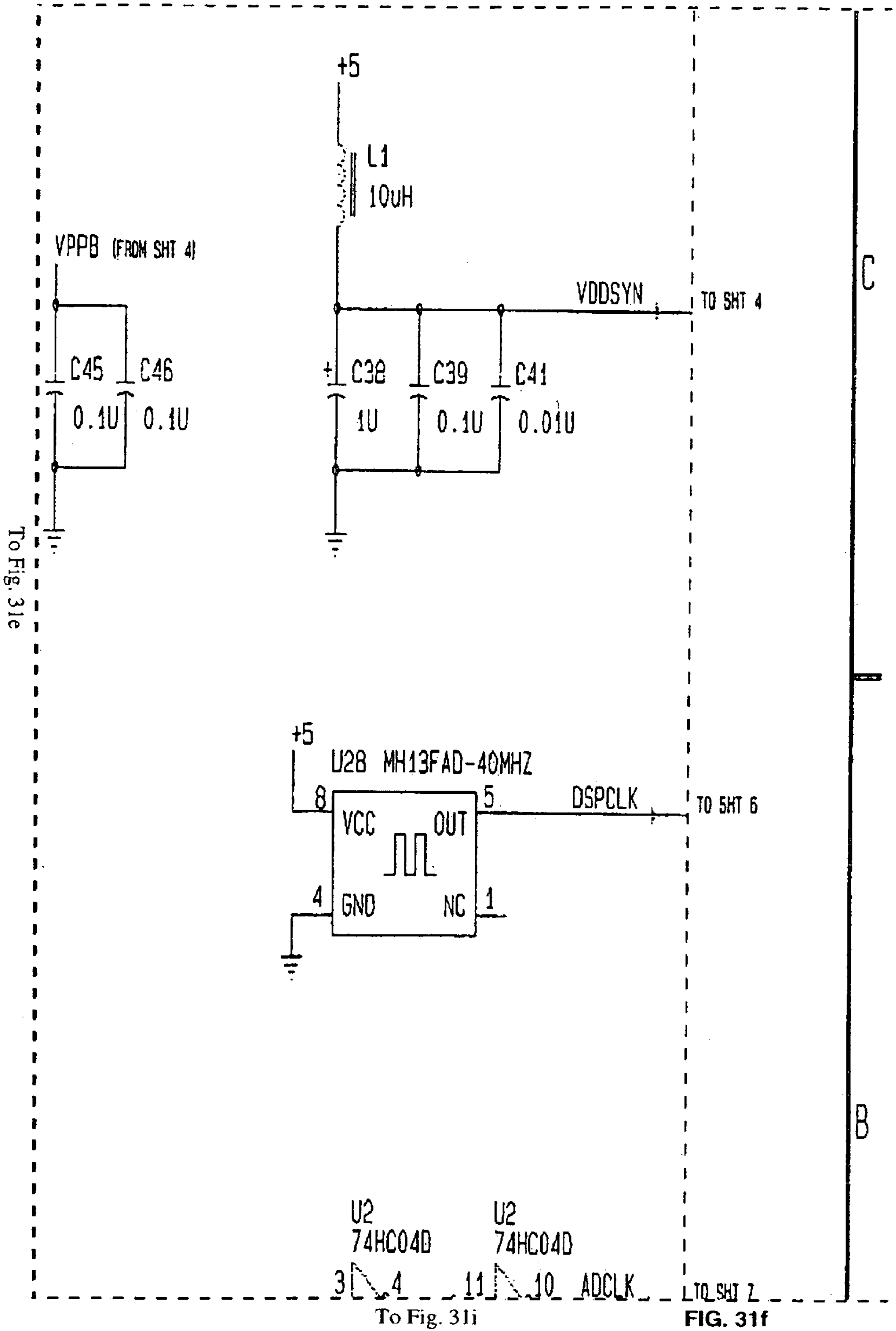
Figure 31G:
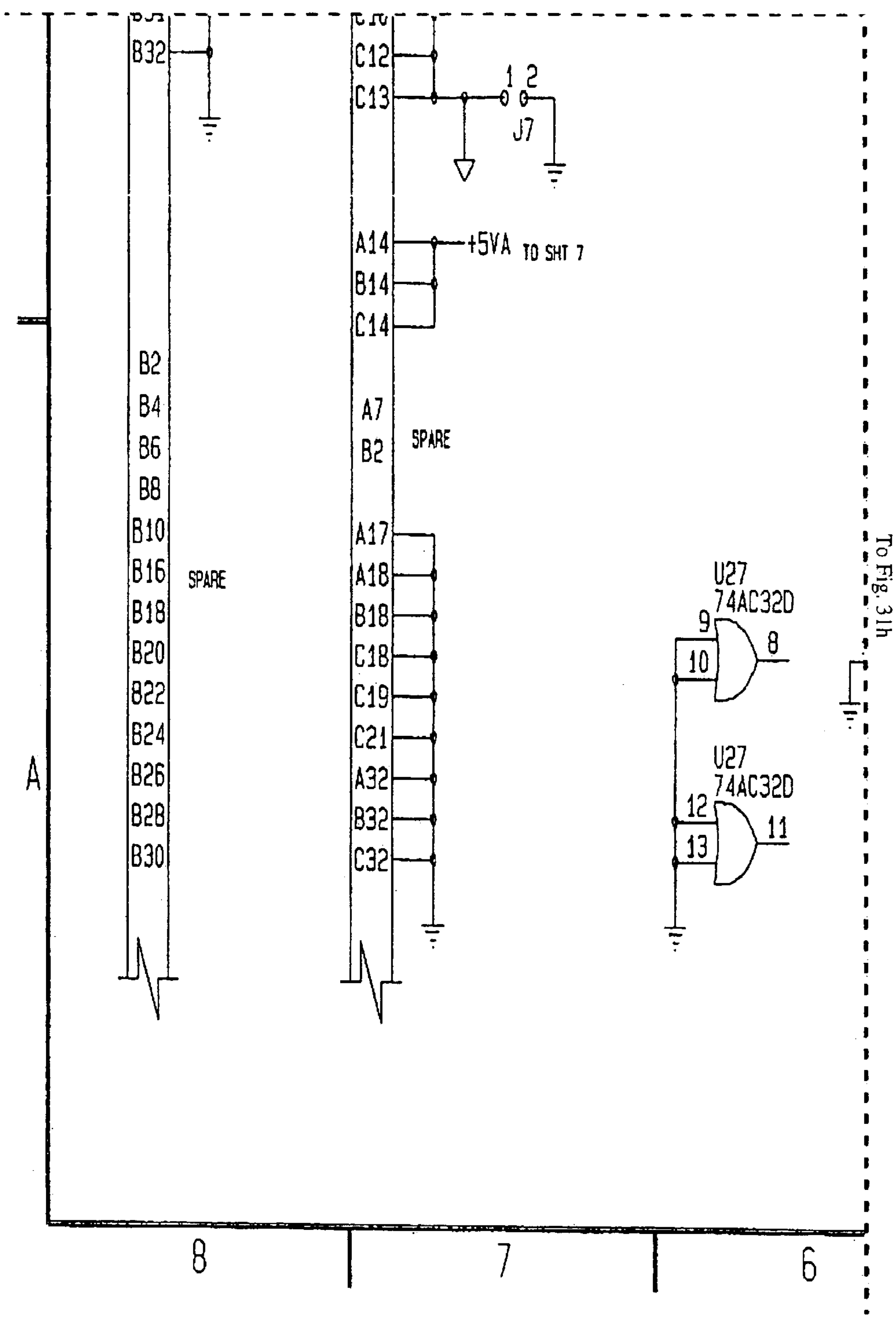
Figure 31H:
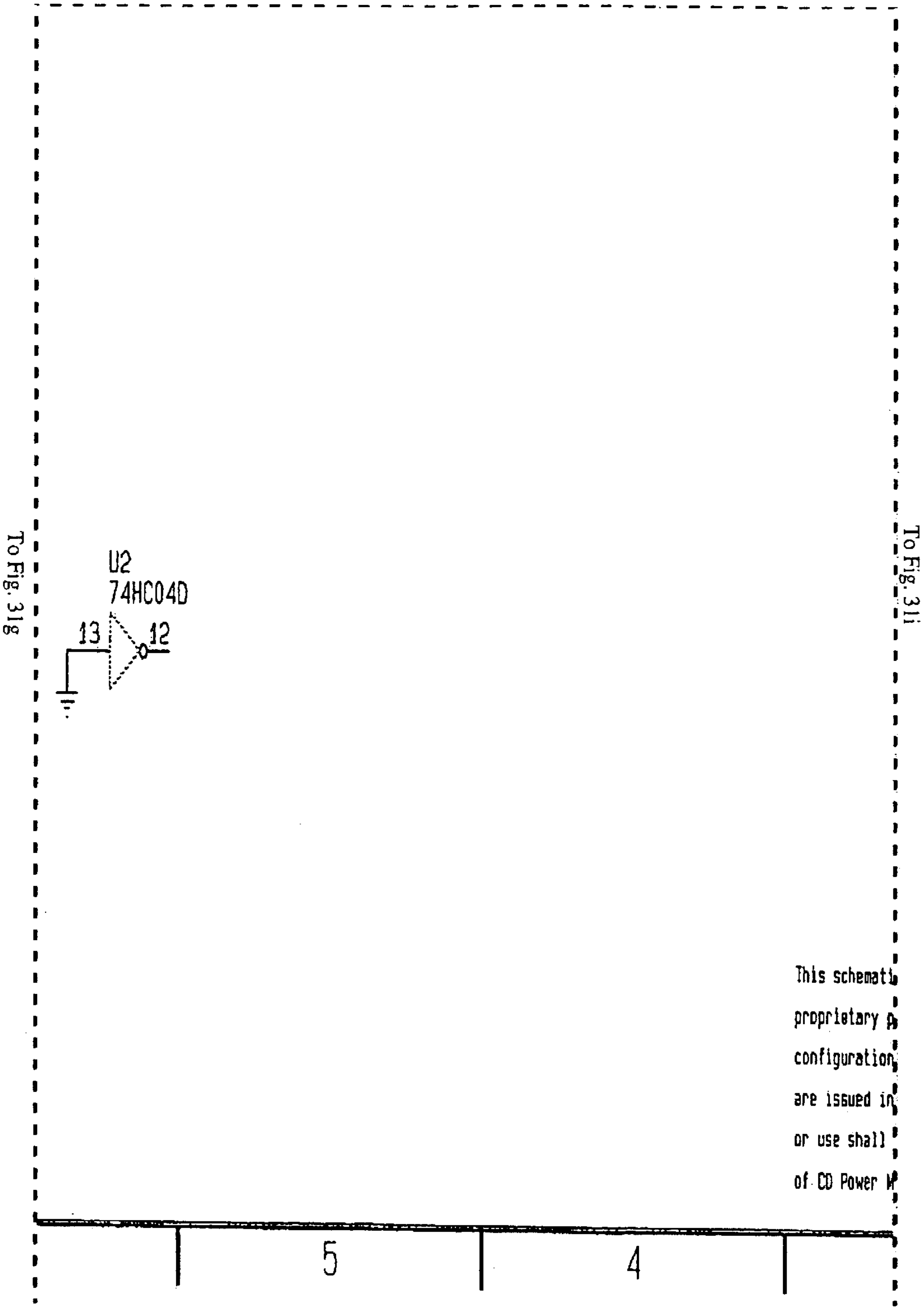
Figure 31I:
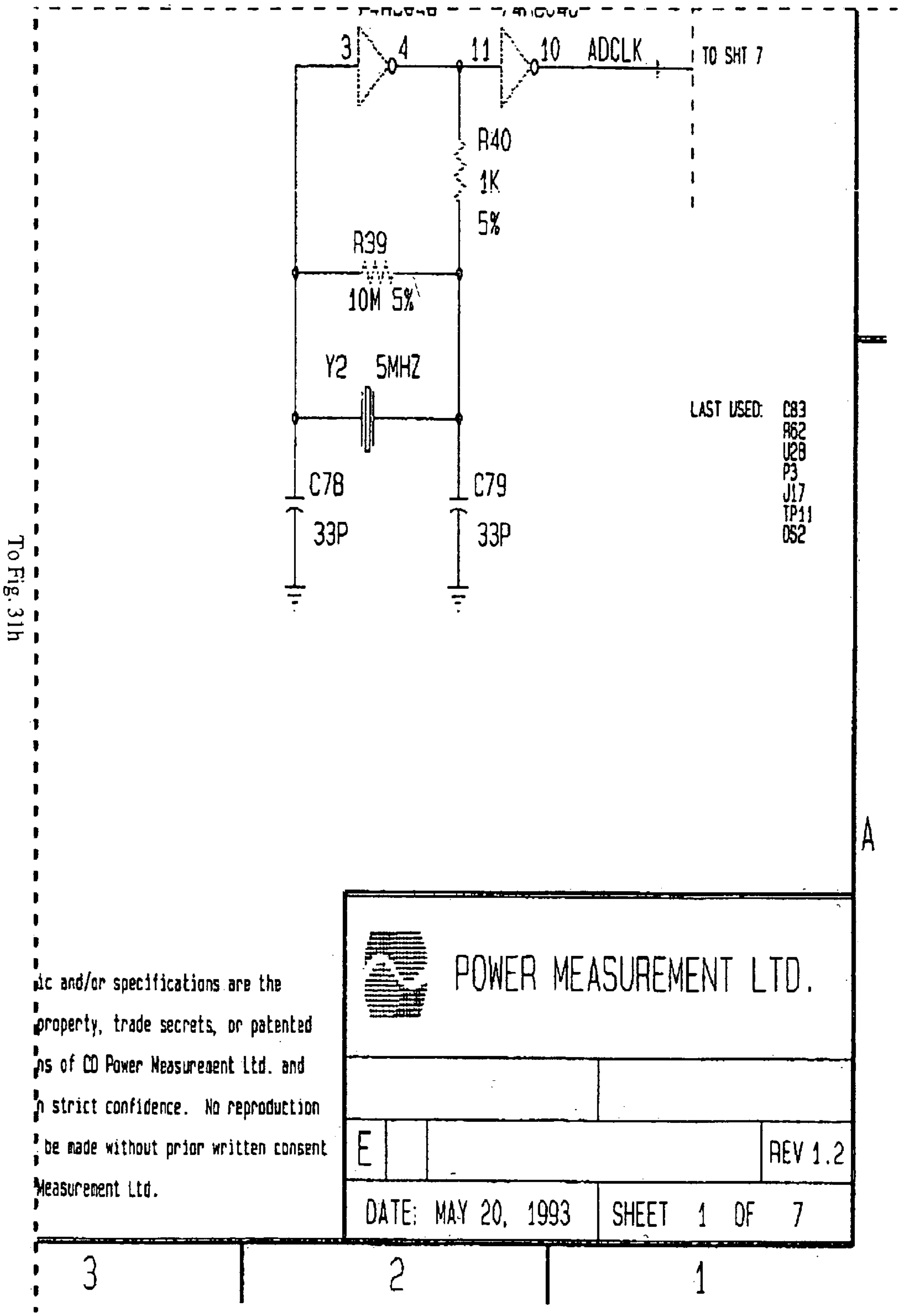
Figure 32A:
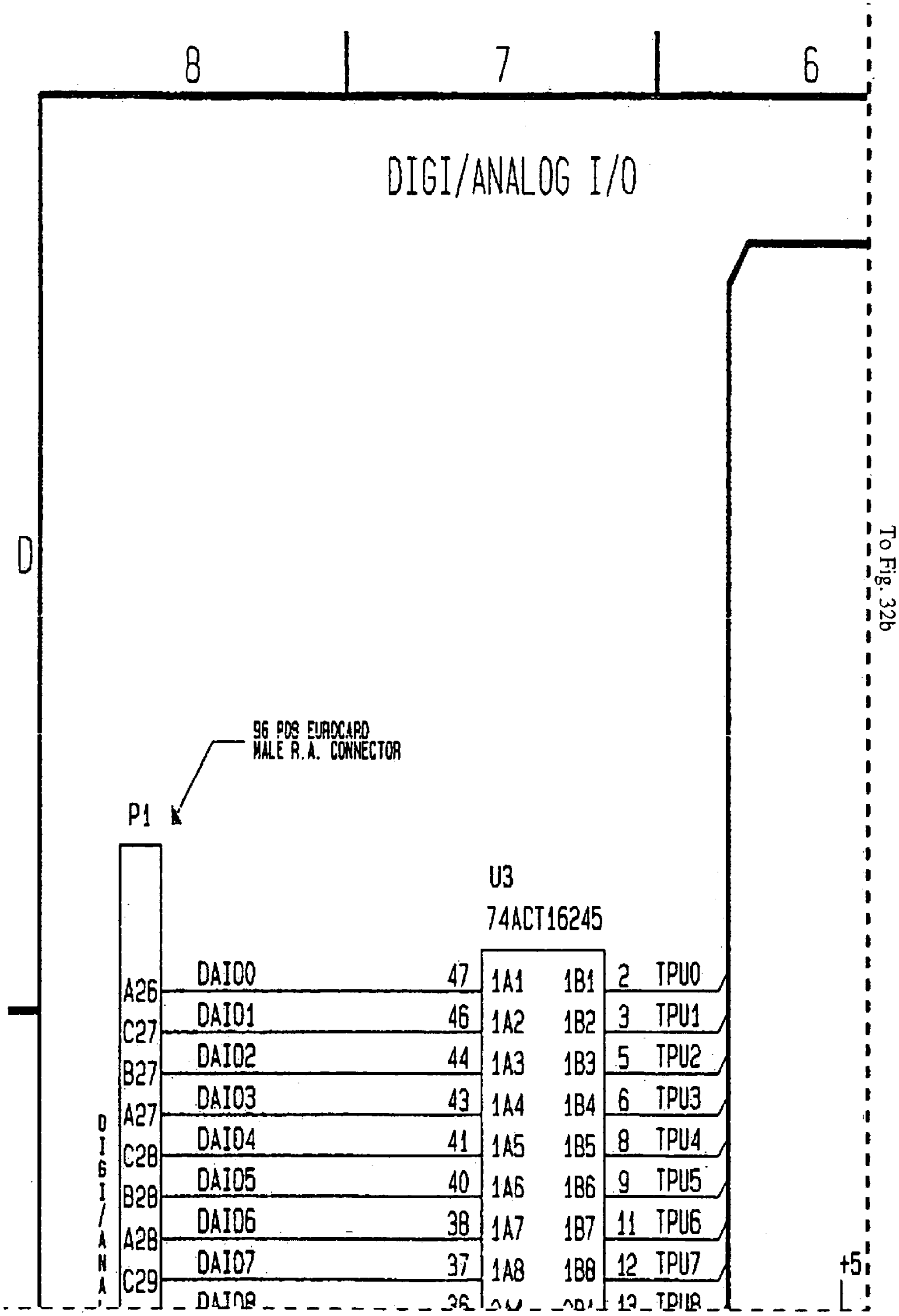
Figure 32B:
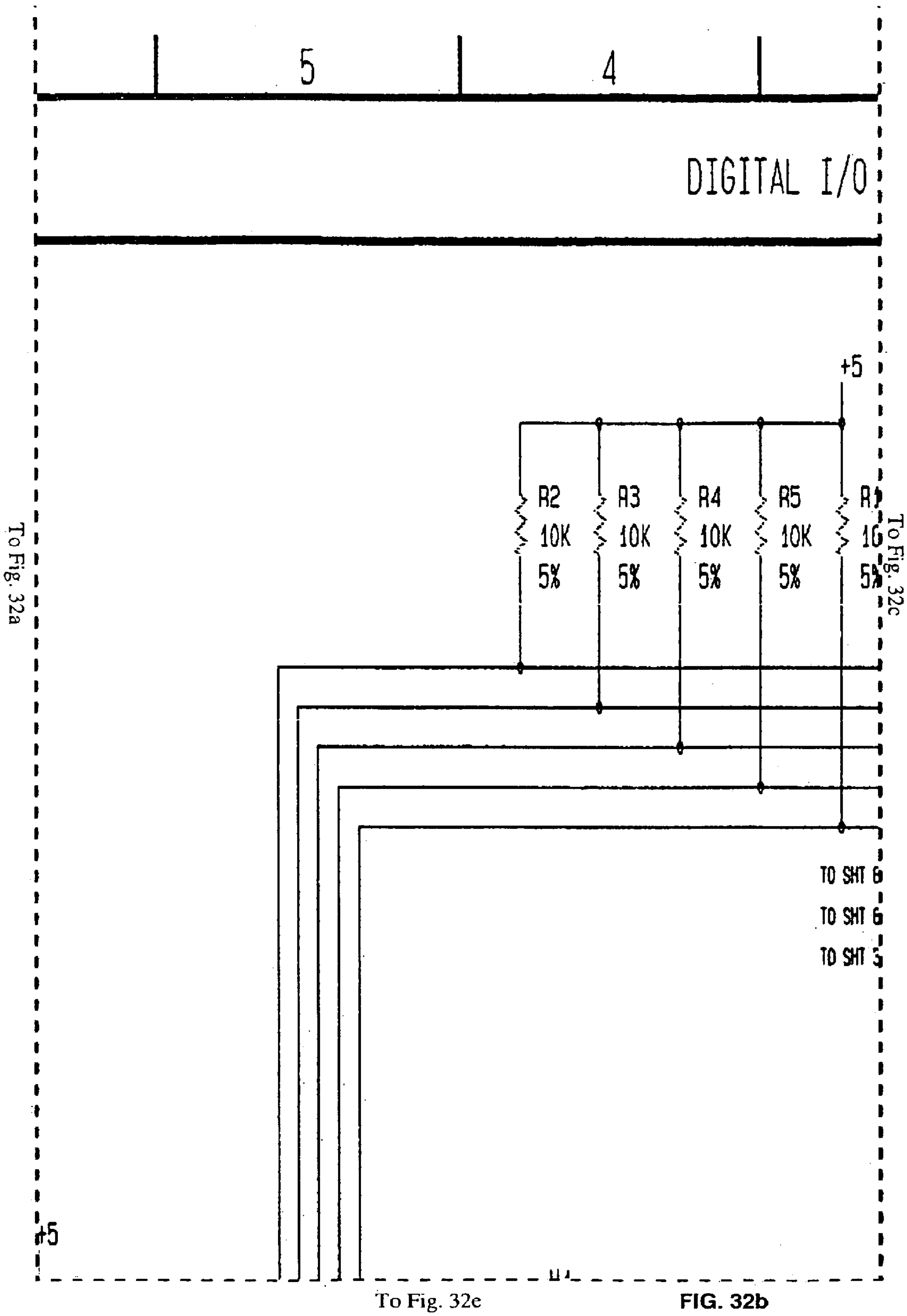
Figure 32C:
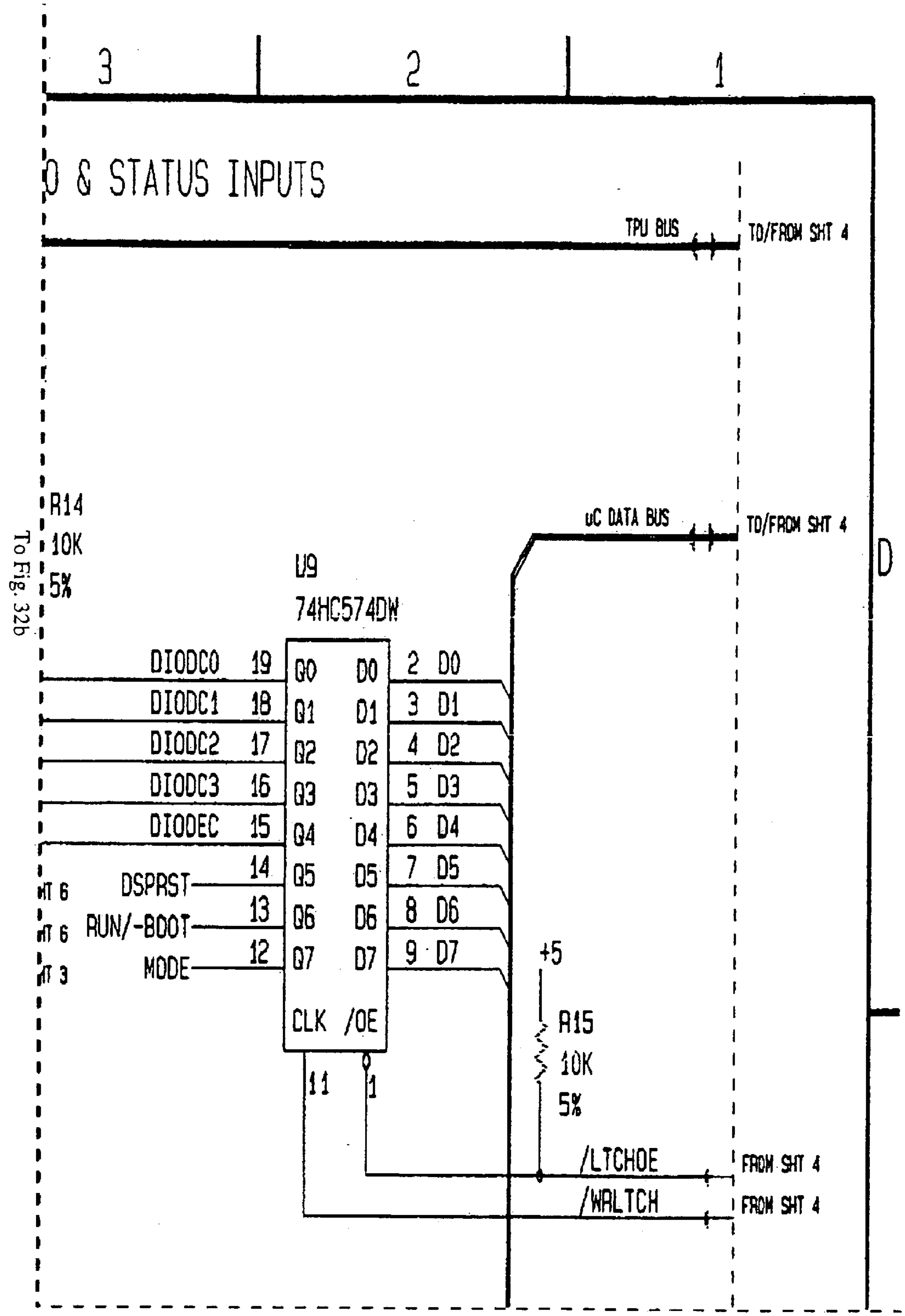
Figure 32D:
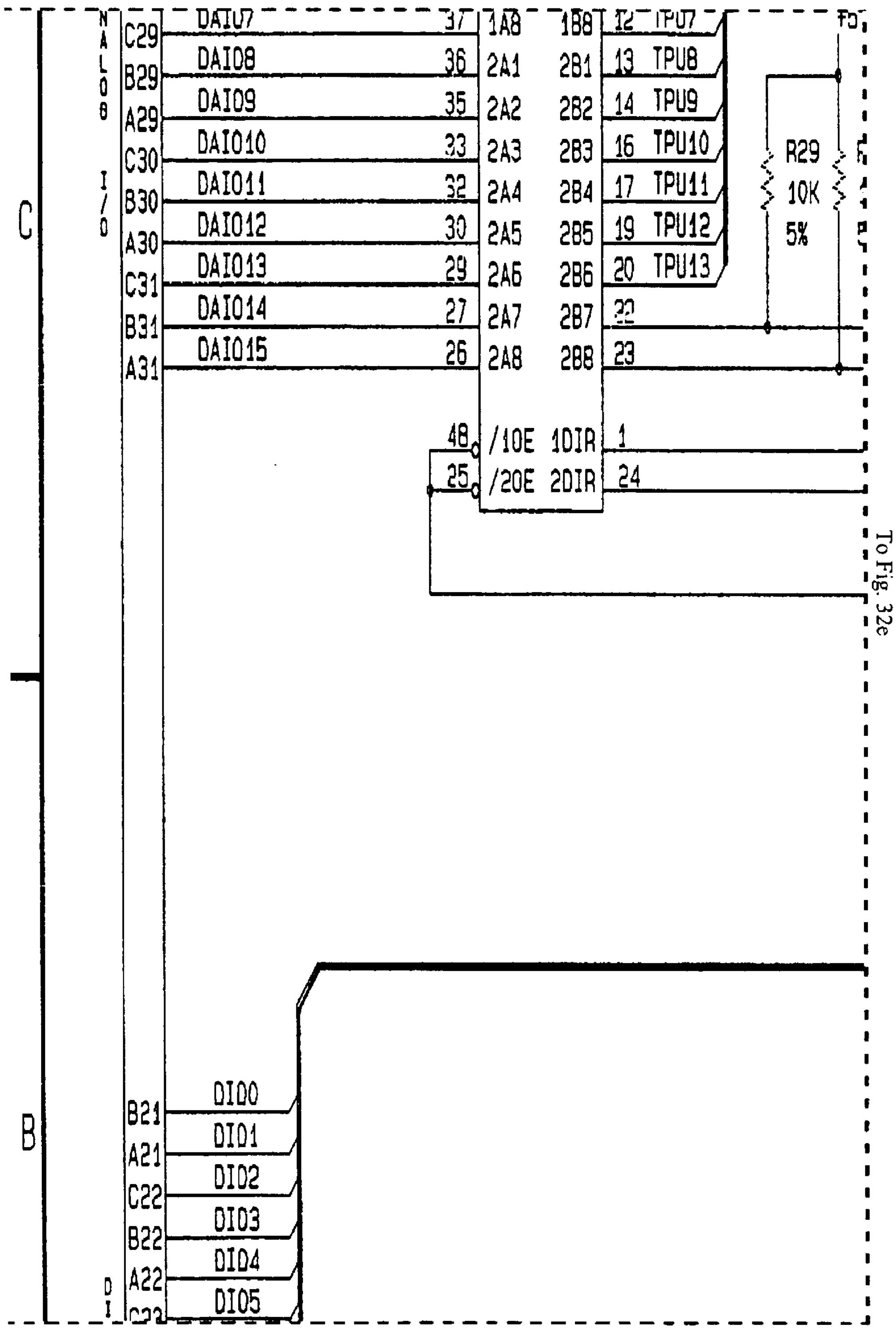
Figure 32:
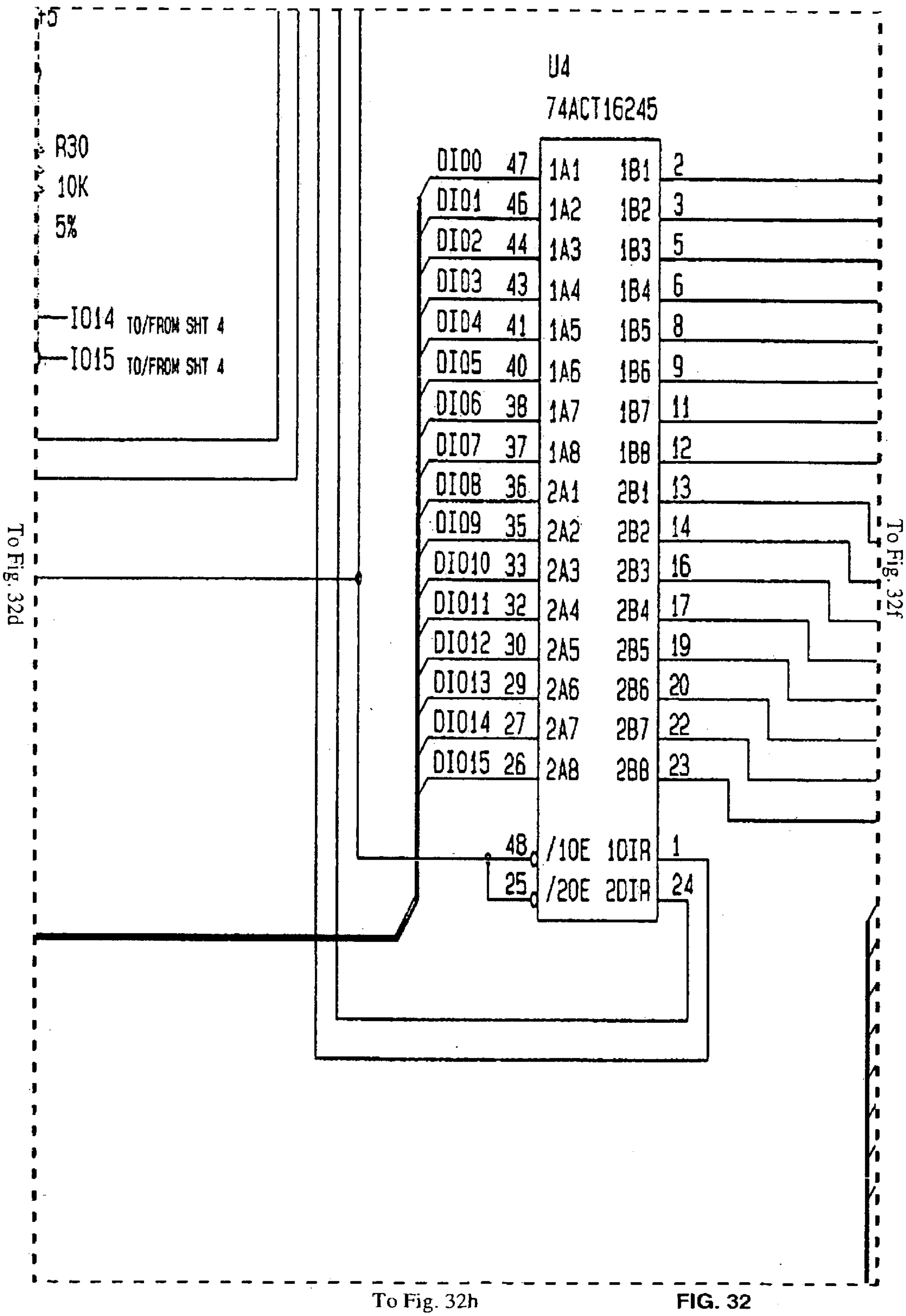
Figure 32F:
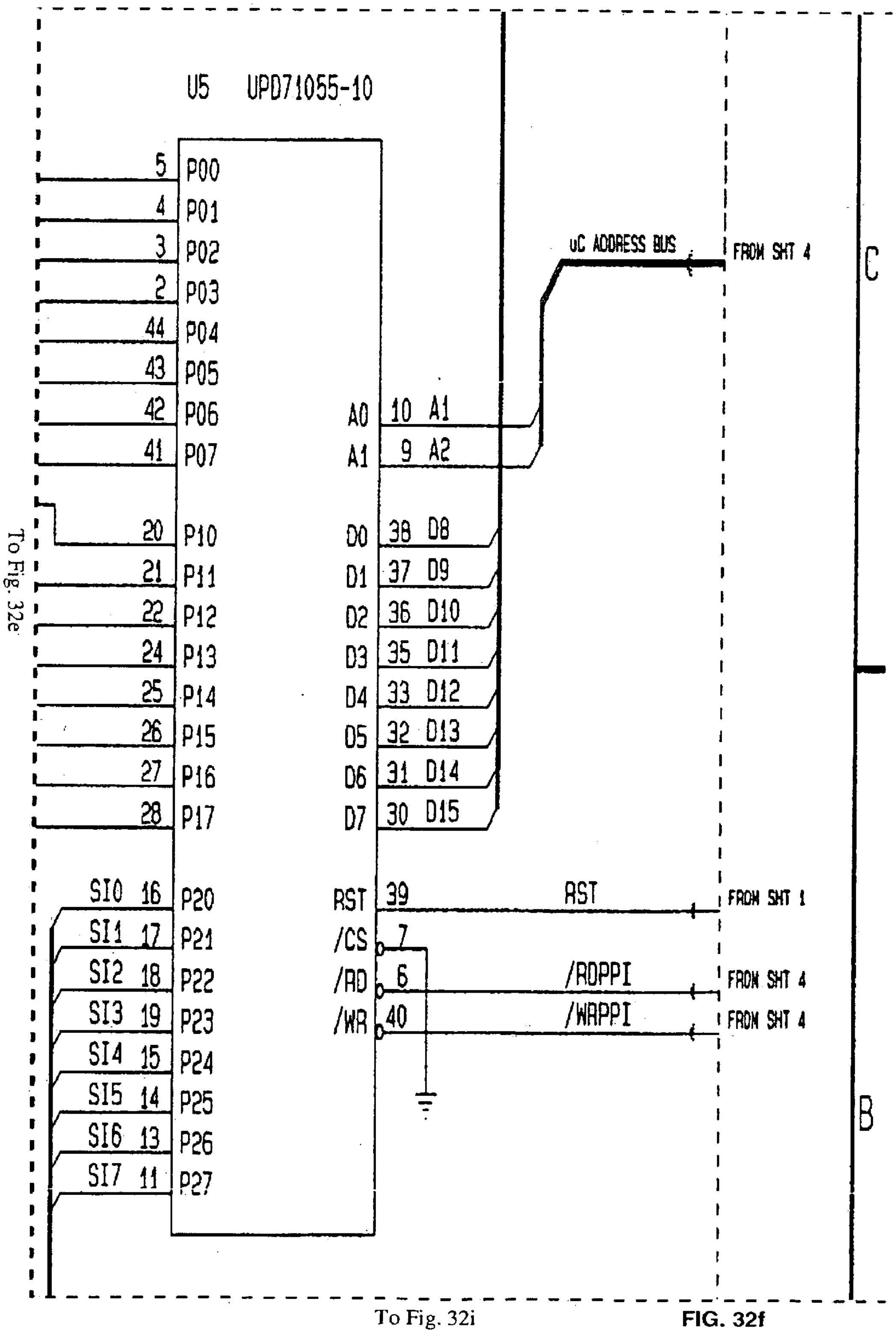
Figure 32G:
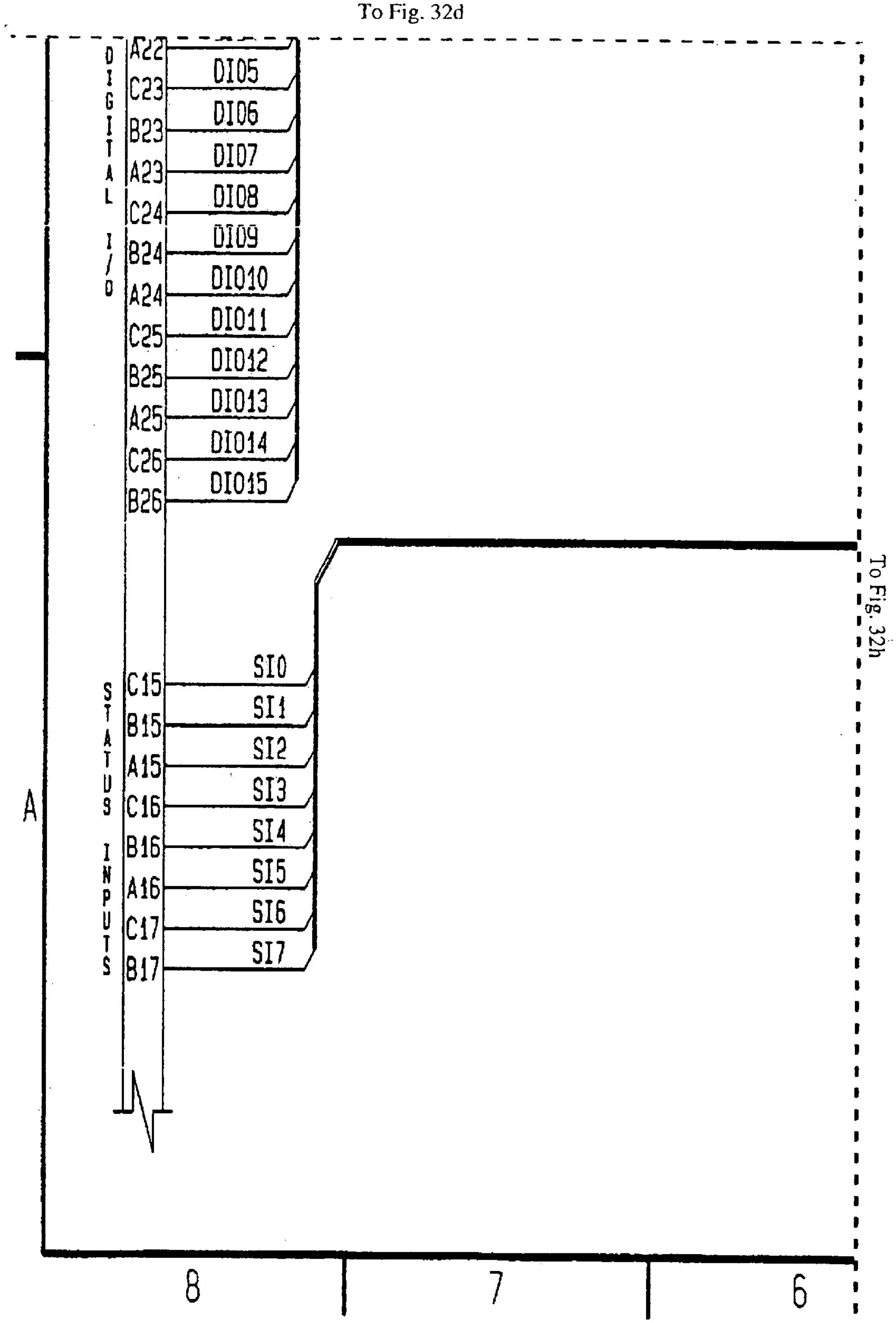
Figure 32H:
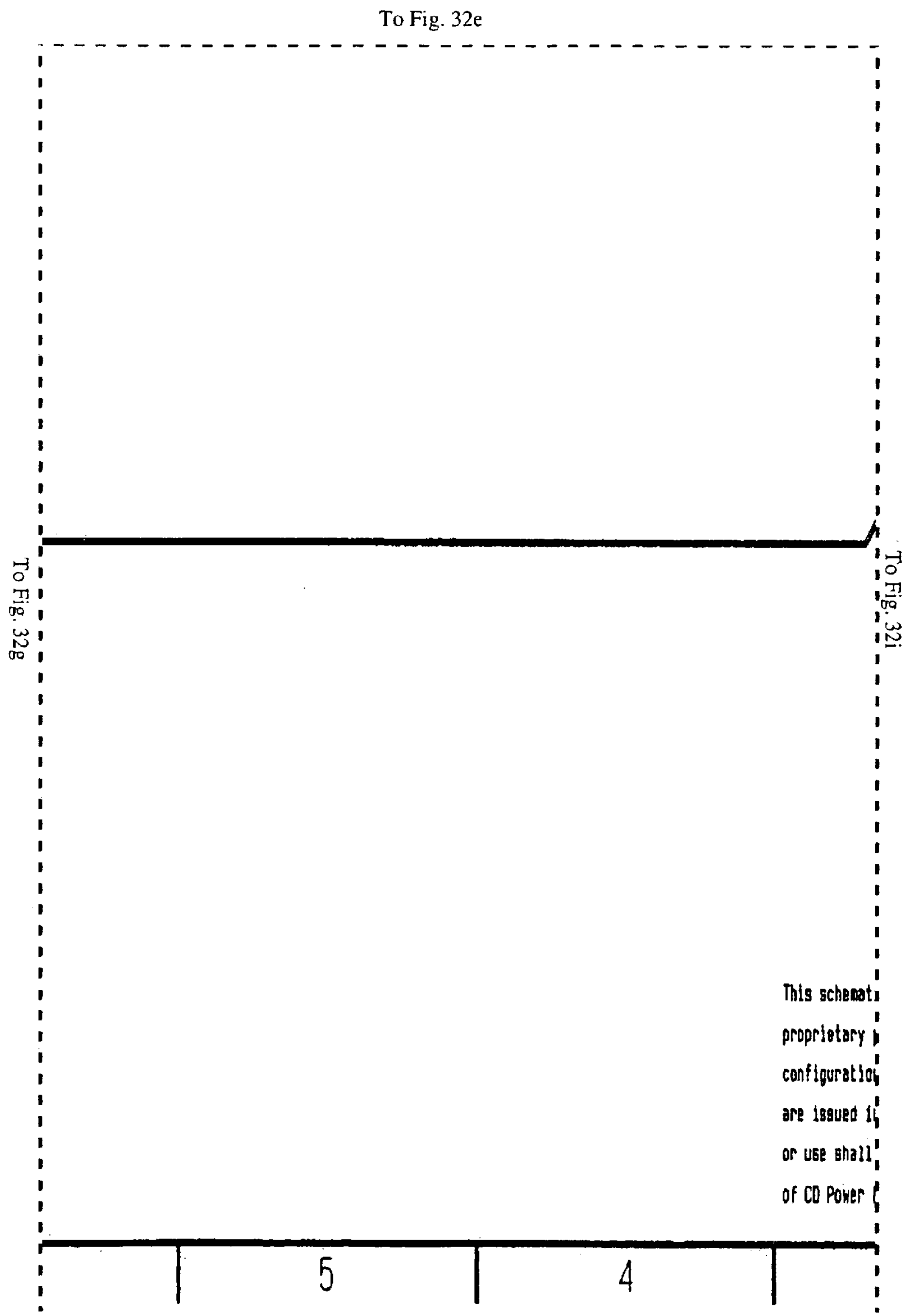
Figure 32I:
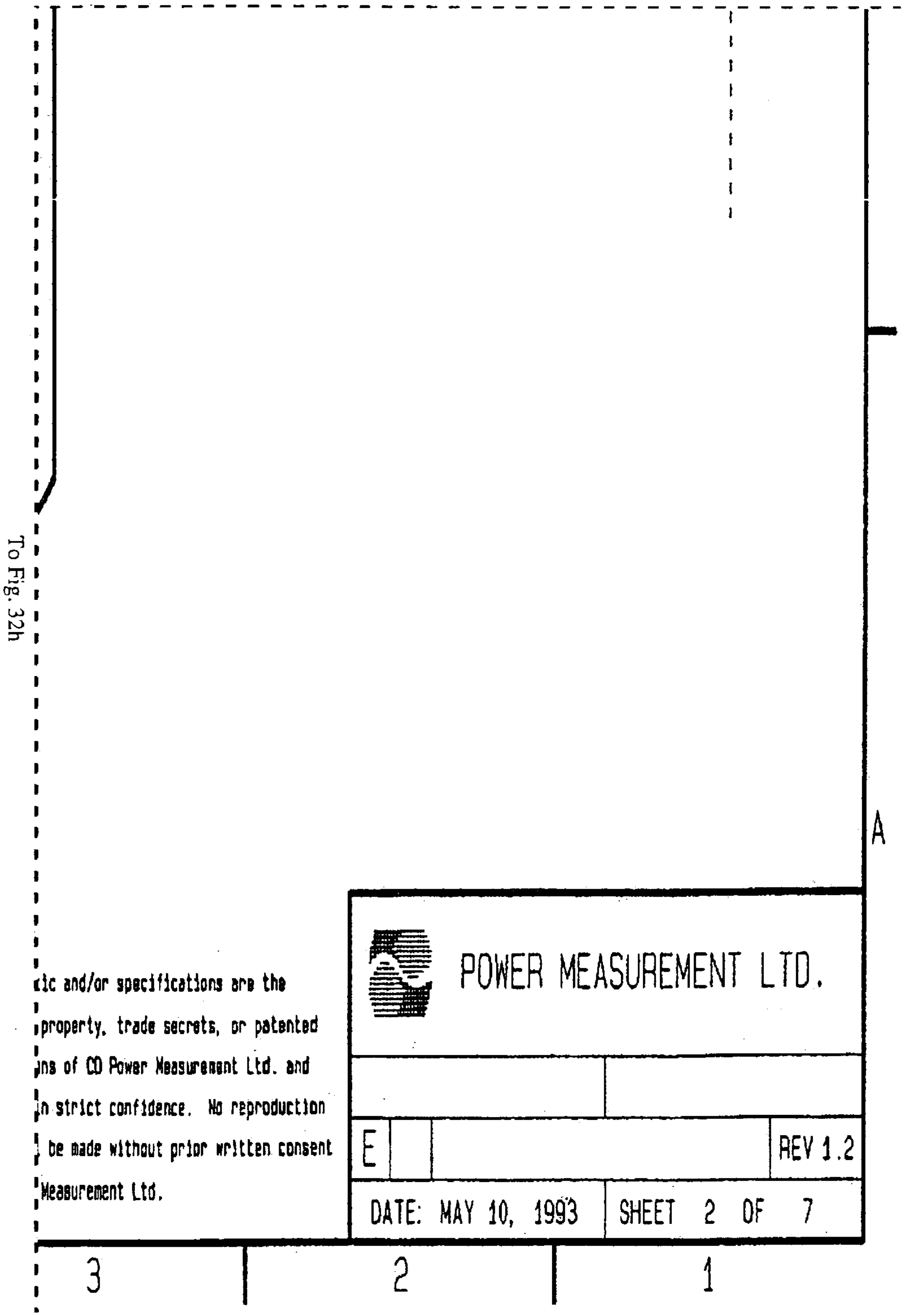
Figure 33A:
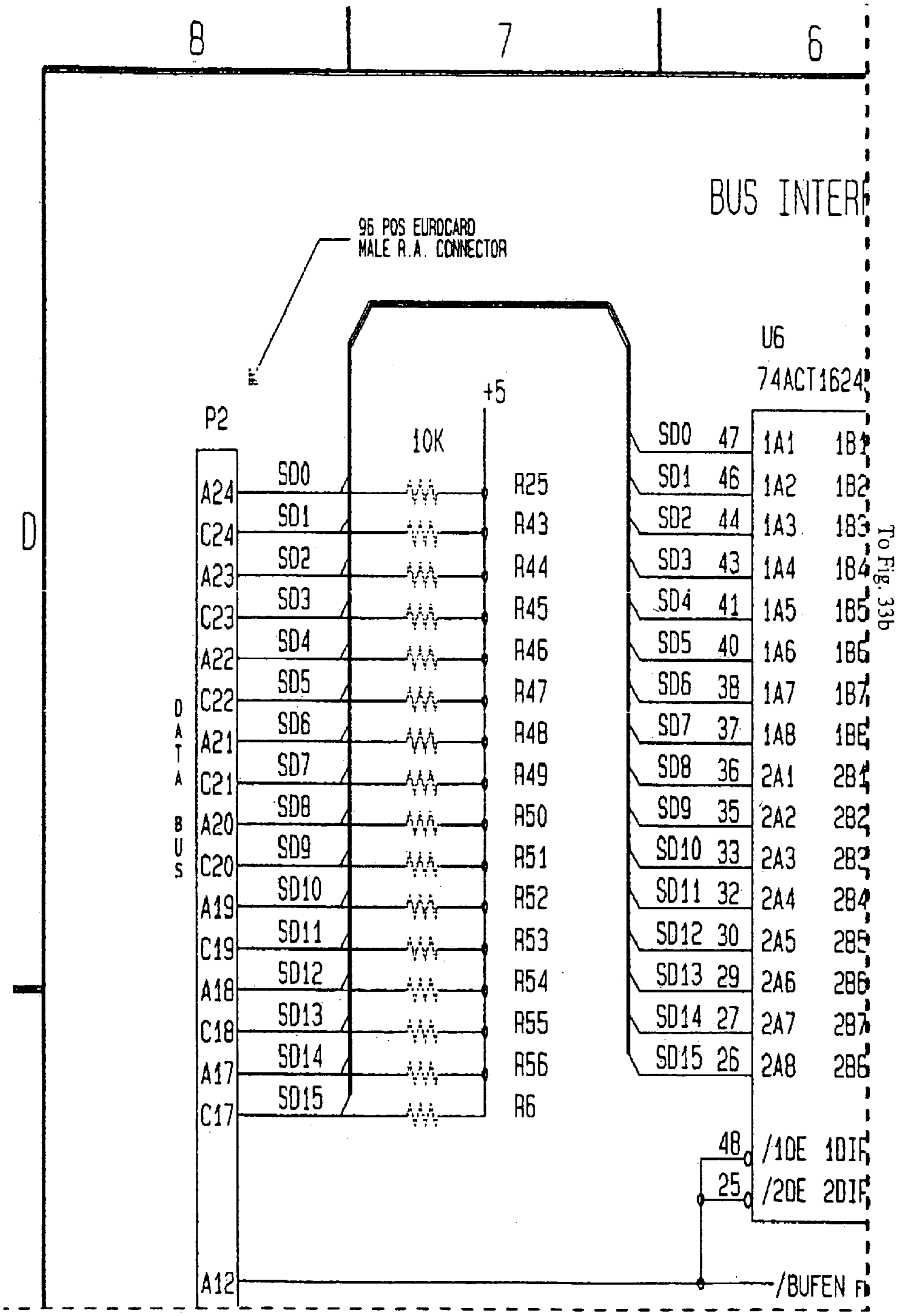
Figure 33B:
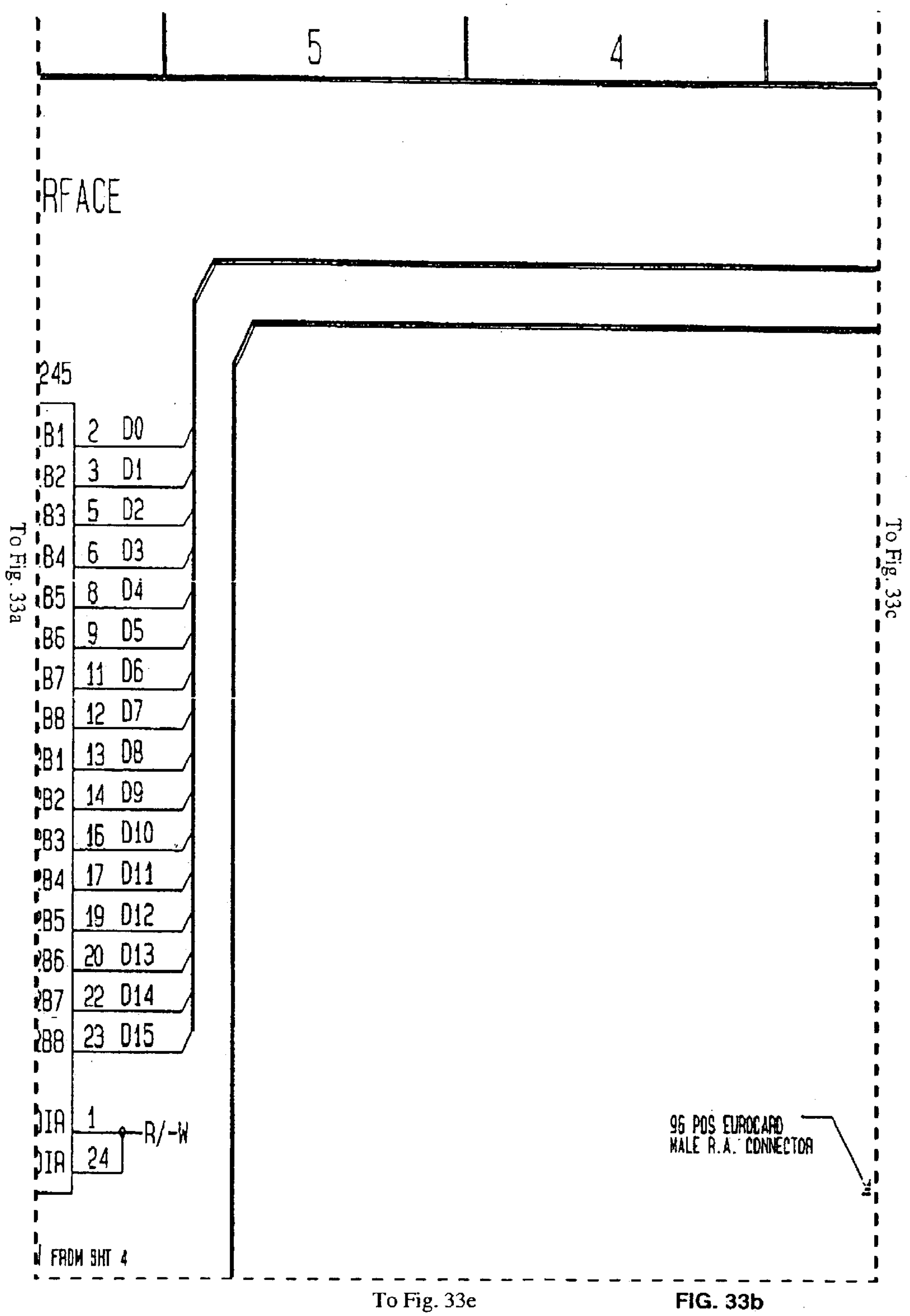
Figure 33C:
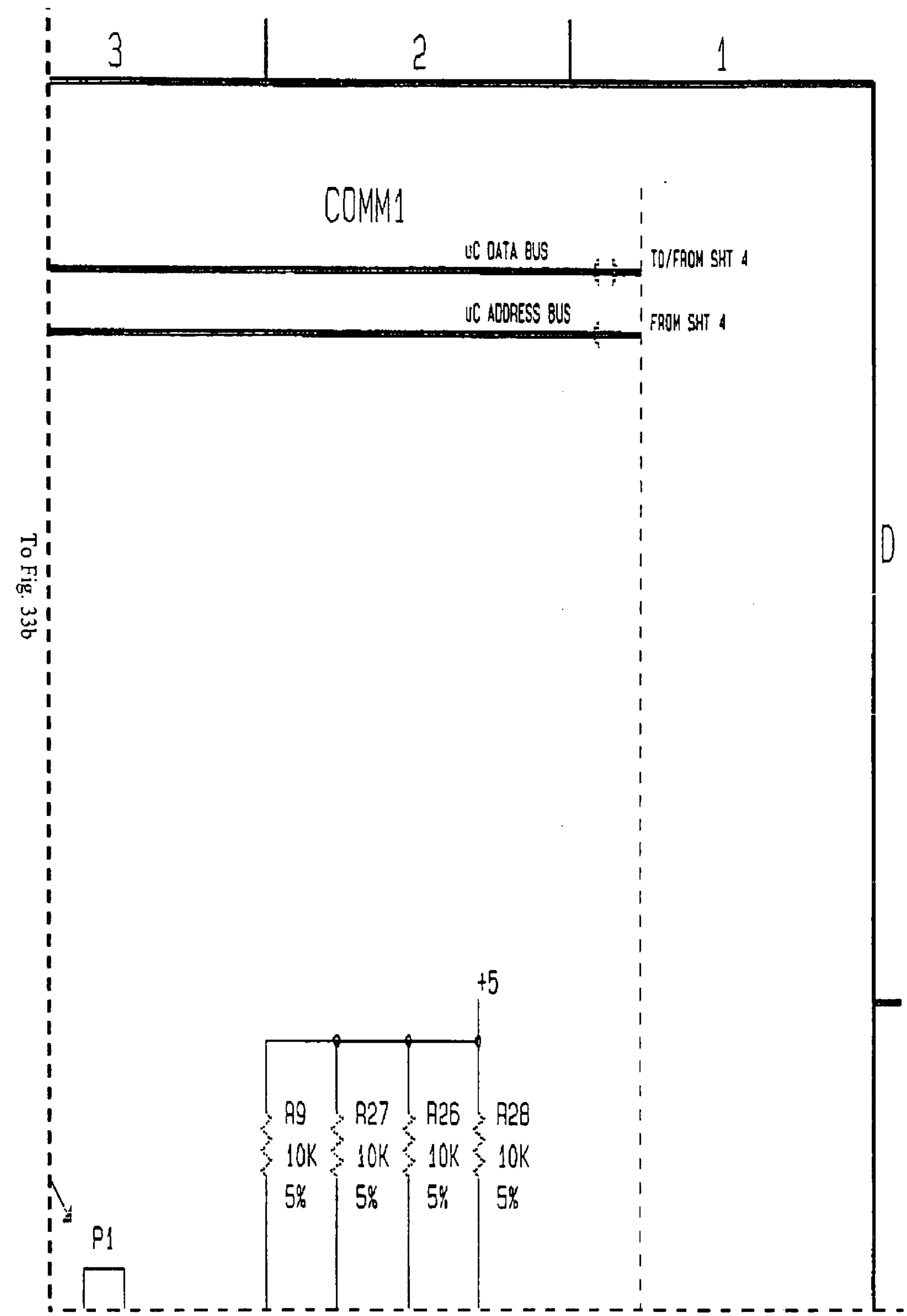
Figure 33D:
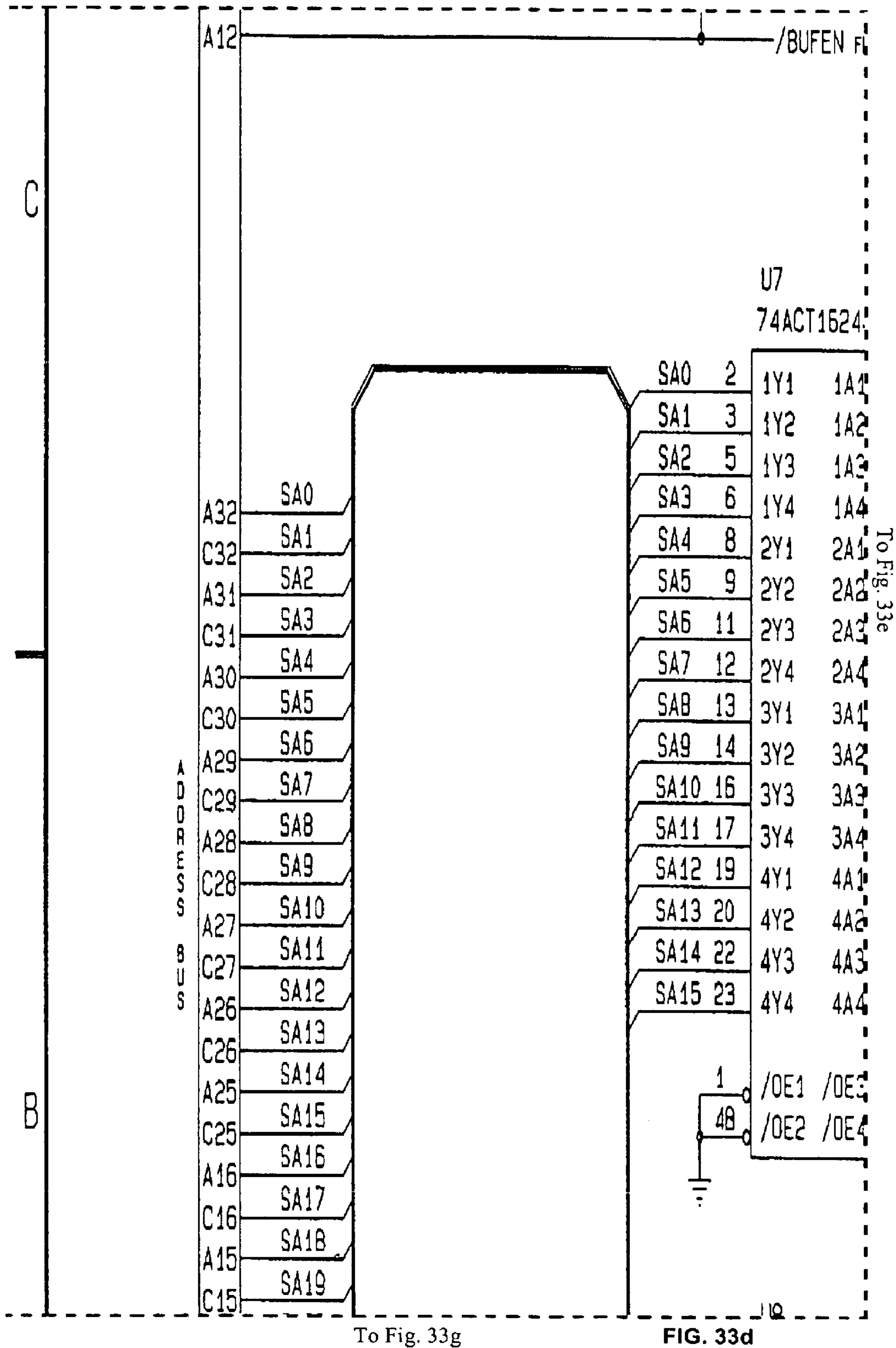
Figure 33E:
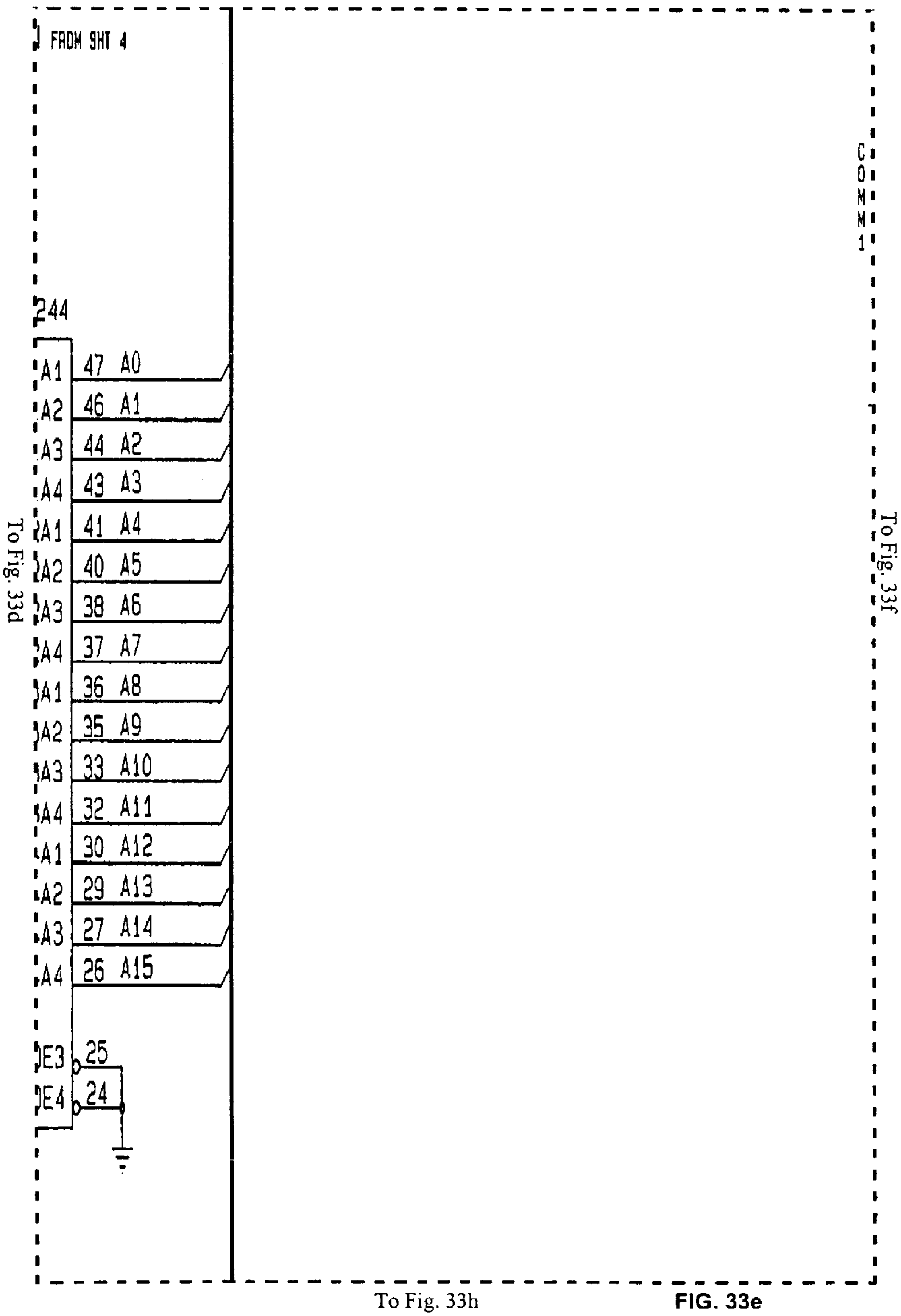
Figure 33F:
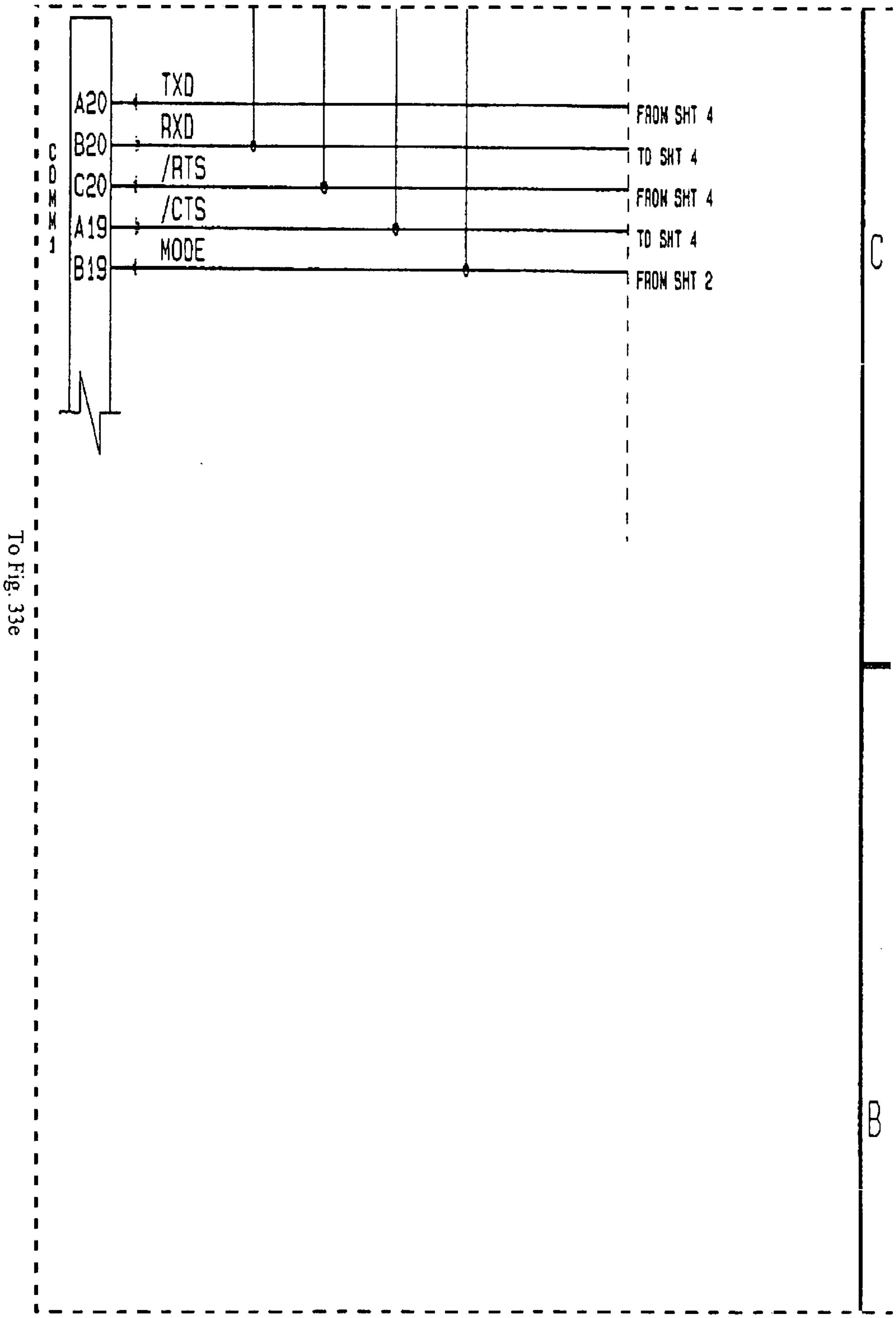
Figure 33G:
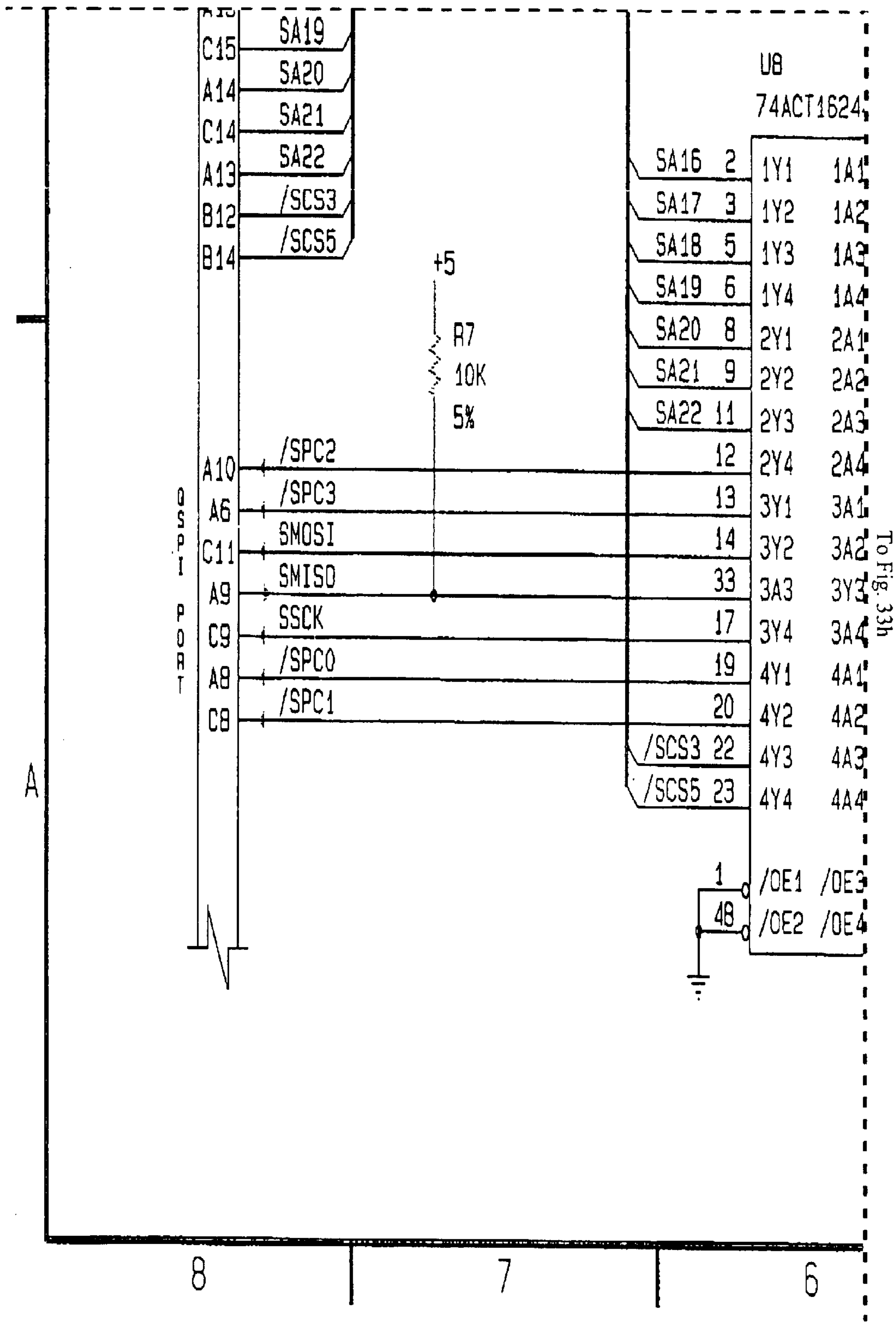
Figure 33H:
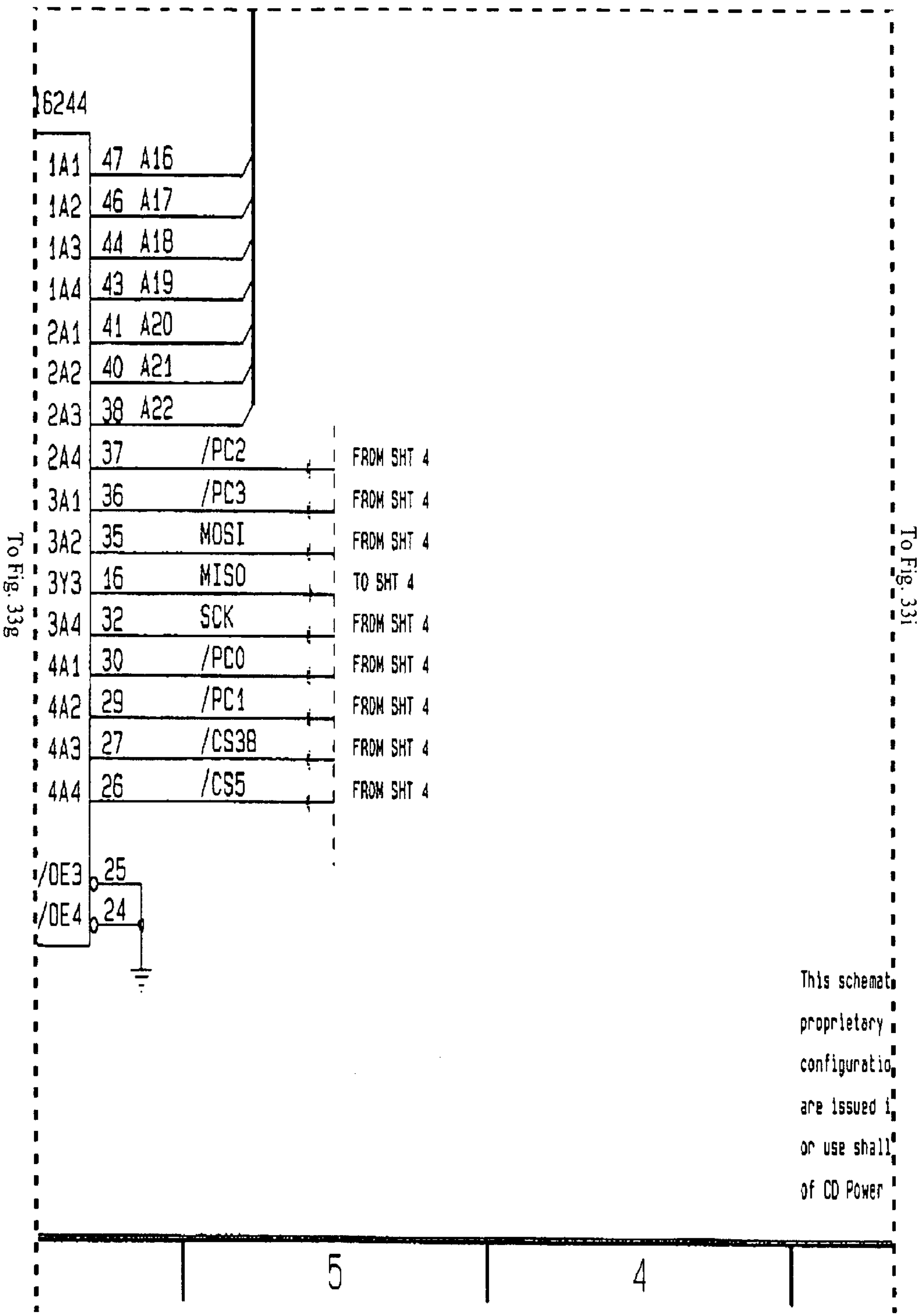
Figure 34A:
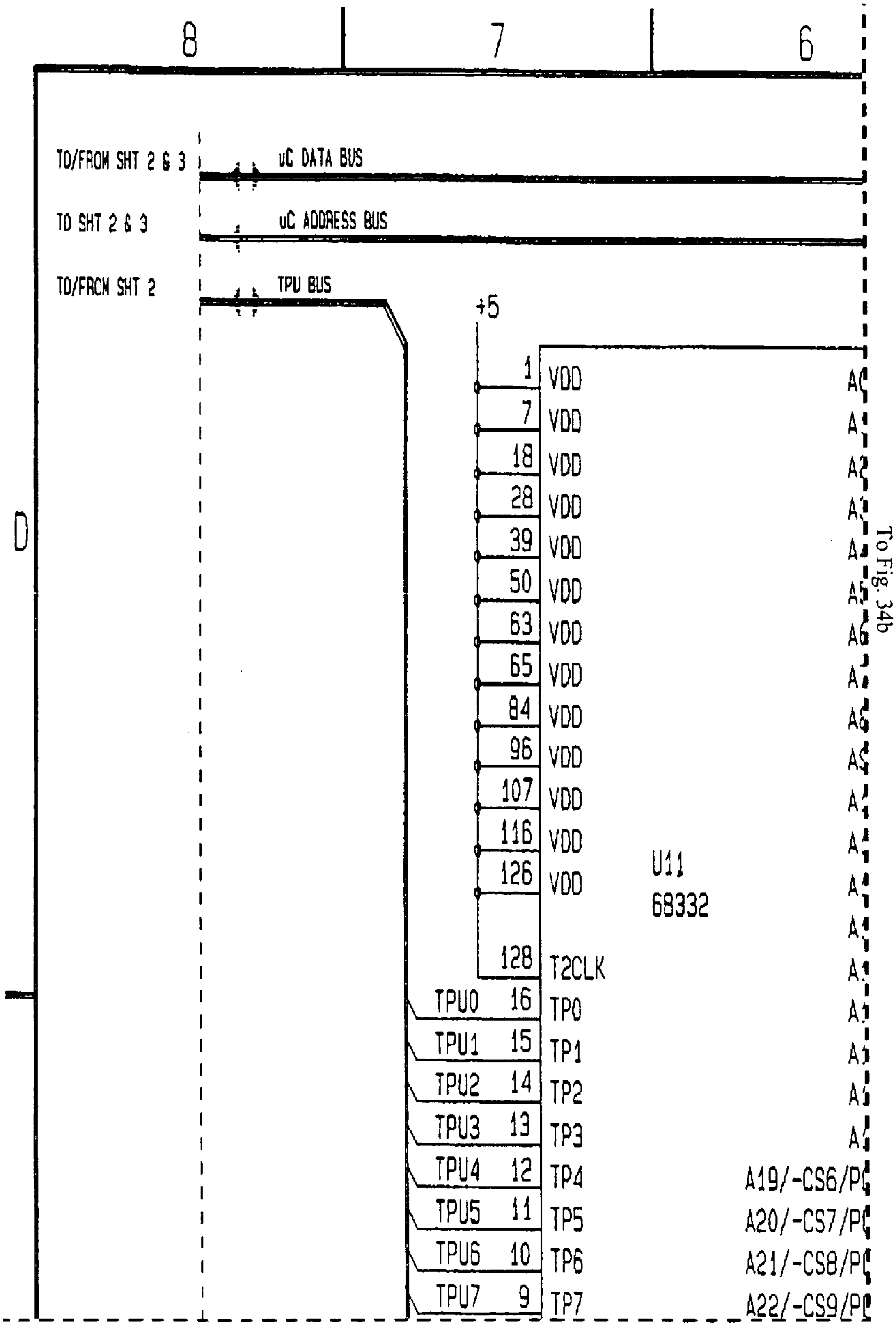
Figure 34B:
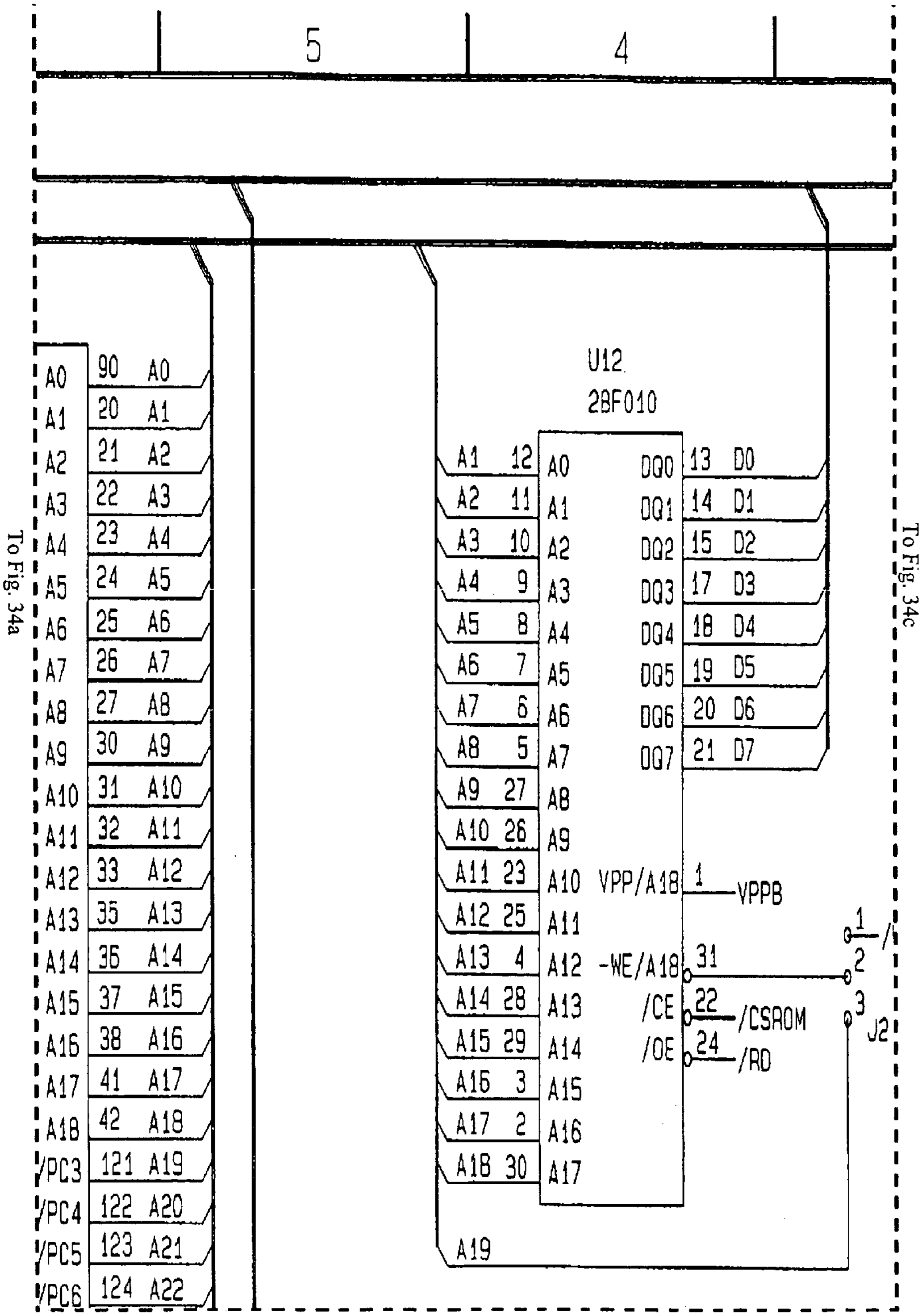
Figure 34C:
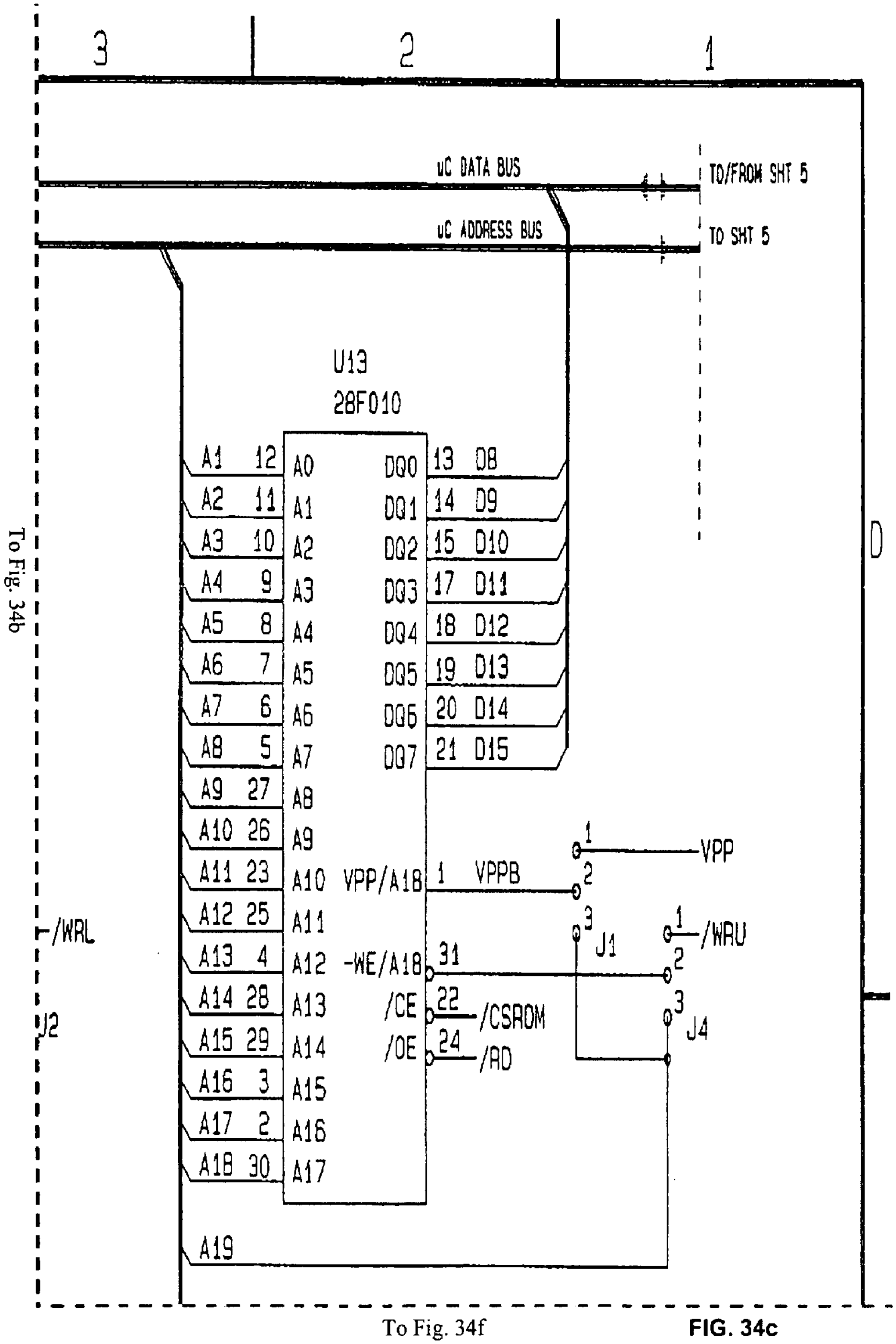
Figure 34D:
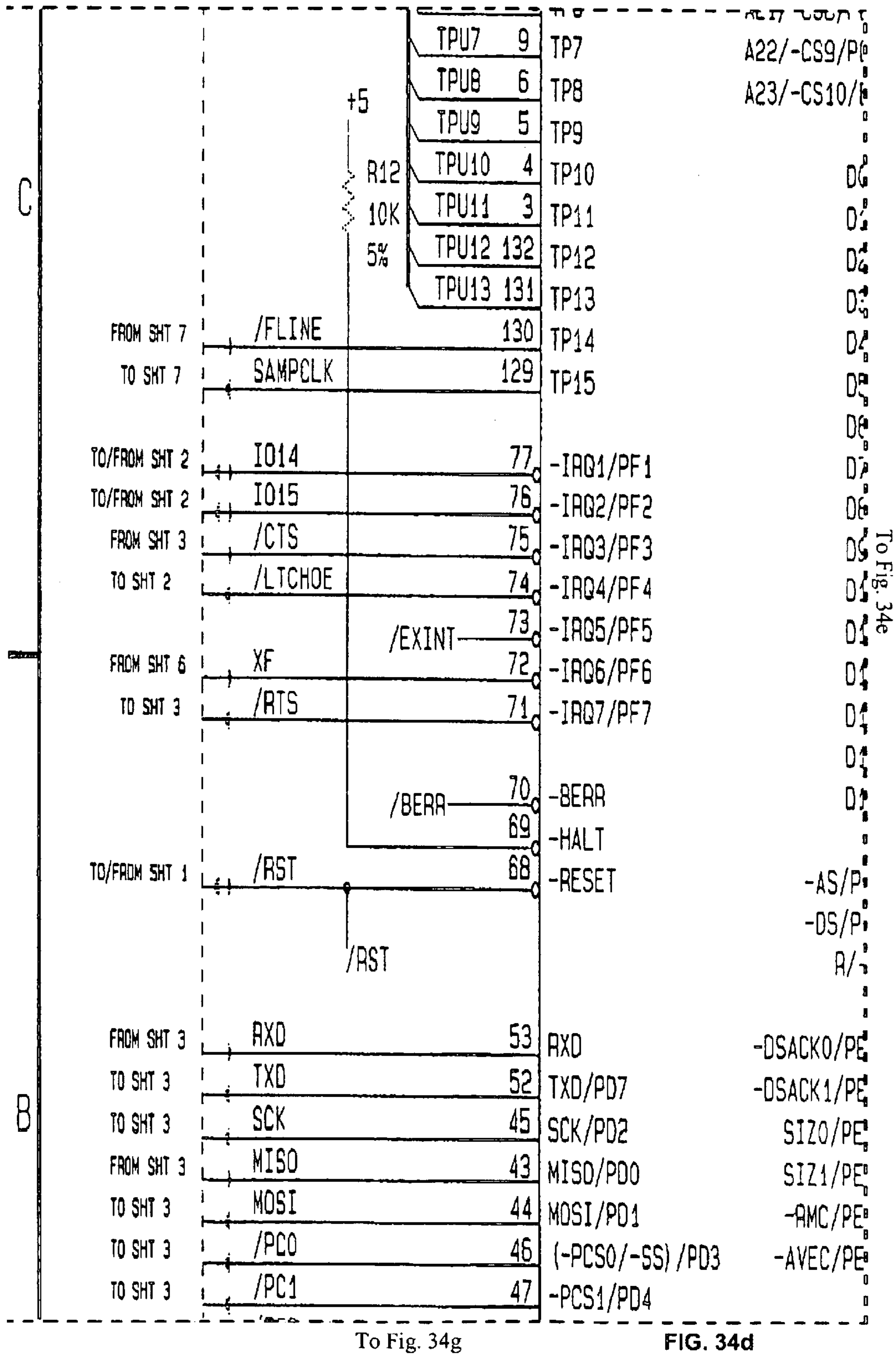
Figure 34E:
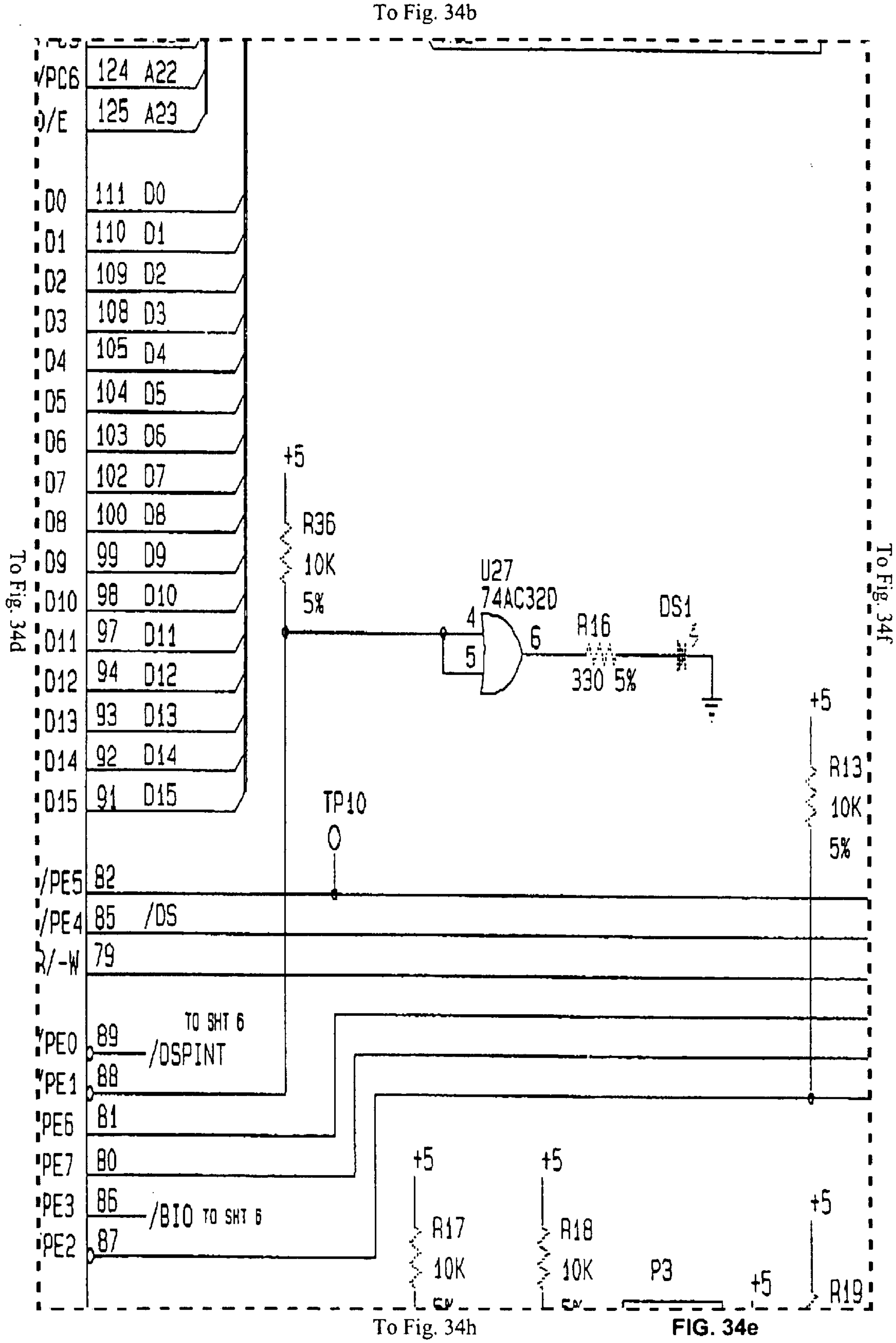
Figure 34F:
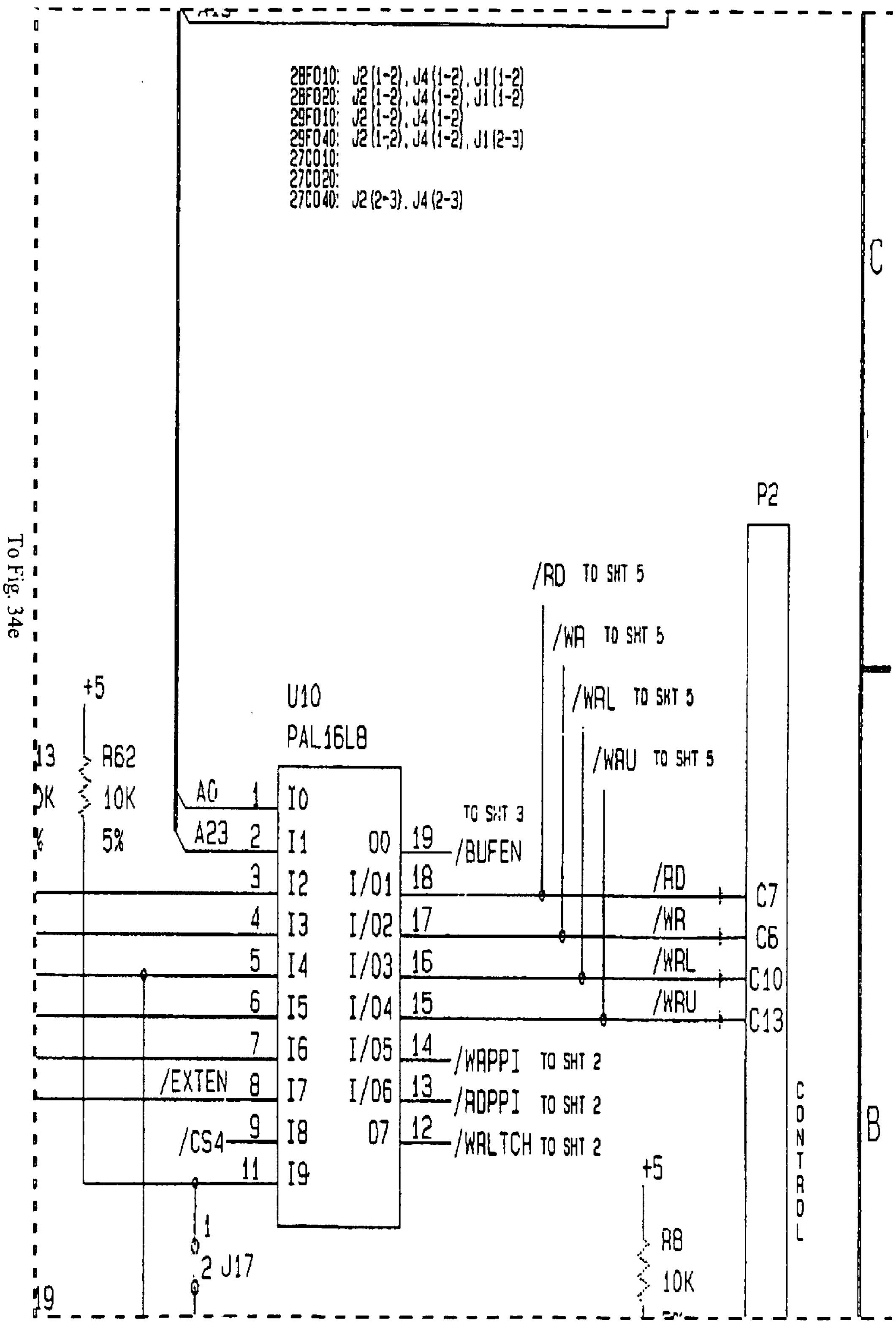
Figure 34G:
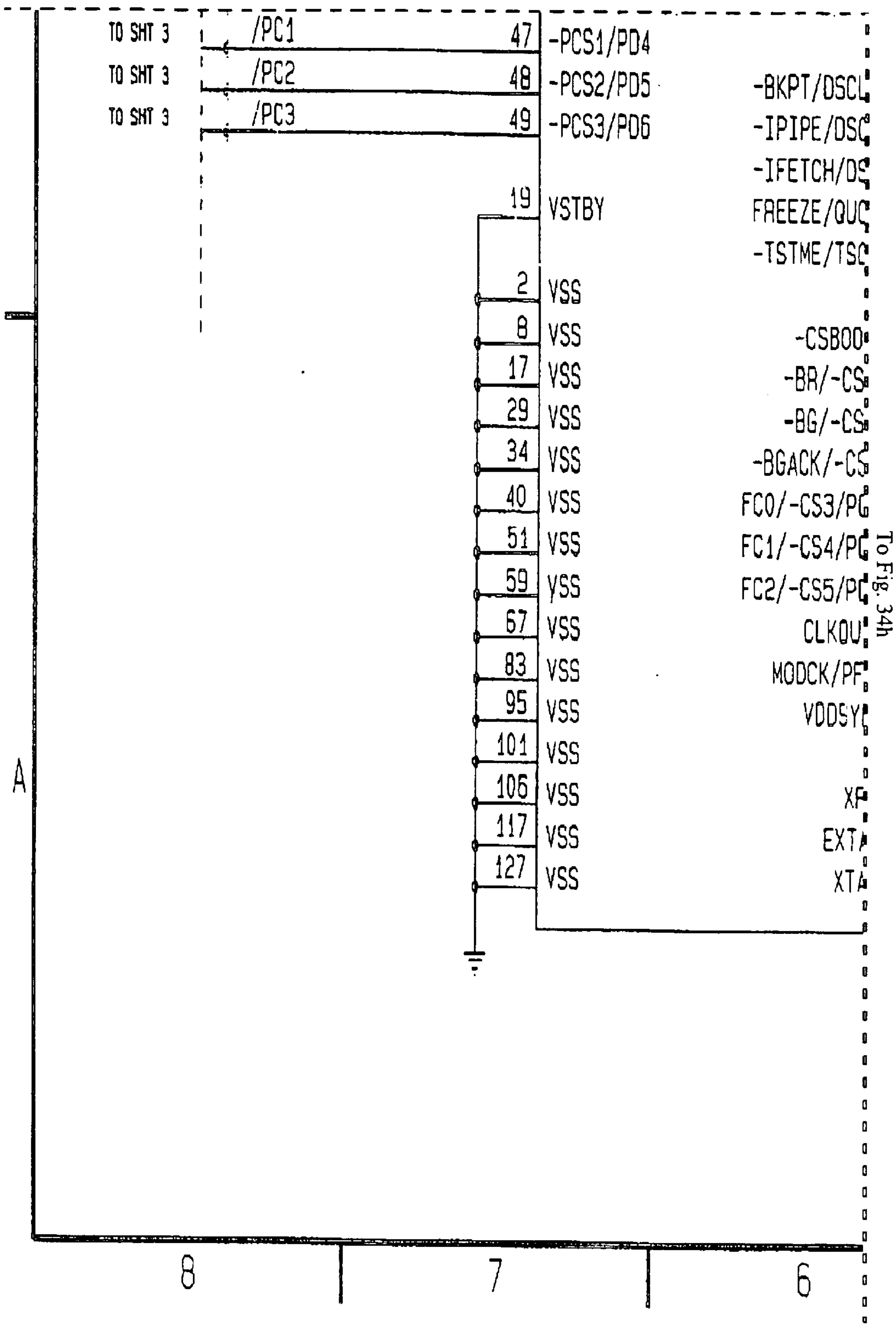
Figure 34H:
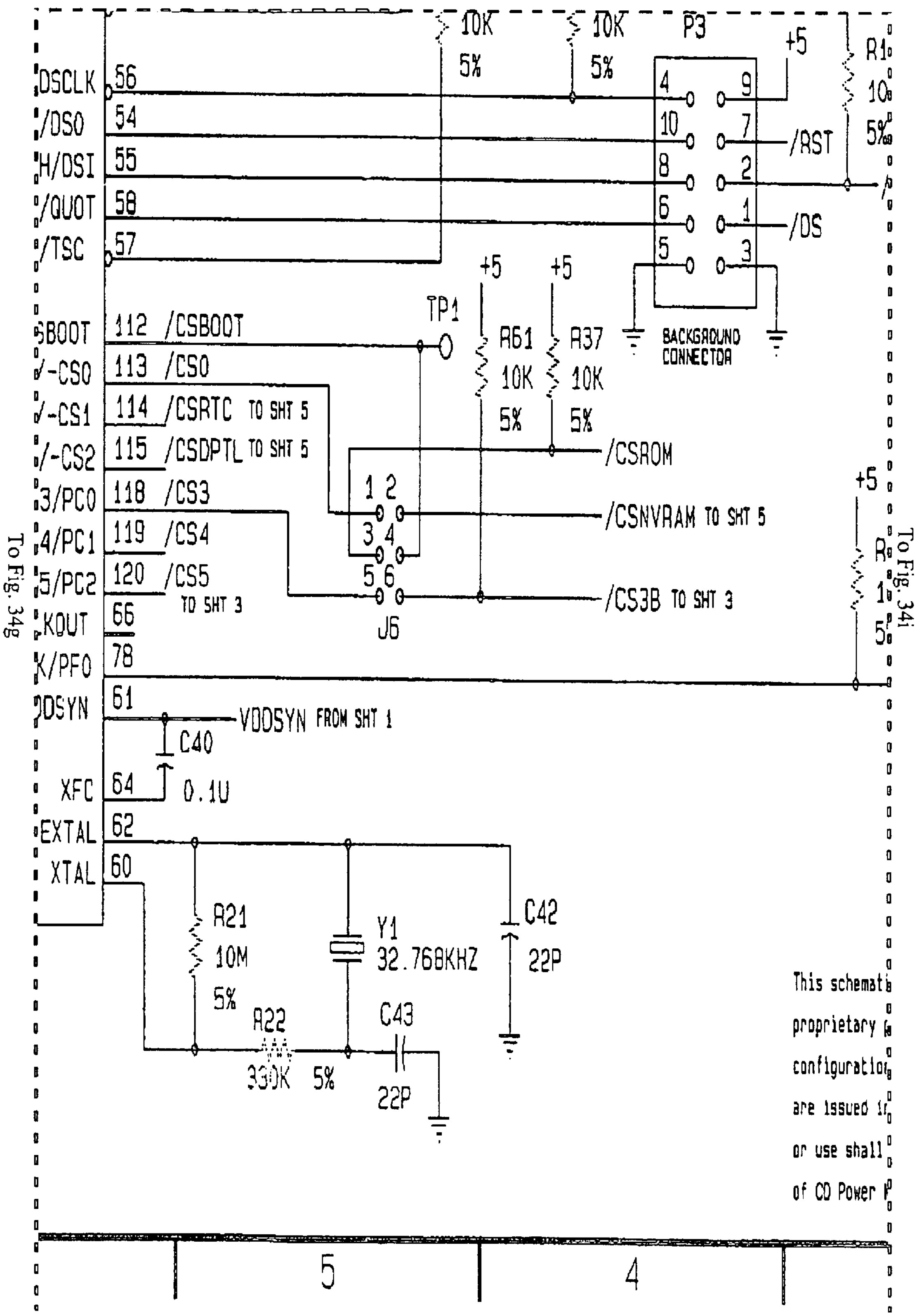
Figure 34I:
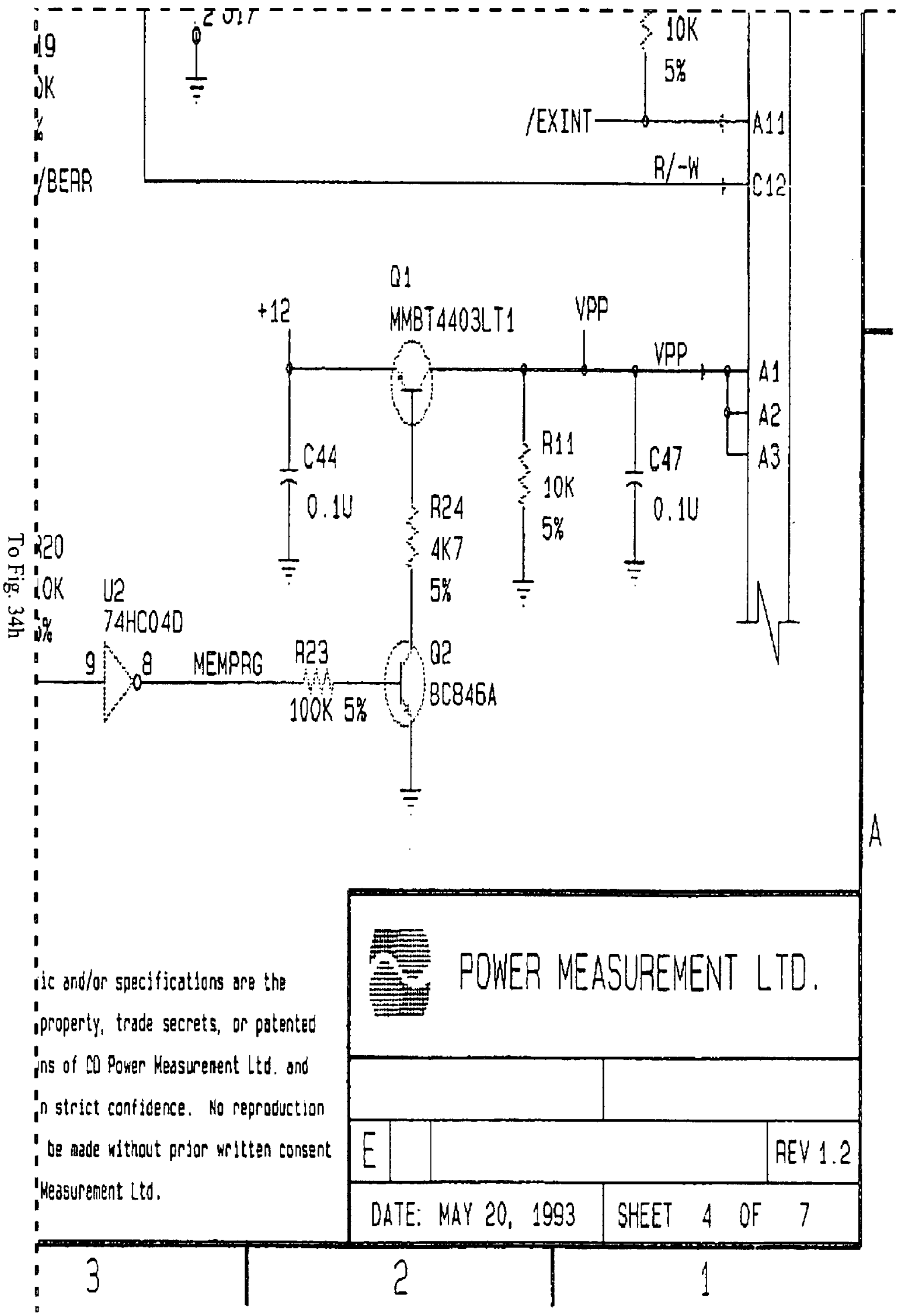
Figure 35A:
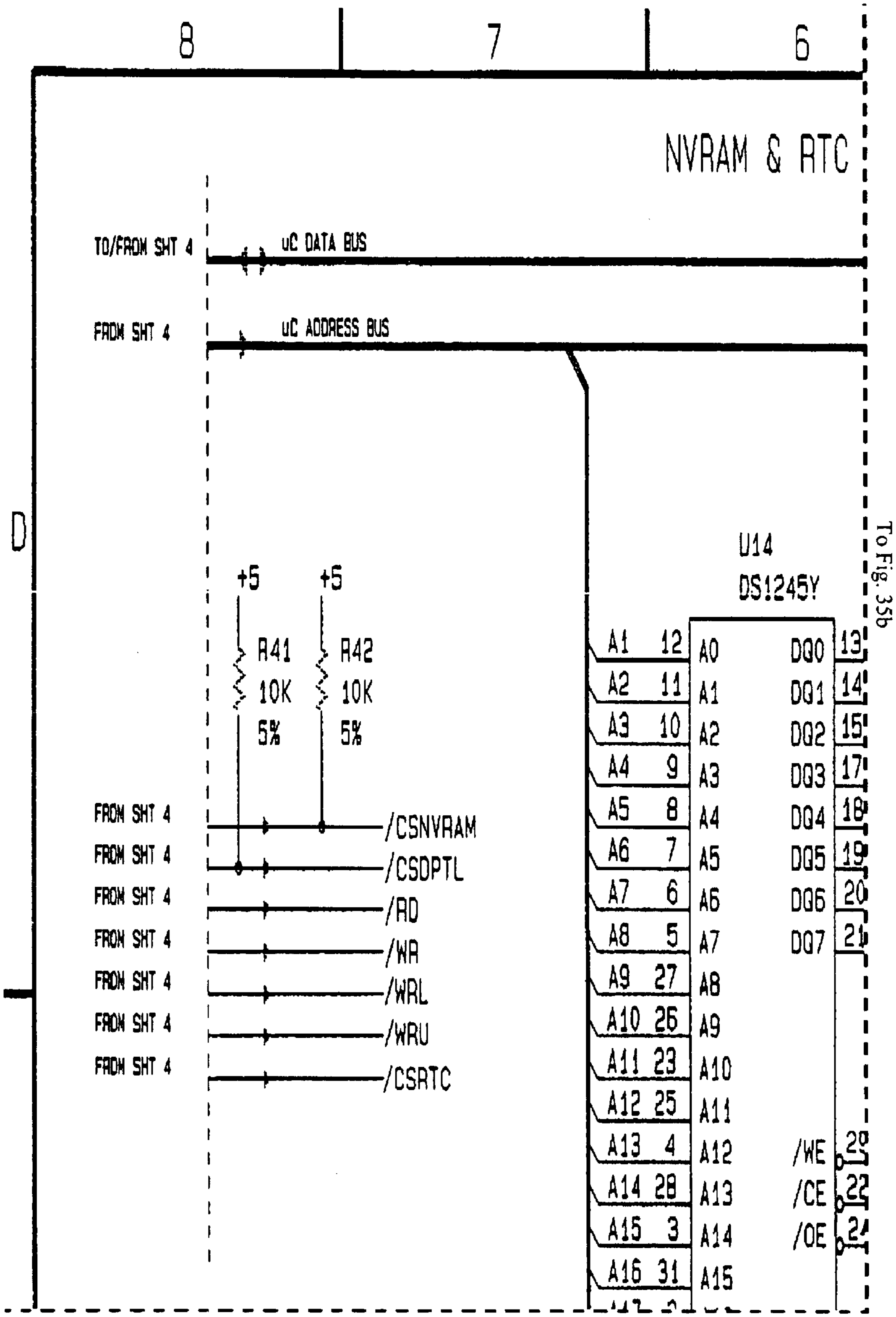
Figure 35B:
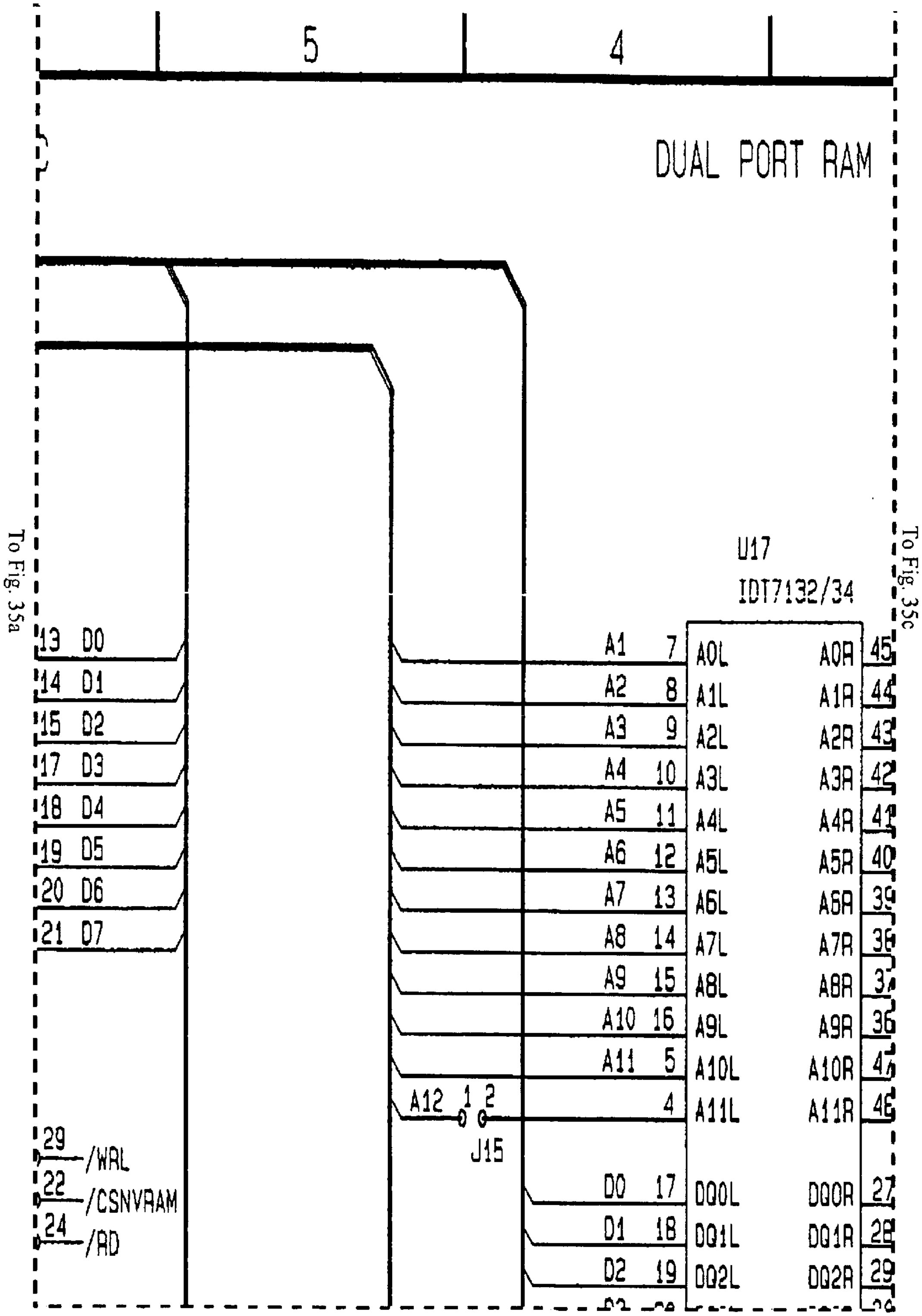
Figure 35C:
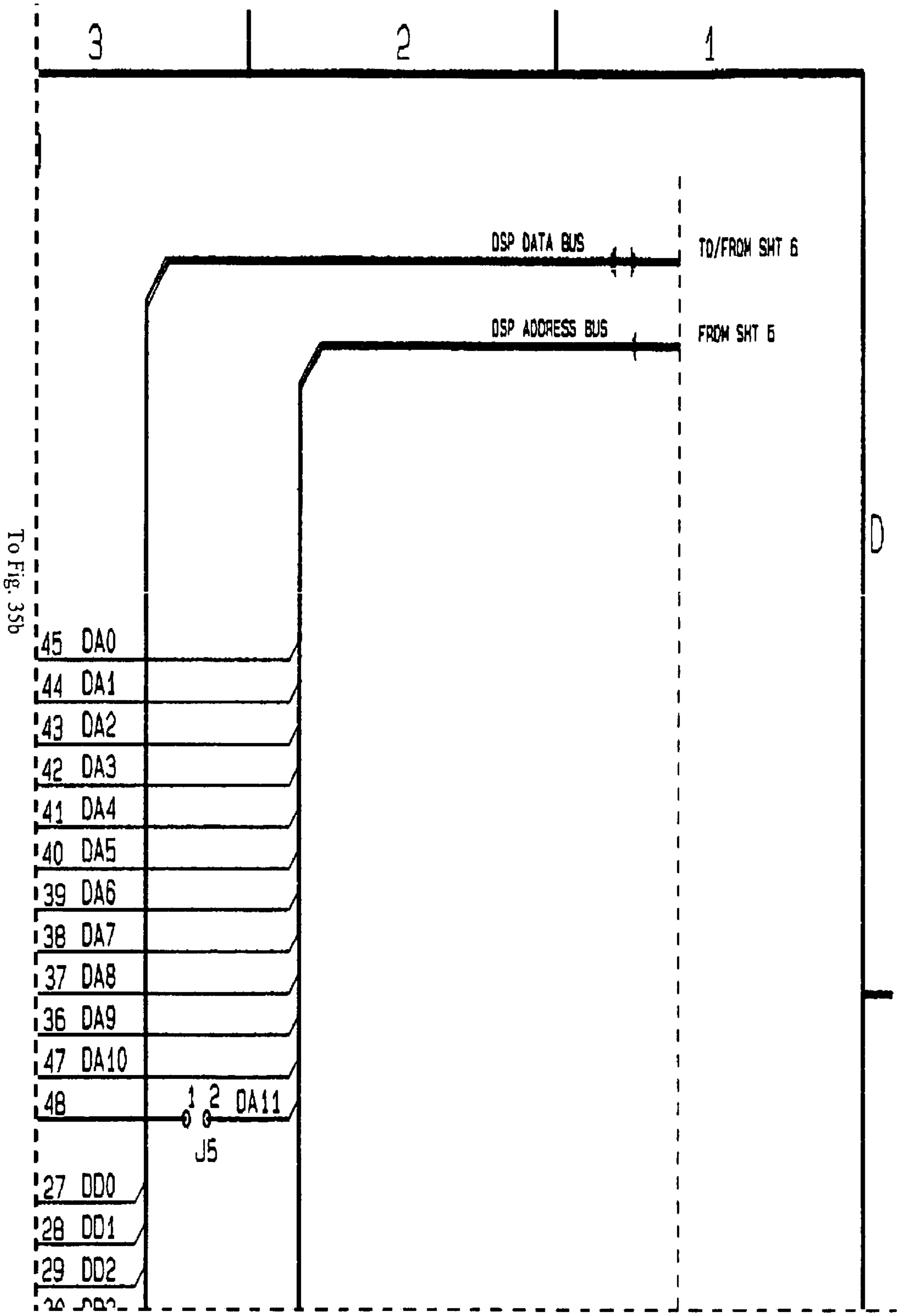
Figure 35D:
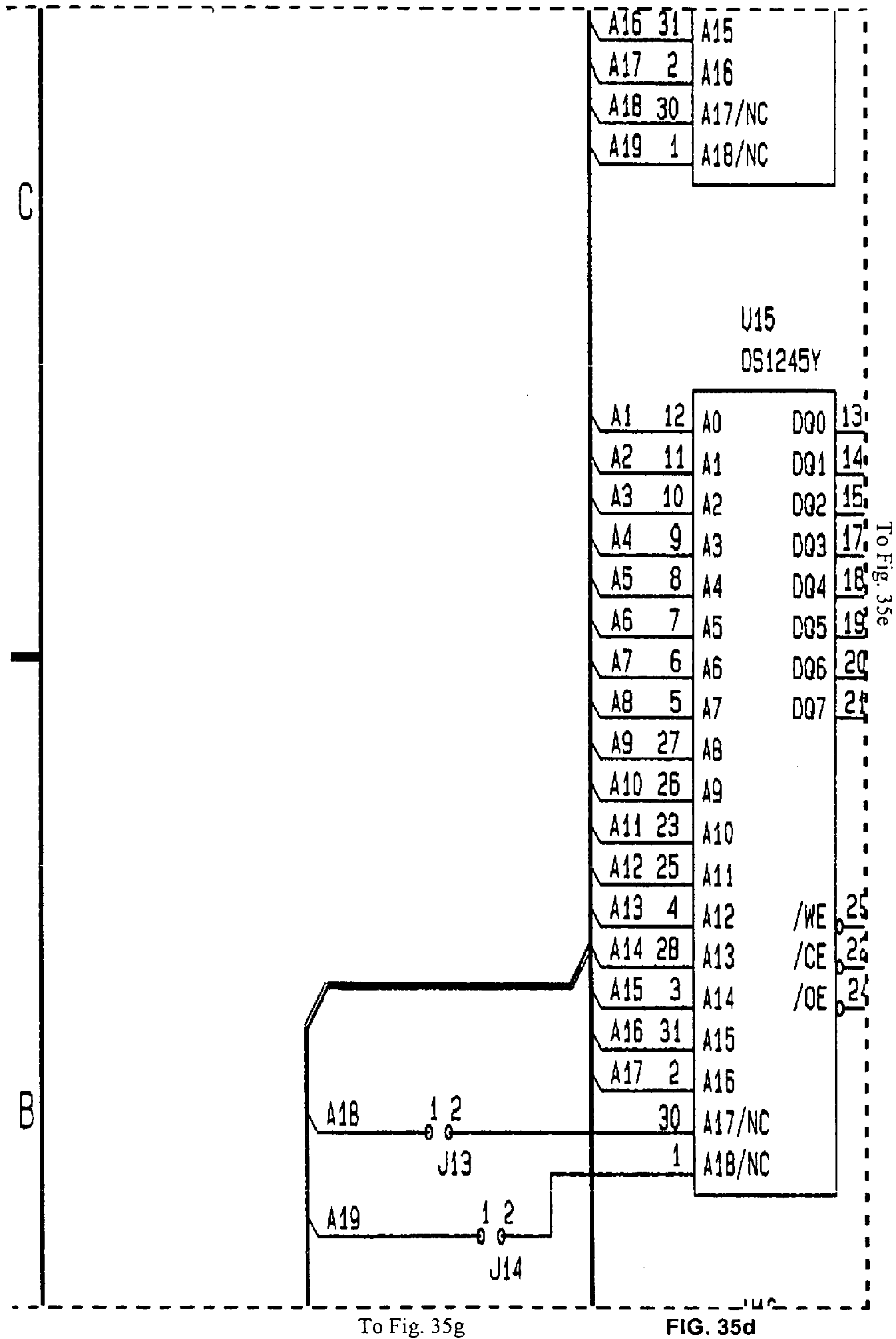
Figure 35:
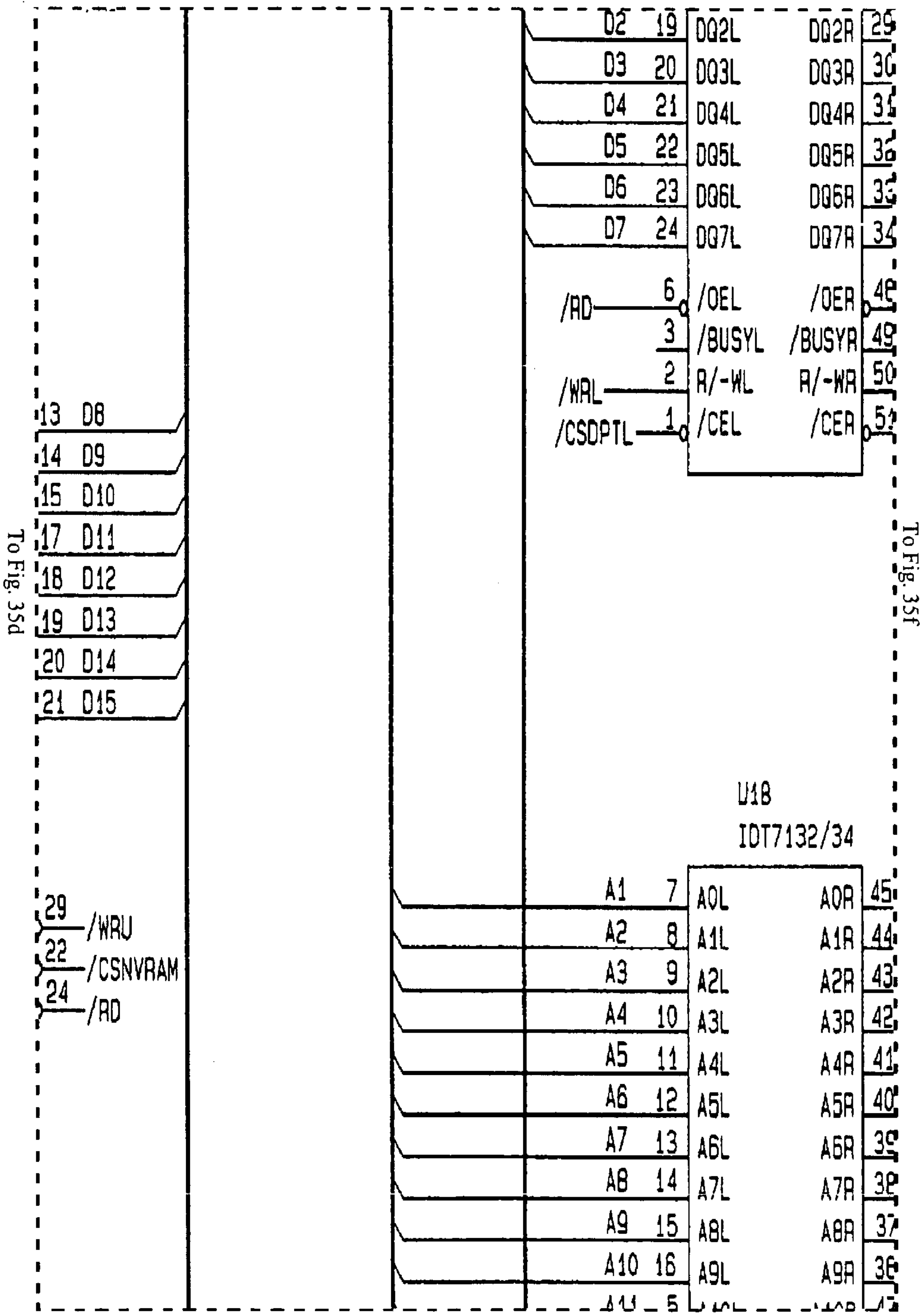
Figure 35F:
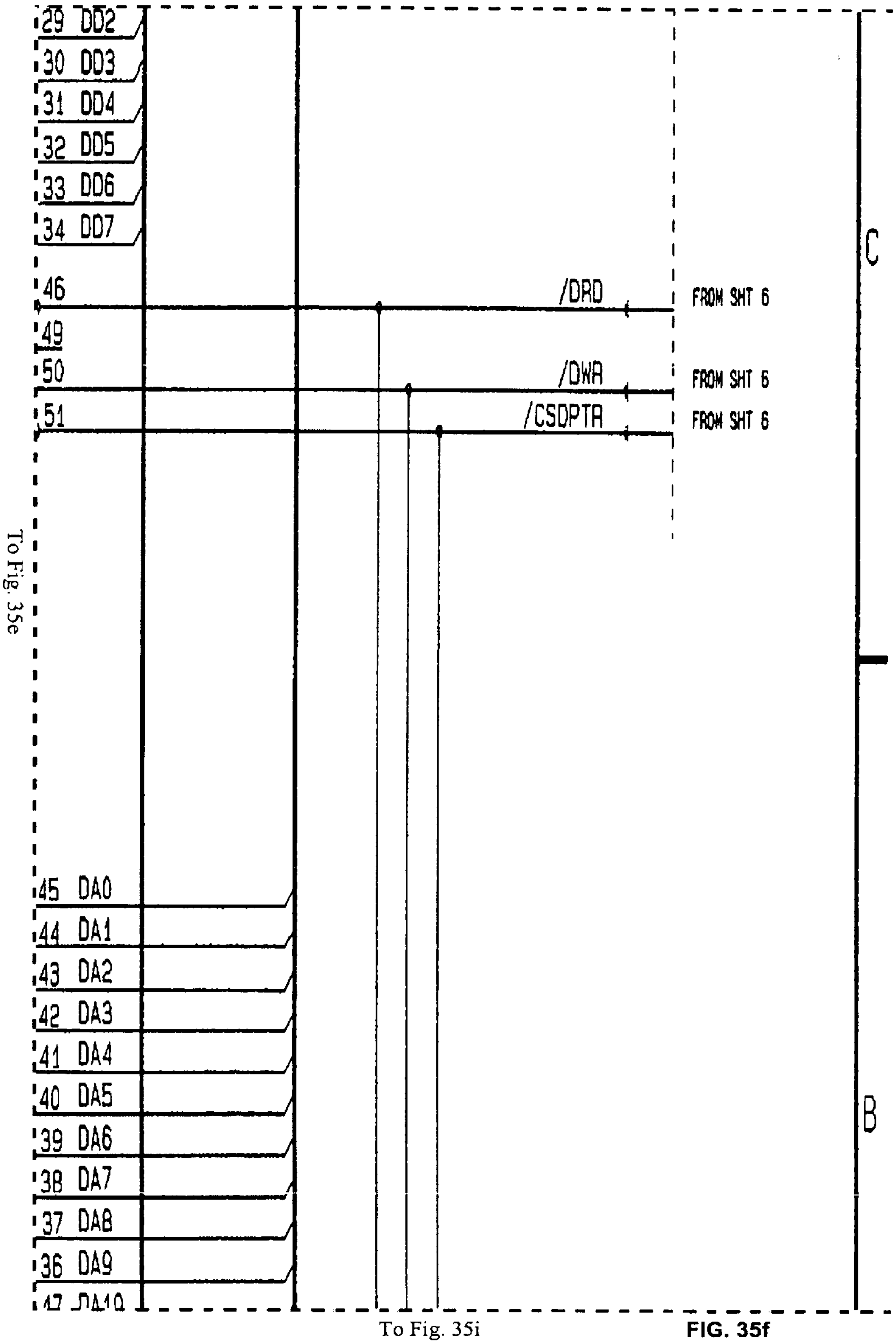
Figure 35G:
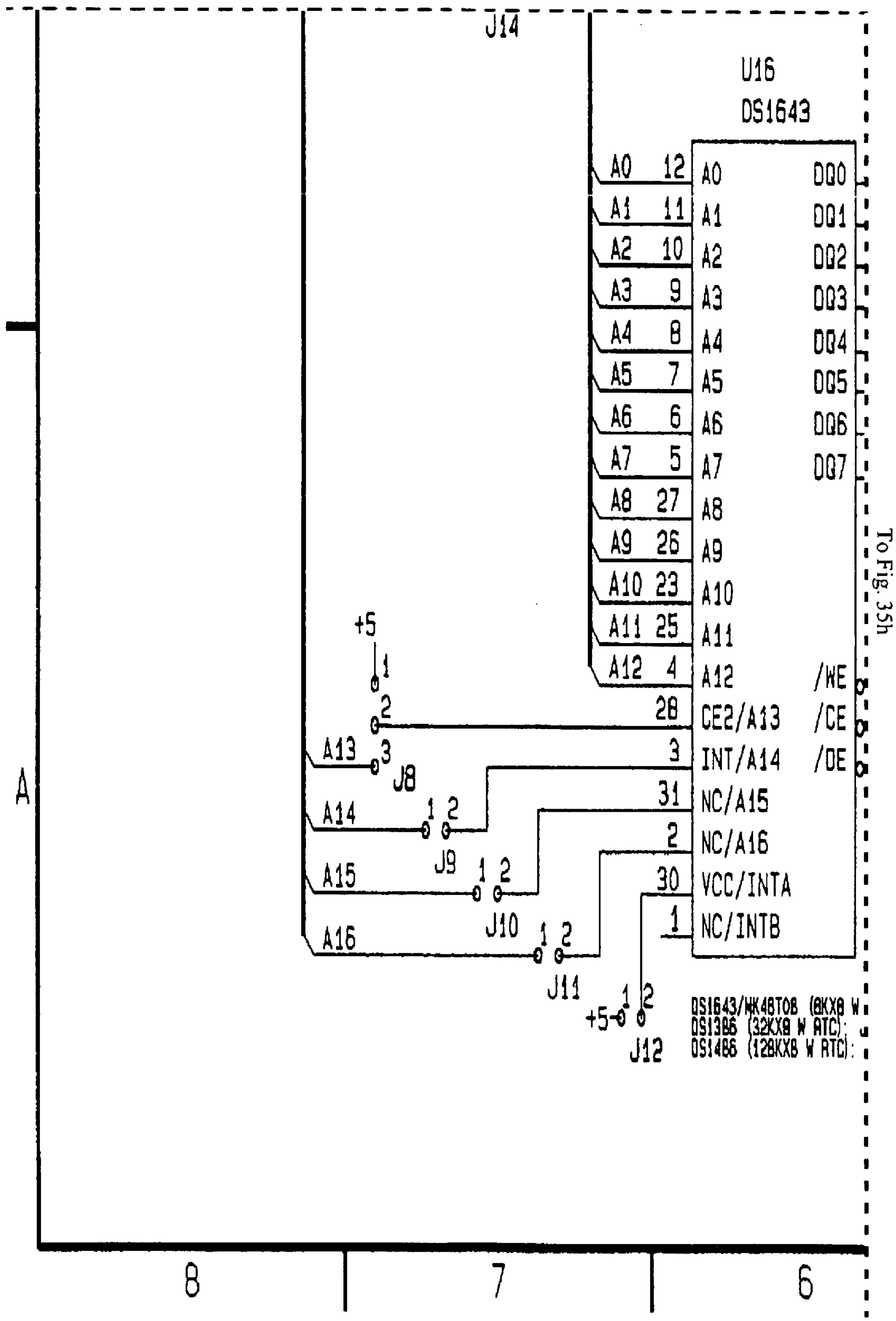
Figure 35H:
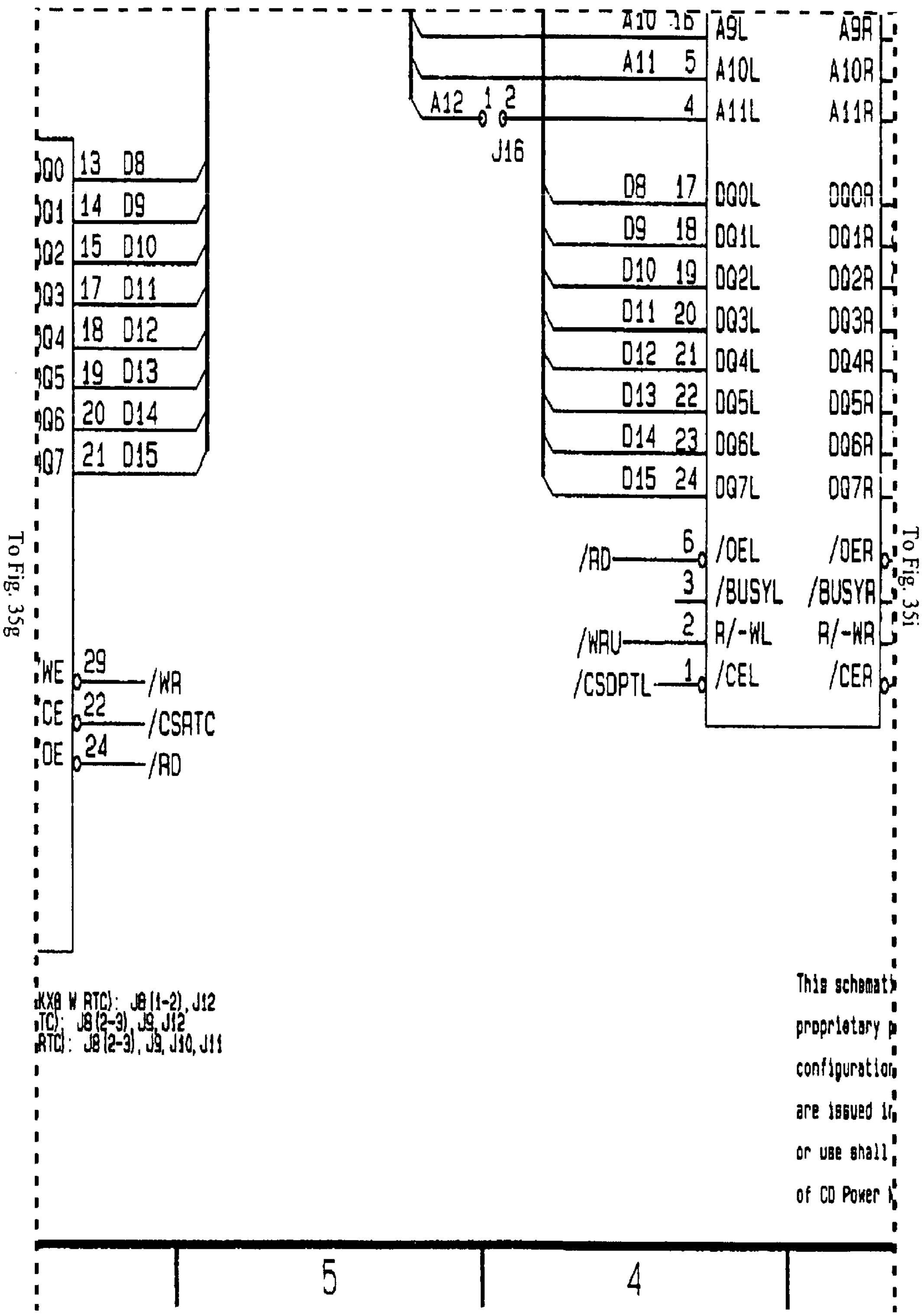
Figure 35I:
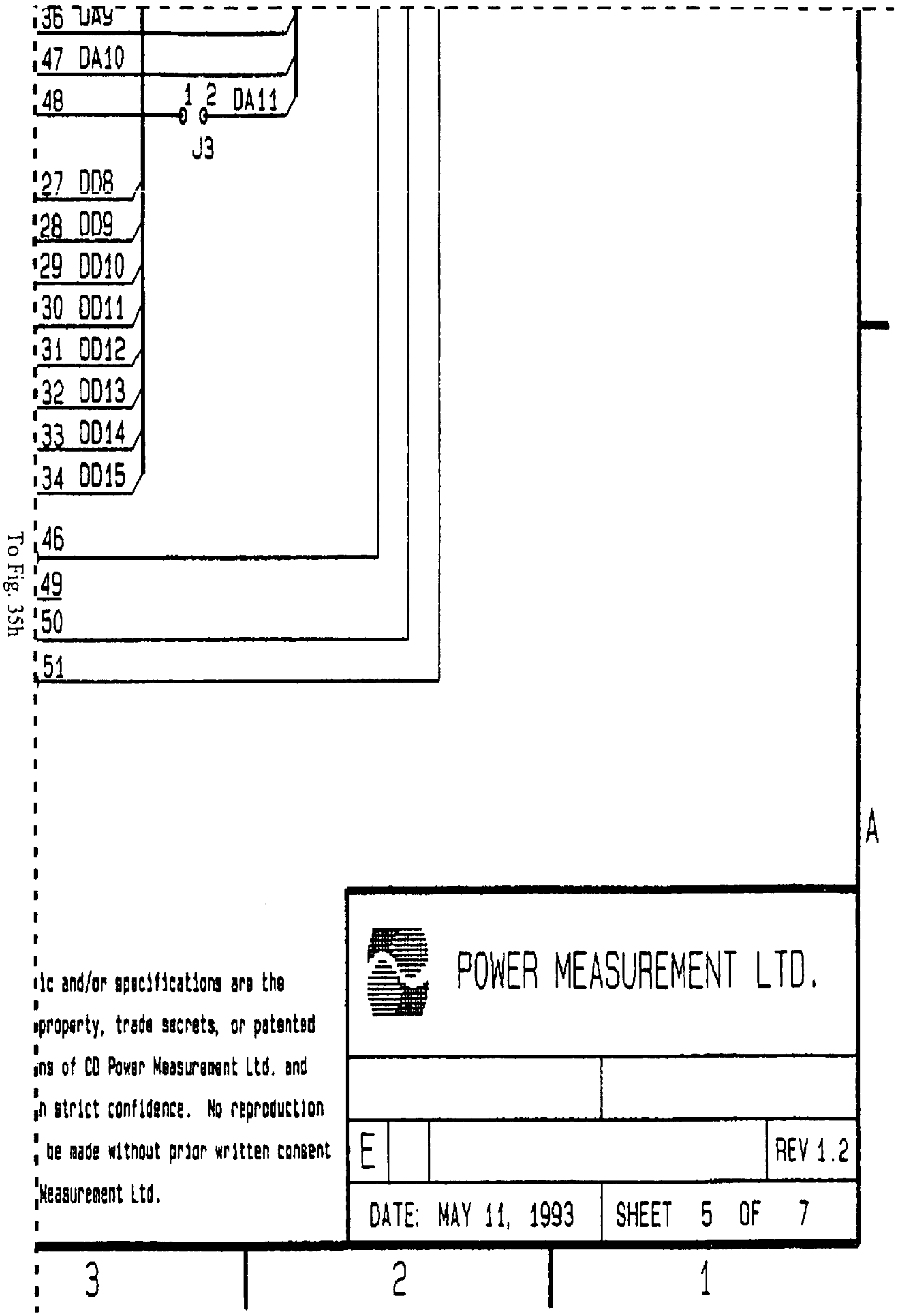
Figure 36A:
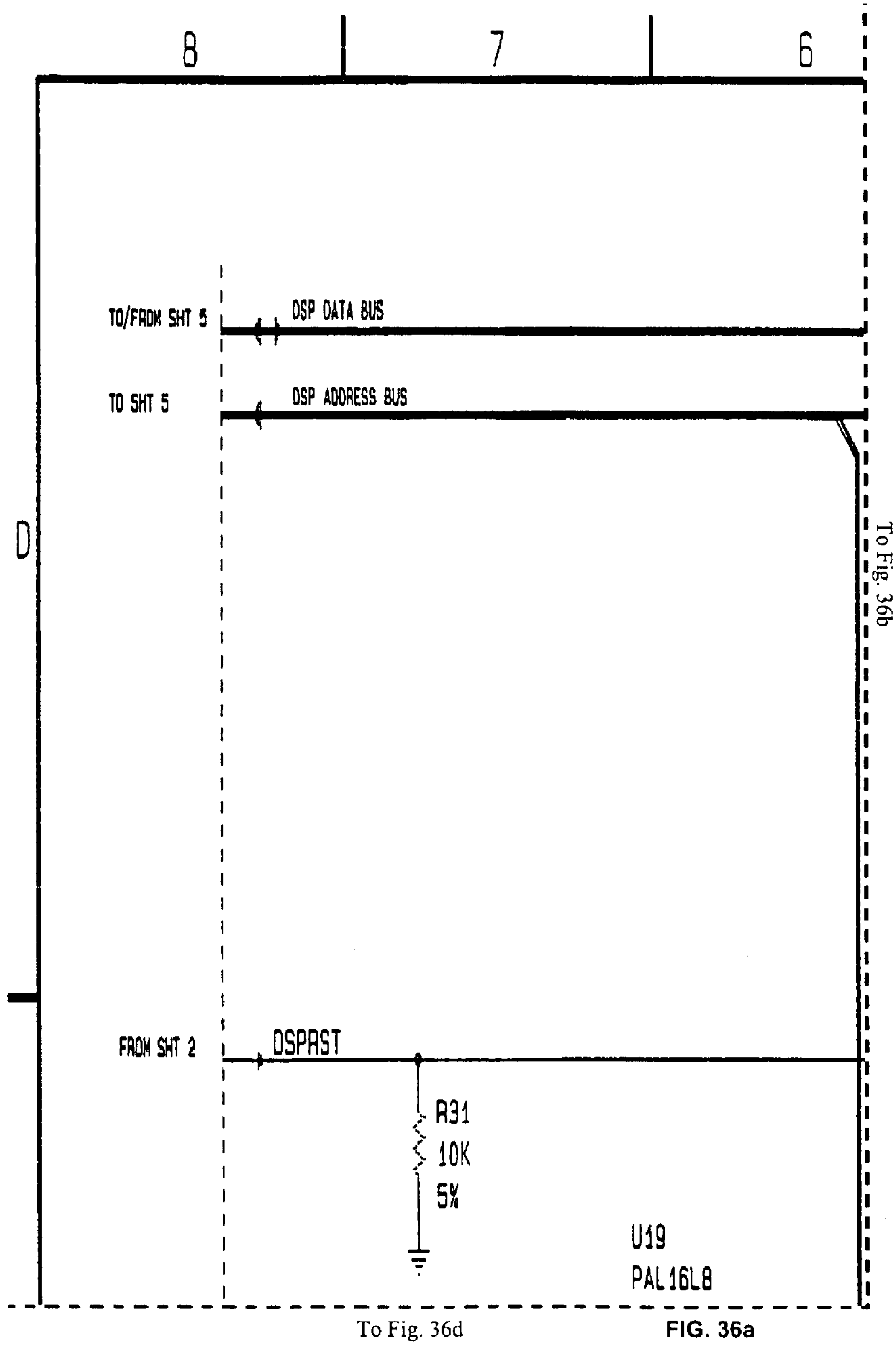
Figure 36B:
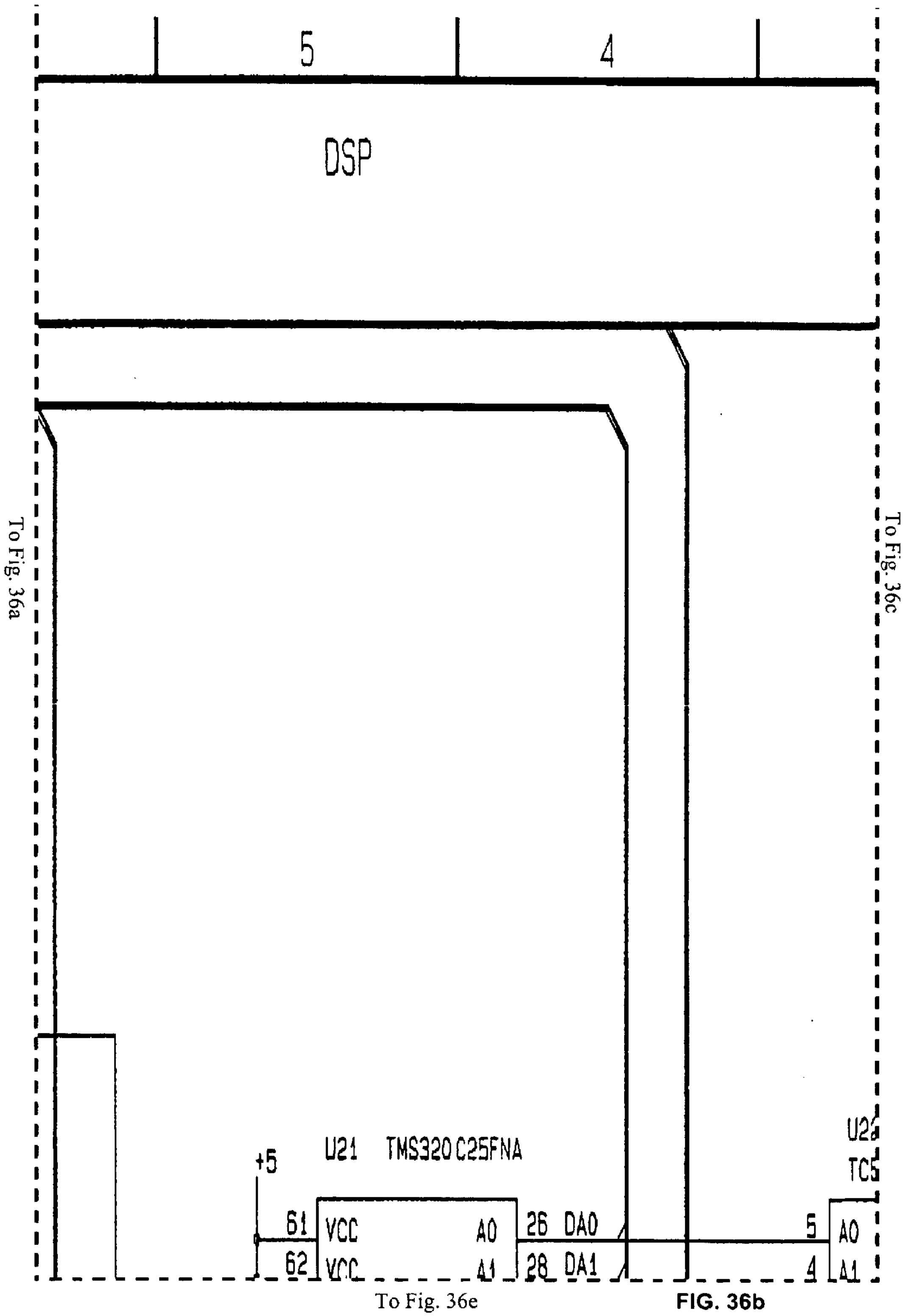
Figure 36C:
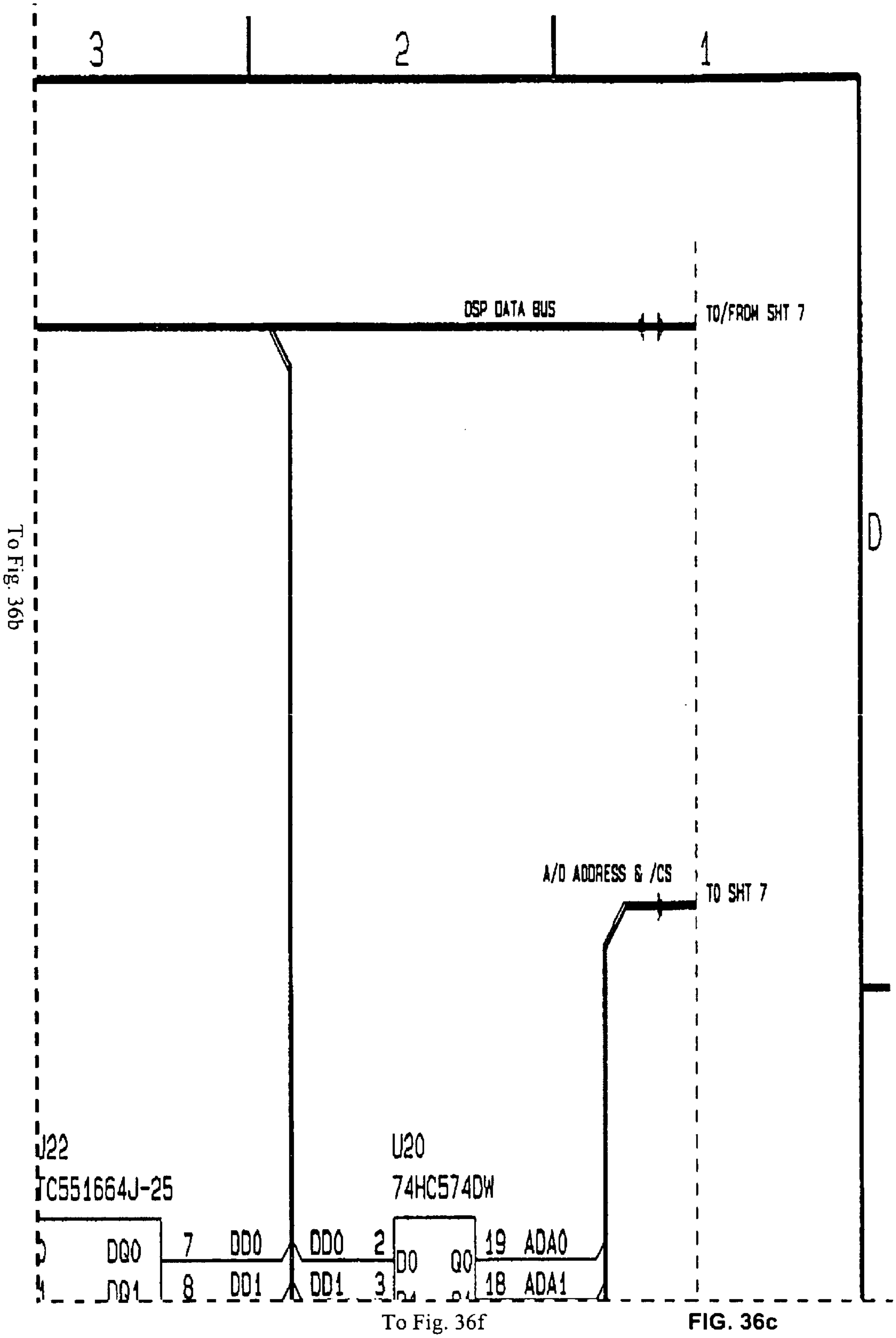
Figure 36D:
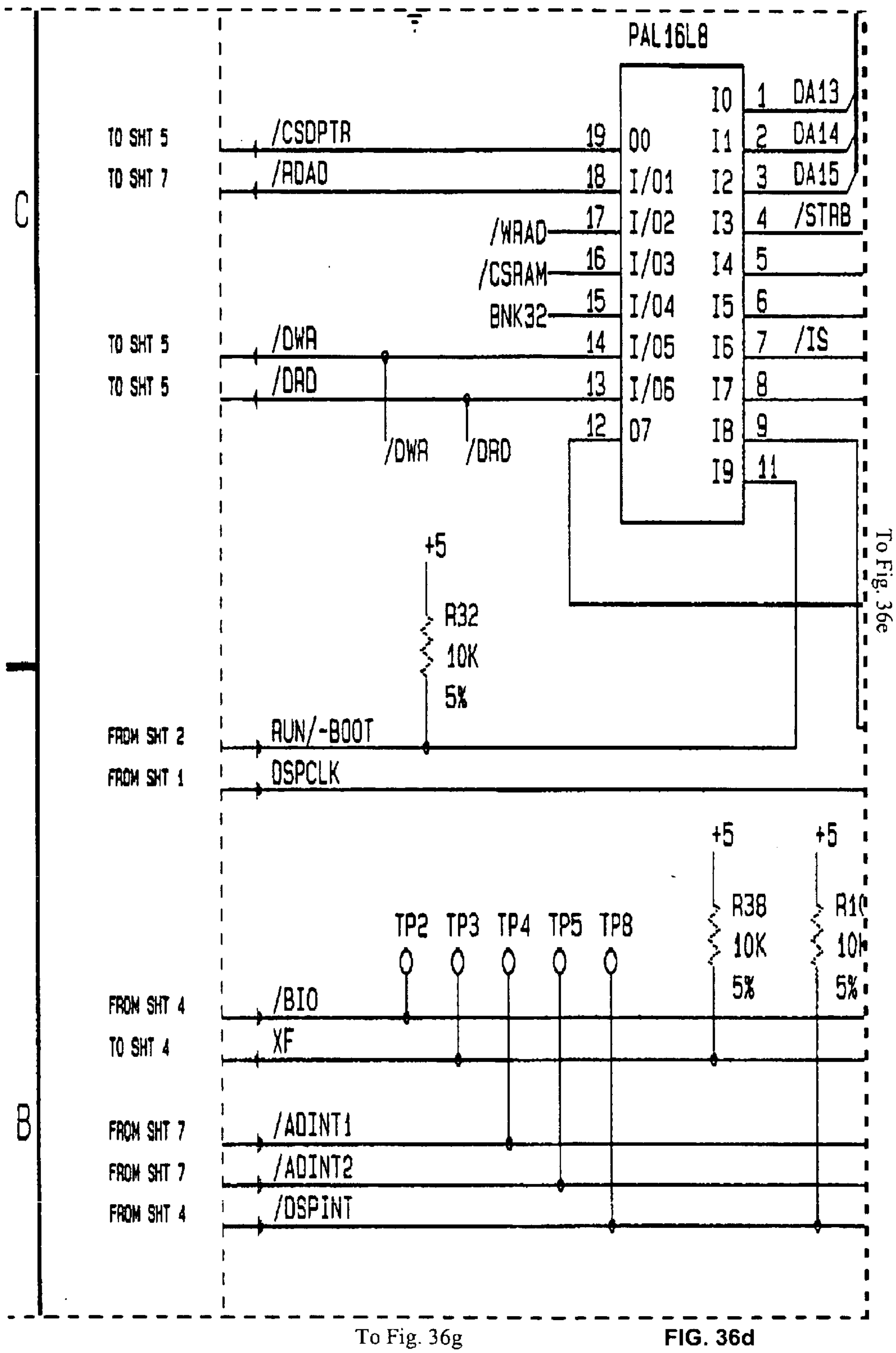
Figure 36E:
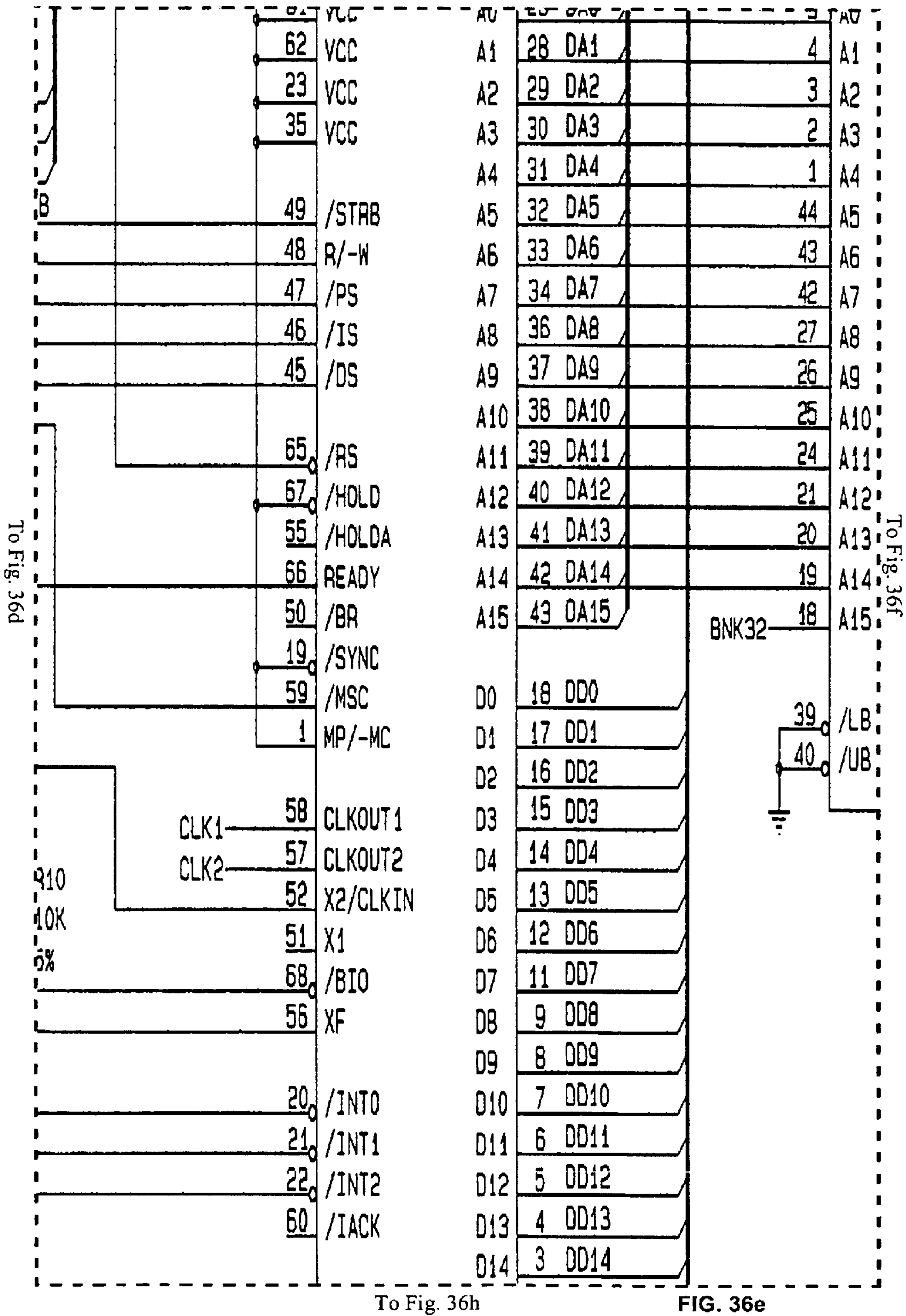
Figure 36F:
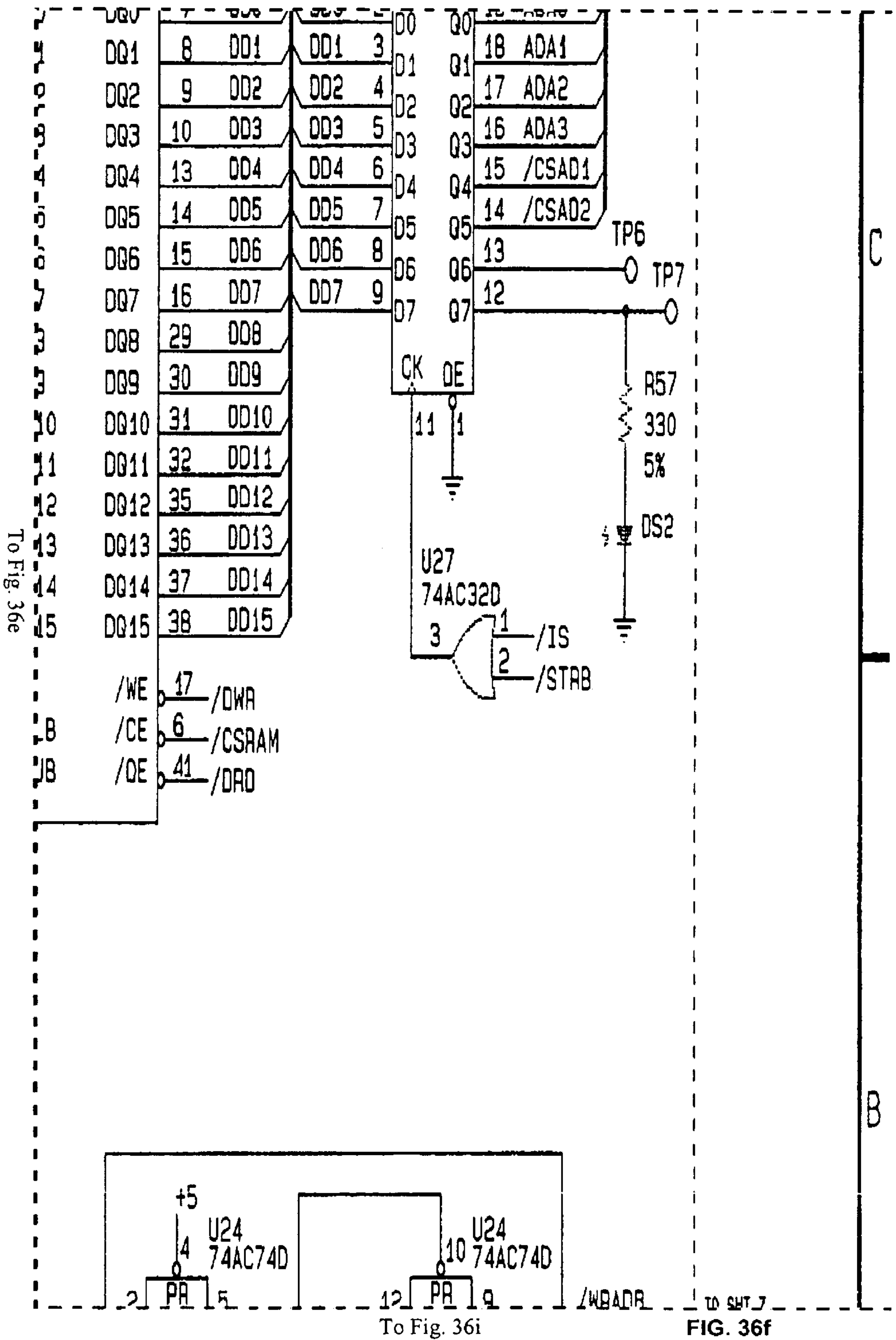
Figure 36G:
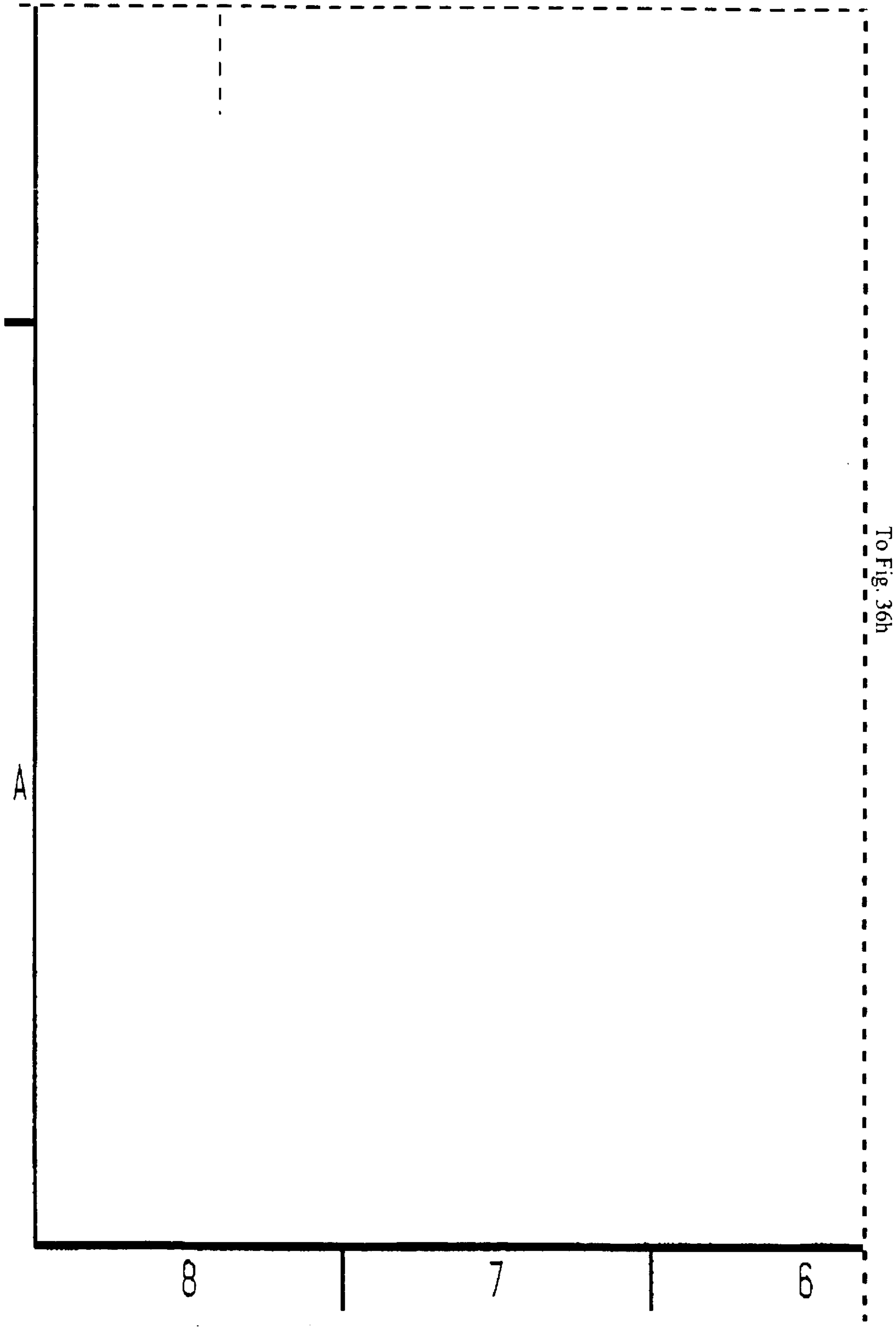
Figure 36H:
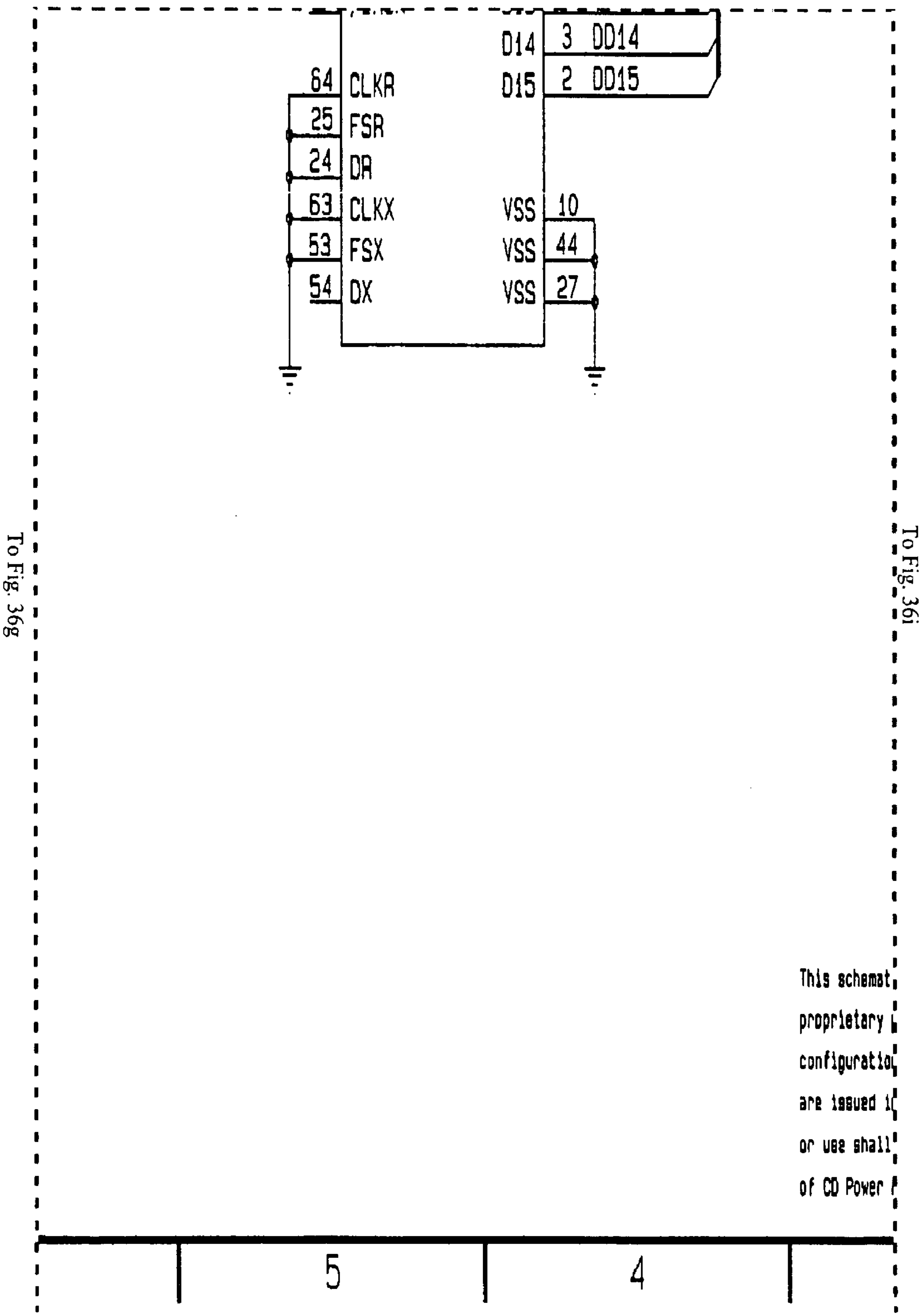
Figure 36I:
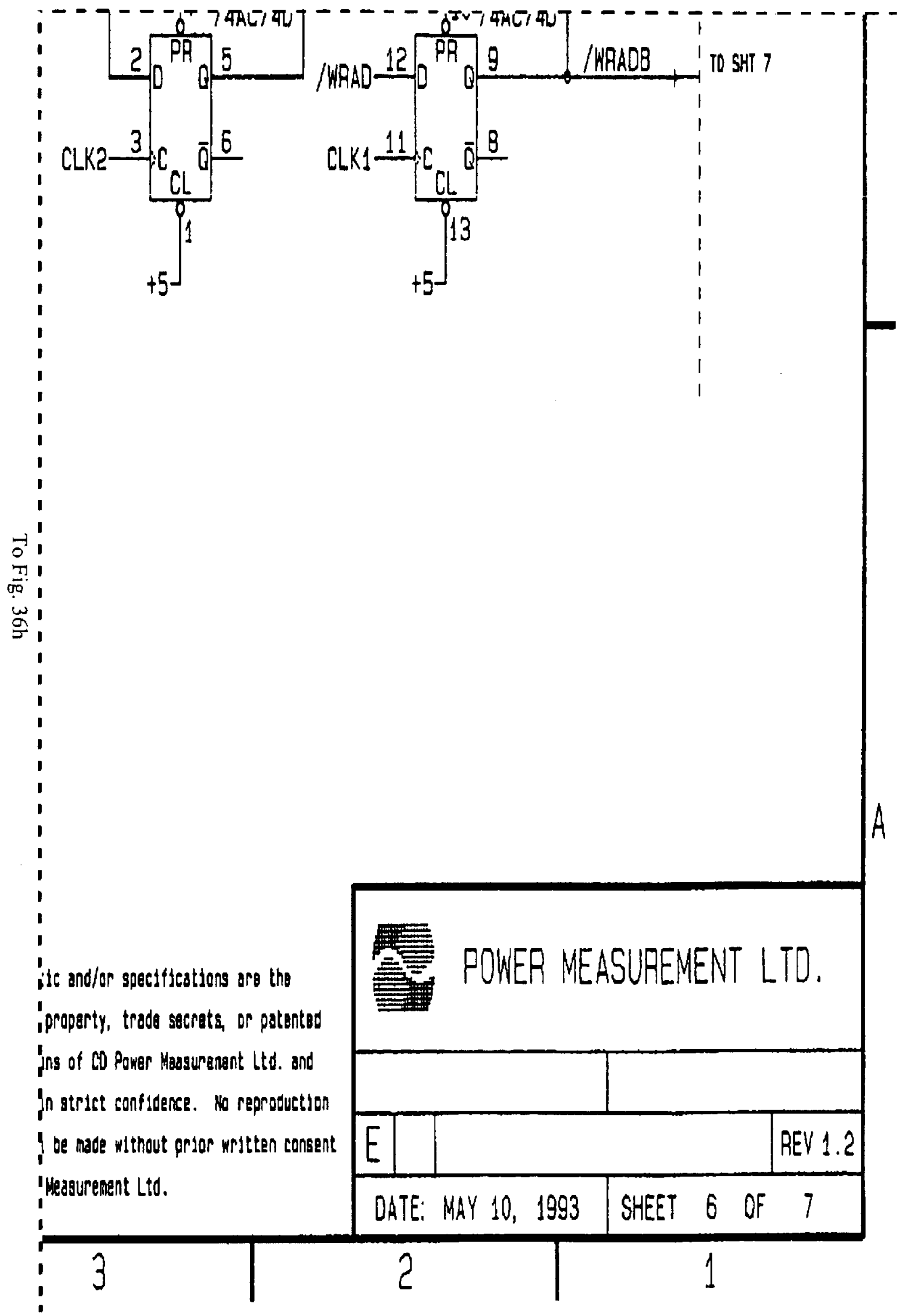
Figure 37A:
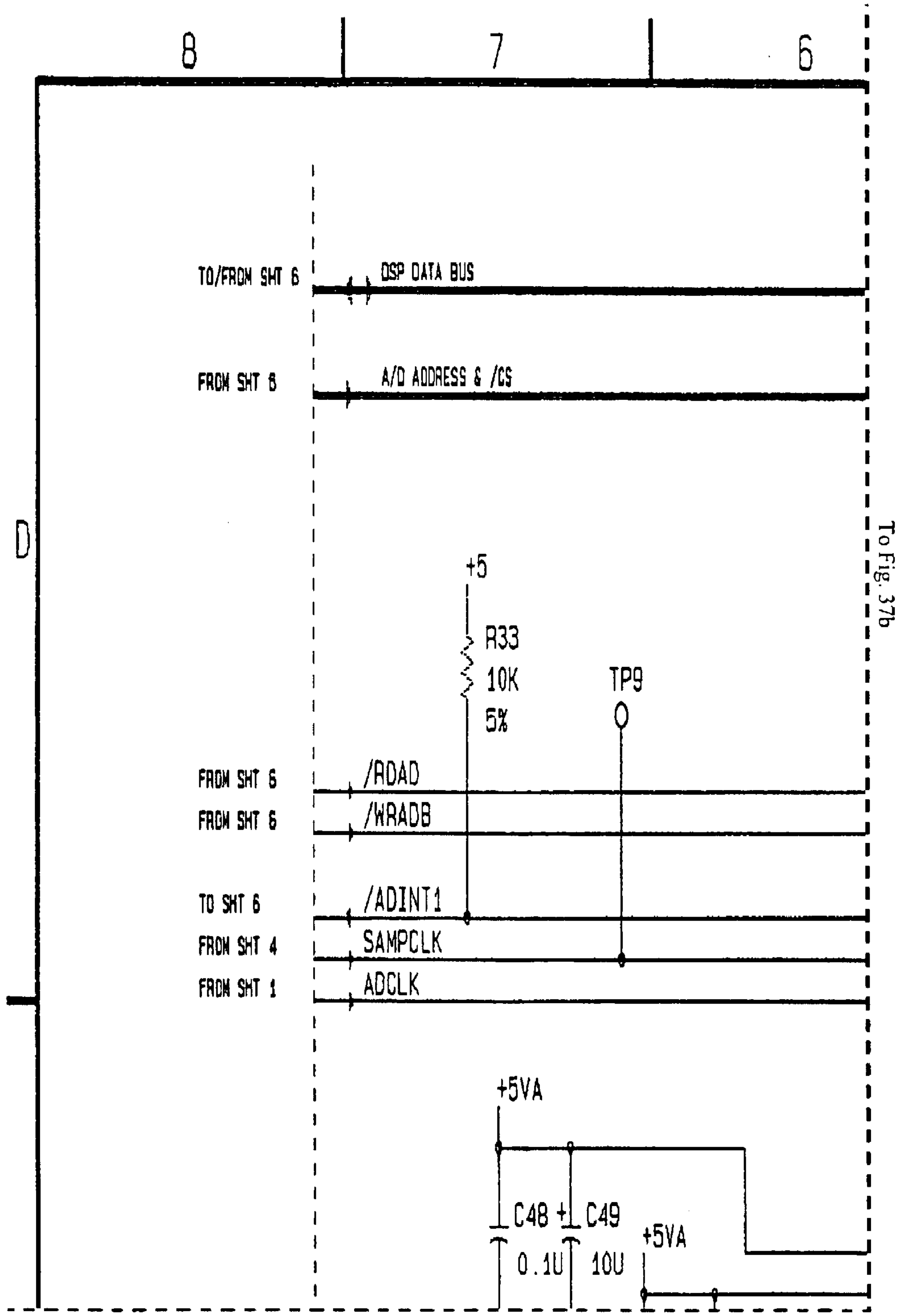
Figure 37B:
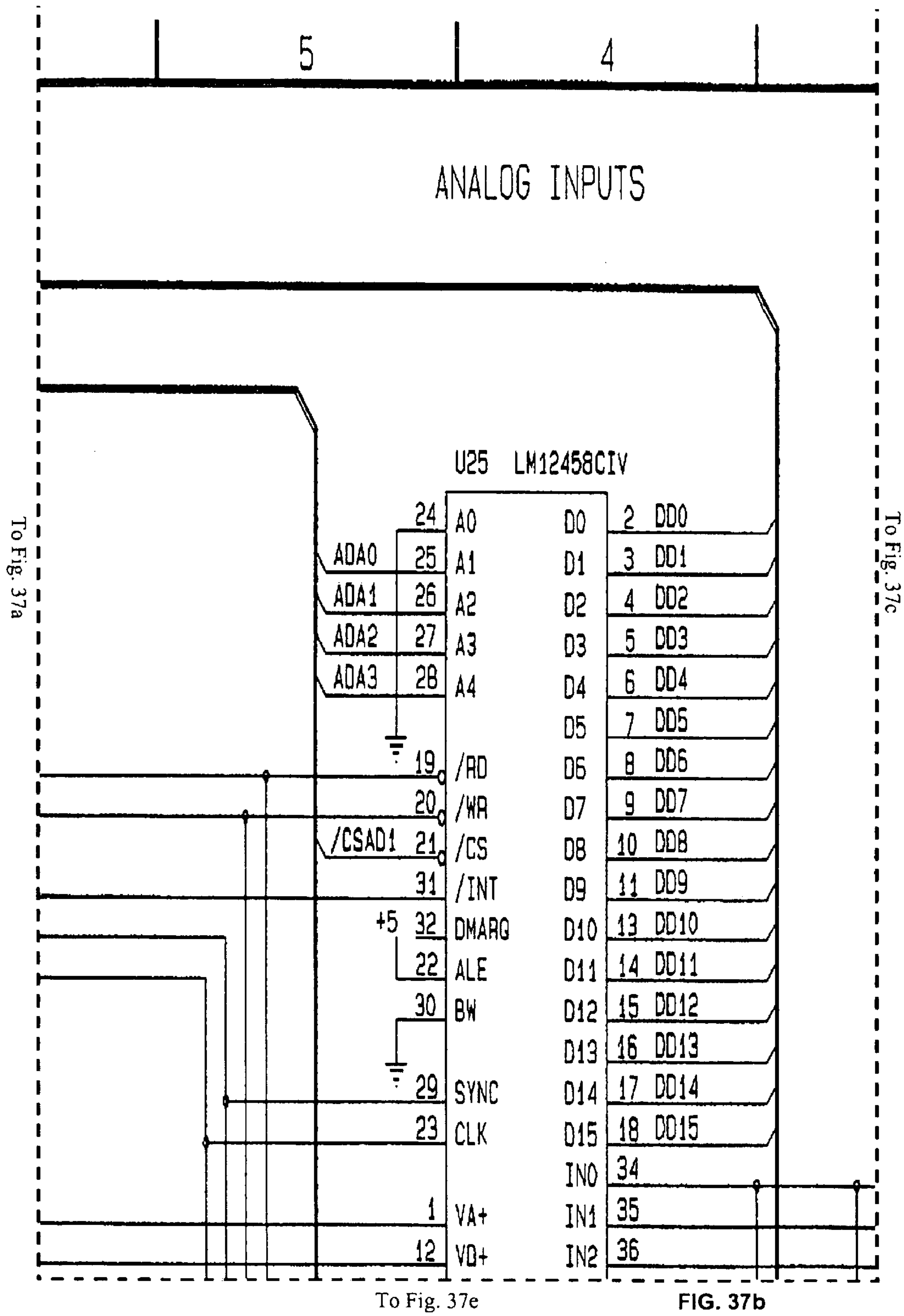
Figure 37C:
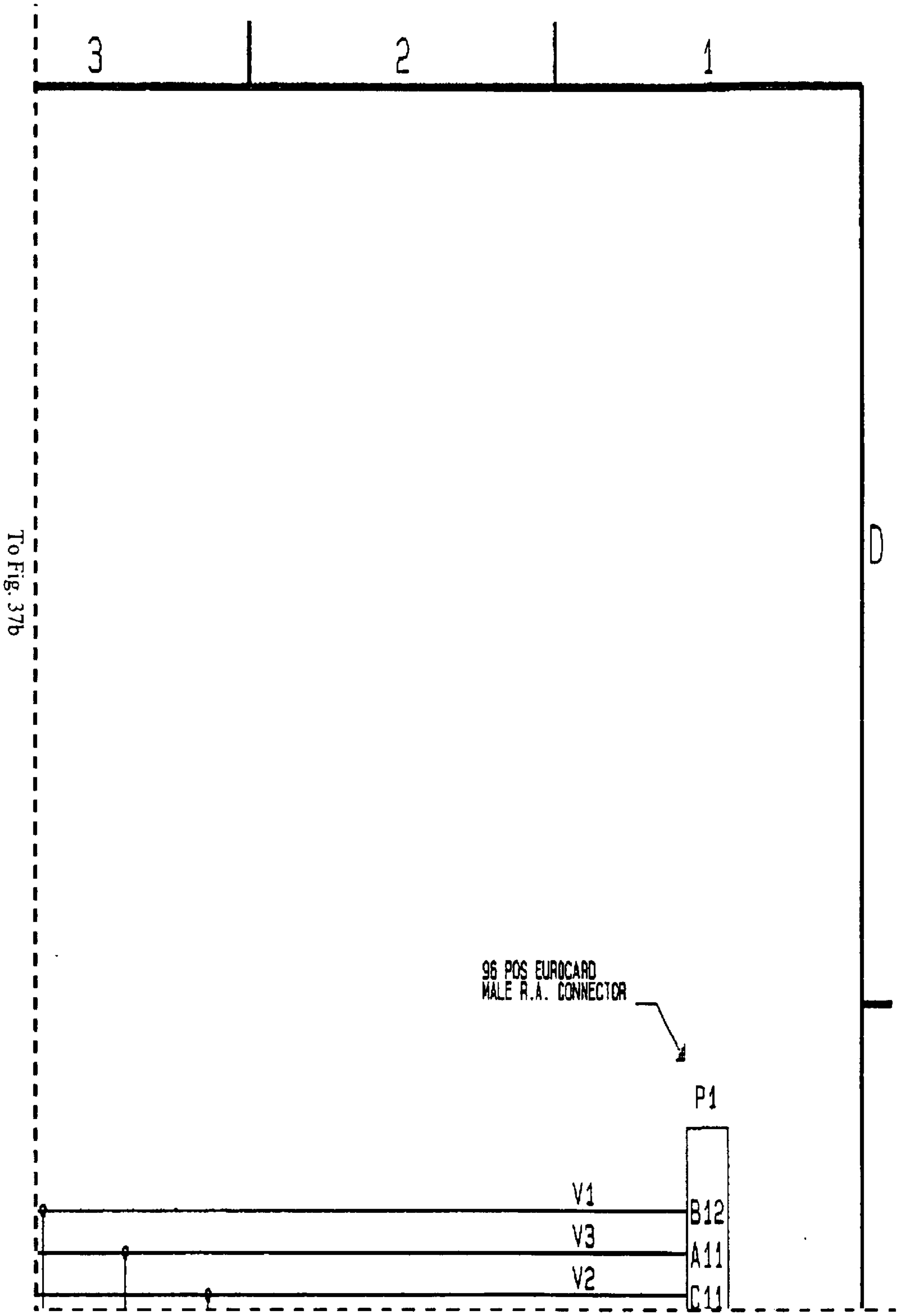
Figure 37D:
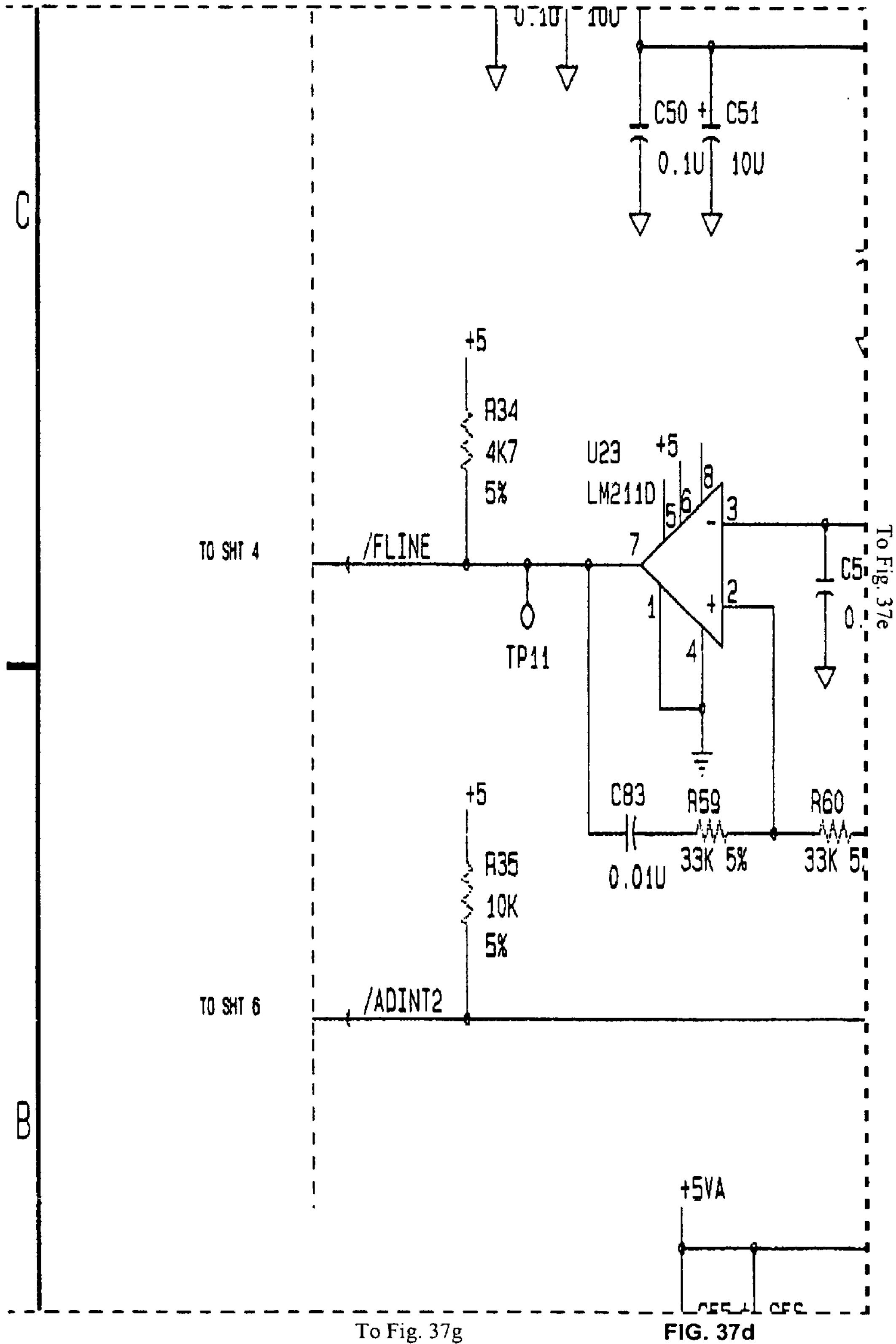
Figure 37E:
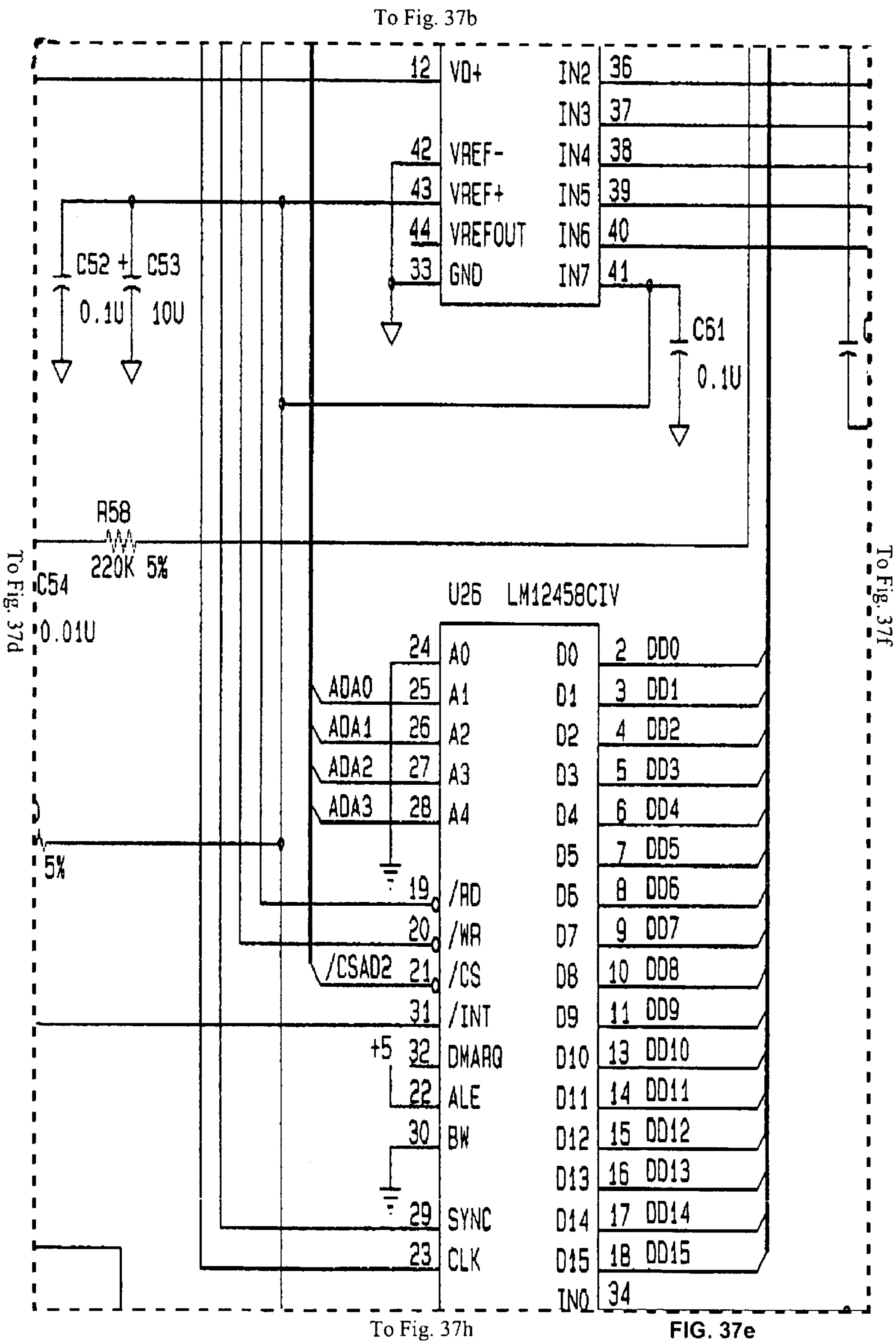
Figure 37F:
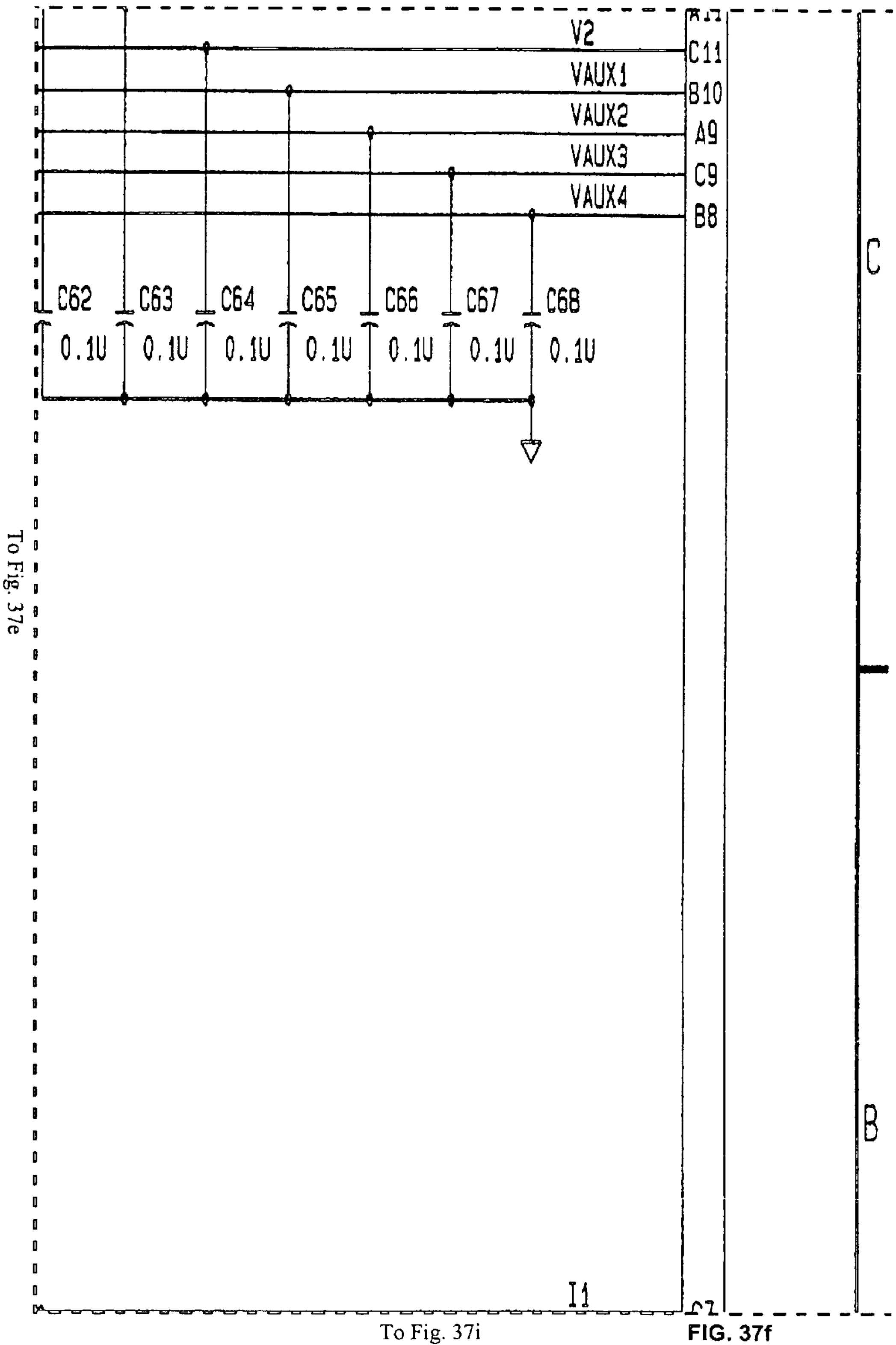
Figure 37G:
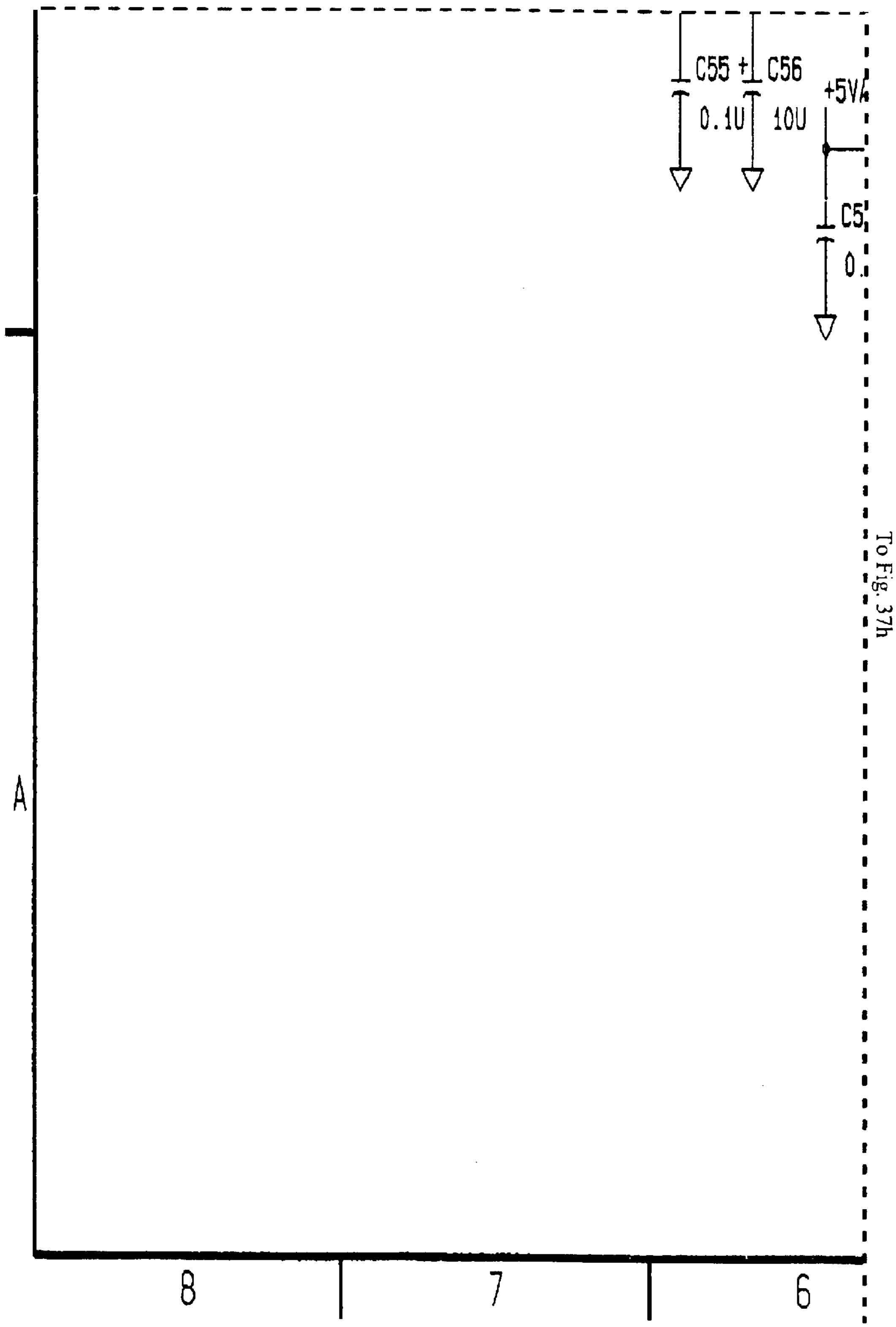
Figure 37H:
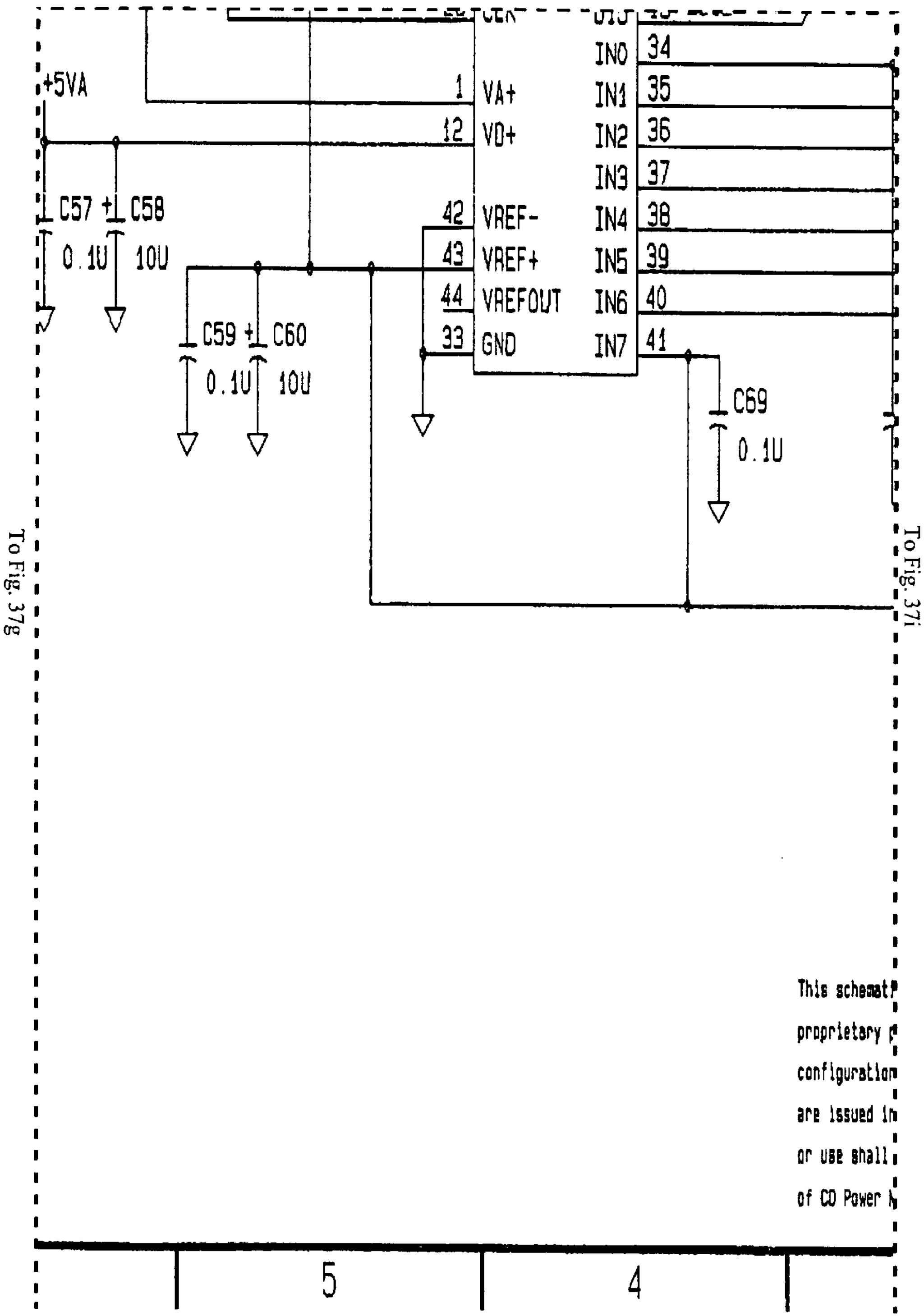
Figure 37I:
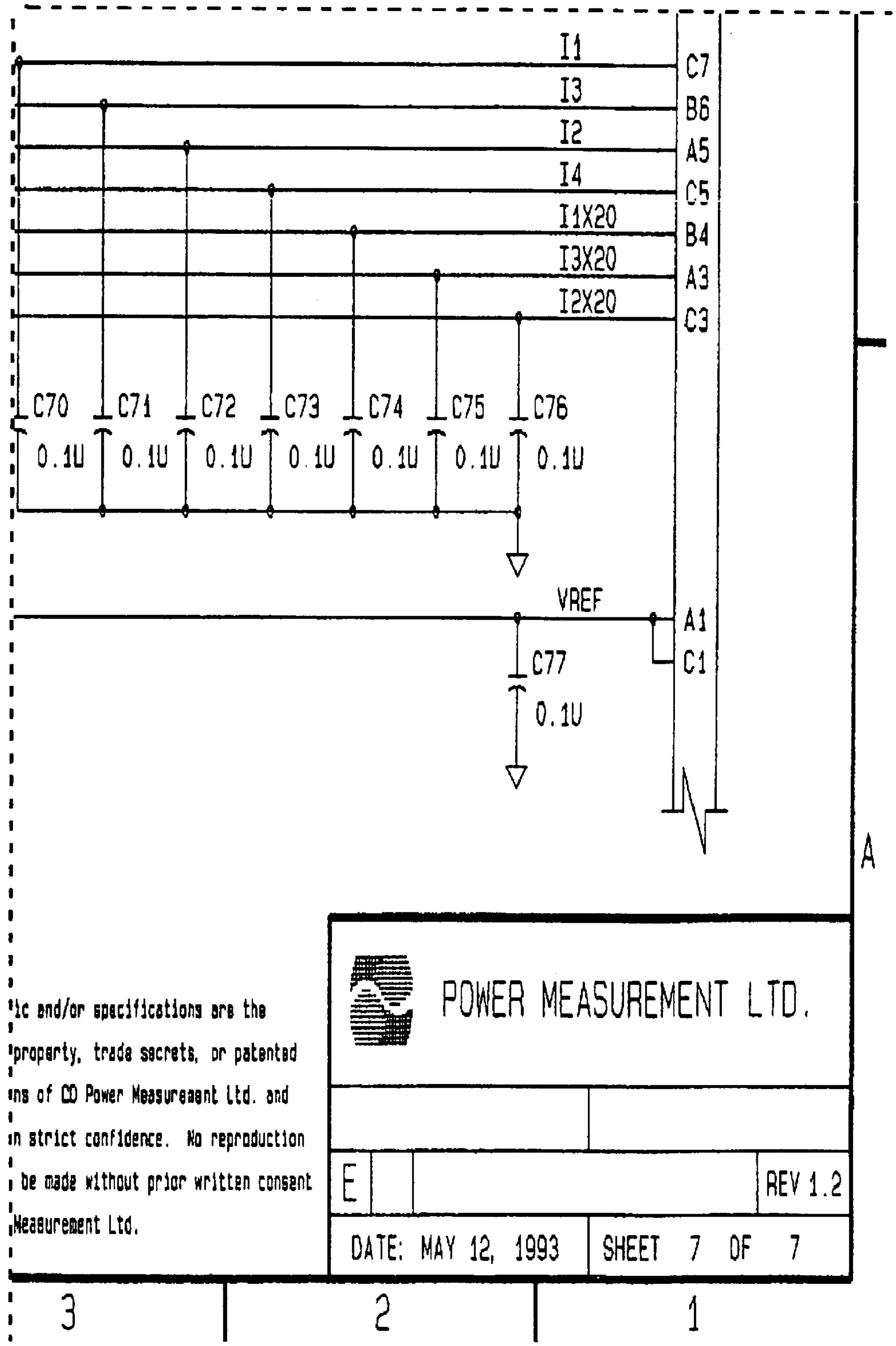
Figure 38A:
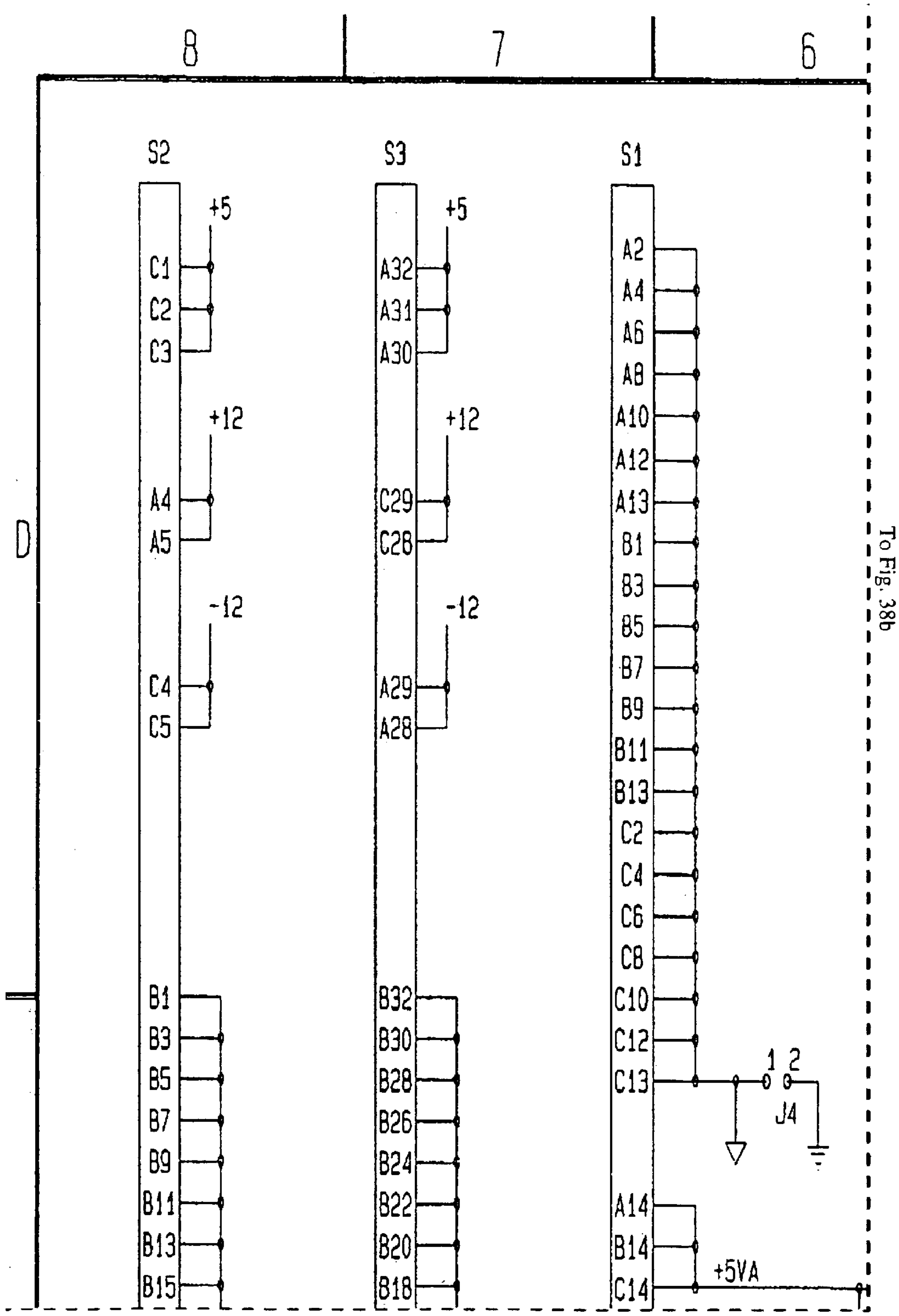
Figure 38B:
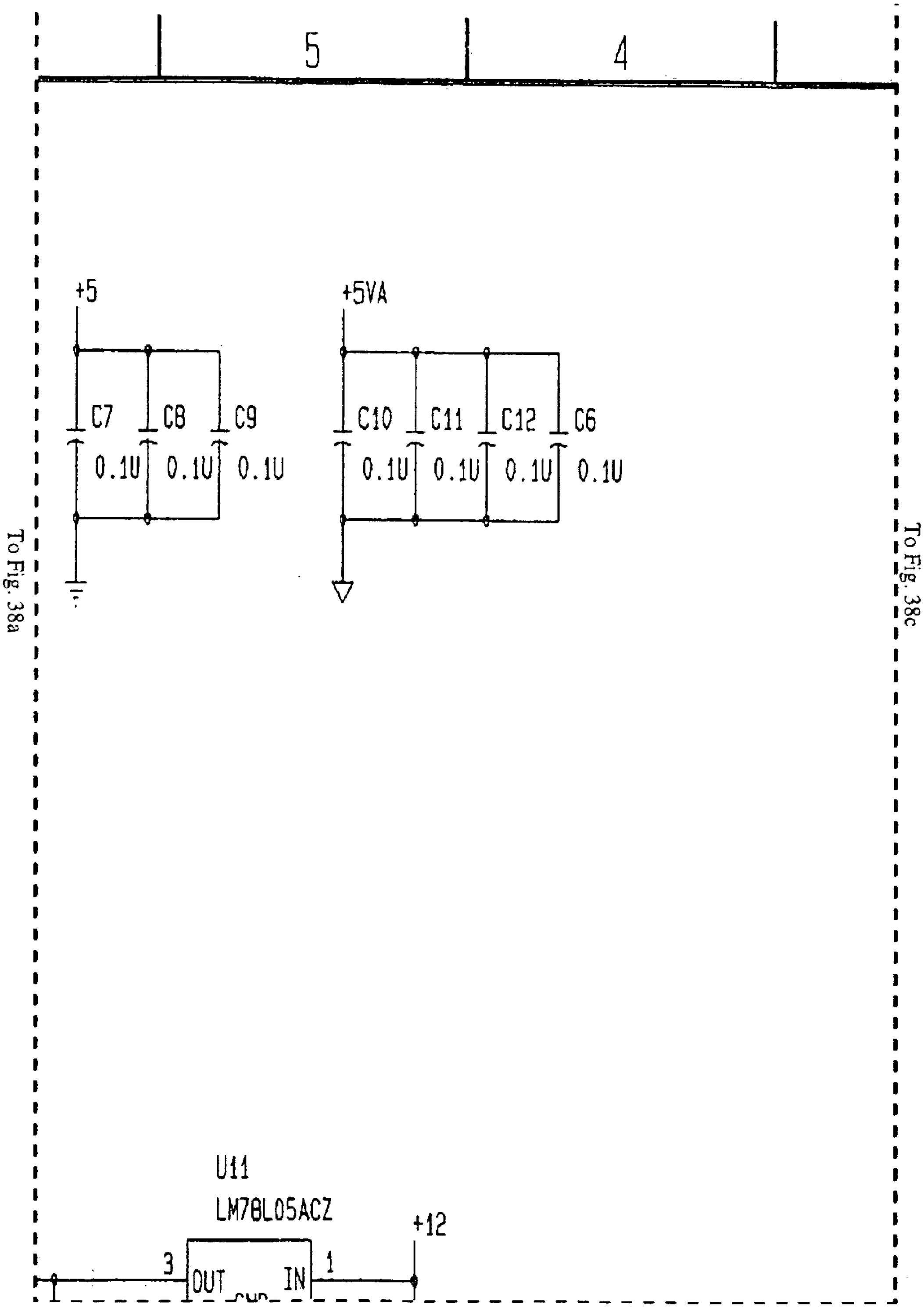
Figure 38C:
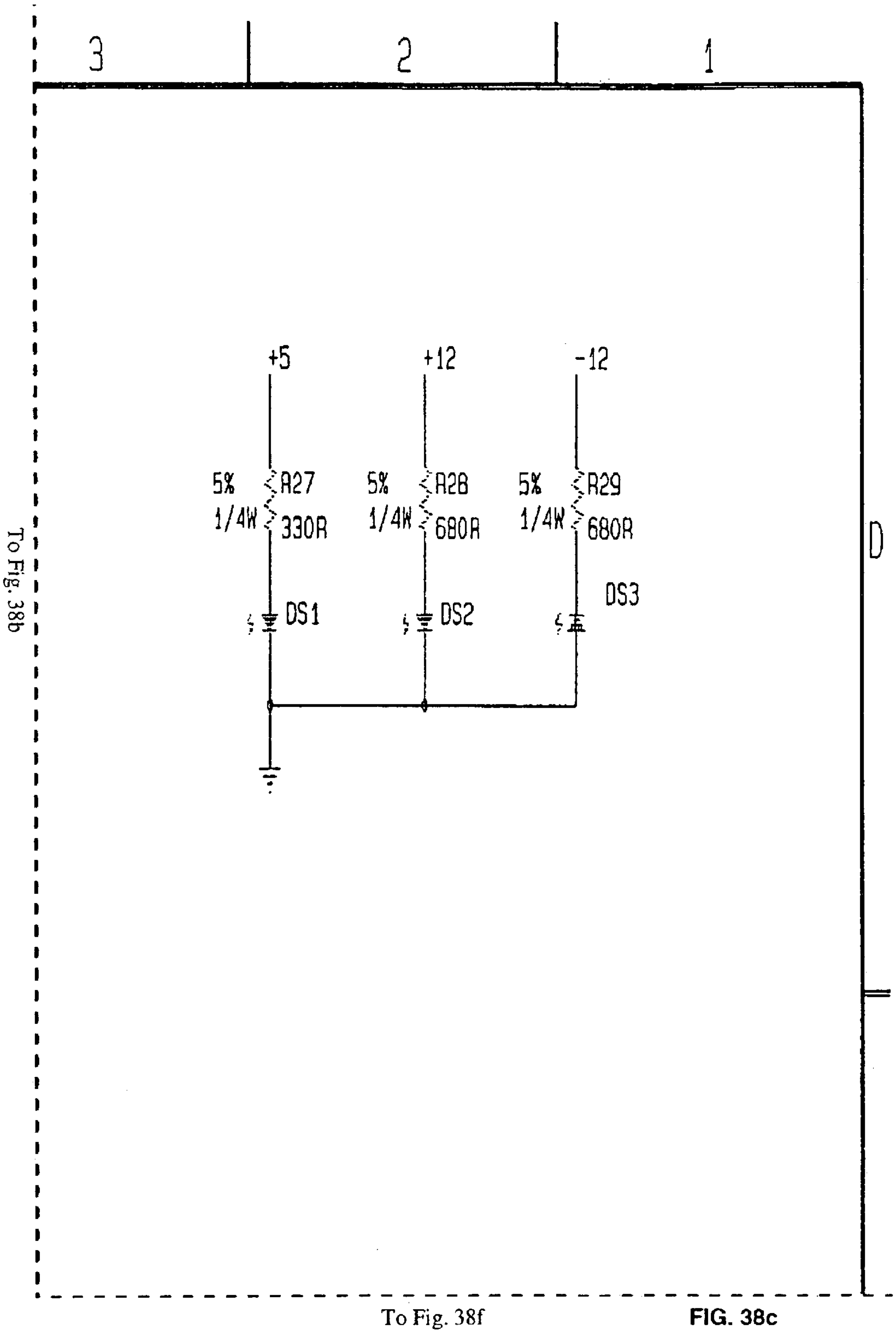
Figure 38D:
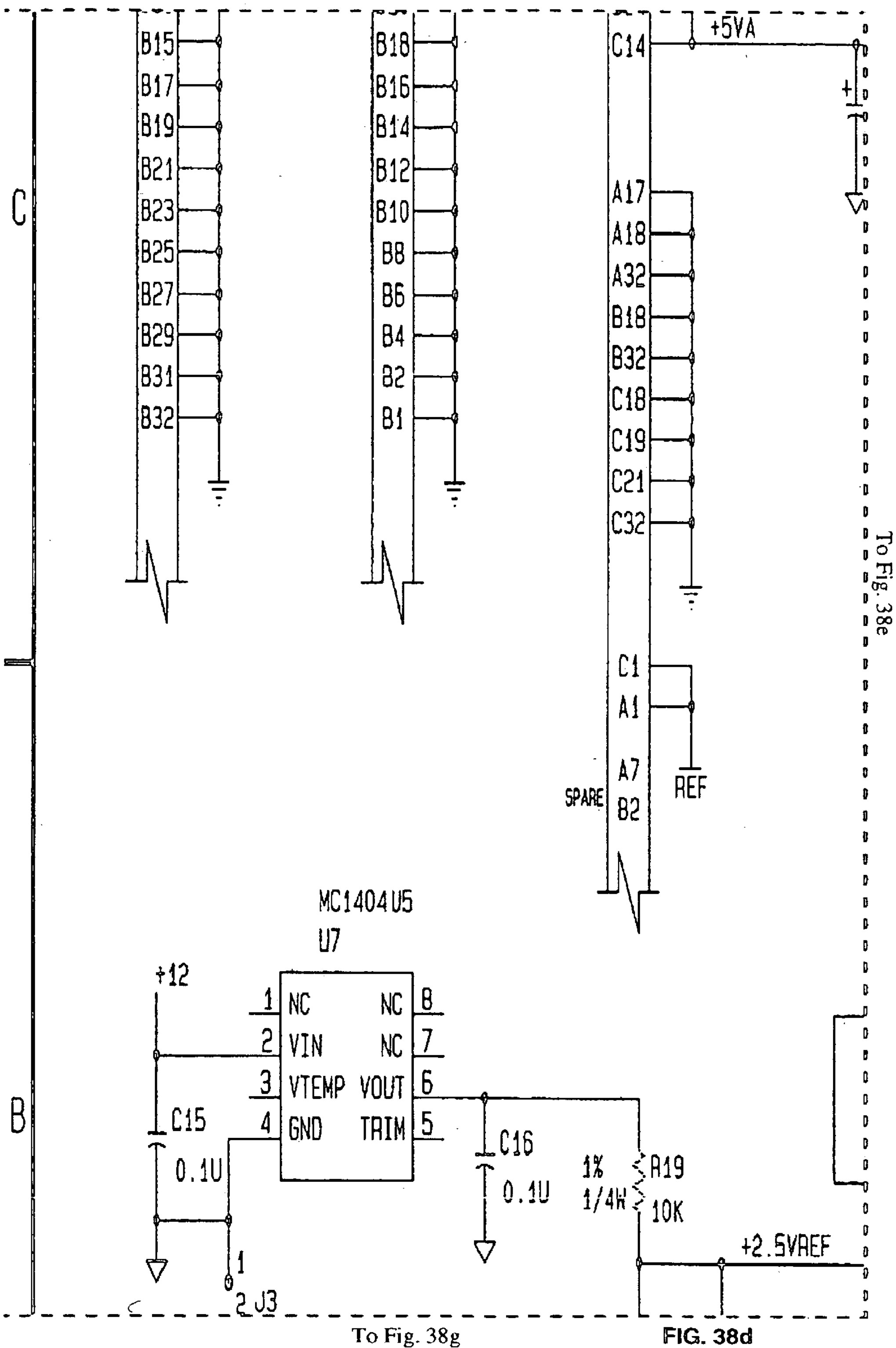
Figure 38:
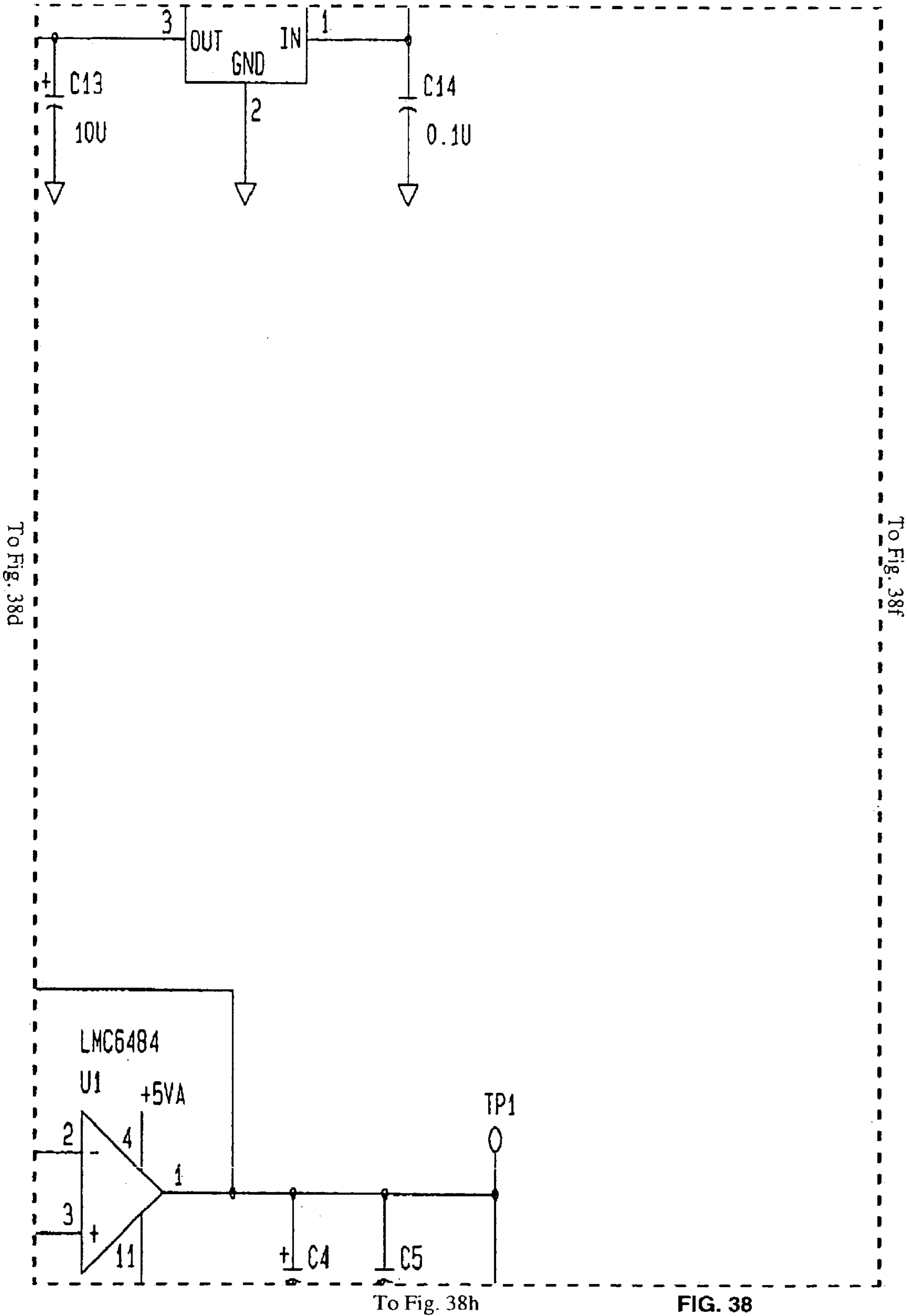
Figure 38F:
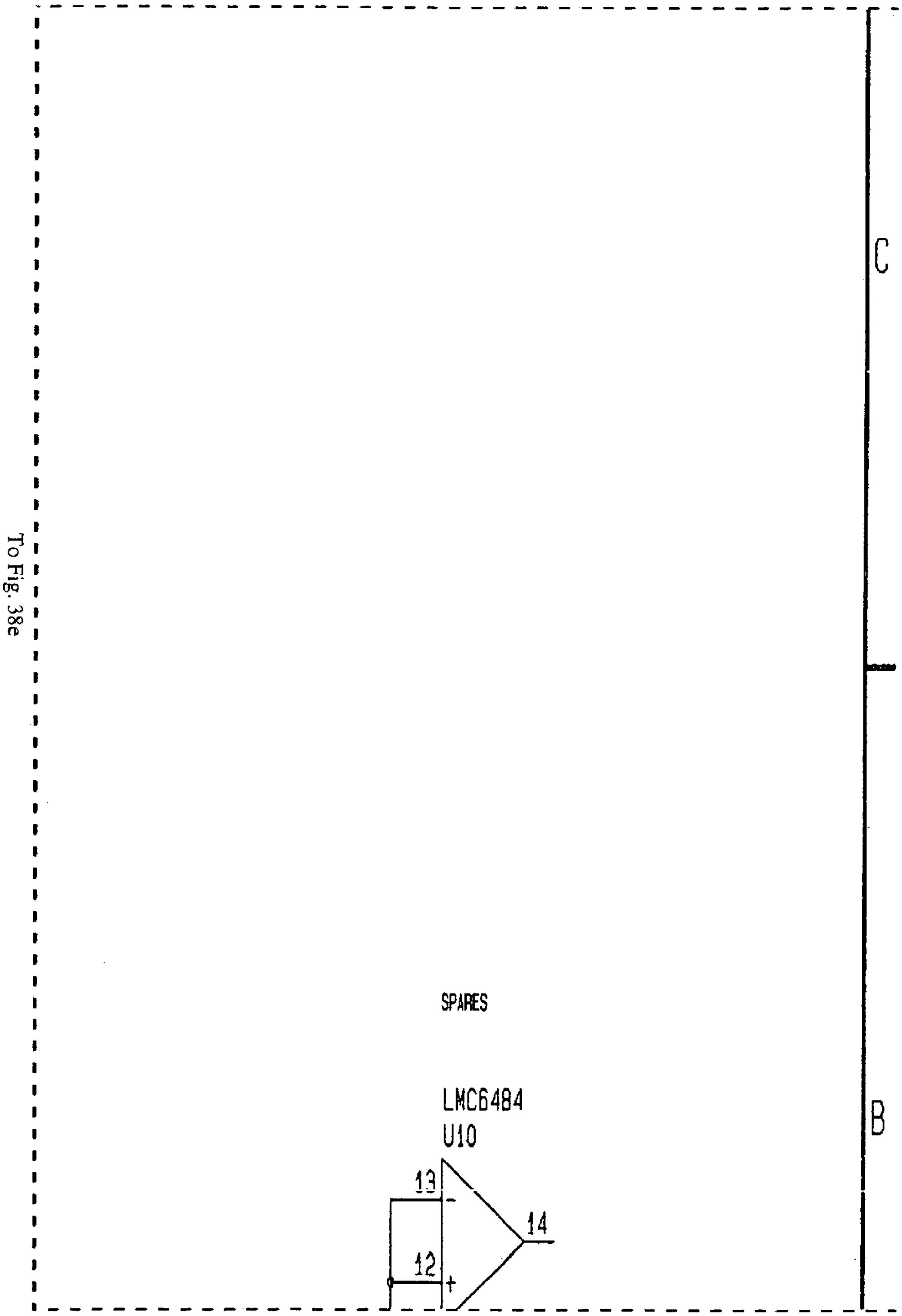
Figure 38G:
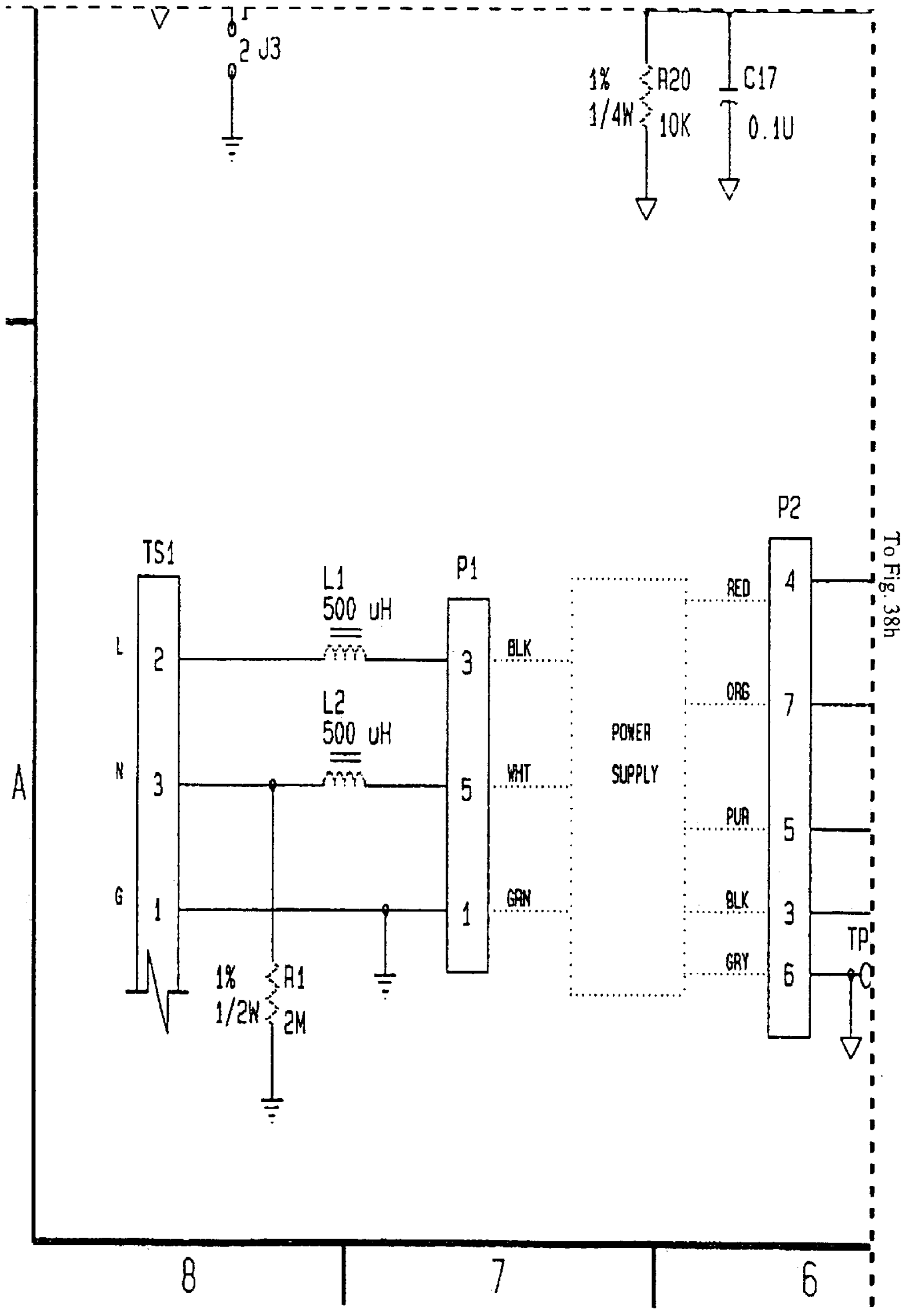
Figure 38H:
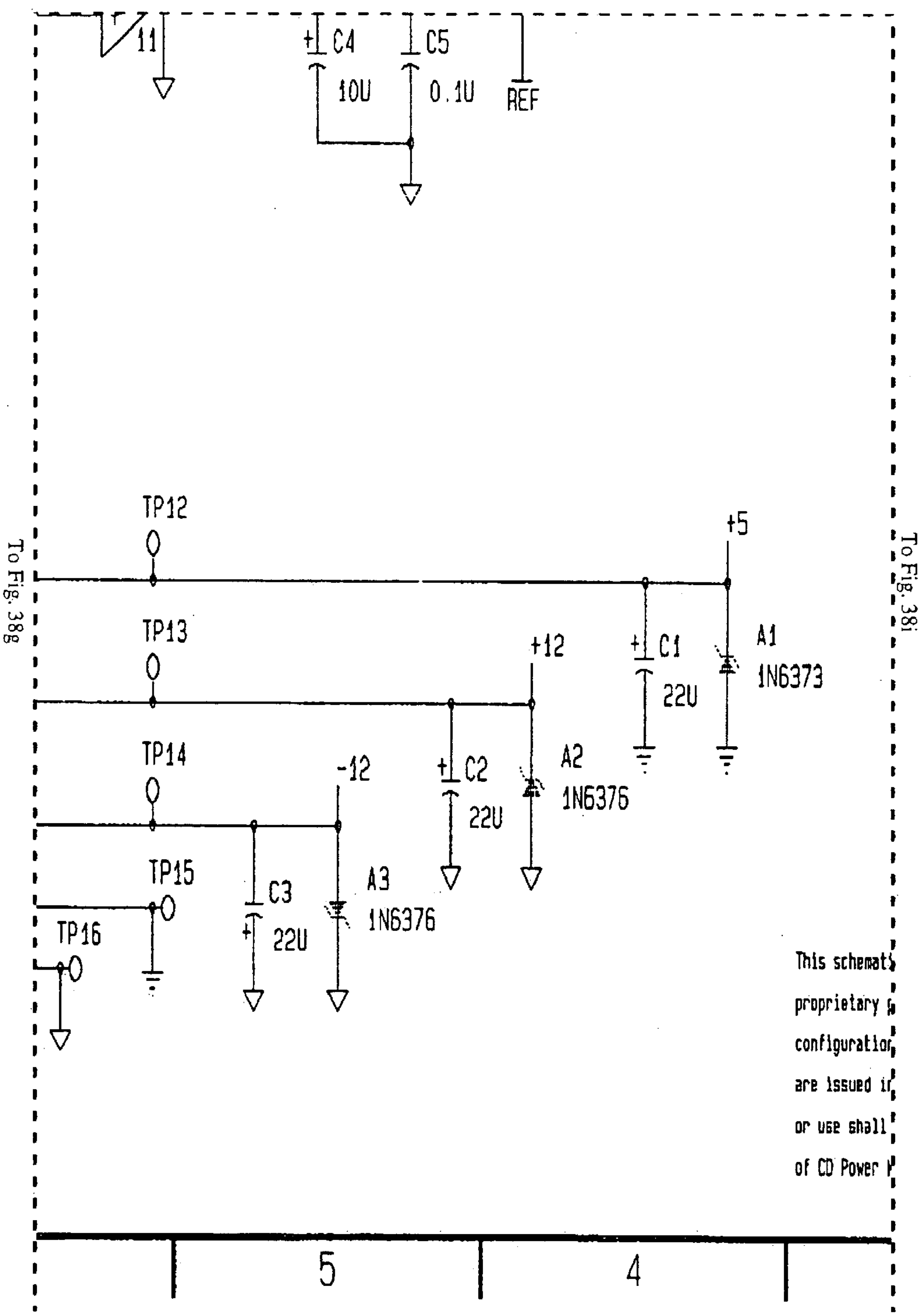
Figure 38I:
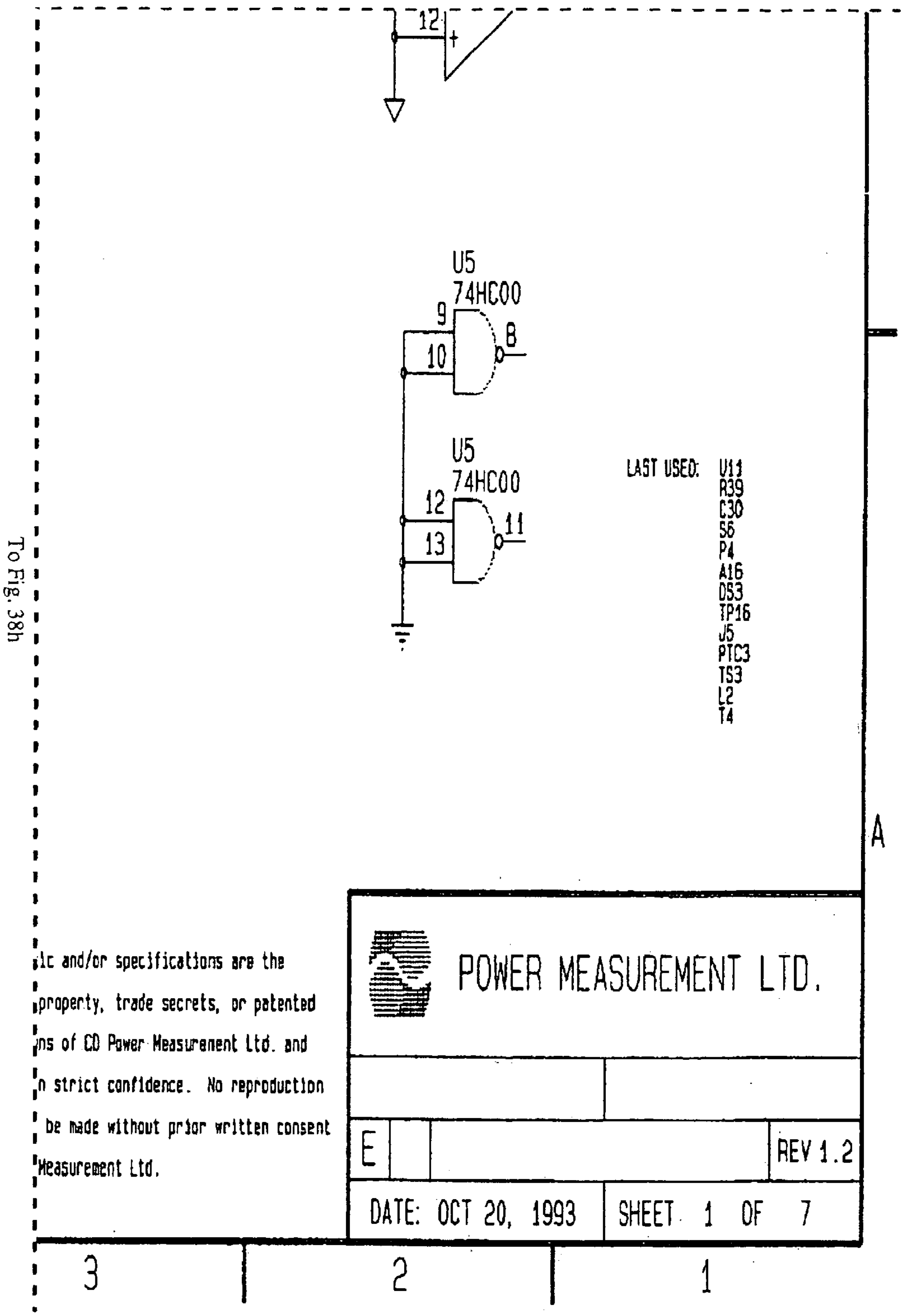
Figure 39A:
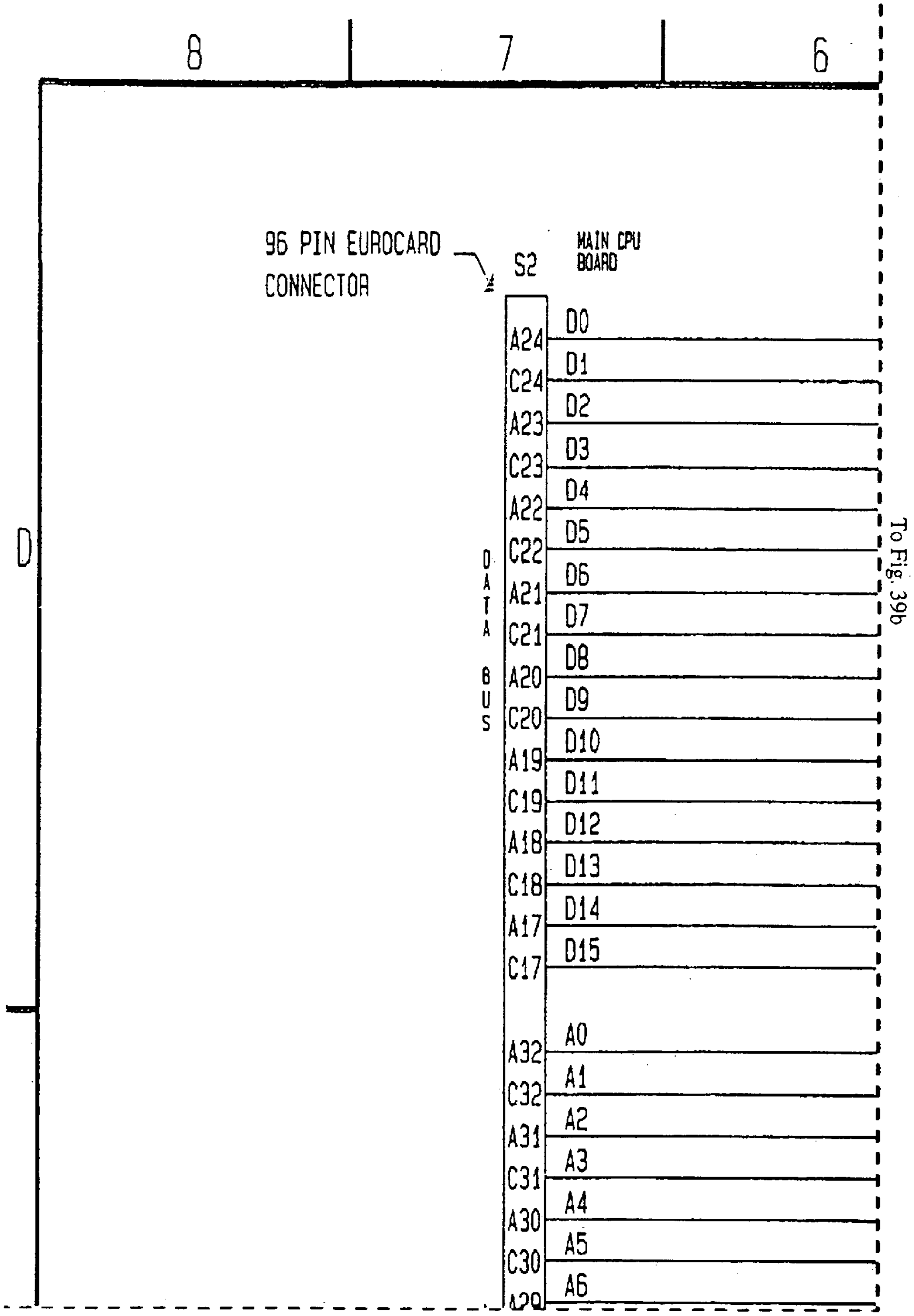
Figure 39B:
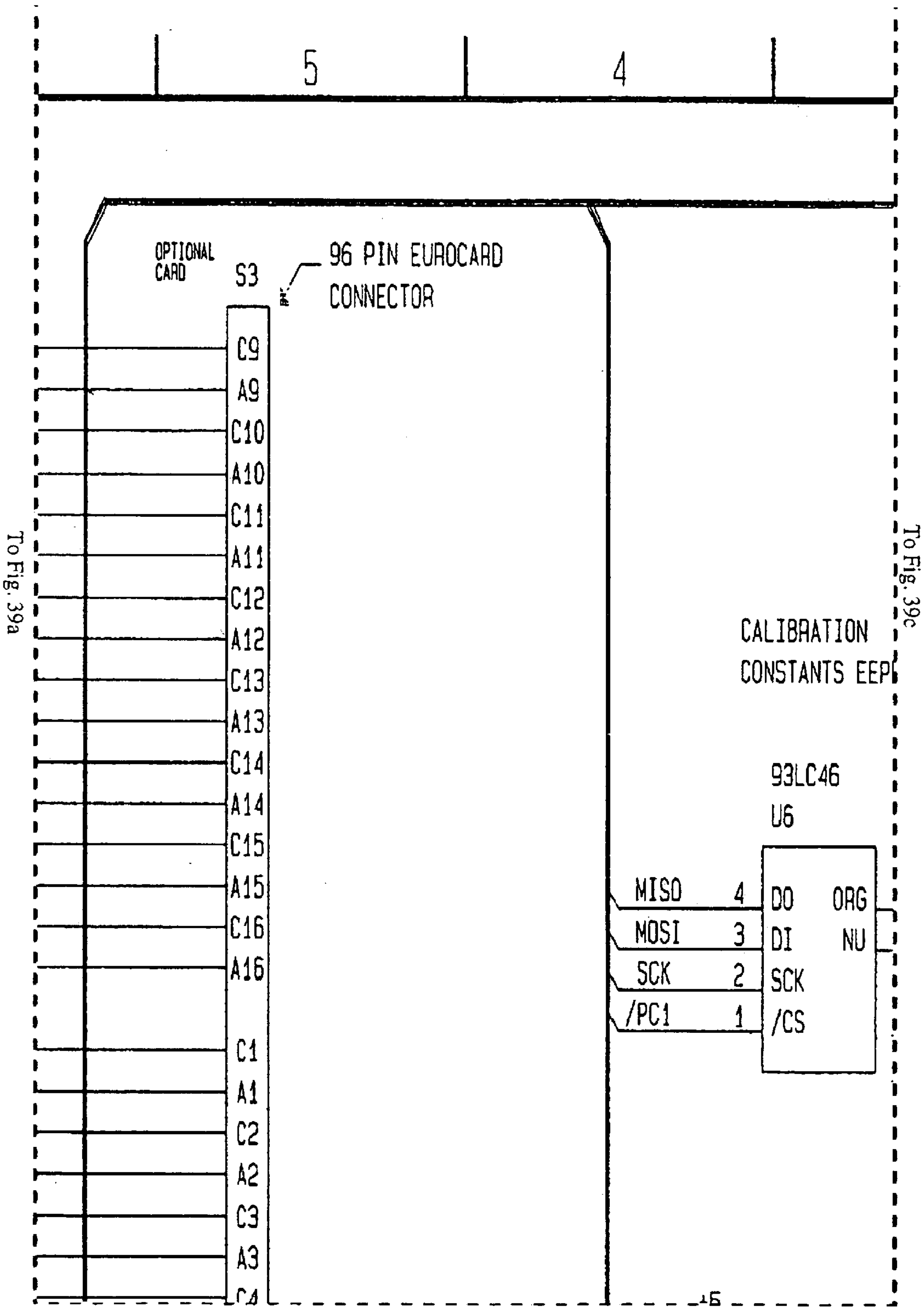
Figure 39C:
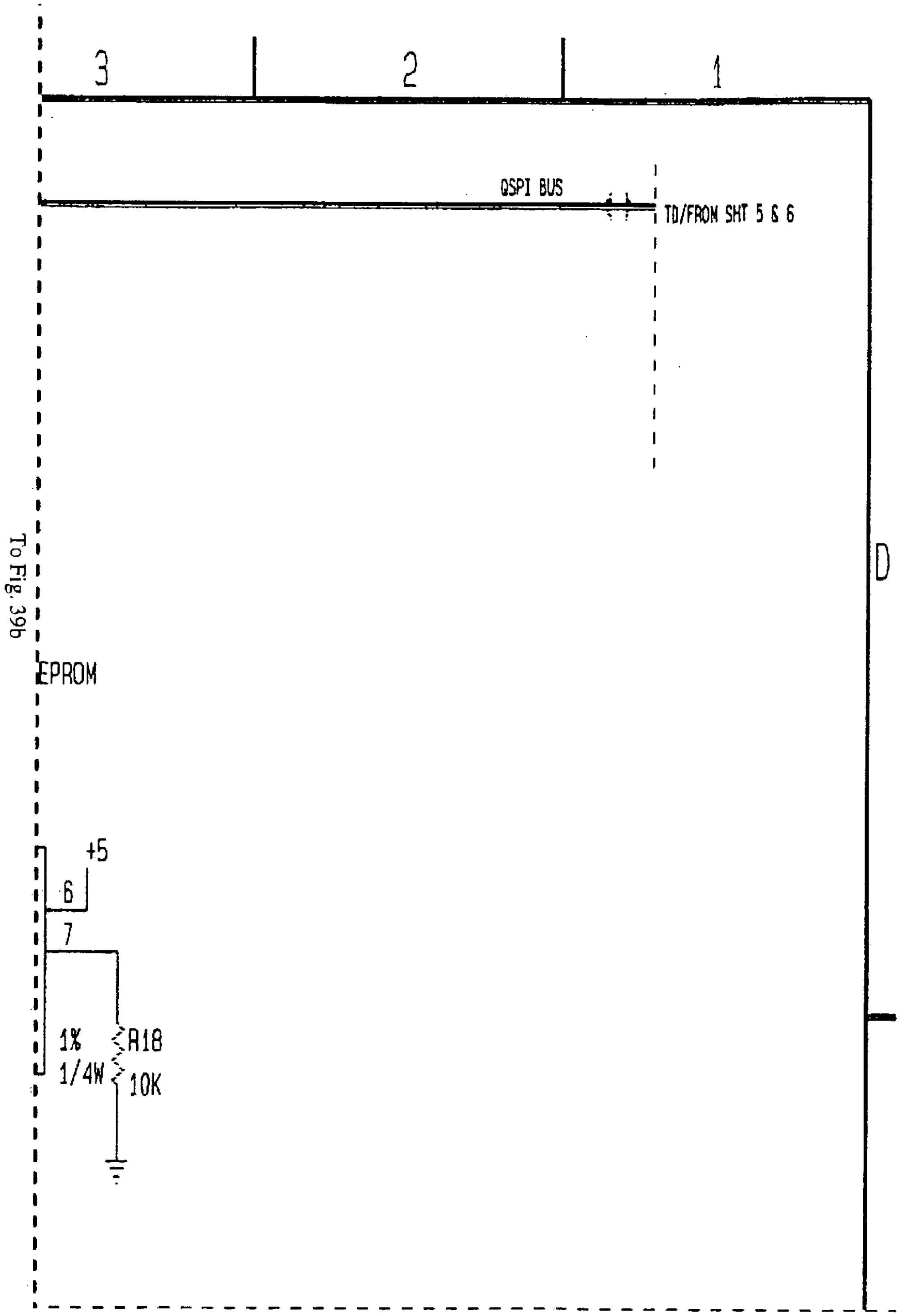
Figure 39D:
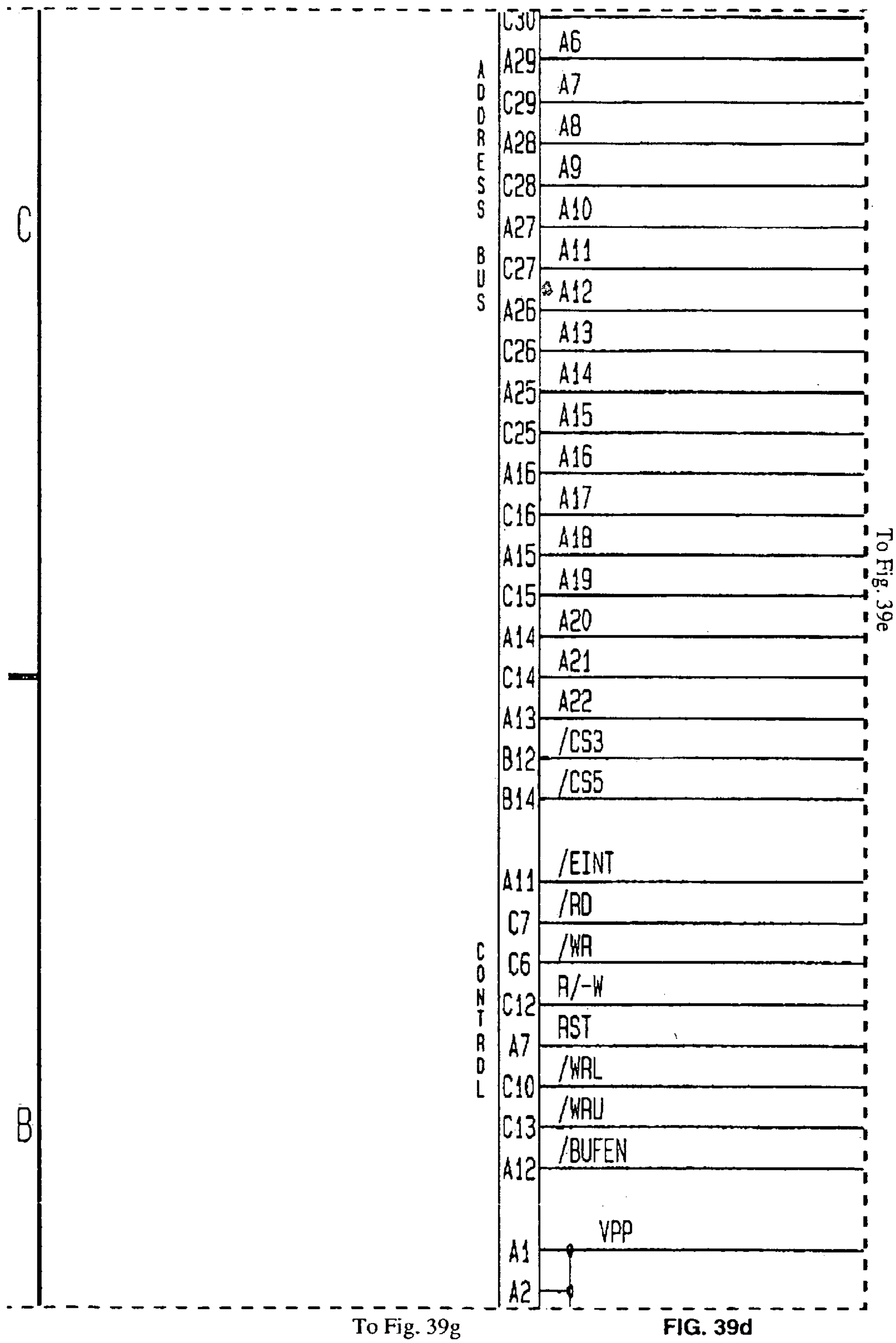
Figure 39:
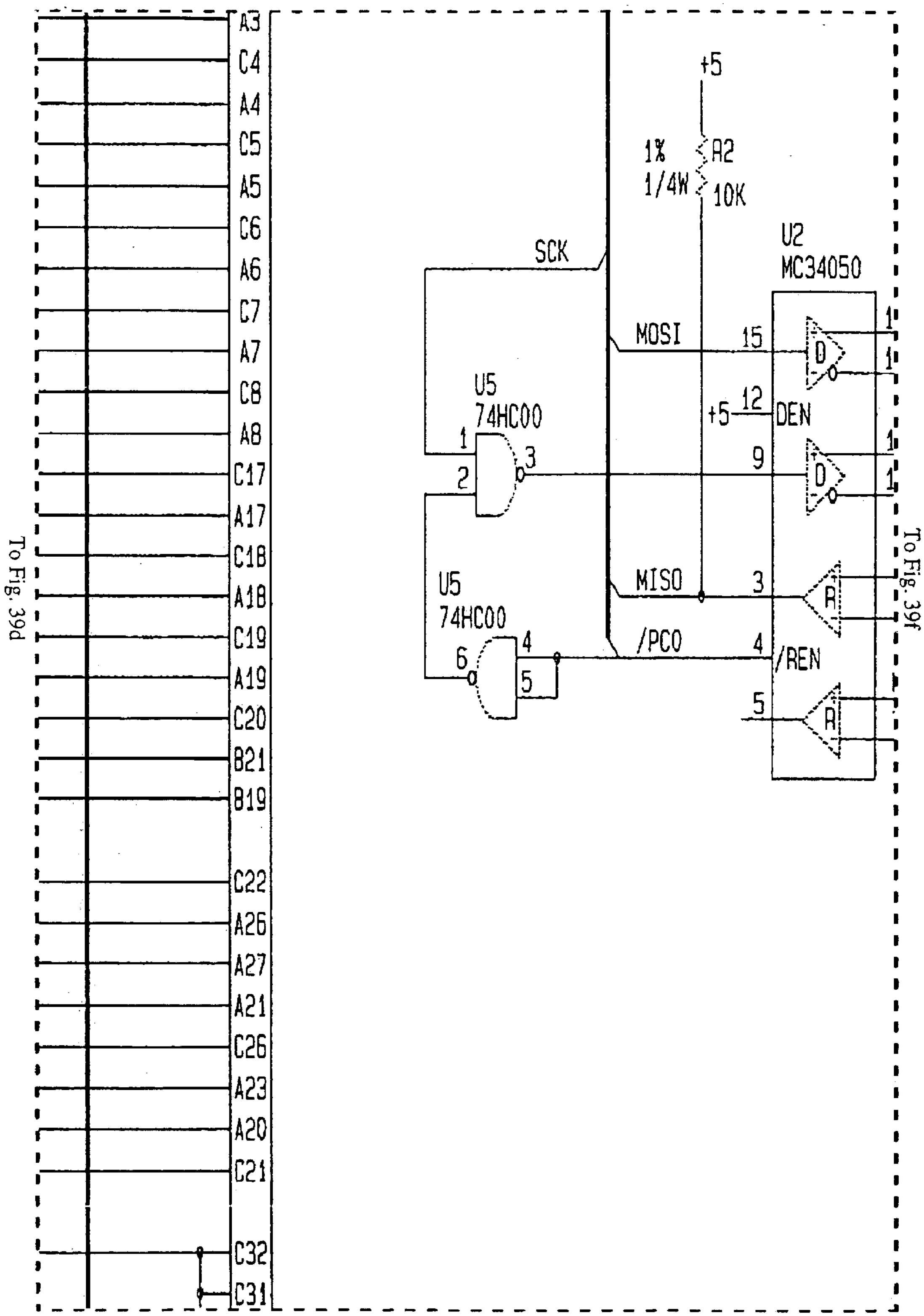
Figure 39F:
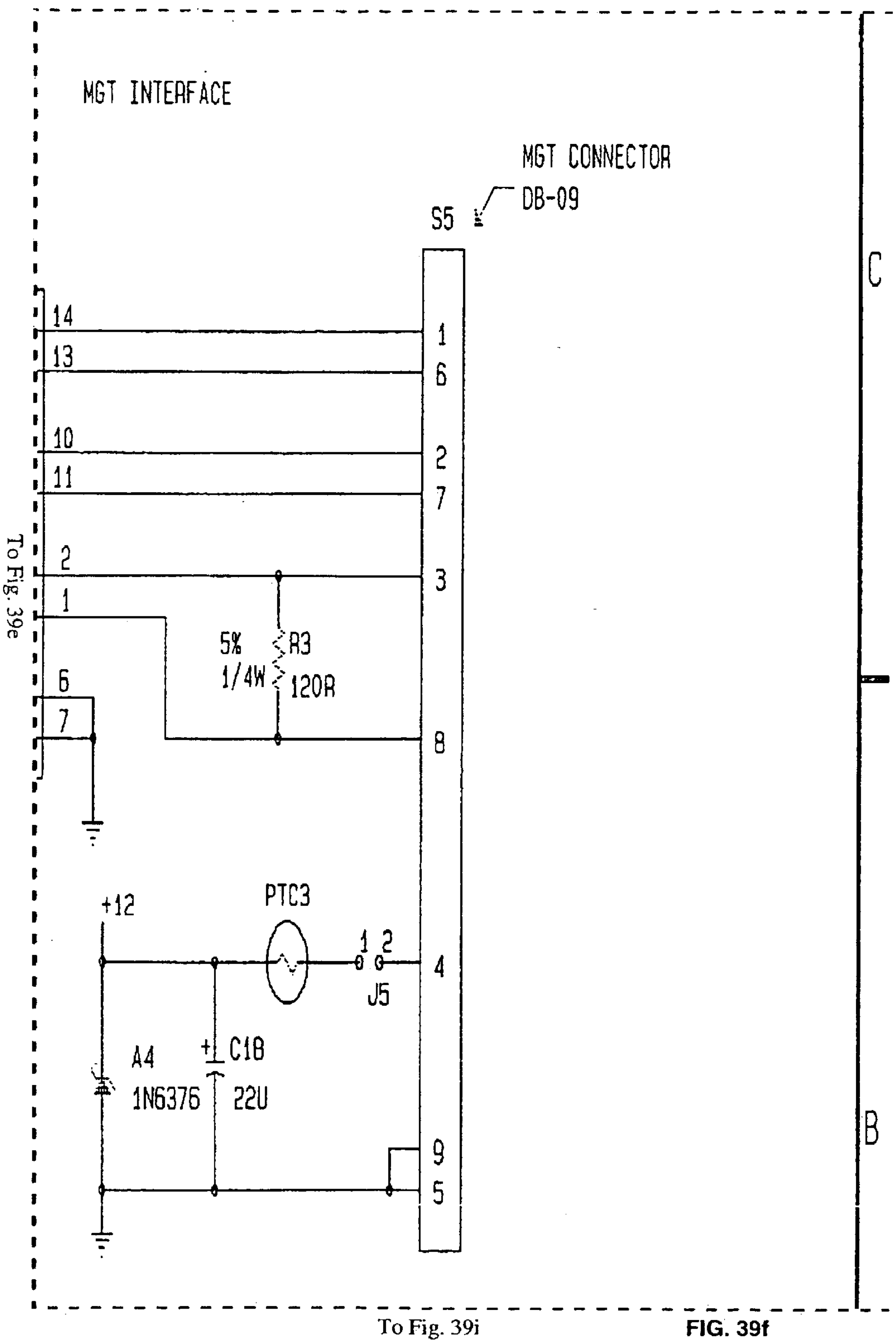
Figure 39G:
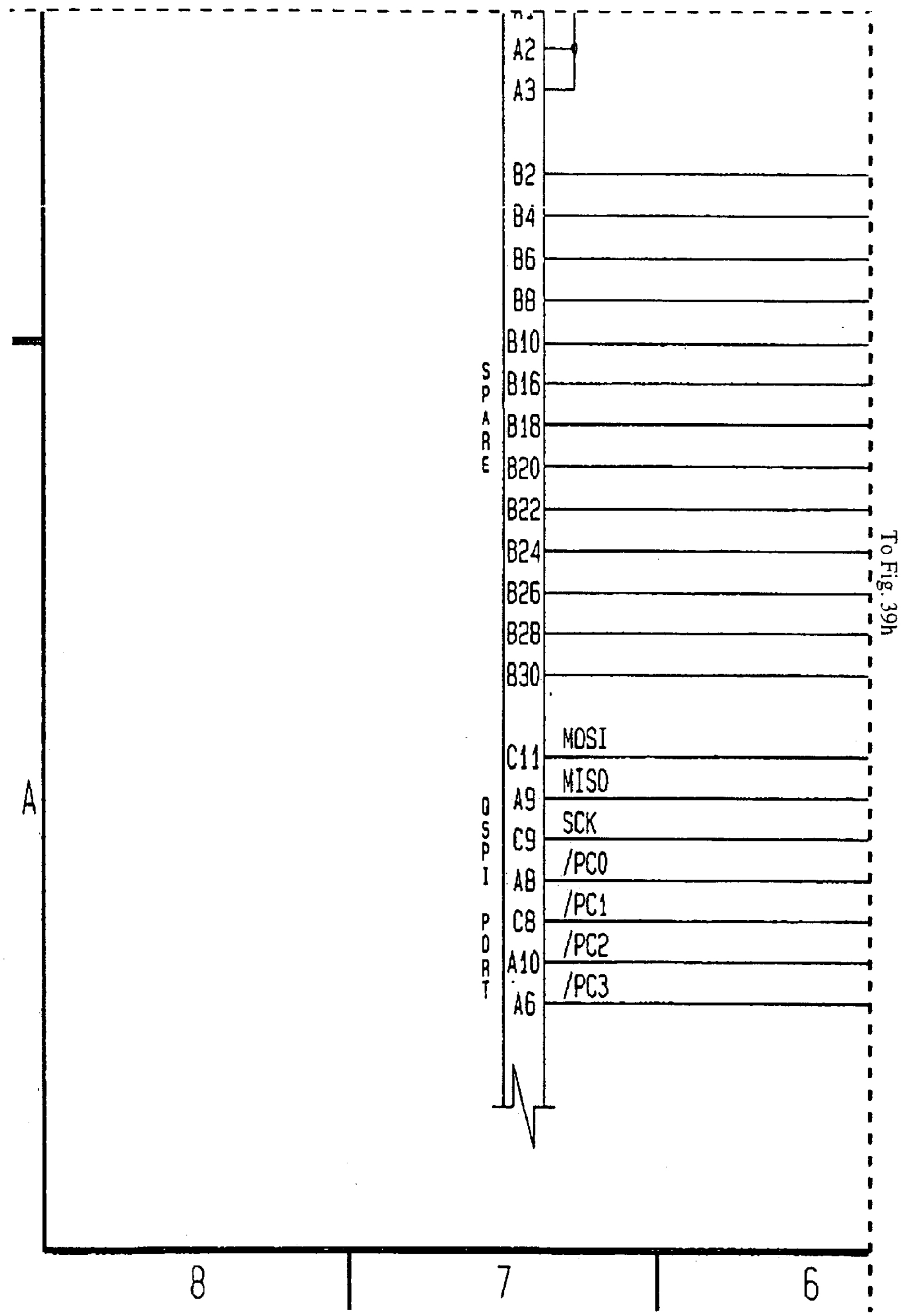
Figure 39H:
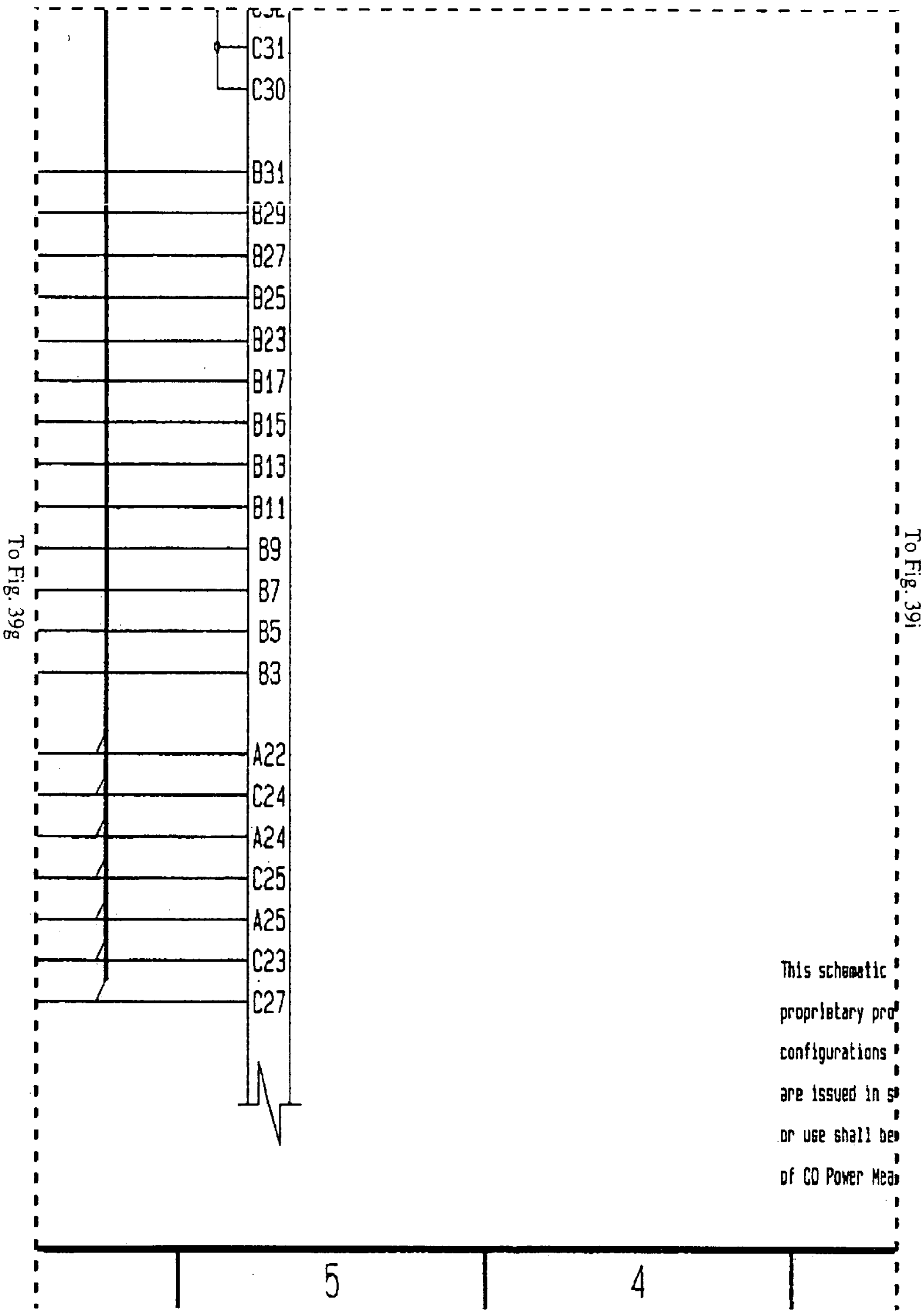
Figure 40A:
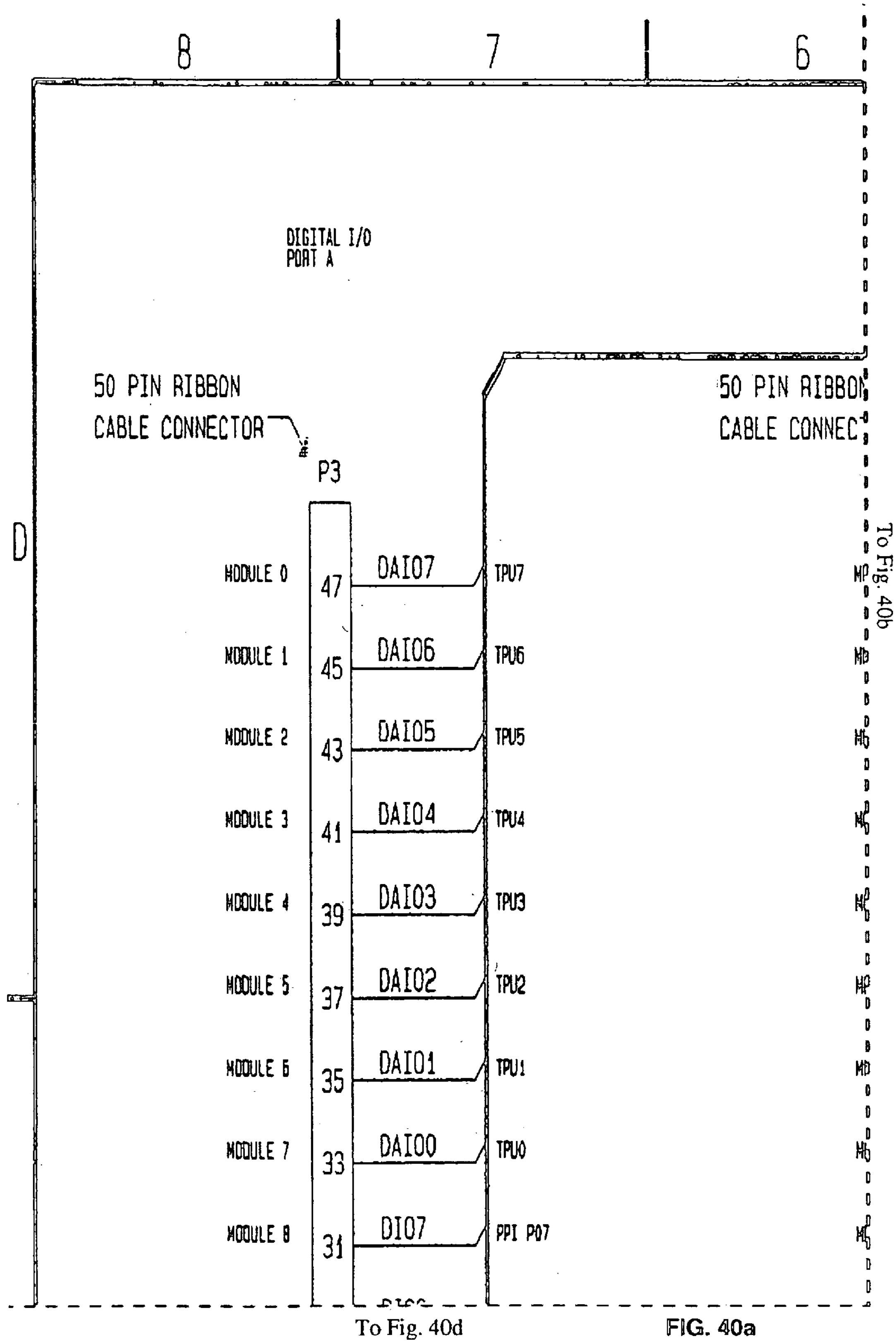
Figure 40B:
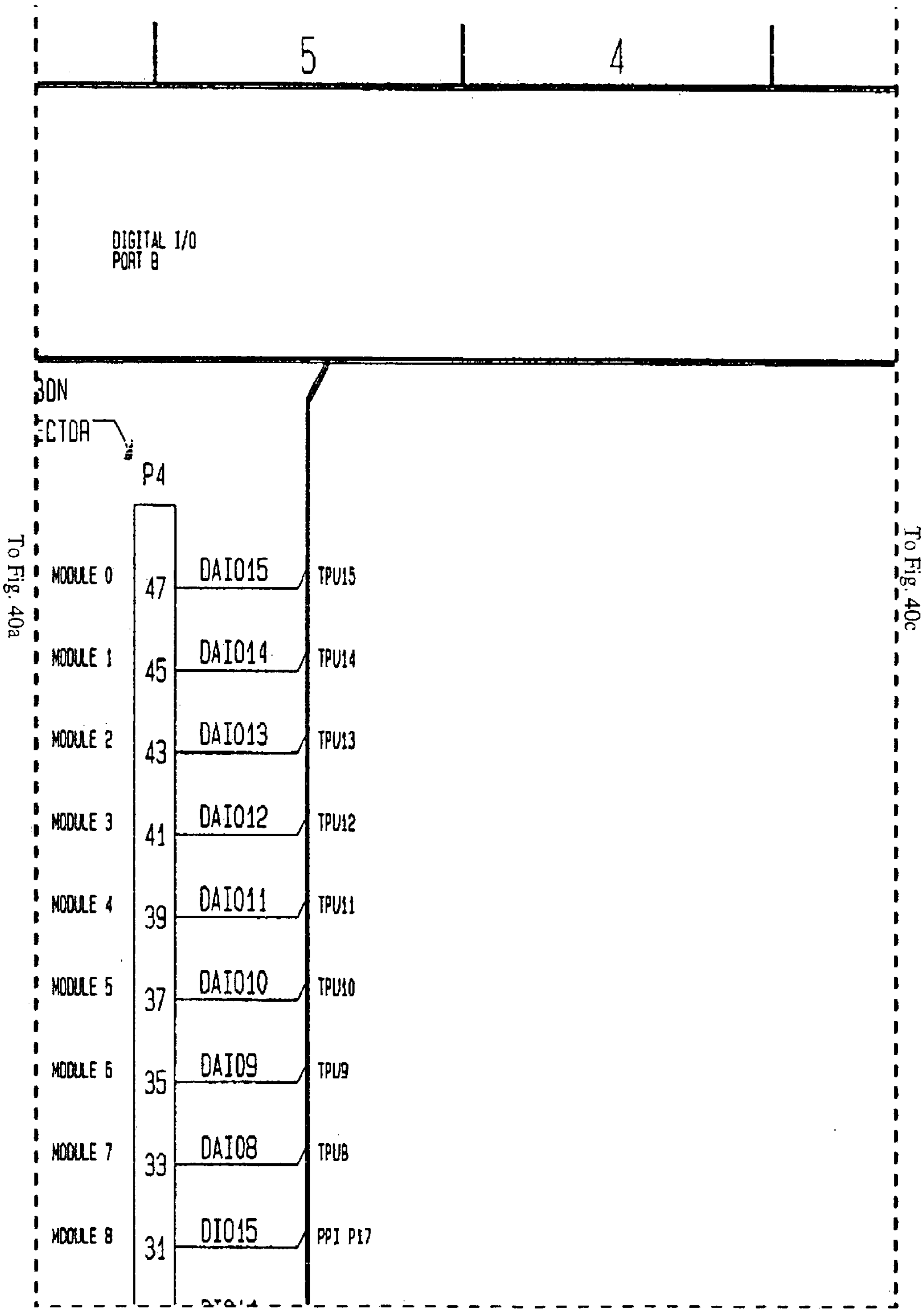
Figure 40C:
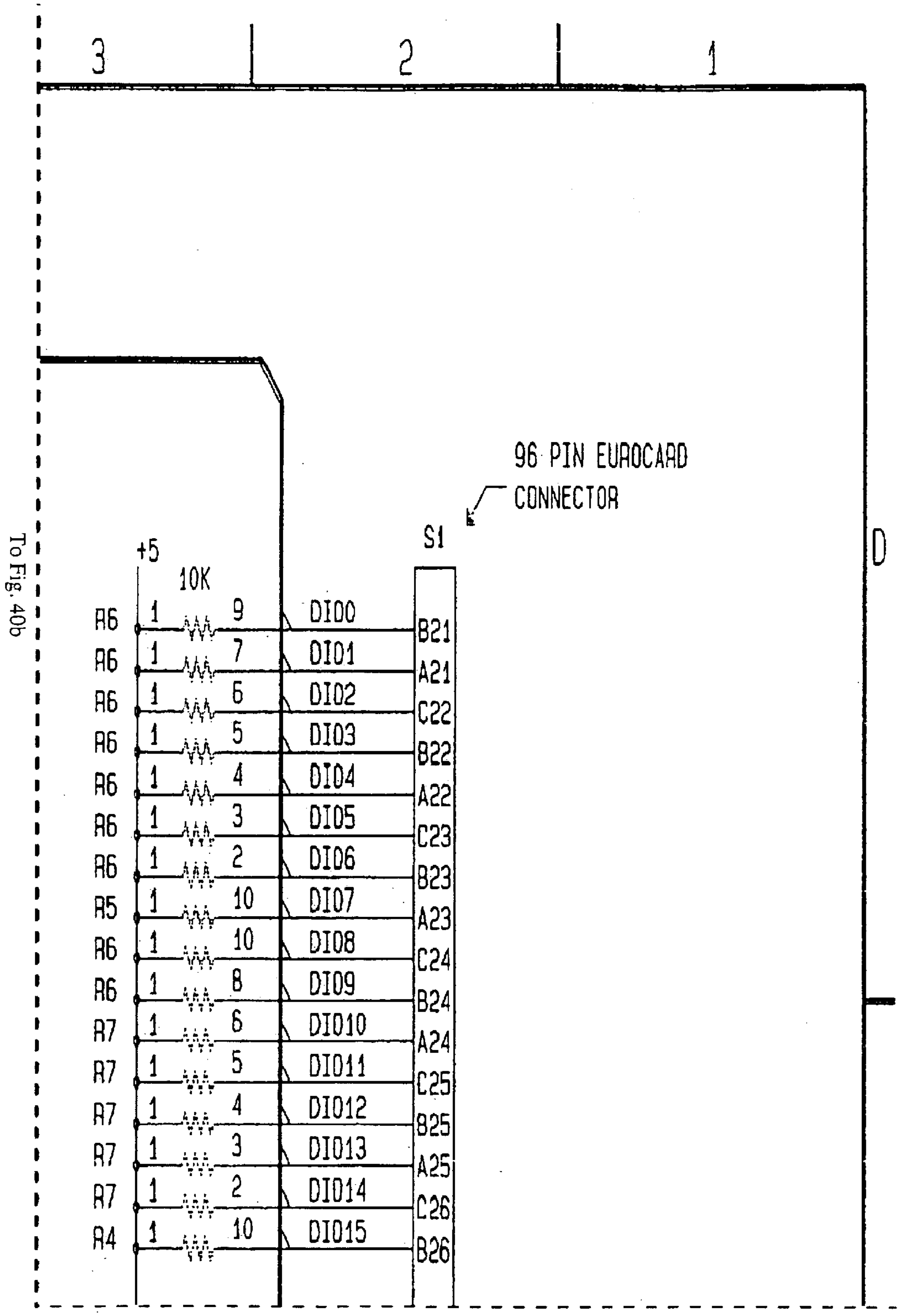
Figure 40D:
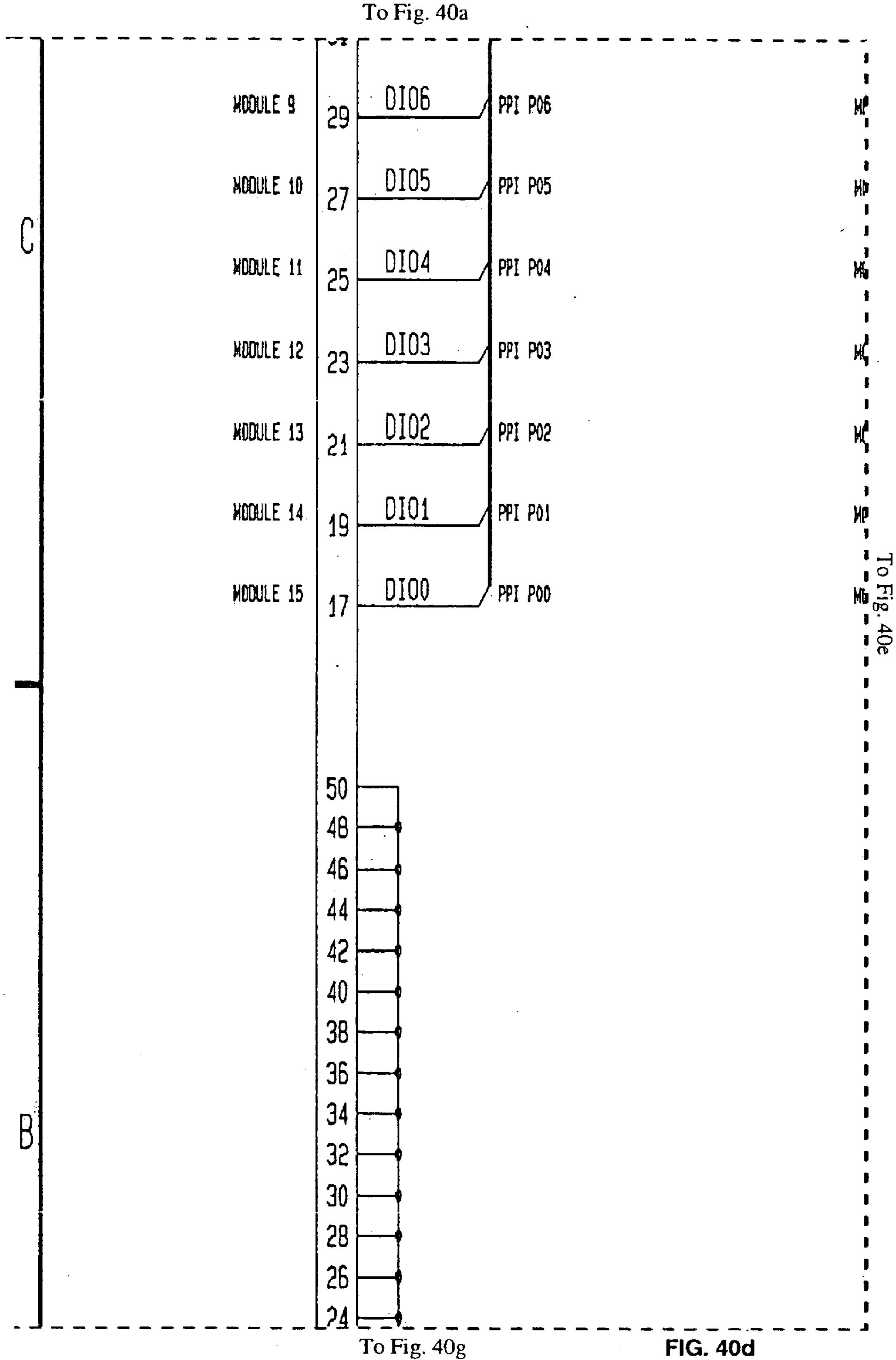
Figure 40:
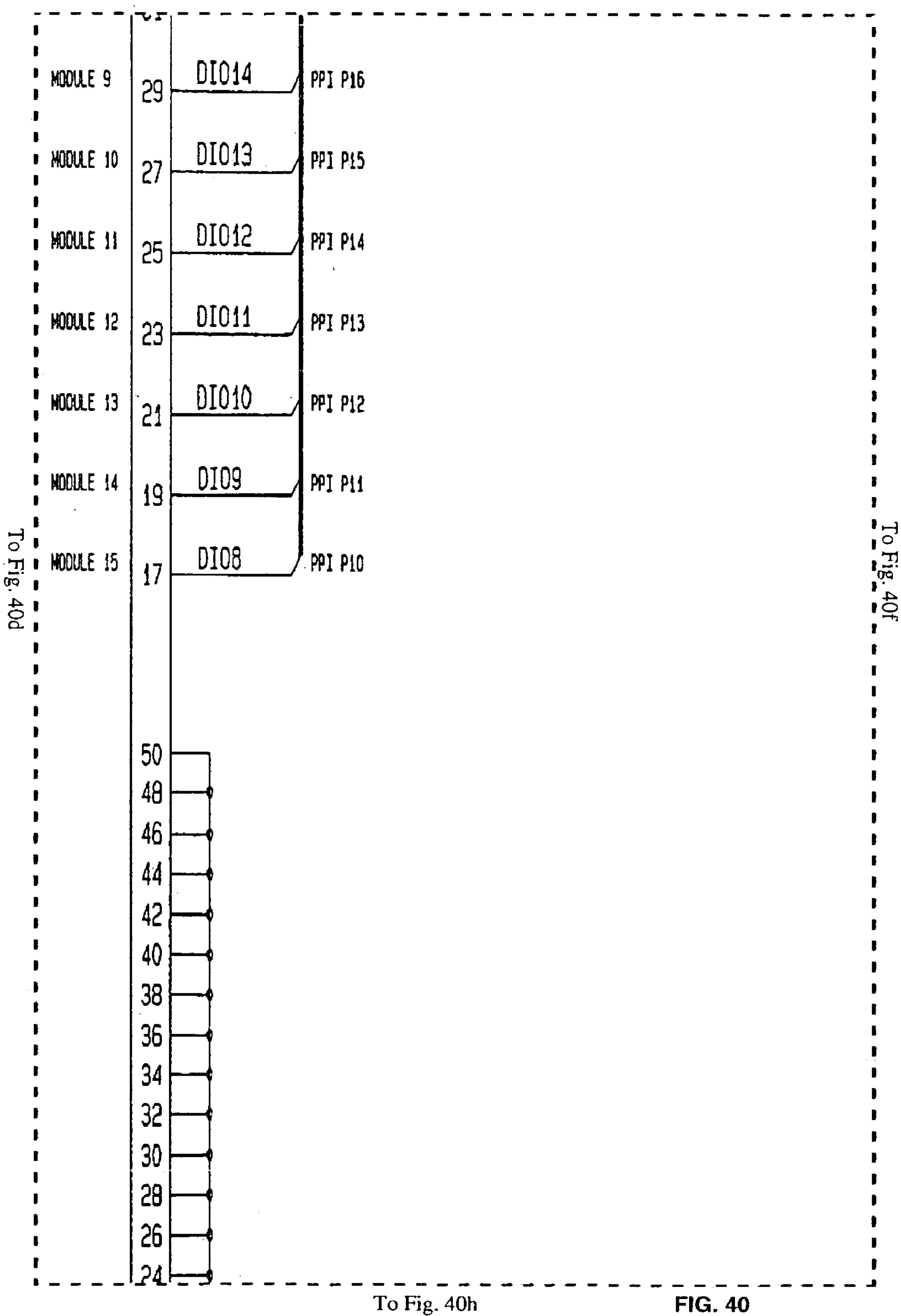
Figure 40F:
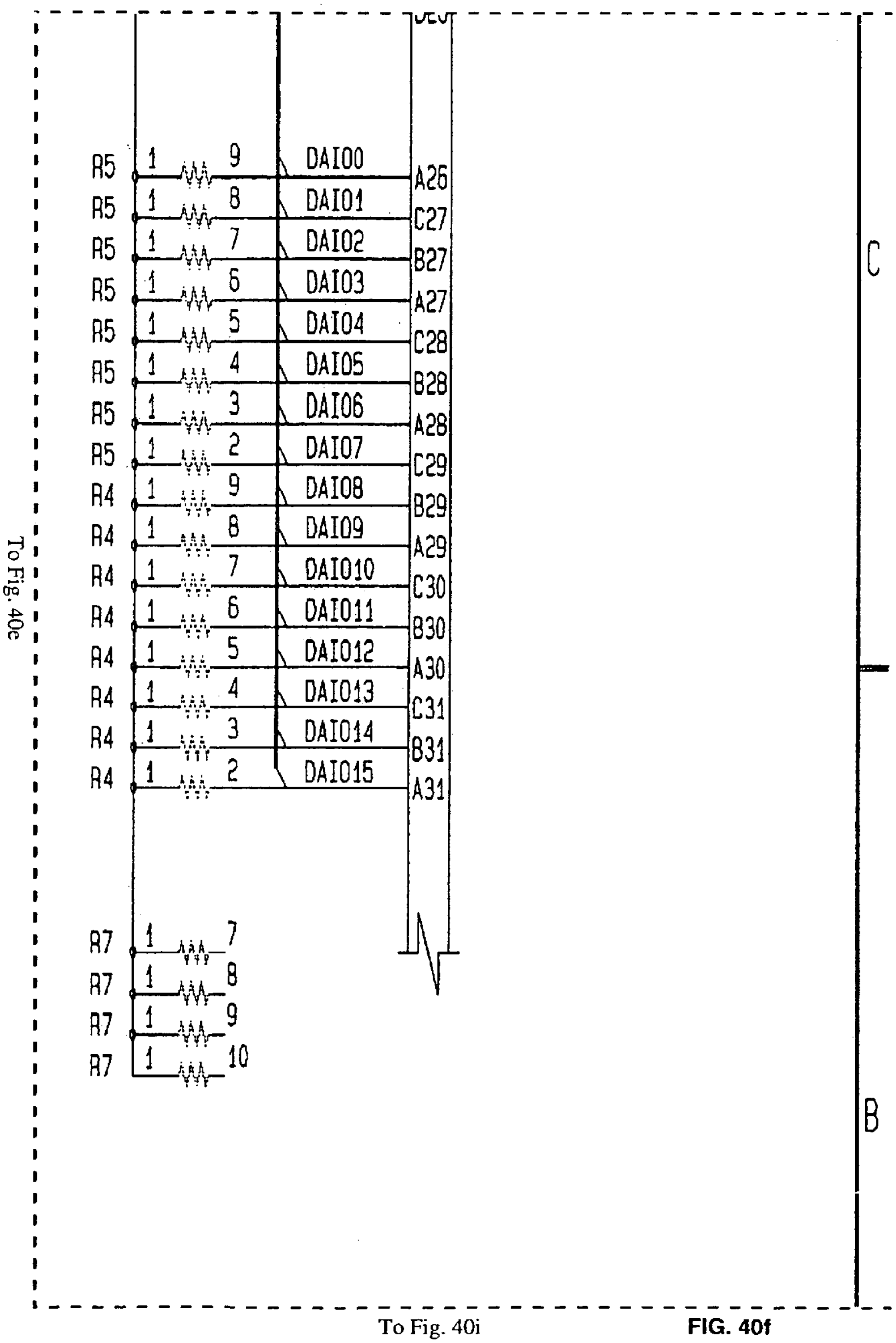
Figure 40G:
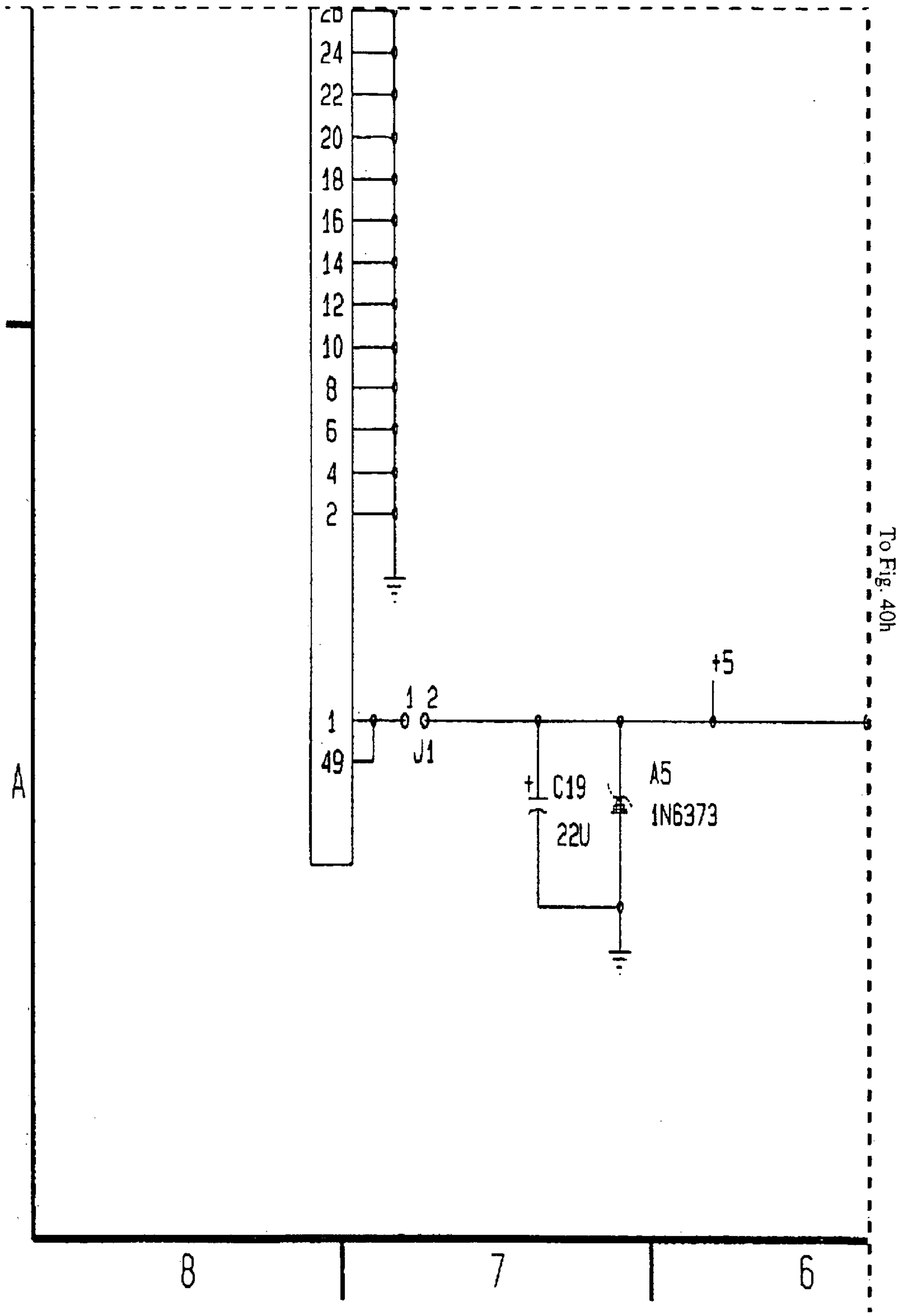
Figure 40H:
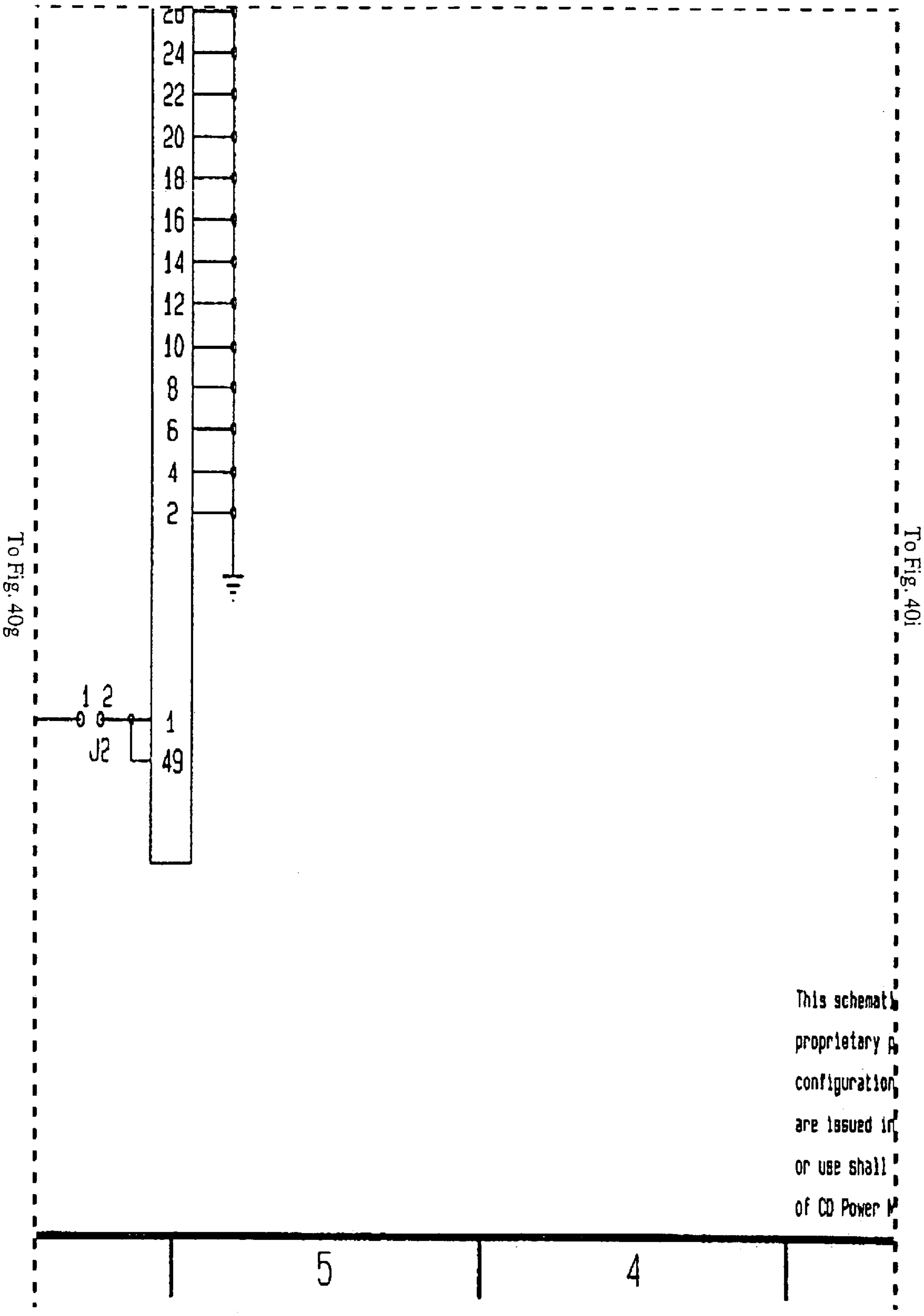
Figure 41A:
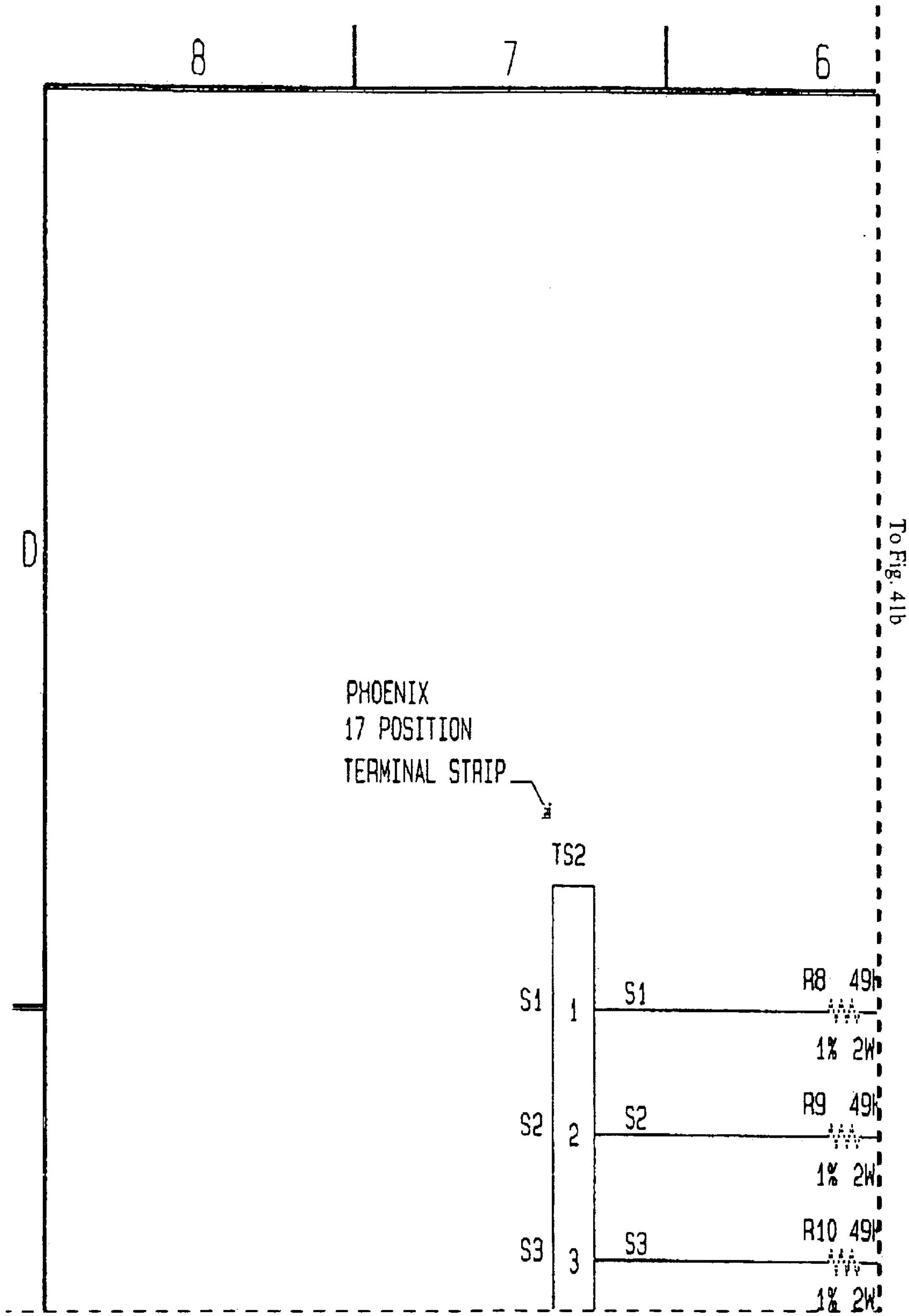
Figure 41B:
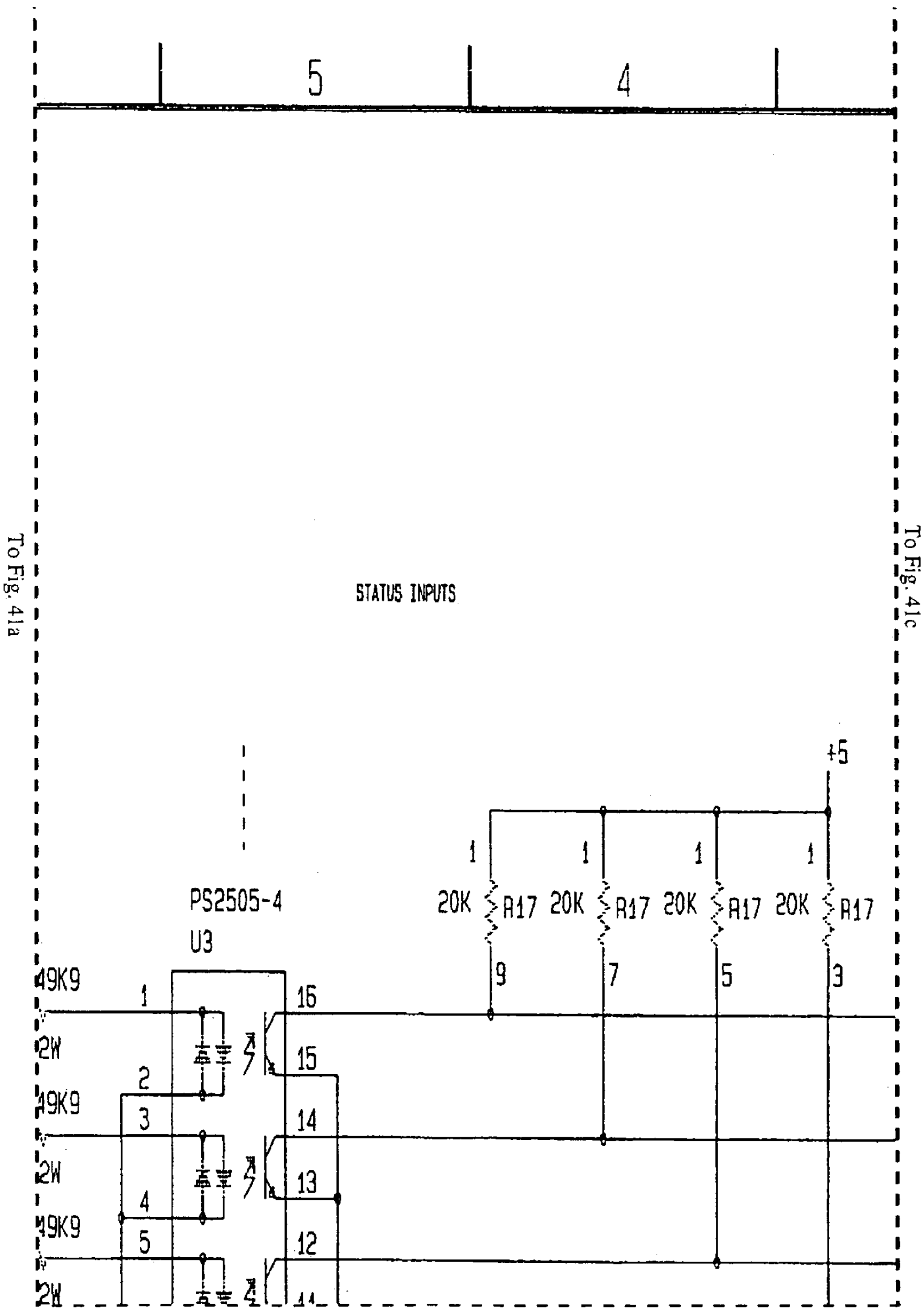
Figure 41C:
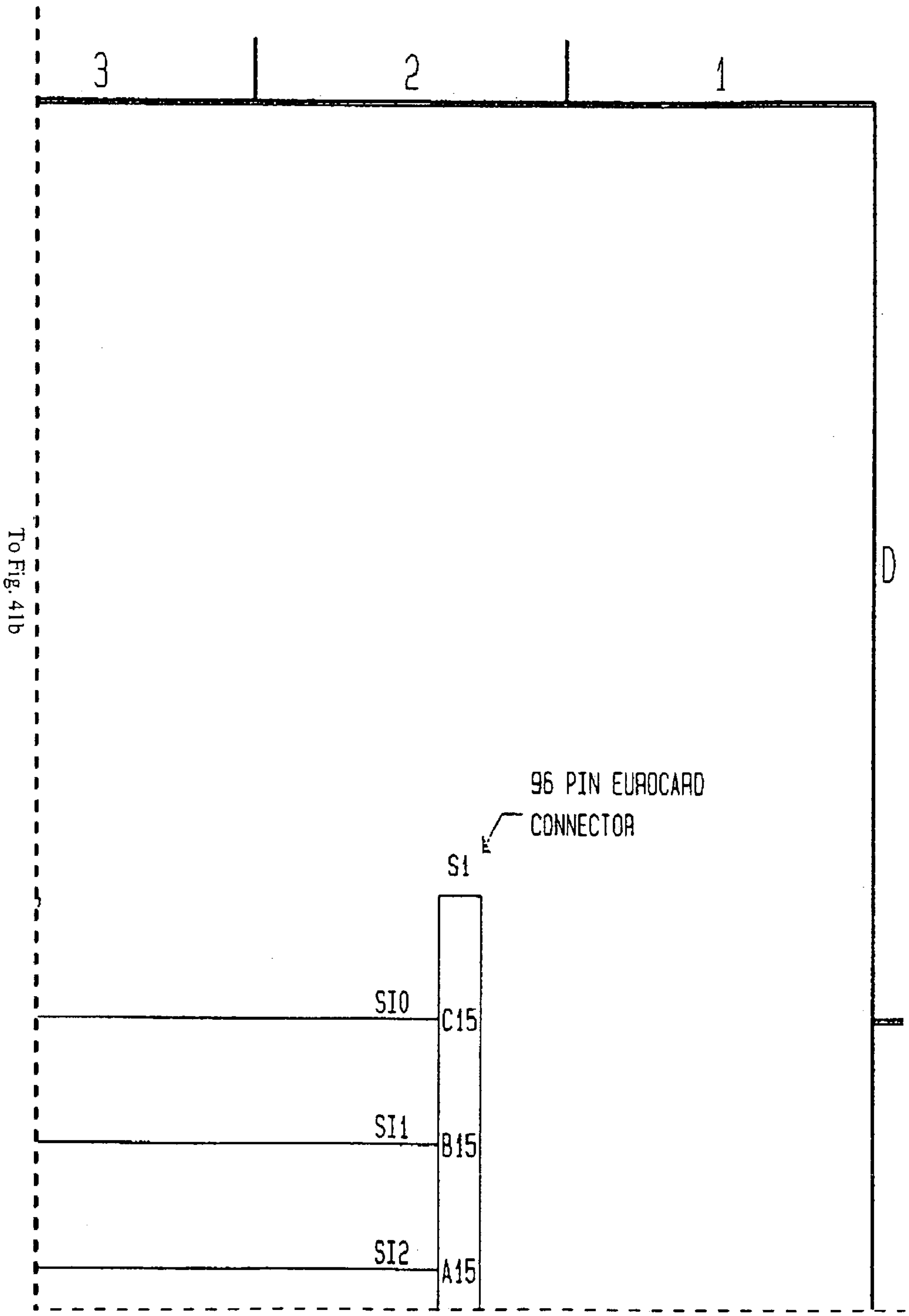
Figure 41D:
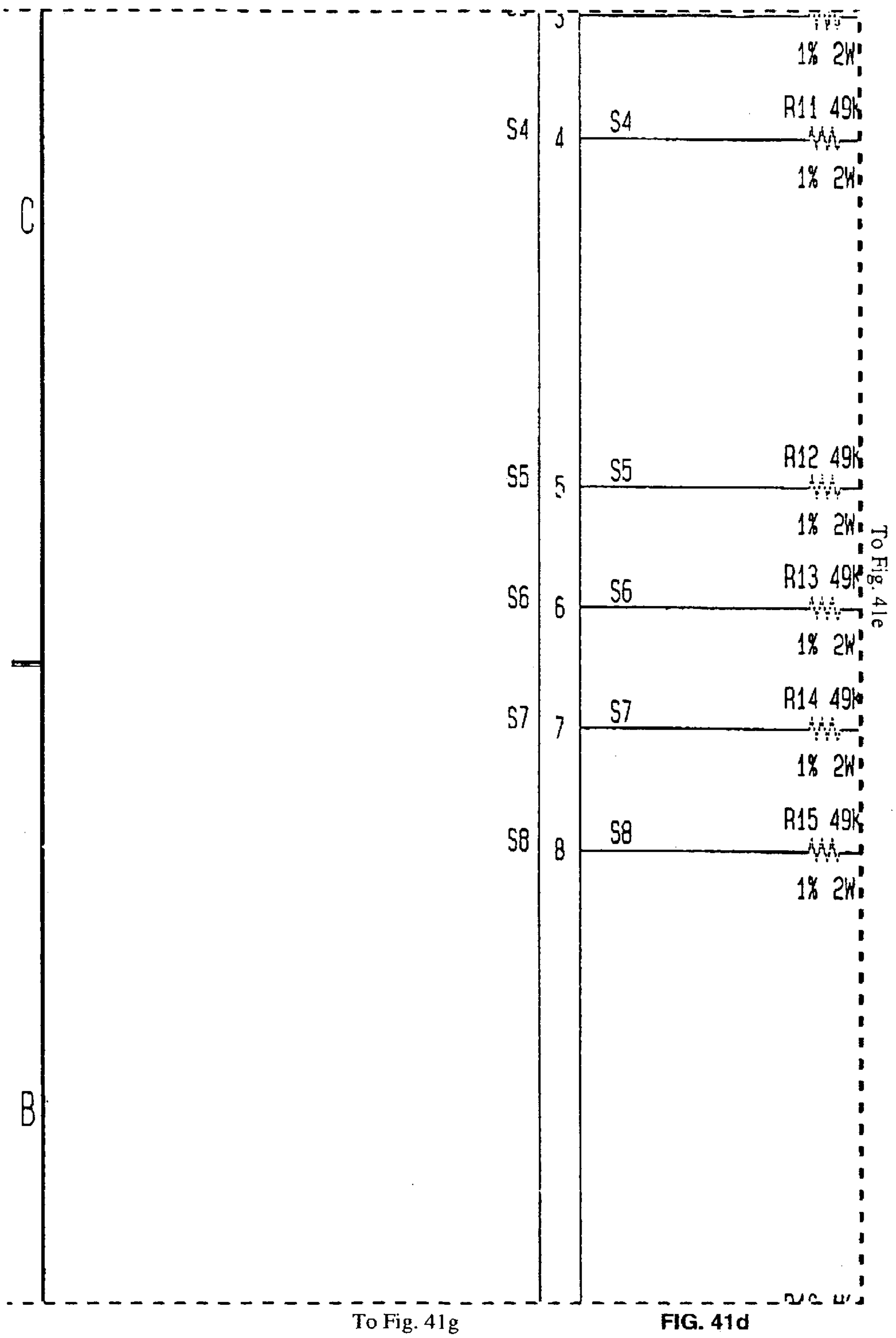
Figure 41:
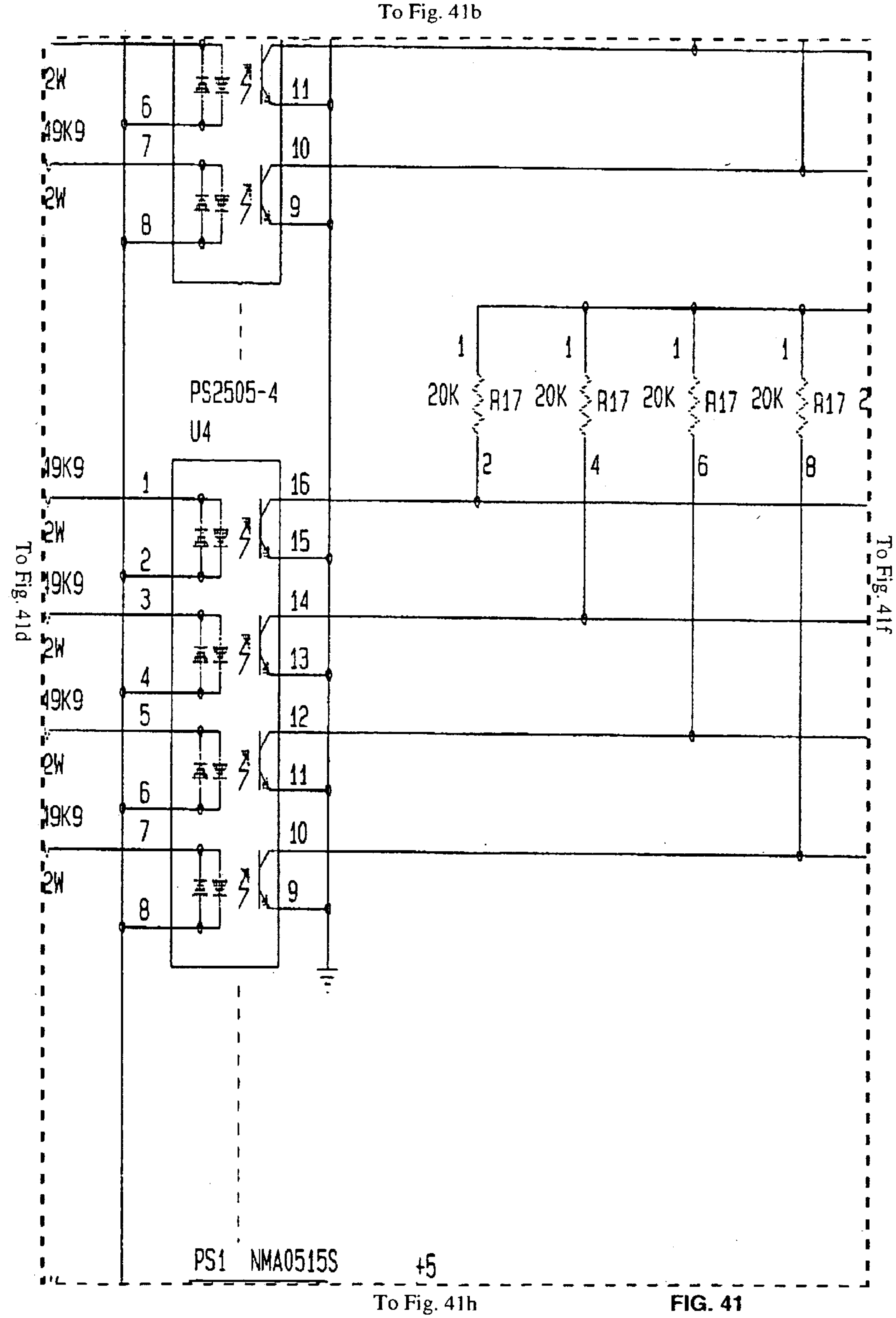
Figure 41F:
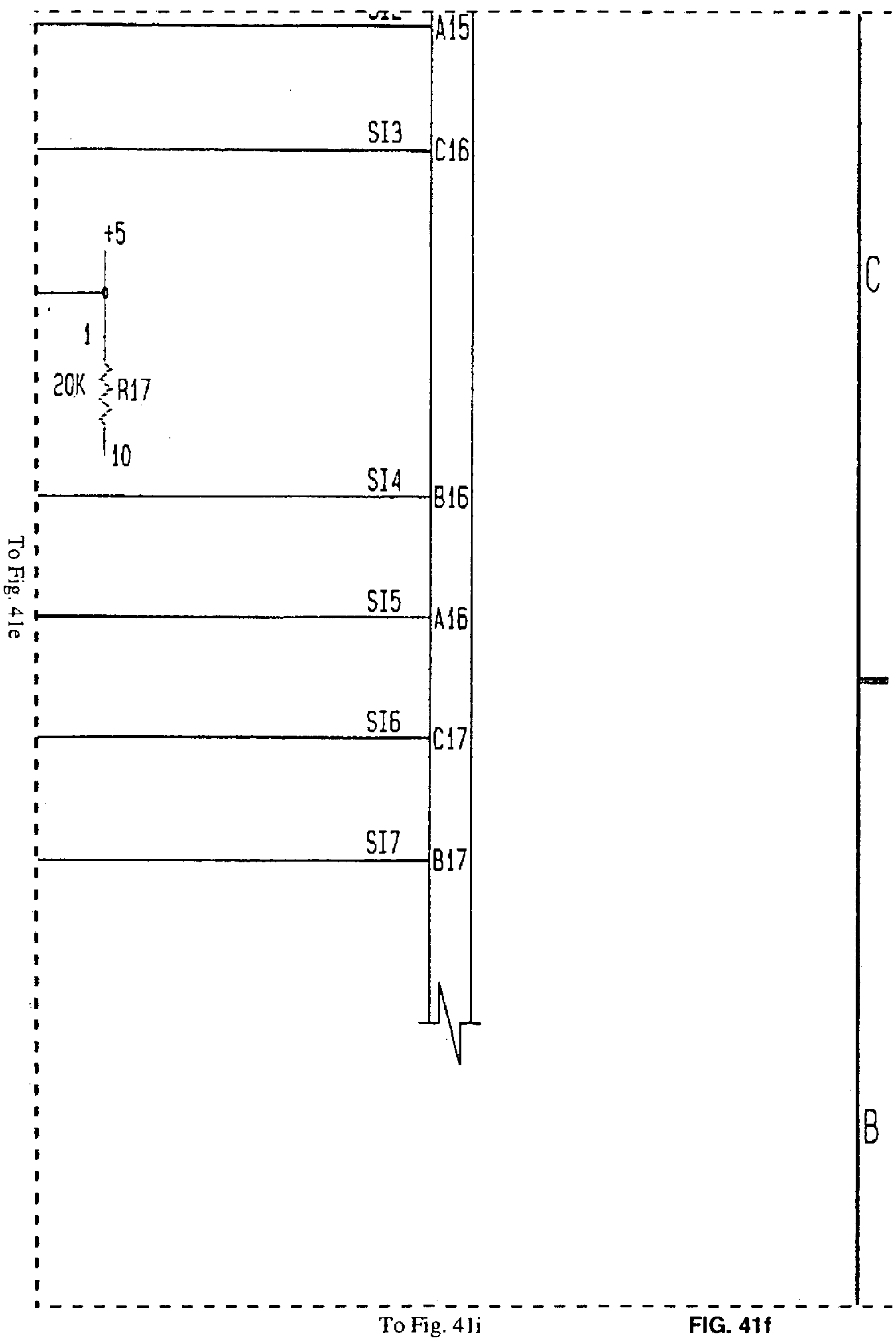
Figure 41G:
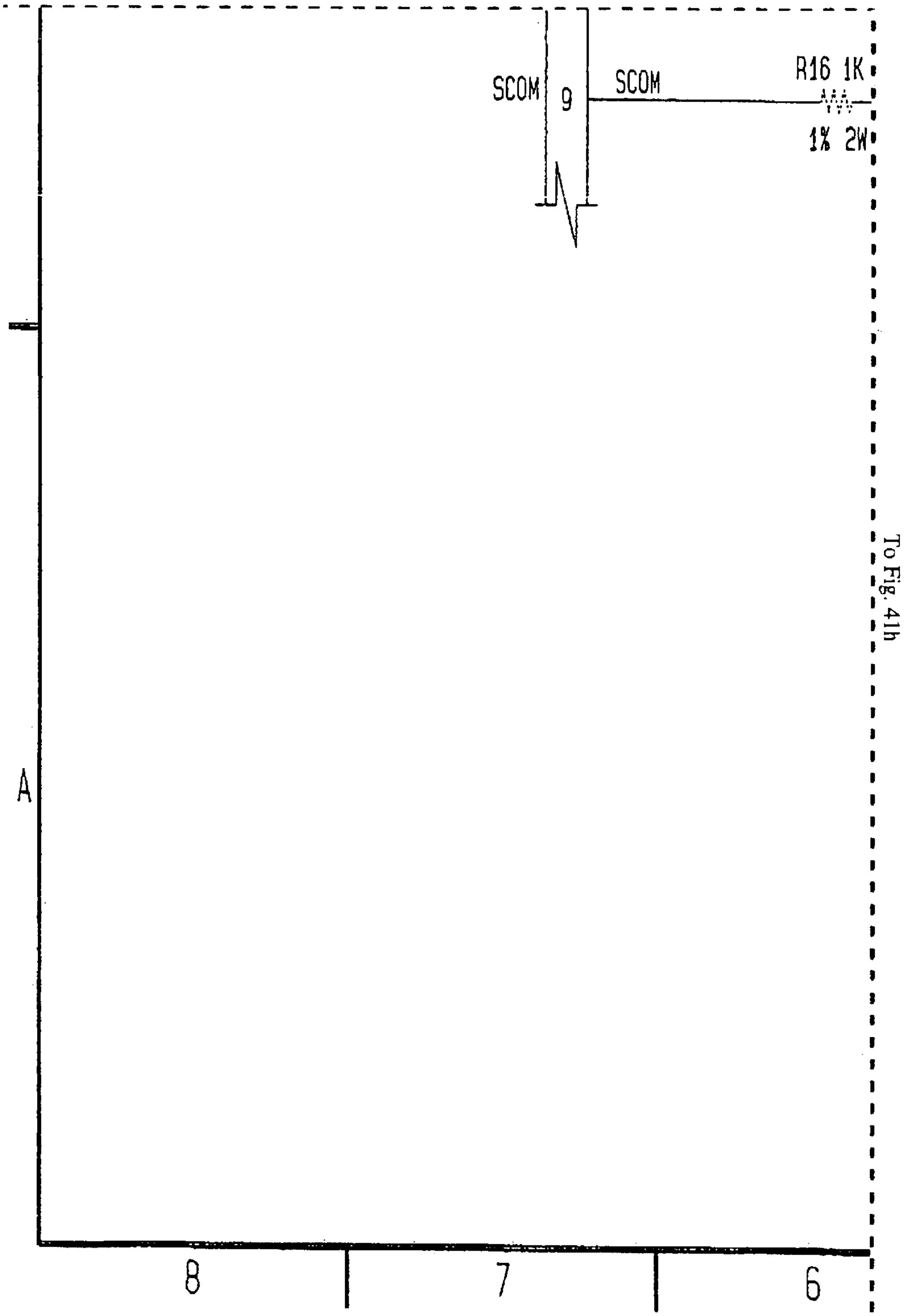
Figure 41H:
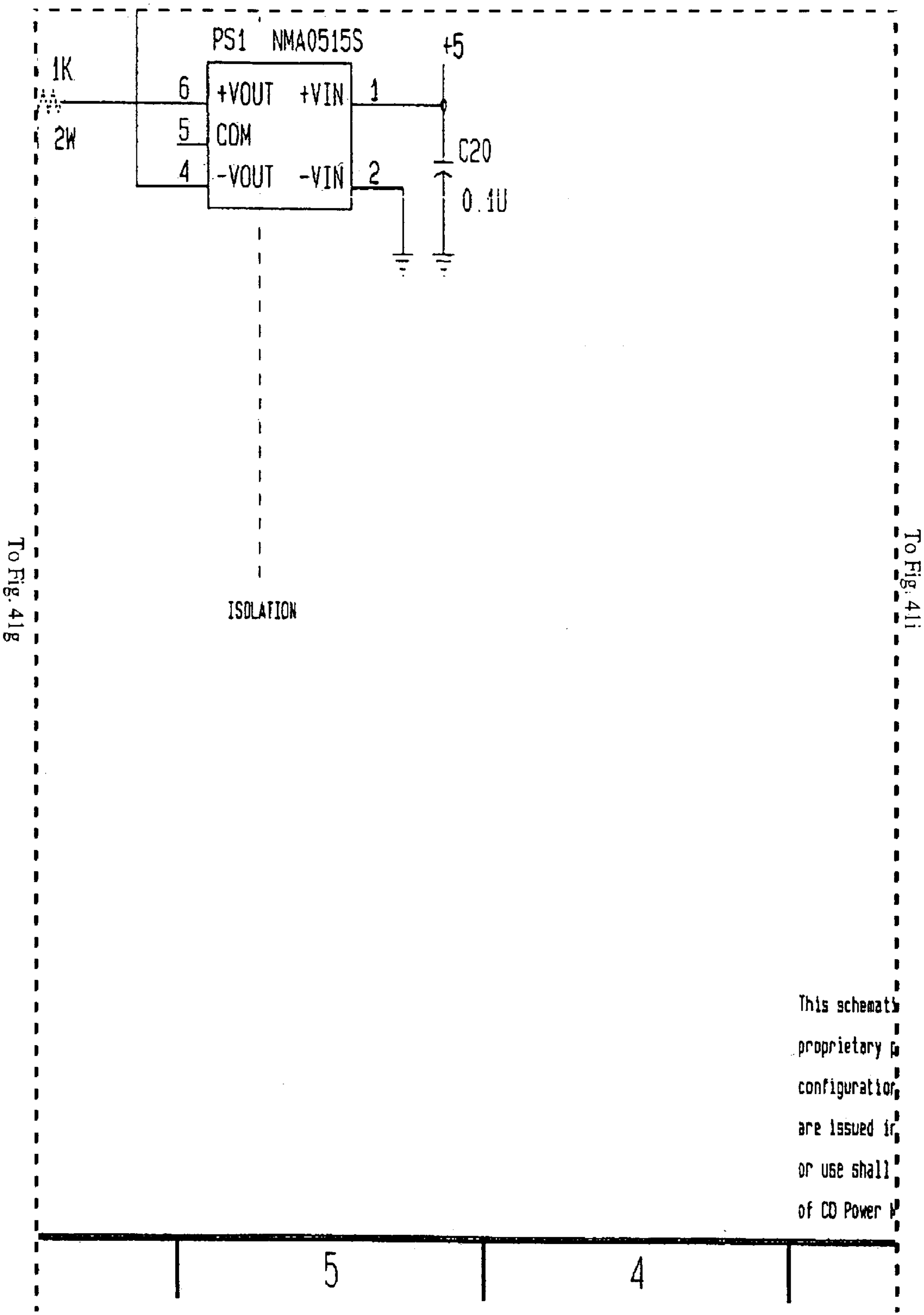
Figure 42A:
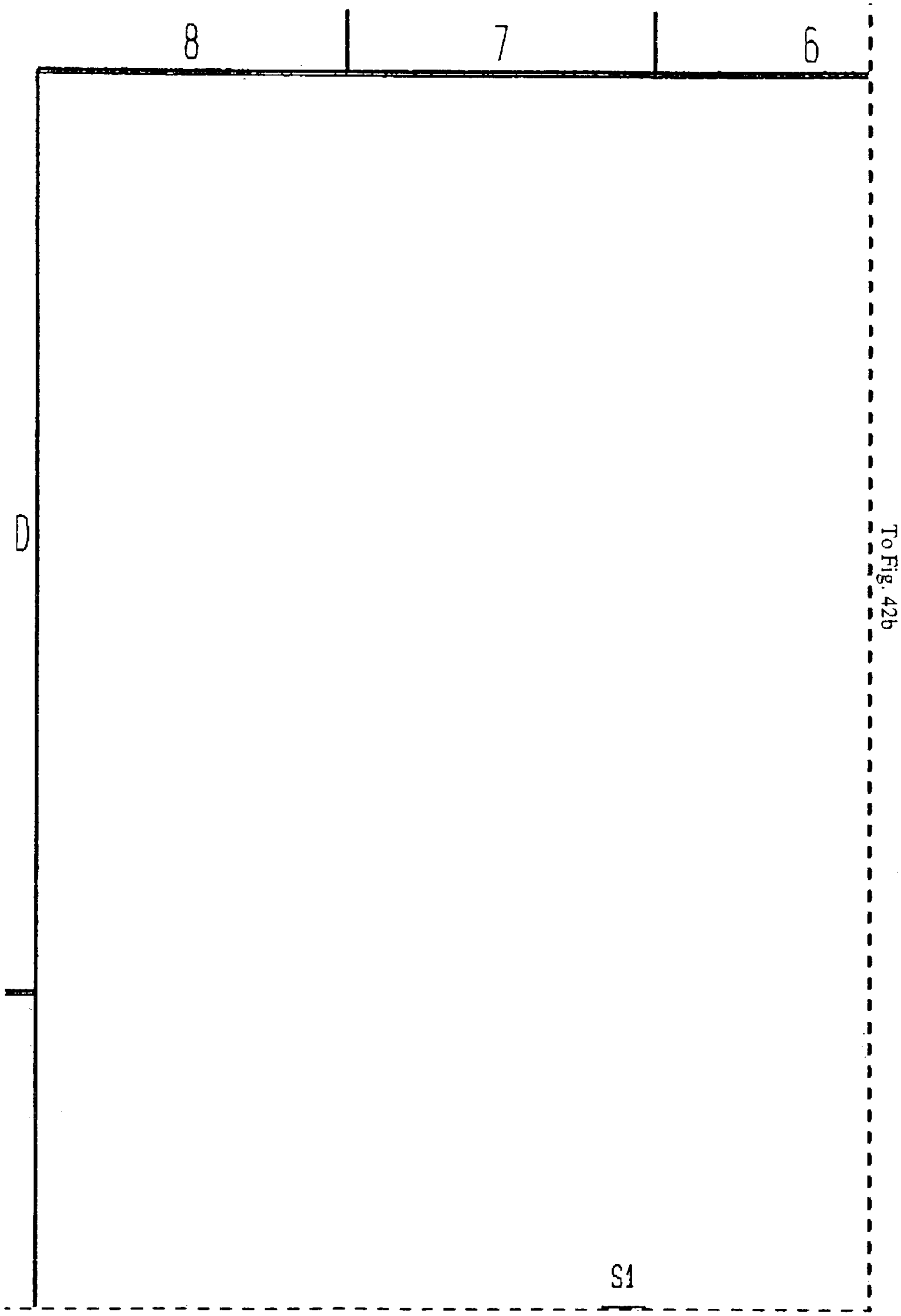
Figure 42B:
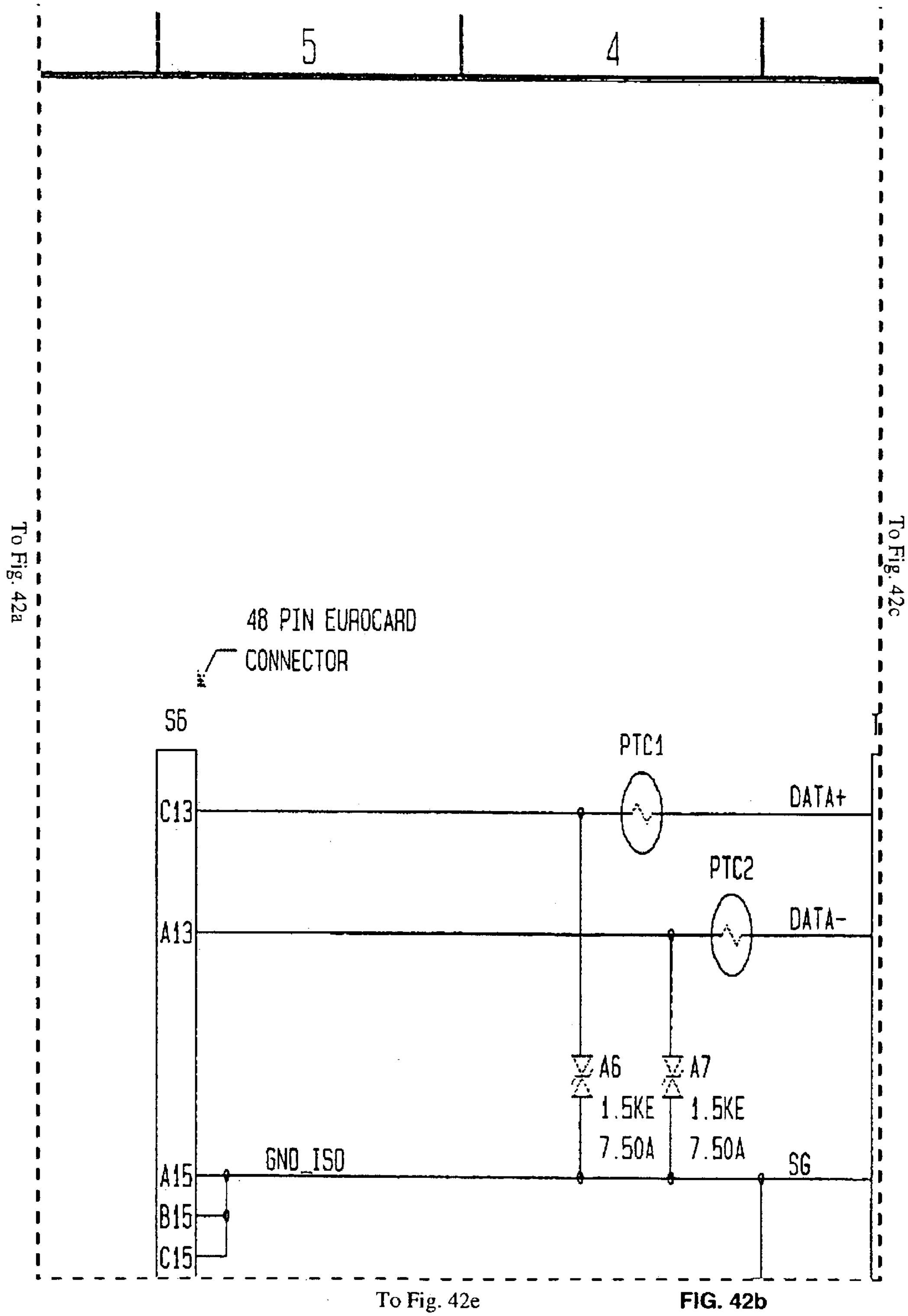
Figure 42C:
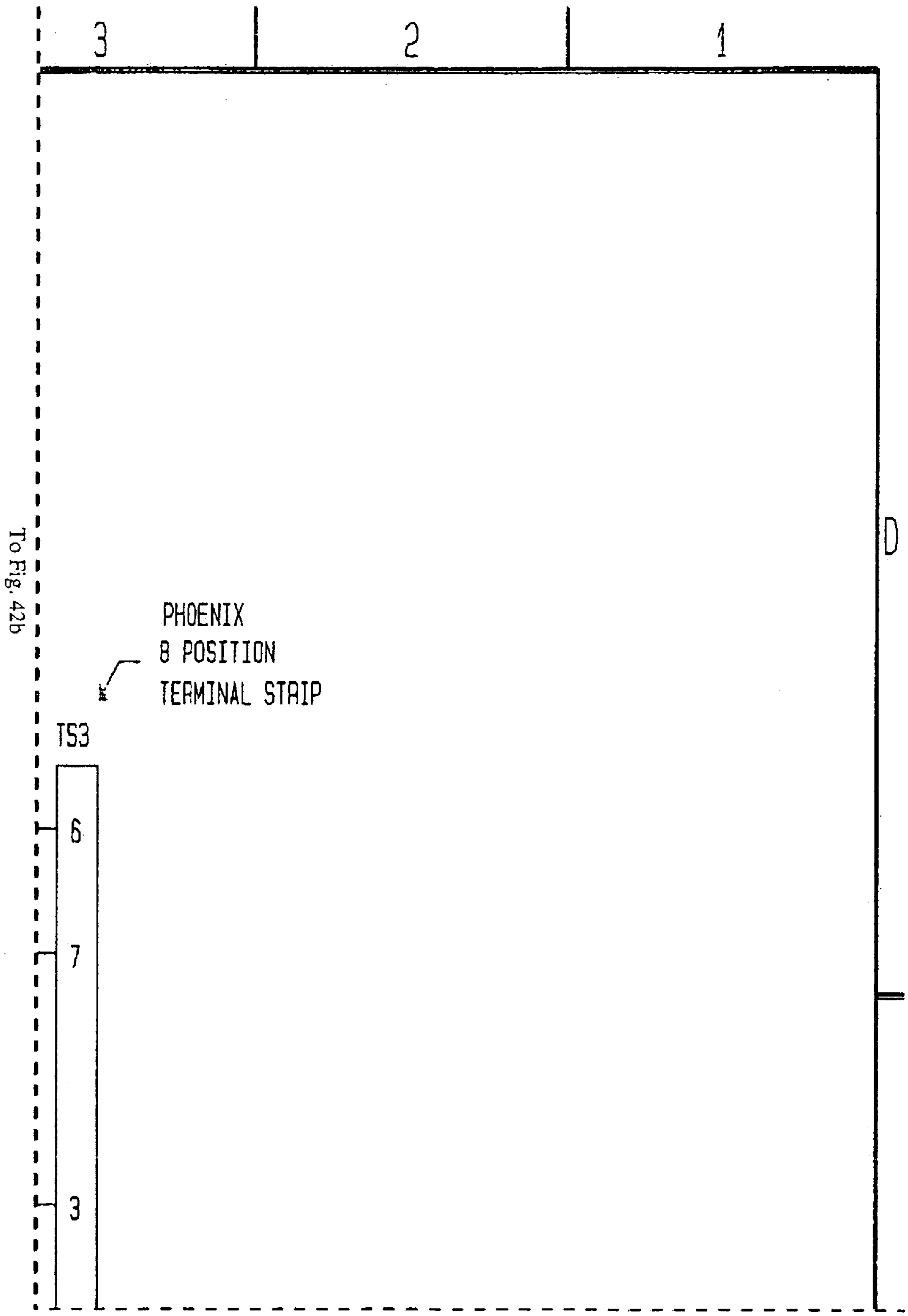
Figure 42D:
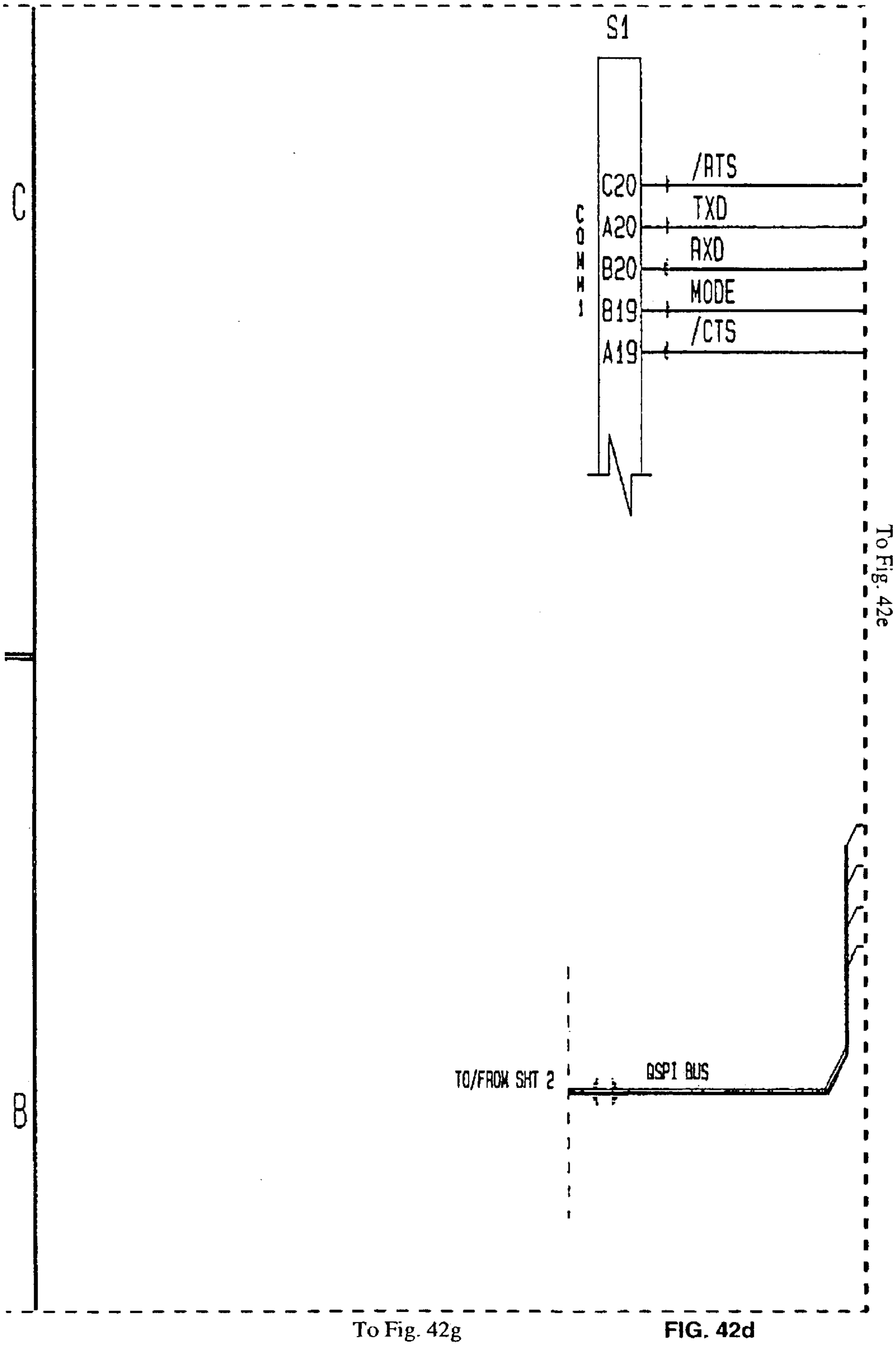
Figure 42E:
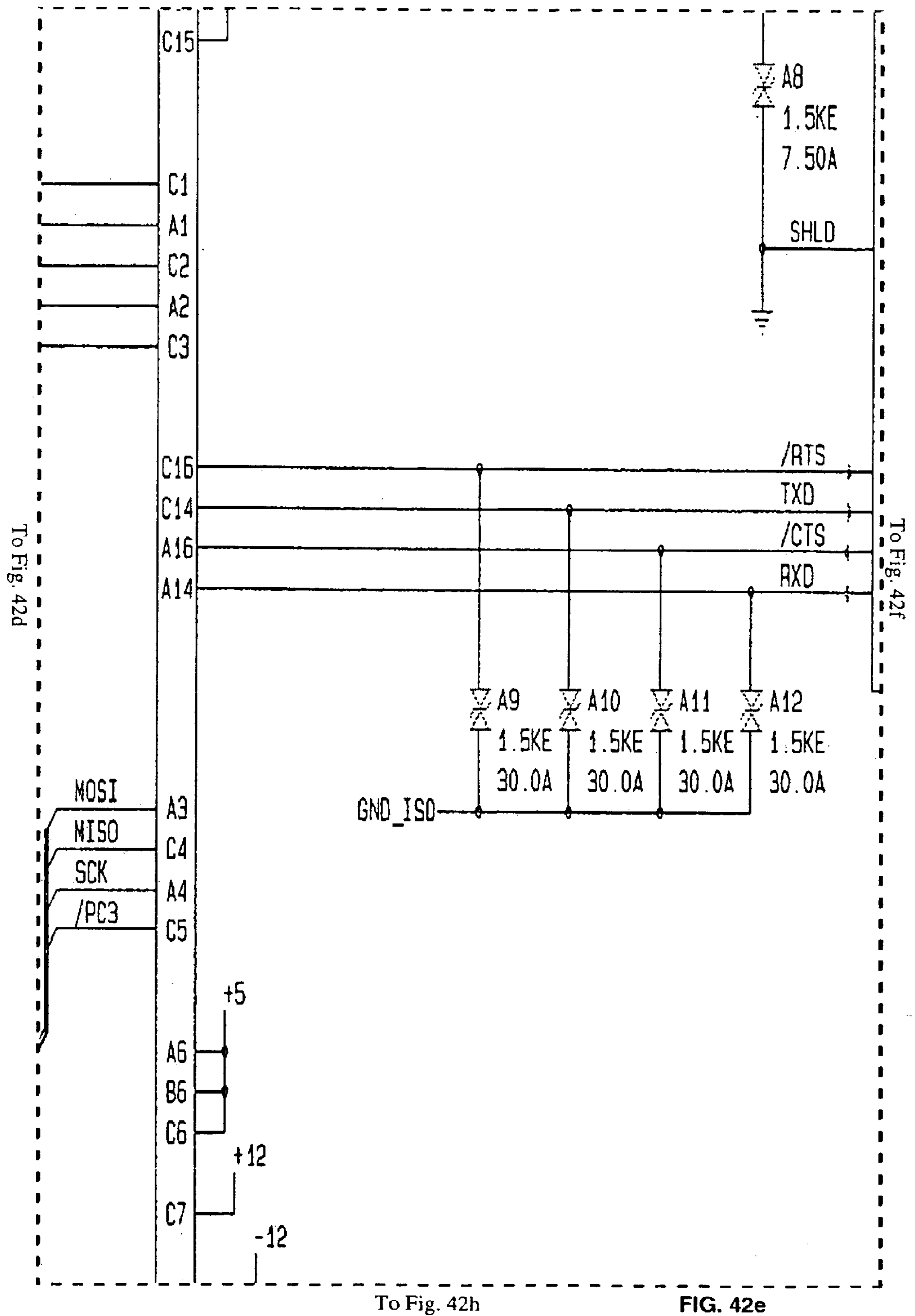
Figure 42F:
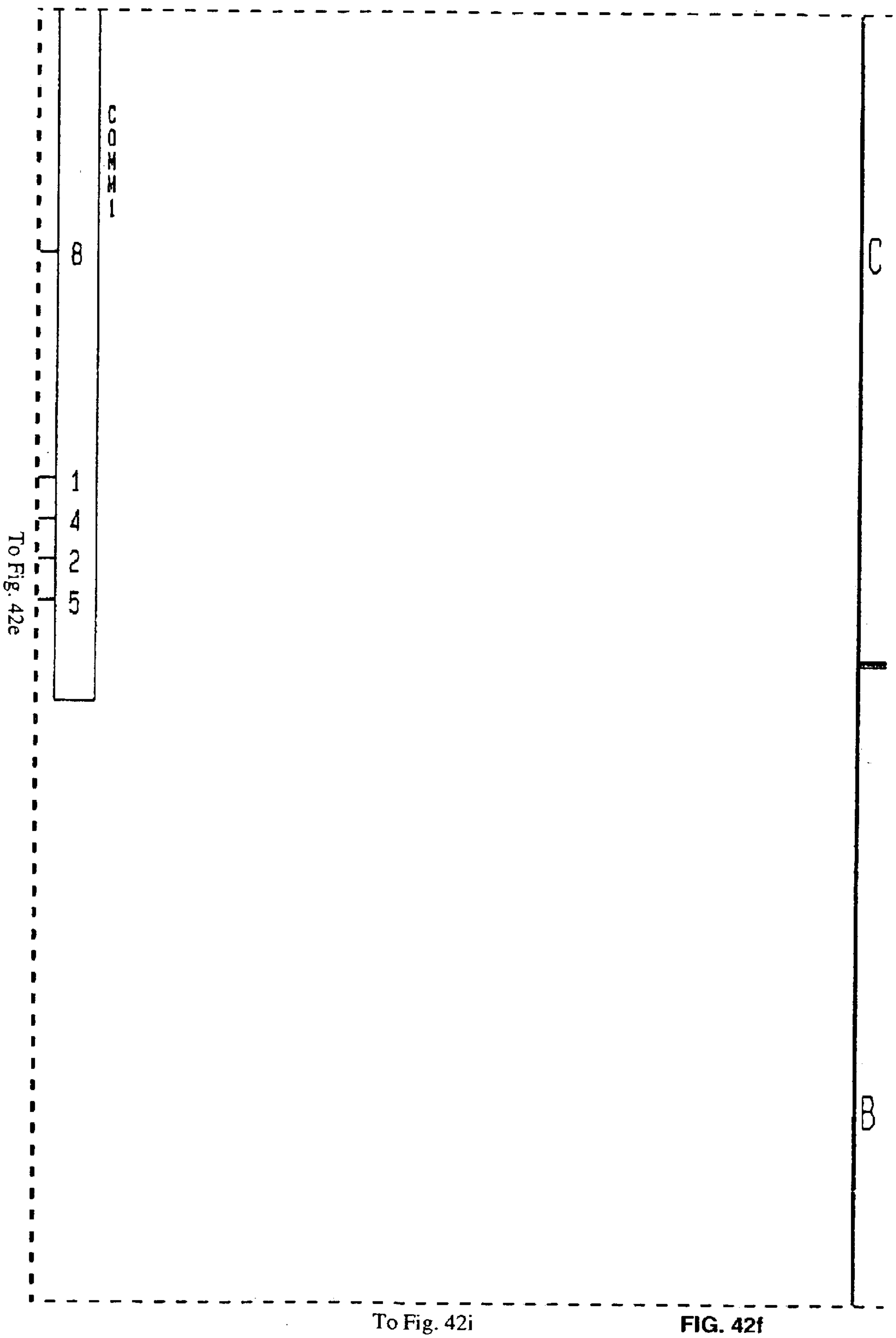
Figure 42G:
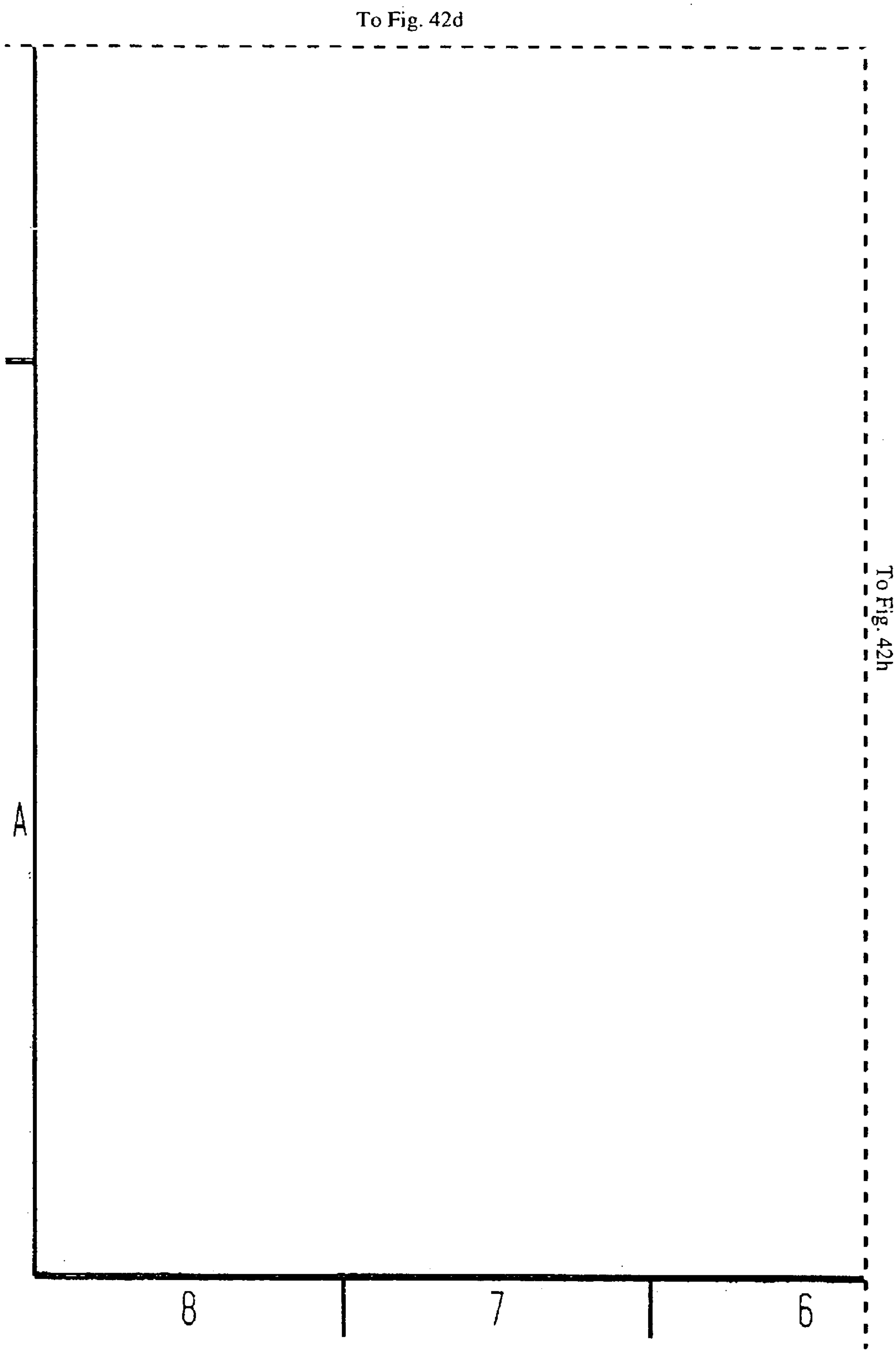
Figure 42H:
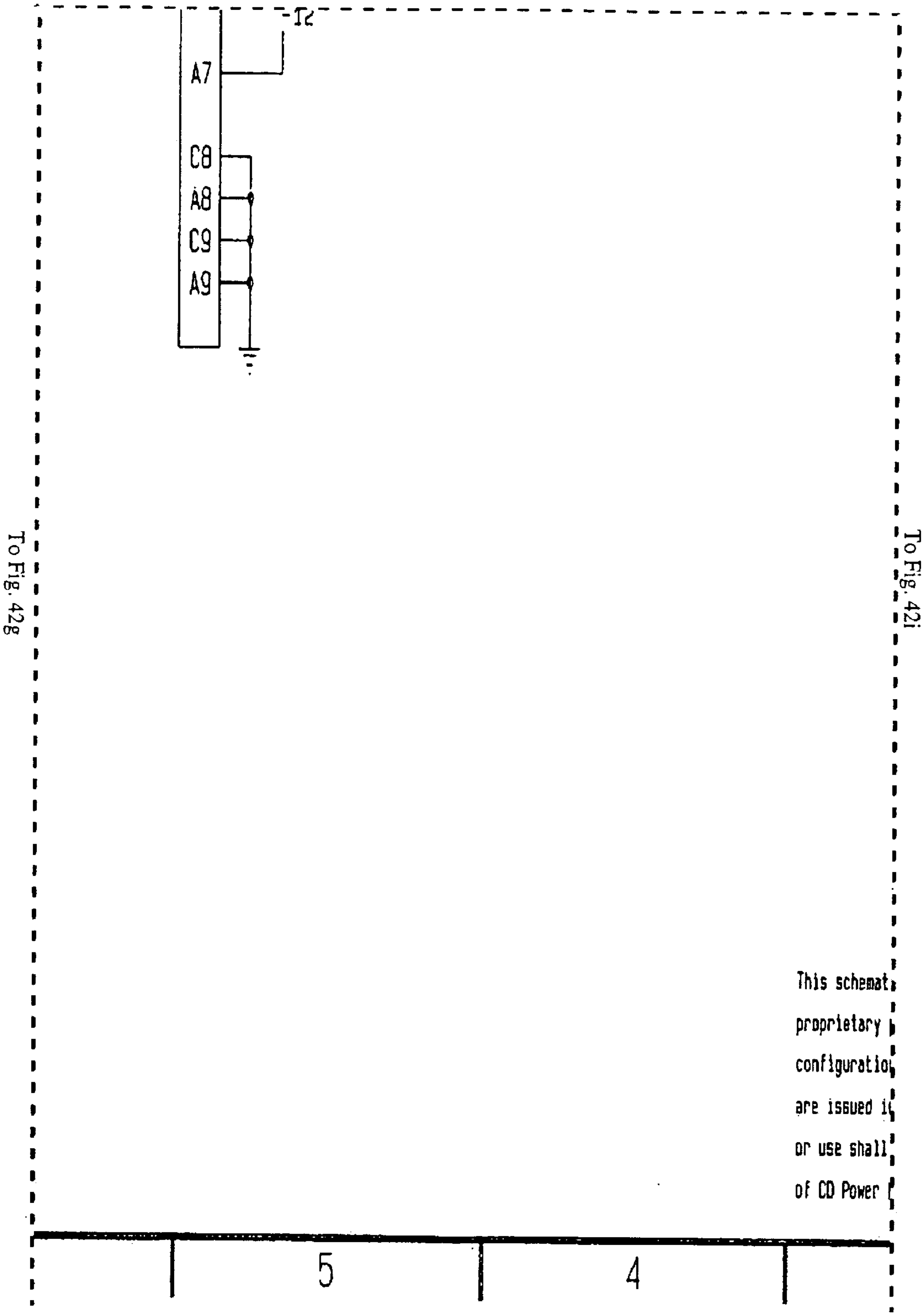
Figure 42I:
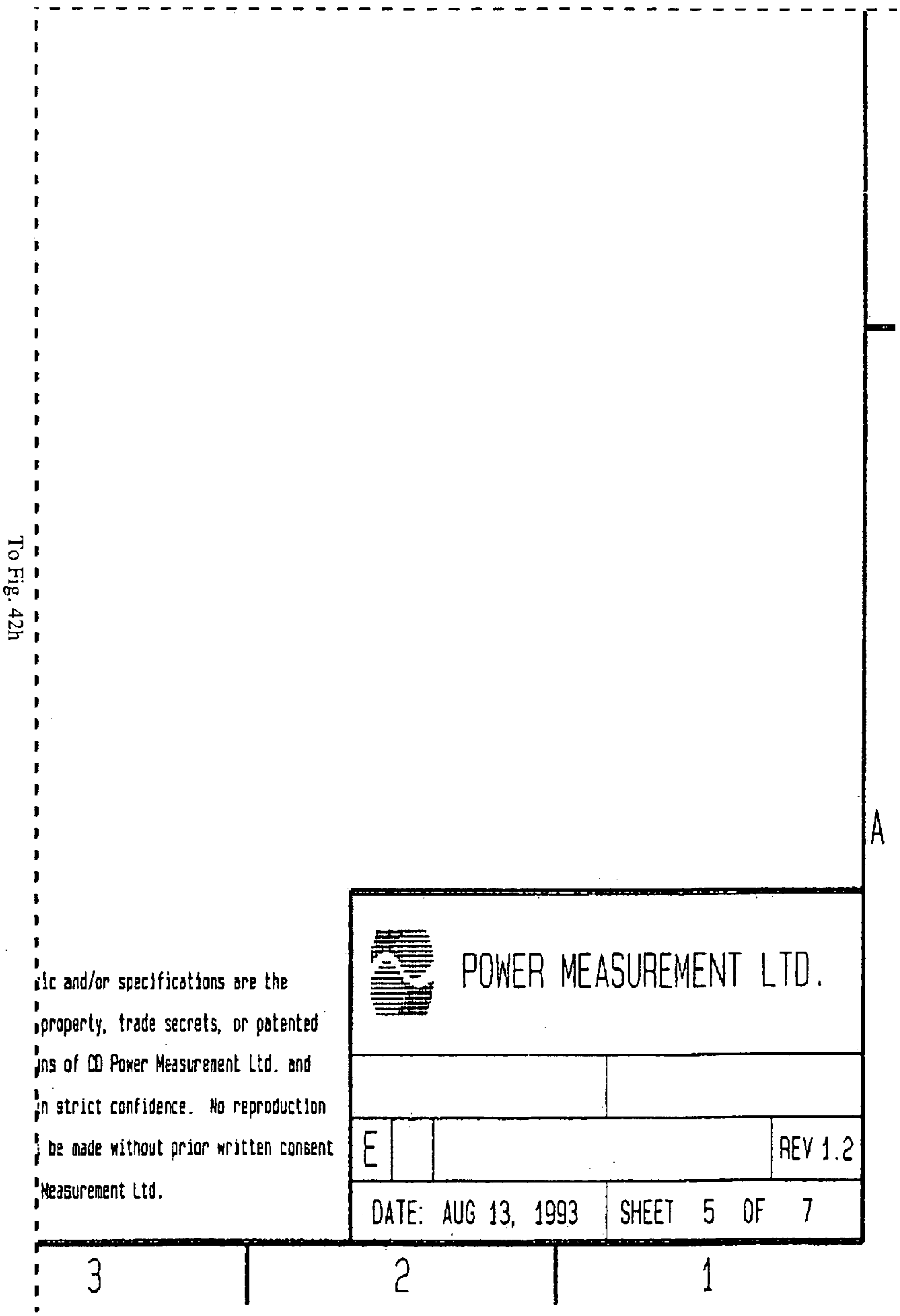
Figure 43A:
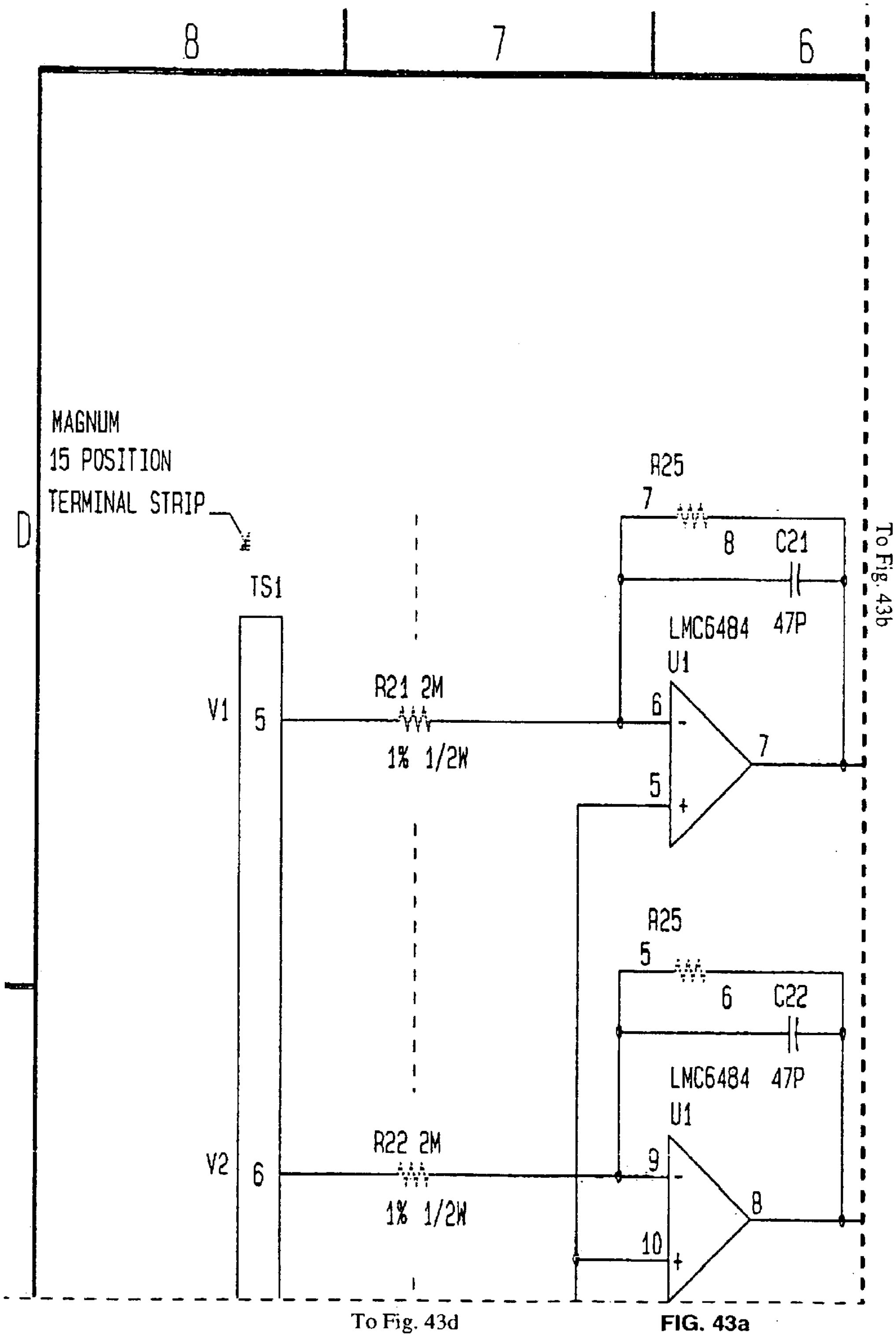
Figure 43B:
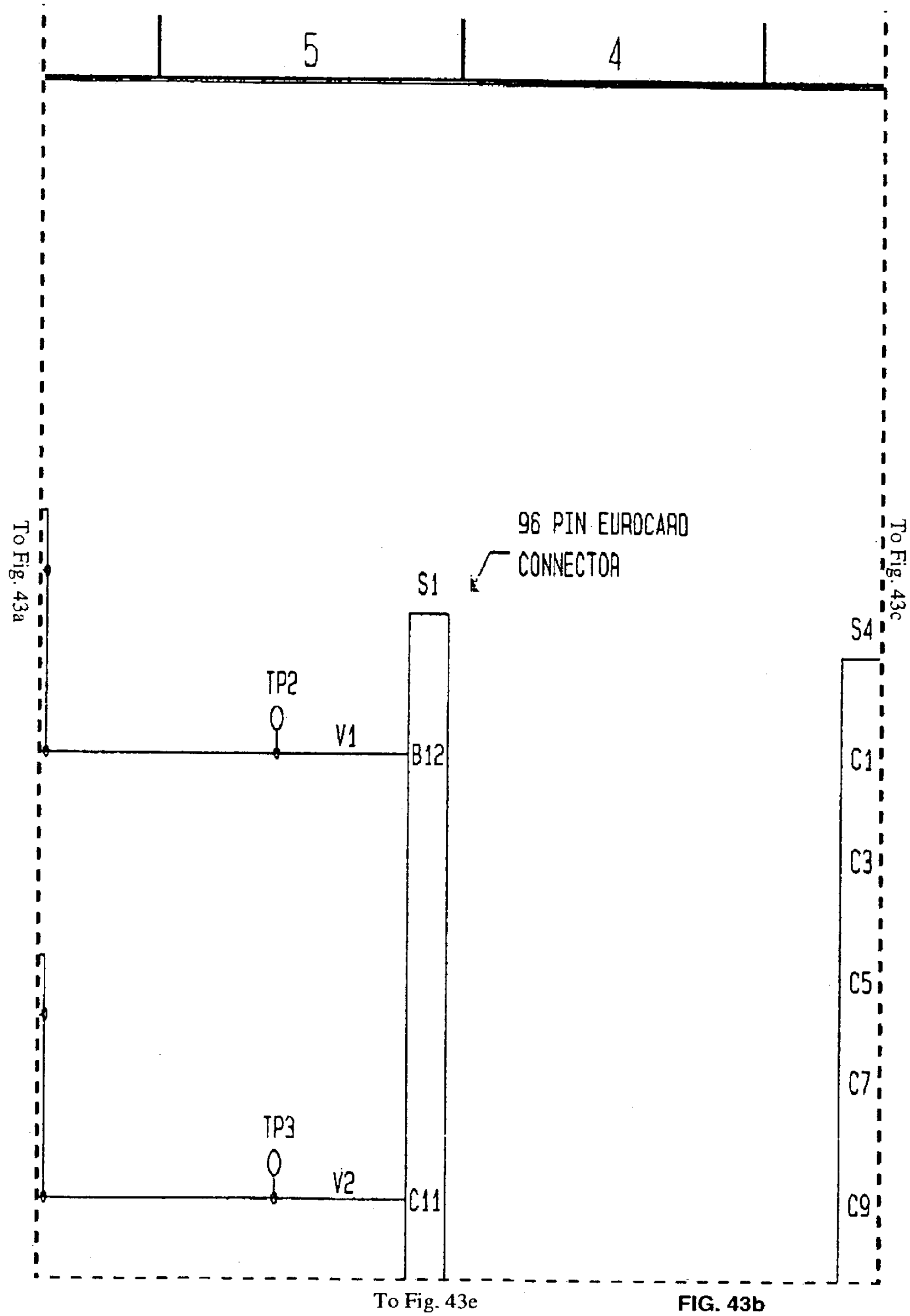
Figure 43C:
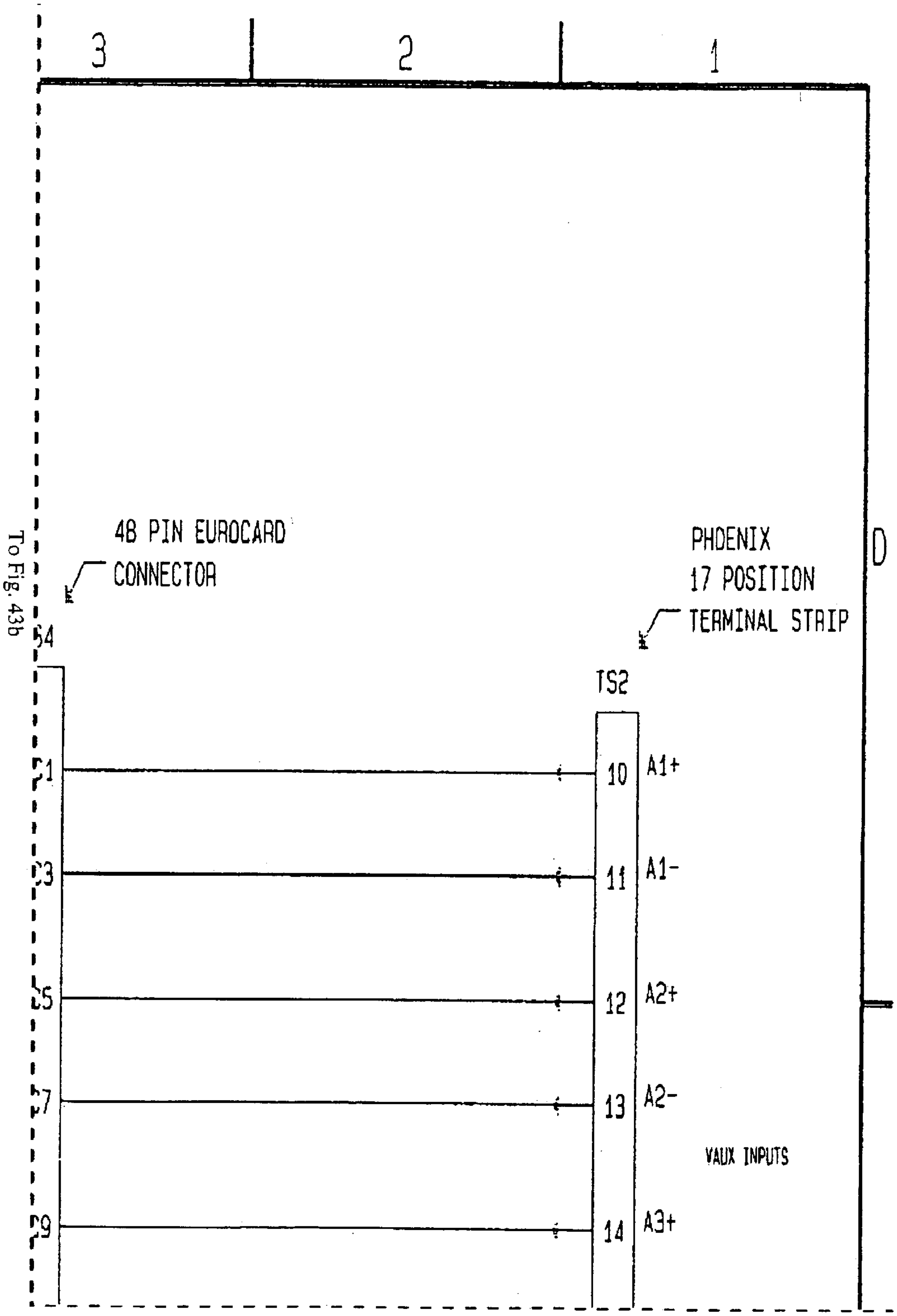
Figure 43D:
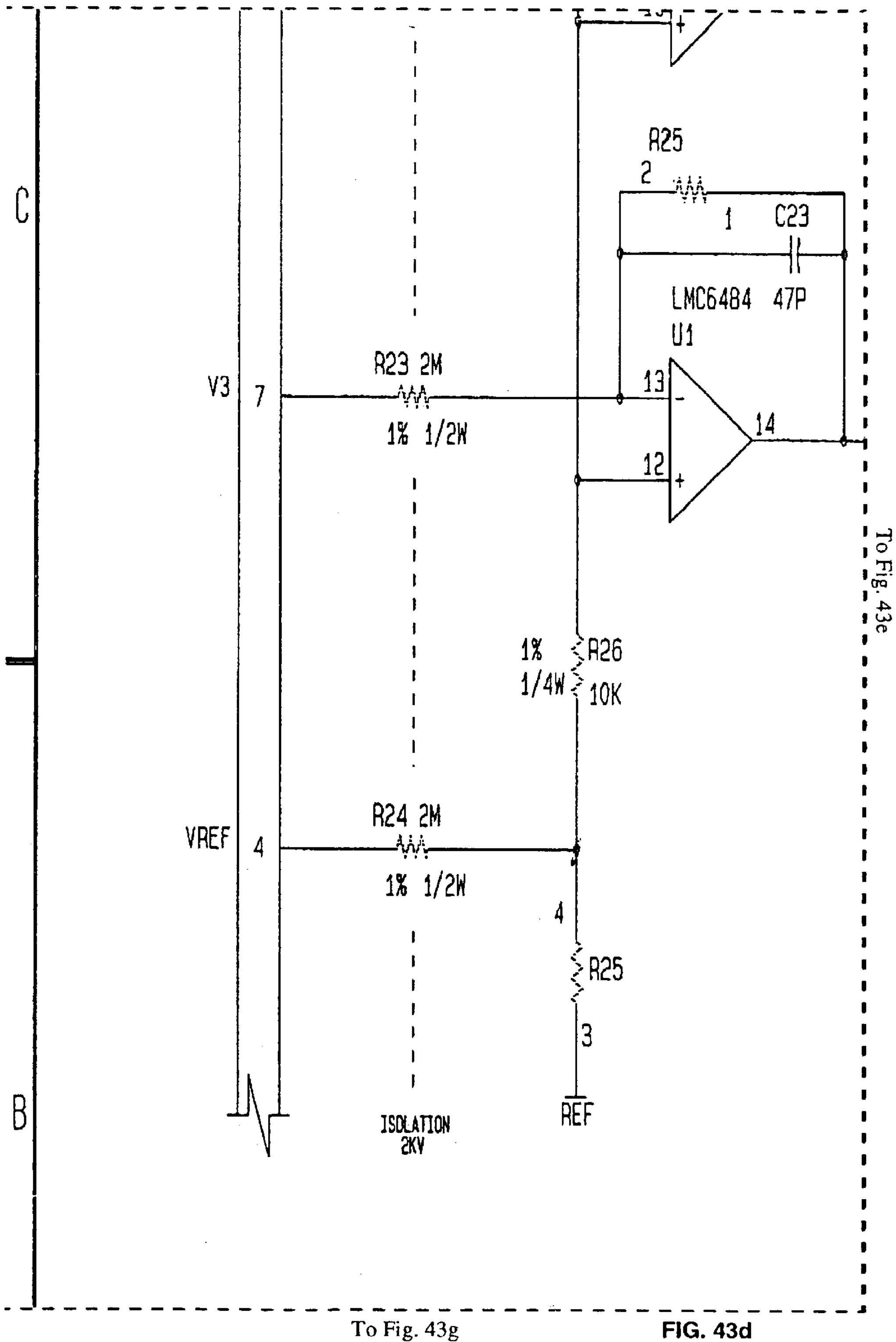
Figure 43:
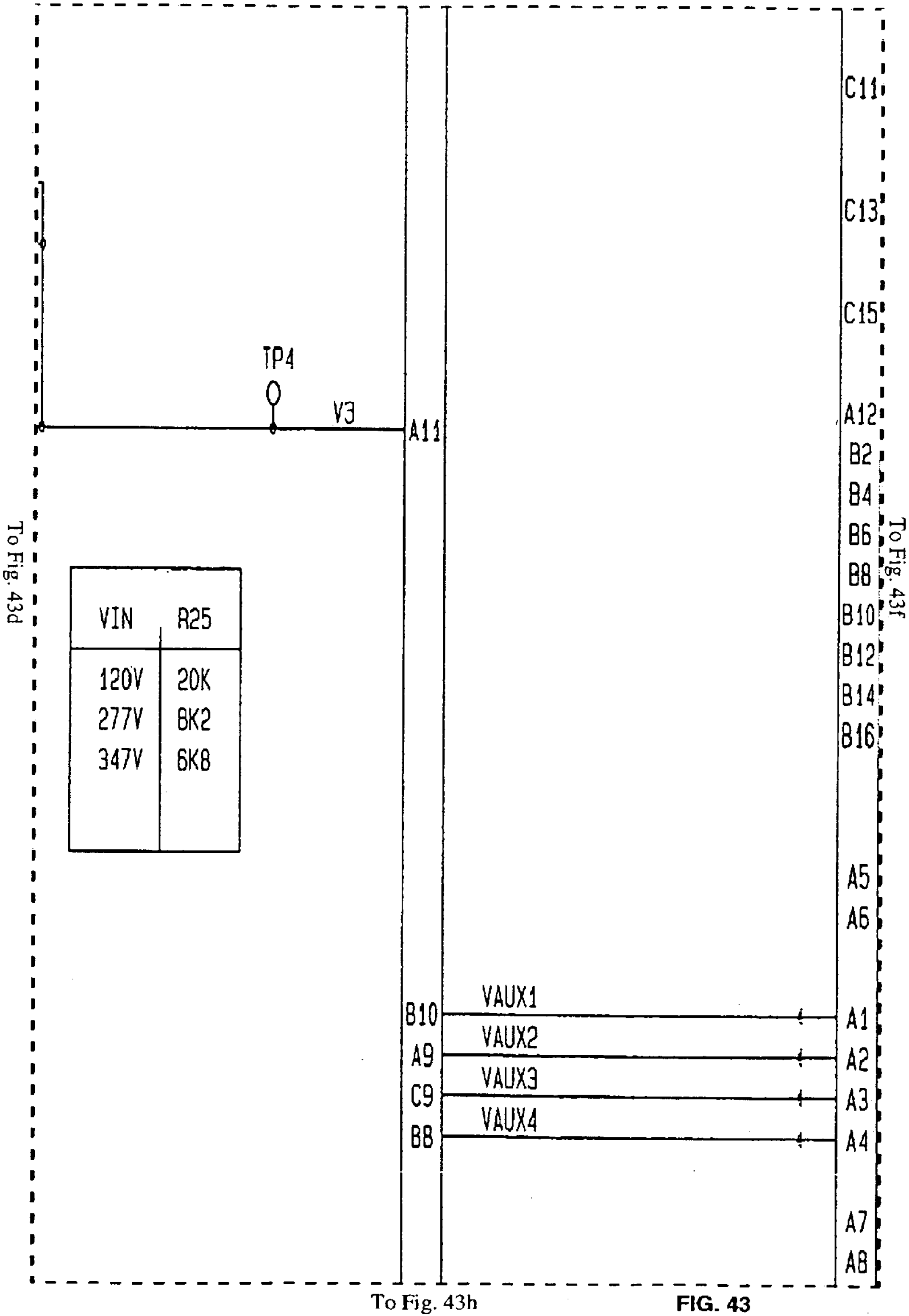
Figure 43F:
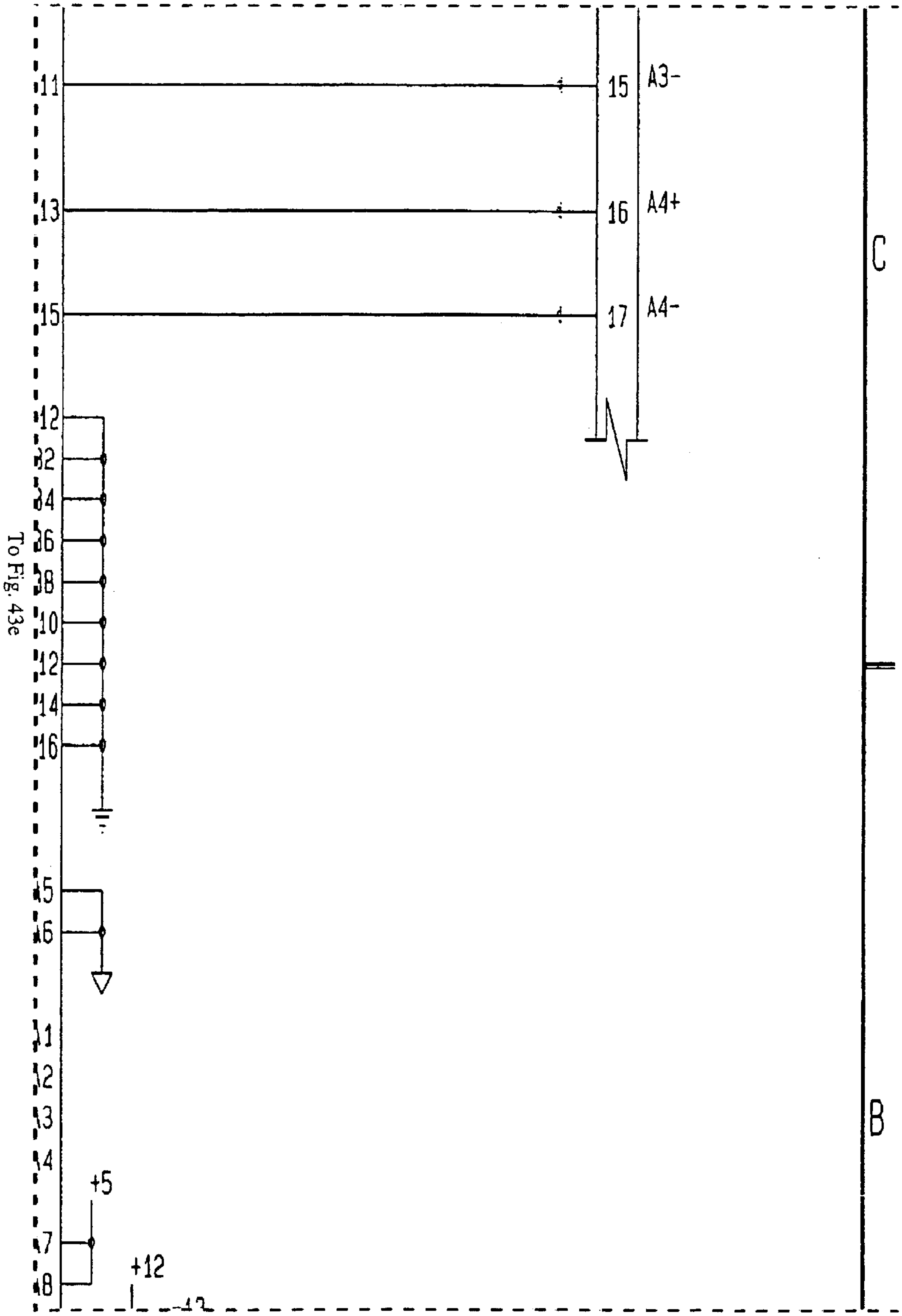
Figure 43G:
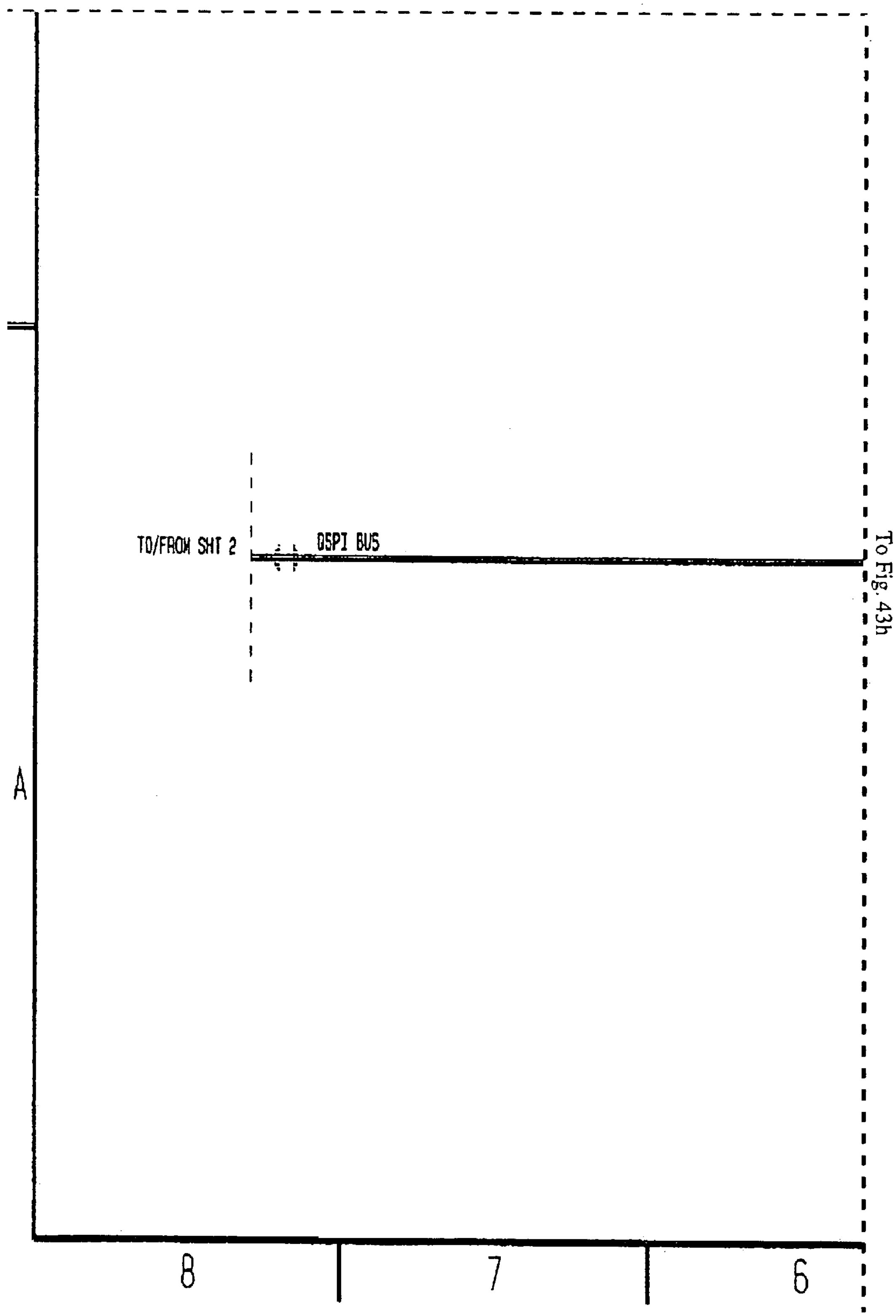
Figure 43H:
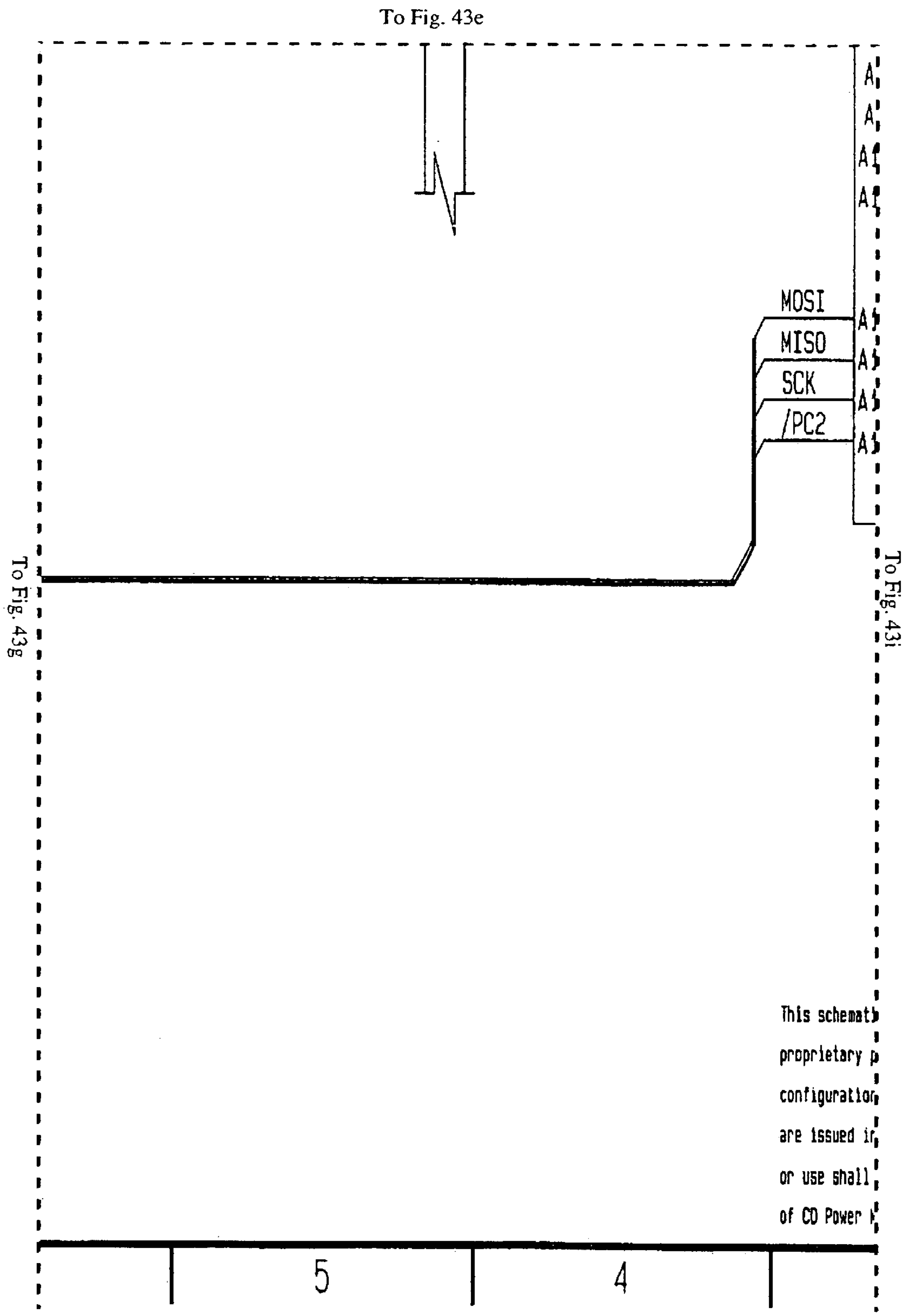
Figure 43I:
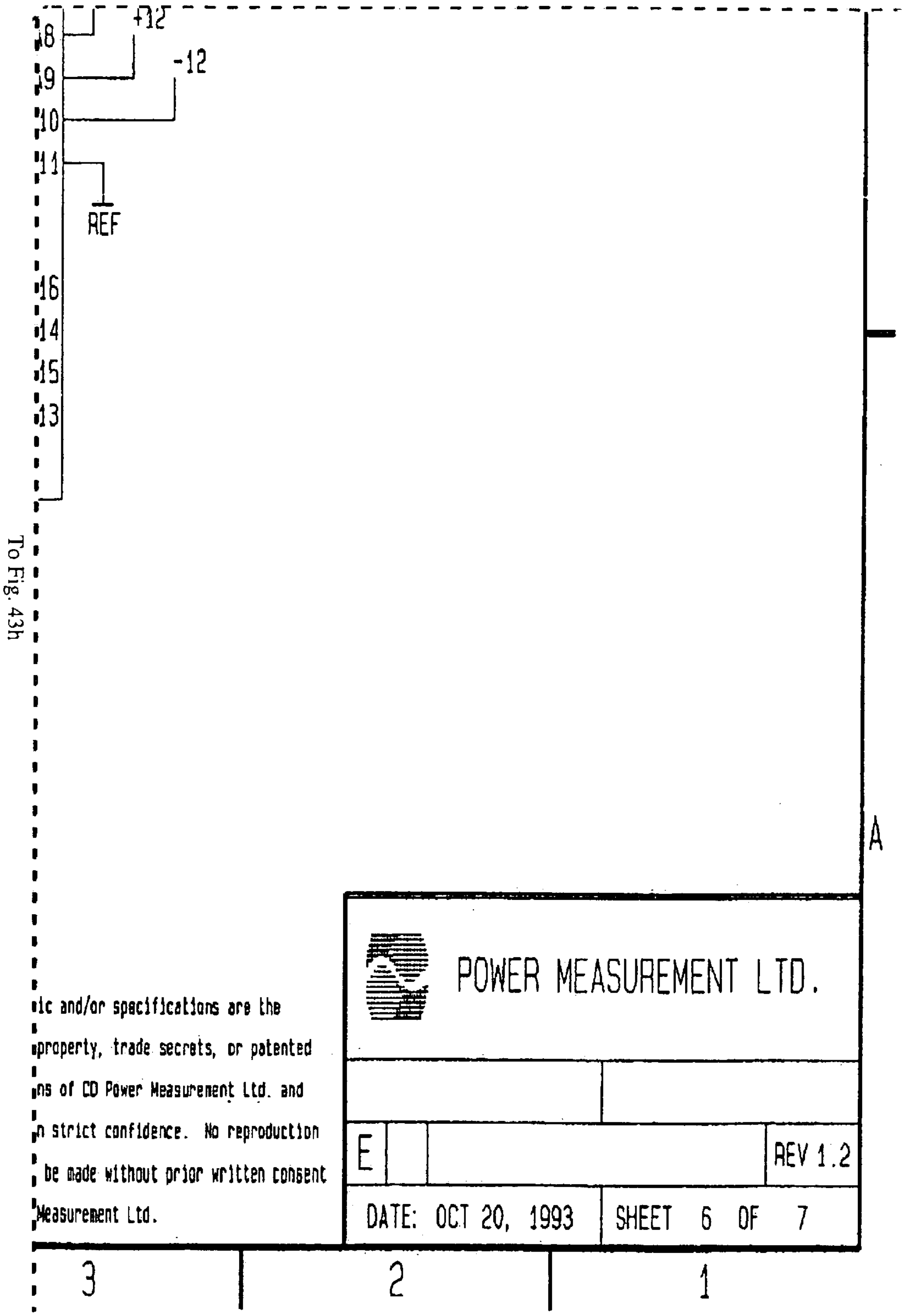
Figure 44A:
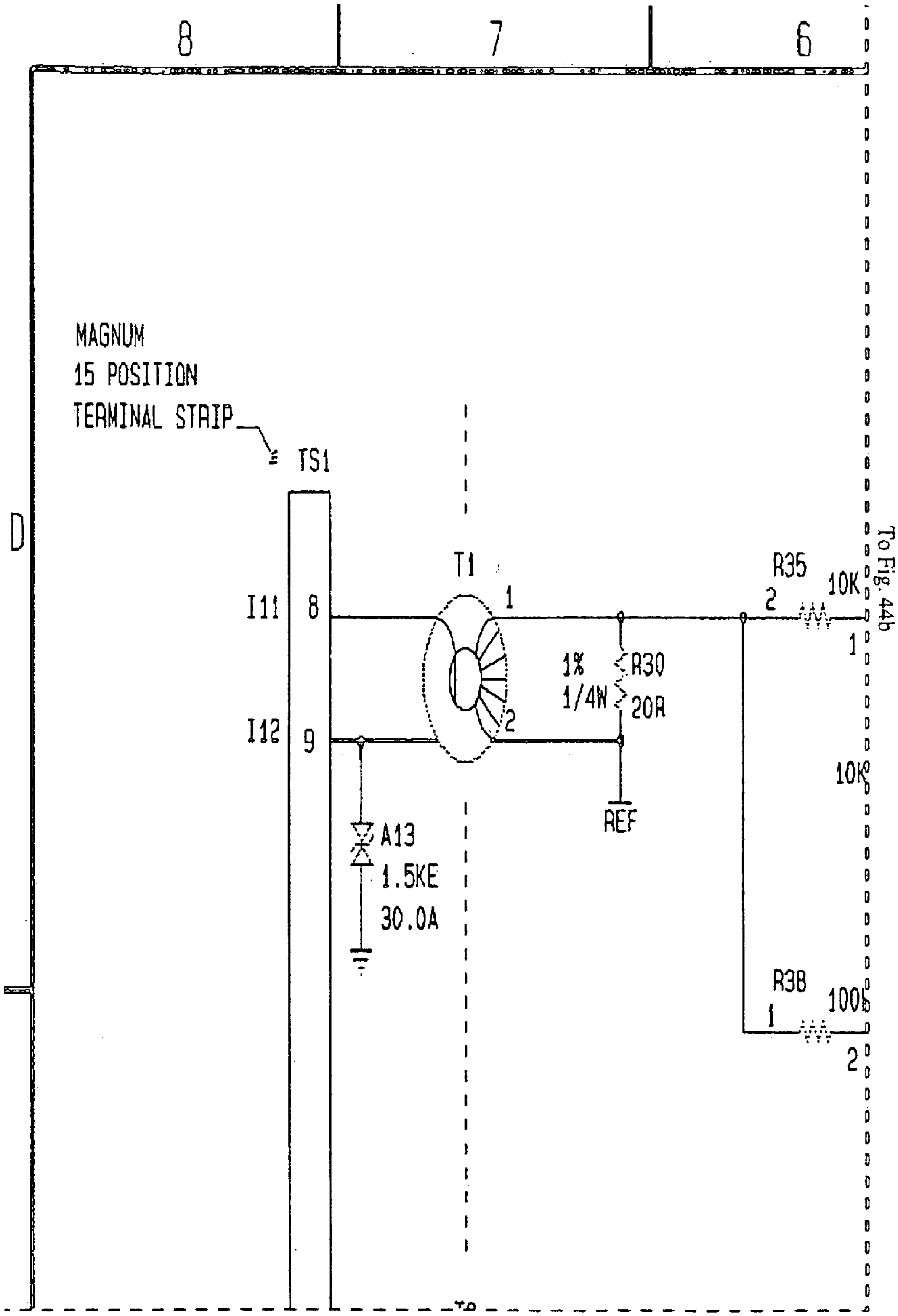
Figure 44B:
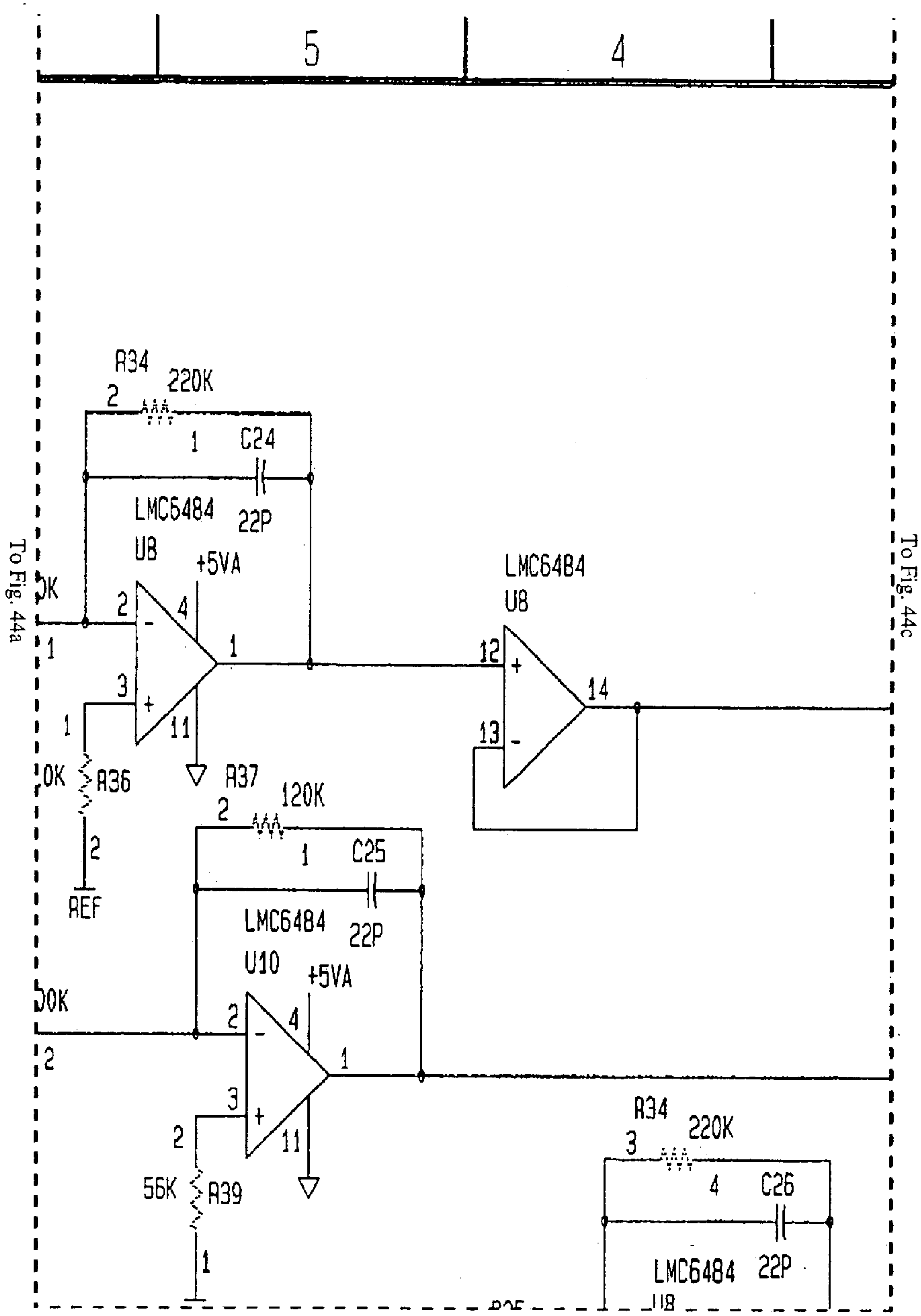
Figure 44C:
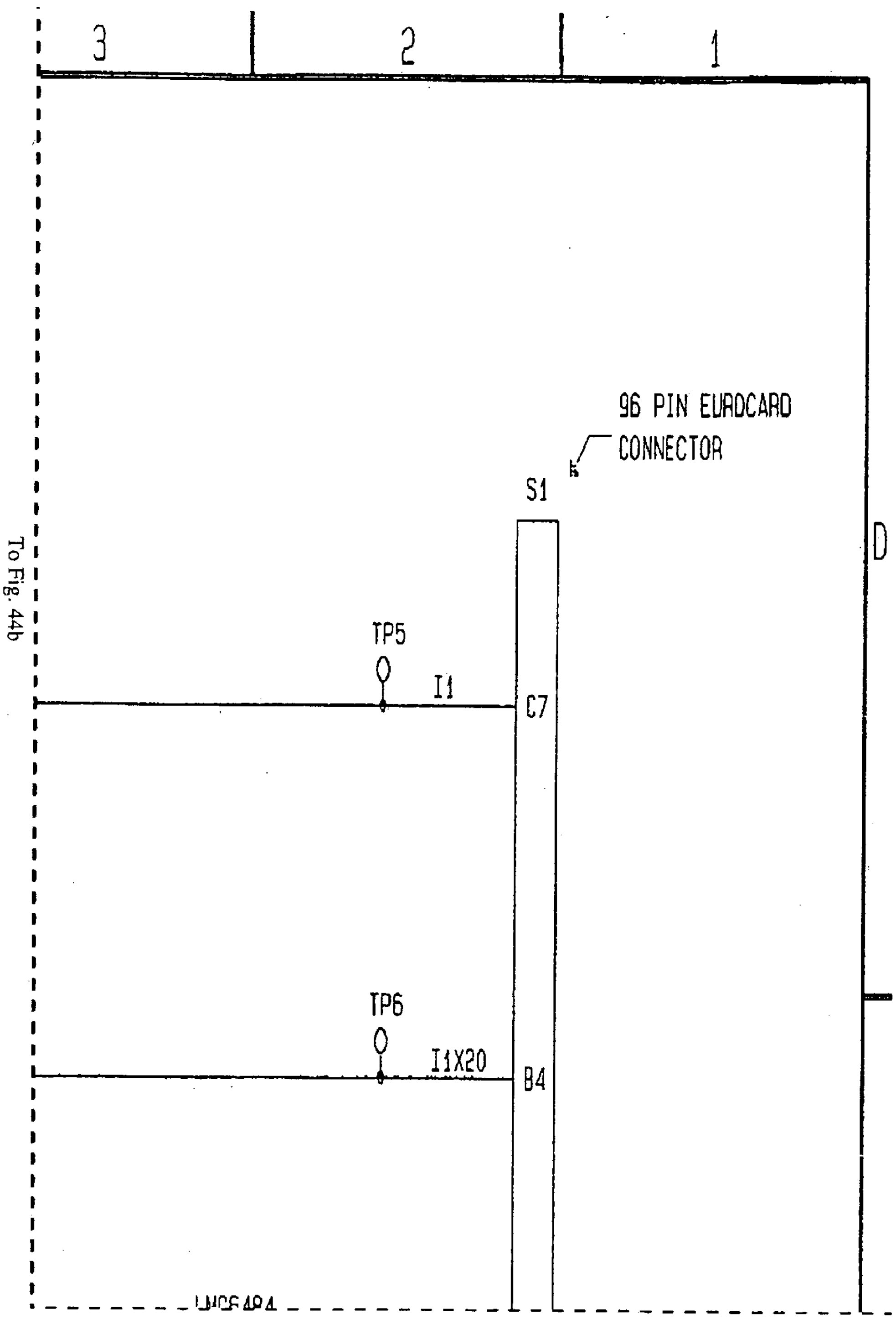
Figure 44D:
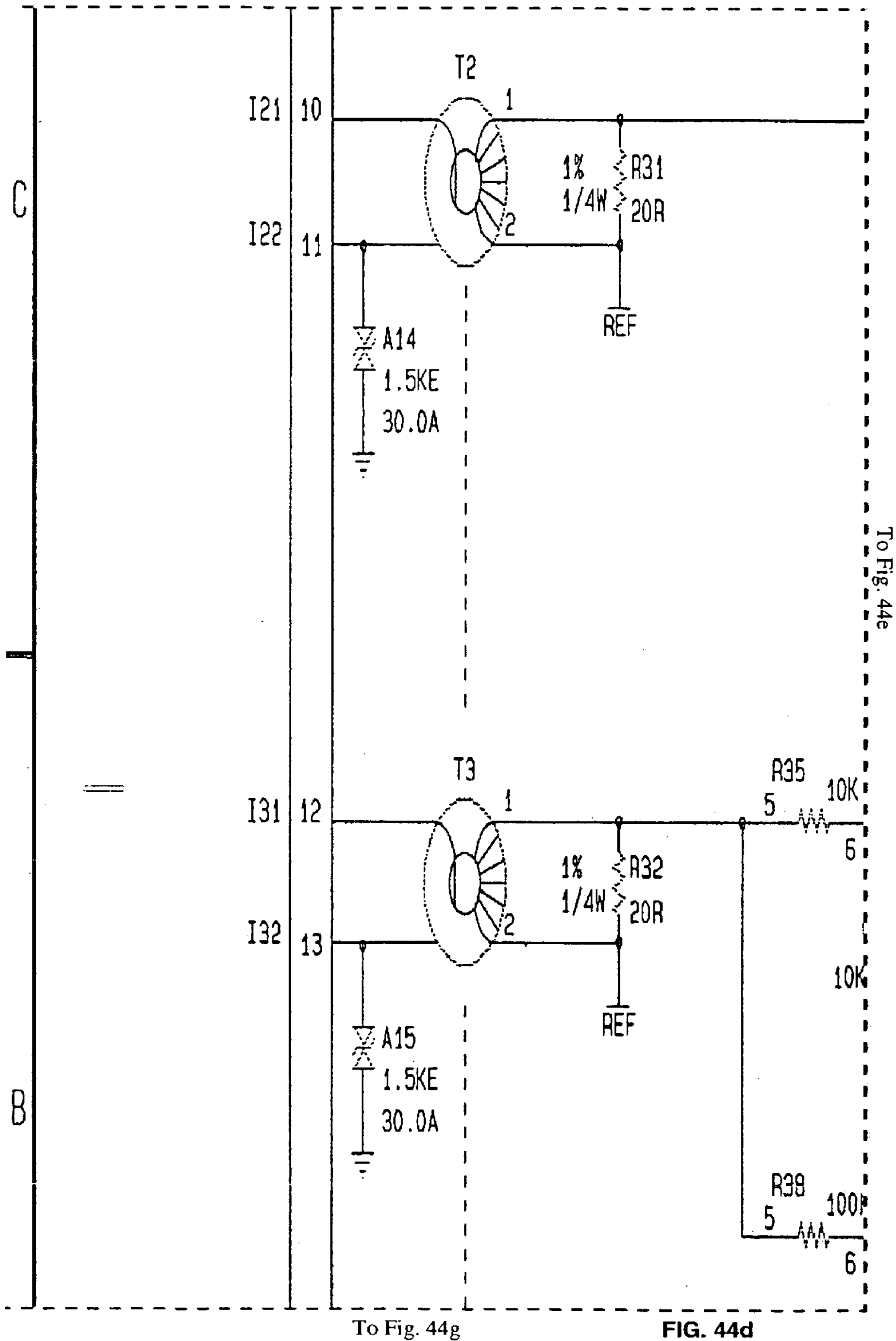
Figure 44:
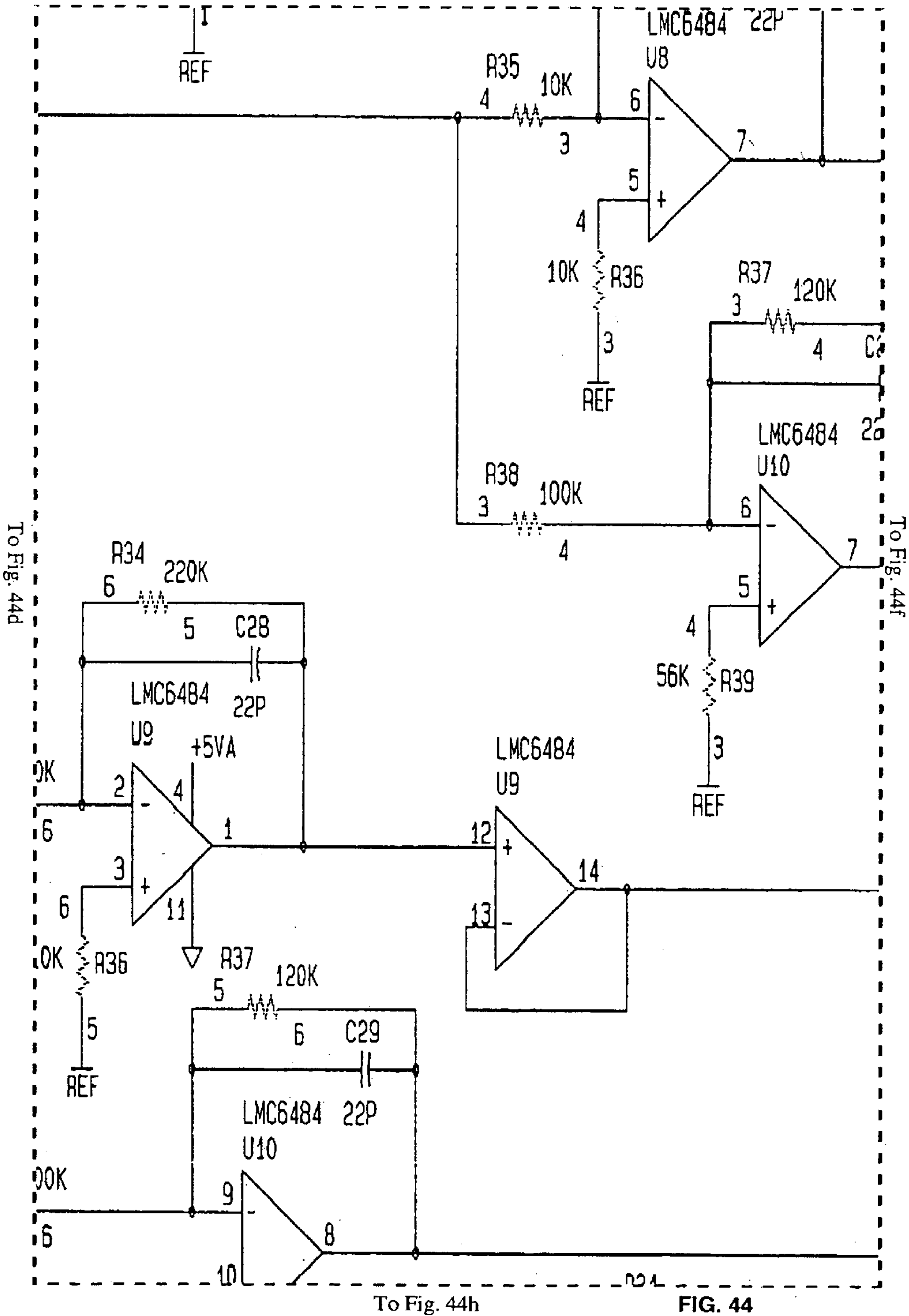
Figure 44F:
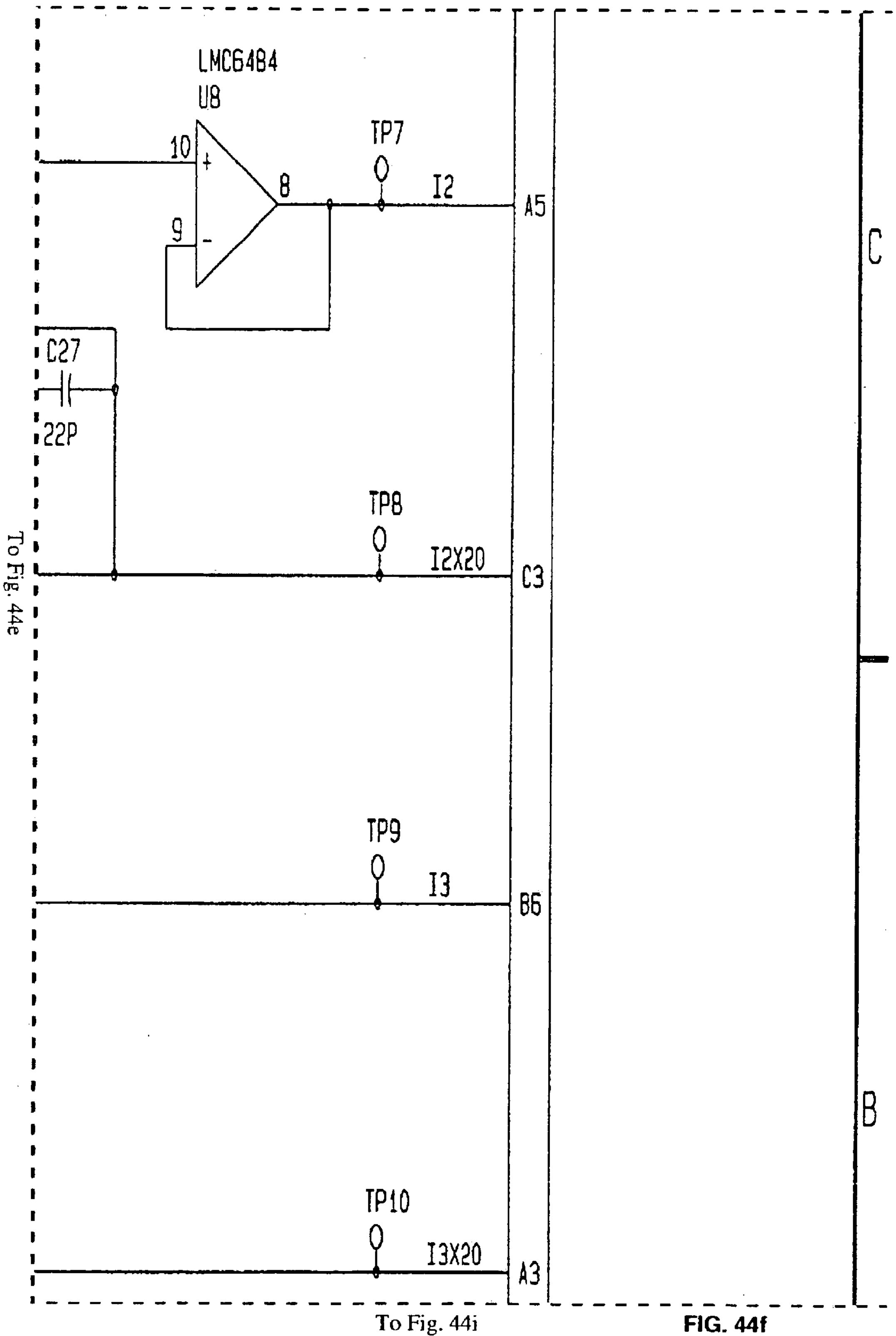
Figure 44G:
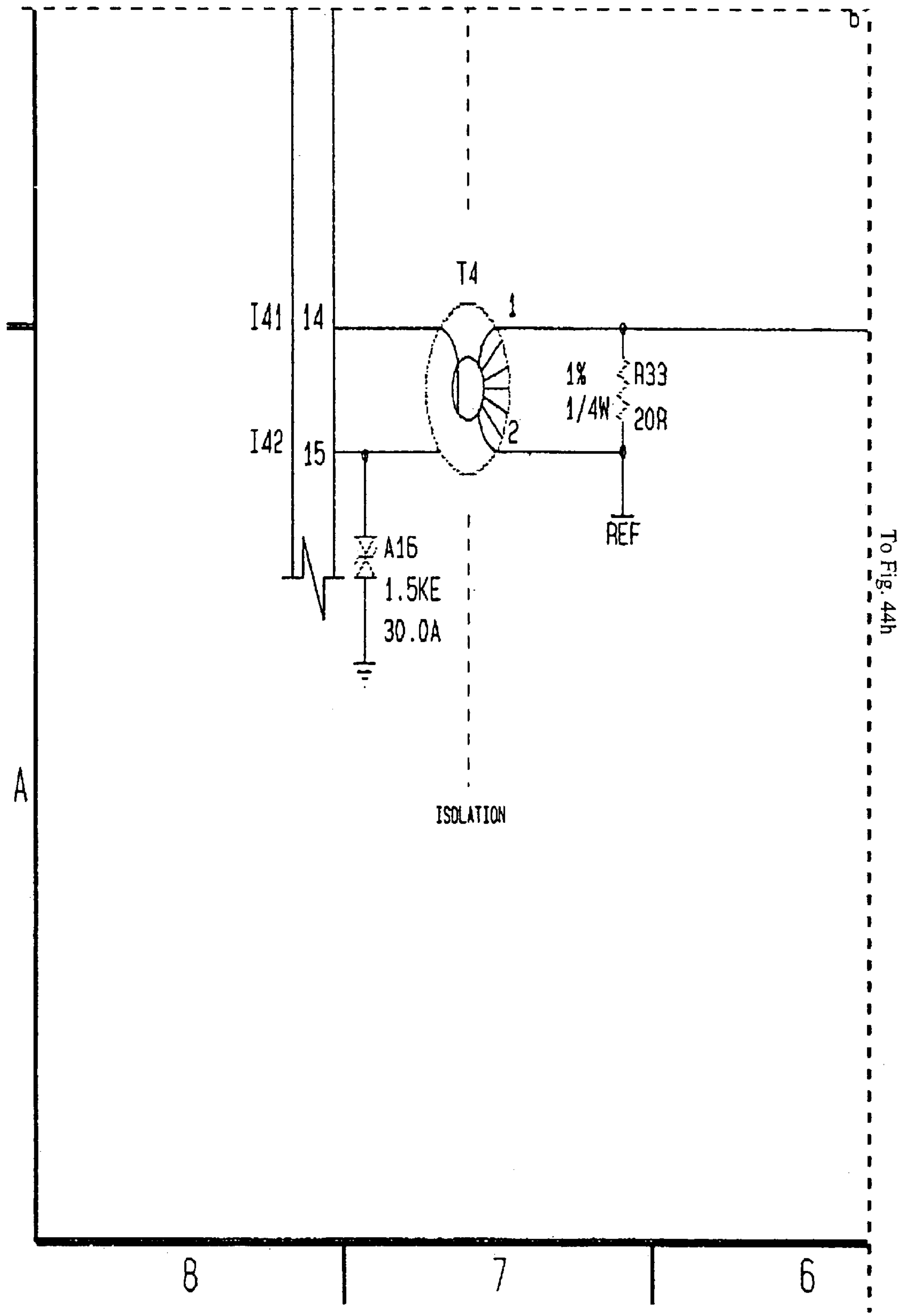
Figure 44H:
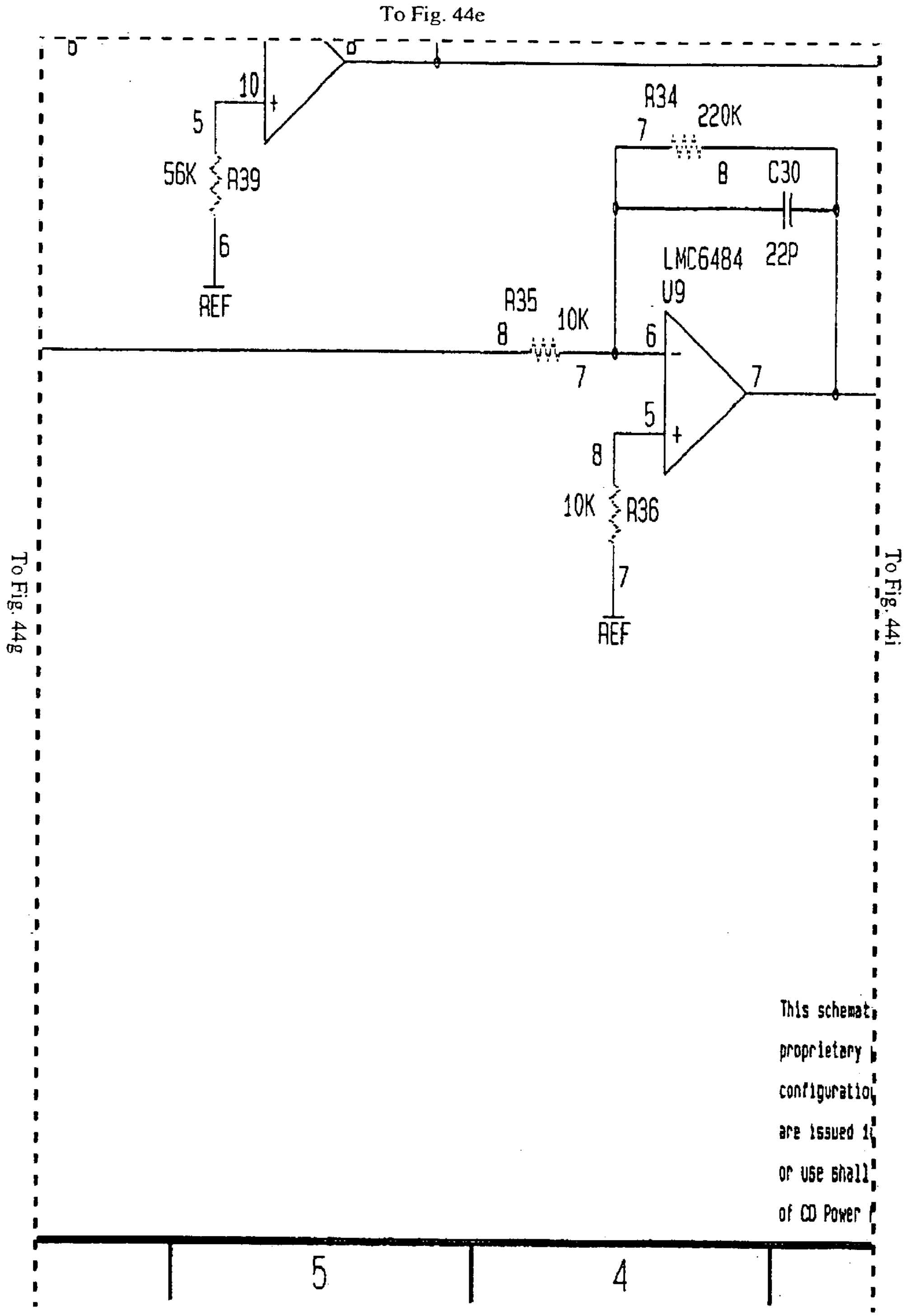
Figure 44I:
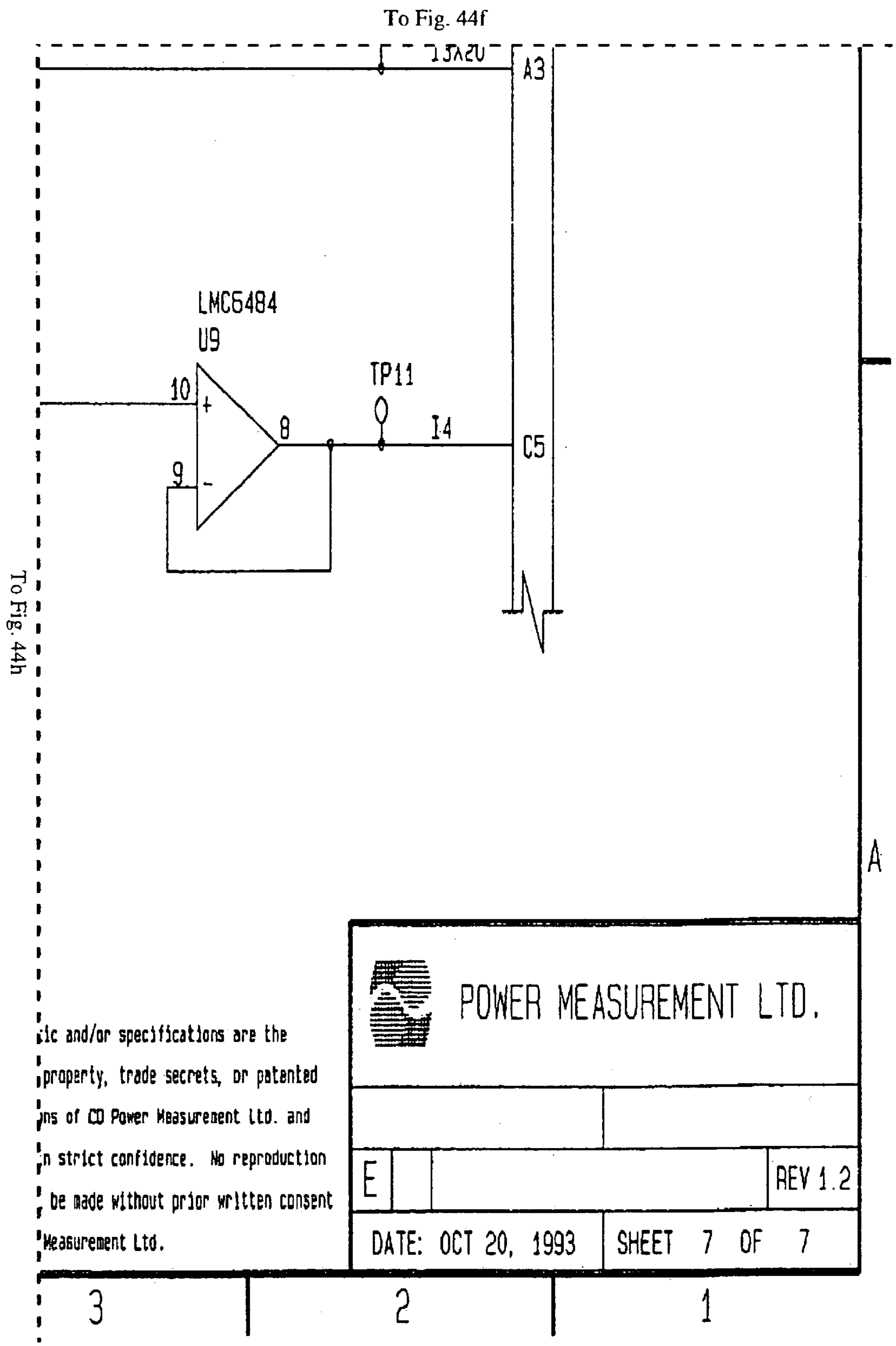
Figure 45A:
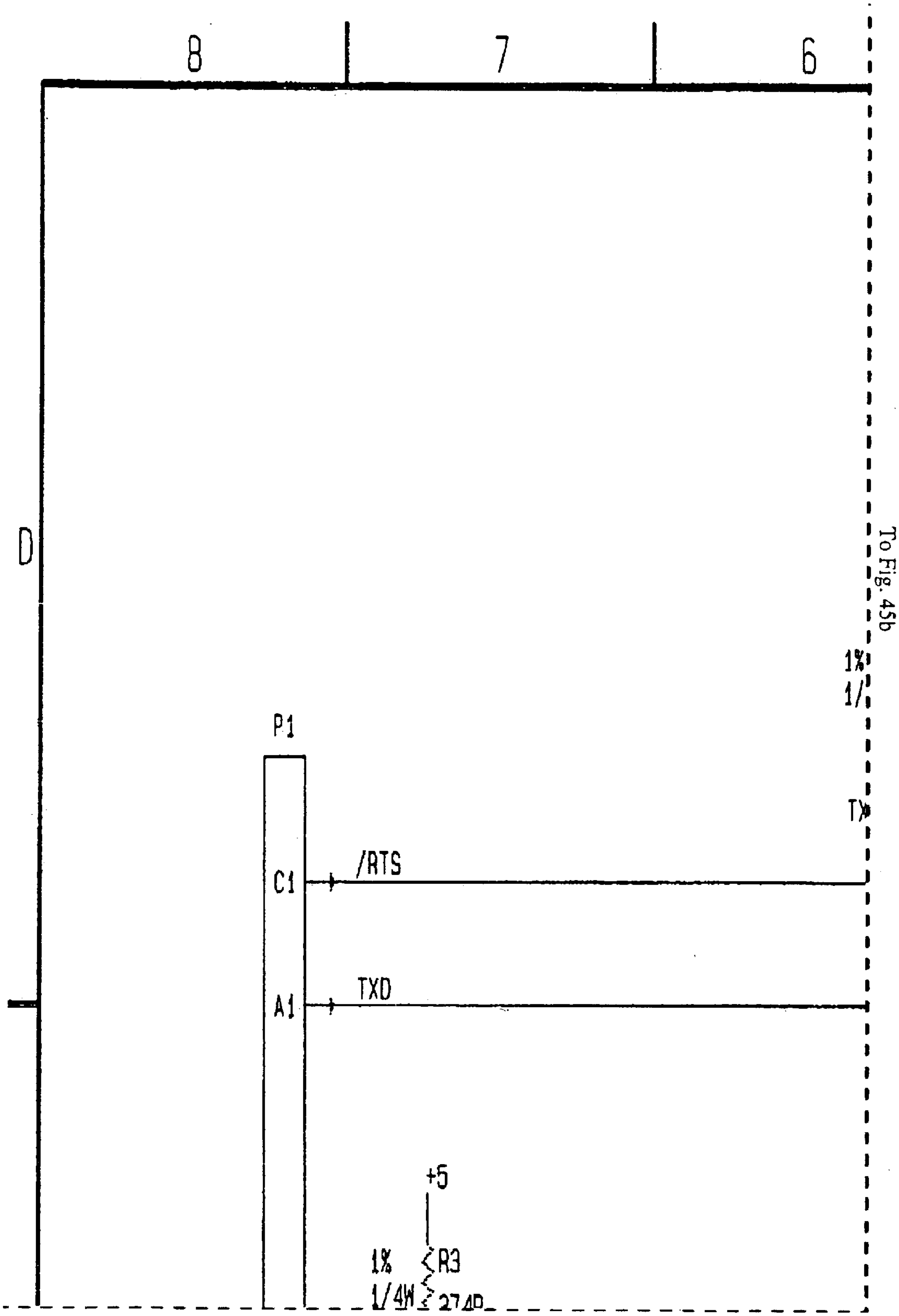
Figure 45B:
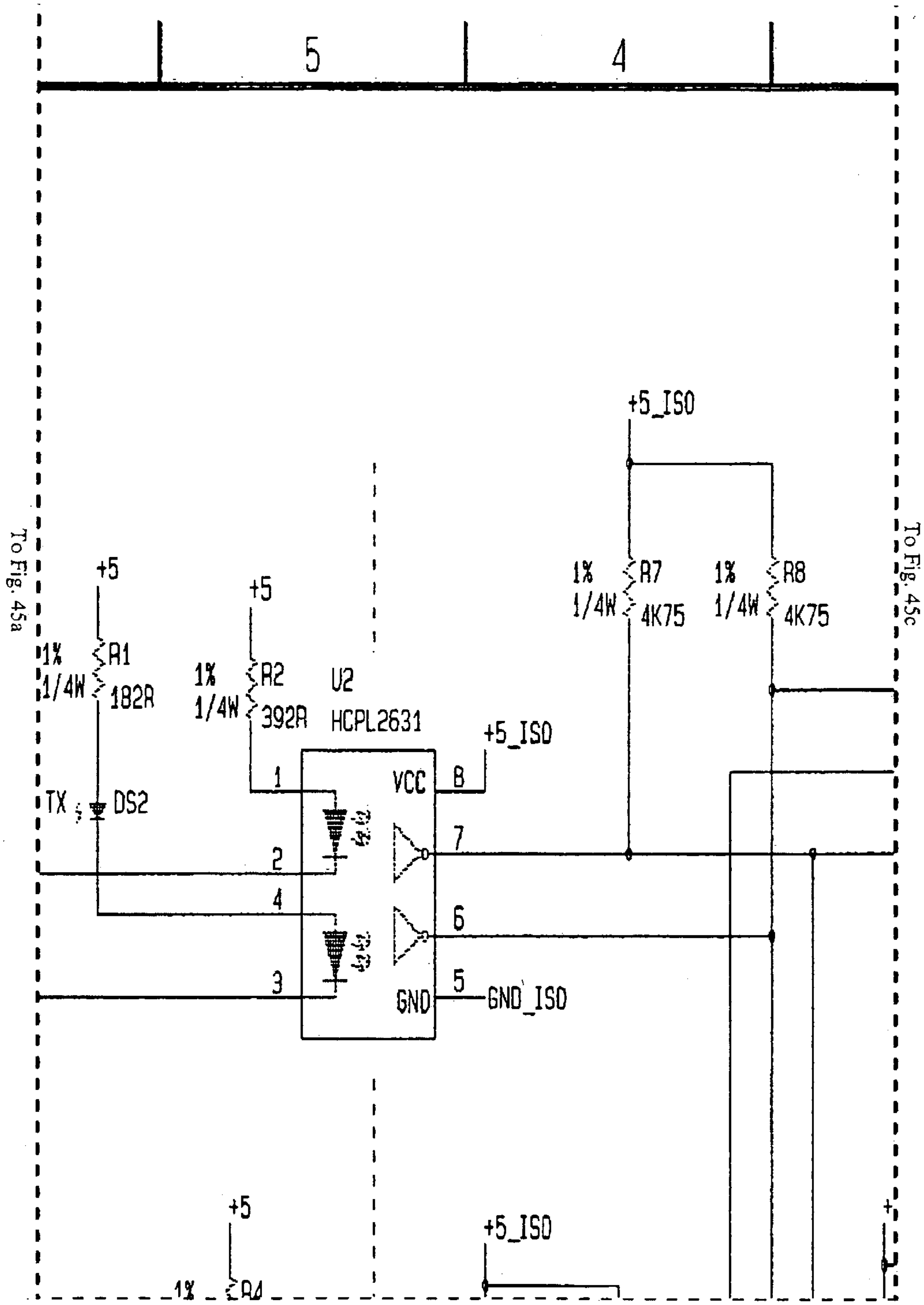
Figure 45C:
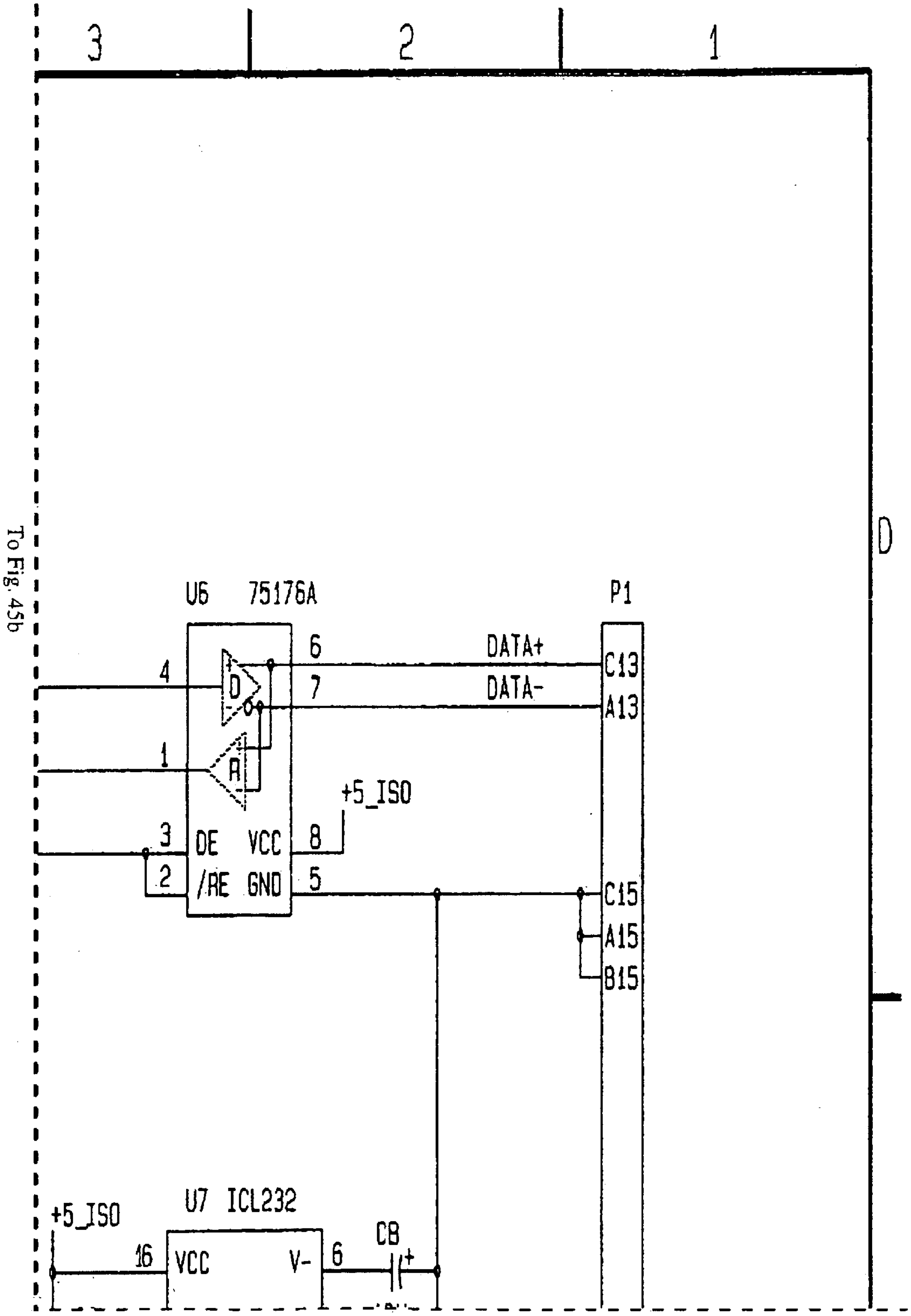
Figure 45D:
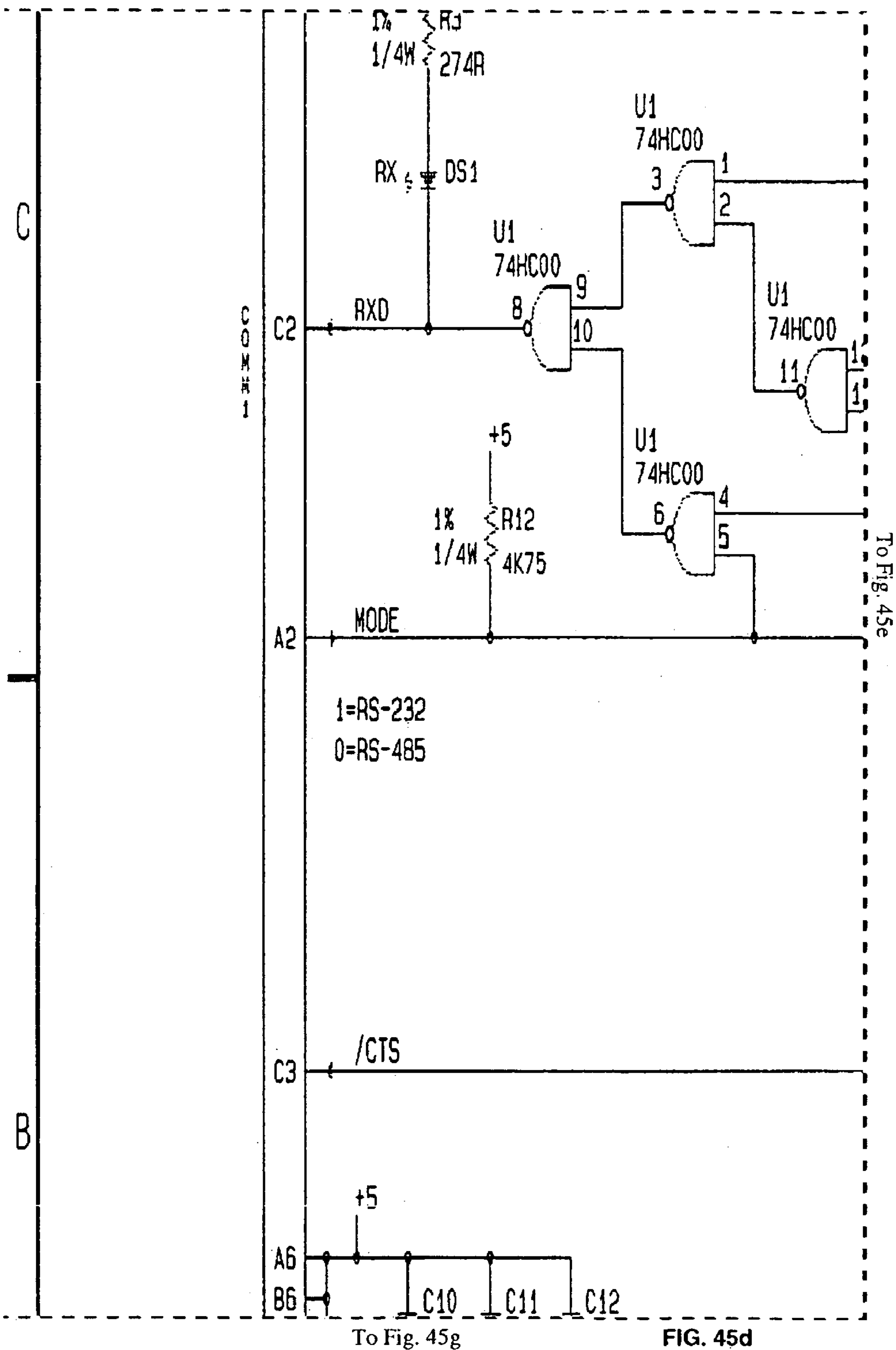
Figure 45:
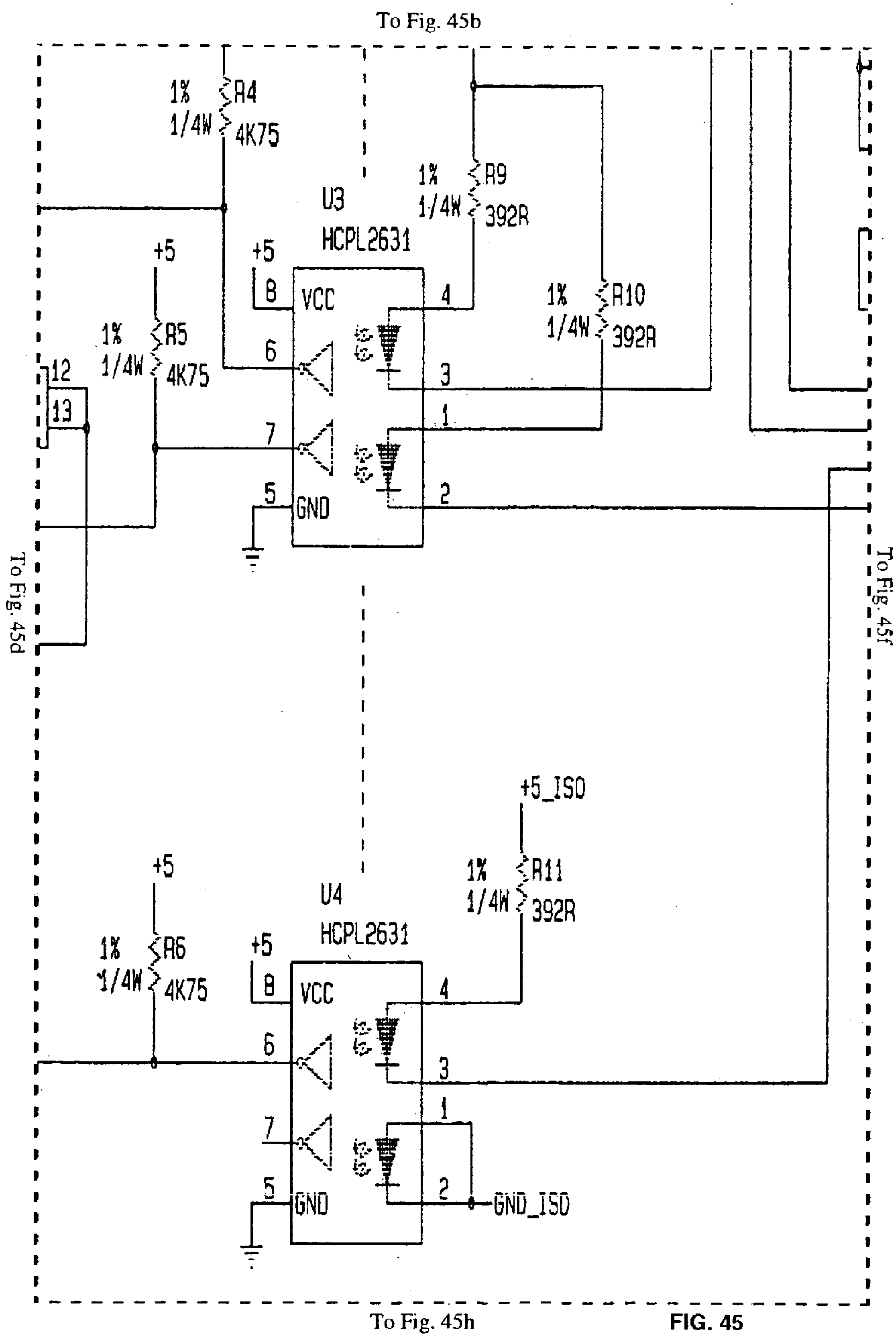
Figure 45F:
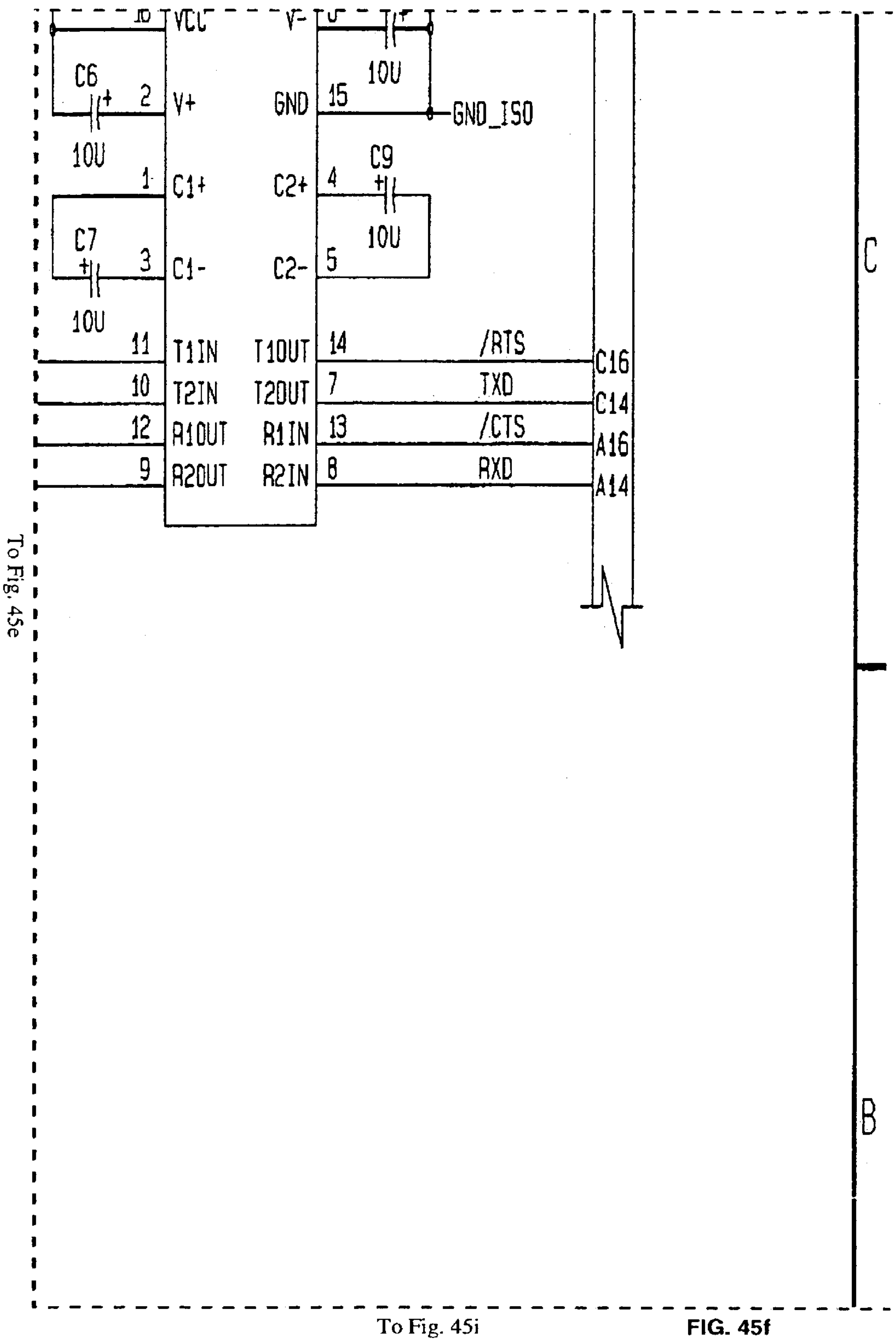
Figure 45G:
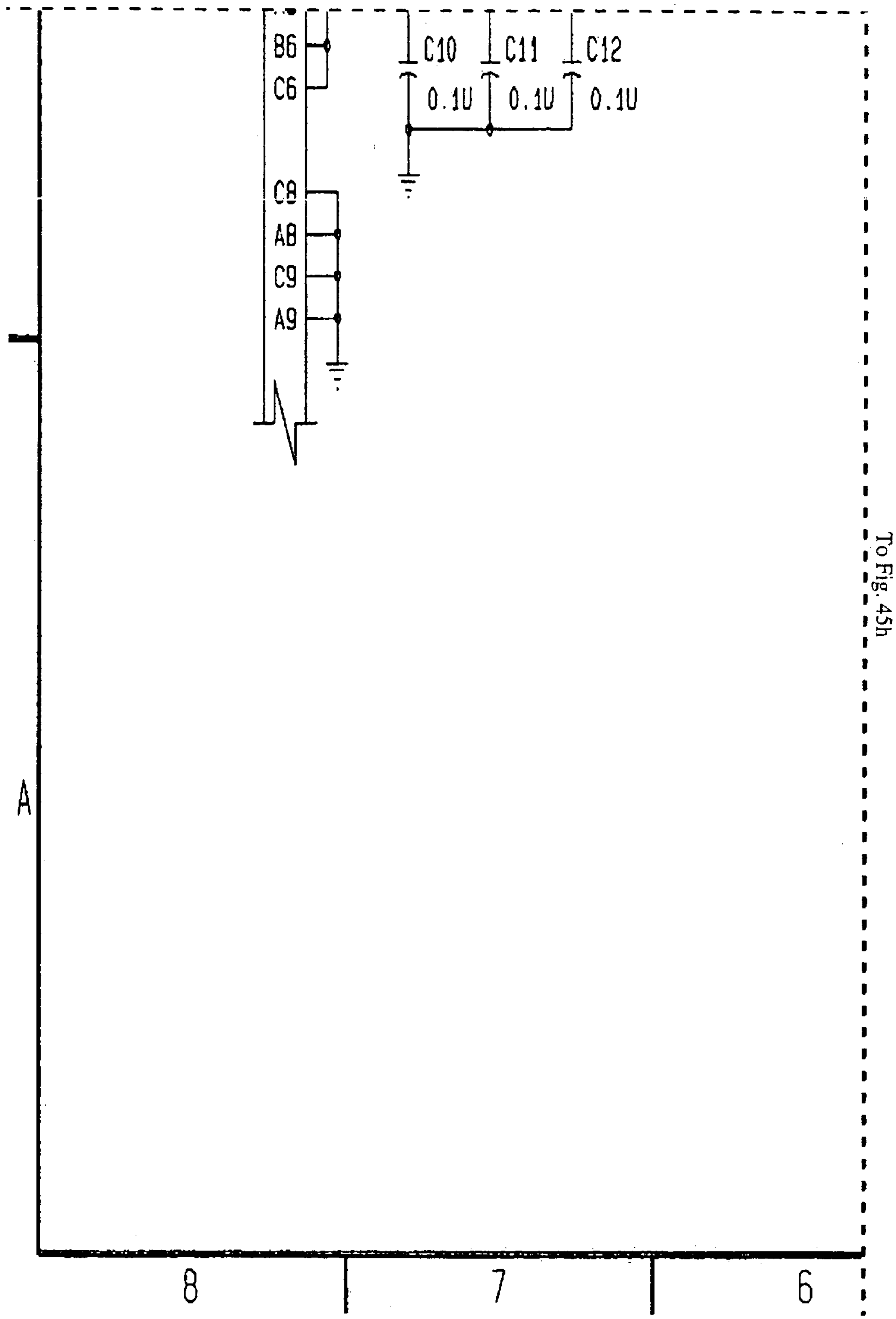
Figure 45H:
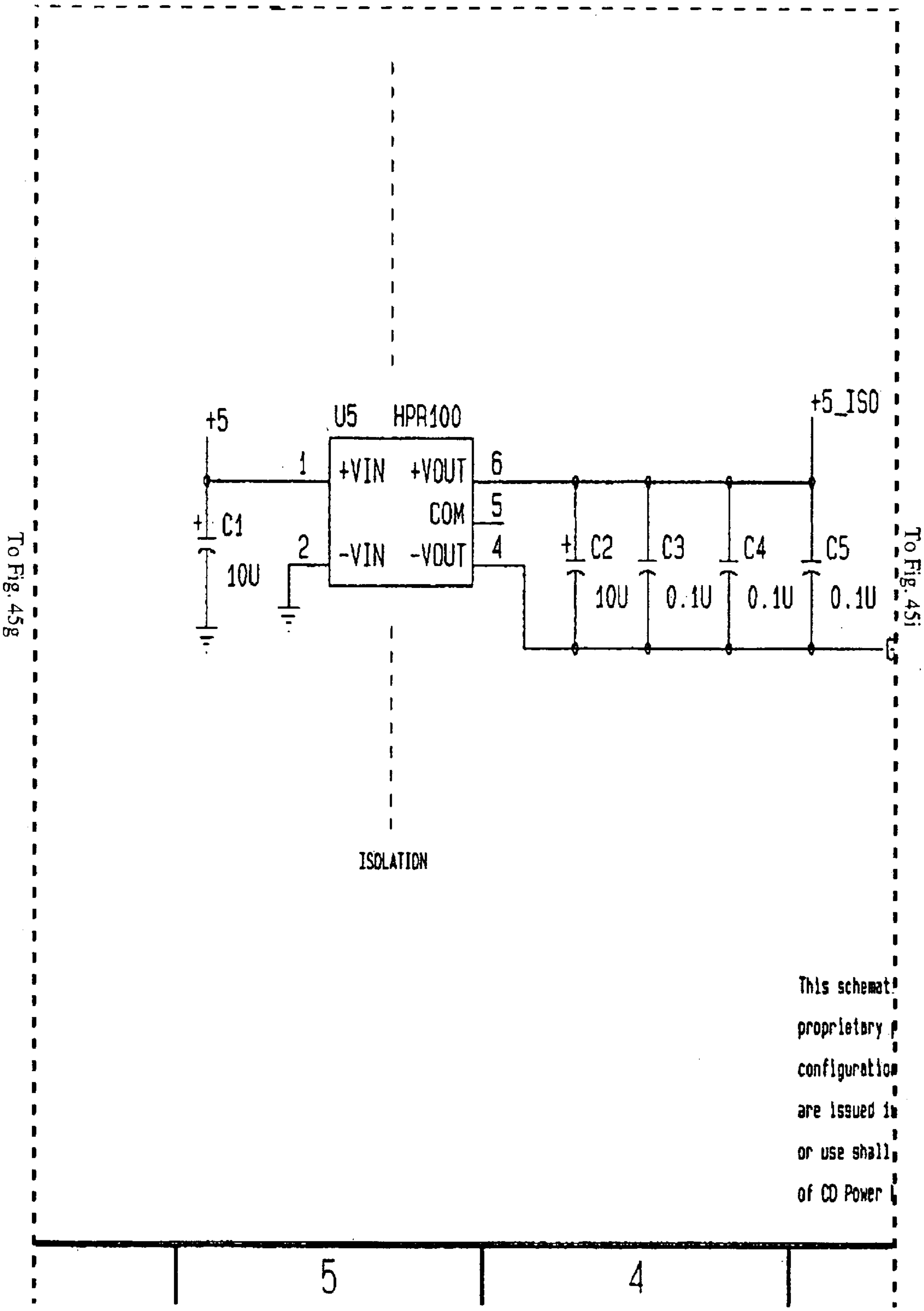
Figure 45I:
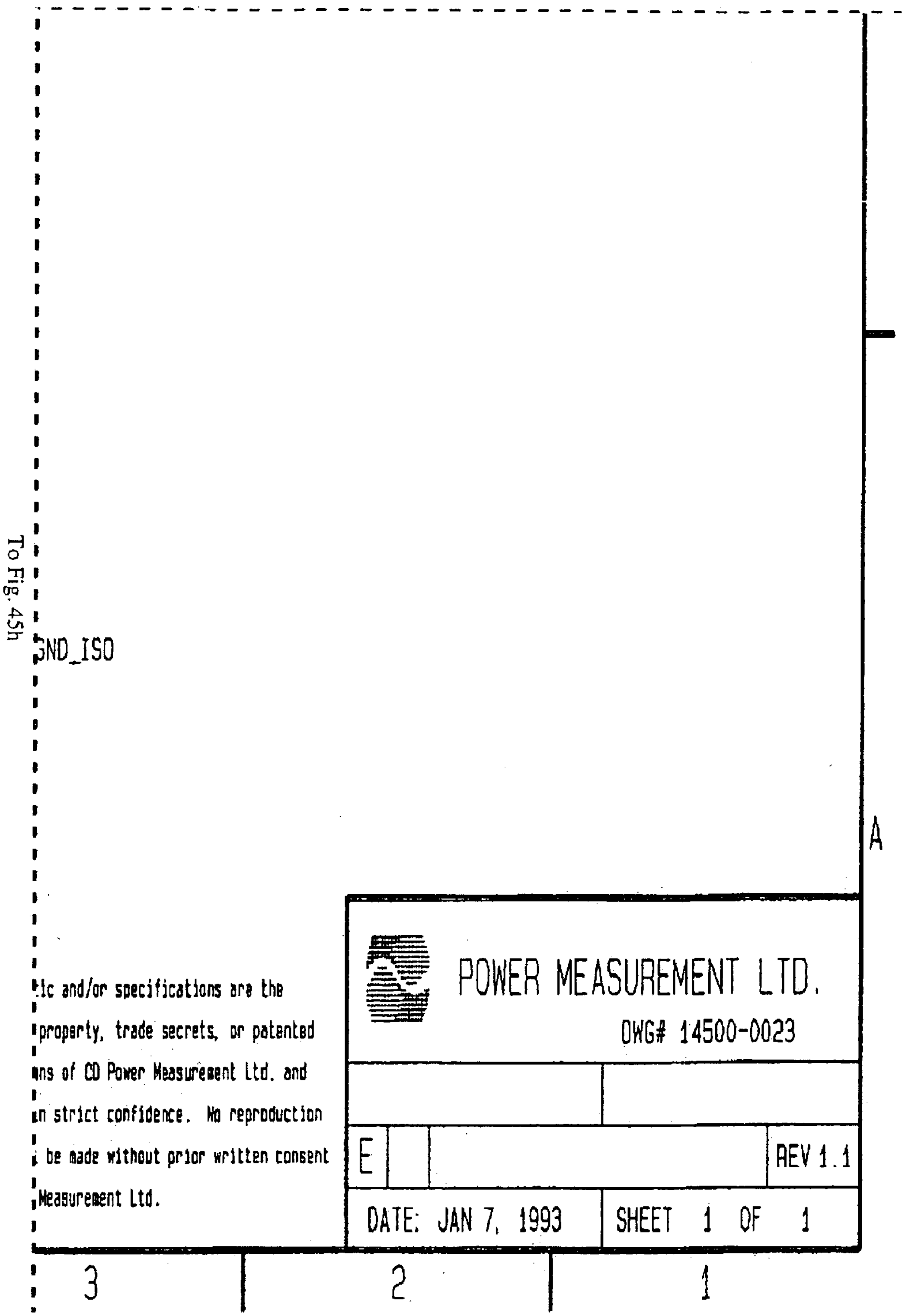
Figure 46A:
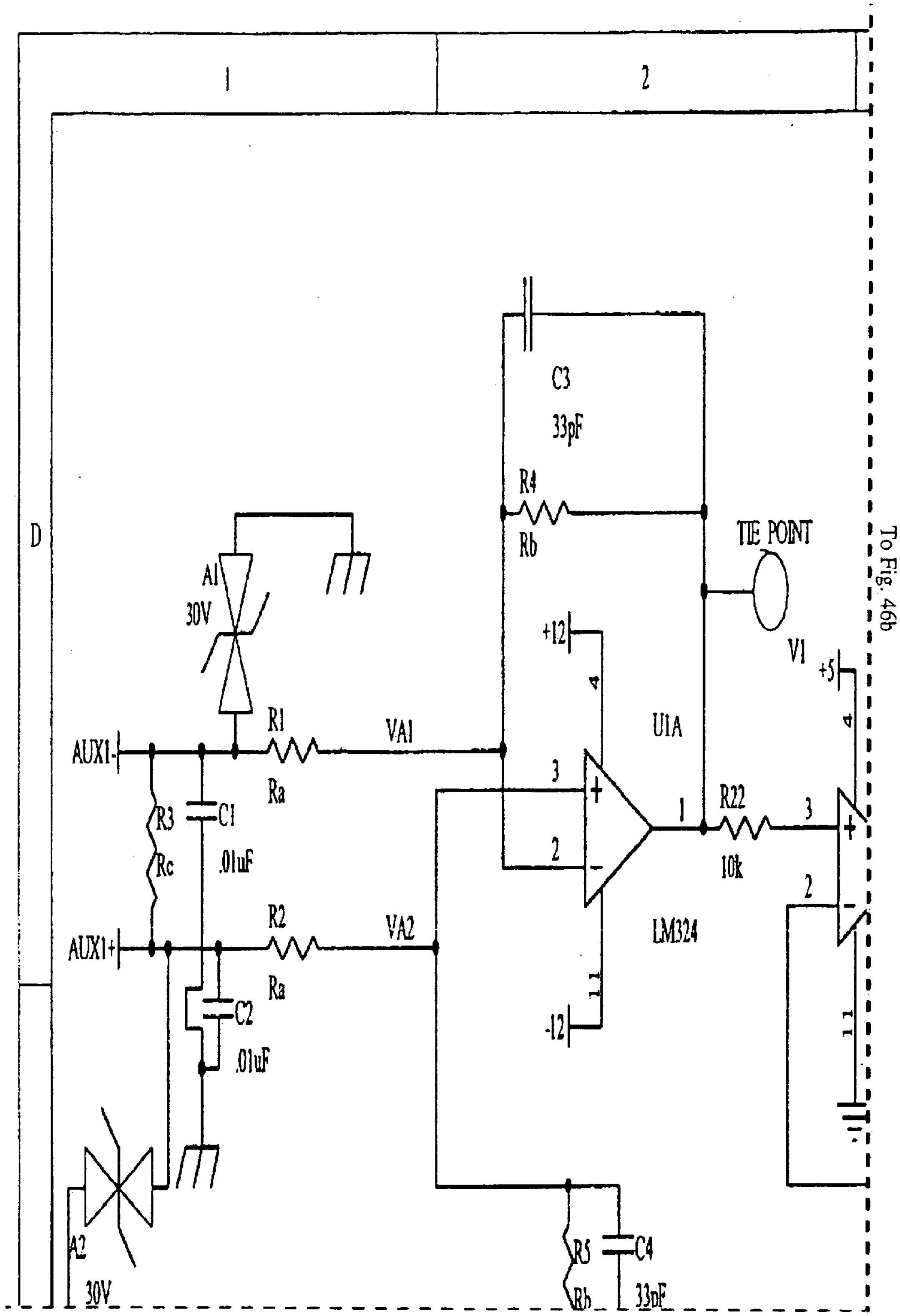
Figure 46B:
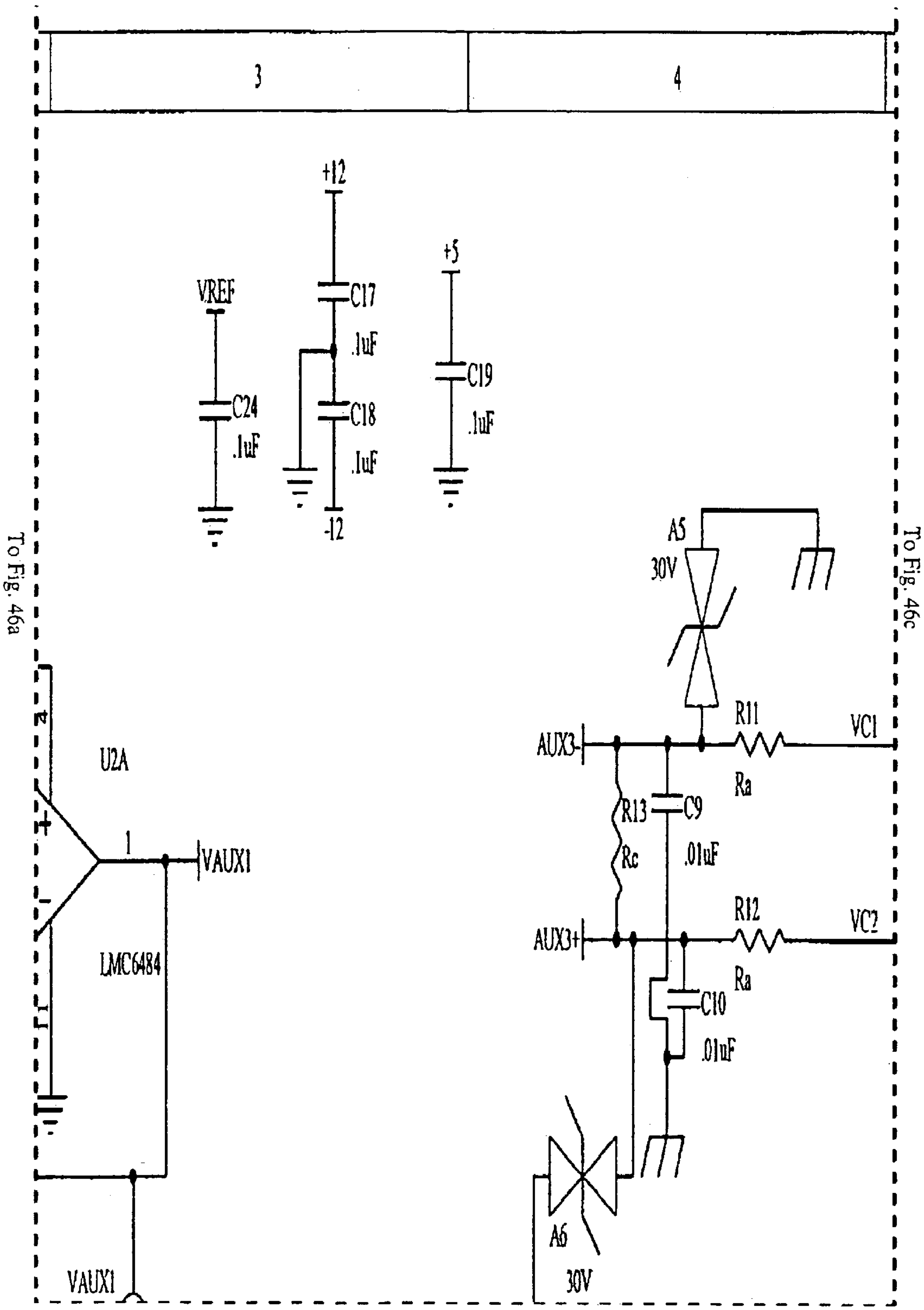
Figure 46C:
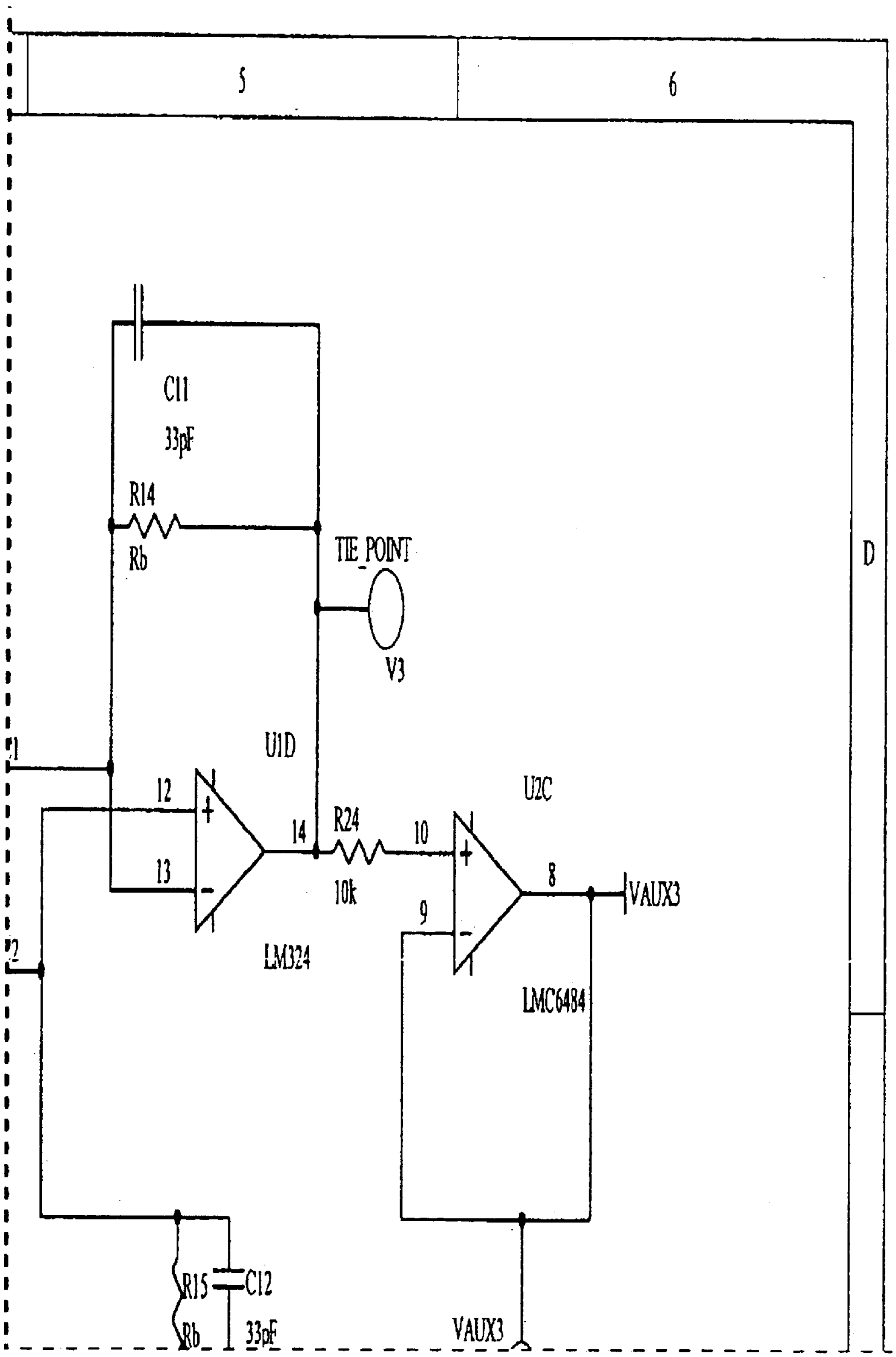
Figure 46D:
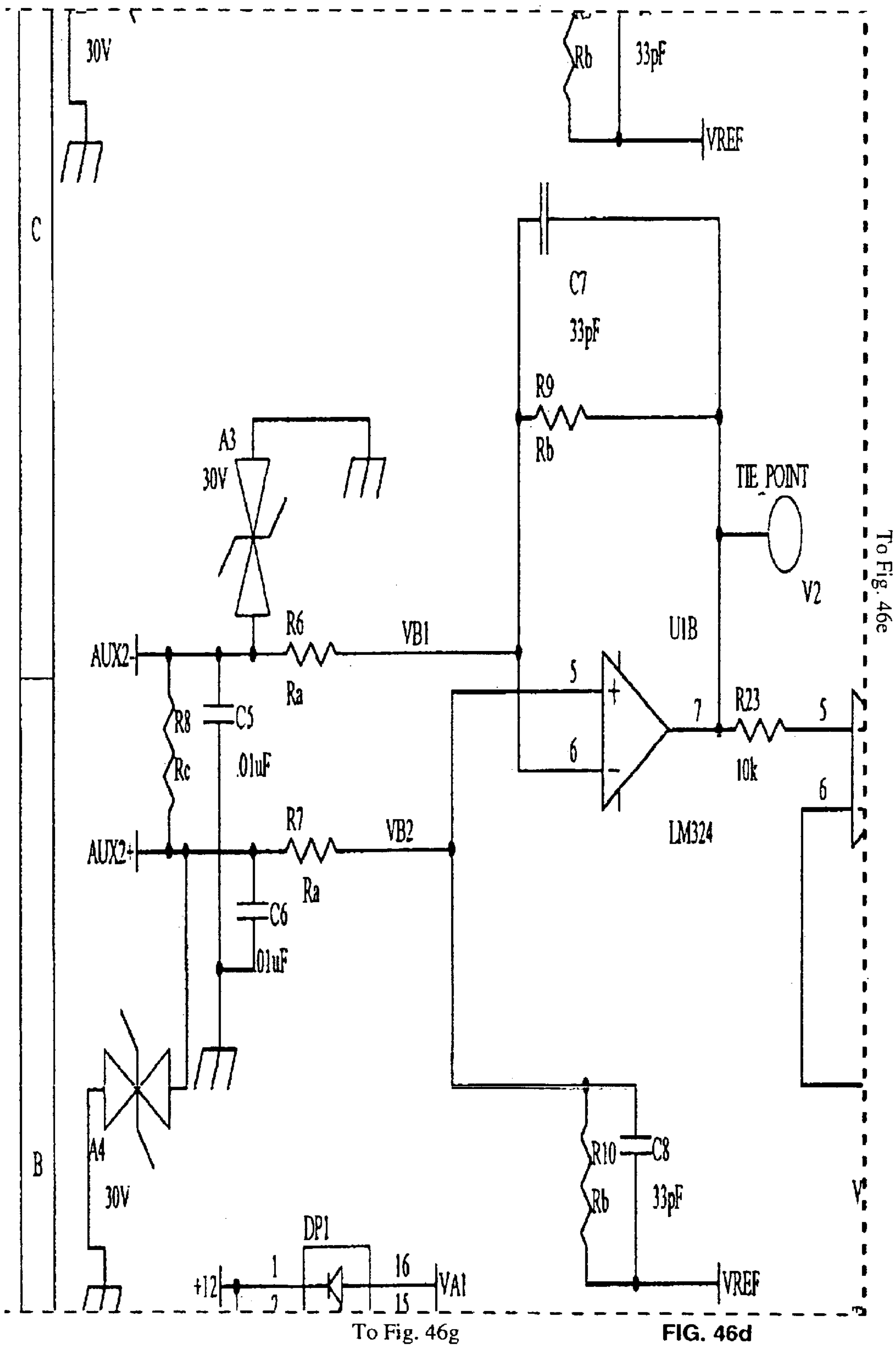
Figure 46:
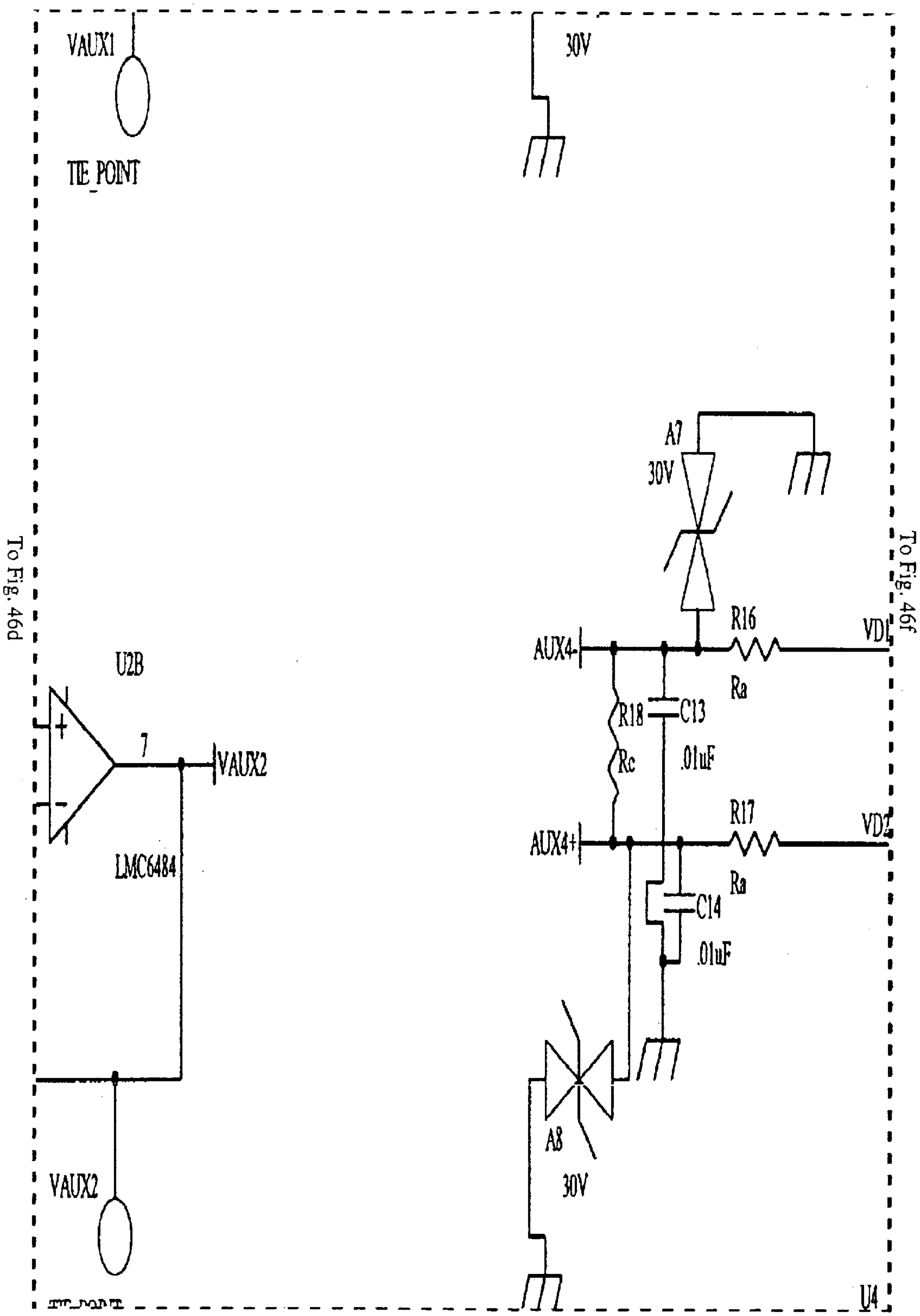
Figure 46F:
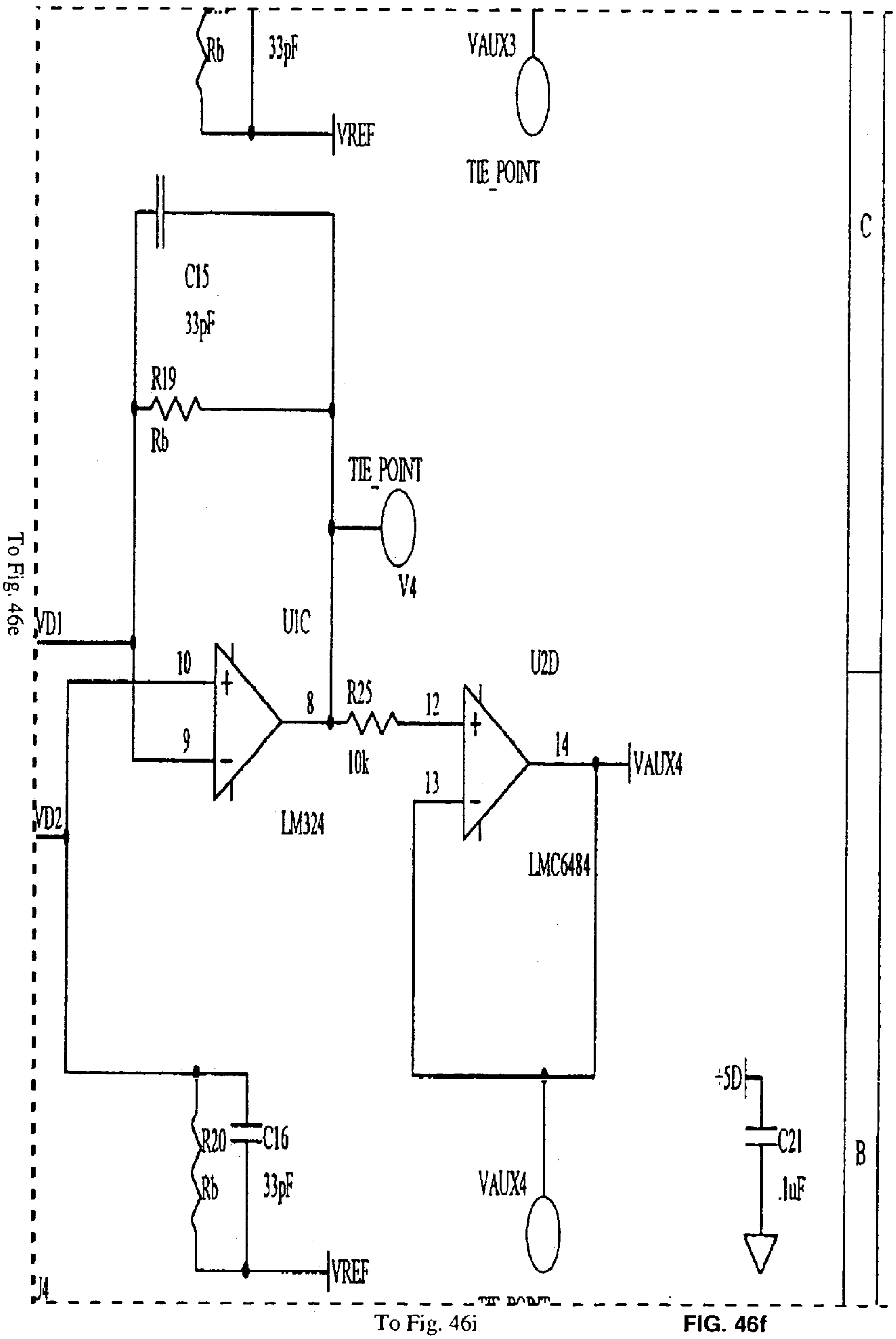
Figure 46G:
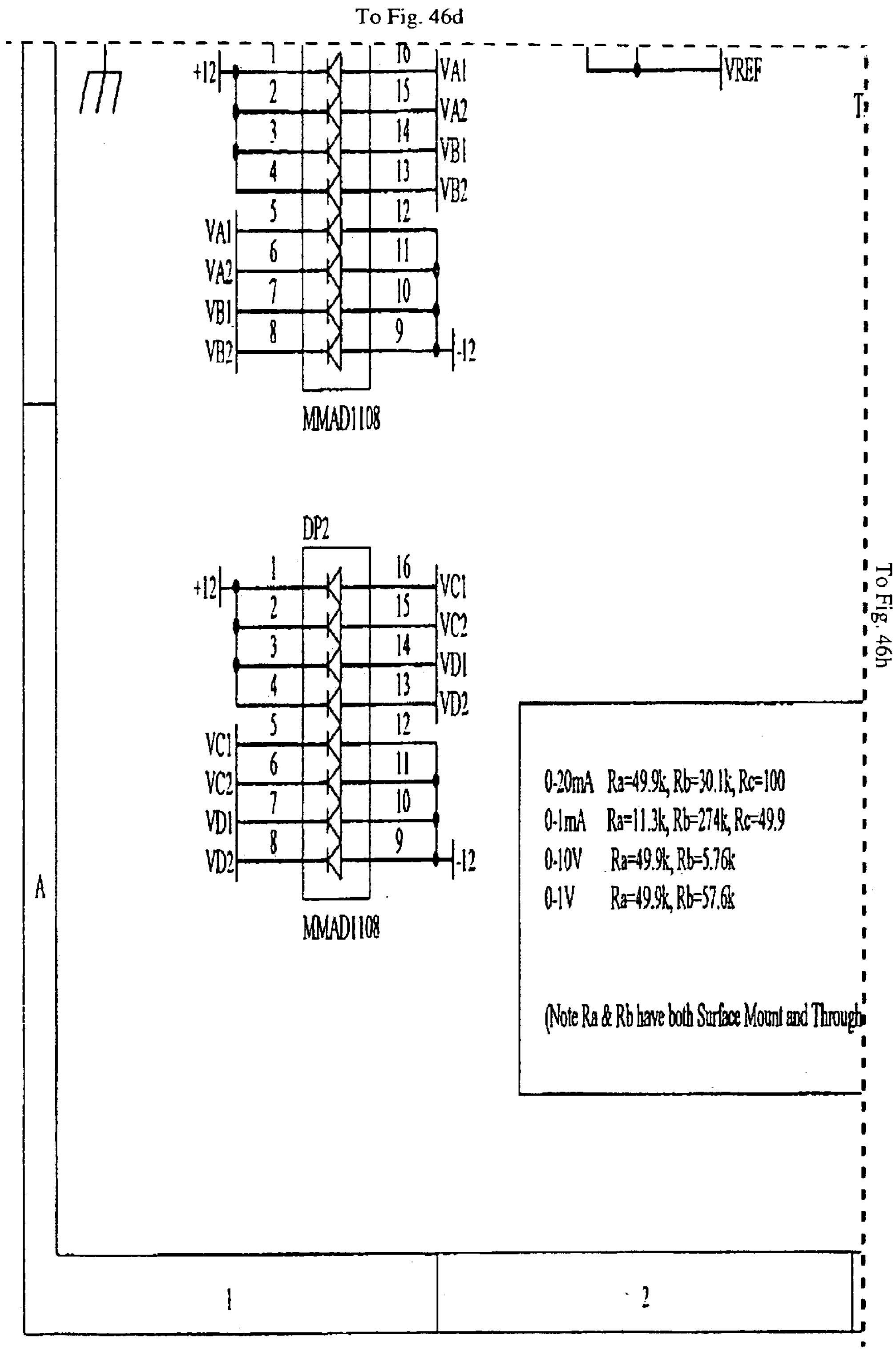
Figure 46H:
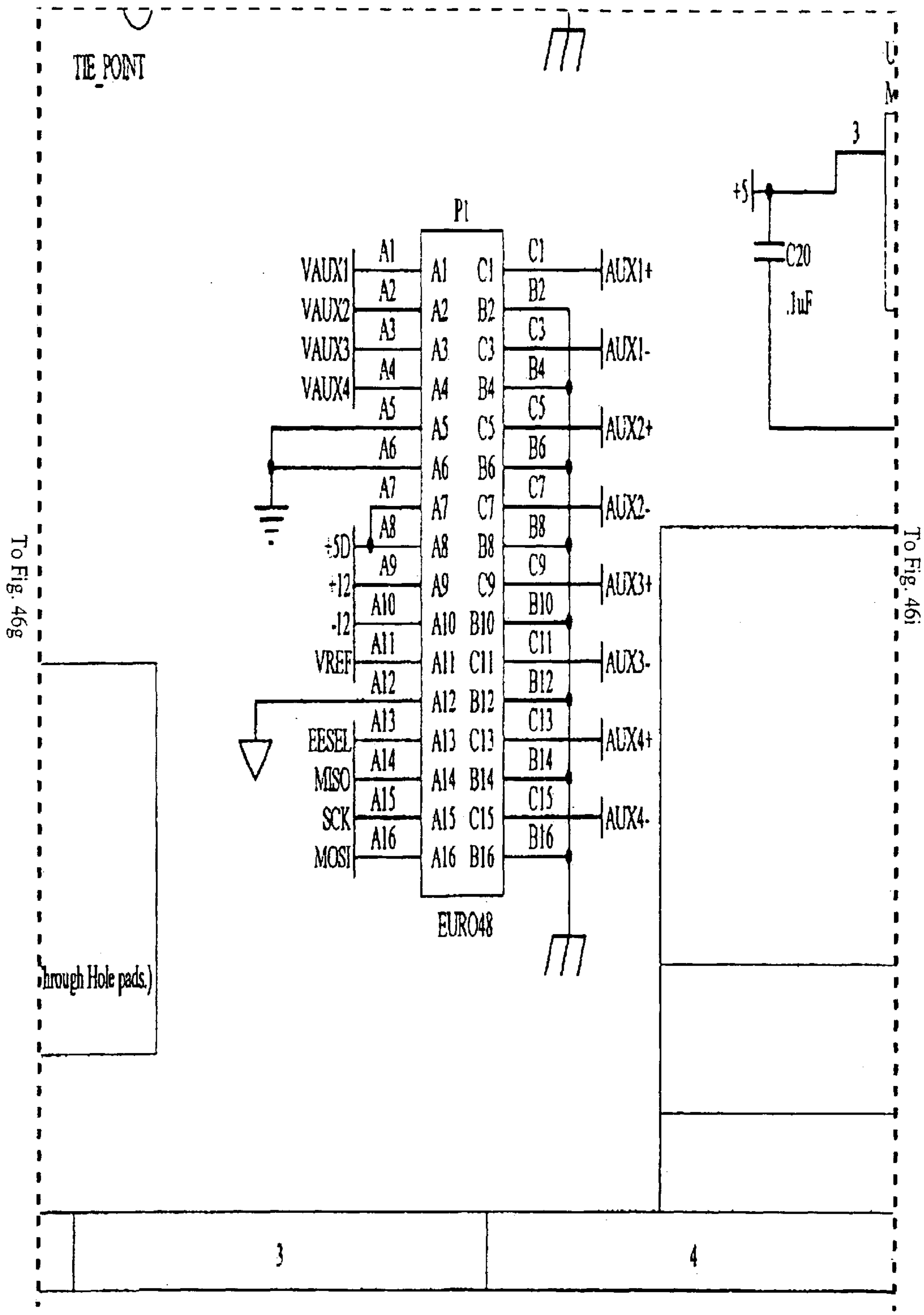
Figure 46I:
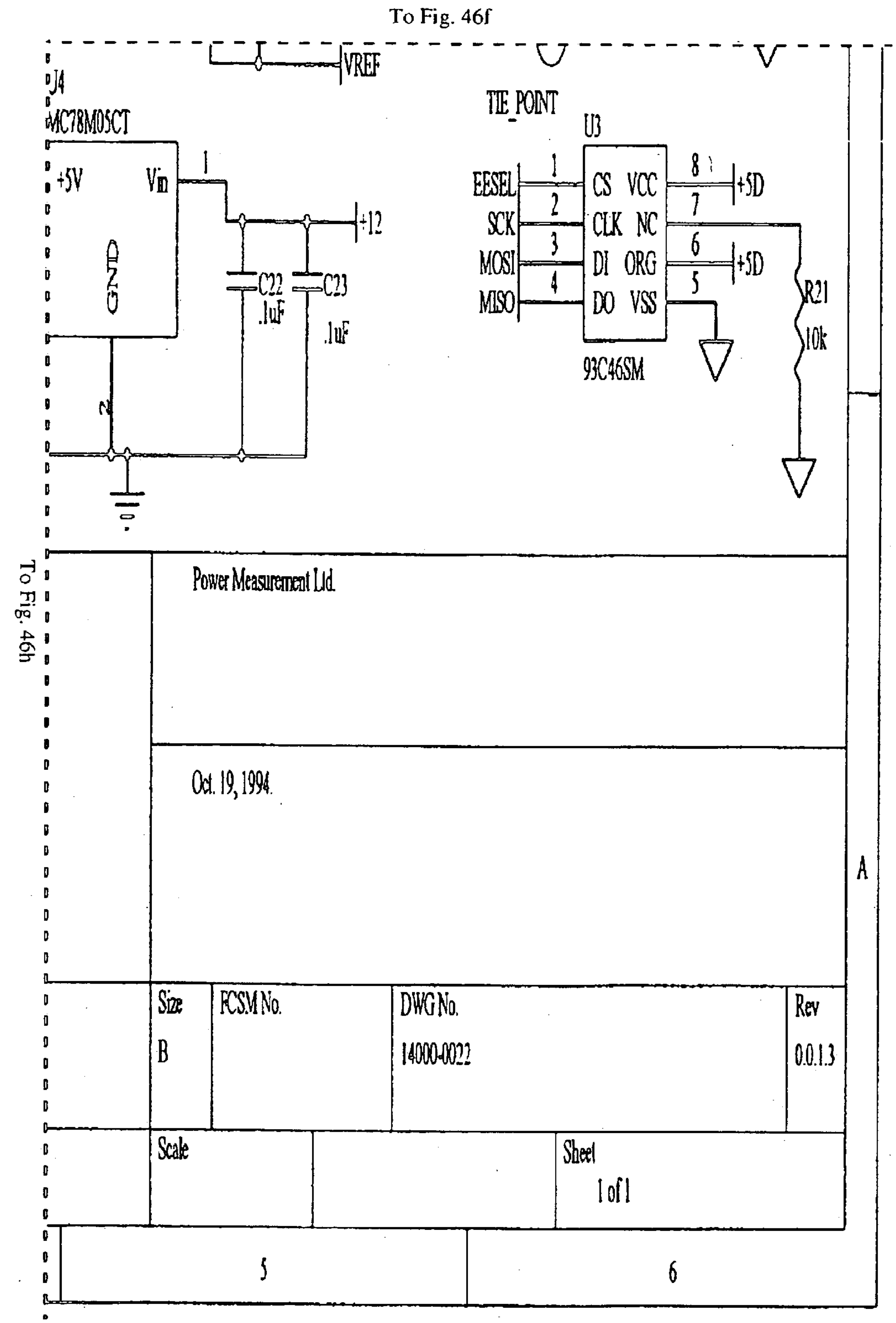

Registers operate only as servers in the architecture. In other words they only respond to method invocations. Some of the most commonly used registers in the preferred embodiment are boolean registers, enumerated registers, numeric registers and numeric bounded registers. A flow chart for the server operation of a boolean register is shown in FIGS. 27A–27C. A flow chart for the server operation of an enumerated register is shown in FIGS. 28A–28B. A flow chart for the server operation of a numeric register is shown in FIGS. 29A–29B. A flow chart for the server operation of a numeric bounded register is shown in FIGS. 30A–30B.

It will be recognized by those skilled in the art that the registers' functionality can be embedded within the modules.

Figure 18:
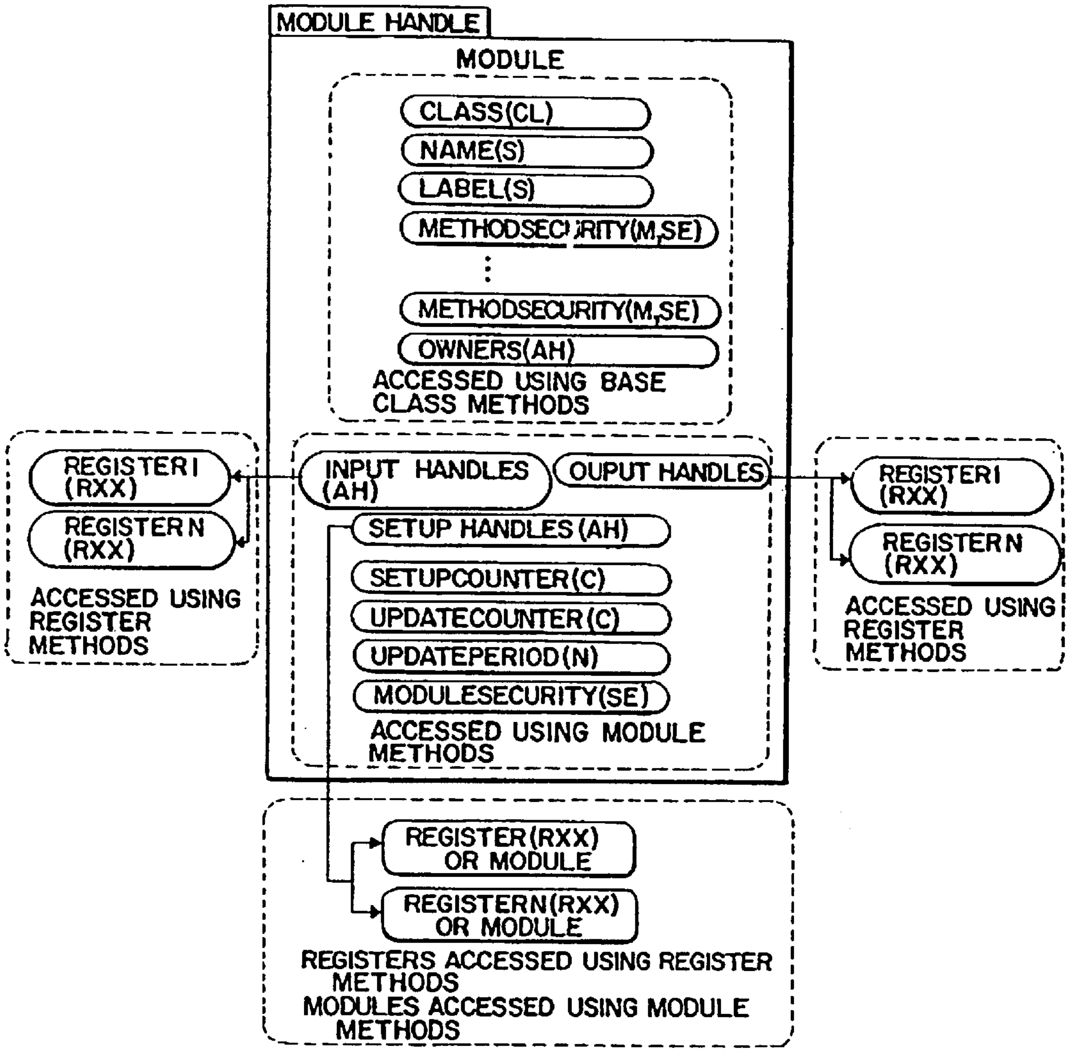
FIG. 18 schematically illustrates a preferred embodiment of the properties of the modules.
Figure 19:
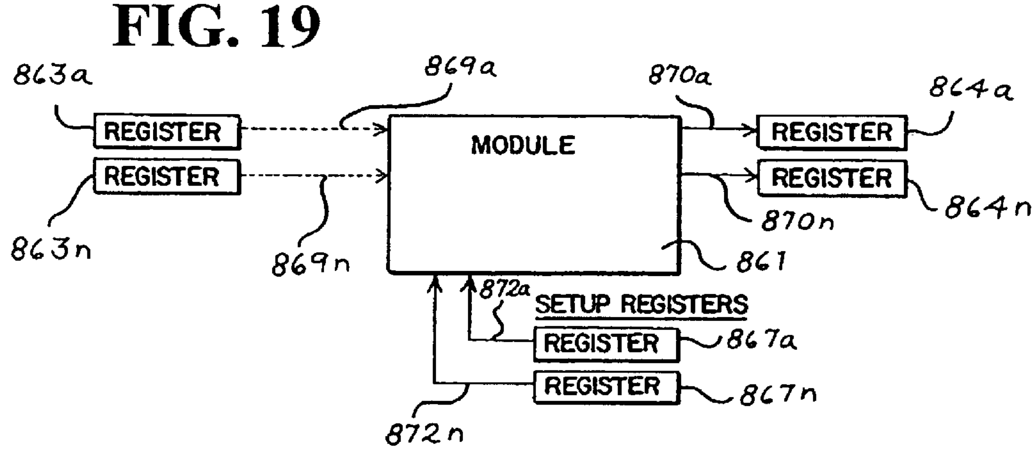
FIG. 19 schematically illustrates a preferred embodiment of the data flow for a module.

The modules provide the IED the functionality in the architecture. FIG. 18 schematically illustrates a preferred embodiment of the properties of the modules. The modules can be considered as "black boxes" that read data at the inputs, manipulate the data in some fashion, and write the result to outputs. Input data is read from registers and output data is written to registers. For all types of modules, the links to input registers can be programmed, but the links to output registers are fixed. Most modules have links to registers which contain setup information—these links are also fixed, and the module can only read them. FIG. 19 illustrates the data flow for a module. A module 861 is linked to input registers 863*a*–863*n* through programmable links 869*a*–869*n*. Setup registers 867*a*–867*n* are linked to module 861 through links 872*a*–872*n* which are not programmable. Output registers 864*a*–864*n* are linked to module 861 through links 870*a*–870*n* which also are not programmable.

In the preferred embodiment, the modules have the following properties

An array of handles (input handles) point to the input registers. The module has shared ownership of these registers. The module reads a register using the Read.sub.—Value method.

Module setup data (such as scaling information) is stored in registers. An array of handles (setup handles) point to these Registers. There is one exception: For a manager module these Handles point to other modules rather than registers. The module has shared ownership of these objects.

The module uses the input data and setup data to produce output data according to the function of the module which is described by the module behavior.

An array of handles (output handles) point to the output registers. The module has shared ownership of these registers. A module writes these registers using the Write.sub.—Value method.

UpdatePeriod contains the period at which the module updates the output registers.

ModuleSecurity contains the security level which the module uses when invoking methods on other objects.

The module has a class which is unique to that type of module. (e.g. All setpoint modules would have the same class).

The module has a name. This name is fixed (read only) and is different in every module.

The module has a label which can be programmed.

A method security level is defined for every method which can be invoked on a module. Thus, there is a security parameter for every method which can be invoked on the module.

The module has owners which are listed in an array of Handles. This array lists all the module(s) that have shared ownership of the module.

A module is created by a manager using the Create.sub.—Module( ) method. When the module is created all output registers and setup registers are also created. However, input registers are not created when a module is created. Often, a manager will have a fixed number of modules and the Create.sub.—Module( ) method will not be supported.

The module class (class=500) is derived from the base class. The methods listed below in Table 20 are common to all module classes (all module classes are inherited from this module class).

TABLE 20

| # | Method | Return-type | Description |
|---|---|---|---|
| 1000 | read.sub.-- input.sub.-- handles( ) | HandleArray Type | Returns a list of the handles to the registers that are connected as inputs to the manager or module. (In the current embodiment, managers do not have inputs.) |
| 1001 | write.sub.-- input.sub.-- handles(HandleArrayType) | BooleanType | Accepts a list of handles and attempts to link a module or manager to these input registers. (In the current embodiment, managers do not have inputs.) The handle order is defined in the module definitions. If one of the handles is incorrect the method will fail and NO handles will be written (i.e. all or nothing). |
| 1002 | read.sub.-- input.sub.-- classes( ) | ArrayUnsigned ArrayType | Reads the allowed register classes for the write.sub.-- input.sub.-- handles method. The returned array has the same number of elements as the HandleArray used in the write.sub.-- input.sub.-- handles method. If the returned array has an element that contains a Null rather than a class this indicates that this input element cannot be programmed. |
| 1003 | read.sub.-- output.sub.-- handles( ) | HandleArray Type | Returns a list of handles to the output registers of a module or manager. (In the current embodiment, managers do not have outputs.) The handle order is defined in the module definitions. |
| 1004 | read.sub.-- setup.sub.-- handles( ) | HandleArray Type | Returns a list of handles to the setup register of a module or a list of handles to modules for a manager. The handle order is defined in the module definitions. |
| 80 | read.sub.-- setup.sub.-- counter( ) | CounterType | Returns a number indicating how many times the module or manager has had its configuration changed. A master device can keep a local copy of this number. If another master device changes the setup of the slave device, the first manager can detect the change by comparing its count with the current count. |
| 81 | read.sub.-- update.sub.-- counter( ) | CounterType | Returns a number indicating how many times the module or manager has successfully invoked a method to write a new value to its output registers. A master device can then determine if it is necessary to read the output from the module or manager. (In the current embodiment, managers have no outputs.) |
| 1005 | read.sub.-- update.sub.-- period( ) | StringType | Returns a number indicating the minimum amount of time there will between the module or manager updating its output registers. (In the current embodiment, managers have no outputs.) Typical response is one of: "one cycle" |

TABLE 20-continued

| # | Method | Return-type | Description |
|---|---|---|---|
| | | | "one second"<br>"two cycles" |
| 1006 | read.sub.-- module.sub.-- security( ) | SecurityType | Returns a numbers indicating the security access a module has. Other modules or registers may refuse to execute a method invoked by a module which does not have a high enough security level. |

Table 21 below lists the behavior details for the module parameters.

TABLE 21

| Module Parameter | Behavior |
|---|---|
| update.sub.-- counter | will be incremented every time a write.sub.-- value( ) method is successfully invoked on one of the registers identified by the output handles.<br>Note: by default the update counter will be incremented every time an module writes an event register. |

TABLE 21-continued

| Module Parameter | Behavior |
|---|---|
| setup.sub.-- counter | will be incremented every time a write.sub.-- value( ) method is successfully invoked on one of the system registers identified by the setup handles and every time the write.sub.-- input.sub.-- handles( ) method is successfully invoked. |

Table 22 below provides a list of the modules (including the corresponding input, output and setup registers) presently supported by the presently preferred embodiment.

TABLE 22

| # | Module Name | Input Registers | Output Registers | Setup Registers | Module Description |
|---|---|---|---|---|---|
| 501 | Power Meter | V1 (NAR)<br>V2 (NAR)<br>V3 (NAR)<br>l1 (NAR)<br>l2 (NAR)<br>l3 (NAR)<br>l4 (NAR) | Vabc*(NVR).sup.1<br>Vllabc*(NVR)<br>labc*(NVR)<br>KWabc*(NVR)<br>KVARabc*(NVR)<br>KVAabe*(NVR)<br>PFSIGNabc*(NVR)<br>PFLEADabc*(NVR)<br>PFLAGabc*) NVR)<br>Vunbal(NVR)<br>lunbal(NVR)<br>l4(NVR)<br>Iresidual(NVR)<br>PhaseRev(BVR)<br>LineFreq(NVR)<br>Event(ER) | ode(ENR)<br>PT Pri Volts(NBR)<br>PT Sec Volts(NBR)<br>CT Pri (NMR)<br>CT Sec l(NBR)<br>14 CT Pri l(NBR)<br>14 CT Sec l(NBR)<br>l1 Polarity(ENR)<br>l2 Polarity(ENR)<br>l3 Polarity(ENR)<br>PhaseOrder(ENR)<br>NormFreq(ENR)<br>PhaseLabels<br>(ENR) | Basic 3-phase power met met meter.<br>PhaseOrder:<br>"ABC"<br>"ACB"<br>NormFreq:<br>"50"<br>"60"<br>"400"<br>PhaseLabels:<br>"ABC"<br>"RST"<br>"XYZ"<br>"RYB" |
| 502 | Analog Input | | ScaledAnalog(NVR)<br>Event(ER) | Zero Scale(NBR)<br>Full Scale(NBR)<br>Port(ENR) | Analog Input function.<br>Port indicates H/W Input port. |
| 503 | Analog Output | Source(NVR) | State(NVR)<br>Event(ER) | Zero Scale(NBR)<br>Full Scale(NBR)<br>OutputMode<br>(ENR)<br>Port(ENR) | Analog Output function.<br>OutputState gives present output value as a % of output full scale.<br>OutputMode:<br>"0–20 ma"<br>"4–20 ma"<br>note: OutputMode is not supported for all devices.<br>Port indicates H/W output port. |
| 504 | Digital Input | | State(BVR)<br>Trigger(DR)<br>Event(ER) | InputMode (ENR)<br>EvLogMode<br>(ENR)<br>InPolarity(ENR)<br>Debounce(NBR)<br>Port(ENR) | Processes raw digital signals received from H/W digital input channel.<br>Trigger on valid state changes.<br>InputMode:<br>"Pulse"<br>"KYZ"<br>EvLogMode:<br>"Log Off"<br>"Log On"<br>InPolarity: |

TABLE 22-continued

| # | Module Name | Input Registers | Output Registers | Setup Registers | Module Description |
|---|---|---|---|---|---|
| | | | | | "non-inverting"<br>"inverting"<br>Debounce in ms.<br>Port indicates H/W input port. |
| 505 | Digital Output | Source(BVR)<br>ForceOn(DR)<br>ForceOff(DR)<br>Normal(DR) | State(BVR)<br>Mode(BVR)<br>Event(ER) | EvLogMode (ENR)<br>OutPolarity(ENR)<br>PulseWidth(NBR)<br>Port(ENR) | Provides raw bit pattern for H/W digital output channel.<br>EvLogMode:<br>"Log Off"<br>"Log On"<br>OutPolarity:<br>"non-inverting"<br>"inverting"<br>PulseWidth:<br>0 = continuous output.<br>not 0 = pulse width in ms.<br>Port indicates H/W output port. |
| 506 | Pulser | Source(DR) | Event(ER) | PulseWidth(NBR)<br>OutputMode (ENR)<br>OutPolarity(ENR)<br>Port(ENR) | Proves pulse output (e.g. for Kwh pulsing). Output Port is pulsed every time a pulse is received at the Source input.<br>PulseWidth specified in ms.<br>OutputMode:<br>"Pulse"<br>"KYZ"<br>OutPolarity:<br>"non-inverting"<br>"inverting"<br>Port indicates H/W output port. |
| 508 | SWD | Source(NVR)<br>Sync(DR)<br>Reset(DR) | SWD(NVR)<br>Prediction(NVR)<br>Event(ER) | Period(NBR)<br>#Periods(NBR)<br>SyncMode(ENR)<br>PredictSpeed (NBR) | Provides SWD on source input.<br>Period in minutes.<br>SyncMode:<br>"internal"<br>"external"<br>Sync input is used in external sync mode, otherwise un-used.<br>PredictSpeed from 0–99 (99 = fast response). |
| 509 | TD | Source(NVR)<br>Reset(DR) | TD(NVR)<br>Event(ER) | Period(NBR)<br>TimeConstant (NBR) | Provides Thermal Demand calculation on a single source input.<br>Period in minutes.<br>TimeConstant is a percentage of the Period. |
| 510 | Integrator | Integrand(NVR)<br>Enable(BVR)<br>Reset(DR) | Result(NVR)<br>Pulse(DR)<br>Event(ER) | Divisor(NBR)<br>IntMode(ENR)<br>PulseSize(NBR) | Provides integration function.<br>Enable allows gating Divisor in seconds (for Kwh the Divisor would be 3600)<br>IntMode:<br>"forward"<br>"reverse"<br>"absolute"<br>"net"<br>The Pulse output will be pulsed when the Result output changes by the amount specified in PulseSize setup . . . |
| 511 | Min | Source(NVR)<br>Enable(BVR)<br>Reset(DR) | Min(NVR)<br>Trigger(DR) | Event(ER) | Scans Source register for new minimum values.<br>Enable allows gating for every new minimum the Min and Trigger registers are updated. |
| 512 | Max | Source(NVR)<br>Enable(BVR)<br>Reset(DR) | Max(NVR)<br>Trigger(DR) | Event(ER) | Scans Source register for new maximum values.<br>Enable allows gating for |

TABLE 22-continued

| # | Module Name | Input Registers | Output Registers | Setup Registers | Module Description |
|---|---|---|---|---|---|
| | | | | | every new maximum the Max and Trigger registers are updated. |
| 513 | Setpoint | Source(NVR/BVR) Enable(BVR) Reset(DR) | Status(BVR) Trigger(DR) Event(ER) | HiLim(NBR) LoLim(NBR) TDOperate(NBR) TDRelease(NBR) InputMode(ENR) EvaluateMode (ENR) EventPri(NBR) | Provides hysteric setpoint function on numberic of loolean value. Enable allows gating. Trigger on setpoint going ACTIVE. TDOperate and TDRelease in ms. InputMode: "Signed" "Absolute" EvaluateMode: "GreaterThan" "LessThan" |
| 514 | FFT | Source(NAR) Enable(BVR) | FFT(NAR) Event(ER) | | Performs FFT calculations on input source array and generates an array of complex numbers. |
| 515 | Harmonics Analyzer | Source(NAR) Enable(BVR) | HD1(NVR) . . . HDN(NVR) THD(NVR) TEHD(NVR) TOHD(NVR) KFactor(NVR) Event(ER) | | Performs harmonics calculations on an N-size array of complex numbers (i.e. from an FFT module). |
| 516 | Recorder | Source1 (NVR/BVR/NAR/ BAR/WR) . . . SourceN (NVR/BVR/NAR/ BAR/WR) Enable(BVR) Trigger(DR) | RecLog(LR) Event(ER) | Depth(NBR) RecMode(ENR) EvLogMode (ENR) | Provides a snapshot of the input source registers when trigger register is pulsed. Can record waveforms, arrays, and single value registers. Enable allows gating RecMode: "Circular" "Stop-when-full" EvLogMode: "Log Off" "Log On". |
| 517 | Wave form Formatter | RawWF(NAR/BAR) | FormattedWF(WR) Event(ER) | Format(ENR) | Formats waveform data. Format (#sampls/cyc x #cycles) "128.times.12" "64.times.28" etc . . . |
| 518 | Periodic Timer | Enable(BVR) Initialize(DR) | Trigger(DR) Event(ER) | Period(NBR) TimingMode (ENR) ResetMode(ENR) | Pulses the Trigger output whenever the timer value reaches zero. Period in ms. TimingMode: "Sync to UNIX" "Sync to Init" ResetMode: "init to Period" "init to zero" |
| 519 | One-shot Timer | Enable(BVR) TriggerIn(DR) | State(BVR) TriggerOut(DR) Event(ER) | Period(NBR) | Provides a one-shot timer. State: 1 when timer is running 0 after time out The Trigger Out activates at the end of the timing interval. Period in ms. |
| 520 | Counter | Trigger(DR) Initialize(DR) | Count(NVR) Event(ER) | Multiplier(NBR) UpDown(ENR) | Increment/Decrement Count register by the amount specified in the Multiplier register each time the counter is triggered. UpDown: "Count Down" "Count Up" |
| 521 | LogicalAndOr | Source1(BVR) . . . SourceN(BVR) | Results(BVR) Event(ER) | Mode(ENR) EvLogMode (ENR) | Performs either Logical AND, NAND or function on the source inputs. |

TABLE 22-continued

| # | Module Name | Input Registers | Output Registers | Setup Registers | Module Description |
|---|---|---|---|---|---|
| | | | | | Mode:<br>"AND"<br>"NAND"<br>"OR"<br>EvLogMode:<br>"Log Off"<br>"Log On" |
| 522 | Event Log Controller | Event1(ER)<br>. . . EventN(ER) | EventLog(ELR) | EvLogDepth (NBR)<br>AlarmPriority (NBR) | Logs all event records in EventLog regardless of priority.<br>Keeps track of previous and presently active alarms in EventLog. Any event with a priority equal to or above AlarmPriority is an alarm. |
| 528 | LogSchema | LogInout1 (LR)<br>. . . LogInputN (LR) | LogSchema(DSR) | | Uploads log records from the remote LogRegister inputs and stores them in a database schema. |
| 529 | EventSchema | EventInput1 (ELR)<br>. . . EventInputN (ELR) | EventSchema(DSR) | | Combines event records and alarm information from each IED and stores the data in a database schema. |
| 532 | Label | EventLog1 (ELR)<br>. . . EventLogN (ELR) | LableTable (DTR) | | Maintains a historic list of all labels that exist on each IED. The remote EventLogRegister inputs can be used to track label changes. Initially all labels are read by accessing the feature manager. |
| 533 | LogView | LogSchema (DSR)<br>LabelTable (DTR) | LogView (LVR) | | Acts as a bridge between the input database tables and the output LogViewRegister. The input tables are joined to produce detaild log records. |
| 534 | EventView | EventSchema (DSR)<br>LabelTable (DTR) | EventView (EVR) | | Acts as a bridge between the input database tables and the output EventViewRegister. The input tables are combined to produce detailed event records. |
| 524 | Comm | Reset (DR) | Event (ER) | CommMode (ENR)<br>Baudrate(ENR)<br>HandshakeMode (ENR)<br>RTSLevel(ENR)<br>CTSLevel(ENR)<br>RTSDelay(NBR)<br>UnitD(NBR) | Communications Interface.<br>CommMode:<br>"RS232"<br>"RS485"<br>BaudRate:<br>"300"<br>"1200"<br>etc . . .<br>HandshakeMode:<br>"RTS with level"<br>"CTS with level"<br>RTSLevel:<br>"active low"<br>"active high"<br>CTSLevel:<br>"active low"<br>"active high"<br>RTSDelay:<br>specifies transmission delay time (in ms) after RTS has been raised. |
| 523 | Data Acquisition | | Output1(NAR)<br>. . . OutputN(NAR) | | Provides sampled data from the waveforms of a power system. |
| 530 | External Control | | Numeric1(NVR)<br>. . . NumericN(NVR)<br>Trigger1(DR)<br>. . . TriggerN(DR)<br>Switch1(BVR)<br>. . . SwitchN(BVR) | | Provides registers that can be controlled externally. |

TABLE 22-continued

| # | Module Name | Input Registers | Output Registers | Setup Registers | Module Description |
|---|---|---|---|---|---|
| 525 | Diagnostics | Reset(DR) | Output1(BVR/NVR) . . . OutputN(BVR/NVR) Event(ER) | | Output registers provide diagnostic features . . . |
| 526 | Real-time Clock | | Time(TR) | | Provides real-time clock facility. Time register in universal (GMT) seconds. |
| 527 | Factory | | Event(ER) | Setup1 (ENR/NBR) . . . SetupN (ENR/NBR) | Used for Factory Purposes. All other uses violate the architecture. It has no owner and cannot be created or dewtroyed ("it merely exists"). It can be accessed only with the factory security level. |
| 531 | Symmetrical Components | Source1(NAR) Source2(NAR) Source3(NAR) Enable(BVR) | ZeroSeqMag(NVR) ZeroSeqPhase(NVR) PosSeqMag(NVR) PosSeqPhase(NVR) NegSeqMag(NVR) NeqSeqPhase(NVR) Event(ER) | Harmonic(NBR) | Calculates the magnitude and phase for each sequence component for a particular harmonic. Typically, FFT Modules is used to produce the Numeric Array Registers inputs. |

.sup.1 The method read.sub.-- output.sub.-- handles( ) will return handle in the order given here. This also applied to the methods read.sub.-- input.sub.-- handles and read.sub.-- setup.sub.-- handles( ) for all modules defined in this document.
Legned of register acronyms:
BAR -- Boolean Array Register
BVR -- Boolean Variable Register
CR -- Counter Register
DR -- Delta Register
ELR -- Event Log Register
ENR -- Enumerated Register
ESR -- Event Schema Register
EVR -- Event Register
LR -- Log Register
LSR -- Log Schema Register
NAR -- Numeric Array Register
NBR -- Numeric Bounded Register In the following description reference is made to "managers". It will be noted that managers are just a specific type of module which have additional functionality. The purpose of the managers is to manage modules. One manager is needed for each practical group of modules, such as setpoint modules and min modules.

Table 23 below provides a list of the methods which are added specifically for the manager class. (All class and module class methods are inherited by the manager class but are not shown here for reasons of brevity.)

TABLE 23

| # | Method | Return-type | Description |
|---|---|---|---|
| 100 | read.sub.-- module.sub.-- setups.sub.-- counter( ) | CounterType | Returns a number indicating how many times the setup registers of the modules below a manager have been changed. The master device can keep a local count of this number in order to determine if another master device has successfully invoked a method to change the setup of the device. For instance, if a master device keeps this count for the feature manager, it can tell if any setup register on the deivce has been changed without going to each individual module. |
| 101 | read.sub.-- module.sub.-- updates.sub.-- counter( ) | CounterType | Returns a number indicating how many times the output registers of the modules and managers beneath a certain manager have been updated. Used in the same fashion as Read Module Setups Counter, the Read Module Updates Counter is used to determine if any of the modules beneath the manager |

TABLE 23-continued

| # | Method | Return-type | Description |
|---|---|---|---|
| | | | have successfully invoked a method to update their output registers. (In the current embodiment, managers have no outputs.) |
| 1500 | create.sub.-- module(Class Type) | HandleType | Creates a module and stores the module handle in the setup handles array; return handle to module. The method read.sub.-- managed.sub.-- class indicates which class of module can be created. |
| 1501 | destroy.sub.-- module(HandleType) | BooleanType | Destroys a module. Handle must be one of setup handles or an exception will be returned and the method will fail. The resources for that module are then available to perform other functions on the device. |
| 1502 | read.sub.-- managed.sub.-- class( ) | ClassType | Returns the class of module which can be created with the create.sub.-- module method. |

Every system has a "root" manager module called the feature manager. The feature manager has setup handles to all the other managers. Importantly, the feature manager handle is identical for all systems. The handle for the feature manager is 2. Starting with this handle, it is possible to determine the entire system configuration.

Figure 19A:
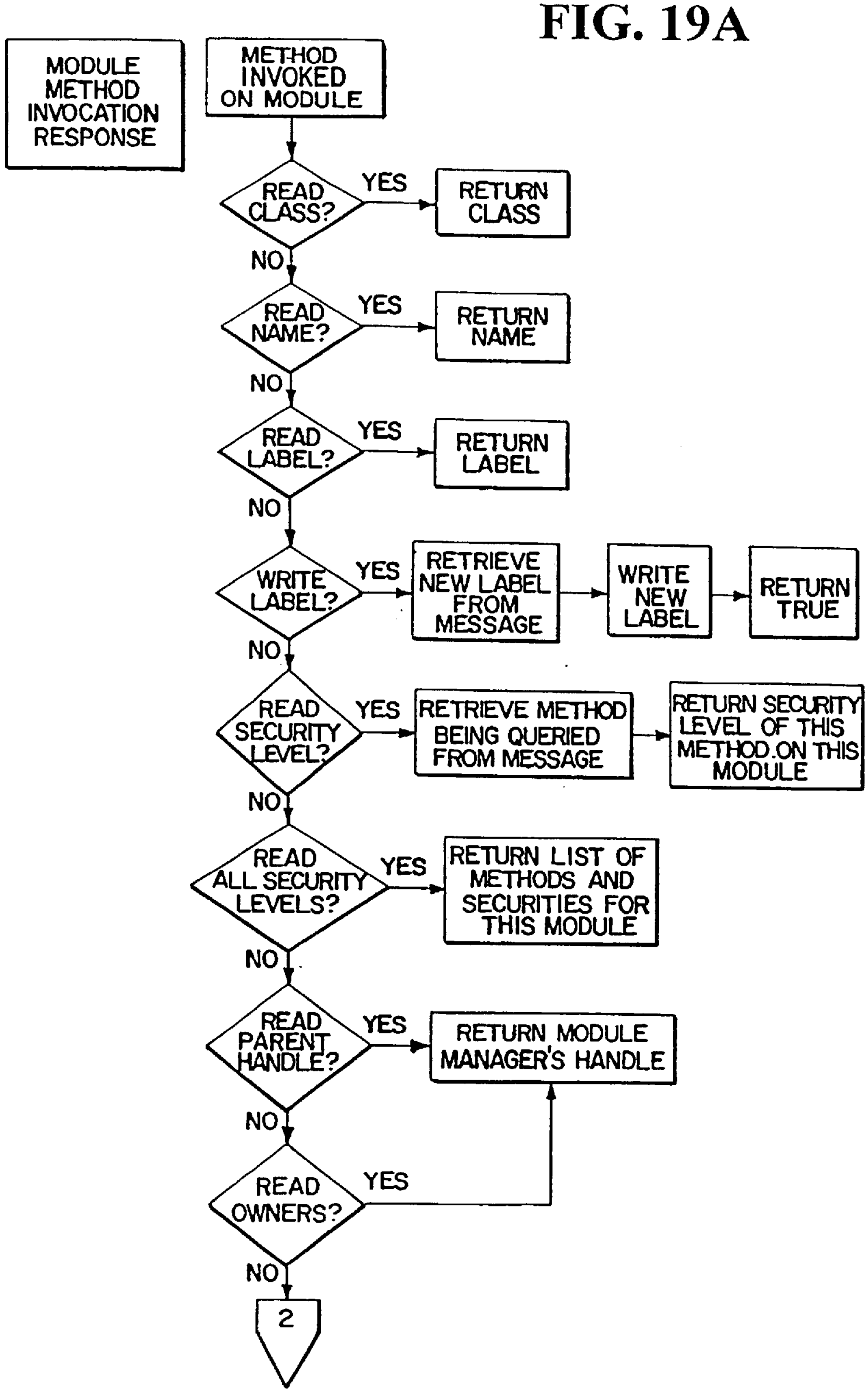
FIGS. 19A–19C show a flowchart of a preferred embodiment of the logic for the module operation.
Figure 19B:
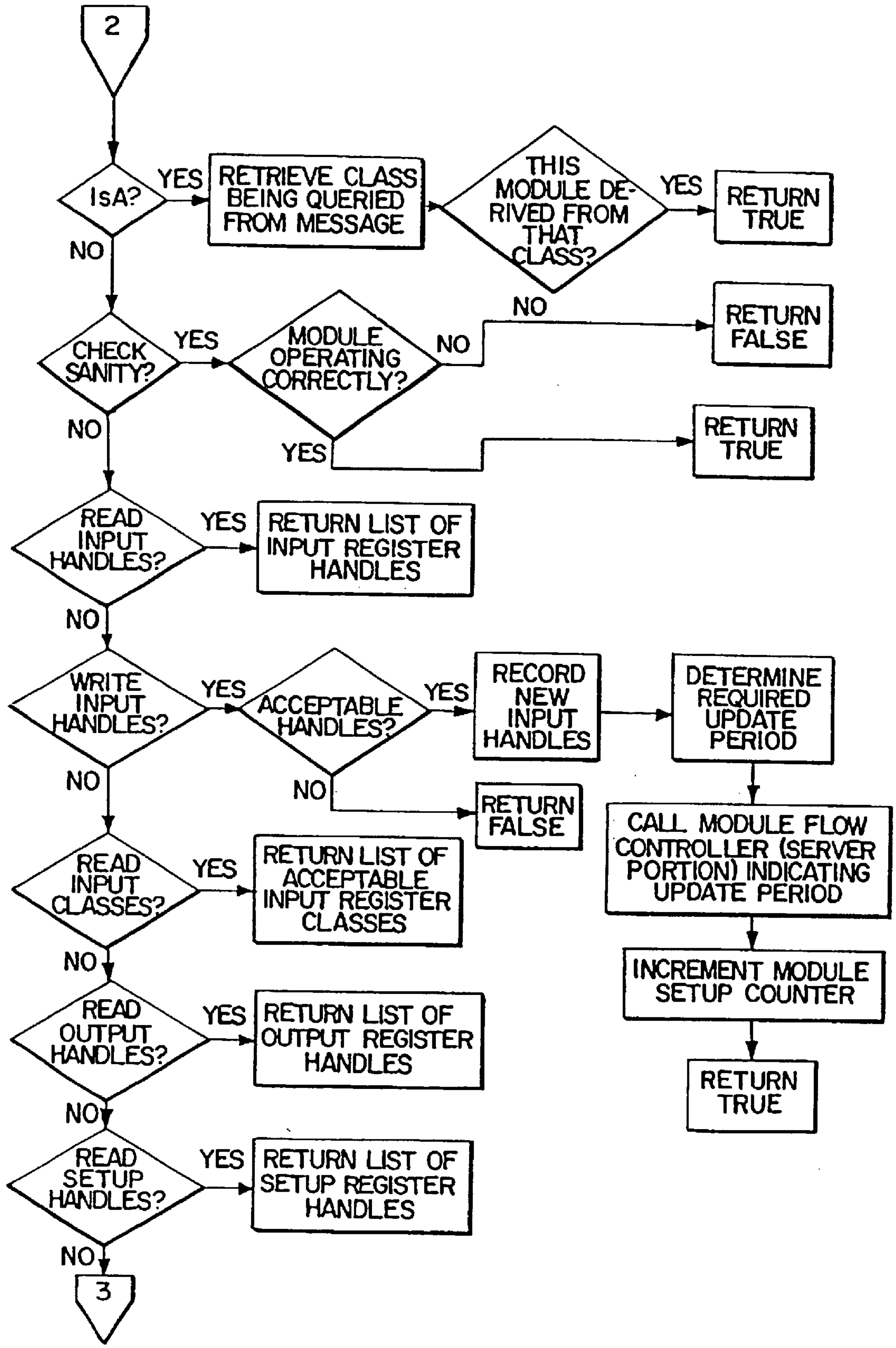
Figure 19C:
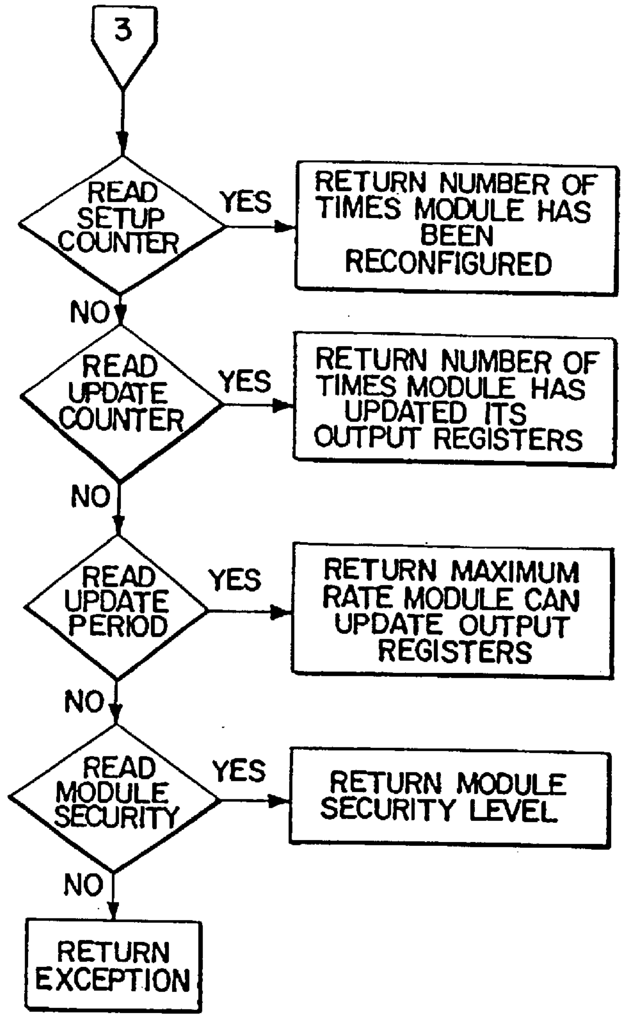

As was mentioned previously, modules act as both clients and servers in the object oriented architecture. In the present embodiment, the client and server portion of the modules operate separately. The server portion of the modules respond to method invocations. The server portion follows the same logic for all modules (except the managers) on the device. A flow chart of the logic for the server portion of a module is shown in FIGS. 19A–19C.

Figure 11A:
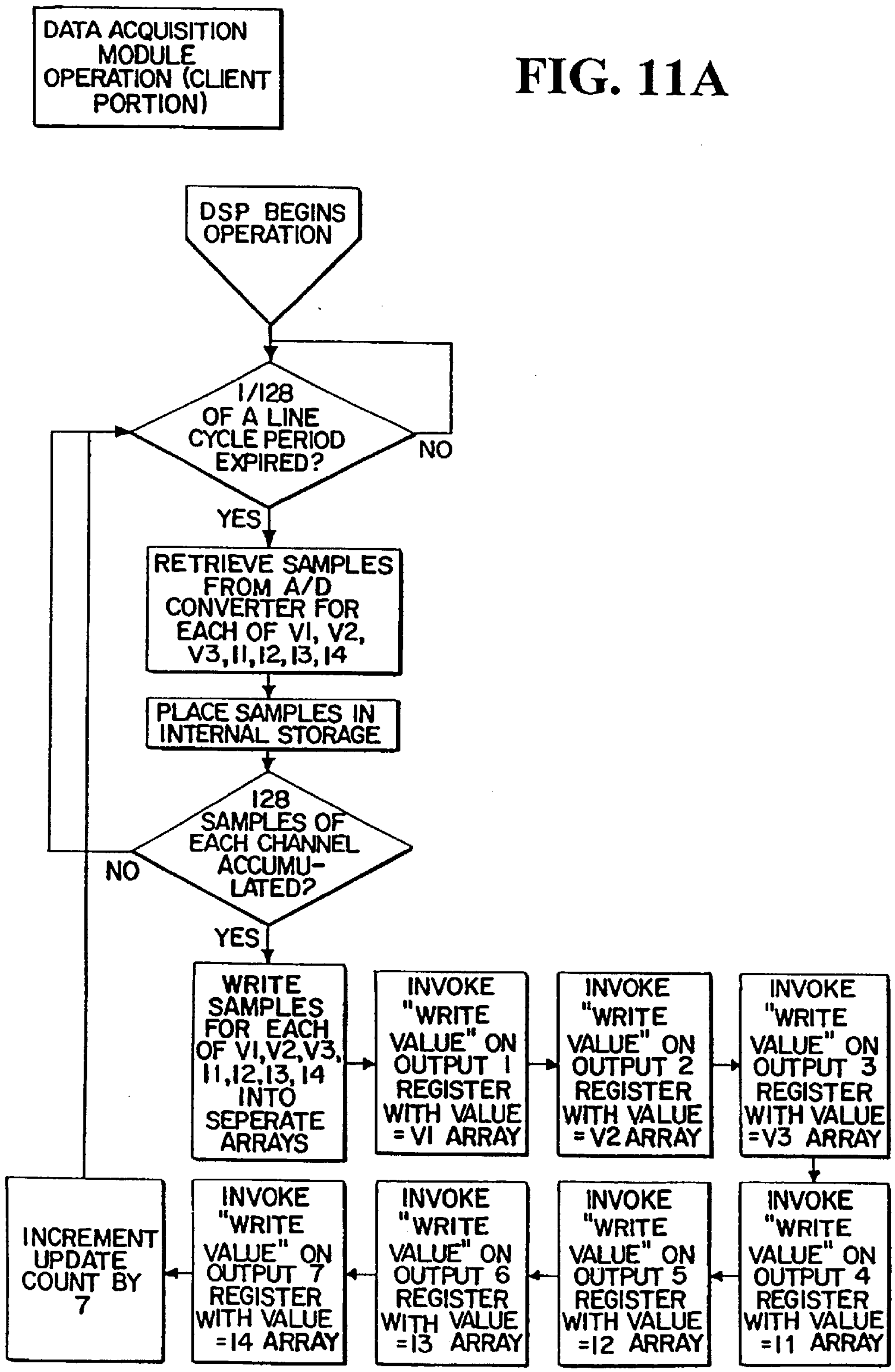
FIG. 11A shows a flowchart of a preferred embodiment of the logic for the client portion of the data acquisition module.
Figure 12:
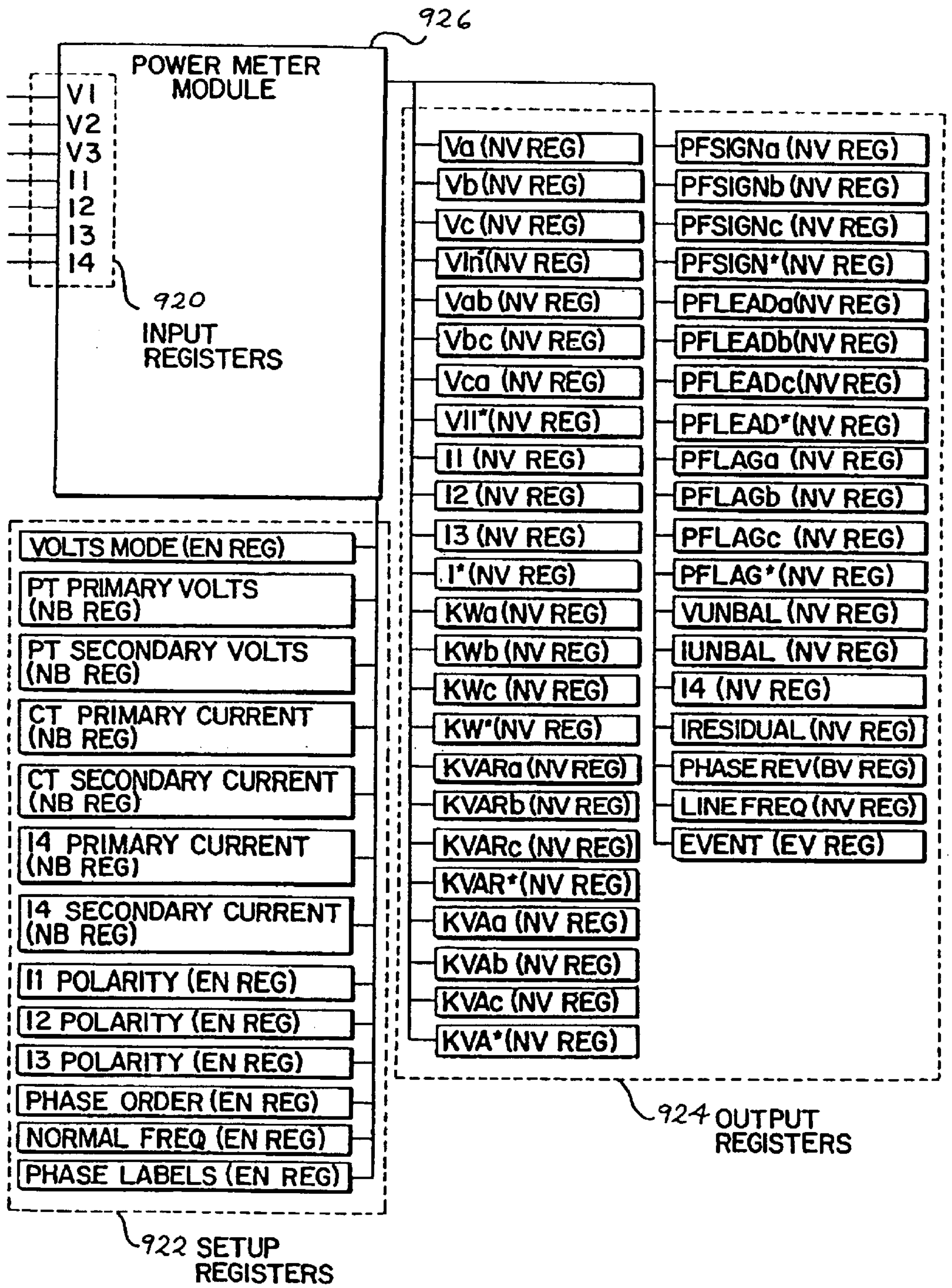
FIG. 12 schematically illustrates a preferred embodiment of the power meter module and its respective registers.
Figure 12A:
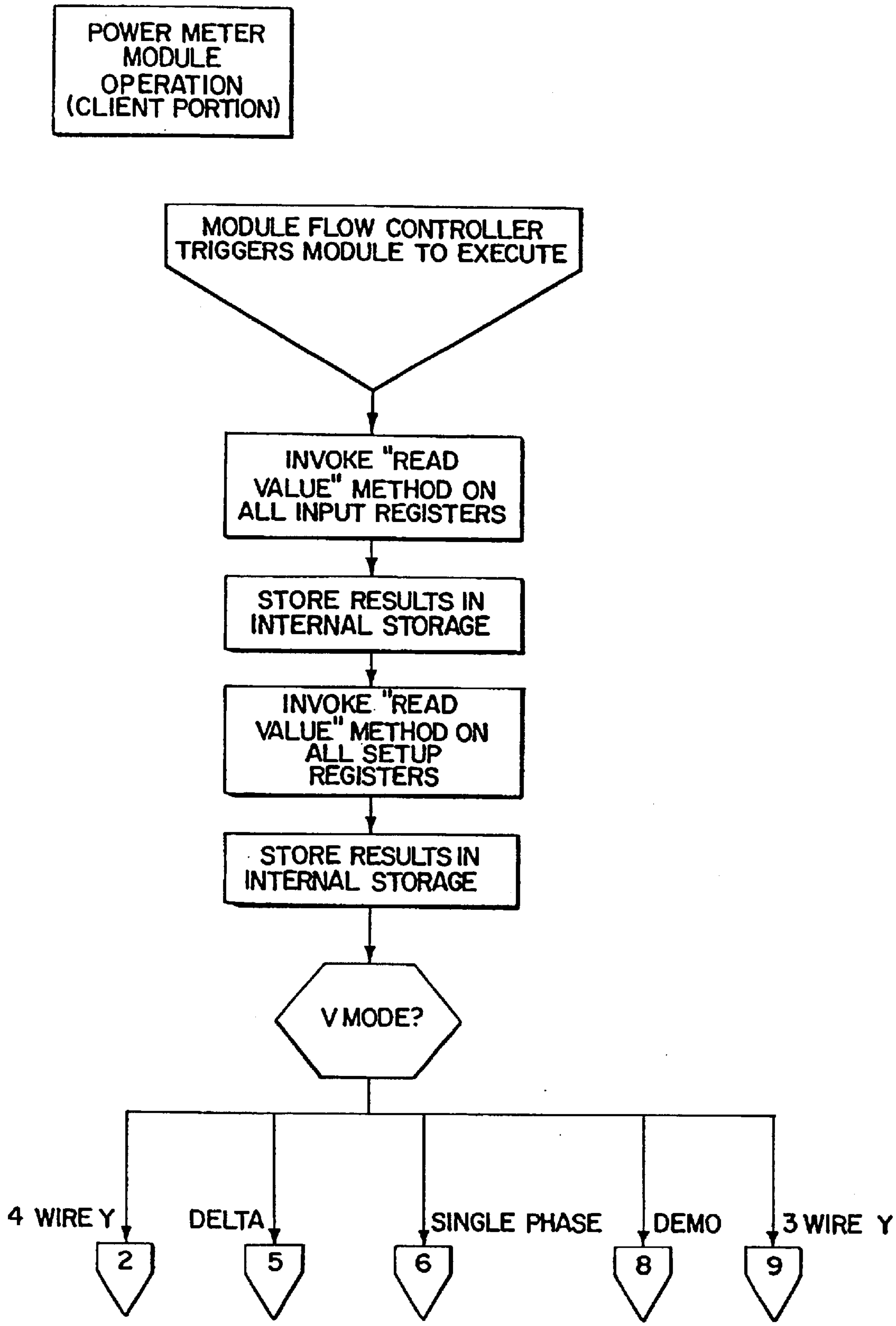
FIGS. 12A–12L show flowcharts of a preferred embodiment of the logic for the client portion of the power meter module.
Figure 12B:
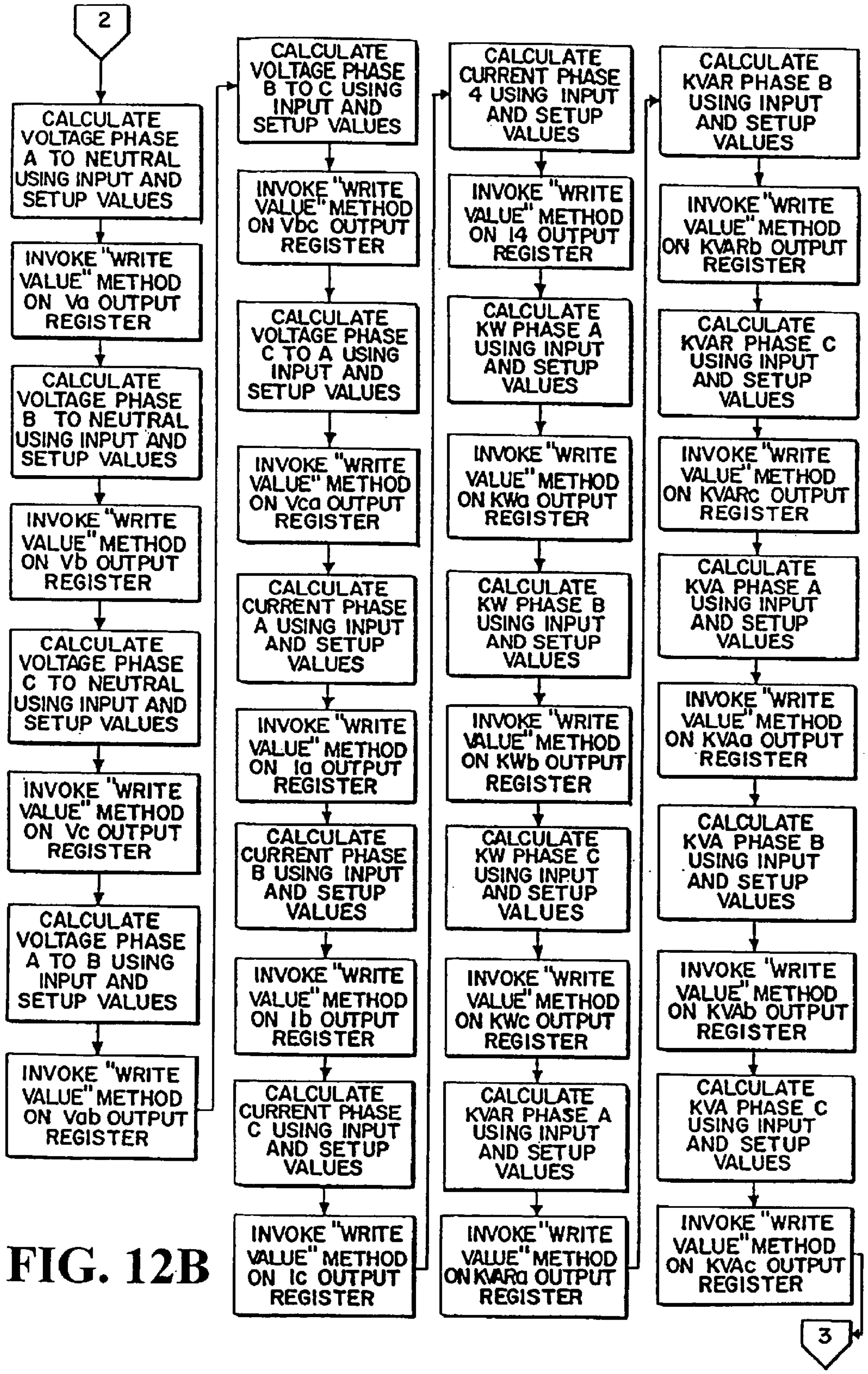
Figure 12C:
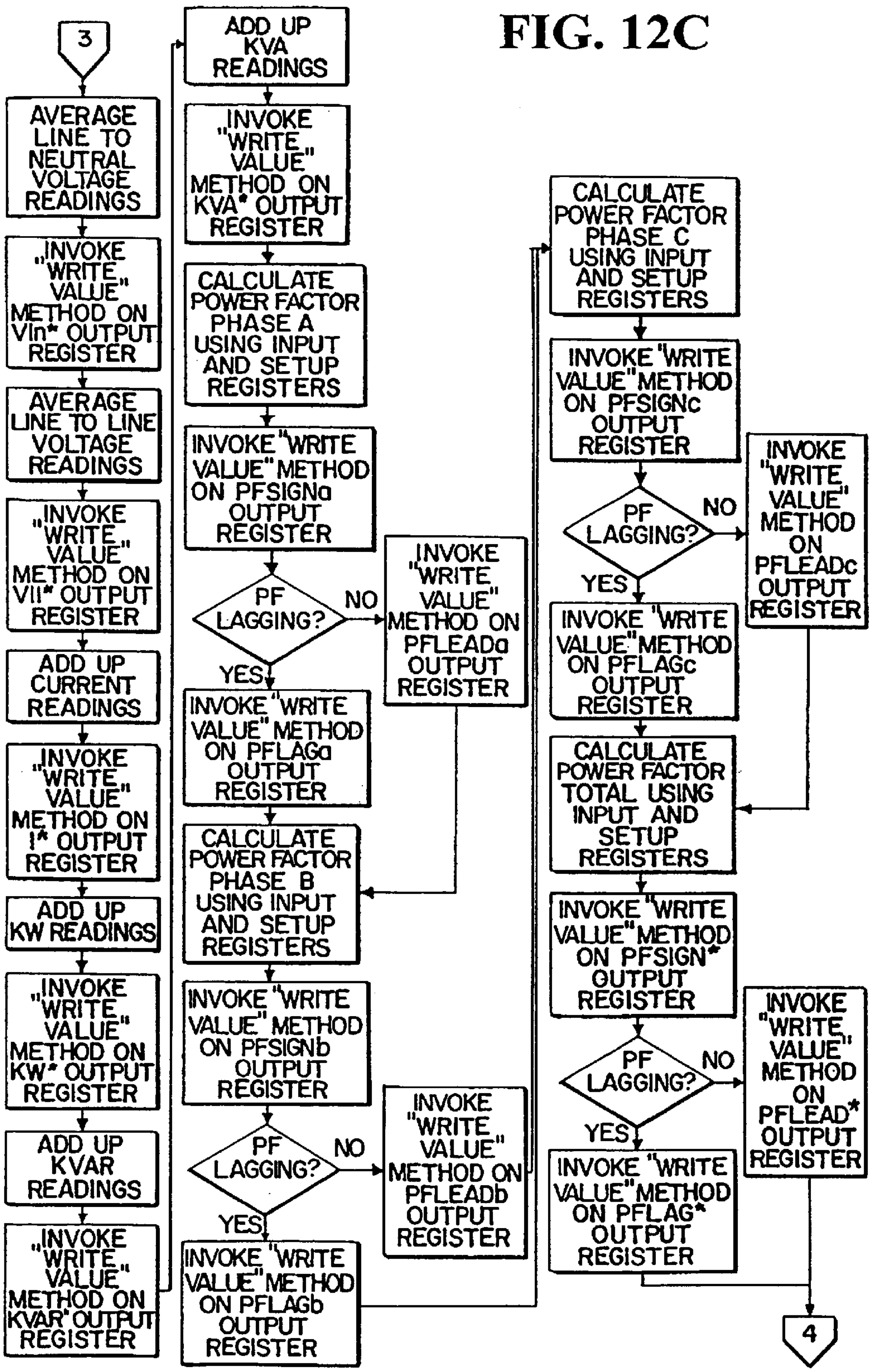
Figure 12D:
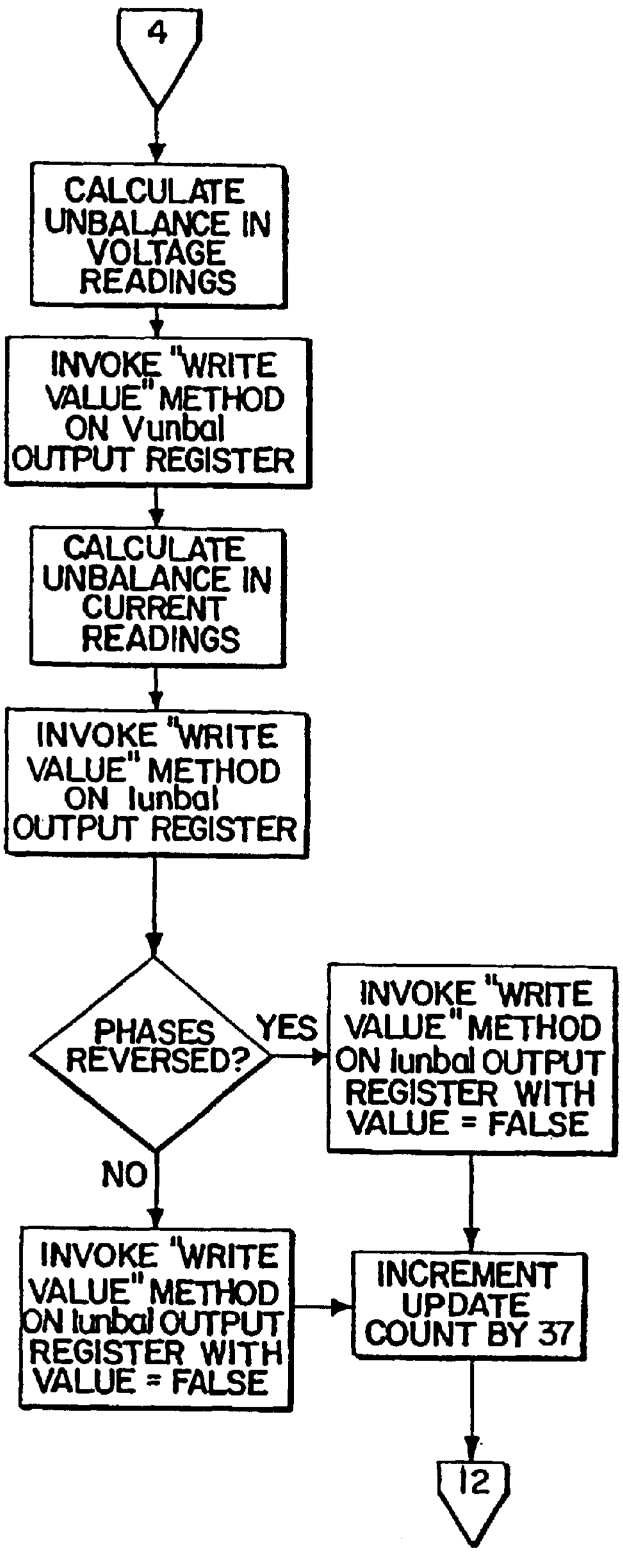
Figure 12H:
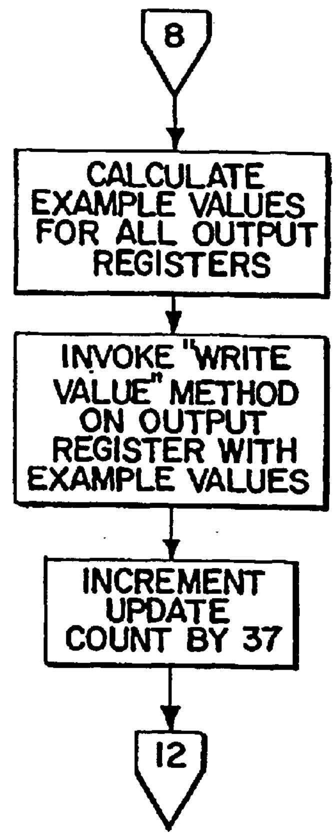
Figure 12E:
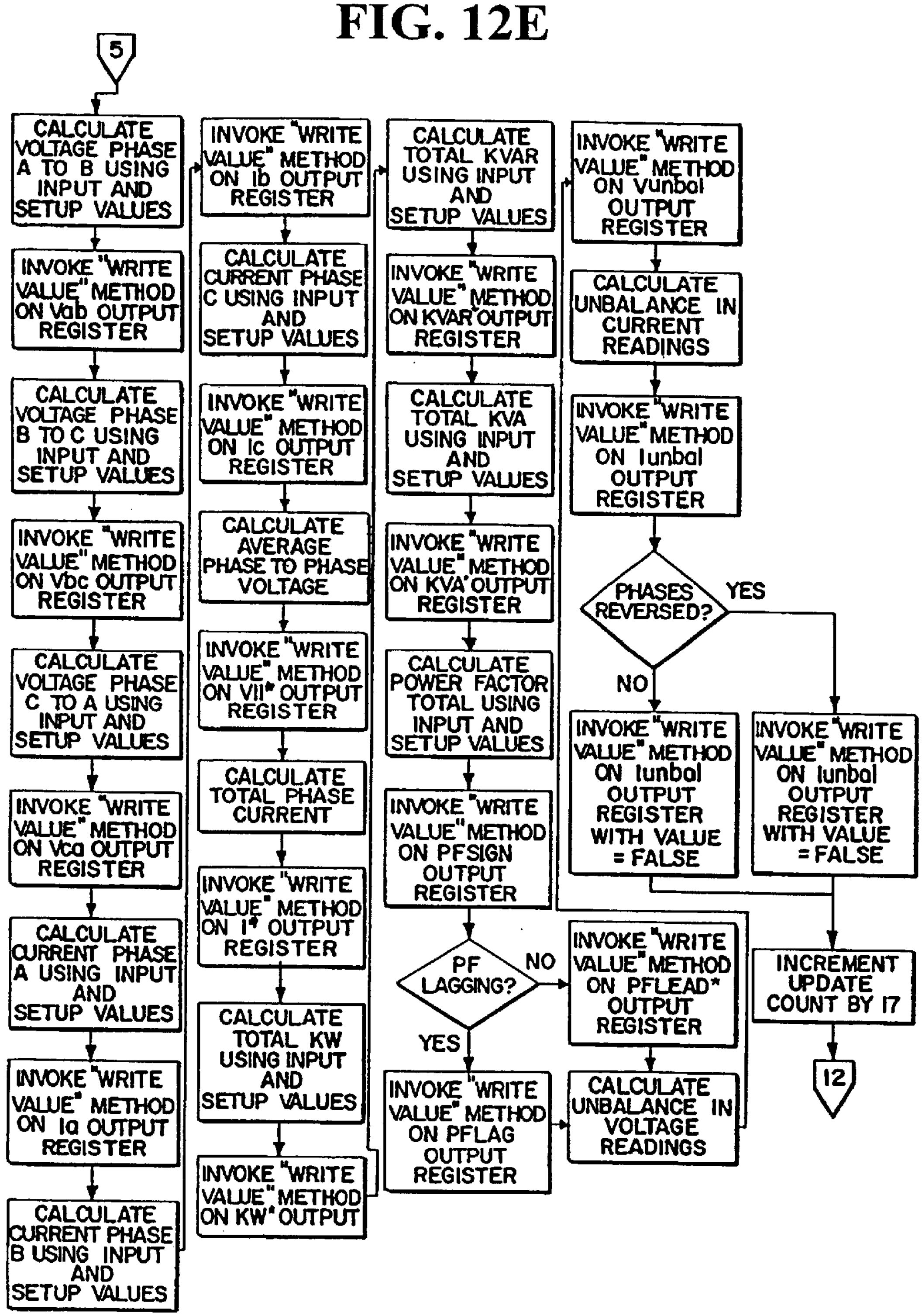
Figure 12F:
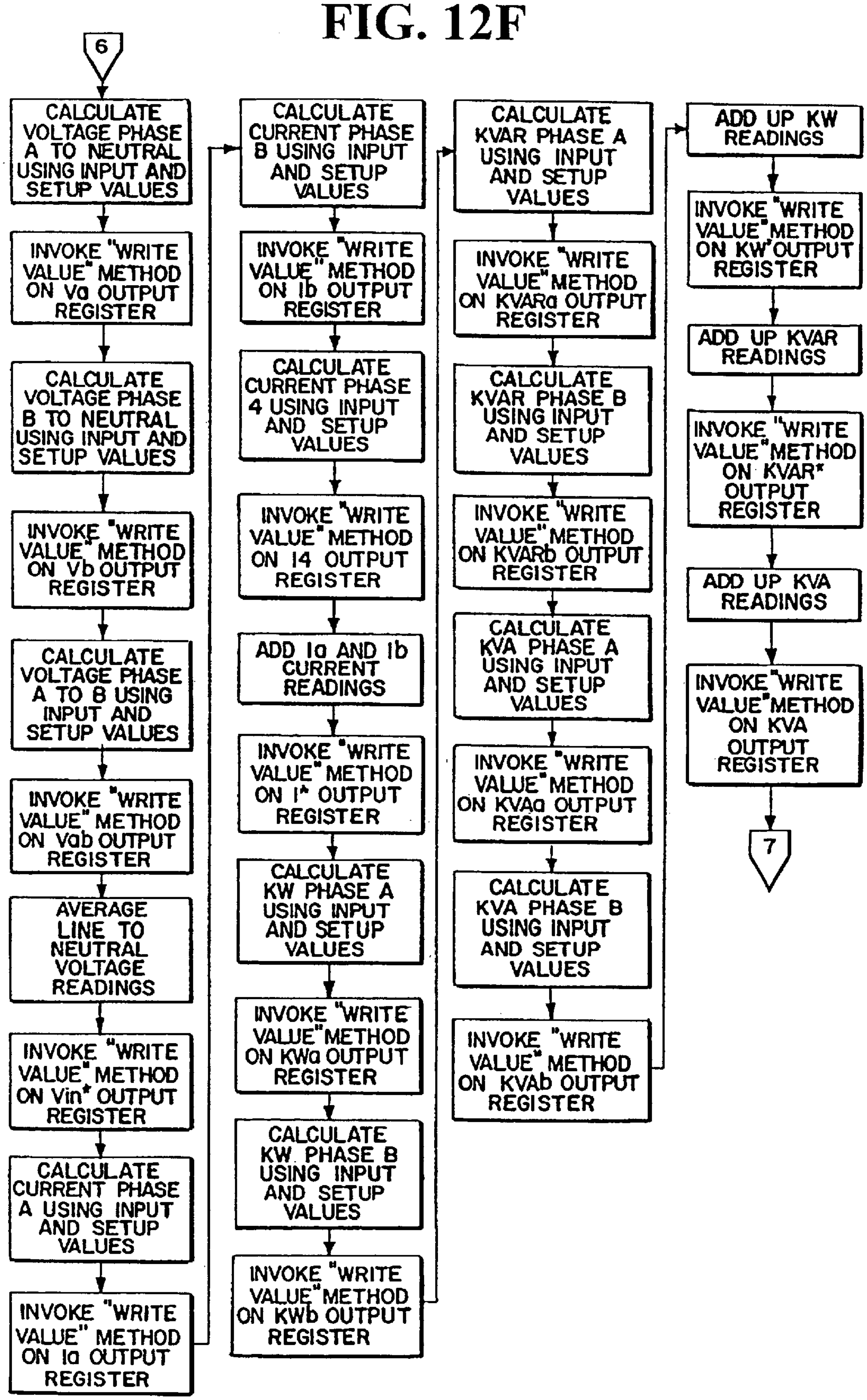
Figure 12G:
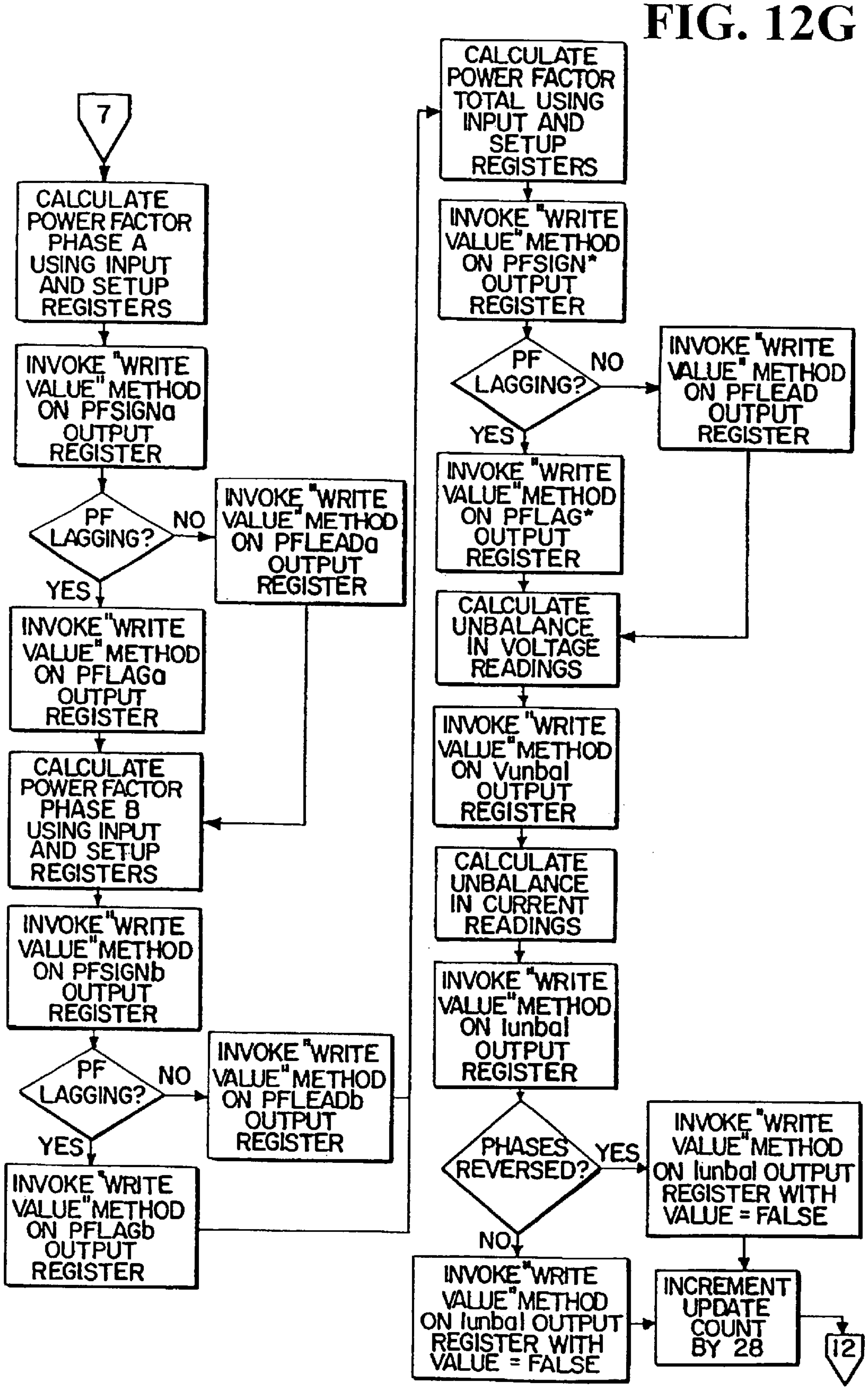
Figure 12I:
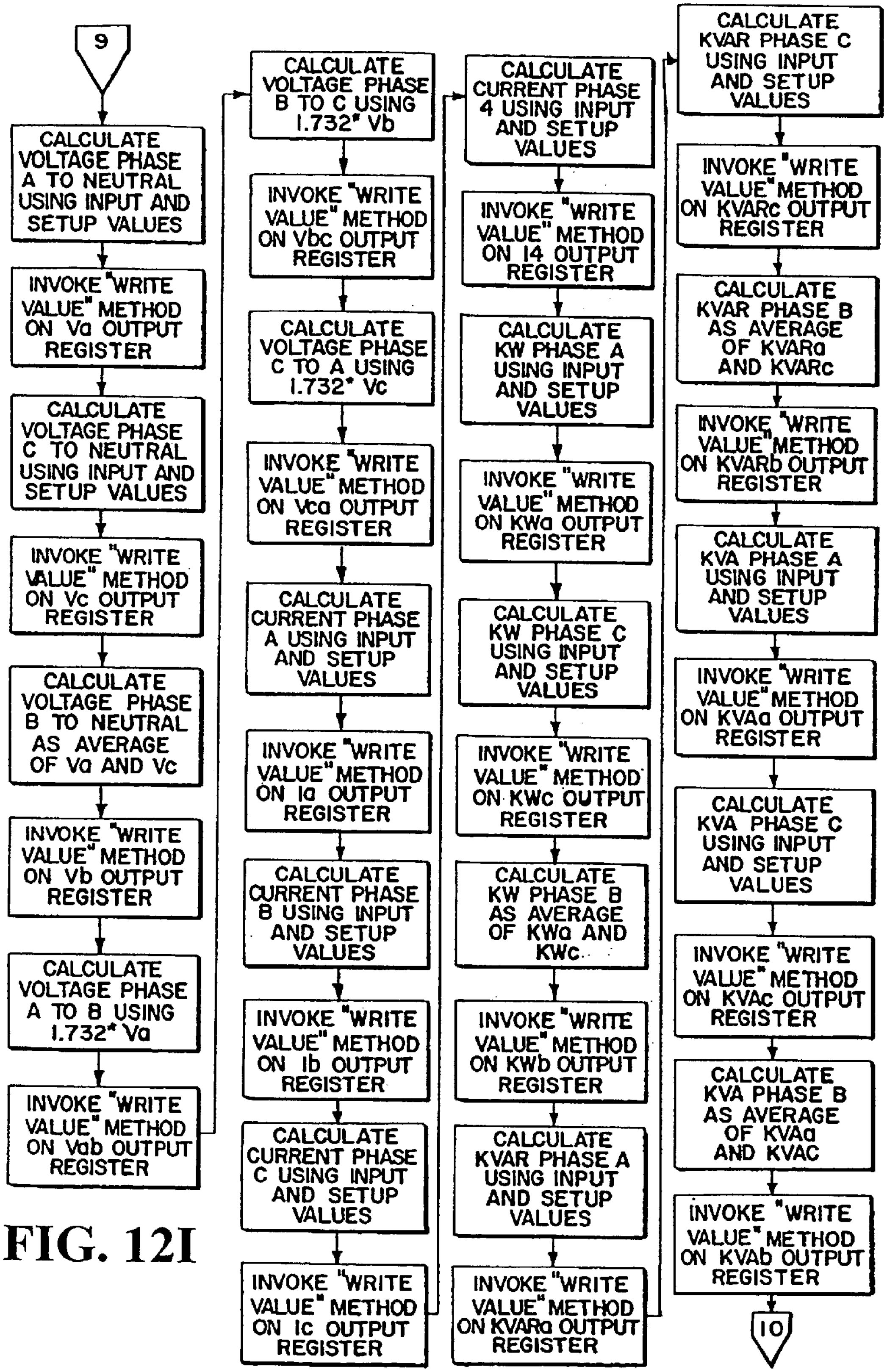
Figure 12J:
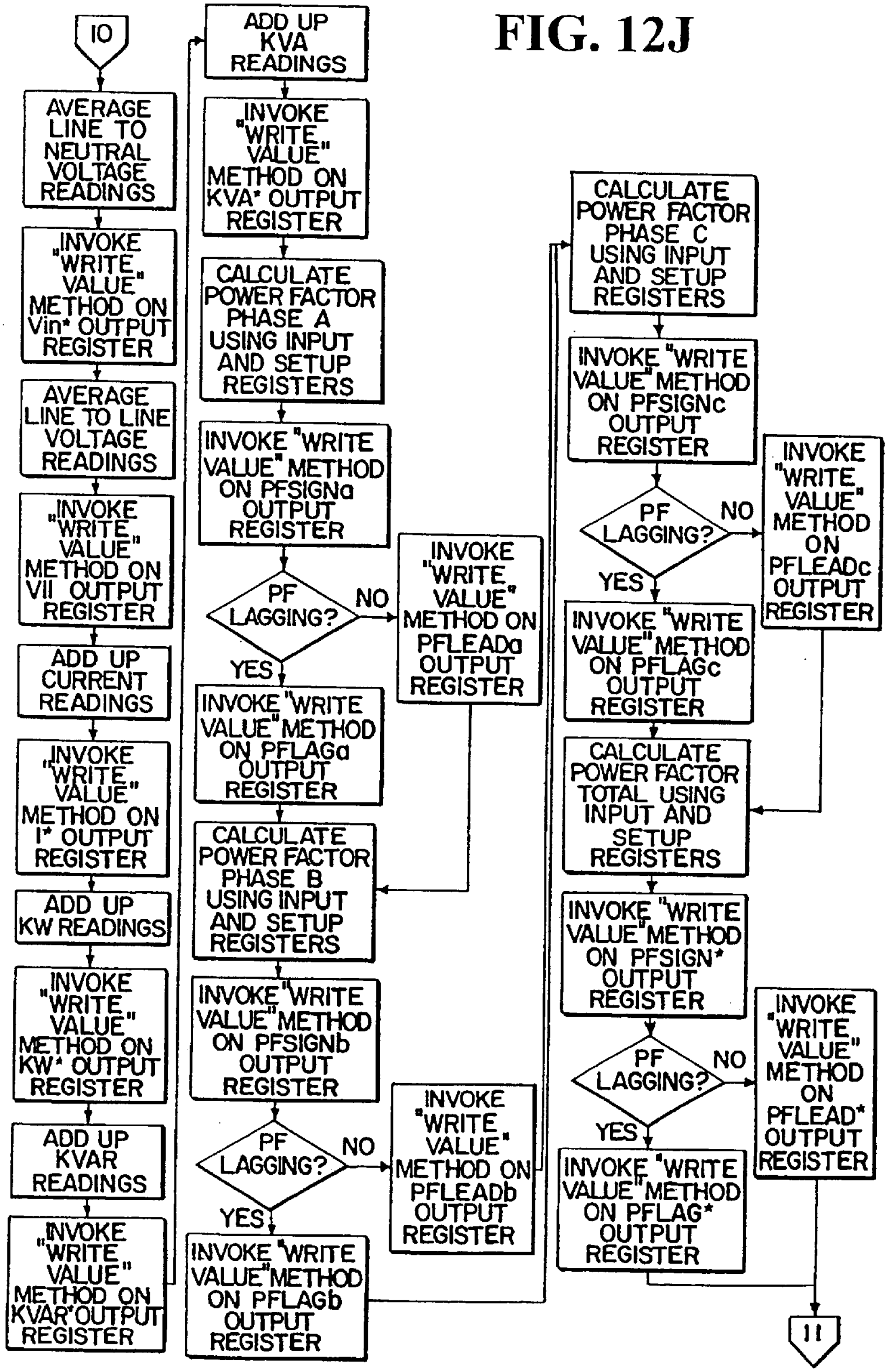
Figure 12K:
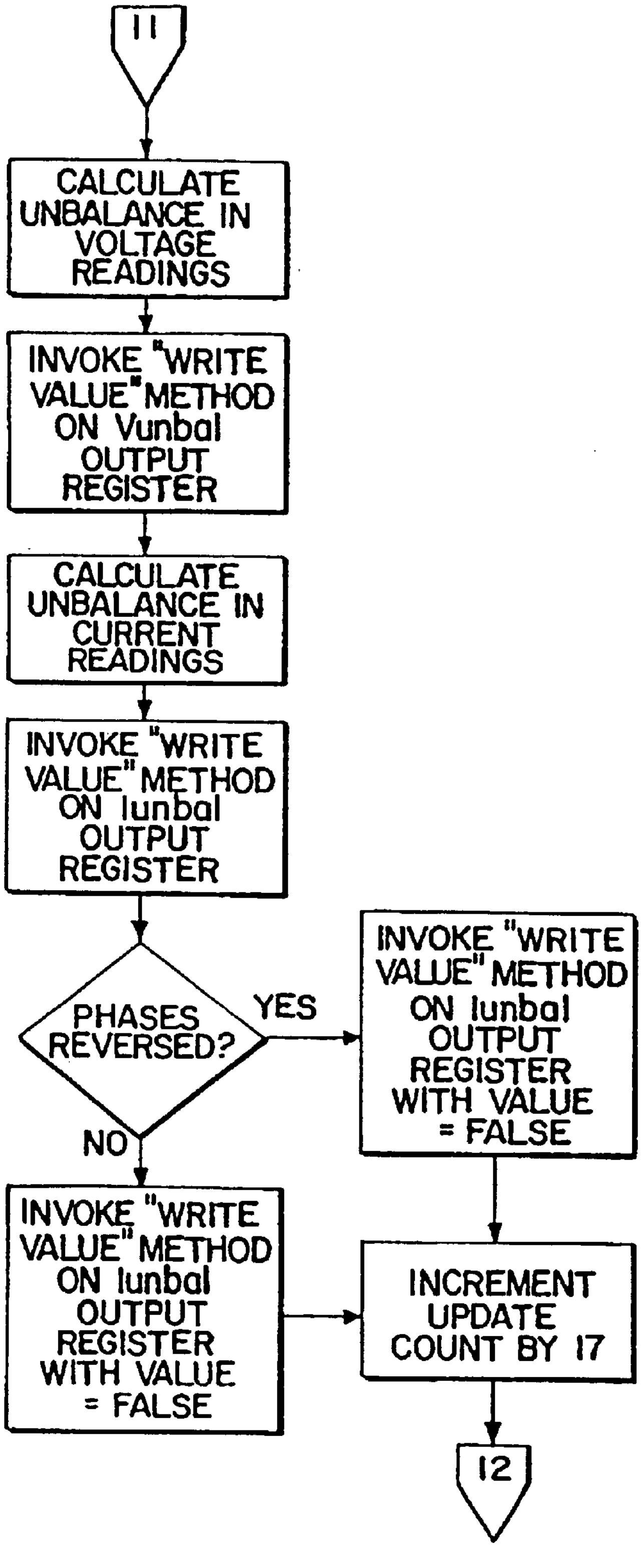
Figure 12L:
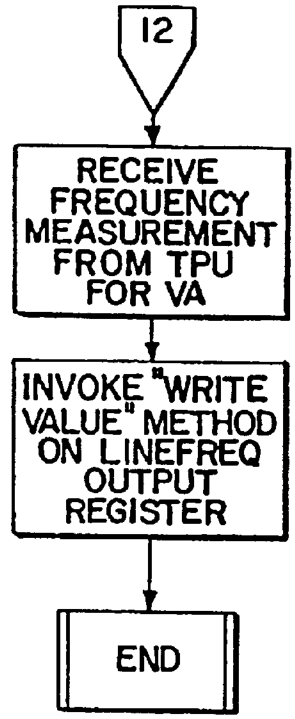

A description is now given of how the modules described above are used in the system of FIGS. 8–10. In the preferred embodiment the output registers from the data acquisition module 952 (FIG. 11) (which are digital signals representing the samples of the voltage and current) are permanently connected as input registers 120 of a module called the power meter module 926 (FIG. 12). Conceptually, the data acquisition module encompasses signal conditioning circuitry 860, 862, 864, 866A, 866B, 866C, 868A, 868B, 868C, 870, the A/D converters 829, 830 and software in the DSP 828. The interface between the data acquisition module and the power meter module includes the dual port RAM 827. A flow chart for the logic of the client portion of the data acquisition module 952 is shown in FIG. 11A. The power meter module 926 owns setup registers 922 which modify the operation of the power meter module 926 and output registers 924 which contain the results of the calculations that the power meter module does and can be connected to other modules. A flow chart of the logic for the power meter module 926 is shown in FIGS. 12A–12L.

Figure 13:
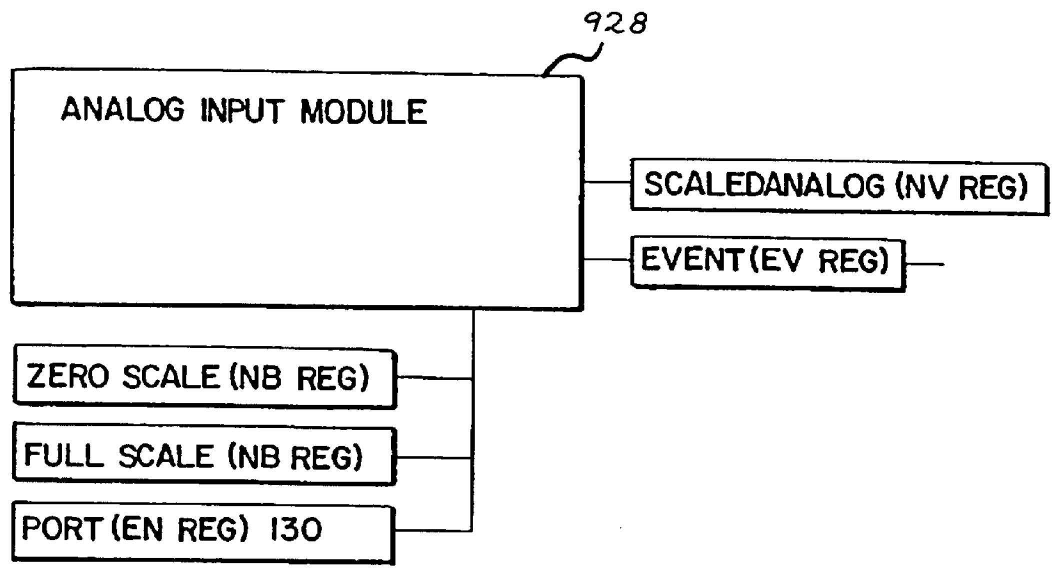
FIG. 13 schematically illustrates a preferred embodiment of the analog input module and its respective registers.
Figure 14:
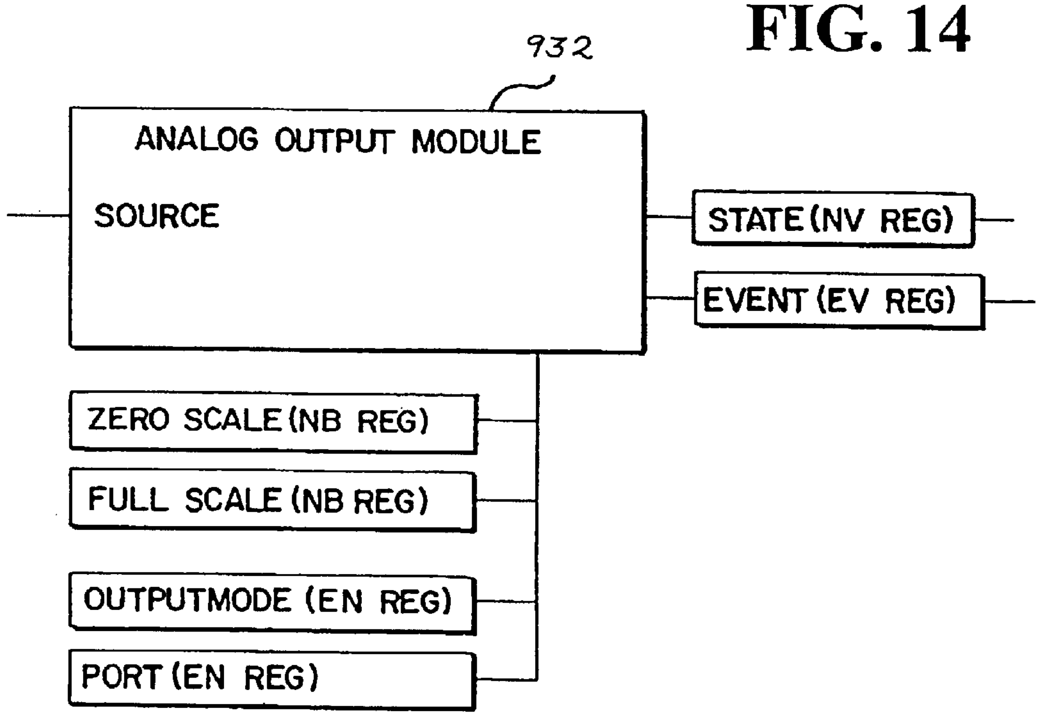
FIG. 14 schematically illustrates a preferred embodiment of the analog output module and its respective registers.
Figure 13A:
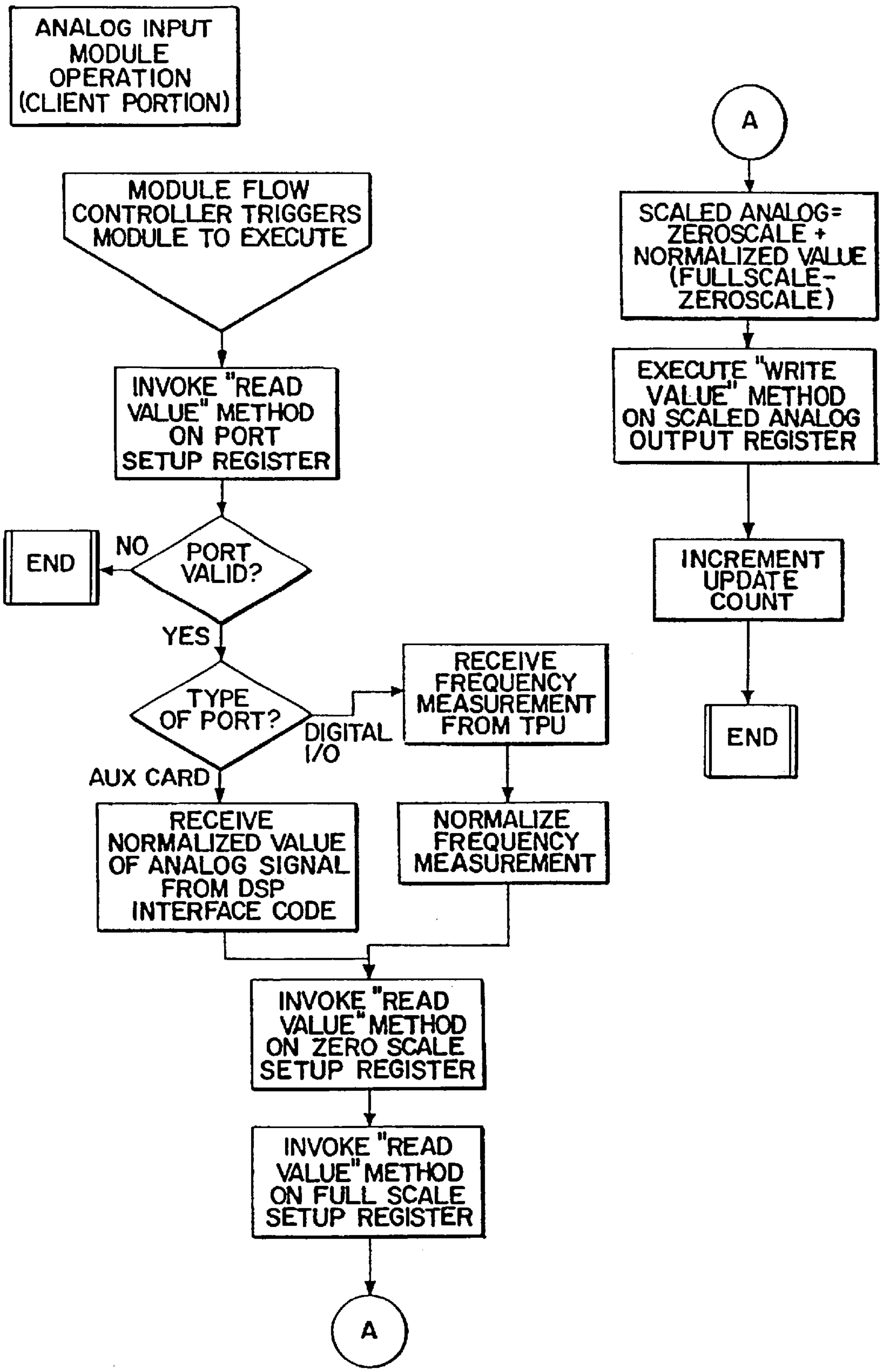
FIG. 13A shows a flowchart of a preferred embodiment of the logic for the client portion of the analog input module.

The module called the analog input module is an example of a module which connects to a physical signal in a different way. A preferred embodiment of the analog input module 928 is illustrated schematically in FIG. 13. An exemplary embodiment of the logic for the client portion of the analog input module of FIG. 13 is illustrated in flowchart form in FIG. 13A. The analog input module 928 owns a port setup register 930 which defines which of the auxiliary input signals 820 the module is associated with. Analog input modules can also be connected to digital I/O signals 844 (FIG. 9). In this configuration, the Digital I/O transceiver 849 operates in input mode and the analog input module converts the frequency of the digital signal into a number. In this embodiment, an external voltage to frequency converter is connected to the digital input signal line.

Figure 14A:
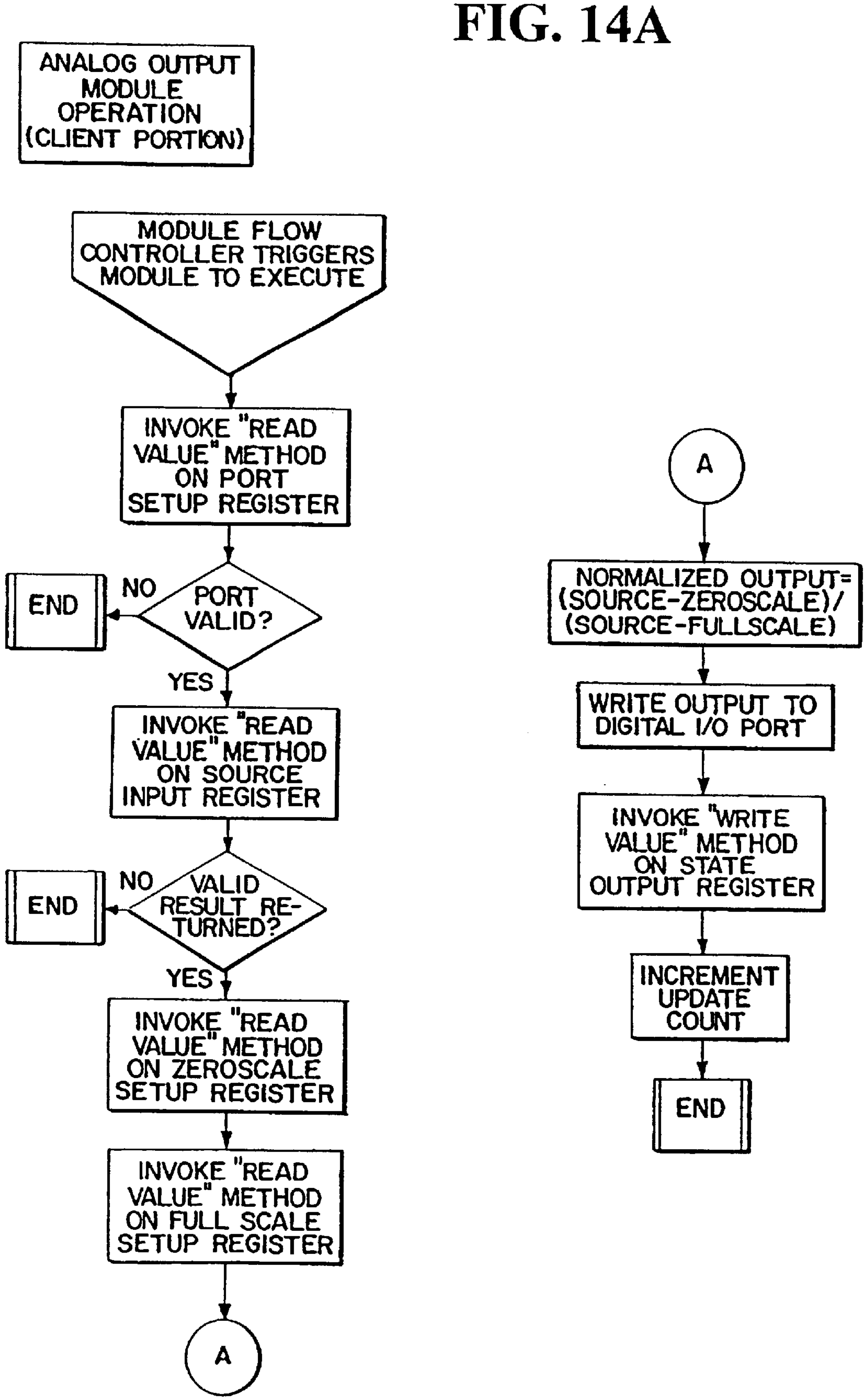
FIG. 14A shows a flowchart of a preferred embodiment of the logic for the client portion of the analog output module.
Figure 16:
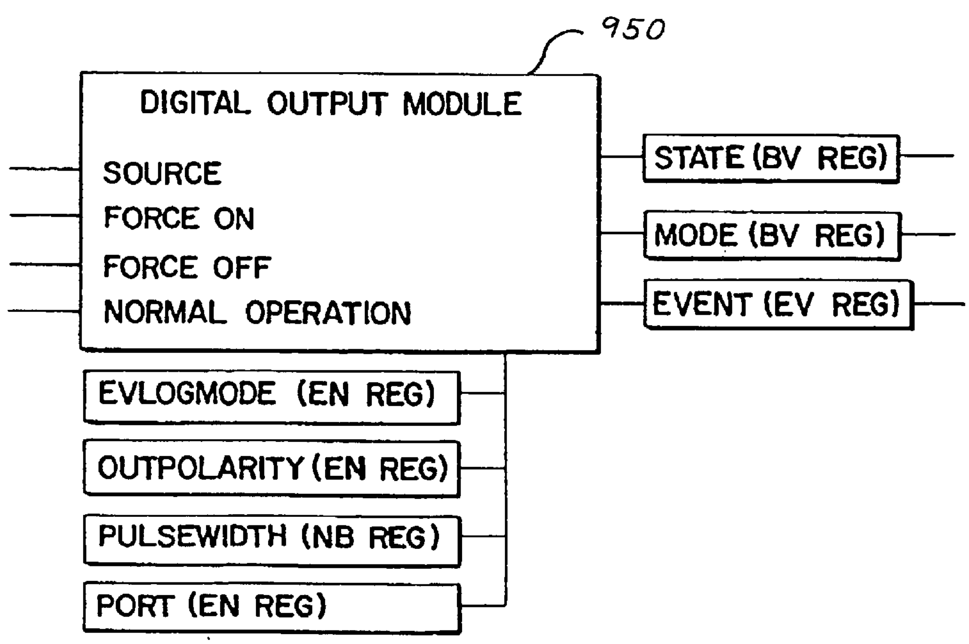
FIG. 16 schematically illustrates a preferred embodiment of the digital output module and its respective registers.

Analog output modules can also be connected to the Digital I/O Signals 844. In this configuration, an external device is connected to the I/O line which converts the digital signals coming from the analog output module 930 to an analog signal. A preferred embodiment of the analog output module 930 is illustrated schematically in FIG. 14. An exemplary embodiment of the logic for the client portion of the analog output module 930 is illustrated in FIG. 14A in flowchart form.

Figure 15:
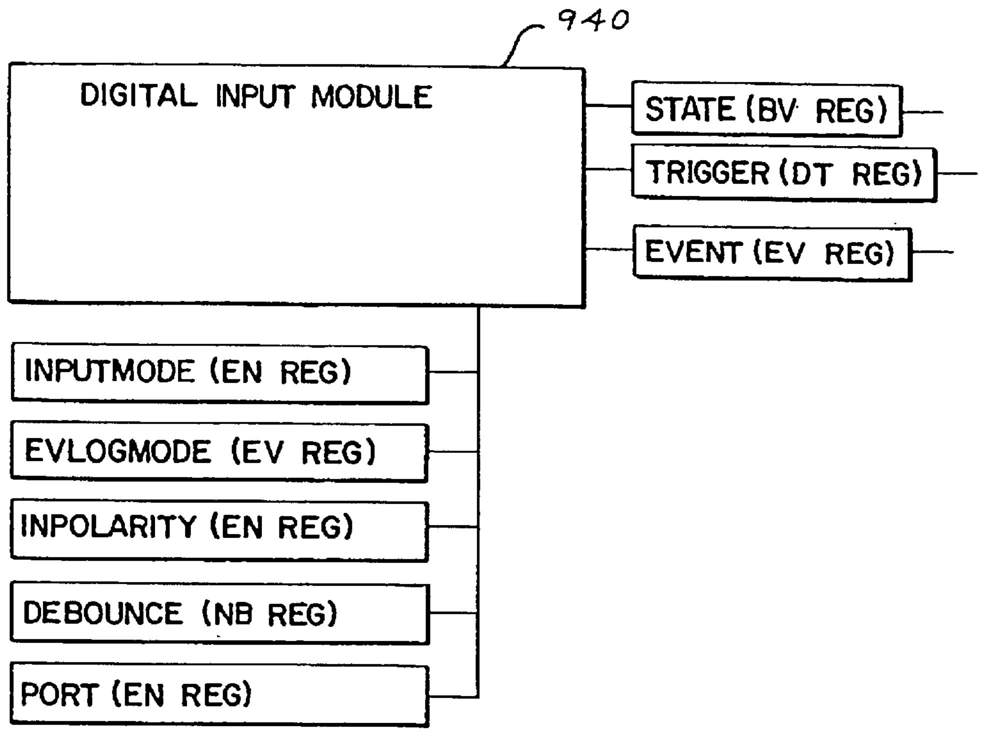
FIG. 15 schematically illustrates a preferred embodiment of the digital input module and its respective registers.
Figure 15A:
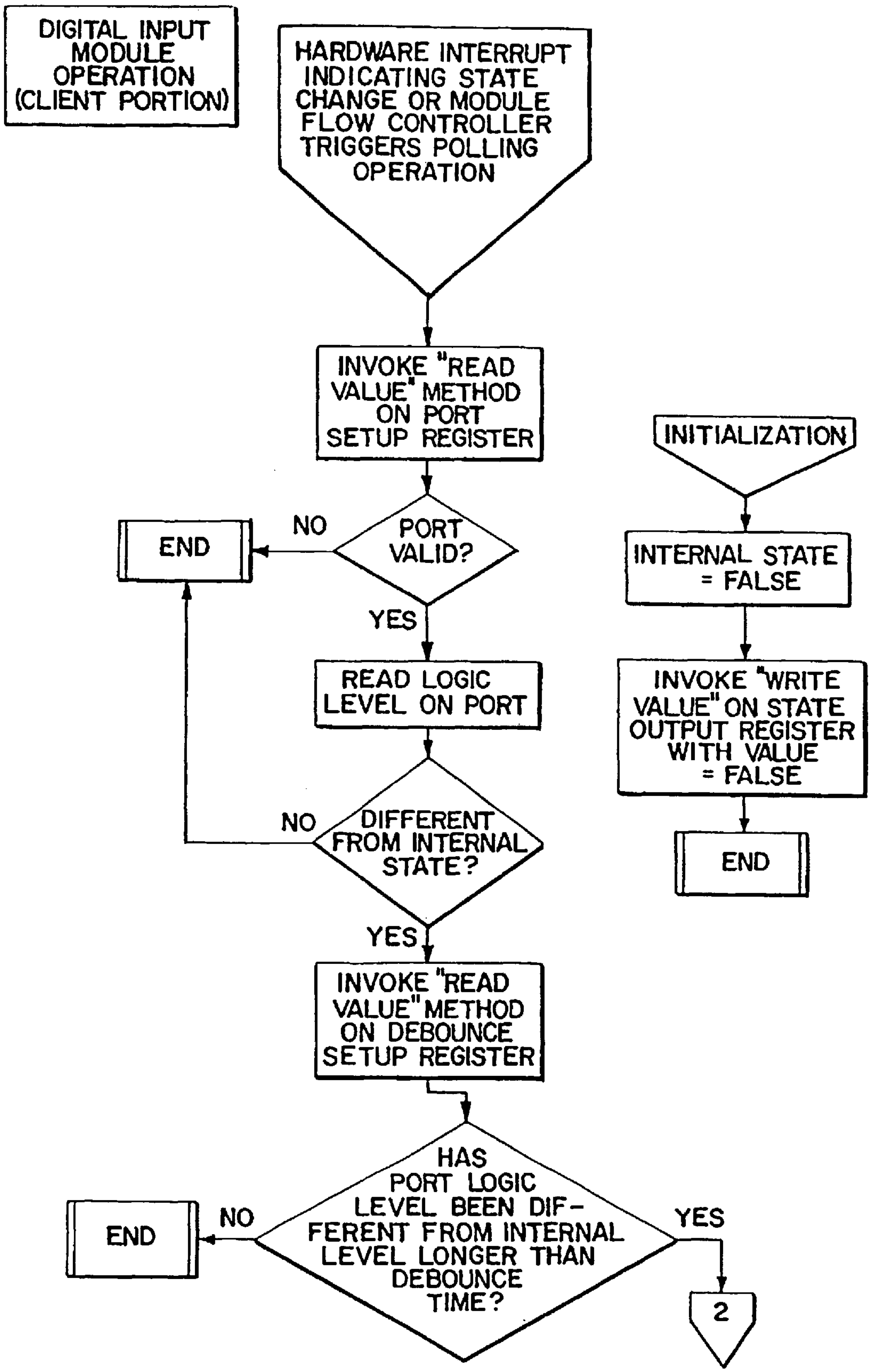
FIGS. 15A and 15B show a flowchart of a preferred embodiment of the logic for the client portion of the digital input module.
Figure 15B:
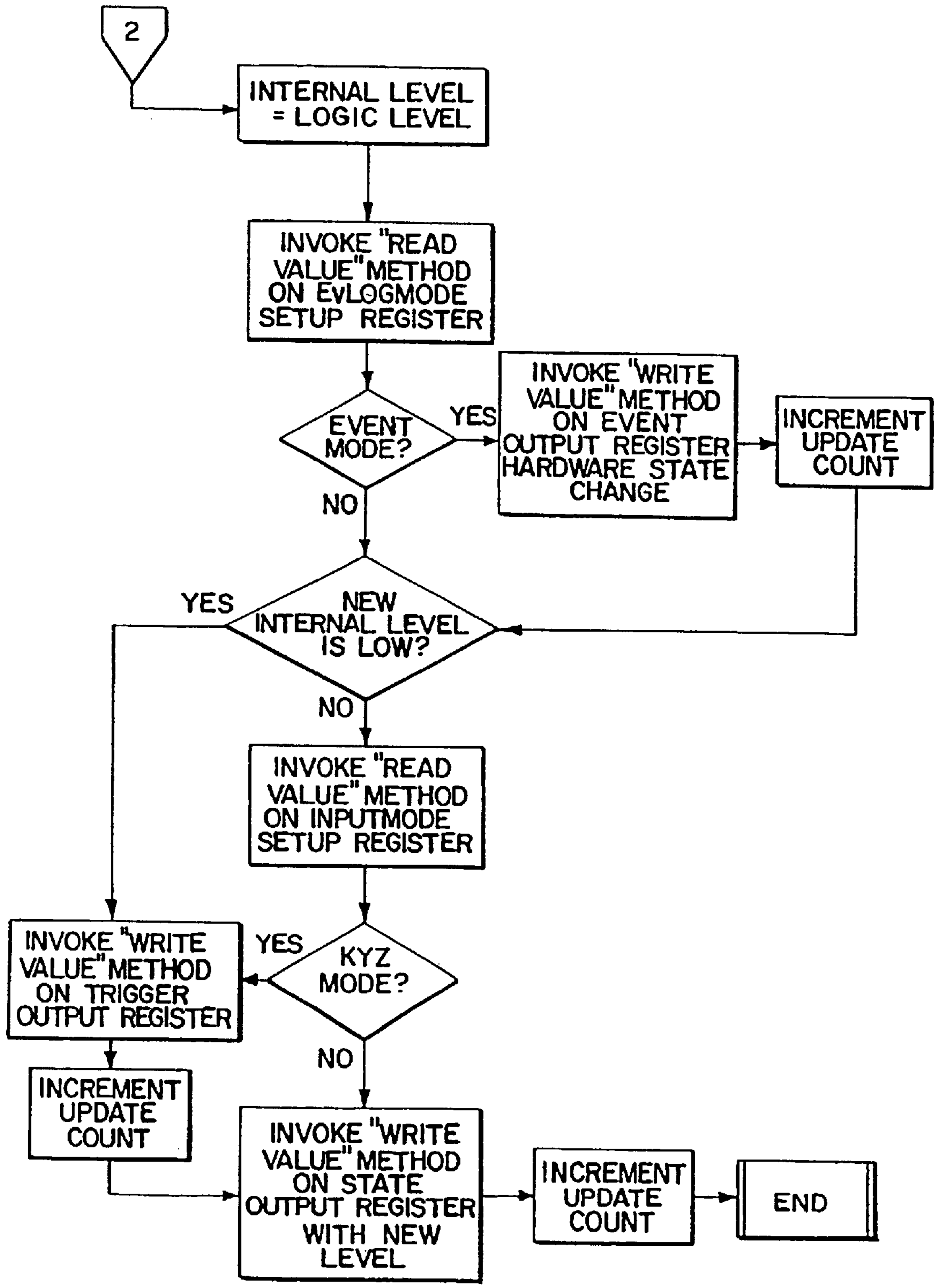
Figure 16A:
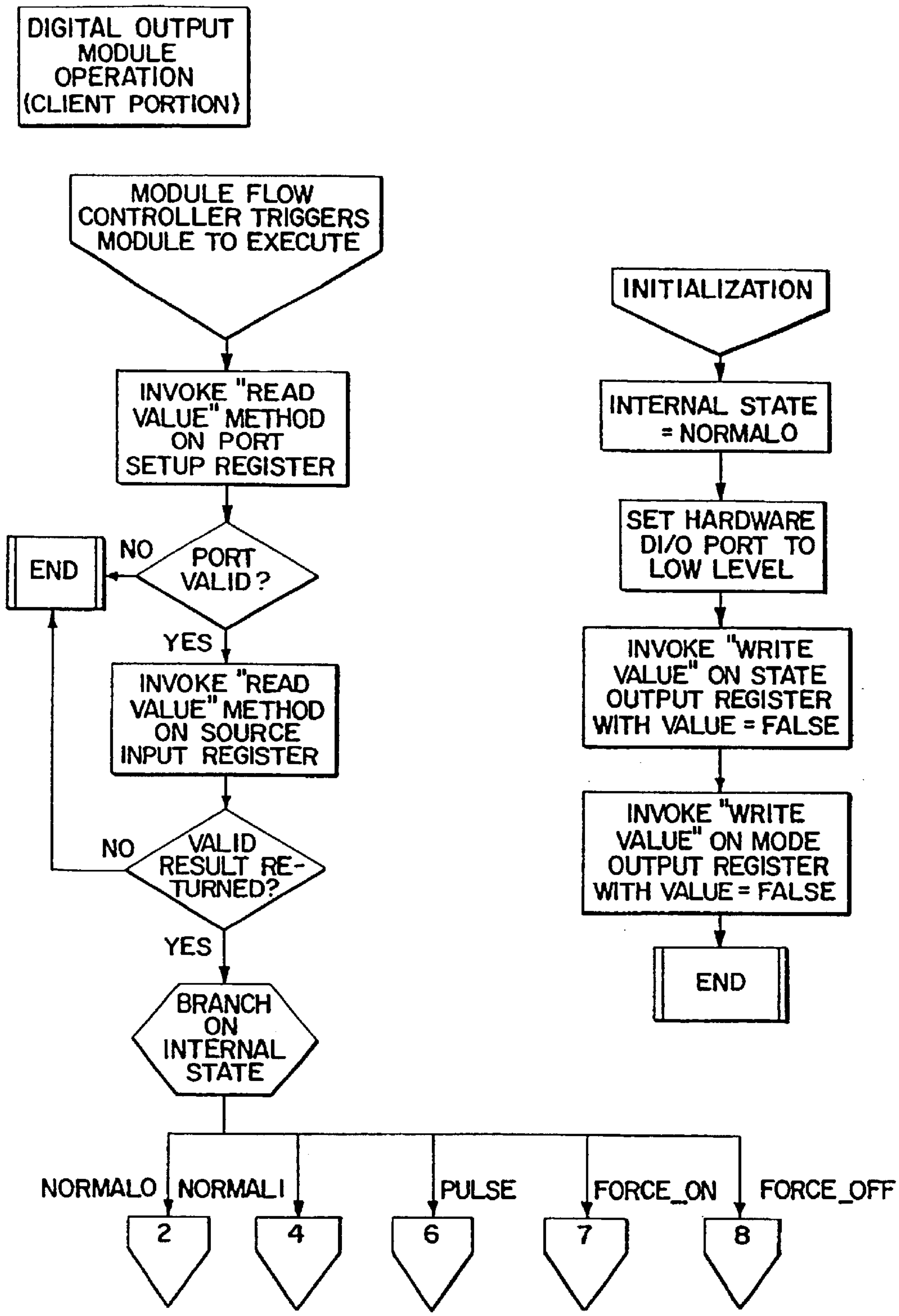
FIGS. 16A–16H show a flowchart of a preferred embodiment of the logic for the client portion of the digital output module.
Figure 16B:
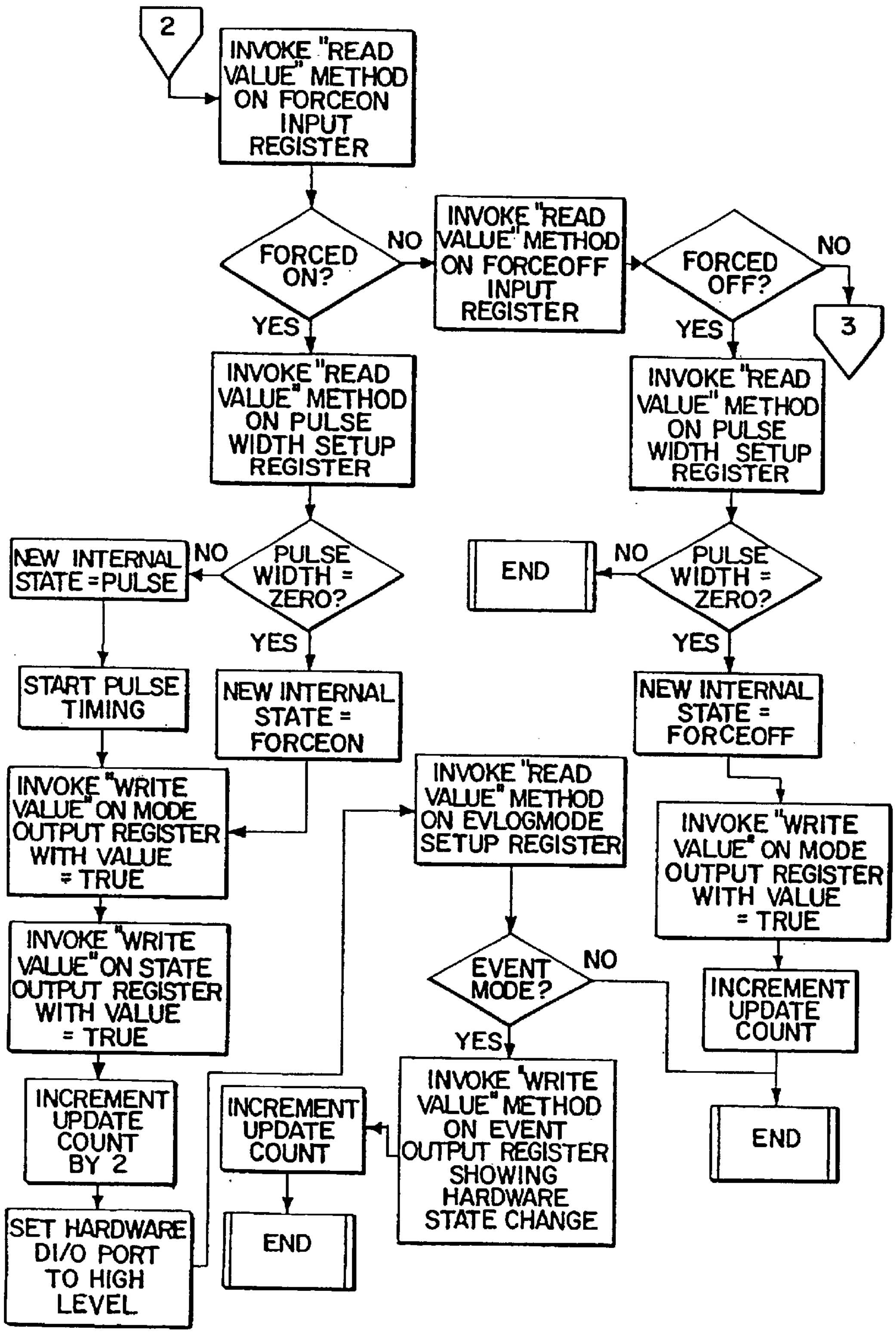
Figure 16C:
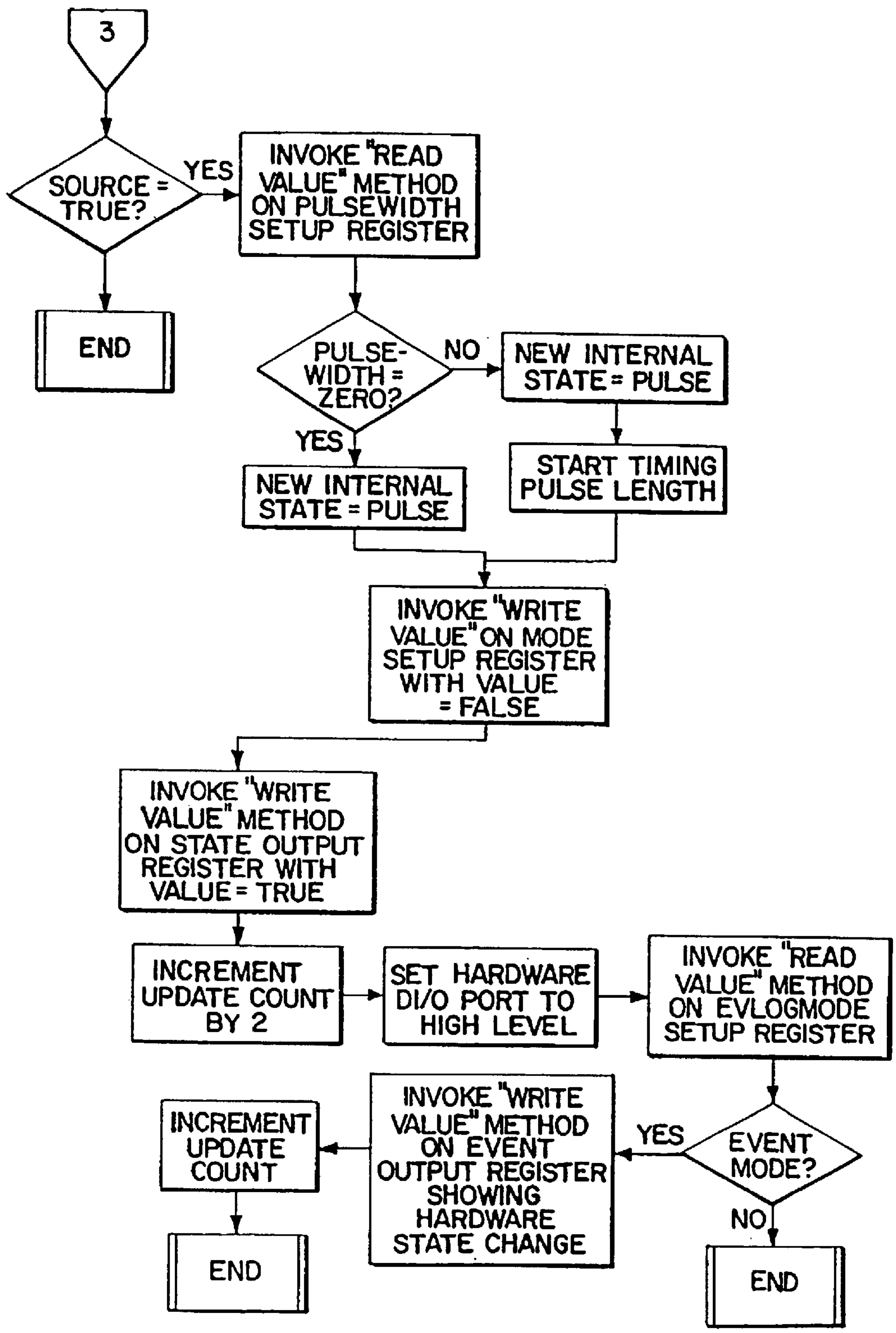
Figure 16D:
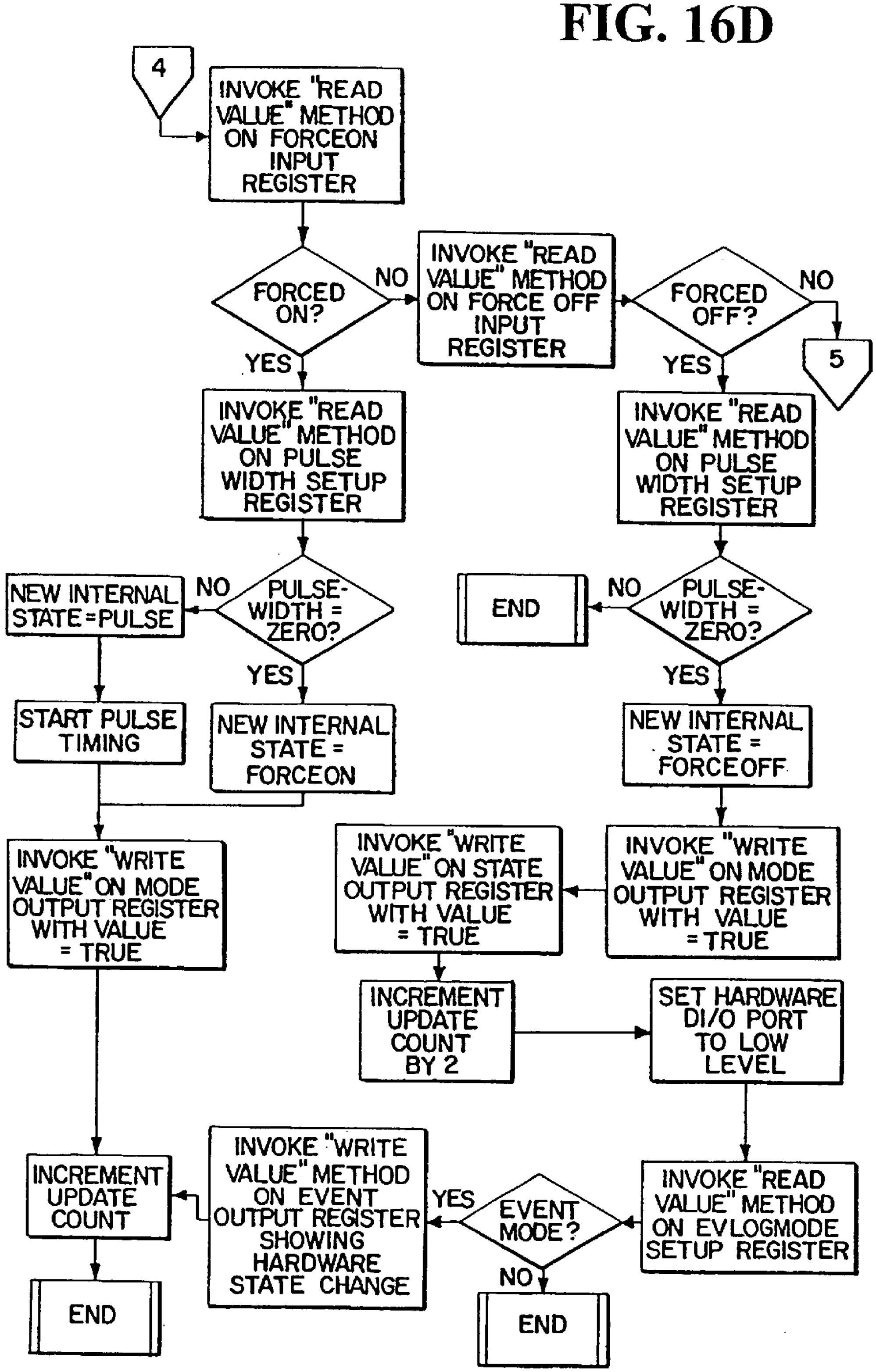
Figure 16E:
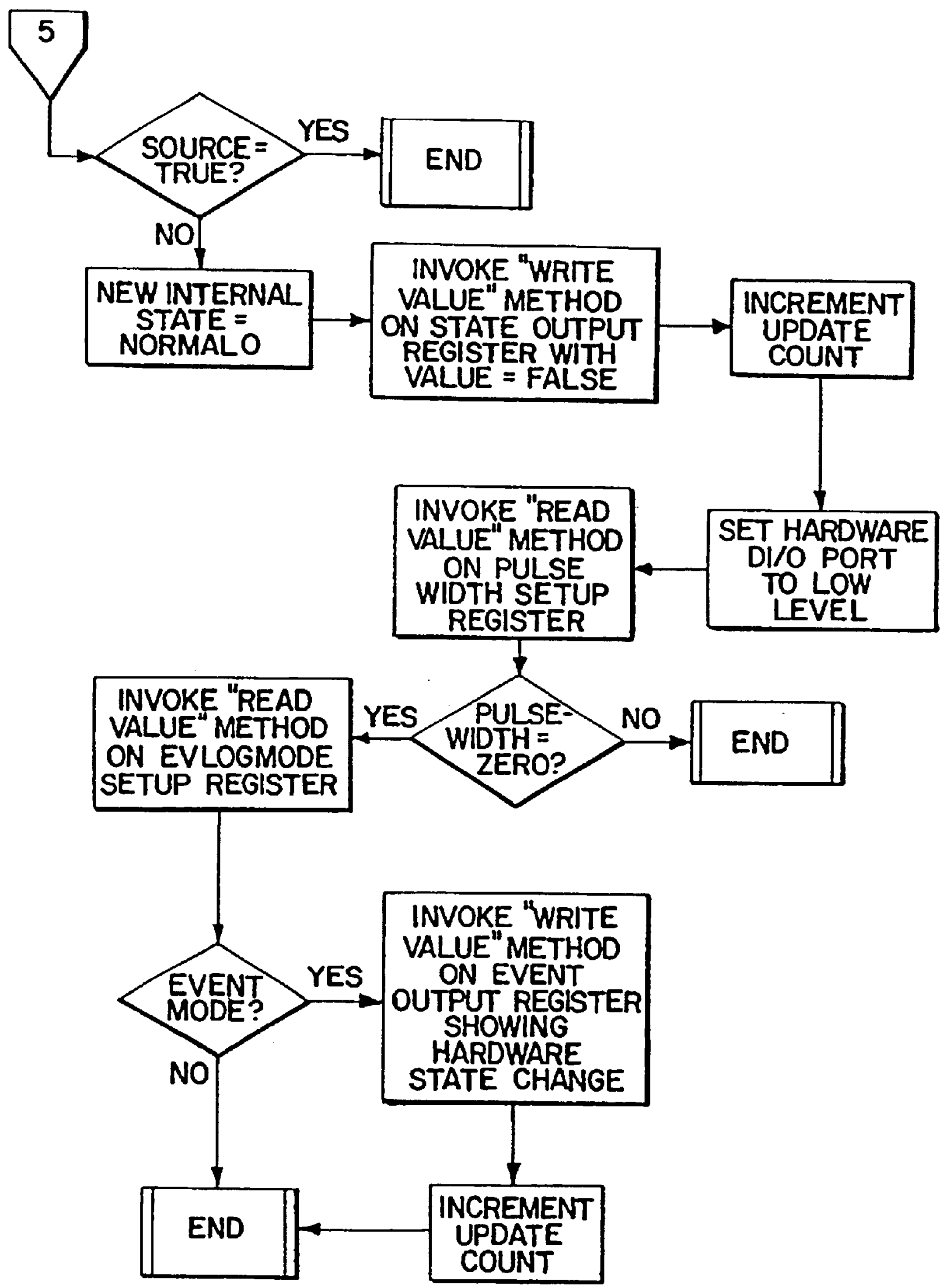
Figure 16F:
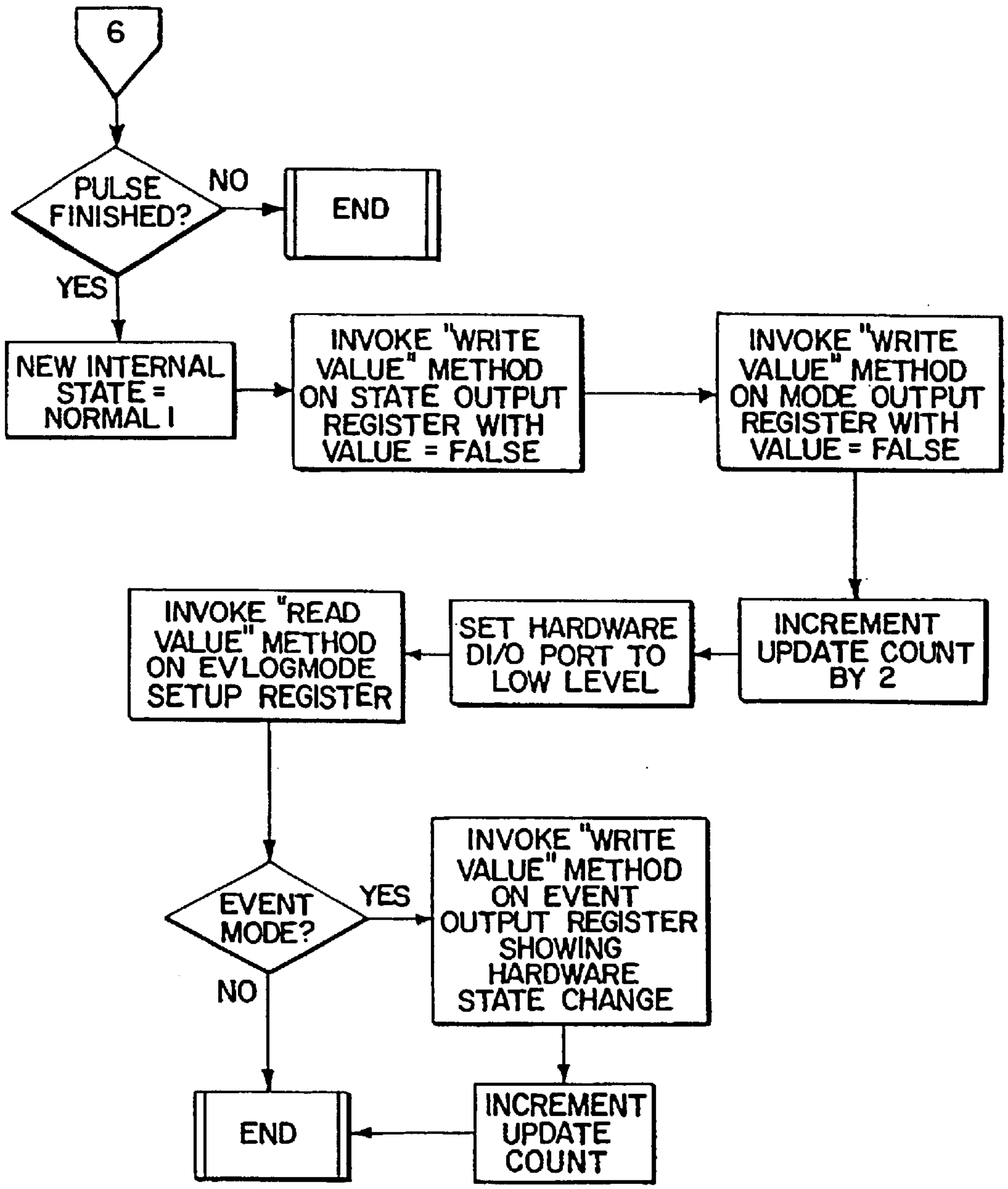
Figure 16G:
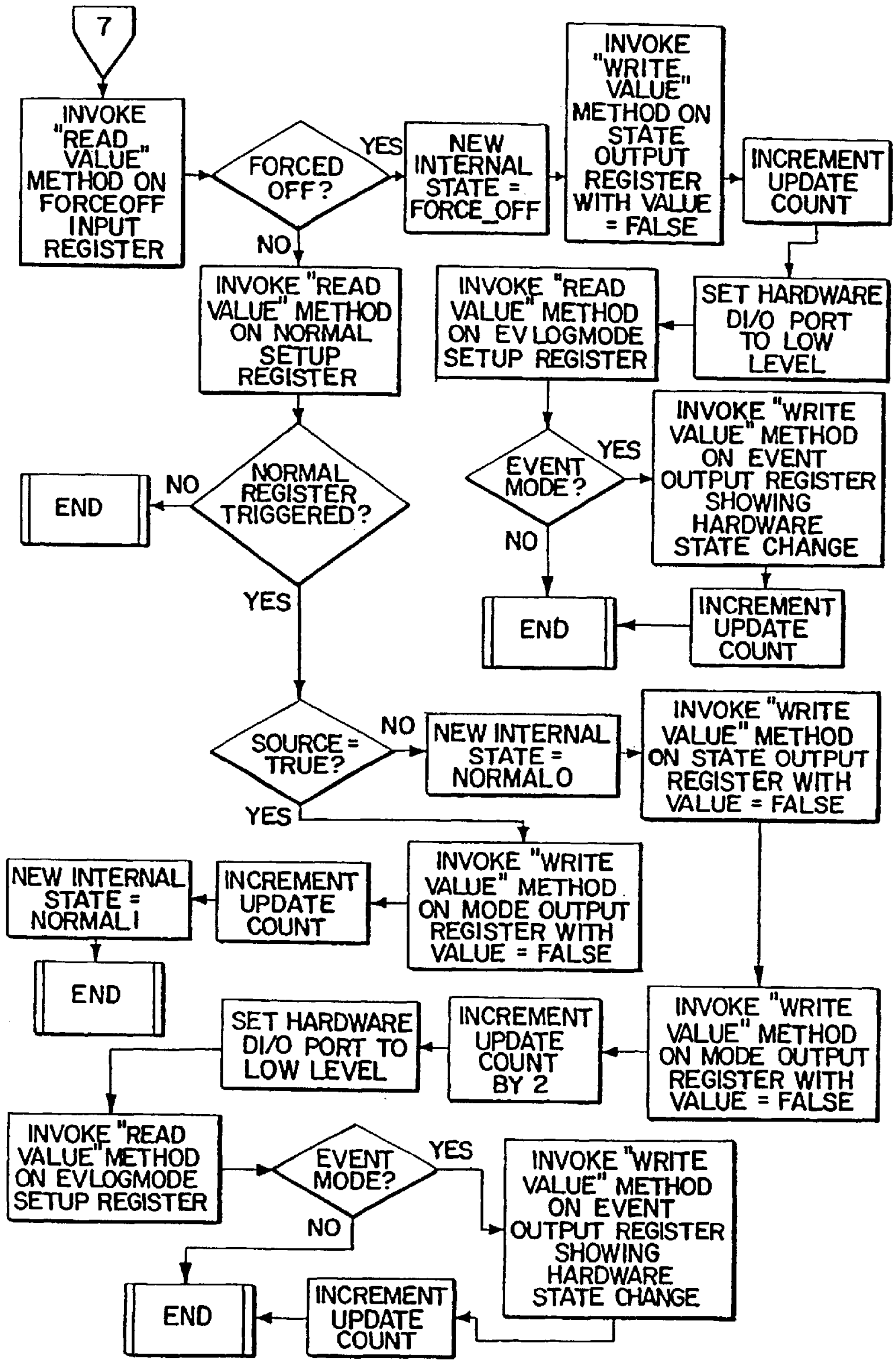
Figure 16H:
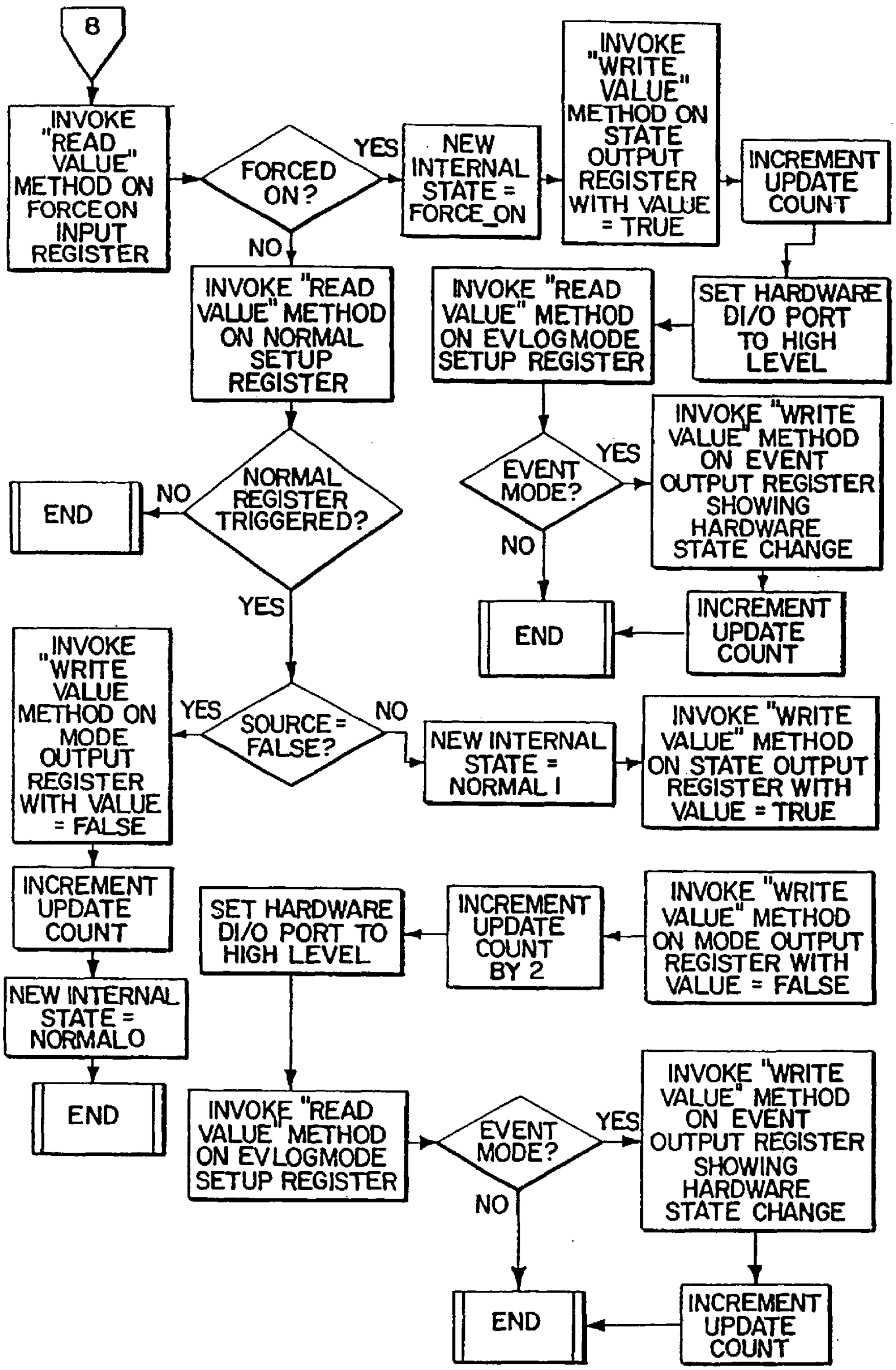

The digital input module 940 transforms a digital I/O signal 844 into a form that can be used as an input to other modules. A preferred embodiment of the digital input module 940 is illustrated schematically in FIG. 15. An exemplary embodiment of the logic for the client portion of the digital input module 940 is illustrated in FIGS. 15A–5B in flowchart form.

The digital output module 950 transforms the output from another module into a signal on a digital I/O signal line 8. A preferred embodiment of the digital output module 950 is illustrated schematically in FIG. 16. An exemplary embodiment of the logic for the client portion of the digital output module 950 is illustrated in FIGS. 16A–16H in flowchart form.

Figure 20:
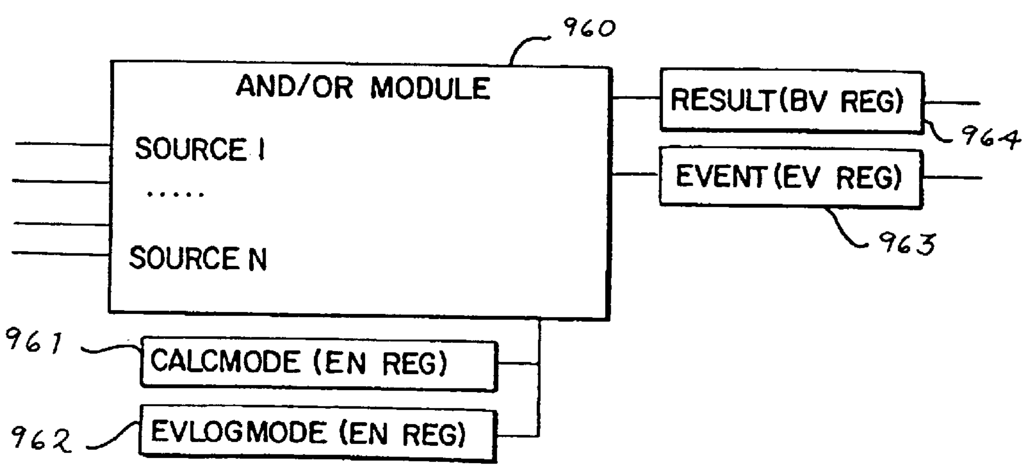
FIG. 20 schematically illustrates a preferred embodiment of the AND/OR module and its respective registers.
Figure 20A:
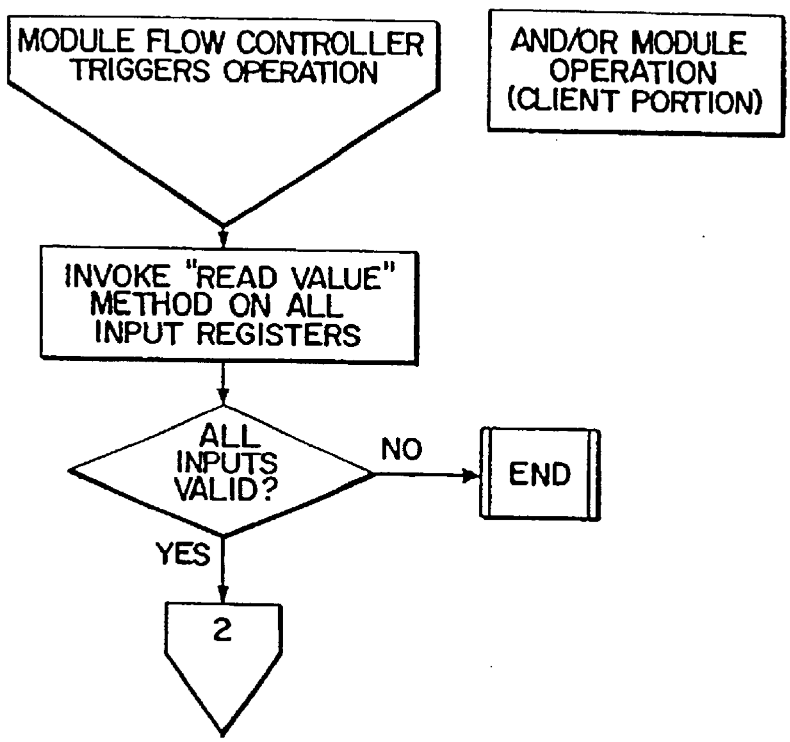
FIGS. 20A and 20B show a flowchart of a preferred embodiment of the logic for the client portion of the AND/OR module.
Figure 21:
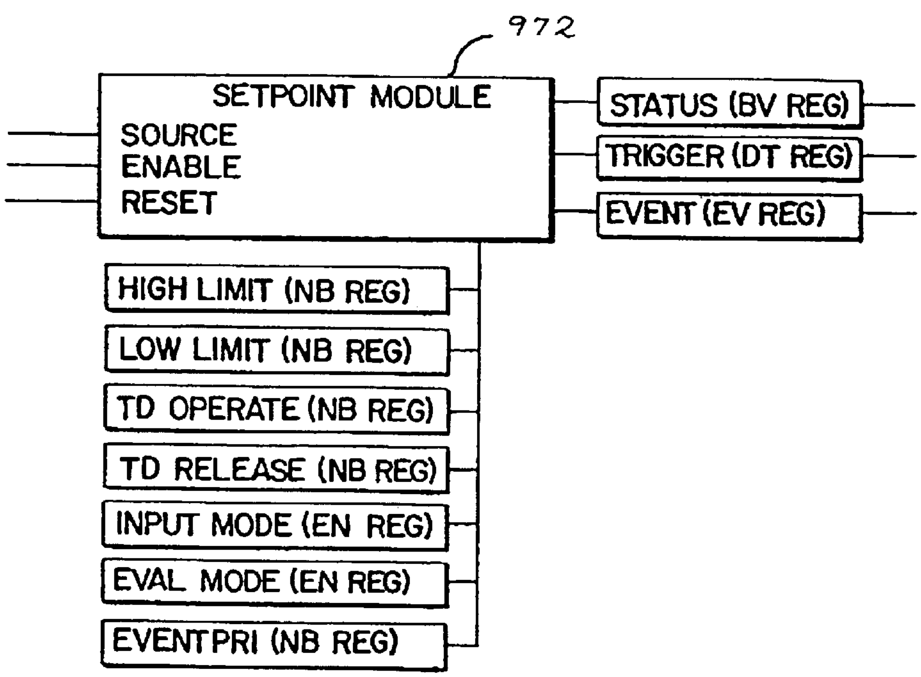
FIG. 21 schematically illustrates a preferred embodiment of the Setpoint module and its respective registers.
Figure 20B:
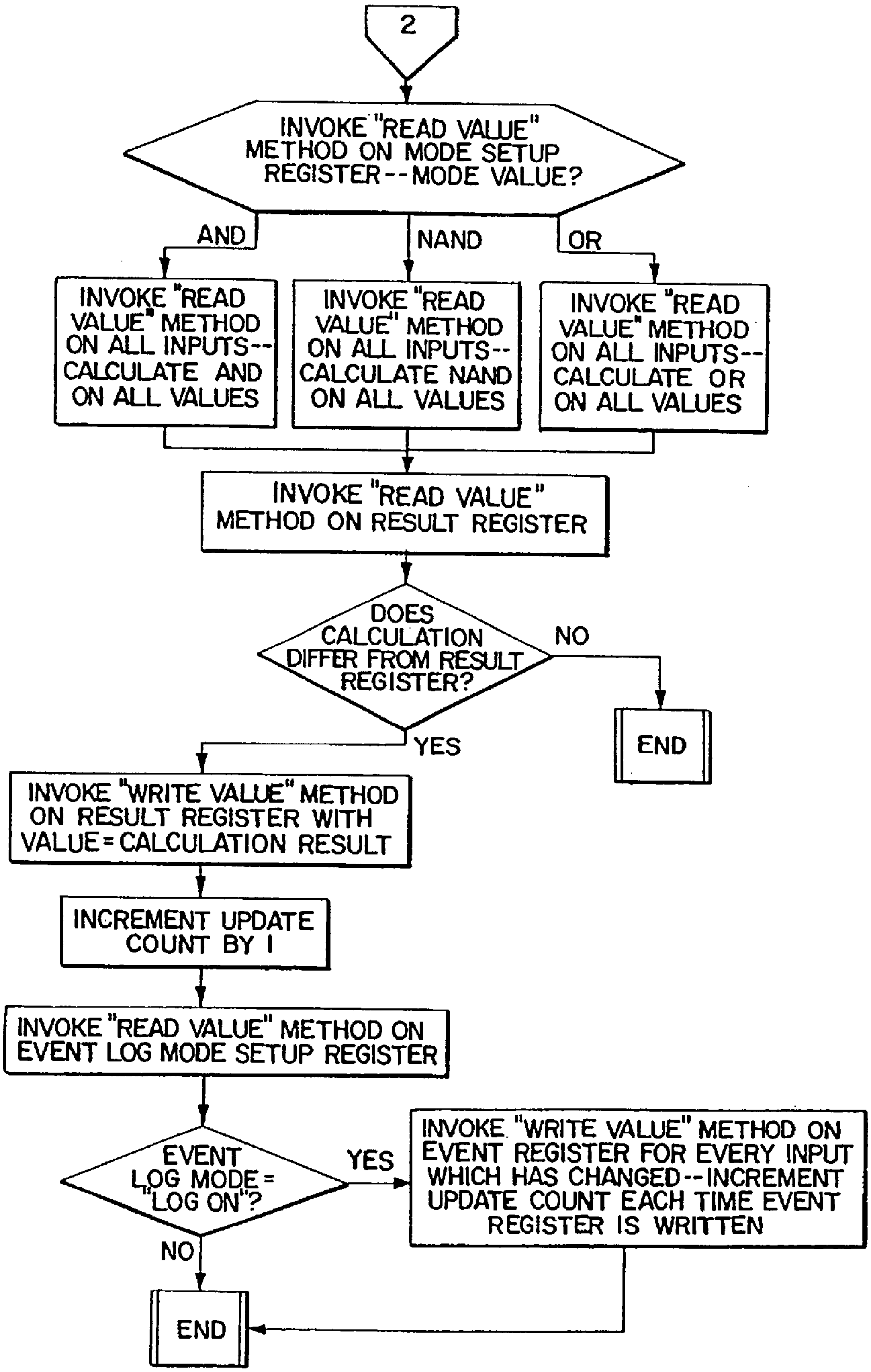
Figure 21A:
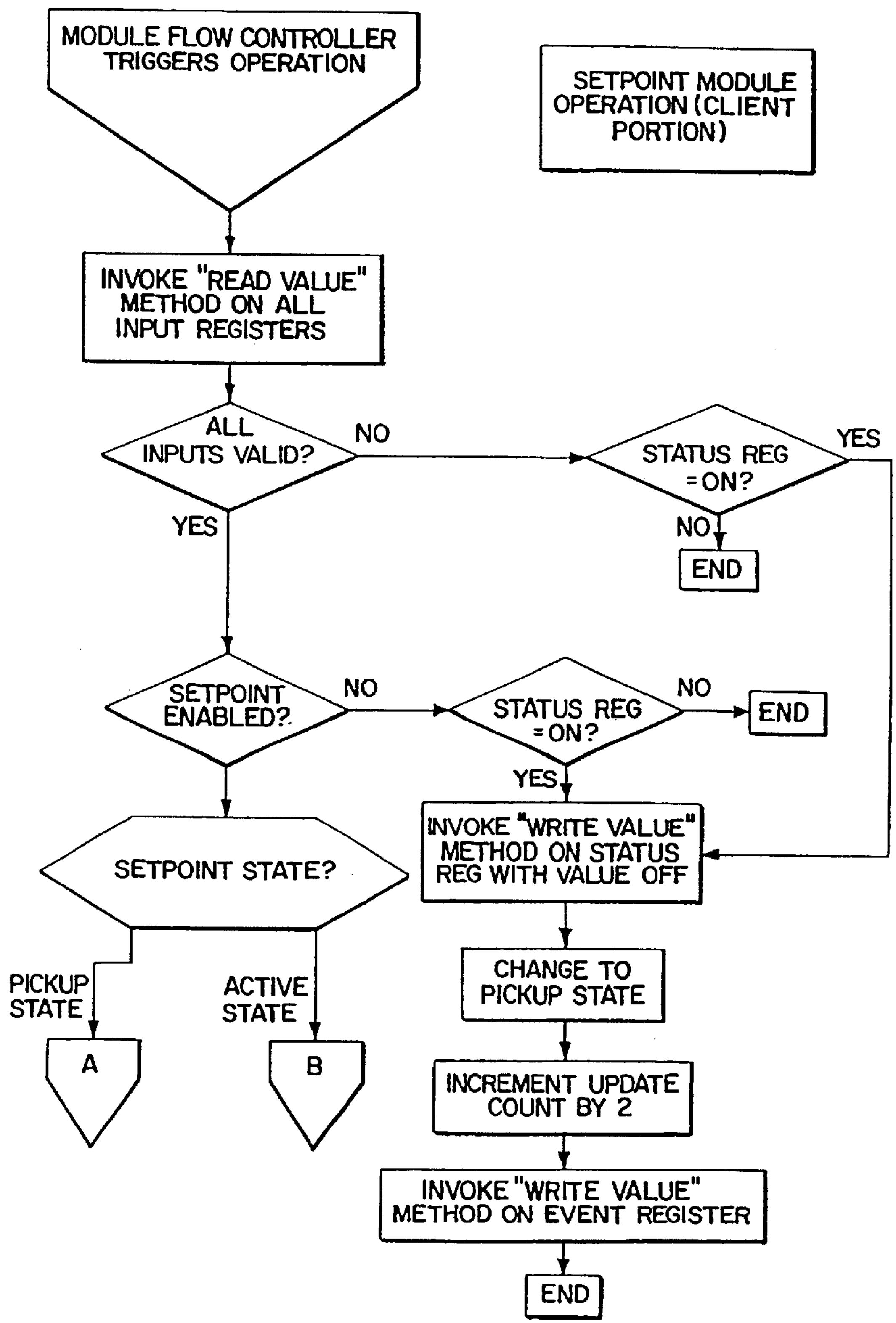
FIGS. 21A–21C show a flowchart of a preferred embodiment of the logic for the client portion of the setpoint module.
Figure 21B:
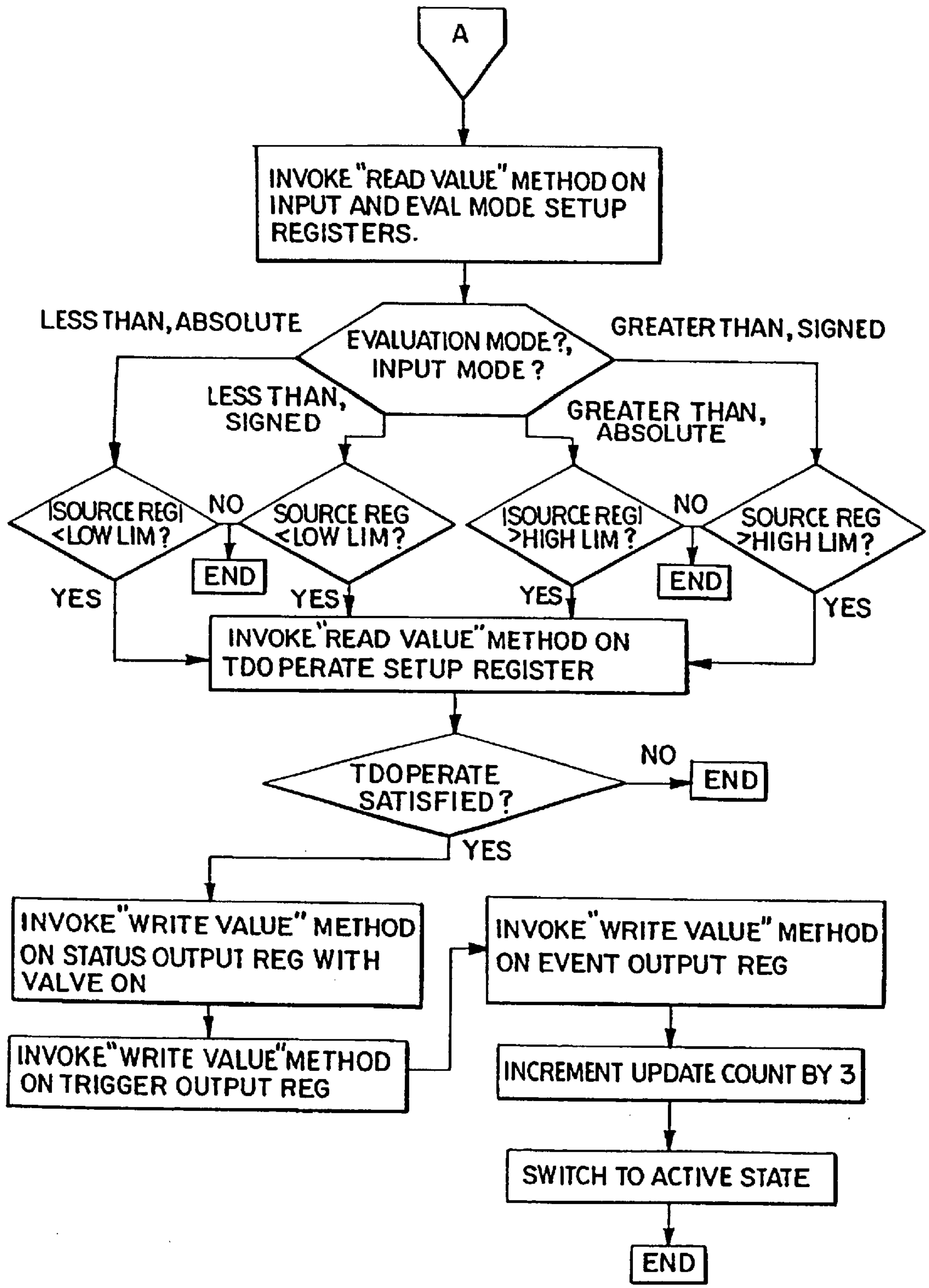
Figure 21C:
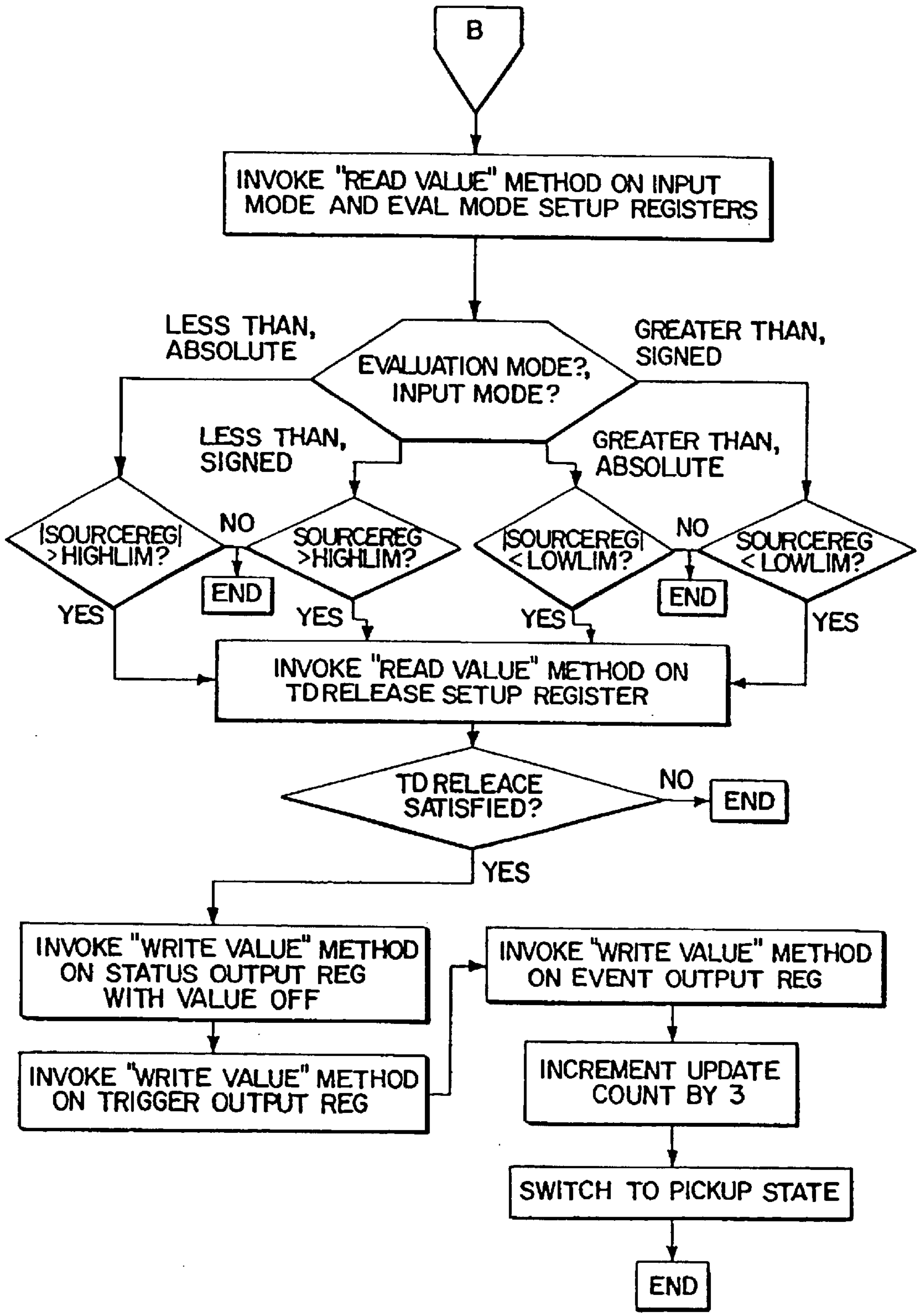

Additional modules that operate only on the results of other modules are also possible. An example of one of these modules is the AND/OR module 960 illustrated schematically in FIG. 20. The AND/OR module 960 takes a number of boolean variable register inputs and performs a logical AND or OR on them to create a result. The CalcMode setup register 961 determines which AND or OR function is being executed. The EvLogMode setup register 962 determines whether events will be generated in the Event output register 963 when the Result 964 register changes. The logic for a preferred embodiment of the client portion of the AND/OR module 960 is illustrated in FIGS. 20A- 20B in flowchart form. The setpoint module 972 is shown schematically in FIG. 21. The logic for a preferred embodiment of the client portion of the setpoint module 972 is shown in FIGS. 21A–21C. These modules do not interface to the outside world.

Figure 22A:
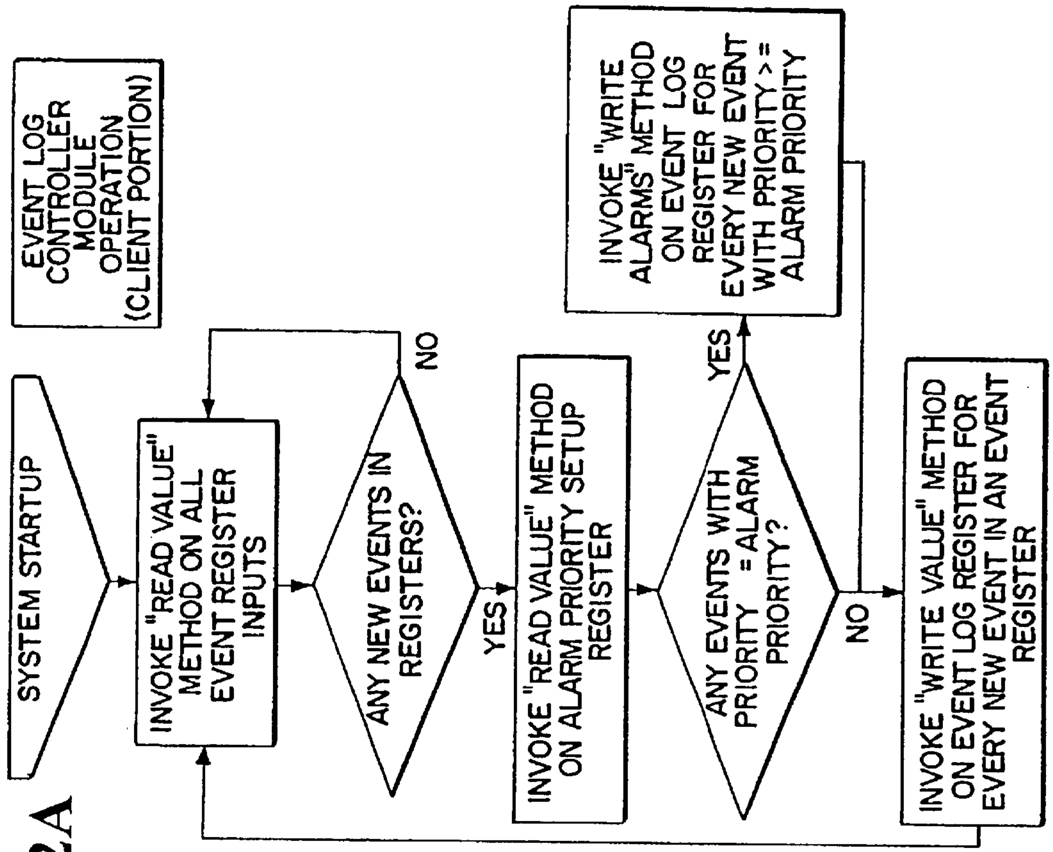
FIG. 22A shows a flowchart of a preferred embodiment of the logic for the client portion of the EventLog module.
Figure 22:
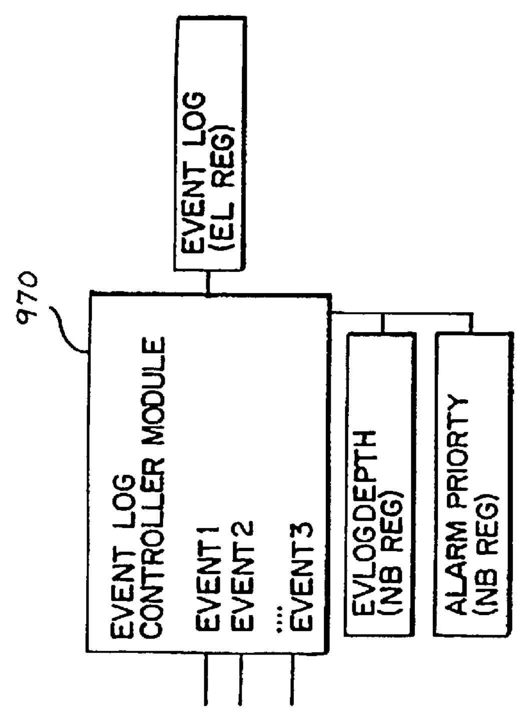
FIG. 22 schematically illustrates a preferred embodiment of the EventLog module and its respective registers.

Another module of note is the EventLog module 970. The EventLog module is shown schematically in FIG. 22. A flowchart of a preferred embodiment for the client portion of the EventLog module is shown in FIG. 22A. Nearly all other modules within the device are connected to an event output register. When an unusual state arises within a module it may send an event message to the event register. The EventLog module 970 takes event registers as an input and invokes a method to write the "event" into its event log output register. The result is that the Event Log register then contains a list of all the significant occurrences that have happened on the device. In this manner, the time as well as the effects which occur in the IED may be recorded.

An example of the events that may be generated on the power meter of the present embodiments can be seen in Table 24.

TABLE 24

| Event # | Time | Cause Label | Cause Value | Effect Label | Effect Value |
|---|---|---|---|---|---|
| 1 | Dec. 15/94 @ 800 | None | External | Motor 4 | Powdered Down |
| 2 | Dec. 15/94 @ 800 | Motor 4 | Powdered Down | Cooler 7 | Shutdown |
| 3 | Dec. 15/94 @ 923 | kW Phase A | 1000 | Over kWa | True |
| 4 | Dec. 15/94 @ 923 | Over kWa | True | Relay 6 | Closed |

In table 24 a number of events in the system are shown. Event #1 is an event that a digital input module might create if its hardware changed state. In this case, the digital input is connected to the status output of a motor. There is no cause label in this case since the cause is external to the meter. Event #2 shows an event that a digital output module might create. The source input of this digital output module is connected as the state output of the digital input module. Event #3 is an event that a setpoint module might create. The setpoint module has detected that the amount of power being consumed is too great so its status output register is set to true. This status output register is connected as the source input register to another digital output module. In Event #4 the digital output module is shown to close a relay. Therefore, the fact that kW Phase A has exceeded a certain bounds has caused an external relay to close (hopefully rectifying the problem).

A significant feature of the disclosed architecture is that the modules can be linked in arbitrary fashions to form arbitrary functional blocks comprised of networked objects.

Figure 23:
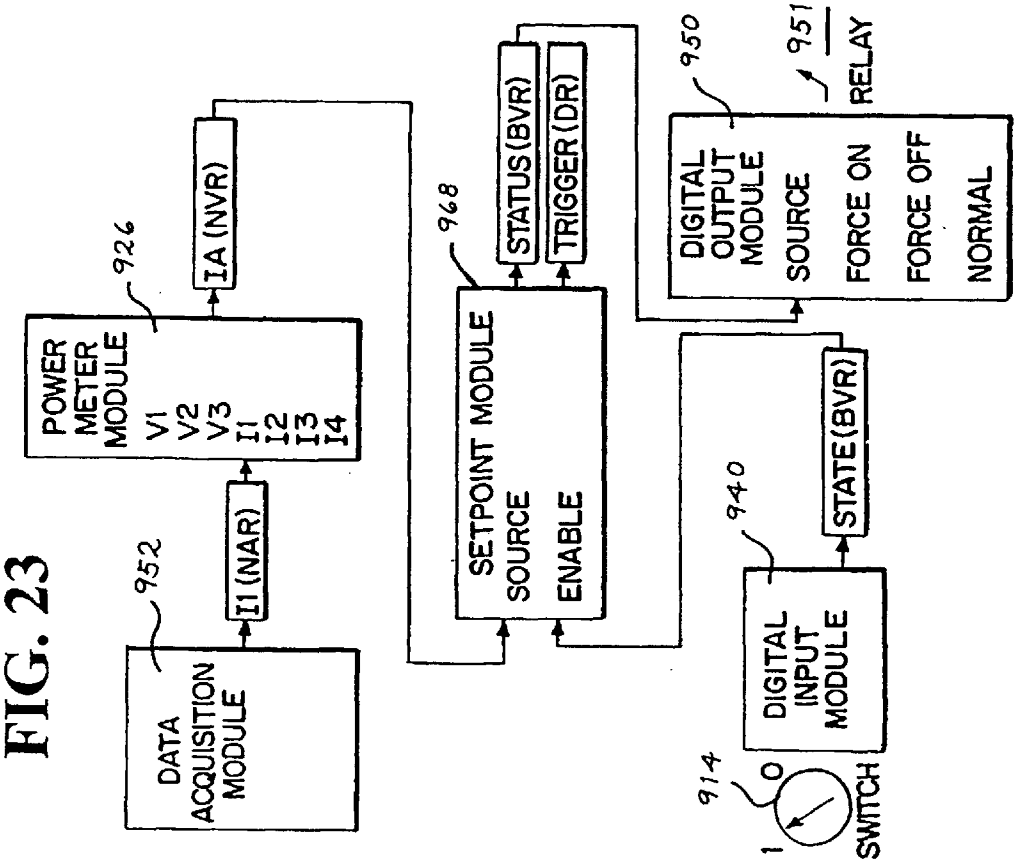
FIG. 23 shows an example application using the object oriented structure of this invention.

An example application using the architecture of this embodiments is shown in FIG. 23. In this example, a setpoint module 972 is used to monitor Phase A current from the power meter module 926. The setpoint is enabled using a digital input module 940 which is driven by the manual switch 941. The setpoint setup registers are configured so that the setpoint goes ON when the current exceeds 100 Amps. The setpoint status output controls the digital output module 950, which drives a relay 951 which could control a motor (not shown). Whenever the phase A current exceeds 100 Amps and the manual switch 941 is closed, the relay 951 will be closed causing the motor to turn off. (Note: in this example setup registers and other registers that are not needed for the example are not shown.) It will be appreciated by those skilled in the art that the number and variety of possible additional modules and applications is unlimited.

Figure 24A:
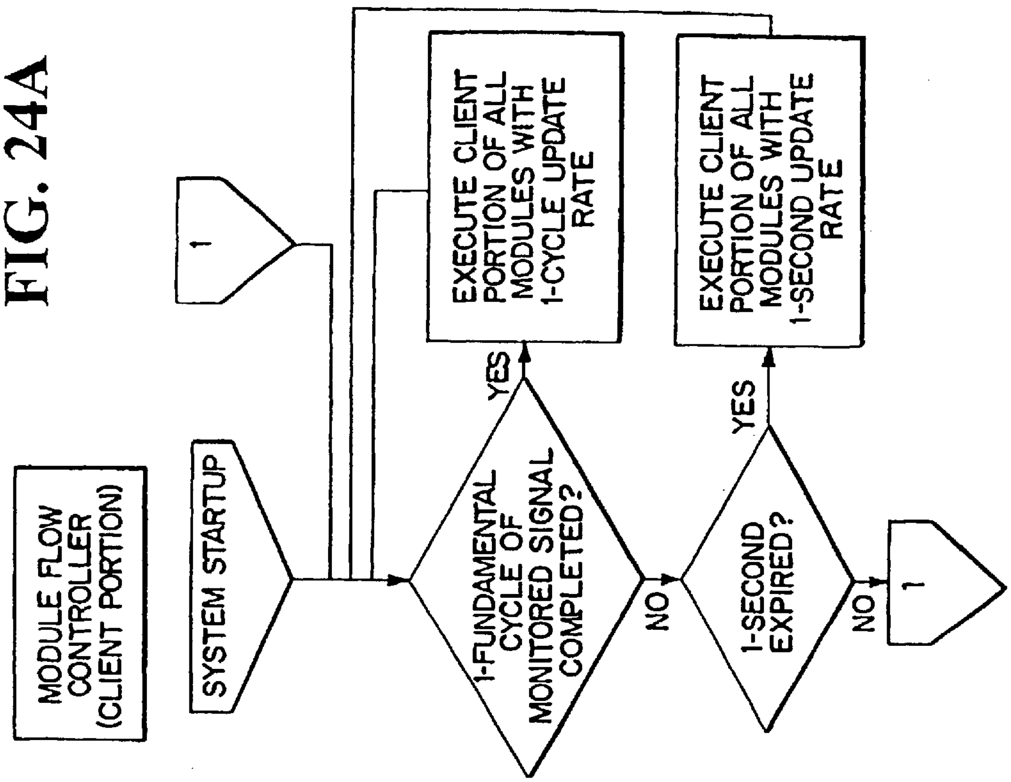
FIGS. 24A and 24B show the operation of the Module Flow Controller.
Figure 24B:
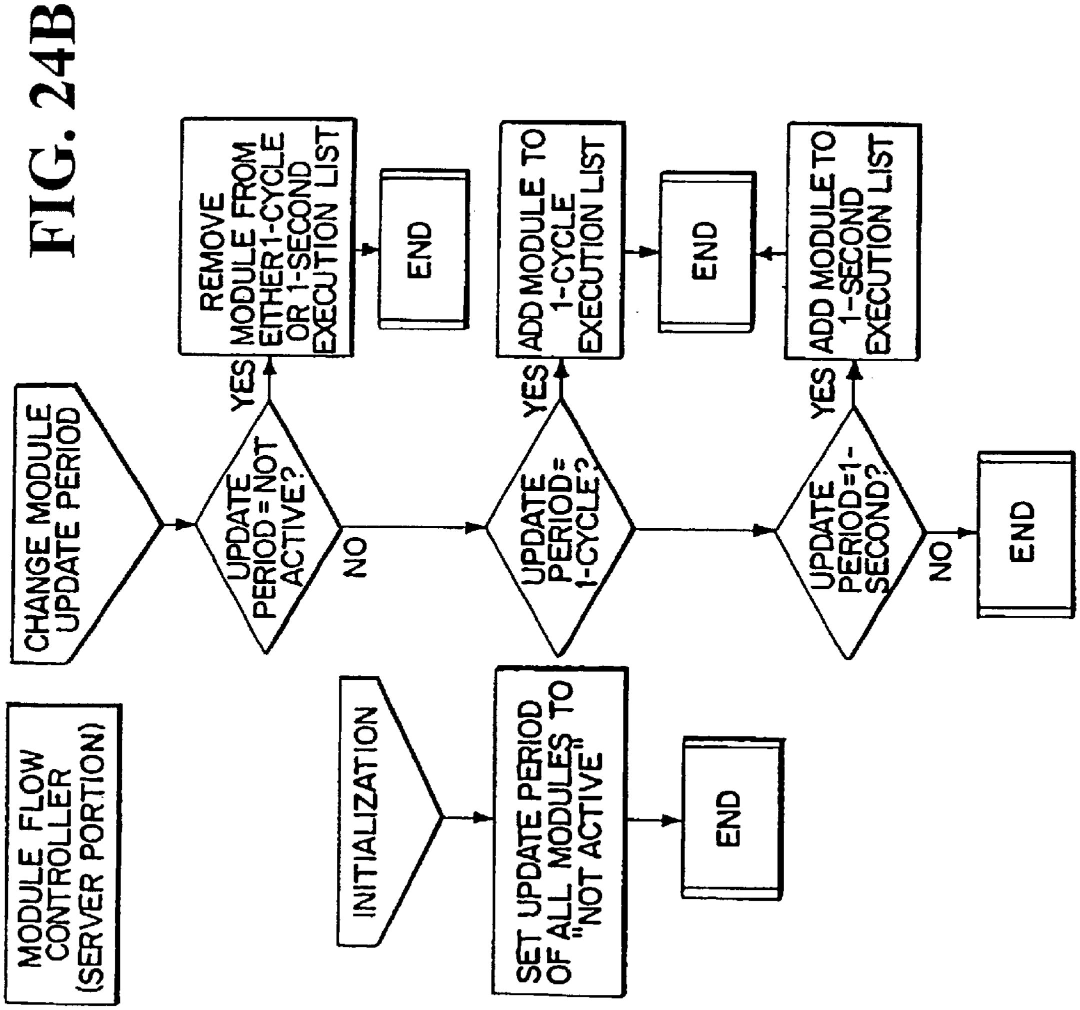

The operation of most of the modules in the IED is governed by the client portion of the module flow controller. A flow chart for the execution of the client portion of the module flow controller is shown in FIG. 24A. The module flow controller causes different modules within the device to execute. The module flow controller only triggers modules to execute that have valid input registers. Therefore, any modules that do not meet this requirement do not use any of the processing power available to the device. The server portion of the module flow controller is executed when a module has the write input handles method invoked on it. A flow chart for the operation of the server portion of the module flow controller is shown in FIG. 24B. The server portion of the module flow controller records whether the input handles being written are valid or not. The client portion then uses this information when it makes its decision on whether to execute the module or not.

Figure 25:
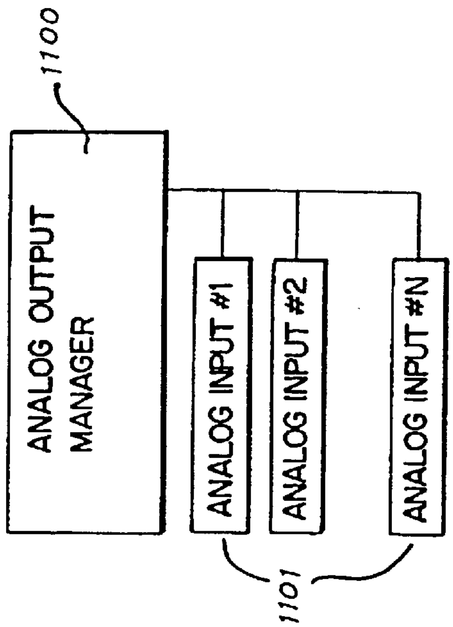
FIG. 25 schematically illustrates a preferred embodiment of the analog output manager.
Figure 25A:
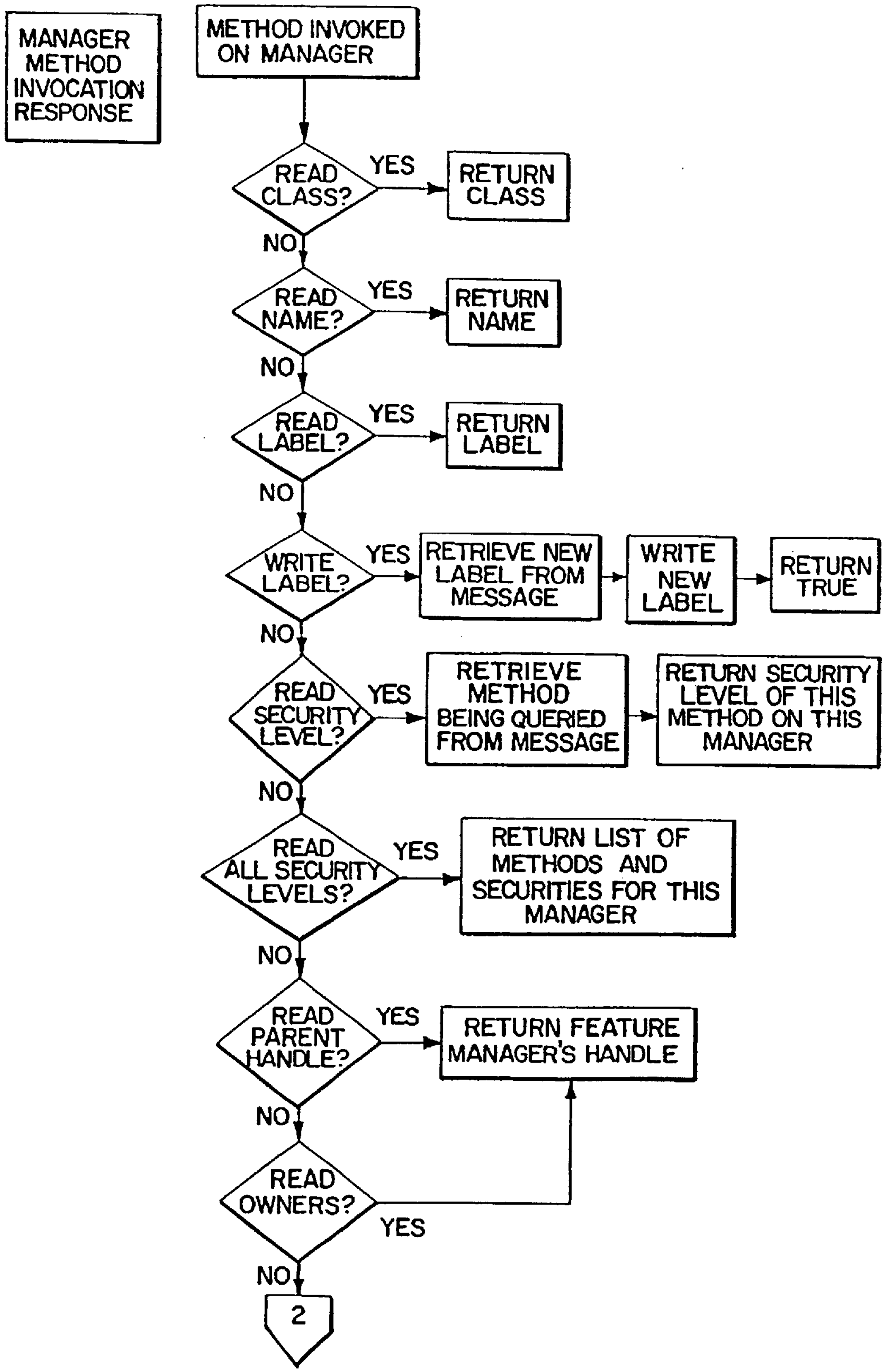

FIG. 25 schematically illustrates a preferred embodiment of a manager, the analog output manager 1100. A flow chart for the logic for the server portion of a manager is shown in FIGS. 25A–25B. In the present embodiment, managers have no client portion. There is one resource manager 1100 for each type of module. Each resource manager 1100 may have many modules below it.

Figure 26A:
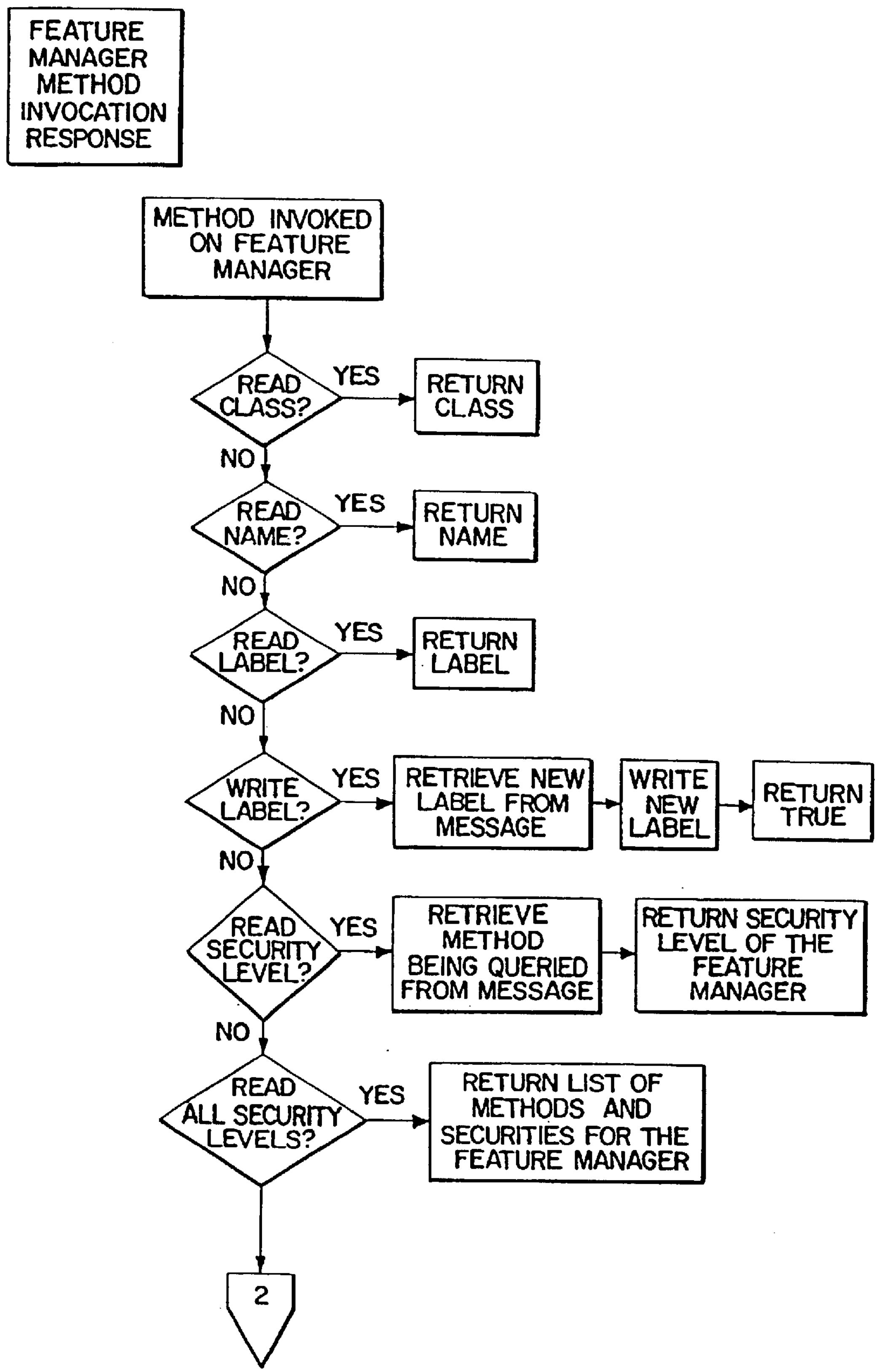
FIGS. 26A and 26B show a flowchart of a preferred embodiment of the logic for the server portion of the feature manager.
Figure 26B:
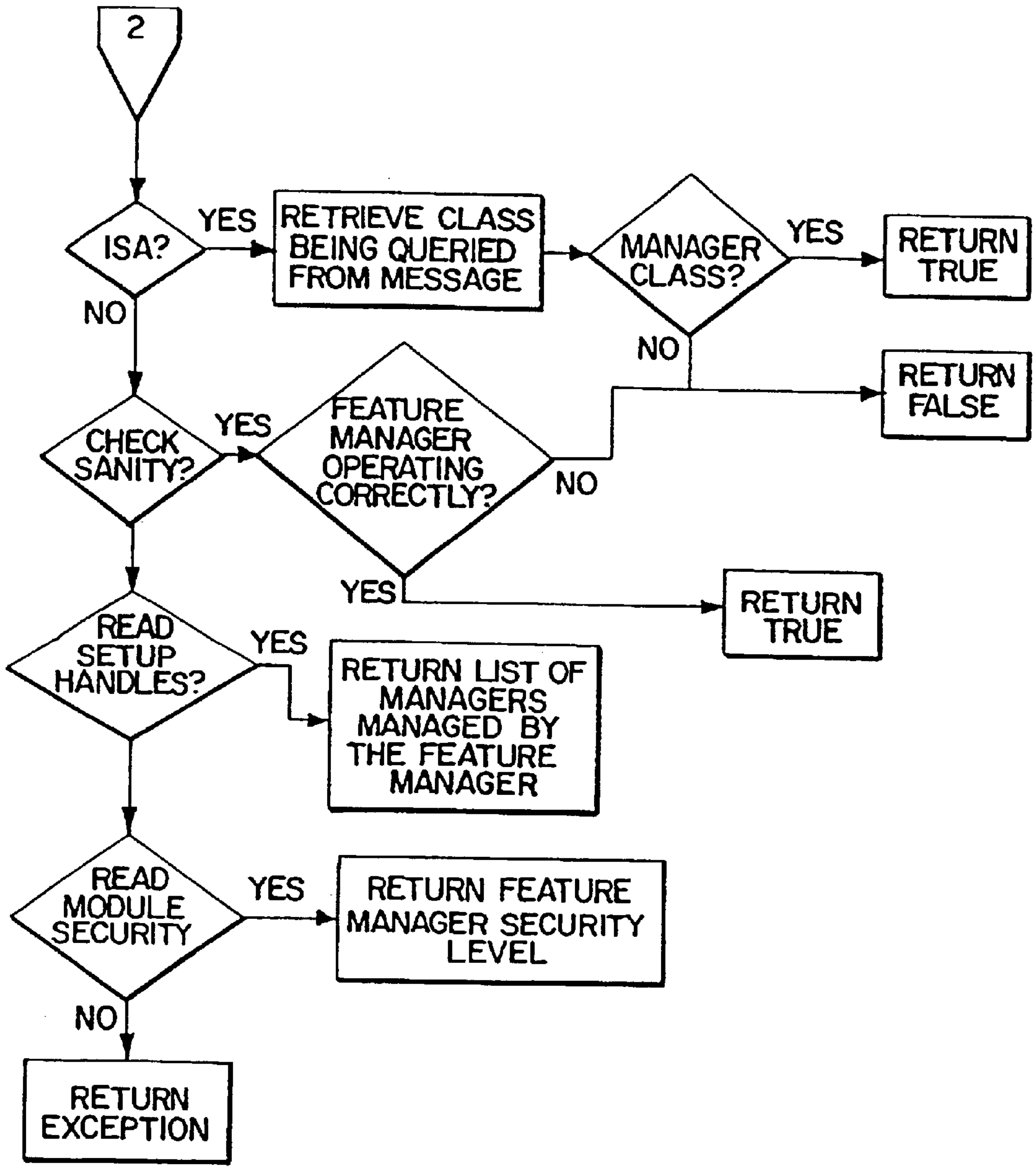

Every manager 1100 in an IED resides beneath the feature manager for the device. A preferred embodiment of feature manager 1200 is schematically shown in FIG. 26. A flow chart for the logic of the server portion of the feature manager is show in FIGS. 26A–26B. All the managers on the device appear as setup registers 1201 to the feature manager 1200. The feature manager 1200 controls access to the entire device 900. Starting from the feature manager 1200, a master device, such as PC 914, can determine all input, output and setup registers for every module on the IED device 900.

Each manager is said to own all the modules that appear as its setup registers. The feature manager is said to own the resource managers that appear as setup registers to it. Therefore, a hierarchy of modules exists with the feature manager on top.

In order for a master device, such as PC 914, to access the information in a slave device, such as the IED 900, it invokes methods on the managers, modules or registers. In order for a master to execute a method on a slave, it must have a handle. The handle indicates which manager, module or register the method is to be acted on. For example, the handle for the feature manager for any type of slave device is 2 in the current embodiment. This is the only thing that is fixed in the architecture and every type of device has a feature manager with a handle of 2. From this handle, the entire configuration of the device can be determined.

With the configuration of the present embodiments the slave device, such as the IED's 900 may have the capability to execute many different objects, but only a limited number of objects can be executed at any one time due to processing power constraints. The flow control client controls the operation of modules. Therefore, only the modules that have valid input, output and setup registers connected to them are executed.

In order for a master device, such as a PC 914, to determine the configuration of a slave device without the master device having any previous knowledge of the configuration, the master device invokes certain methods on the feature manager. These methods are fixed in the architecture. In other words, every feature manager for every different type of slave device will interpret these methods in the same way. For instance, the master device may invoke the method Read Setup Handles on the feature manager which requests a list of the managers that reside beneath it. From this list, the master device can then go to each individual manager and request the operating modules beneath them by again executing the method Read Setup Handles. Once the master device knows which modules are operating, it can request of each module its currently connected input, output and setup registers using the appropriate methods and thus determine the entire configuration of the device. Thus, without any prior knowledge of the slave device, or its configuration, the master device can determine all characteristics of the device. The master device can then invoke other methods to change the configuration of the device. The slave devices, however can operate autonomously without the involvement of the master devices.

Thus, the slave devices, such as power monitors, can be readily configured to exactly match a user's unique requirements and to provide the ability to do so without interrupting the operation of the rest of the functions the device is performing. The slave devices, such as the IEDs, can be networked to one or more computers and the slave devices can be configured or reconfigured via the communications network.

Further, with the present embodiments, it is not necessary to change the software on a master device when a slave device is upgraded.

The modules are independent or autonomous. Thus, when a module is modified, there is no need to modify the other modules. As used herein the term "independent modules" means that modifications or changes can be made to one or more modules without a need to modify the remaining modules (i.e. a modification to one module has no effect on the operation or functionality of the other modules.

The feature manager keeps a count of how many times the configuration of the device has been changed. A master can invoke a the method Read Module setups counter on the feature manager to request this count. If there are multiple masters changing the configuration of the device, each master need only request this count from the feature manager to determine if the configuration of the device has been changed.

The feature manager also contains a count of how many times the modules below it have updated their output registers. Each individual manager has a count of how many times the modules below it have updated their output registers and each individual module has a count as well. Therefore, if a master device executes the method Read Module Updates Counter and finds that none of the modules under a certain manager have updated their output registers since the last time the master read the values in the registers, the master does not need to waste communications bandwidth reading the same values again.

Methods and Modules are preferably assigned a security level. This permits the system to be configured such that certain users have access to all of the system functions while other users have access to only selected functions.

The Read Security Level, Read All Security Levels and Read Module Security methods can be used to determine what level of authorization is necessary to access the various methods and modules in the system.

The foregoing description of the preferred embodiments of the present embodiments has been presented for purposes of illustration and description. The described embodiments are not intended to be exhaustive or to limit the embodiments to the precise forms disclosed. Obviously many modifications and variations are possible in light of the above teachings. The embodiments which were described were chosen in order to best explain the principles of the embodiments and its practical applications.

Figure 3:
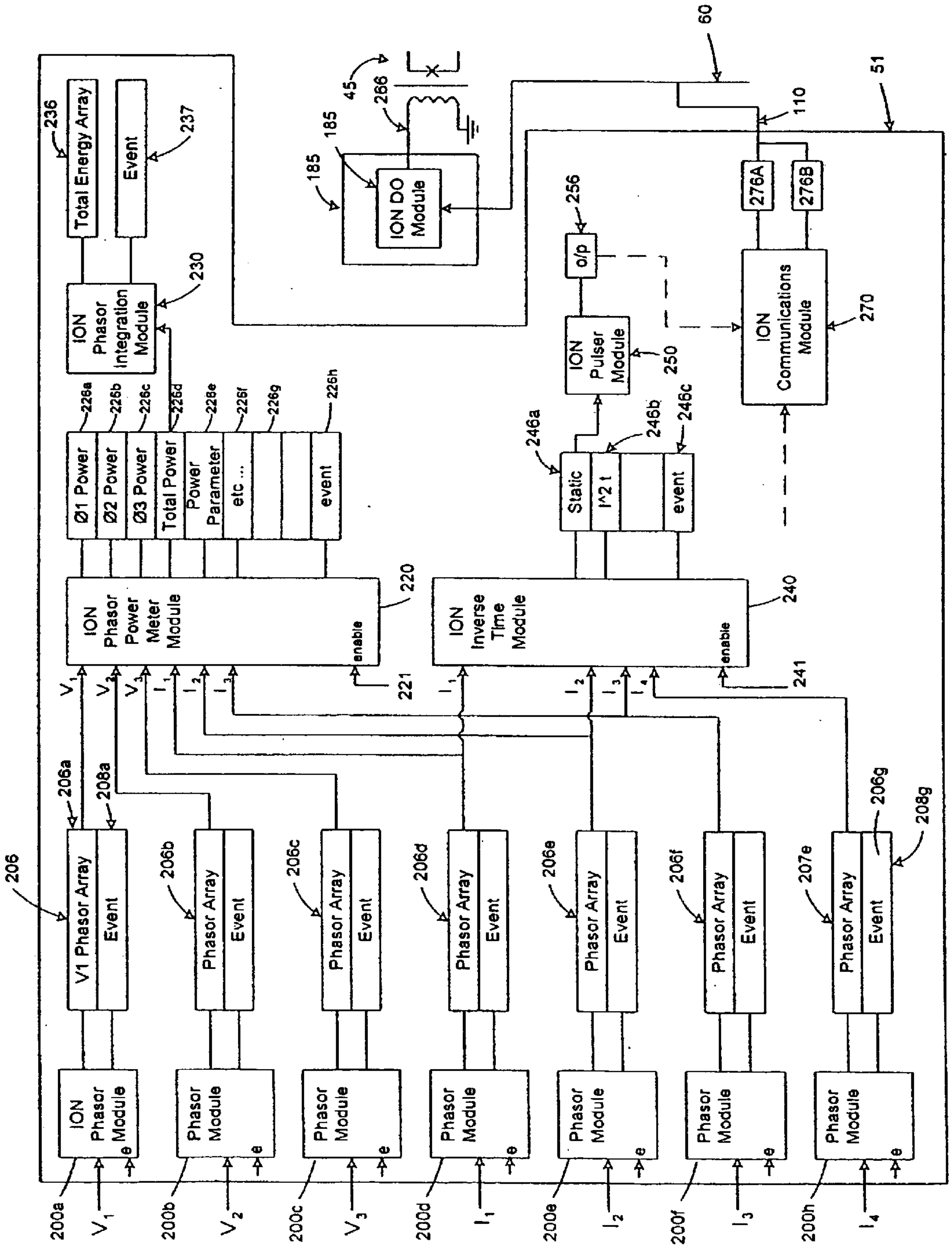
FIG. 3 is a block diagram illustrating the functional program modules of the phasor transducer device shown in FIG. 2.

Referring back to FIG. 3 is a diagram using the object-oriented architecture disclosed in the copending application Ser. No. 08/369,849, now U.S. Pat. No. 5,650,936. The diagram of FIG. 3 shows modules which represent program objects. A "module" may be regarded to be an active object in the program architecture. Modules behave as both a client and a server. The client portion of a module contains the active components which perform the various tasks within the device. Modules act as "black boxes" that read data in at the inputs, manipulate the data in some fashion, and write the result to outputs. The inputs are read from registers and the outputs are written to registers.

The diagram of FIG. 3 shows a functional relationship between the program objects that may be used in a preferred embodiment of the system. The objects shown in FIG. 3 include objects that may be physically located (or that may be regarded as "running") on the phasor transducers and/or the phasor array processors, or both. In a preferred embodiment, the modules shown in FIG. 3 are located on a single phasor transducer, such as the phasor transducer 51. The other phasor modules, 50, 52, 53, and 54, would include similar phasor modules.

(1). Phasor Power Modules

As shown in FIG. 3, running on the phasor transducer 51 (specifically on the phasor transducer local microprocessor 100) are a plurality of phasor modules 200. In the embodiment shown, the plurality of phasor modules 200 includes a phasor module for each voltage and current channel. The plurality of phasor modules 200 receive the digitized values of the voltage and current signals V1, V2, V3, 11, 12, 13, and 14, that are output from the analog to digital converter 70 in FIG. 2. (Each of the other phasor transducers 50, 52, 53, and 54 of FIG. 1 would likewise include its own plurality of phasor modules for the digitized values of the voltage and currents channels sensed by its corresponding voltage and current sensors associated with its corresponding circuit.) In the embodiment shown in FIG. 3, the plurality 200 of phasor modules includes seven phasor modules, 200A–200G. Each of these phasor modules receives as an input one of the digitized voltage or current signals, V1, V2, V3, 11, 12, 13, and 14. In addition, each of these modules includes an "enable" input, such as input 202A on module 200A. The "enable" input enables operation of the module. The "enable" input is received from another module with a Boolean output. In an alternative embodiment, the module 200A may defaulted to "enable" and will provide an output unless a negative signal is received on its "enable" input.

Each of the phasor modules 200 provides an output in the form of a phasor array output register and an event register. For example, phasor modules 200A–200G output phasor array output registers 206A–206G, respectively, and event registers 208A–208G, respectively. Each of the phasor module output registers 206 contains an array of phasors computed by its respective phasor module that represents its respective digitized input voltage or current for each harmonic for which the module is enabled. Each phasor array register and each event register also include a time stamp that indicates the instant in time that it represents.

(The "phasor" may be a polar number, the absolute value or modulus of which corresponds to either the peak magnitude or the RMS value of the quantity, and the phase argument to the phase angle at zero time. Alternatively, the "phasor" may be a complex number having real and imaginary components values, or the phasor may use rectangular or exponential notation. Phasors may be used to represent the voltage, current, power, or energy in a phase conductor, in an electric circuit, or in group of circuits. By contrast, conventional sensing devices generally measure only "power parameters." A "power parameter" may be regarded as a scalar representation of a voltage, current, power, frequency, etc., in the line. A "phasor array" may be an array or matrix of phasors. Phasor arrays may be used to represent the voltage, current, power, or energy phasors in the phase conductor, or circuit, or group of circuits, being sensed. Each element of the phasor array represents the phasor for a particular harmonic in a phase conductor voltage, power or energy signal. The array may be a single element array consisting of a single phasor for a single harmonic or the fundamental frequency.)

As mentioned above, each of the phasor modules also includes an event register, such as event register 208A–208G. An "event" may be regarded as any occurrence in the system that warrants logging and the data in the event registers 208 identify the nature of the event. The data in the event register 208 uniquely identifies the type of event and the time the event occurred.

As mentioned above, in one embodiment, the plurality of phasor modules 200 and their output registers 206 and 208 are included as program objects on the local microprocessor 100 in the phasor transducer 51 associated with the voltage and current lines 15A, 15B, and 15C, the phasors of which are being computed. However, in alternative embodiments, the plurality of phasor modules 200 and their output registers 206 may be included as program objects on a microprocessor that is physically located remotely in one or more of the phasor array processors, such as the phasor array processors 130, 131, and 132, or even on a microprocessor located on another of the phasor transducers, such as the phasor transducers 50, 52, 53, or 54. The program objects that perform the functions of the phasor modules 200 are not necessarily restricted to a specific physical location. If the program objects that perform the functions of the phasor modules are not physically located in the phasor transducer associated with the voltage and current lines the phasors of which are being computed by the modules, then the digitized outputs of the analog to digital converter may be transmitted over the network to another microprocessor where the phasor modules may be located.

As mentioned above, the values included in the phasor array output registers 206 represent the phasor values computed by each of the phasor modules 200 for each harmonic that is enabled. There are several methods that can be used to compute these phasor array values. One preferred method is to use a fast fourier transform to compute the phasor value for each harmonic frequency from the digitally-sampled data.

Each of the modules 200 includes scaling and notation setup parameters that may be used to configure the output format and scaling. For example, the modules 200 may be configured in various modes, e.g. xvye or delta, and the phasor notation may be provided in polar, rectangular, complex, or exponential notation. In addition, the scaling parameters may be set to provide for selection of units, percent, primary, secondary, per unit (PU), or Engineering units. In addition, there may be setup parameters used to select the harmonics that are enabled in the module.

(2). Phasor Power Meter Module

The phasor values in the phasor array output registers 207A–207G are provided as inputs to a phasor power meter module 220. Like the phasor modules 200, the phasor power meter module 220 is preferably implemented as a program object on the phasor transducer local microprocessor 100. The phasor power meter module 220 computes the phasor product of the voltage phasor arrays and the current phasor arrays for each phase in turn to generate the power phasor array for each phase. Also, the phasor power meter module 220 computes the sum of the power phasor arrays for all the phases to generate the total real, reactive, and apparent power parameters for all the harmonics that are enabled. An important function of the phasor power meter module 220 is the ability to buffer and time align the phasor array data from all the inputs so that the power calculation uses data which are representative of the same instant in time. The phasor power meter module 220 also includes an "enable" input 221 that enables the operation of the phasor power meter module 220.

The phasor power meter module 220 provides an output in the form of power meter output registers 226. The power meter output registers 226 include the following registers: (1) register 226A–226C that include a power phasor array for each phase, representing the real and reactive power for that phase for each harmonic that is enabled, (2) a register 226D that includes a total power phasor array representing the three phase total real and reactive power for each harmonic that is enabled, (3) a 226E register that includes a total real power parameter, (4) a register 226F that includes a total reactive power parameter, (5) a register 226G that includes a total apparent power parameter, and (6) an event register 226H.

The phasor power meter module 220 may be configurable to provide for selection of appropriate parameters for both its inputs and its outputs. For example, the phasor power meter module 220 may be configurable to provide its phasor output in various notations, such as polar, rectangular, complex, or exponential. The phasor power meter module 220 may be configured for scale, e.g. per unit, percent, or Engineering units. The phasor power meter module 200 may also be configurable for the number of harmonics enabled. Also, the phasor power meter module 220 may be configured to provide for the polarity of each input, i.e. an identification of whether an input should be added or subtracted when computing a sum.

Like the program objects that perform the functions of the phasor modules 200, the program object that performs the functions of the phasor power meter module 220 is not necessarily restricted to a specific physical location. For example, the phasor power meter module 220 may reside on a phasor transducer, such as the phasor transducer 51, or alternatively, the phasor power meter module 220 may reside on a phasor array processor, for example the phasor array processor 130. If the program object that performs the functions of the phasor power meter module is not physically located in the component that also includes the phasor modules, then the outputs of the modules 200 may be transmitted over the network 60 to another microprocessor where the appropriate phasor power meter module is located.

(3). Phasor Integration Module

Some of the values in the phasor power meter module output registers 226 are used as inputs by a phasor integration module 230. Like the phasor power meter module 220, the phasor integration module 230 is preferably implemented as a program object. Specifically, the phasor integration module 230 uses as inputs the phasor array values from the phasor power meter output register 226. The phasor integration module 230 also receives inputs that include (1) an "enable" input to enable operation of the phasor integration module 230, (2) a setup parameter that selects the harmonics that are enabled by the phasor integration module, and (3) an input to reset the phasor integrator module to zero.

The phasor integration module 230 performs a time integration of selected input power phasor arrays to compute energy phasor arrays for each enabled harmonic. The phasor integration module 230 provides outputs in the form of a integration output register 236 and an event register 237. The integration output register 236 is composed of output values that include a phasor array result that represents the time integration of the input phasor array. When the input to the phasor integration module 230 is a power phasor array, the output array in the integration output register 236 will be an energy phasor array which represents the real and reactive energy for each harmonic which is enabled.

The phasor integration module 230 may be configured for selection of a value for a divisor by which an integrand is divided before it is added to the result. The phasor integration module 230 may also be configured for selection of an integration mode to specify the type of integration to be performed.

Like the program objects that perform the functions of the phasor power meter module 220, the program object that performs the functions of the phasor integration module 230 is not necessarily restricted to a specific physical location and may reside on the phasor transducer 51, or on a phasor array processor. If the program object that performs the functions of the phasor integration module is not physically located in the component that also includes the phasor power meter module 220, then the outputs of the phasor power meter module 220 may be transmitted over the network 60 to another microprocessor where the phasor integration module 230 is located.

(4). Inverse Time, Pulser, and Digital Output Modules

The phasor values in the current phasor array output registers 206D–206G are provided as inputs to an inverse time module 240. Like the phasor modules 200, the phasor power module 220, and the integration module 230, the inverse time module 240 is preferably implemented as a program object. The inverse time module 240 provides an overcurrent protection function. (The inverse time module 240 may also be regarded as an inverse current module or an I2T module). The inverse time module 240 receives the digital data from the phasor modules 200 and processes the data to determine if there is a fault condition in the circuit 15. The inverse time module 240 also includes an “enable” input 241 that enables the operation of the inverse time module 240.

The inverse time module 240 provide an output in the form of inverse time output registers 246. The inverse time output registers 246 include the following registers: (1) a state register 246A, (2) an I2T value register 246B, and (3) an event register 246C. The inverse time module 240 may be configurable.

217 The state output register 246A of the inverse time module 240 is used as an input by a pulser module 250. The pulser module 250 may be located on the phasor transducer 51. The pulser module 250 in turn has an output register 256 that is used as an input by a digital output module 260. The digital output module 260 is preferably located on the local processor of the protection device 185. Accordingly, in order for the digital output module 260 to receive the data from the output register 256 of the pulser module 250, the data in the register 256 are transmitted over the network 60 from the phasor transducer 51 to the protection device 185. The digital output module 260 provides a trip output 266 that is coupled to the circuit breaker 45 (also shown in FIG. 1) associated with the circuit 15 the phasor values of which are being measured and computed by the phasor transducer 51.

The program objects that perform the functions of the inverse time module 240 and the pulser module 250 may reside on a phasor transducer, such as phasor transducer 51, or alternatively, these modules may reside on a phasor array processor, for example, the phasor array processor 130. The digital output module 260 is preferably located on a local processor associated with the protection device 185 associated with the circuit breaker 45. The digital output module 260 receives its input from the pulser module 250 over the network 60.

(5). Communications Module

In a preferred embodiment, each phasor transducer also includes a communications module 270. The communications module 270 is used to make the data in the output registers of the modules 200, 220, 230, 240, 250, and 260 accessible to remote modules on other nodes on the network 60 such as the phasor array processor 130 and the protection device 185. In a preferred embodiment, the communications module 270 allows external devices and/or modules to link to or communicate with any of the modules or registers on the phasor transducer 51. The communications module 270 preferably uses data communications techniques described in the copending application Ser. No. 08/369,849, now U.S. Pat. No. 5,650,936.

If the modules 200, 220, 230, 240, and 250, are all located located on a single component, such as on the phasor transducer 51, they can communicate with each other internally. However, if any of these modules are located on a remote microprocessor, such as a microprocessor on a phasor array processor or on a protection device, then the communications module 270 is used to enable the necessary data for the remote module to be accessible over the network 60.

(6). Other Modules on the Phasor Transducer

Other program modules may be located on a phasor transducer including a symmetrical component module, a recorder module, a setpoint module, and arithmetic modules. The structure, function and operation of these modules are disclosed in the aforementioned copending application Ser. No. 08/369,849, now U.S. Pat. No. 5,650,936. For example, a symmetrical component module may provide in its output registers values for the positive, negative, and zero sequence current and voltage arrays.

(7). Phasor Summation Module

Figure 4:
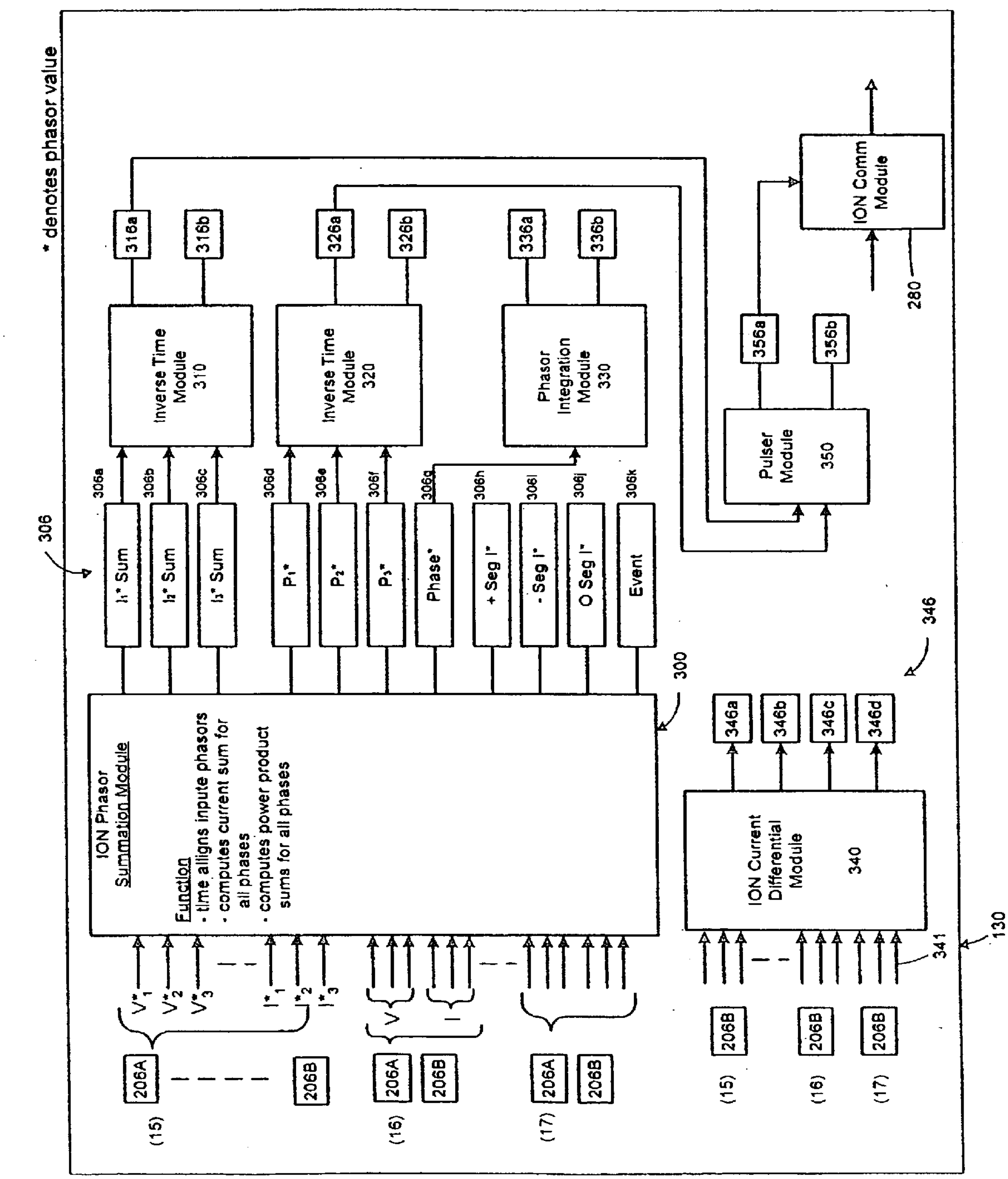
FIG. 4 is a block diagram illustrating the functional program modules of one of the phasor array processors shown in FIG. 1.

FIG. 4 is a functional diagram showing additional program objects. In a preferred embodiment the program objects in FIG. 4 are located on the phasor array processor 130. Some of the modules in FIG. 4 utilize as their input the data in the output registers 206 of the modules 200 on the plurality of the phasor transducers, such as the phasor transducers 50, 51, 52, 53, and 54. Thus, the phasor array processor 130 is able to process phasor data from a plurality of circuits, such as the circuits 14, 15, 16, 17, and 18. The program objects in FIG. 4 receive data from the phasor array transducers, 50, 51, 52, 53, and 54, over the network 60. Alternatively, since the phasor transducers can communicate with each other over the network 60, it is also possible to use a phasor transducer local microprocessor in one of the phasor transducers to run the program objects in FIG. 4.

A phasor summation module 300 uses as its inputs the data in the voltage and current output registers from the plurality of phasor power modules located on the plurality of remote phasor transducers. For example, the phasor summation module 300 uses the data in the output registers 206 of the phasor modules 200 in the phasor transducer 51, as well as corresponding data from the output registers 206 of the phasor modules in other phasor transducers, such as phasor transducers 50, 52, 53, and 54. The summation module 300 receives these inputs over the network 60 and may utilize a communication module for this purpose as described below. The phasor summation module 300 also includes an enable input 301 that enables operation of the module.

The phasor summation module 300 computes the vector sum of the input phasor arrays from the plurality of phasor transducers. Specifically, the phasor summation module 300 computes the phasor sum of all the current phasor array inputs and generates a current phasor array result for each phase. The phasor summation module 300 also computes the power phasor arrays for each voltage-current input pair, and sums them both on a per-phase basis and on an all-phases basis. The resulting output is a net power phasor for each phase plus the net power phasor arrays for all phases.

The summation module 300 has the ability to buffer and time align the phasor array data from all the inputs so that the summation calculation uses data which is representative of the same instant in time. In addition, the summation module 300 has the ability to assign a polarity to each input phasor array register. This allows the summation module 300 to compute net values that represent either total or differential current and power. Total values for current and power are advantageous when it is desired to measure the total power delivered to a plurality of circuits. Differential values for current, power, and energy are advantageous when it is desired to measure faults, power losses, or power delivered to a circuit which is not equipped with a phasor transducer device. Alternatively, instead of using voltage and current phasor arrays, the summation module 300 may use power phasor arrays as input to achieve a similar functionality and result. (Note that although the phasor summation module 300 may be used for computation of differential phasor values for current, power, and energy, these functions may also be performed by a separate module, such as the current differential module 340 described below. The computation of these differential values in the current differential module may be as a substitution for, or in addition to, the computation of these values in the phasor summation module.)

The phasor summation module 300 provides its output in the form of summation output registers 306. The summation output registers 306 include the following registers: (1) registers 306A, 306B, and 306C which include a register for a net current phasor array for each phase, plus net RMS current parameter for each phase, (2) registers 306D, 306E, and 306F which include a register for a net power phasor array for each phase, representing the total real and reactive power for each phase, (3) a register 306G including the net three phase power array, representing the total real and reactive power for all phases combined, (4) registers 306H, 3061, and 306J which include a register for the net positive, negative, and zero sequence current, and (6) and an event register 306K.

The summation module 300 is configurable. The summation module 300 may provide for configuration of type of phasor notation, e.g. polar, rectangular, complex, or exponential. The summation module 300 may also be configured to select a desired scaling, e.g. per unit, percent, or Engineering. The summation module 300 may also be configured to identify the voltage references, such as which voltage phasor array to associate with each current phasor array. In addition, the summation module 300 may be configured to provide for the selection of polarity for each input in order to identify whether an input should be added or subtracted when computing a sum. (8). Current Differential Module A current differential module 340 may also be included on the phasor array processor 130. Like the phasor summation module 300, the current differential module 340 utilizes as its input the data from the output registers of a plurality of modules from a plurality of phasor transducers, such as the phasor transducers 50, 51, 52, 53, and 54, which represents phasor data from a plurality of circuits, such as the circuits 14, 15, 16, 17, and 18. The current differential module 340 receives these inputs over the network 60. The current differential module 340 also includes an enable input 341 that enables operation of the module.

The current differential module 340 time aligns the phasor arrays, computes the phasor sum of the current phasor inputs, and generates a phasor result for each enabled harmonic. The result is the total current into the circuits, minus the total current out of the circuits. In an ideal network of circuits, which is functioning correctly, this result will be zero. In a network of circuits with a fault, or internal losses, the result will be a non-zero value. The differential module also computes the sum of all the power phasors for all of the voltage and current phasor input pairs for each enabled harmonic. The result is the differential power phasor which provides the real and reactive power losses in the circuits for each harmonic.

The current differential module 340 provides its output in the form of differential output registers 346. The differential output registers 346 include the following: (1) a register including the differential current for each harmonic 346A, (2) a register including the differential real power for each harmonic 346B, (3) a register including the differential reactive power for each harmonic 346C, and (4) an event register 346D.

The current differential module 340 may be configurable for selection of type of phasor notation (e.g. polar, rectangular, complex, or exponential), scaling (e.g. per unit, percent, or Engineering), harmonic bands enabled, and voltage references (e.g. which voltage phasor to be associated with each current phasor).

As mentioned above, the functions of the current differential module 340 may be performed by the phasor summation module 300.

(9). Summation Inverse Time Modules and Phasor Integration Module on the Phasor Array Processor The present embodiment may also include phasor summation inverse time modules, such as a current phasor summation inverse time module 310 and a power phasor summation inverse time module 320. Like the other modules, these may be located on the phasor array processor 130 or may be located elsewhere. These inverse time modules perform a similar function as the inverse time module 240, except that the inverse time modules 310 and 320 use as their inputs the data in the phasor summation data output registers 306 of the phasor summation module 300. Specifically, the current phasor inverse time module 310 uses the data from the current phasor summation registers 306A, 306B, and 306C and the power phasor inverse time module 320 uses as its inputs the data from the power phasor summation registers 306D, 306E, and 306F. With regard to the current phasor summation inverse time module 310, this module performs an overcurrent protection function based upon the summation current phasor values. Since the summation phasor values are derived the several circuits, this module has the ability to perform its overcurrent protection function based on the several circuits that are used to form the summation net current phasor array for each phase. Similarly, with regard to the power phasor summation inverse time module 320, this module performs an overpower protection function based upon the summation power phasor values derived the several circuits that are used to form the summation power phasor array for each phase, representing the total real and reactive power for each phase. Since the summation phasor values are derived the several circuits, this module has the ability to perform its overpower protection function based on the several circuits that are used to form the summation net current phasor array for each phase. These module permit sophisticated and high impedance fault protection schemes to be implemented. The current phasor summation inverse time module 310 provides an output in the form of current phasor inverse time output registers 316. The current phasor inverse time output registers 316 include the following registers: (1) a state register 316A, (2) and (3) an event register 316B. The current phasor inverse time module 316 may be configurable.

Similarly, the power phasor summation inverse time module 320 provides an output in the form of power phasor inverse time output registers 326. The power phasor inverse time output registers 326 include the following registers: (1) a state register 326A, (2) and (3) an event register 326B. The power phasor inverse time module 32 may be configurable.

The state output register 316A of the current phasor inverse time module 310 and the state output register 326A of the power phasor inverse time module 320 are used as inputs by one or more pulser modules 350. The pulser module 350 may be similar to the pulser module 250. Like the pulser module 250, the pulser module 350 has an output register 356 that is used as an input by a digital output module. The output register 356 of the pulser module 350 may be used by more than one digital output module associated with more than one circuit. Since the summation current inverse time module 310 and the summation power inverse time module 320 represent values derived from several circuits, when an overcurrent or an overpower condition is detected based on the summation values, it may be desired to open more than one circuit. Accordingly, the output register 356 of the pulser module 350 may be sent to and used by digital output modules (such as the digital output module 260) located on several respective protections devices associated with separate circuits. Like the output 256 of the pulser module 250, the output 356 of the pulser module 350 may be transmitted over the data network 60. Accordingly for this purpose, a communications module 280 may be used, as described below.

(In an alternative embodiment, the pulser module 250 may be used to receive the data from the output registers 316A and 326A of the summation inverse time modules 310 and 320, respectively and perform the functions of the pulser module 350.)

(10). Summation Phasor Integration Module on the Phasor Array Processor

The present embodiment may also include a phasor summation integration module 330. Like the other modules, this module may be located on the phasor array processor 130 or may be located elsewhere. The phasor summation integration module 330 performs a similar function as the phasor integration module 230, except that the phasor summation integration module 330 uses as for its inputs the data in the phasor summation data output register 306G of the phasor summation module 300. As mentioned above, the data from in phasor summation register 306G includes the net three phase power array, representing the total real and reactive power for all phases combined Since the summation phasor values are derived the several circuits, this module has the ability to provide a time integration of phasor values, such as kilowatt-hours, except in the phasor domain. The phasor integration module 330 provides an output in the form of a phasor summation integration output register 336A and an event register 336B.

2391 The integration module 330 may be configured in a manner similar to the integration module 230.

(11). Communications Module on the Phasor Array Processor

In the embodiment in FIG. 4, the phasor array processor 130 also includes a communications module 280. The communications module 280 is used to make the data in the output registers 306, 316, 326, 336, and so on, of the phasor array processor 130 accessible to remote modules or other nodes on the network 60. The communications module 280 may be similar or identical to the communications module 270 that runs on the local processor 100 of the node processor 51. (In general, a communications module, such as 270 or 280, is associated with each separate device that has its own CPU and communications port and provides for communications between the objects running on its CPU and objects on other devices via its communications port.) Like the communications module 270, the communications module 280 allows external devices and/or modules to link to or communicate with any of the modules or registers on the phasor array processor 130. The communications module 280 preferably uses data communications techniques described in the aforementioned copending application Ser. No. 08/369,849, now U.S. Pat. No. 5,650,936.

The communications module 280 has a communications output register 286. The data in the communications output register 286 is transmitted via appropriate hardware such as a communications port of the phasor array processor 130 onto the data network 60.

(12). Other Modules on the Phasor Array Processor

A phasor power meter module, similar to the phasor power meter module 220 described above, may be located on the phasor array processor 130. A phasor power meter module located on the phasor array processor 130 can be linked to phasor modules in remote phasor transducer devices. For example, if some phasor transducers do not have their own phasor power meter modules, a phasor power meter module located on a phasor array processor can be used to provide the power meter module functions. Similarly, if some voltage and current sensors are not connected to a phasor transducer, the outputs of the sensors can be digitized, put on the network, provided to a phasor power meter module located on a phasor array processor, and used to provide the power meter module functions.

(13). Other Modules on Other Processors

The system disclosed provides for protection, control, energy management, and systems diagnostics. The protection devices 184, 185, and so on operate to open circuits to provide protection based on the not just the current or power conditions in a single circuit, but in multiple circuits taking into account the inverse time module output results derived therefrom. The control and energy management functions may be provided by the power meter modules, summation modules, and integration modules. The diagnostics function may be provided by all of these modules. In order to enable an operator to access the control, energy management, and systems diagnostics functions, a node on the network may be provided with an appropriate module START HERE.

7. System Synchronization

Referring to the synchronization circuit 120 in FIG. 2, it is noted that by using a GPS-type signal, all the phasor transducers in the system, such as the phasor transducers 50, 51, 52, 53, and 54, can be synchronized to the same time reference. An advantage of such an arrangement is that all the phasor transducers can be configured to sample at the same time. However, such sampling may not necessarily be synchronous to the fundamental frequency of the electric power signal, thereby potentially introducing errors when the phasors are computed using fast fourier transform techniques. This is true especially for the harmonic phasors. Moreover, the phasors will rotate if the sampling is not done exactly synchronous to the fundamental frequency of the electric power signal.

One alternative is to sample at a frequency which is an exact multiple of the fundamental line frequency. This will provide for accuracy when using fast fourier transform techniques to compute phasors. However, this technique will not necessarily synchronize the sampling among the phasor transducers since the sample frequency may be different at different phasor transducers. Further, when the phasor data is sent from the phasor transducers to the phasor array processors, computation becomes complicated because the different phasor measurements need to be time aligned.

In a preferred embodiment, all the phasor transducers are configured to sample synchronously to the fundamental frequency at one point in the electricity distribution system signal. According to the preferred embodiment, one of the phasor transducers is selected to act as a reference device for the entire system. The phasor for one of the inputs of this phasor transducer device becomes the reference phasor. The reference phasor transducer device computes the precise system frequency and the system "zero time reference" relative to the GPS-time clock. These values are transmitted to each other phasor transducer in the system which in turn sets its sampling to be simultaneous and synchronous to the system reference frequency.

This arrangement has several advantages. All sampling is normally synchronous (except when the system dynamics change) so that the fast fourier transform results and the phasors for the harmonics are accurate. The phasors do not rotate except when the system dynamics change so data transmission and storage requirements can be drastically reduced.

8. Example

Figure 5:
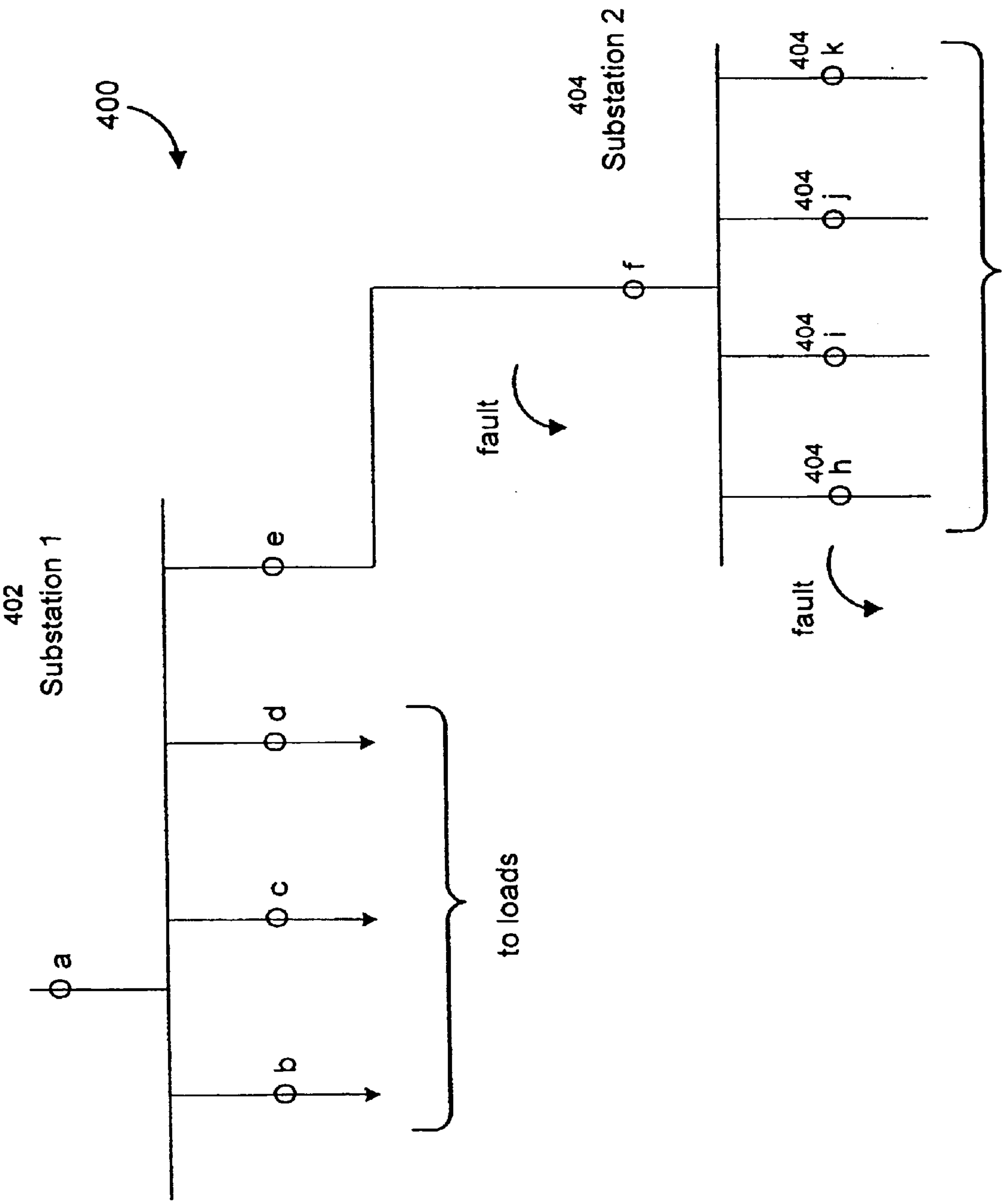
FIG. 5 is a diagram of a plurality of electric circuits used to illustrate an exemplary embodiment of the present invention.
Figure 6:
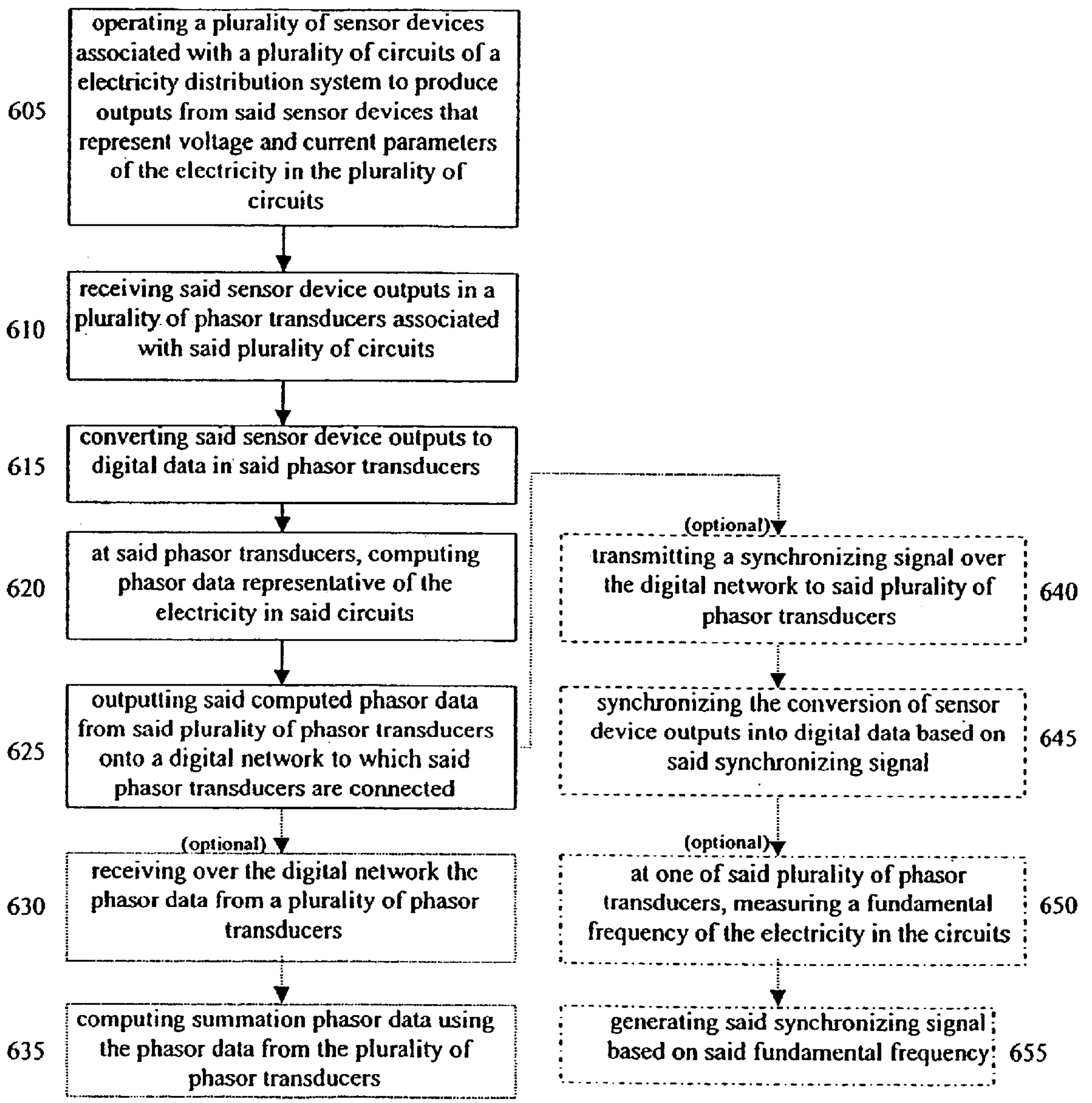
FIG. 6 is a flow chart illustrating a first exemplary method for use with the embodiments depicted in FIGS. 1–4.
Figure 7:
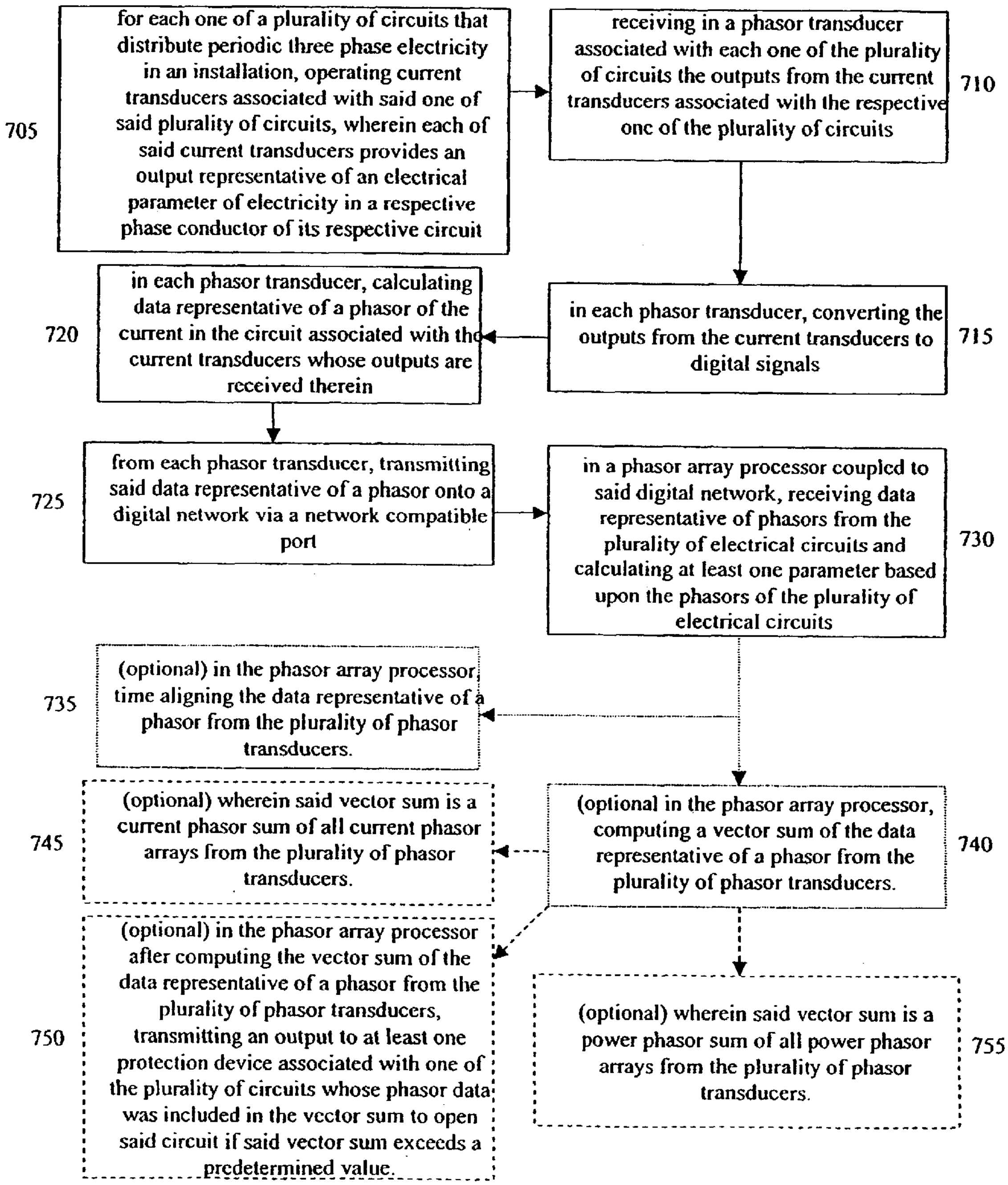
FIG. 7 is a flow chart illustrating a second exemplary method for use with the embodiments depicted in FIGS. 1–4.

Referring to FIG. 5, an exemplary method of according to an embodiment will now be described.

One of the advantages of the disclosed system is its inherent ability to provide sufficient information to properly handle electric protection, control and metering functions at a network level rather than a circuit level. This advantage becomes apparent with regard to breaker coordination. Conventional products generally perform at a circuit level.

FIG. 5 shows a typical three phase electricity distribution network 400. The system 400 consists of two coupled substations, 402 and 404, each with an incoming main, 402*a* and 402*e*, and a number of feeder circuits 402*b*, 402*c*, 402*d*, 404*h*, 404*i*, 404*j*, and 404*k*. A serious design problem in this type of network is breaker coordination. If a fault occurs on the circuit 404*h*, it may also be seen by the circuits 402*a*, 402*e*, and 404*f*. The problem is how to determine which circuits to trip in addition to the circuit 404*h*. According to prior systems, this is typically handled using either breaker coordination, zone protection, or trip blocking schemes. All of these methods are inexact and have functional limitations.

The phasor array processing capability as disclosed herein provides a superior solution to this problem. The phasor array processor can sum the current phasor arrays for the circuits 402*a*, 402*b*, 402*c*, 402*d*, and 402*e*. If they add to zero, the circuit 402*a* does not need to be opened, but if they add to a significant non zero value, the circuit 402*a* should be opened. Similarly the phasor array processor can sum the current phasor arrays for the circuits 404*f*, 404*h*, 404*i*, 404*j*, and 404*k* to determine if the circuit 404*f* should be opened. The phasor array processor can sum the current phasor arrays for the circuits 402*e* and 404*f* to determine if there is a fault in the circuit between the circuits 402*e* and 404*f*.

An even more difficult situation for conventional devices is detection and isolation of high impedance faults. If a high impedance fault occurs on the circuit 402*e*, it is very difficult to detect and even more difficult to isolate using conventional devices. The system disclosed above, including the phasor transducers and phasor array processor, can be used for high impedance detection and isolation. The system can accomplish this by summing the current phasor arrays for the circuits 402*e* and 404*f*. If they do not add to zero, it is assumed that there is a fault somewhere on the circuit 402*e*. High impedance faults can be detected and isolated to any segment of the circuit network which is bounded by phasor transducer devices. This approach will work for both low and high impedance faults.

Another problem solved by the above-disclosed system is network loss monitoring. The losses in the substation 402 are equal to the sum of the power phasor arrays for the circuits 402*a*, 402*b*, 402*c*, 402*d*, and 402*e*. The losses in the circuit between circuits 402*e* and circuits 404*f* are equal to the sum of the power phasor arrays for the circuits 402*e* and 404*f*. The losses in substation 404 are equal to the sum of the power phasor arrays for the circuits 404*f*, 404*h*, 404*i*, 404*j*, and 404*k*. This system allows power losses caused by loose connections, worn contactors, worn circuit breakers, or even power theft to be detected and isolated. It is important to note that this system works even when there is a transformer in the circuit. Another feature of this approach is that it can be an effective way to verify the accuracy and performance of each of the phasor transducer devices.

The disclosed system also provides effective protection and metering redundancy, so functionality can be maintained even if any single device fails. For example, in FIG. 5, if the phasor transducer device in circuit 402*d* fails, the power, current, and energy through circuit 402*d* can still be derived by the phasor array processor using the formula phasor array (−402*d*=phasor arrays 402*a*+402*b* +402*c*+ 402*e*). The phasor array processor can be configured so that it can trip the circuit 402*d* in the event of an over current situation through that circuit. Conventional devices are not capable of providing such redundancy.

Those skilled in the art will recognize that similar results can be achieved by using symmetrical component arrays instead of per phase phasor arrays.

Those skilled in the art will also appreciate that the phasor transducer embodiments could output data in different formats, such as a wavelet format.

It is intended that the foregoing detailed description be regarded as illustrative rather than limiting and that it is understood that the following claims including all equivalents are intended to define the scope of the embodiments.

I claim:

1. A protection device for use with an electrical circuit, said protection device comprising:

a communications port operative to couple said protection device with a data network;

at least one output coupled with said electrical circuit and operative to control a flow of electrical power through said electrical circuit;

a processor coupled with said communications port and said at least one output, said processor executing at least one programmable software module, each programmable software module of said at least one programmable software module including a plurality of programmable software sub-modules, said plurality of programmable software sub-modules being characterized by a capability of being linked together to perform an arbitrary function, said at least one programmable software module further operative to receive data from said communications port, process said data and generate a signal on said at least one output to at least one of interrupt and restore said flow of electrical power through said electrical circuit.

2. The protection device of claim 1, wherein said data network comprises an Ethernet network.

3. The protection device of claim 1, wherein said electrical circuit comprises at least one circuit breaker, said at least one output being coupled with said at least one circuit breaker to control operation of said at least one circuit breaker.

4. The protection device of claim 3, wherein said at least one output is coupled with said at least one circuit breaker via said data network.

5. The protection device of claim 1, wherein each programmable software module of said at least one programmable module comprises at least one object oriented software program module.

6. The protection device of claim 1, wherein said arbitrary function comprises a protection function.

7. The protection device of claim 1, wherein at least one programmable software sub-module of said plurality of programmable sub-modules is operative to receive data from at least one other device coupled with said data network.

8. The protection device of claim 1, wherein said processor is further operative to receive data from at least one other device coupled with said data network.

9. The protection device of claim 8, wherein said at least one other device comprises at least one sensor coupled with said electrical circuit and operative to sense at least one electrical parameter in said electrical circuit, generate an analog signal representative thereof, digitize said analog signal and transmit said digitized analog signal onto said data network.

10. The protection device of claim 8, wherein said at least one other device comprises at least one other protection device.

11. The protection device of claim 8, wherein said at least one programmable module comprises at least one programmable sub-module coupled with said at least one other device to receive said data.

12. A protection device for use with an electrical circuit, said protection device comprising:

communications means for coupling said protection device with a data network;

output means for coupling said protection device with said electric circuit to control a flow of electrical power through said electrical circuit;

processor means, coupled with said communications means and said output means, said processor means for executing at least one programmable software module means, each programmable software module means of said at least one programmable software module means including a plurality of programmable software sub-module means, said plurality of programmable software sub-module means being characterized by a capability of being linked together to perform an arbitrary function, said at least one programmable software module means further operative to receive data from said communications means, process said data and generate a signal on said output means to at least one of interrupt and restore said it flow of electrical power through said electrical circuit.

13. The protection device of claim 12, wherein said data network comprises an Ethernet network.

14. The protection device of claim 12, wherein said electrical circuit comprises at least one circuit breaker, said output means being coupled with said at least one circuit breaker to control operation of said at least one circuit breaker.

15. The protection device of claim 14, wherein said output means is coupled with said at least one circuit breaker via said data network.

16. The protection device of claim 12, wherein each programmable software module means of said at least one programmable software module means comprises at least one object oriented program module.

17. The protection device of claim 12, wherein said arbitrary function comprises a protection function.

18. The protection device of claim 12, wherein at least one of said plurality of programmable software sub-module means is operative to receive data from at least one other device coupled with said data network.

19. The protection device of claim 12, wherein said processor means is further operative to receive data from at least one other device coupled with said data network.

20. The protection device of claim 19, wherein said at least one other device comprises at least one sensor means for sensing at least one electrical parameter in said electrical circuit, generating an analog signal representative thereof, digitizing said analog signal and transmitting said digitized analog signal onto said data network.

21. The protection device of claim 19, wherein said at least one other device comprises at least one other protection device.

22. The protection device of claim 19, wherein said at least one programmable module means comprises at least one programmable sub-module means coupled with said at least one other device to receive said data.

23. A power control and monitoring system, comprising:

an electrical power distribution network;

a plurality of protection devices, each protection device of said plurality of protection devices being associated with at least one portion of said electrical power distribution network and each protection device of said plurality of protection devices including a communications port for connection to a data network;

wherein each protection device of said plurality of protection devices includes user-programmable logic, said user programmable logic including at least one logic input and at least one logic output and a plurality of sub-components, each sub-component of said plurality of sub-components being capable of being coupled with another of said sub-component of said plurality of sub-components and said at least one logic input and said at least one logic output in a user specified arrangement so as to perform an arbitrary function derived from said user specified arrangement, and wherein said at least one logic input and said at least one logic output are communicated between said plurality of protection devices over said data network.

* * * * *